US011856838B2

(12) United States Patent
Lee et al.

(10) Patent No.: US 11,856,838 B2
(45) Date of Patent: Dec. 26, 2023

(54) ORGANOMETALLIC COMPOUND, ORGANIC LIGHT-EMITTING DEVICE INCLUDING THE ORGANOMETALLIC COMPOUND, DIAGNOSTIC COMPOSITION INCLUDING THE ORGANOMETALLIC COMPOUND

(71) Applicant: Samsung Electronics Co., Ltd., Suwon-si (KR)

(72) Inventors: Kum Hee Lee, Suwon-si (KR); Yoonhyun Kwak, Seoul (KR); Sukekazu Aratani, Hwaseong-si (KR); Jiyoun Lee, Anyang-si (KR); Yuri Cho, Suwon-si (KR); Jongwon Choi, Yongin-si (KR); Whail Choi, Seoul (KR); Kyuyoung Hwang, Anyang-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 493 days.

(21) Appl. No.: 16/840,845

(22) Filed: Apr. 6, 2020

(65) Prior Publication Data

US 2020/0328360 A1 Oct. 15, 2020

(30) Foreign Application Priority Data

Apr. 11, 2019 (KR) ........................ 10-2019-0042745

(51) Int. Cl.
*C07F 15/00* (2006.01)
*C09K 11/06* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
CPC ............. H01L 51/0085; H01L 51/5012; H01L 51/5016; H01L 51/5056; H01L 51/5072;
(Continued)

(56) References Cited

U.S. PATENT DOCUMENTS 9,359,549 B2 6/2016 Rayabarapu et al.
9,859,510 B2 1/2018 Boudreault et al.
(Continued)

FOREIGN PATENT DOCUMENTS

EP 3560940 A1 10/2019
EP 3637489 A1 4/2020
(Continued)

OTHER PUBLICATIONS

JP-2008239759-A—translation (Year: 2008).*
(Continued)

*Primary Examiner* — Sean M DeGuire
*Assistant Examiner* — Rachel Simbana
(74) *Attorney, Agent, or Firm* — CANTOR COLBURN LLP

(57) ABSTRACT

An organometallic compound represented by Formula 1, an organic light-emitting device including the organometallic compound, and a diagnostic composition including the organometallic compound:

$$M(L_1)_{n1}(L_2)_{n2} \quad \text{Formula 1}$$

wherein, in Formula 1, M, $L_1$, $L_2$, n1, and n2 are each described herein.

20 Claims, 1 Drawing Sheet

(51) Int. Cl.

| | |
|---|---|
| ***G01N 21/64*** | (2006.01) |
| ***G01N 33/58*** | (2006.01) |
| ***H10K 101/10*** | (2023.01) |
| ***H10K 50/11*** | (2023.01) |
| ***H10K 50/12*** | (2023.01) |
| ***H10K 50/15*** | (2023.01) |
| ***H10K 50/16*** | (2023.01) |
| ***H10K 50/17*** | (2023.01) |
| ***H10K 50/18*** | (2023.01) |
| ***H10K 85/30*** | (2023.01) |
| ***H10K 85/40*** | (2023.01) |

(52) U.S. Cl.
CPC ................. *C09K 2211/1033* (2013.01); *C09K 2211/1037* (2013.01); *C09K 2211/185* (2013.01); *H10K 50/11* (2023.02); *H10K 50/15* (2023.02); *H10K 50/16* (2023.02); *H10K 50/17* (2023.02); *H10K 50/171* (2023.02); *H10K 50/18* (2023.02); *H10K 2101/10* (2023.02)

(58) Field of Classification Search
CPC ............. H01L 51/5088; H01L 51/5092; H01L 51/5096; H01L 51/0094; H01L 51/5024; C07F 15/0033; C09K 11/06; C09K 2211/1033; C09K 2211/1037; C09K 2211/185; G01N 21/64; G01N 33/58; H10K 85/342; H10K 85/346; H10K 85/348
See application file for complete search history.

(56) References Cited

U.S. PATENT DOCUMENTS

| | | | | |
|---|---|---|---|---|
| 10,003,035 | B2 | 6/2018 | Hwang et al. | |
| 10,205,106 | B2 | 2/2019 | Stoessel et al. | |
| 2008/0145526 | A1* | 6/2008 | Mao | G01N 33/6839 546/10 |
| 2012/0299468 | A1 | 11/2012 | Tsai et al. | |
| 2015/0097169 | A1 | 4/2015 | Xia | |
| 2016/0164006 | A1 | 6/2016 | Chao et al. | |
| 2016/0164007 | A1 | 6/2016 | Lin et al. | |
| 2016/0359121 | A1 | 12/2016 | Ito et al. | |
| 2017/0170413 | A1 | 6/2017 | Stoeddel et al. | |
| 2017/0294596 | A1 | 10/2017 | Ishibe et al. | |
| 2018/0254416 | A1 | 9/2018 | Stoessel et al. | |
| 2018/0323382 | A1* | 11/2018 | Boudreault | C07F 15/0033 |
| 2019/0058139 | A1 | 2/2019 | Ma et al. | |
| 2019/0112324 | A1 | 4/2019 | Kim et al. | |
| 2019/0267555 | A1 | 8/2019 | Tsai et al. | |
| 2019/0326527 | A1 | 10/2019 | Choi et al. | |

FOREIGN PATENT DOCUMENTS

| | | | |
|---|---|---|---|
| JP | 2008239759 | A | * 10/2008 |
| KR | 1020120026486 | A | 3/2012 |
| KR | 1020140027389 | A | 3/2014 |
| KR | 1020150083017 | A | 7/2015 |
| KR | 1020160064951 | A | 6/2016 |
| KR | 1020170115872 | A | 10/2017 |
| KR | 1020150039846 | A | 1/2019 |
| KR | 1020190042459 | A | 4/2019 |
| KR | 1020190123228 | A | 10/2019 |
| WO | 2015117718 | A1 | 8/2015 |
| WO | 2017032439 | A1 | 3/2017 |

OTHER PUBLICATIONS

Extended European search report issued by the European Patent Office dated Aug. 24, 2020 in the examination of the European Patent Application No. 20168158.2.

Tian-Yi Li, et al., Coordination Chemistry Reviews, 374 (2018), 55-92.

* cited by examiner

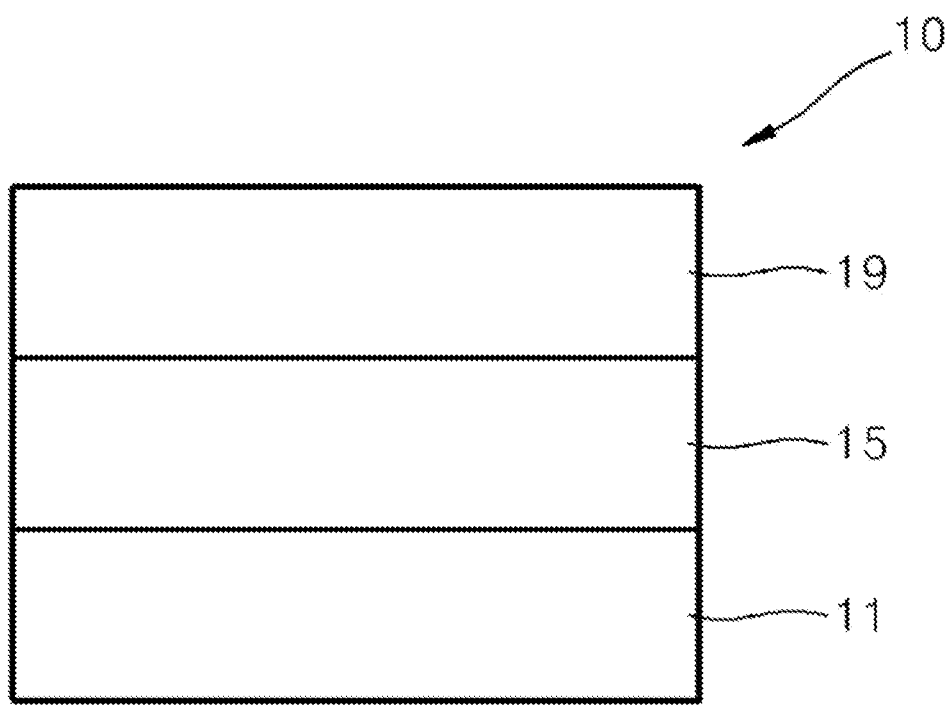
10
19
15
11

ORGANOMETALLIC COMPOUND, ORGANIC LIGHT-EMITTING DEVICE INCLUDING THE ORGANOMETALLIC COMPOUND, DIAGNOSTIC COMPOSITION INCLUDING THE ORGANOMETALLIC COMPOUND

CROSS-REFERENCE TO RELATED APPLICATION

This application claims priority and the benefit of Korean Patent Application No. 10-2019-0042745, filed on Apr. 11, 2019, in the Korean Intellectual Property Office, and all the benefits accruing therefrom under 35 U.S.C. § 119, the content of which in its entirety is herein incorporated by reference.

BACKGROUND

1. Field

One or more embodiments relate to an organometallic compound, an organic light-emitting device including the organometallic compound, and a diagnostic composition including the organometallic compound.

2. Description of the Related Art

Organic light-emitting devices are self-emission devices, which have excellent characteristics in terms of a viewing angle, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be between the anode and the emission layer, and an electron transport region may be between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transit from an excited state to a ground state, thereby generating light.

Luminescent compounds may be used to monitor, sense, or detect a variety of biological materials including cells and proteins. An example of the luminescent compounds is a phosphorescent luminescent compound.

SUMMARY

Aspects of the present disclosure provide a novel organometallic compound, an organic light-emitting device including the novel organometallic compound, and a diagnostic composition including the novel organometallic compound.

Additional aspects will be set forth in part in the description which follows and, in part, will be apparent from the description, or may be learned by practice of the presented embodiments.

An aspect of the present disclosure provides an organometallic compound represented by Formula 1 below:

$$M(L_1)_{n1}(L_2)_{n2} \quad \text{Formula 1}$$

In Formula 1,

M may be a transition metal, $L_1$ may be a ligand represented by Formula 2, n1 may be 1, 2, or 3, wherein, when n1 is 2 or more, two or more $L_1$(s) may be identical to or different from each other, $L_2$ may be a monodentate ligand, a bidentate ligand, a tridentate ligand, or a tetradentate ligand, n2 may be 0, 1, 2, 3, or 4, wherein, when n2 is 2 or more, two or more $L_2$(s) may be identical to or different from each other, and $L_1$ and $L_2$ may be different from each other:

Formula 2

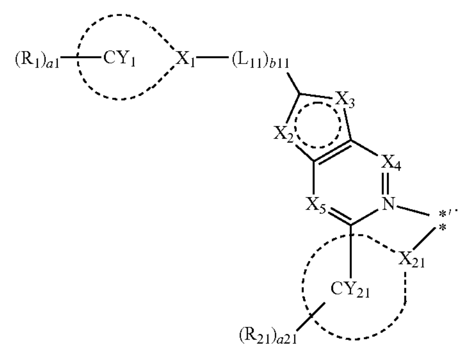

In Formula 2, $X_1$ may be C, N, Si, or P, $X_{21}$ may be C or N, ring $CY_1$ and ring $CY_{21}$ may each independently be a $C_5$-$C_{30}$ carbocyclic group or a $C_2$-$C_{30}$ heterocyclic group, $X_2$ and $X_3$ may each independently be O, S, Se, or $C(R_2)$, wherein $X_2$ or $X_3$ may be O, S, or Se, $X_4$ may be N or $C(R_4)$, $X_5$ may be N or $C(R_5)$, $R_1$, $R_2$, $R_4$, $R_5$, and $R_{21}$ may each independently be hydrogen, deuterium, —F, —C, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(=O)(Q_8)(Q_9)$ or —$P(Q_8)(Q_9)$, a1 and a21 may each independently be an integer from 0 to 20, ring $CY_1$ and $R_2$ may not be linked to each other, and $R_1$ and $R_2$ may not be linked to each other, $L_{11}$ may be a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$, b11 may be an integer from 0 to 10, wherein, when b11 is 0, a group represented by *-$(L_{11})_{b11}$-*' may be a single bond, and when b11 is 2 or more, two or more $L_{11}$(s) may be identical to or different from each other, two of a plurality of neighboring $R_{21}$(s) may optionally be linked to form a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$.

$R_{10a}$ may be the same as defined in connection with $R_{21}$,

* and *' each indicate a binding site to M in Formula 1, a substituent(s) of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, or $—P(=O)(Q_{38})(Q_{39})$; or any combination thereof, and $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

Another aspect of the present disclosure provides an organic light-emitting device including: a first electrode; a second electrode; and an organic layer disposed between the first electrode and the second electrode and including an emission layer, wherein the organic layer may include at least one organometallic compound represented by Formula 1.

The organometallic compound included in the emission layer of the organic layer may act as a dopant.

Another aspect of the present disclosure provides a diagnostic composition including at least one organometallic compound represented by Formula 1.

BRIEF DESCRIPTION OF THE DRAWING

These and/or other aspects will become apparent and more readily appreciated from the following description of the embodiments, taken in conjunction with FIGURE which is a schematic cross-sectional view of an organic light-emitting device according to an embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the FIGURES, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the FIGURES. It will be understood that relative terms are intended to encompass different orientations of the device in addition to the orientation depicted in the FIGURES. For example, if the device in one of the FIGURES is turned over, elements described as being on the "lower" side of other elements would then be oriented on "upper" sides of the other elements. The exemplary term "lower," can therefore, encompasses both an orientation of "lower" and "upper," depending on the particular orientation of the FIGURE. Similarly, if the device in one of the FIGURES is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the FIGURES are schematic in nature and their shapes are not intended to illustrate the precise shape of a region and are not intended to limit the scope of the present claims.

An aspect of the present disclosure provides an organometallic compound represented by Formula 1 below:

$$M(L_1)_{n1}(L_2)_{n2} \qquad \text{Formula 1}$$

M in Formula 1 may be a transition metal.

For example, M may be a first-row transition metal, a second-row transition metal, or a third-row transition metal of the Periodic Table of Elements.

In one embodiment, M may be iridium (Ir), platinum (Pt), osmium (Os), titanium (Ti), zirconium (Zr), hafnium (Hf), europium (Eu), terbium (Tb), thulium (Tm), or rhodium (Rh).

In one embodiment, M may be Ir, Pt, Os, or Rh, but embodiments of the present disclosure are not limited thereto.

$L_1$ in Formula 1 may be a ligand represented by Formula 2, and n1 in Formula 1 indicates the number of $L_1$ in Formula 1 and may be 1, 2, or 3. When n1 is 2 or more, two or more $L_1$(s) may be identical to or different from each other:

Formula 2

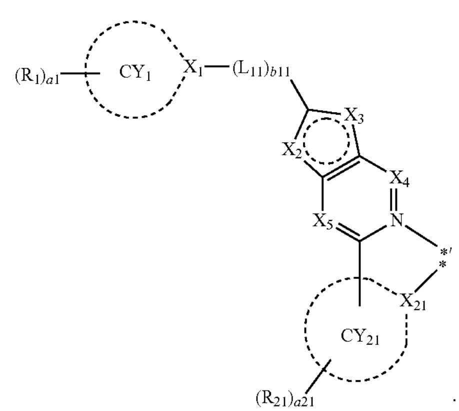

Formula 2 may be the same as described below.

For example, n1 may be 1 or 2.

$L_2$ in Formula 1 may be a monodentate ligand, a bidentate ligand, a tridentate ligand, or a tetradentate ligand, and n2 in Formula 1 indicates the number of $L_2$ and may be 0, 1, 2, 3, or 4. When n2 is 2 or more, two or more $L_2$(s) may be identical to or different from each other. $L_2$ may be the same as described below.

For example, n2 in Formula 1 may be 1 or 2.

In Formula 1, $L_1$ and $L_2$ may be different from each other.

In one embodiment, M may be Ir or Os, and the sum of n1 and n2 may be 3 or 4; or M may be Pt, and the sum of n1 and n2 may be 2.

In Formula 2, $X_1$ may be C, N, Si, or P, and $X_{21}$ may be C or N.

For example, in Formula 2, $X_{21}$ may be C.

In Formula 2, ring $CY_1$ and ring $CY_{21}$ may each independently be a $C_5$-$C_{30}$ carbocyclic group or a $C_2$-$C_{30}$ heterocyclic group.

For example, ring $CY_1$ and ring $CY_{21}$ may each independently be i) a first ring, ii) a second ring, iii) a condensed ring in which at least two first rings are condensed with each other, iv) a condensed ring in which at least two second rings are condensed with each other, or v) a condensed ring in which at least one first ring and at least one second ring are condensed with each other.

The first ring may be a cyclopentane group, a cyclopentadiene group, a furan group, a thiophene group, a pyrrole group, a silole group, an indene group, a benzofuran group, a benzothiophene group, an indole group, a benzosilole group, an oxazole group, an isoxazole group, an oxadiazole group, an isoxadiazole group, an oxatriazole group, an isoxatriazole group, a thiazole group, an isothiazole group, a thiadiazole group, an isothiadiazole group, a thiatriazole group, an isothiatriazole group, a pyrazole group, an imidazole group, a triazole group, a tetrazole group, an azasilole group, a diazasilole group, or a triazasilole group.

The second ring may be an adamantane group, a norbornane group, a norbornene group, a cyclohexane group, a cyclohexene group, a benzene group, a pyridine group, a pyrimidine group, a pyrazine group, a pyridazine group, or a triazine group.

In one embodiment, ring $CY_1$ and ring $CY_{21}$ may each independently be a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group, but embodiments of the present disclosure are not limited thereto.

In one or more embodiments, ring $CY_1$ may be a cyclopentane group, a cyclohexane group, a cycloheptane group, a cyclooctane group, an adamantane group, a norbornane group, a norbornene group, a cyclopentene group, a cyclohexene group, a cycloheptene group, a benzene group, a naphthalene group, a fluorene group, a phenanthrene group, an anthracene group, a fluoranthene group, a triphenylene group, a pyrene group, a chrysene group, a pyrrole group, a thiophene group, a furan group, an imidazole group, a pyrazole group, a thiazole group, an isothiazole group, an oxazole group, an isoxazole group, a pyridine group, a pyrazine group, a pyrimidine group, a pyridazine group, an isoindole group, an indole group, an indazole group, a purine group, a quinoline group, an isoquinoline group, a benzoquinoline group, a quinoxaline group, a quinazoline group, a cinnoline group, a carbazole group, a phenanthroline group, a benzimidazole group, a benzofuran group, a benzothiophene group, an isobenzothiazole group, a benzoxazole group, an isobenzoxazole group, a triazole group a tetrazole group, an oxadiazole group, a triazine group, a dibenzofuran group, a dibenzothiophene group, a dibenzosilole group, a benzocarbazole group, a dibenzocarbazole group, an imidazopyridine group, or an imidazopyrimidine group, but embodiments of the present disclosure are not limited thereto.

In Formula 2, $X_2$ and $X_3$ may each independently be O, S, Se, or $C(R_2)$, wherein $X_2$ or $X_3$ may be O, S, or Se.

For example, in Formula 2, i) $X_2$ may be O, S, or Se, and $X_3$ may be $C(R_2)$, or ii) $X_2$ may be $C(R_2)$, and $X_3$ may be O, S, or Se.

In Formula 2, $X_4$ may be N or $C(R_4)$, and $X_5$ may be N or $C(R_5)$.

For example, $X_4$ may be $C(R_4)$, and $X_5$ may be $C(R_5)$.

In Formula 2, $R_1$, $R_2$, $R_4$, $R_5$, and $R_{21}$ may each independently be hydrogen, deuterium, —F, —C, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(=O)(Q_8)(Q_9)$ or —$P(Q_8)(Q_9)$, wherein $Q_1$ to $Q_9$ are each the same as described above.

For example, $R_1$, $R_2$, $R_4$, $R_5$, $R_{21}$, and $R_{10a}$ may each independently be:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, —$Si(Q_{33})(Q_{34})(Q_{35})$, or any combination thereof; or —$N(Q_1)(Q_2)$, —$Si(Q_3)(Q_4)(Q_5)$, —$B(Q_6)(Q_7)$, —$P(=O)(Q_8)(Q_9)$, or —$P(Q_8)(Q_9)$, and $Q_1$ to Q and $Q_{33}$ to $Q_{35}$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each unsubstituted or substituted with deuterium, a $C_1$-$C_{10}$ alkyl group, a phenyl group, or any combination thereof, but embodiments of the present disclosure are not limited thereto.

In Formula 2, a1 and a21 each indicate the number of $R_1$ and the number of $R_{21}$, respectively, and may each independently be an integer from 0 to 20 (for example, an integer from 0 to 10 or an integer from 0 to 5). When a1 is 2 or more, two or more $R_1$(s) may be identical to or different from each other, and when a21 is 2 or more, two or more $R_{21}$(s) may be identical to or different from each other.

In Formula 2, ring $CY_1$ and $R_2$ are not linked to each other, and $R_1$ and $R_2$ are not linked to each other.

In one embodiment, a group represented by

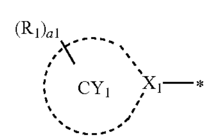

in Formula 2 may be a $C_2$-$C_{10}$ cycloalkenyl group, a $C_2$-$C_{10}$ heterocycloalkenyl group, a $C_6$-$C_{30}$ aryl group, a $C_2$-$C_{30}$ heteroaryl group, a monovalent non-aromatic condensed polycyclic group, or a monovalent non-aromatic condensed heteropolycyclic group, each unsubstituted or substituted with $R_1$(s) in the number of a1.

In Formula 2, $R_1$ and $R_2$ may each independently be:

hydrogen, deuterium, —F, —C, —Br, —I, a cyano group, or —$SF_5$, or a $C_1$-$C_{60}$ alkyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, or a $C_2$-$C_{10}$ heterocycloalkenyl group, each unsubstituted or substituted with deuterium, —F, —C, —Br, —I, $—CD_3$, $—CD_2H$, $—CDH_2$, $—CF_3$, $—CF_2H$, $—CFH_2$, a cyano group, a $C_1$-$C_{20}$ alkyl group, a cyclopentyl group, a cyclohexyl group, a cycloheptyl group, a cycloctyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, and a1 may be an integer from 0 to 10.

Detailed descriptions of a1, $R_1$, a $C_1$-$C_{60}$ alkyl group, a $C_1$-$C_{60}$ alkoxy group, a $C_3$-$C_{10}$ cycloalkyl group, a $C_2$-$C_{10}$ heterocycloalkyl group, a $C_2$-$C_{10}$ heterocycloalkenyl group, a $C_3$-$C_{10}$ cycloalkenyl group, a $C_6$-$C_{30}$ aryl group, a $C_2$-$C_{30}$ heteroaryl group, a monovalent non-aromatic condensed polycyclic group, and a monovalent non-aromatic condensed heteropolycyclic group are the same as described above.

In one or more embodiments, a group represented by

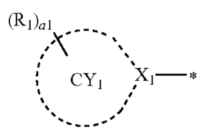

in Formula 2 may be a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with $R_1$(s) in the number of a1.

In Formula 2, $R_1$ and $R_2$ may each independently be:

hydrogen, deuterium, —F, —C, —Br, —I, a cyano group, or $—SF_5$, or a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonanyl group (an n-nonyl group), an isononanyl group (an isononyl group), a sec-nonanyl group (a sec-nonyl group), a tert-nonanyl group (a tert-nonyl group), an n-decanyl group, an isodecanyl group, a sec-decanyl group, a tert-decanyl group, a $C_1$-$C_{10}$ alkoxy, a cyclopentyl group, a cyclohexyl group, a cycloheptyl group, a cycloctyl group, an adamantyl group, a norbornanyl group, a norbornenyl group, a cyclopentenyl group, a cyclohexenyl group or a cycloheptenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a cyano group, a $C_1$-$C_{20}$ alkyl group, a cyclopentyl group, a cyclohexyl group, a cycloheptyl group, a cycloctyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, and a1 may be an integer from 0 to 5, but embodiments of the present disclosure are not limited thereto.

In one or more embodiments, a group represented by

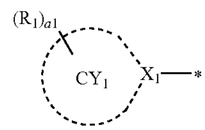

in Formula 2 may be a group represented by one of Formulae 10-13(1) to 10-13(18) and 10-13:

10-13(1)

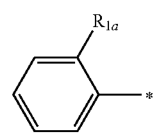

10-13(2)

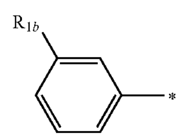

10-13(3)

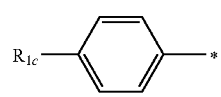

10-13(4)

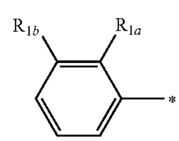

10-13(5)

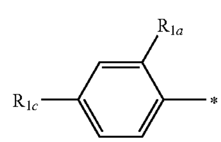

10-13(6)

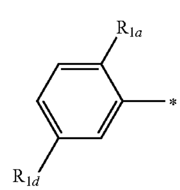

10-13(7)

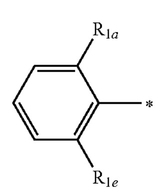

-continued 10-13(8)

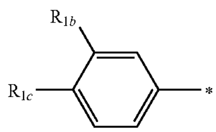

10-13(9)

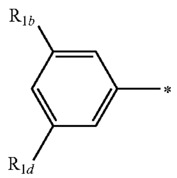

10-13(10)

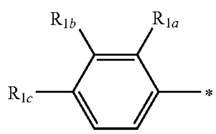

10-13(11)

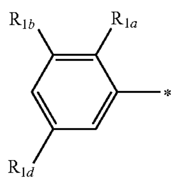

10-13(12)

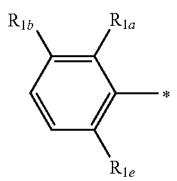

10-13(13)

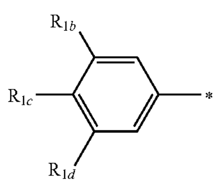

10-13(14)

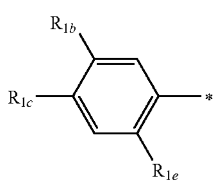

10-13(15)

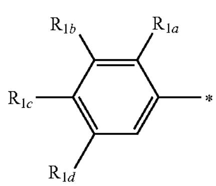

10-13(16)

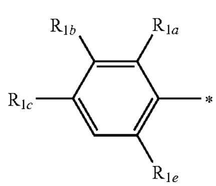

-continued 10-13(17)

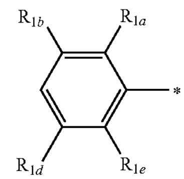

10-13(18)

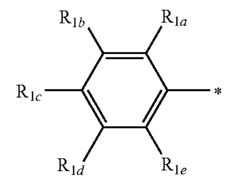

10-13

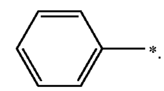

In Formulae 10-13(1) to 10-13(18) and 10-13, $R_{1a}$ to $R_{1e}$ are each independently the same as defined in connection with $R_1$, wherein $R_{1a}$ to $R_{1e}$ are not each hydrogen, and * indicates a binding site to a neighboring atom (e.g., carbon atom).

For example, a group represented by

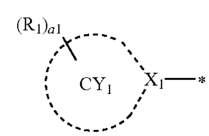

in Formula 2 may be a group represented by one of Formulae 10-13 to 10-240, wherein $R_1$, $R_2$, $R_4$, $R_5$, $R_{21}$, and $R_{10a}$ may each independently be hydrogen, deuterium, —F, a cyano group, a nitro group, $—SF_5$, $—CH_3$, $—CD_3$, $—CD_2H$, $—CDH_2$, $—CF_3$, $—CF_2H$, $—CFH_2$, a group represented by one of Formulae 9-1 to 9-19, a group represented by one of Formulae 10-1 to 10-240, or $—Si(Q_3)(Q_4)(Q_5)$ (wherein $Q_3$ to $Q_5$ are the same as described above), but embodiments of the present disclosure are not limited thereto:

9-1

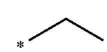

9-2

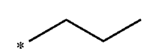

9-3

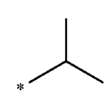

9-4

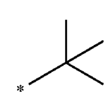

9-5

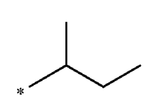

-continued
9-6
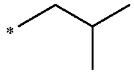
9-7
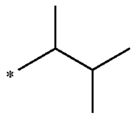
9-8
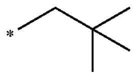
9-9
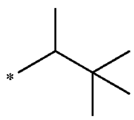
9-10
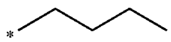
9-11
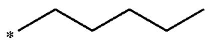
9-12
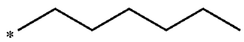
9-13
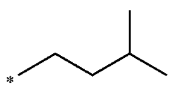
9-14
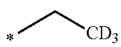
9-15
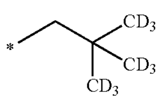
9-16
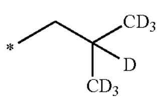
9-17
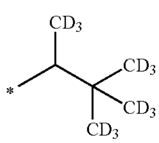
9-18
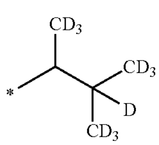
9-19
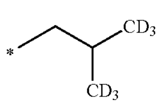
10-1
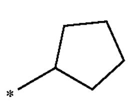
-continued
10-2
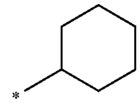
10-3
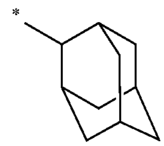
10-4
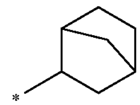
10-5
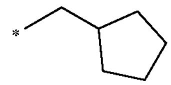
10-6
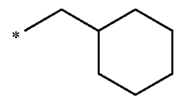
10-7
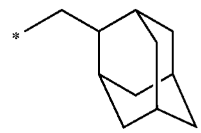
10-8
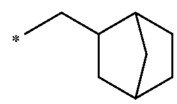
10-9
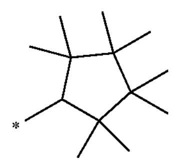
10-10
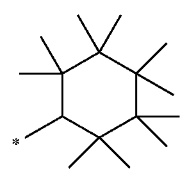
10-11
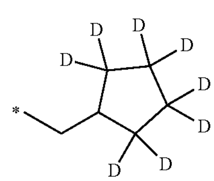
10-12
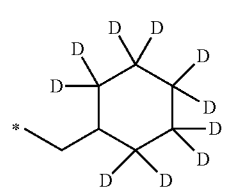

-continued
10-13
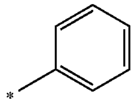
10-14
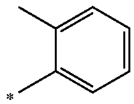
10-15
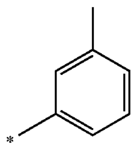
10-16
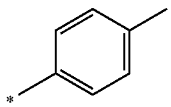
10-17
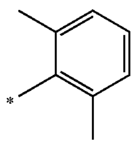
10-18
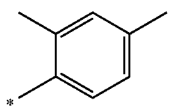
10-19
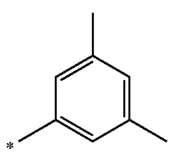
10-20
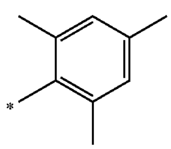
10-21
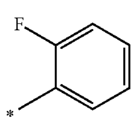
10-22
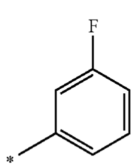
10-23
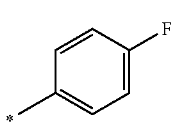
-continued
10-24
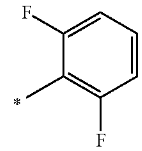
10-25
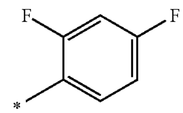
10-26
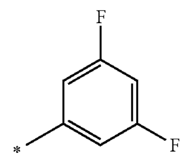
10-27
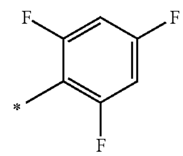
10-28
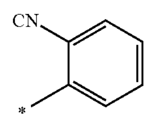
10-29
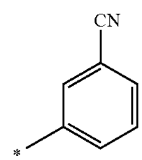
10-30
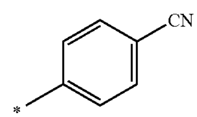
10-31
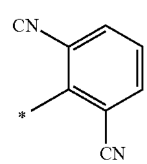
10-32
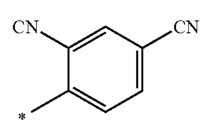
10-33
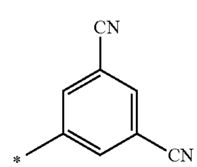

-continued
10-34
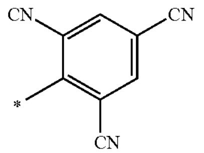
10-35
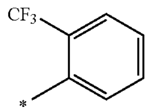
10-36
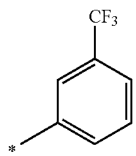
10-37
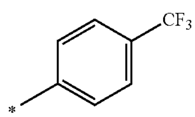
10-38
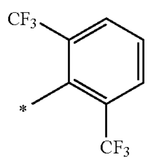
10-39
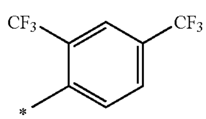
10-40
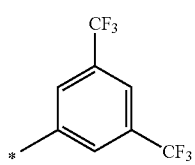
10-41
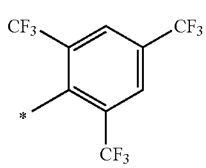
10-42
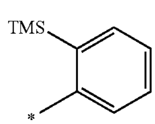
10-43
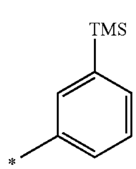
-continued
10-44
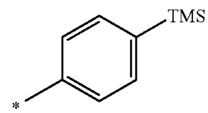
10-45
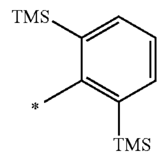
10-46
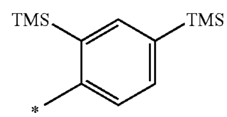
10-47
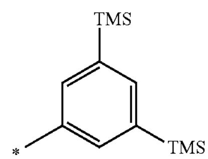
10-48
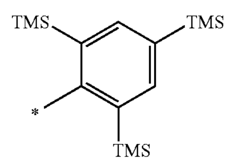
10-49
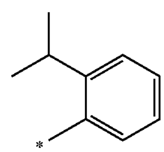
10-50
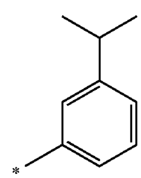
10-51
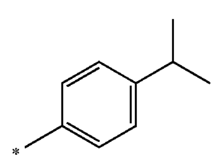
10-52
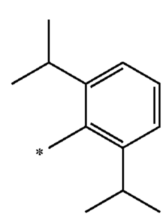

-continued
10-53
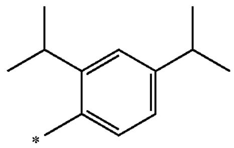
10-54
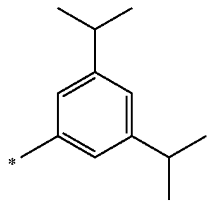
10-55
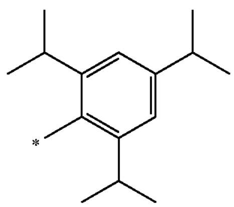
10-56
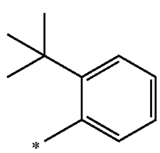
10-57
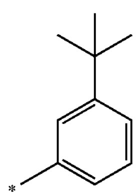
10-58
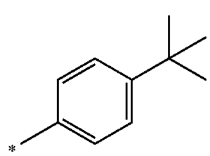
10-59
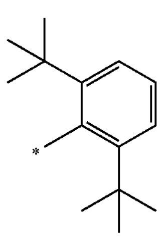
10-60
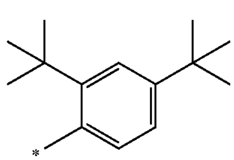
-continued
10-61
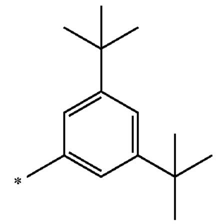
10-62
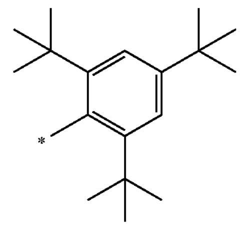
10-63
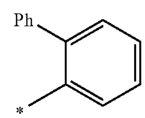
10-64
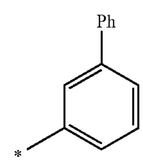
10-65
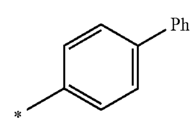
10-66
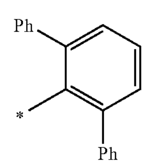
10-67
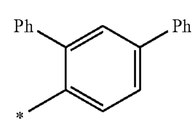
10-68
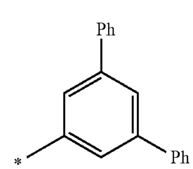
10-69
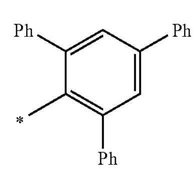

-continued
10-70
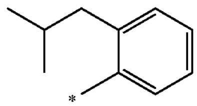
10-71
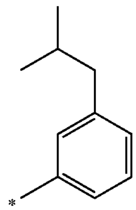
10-72
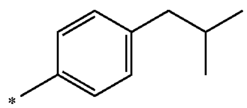
10-73
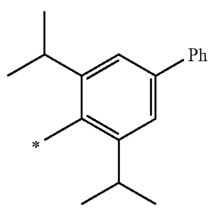
10-74
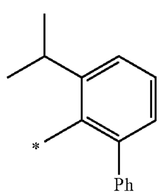
10-75
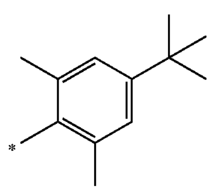
10-76
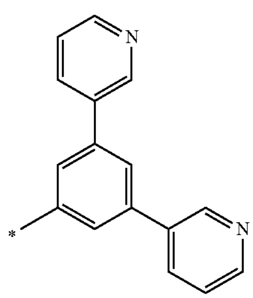
-continued
10-77
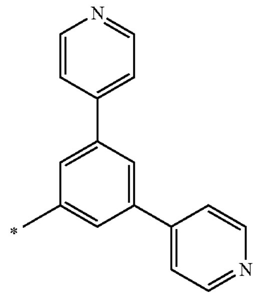
10-78
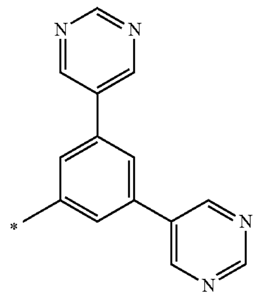
10-79
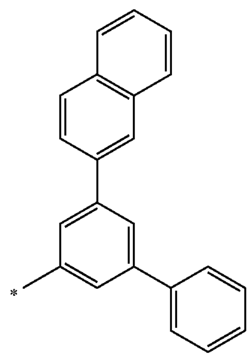
10-80
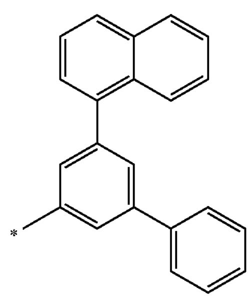
10-81
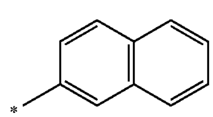
10-82
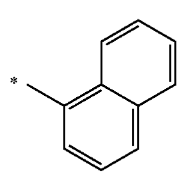

-continued
10-83
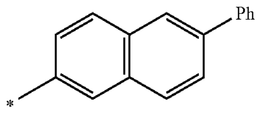
10-84
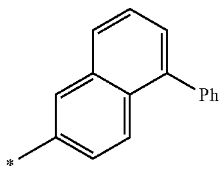
10-85
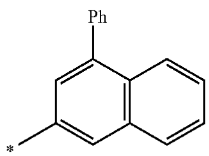
10-86
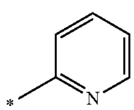
10-87
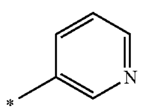
10-88
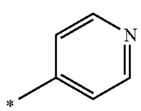
10-89
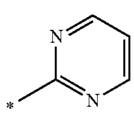
10-90
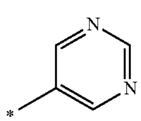
10-91
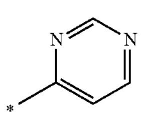
10-92
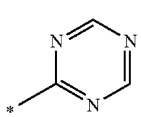
10-93
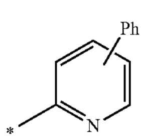
-continued
10-94
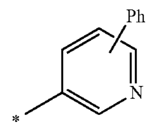
10-95
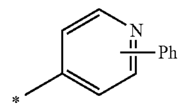
10-96
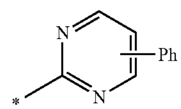
10-97
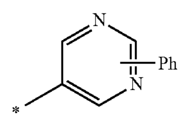
10-98
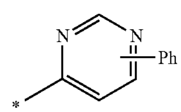
10-99
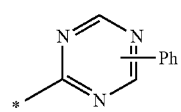
10-100
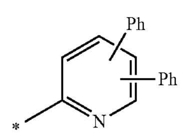
10-101
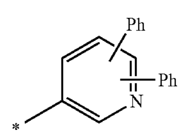
10-102
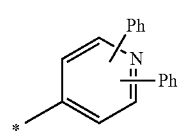
10-103
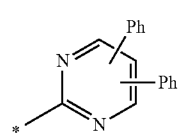
10-104
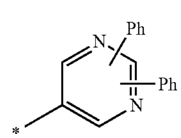

-continued
10-105
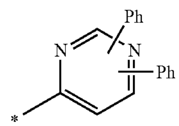
10-106
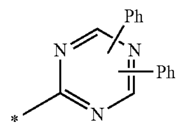
10-107
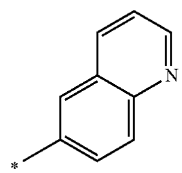
10-108
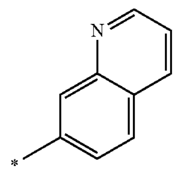
10-109
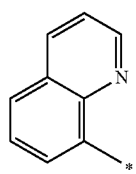
10-110
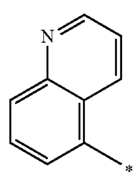
10-111
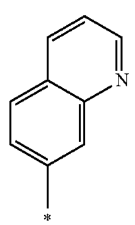
10-112
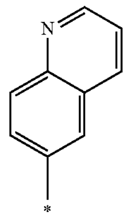
-continued
10-113
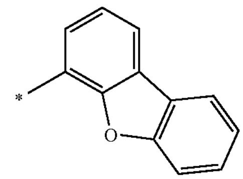
10-114
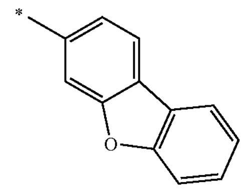
10-115
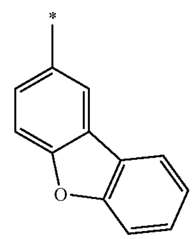
10-116
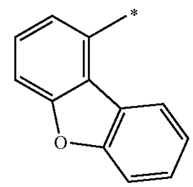
10-117
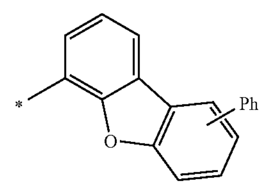
10-118
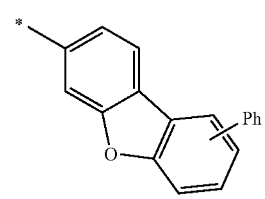
10-119
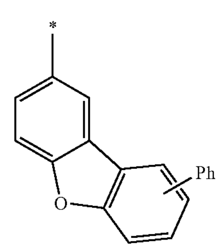

-continued
10-120
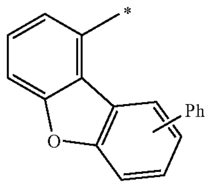
10-121
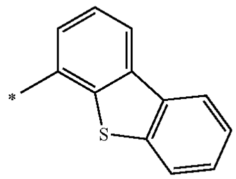
10-122
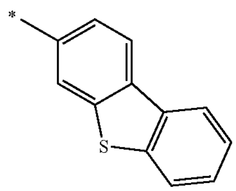
10-123
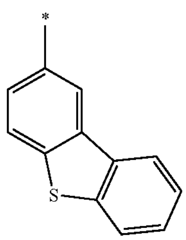
10-124
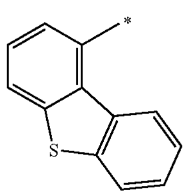
10-125
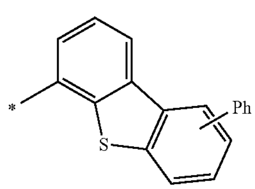
10-126
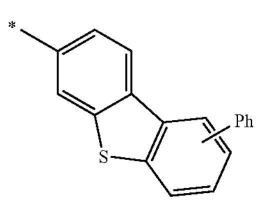
-continued
10-127
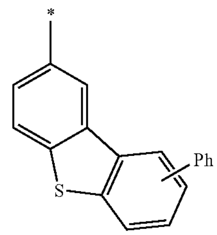
10-128
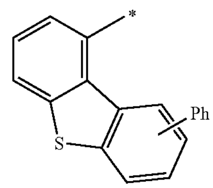
10-129
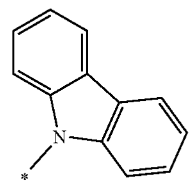
10-130
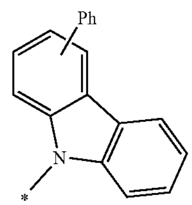
10-131
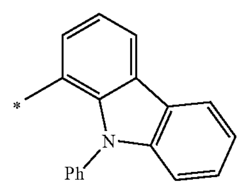
10-132
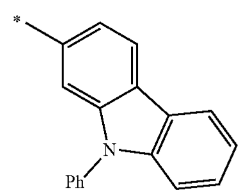
10-133
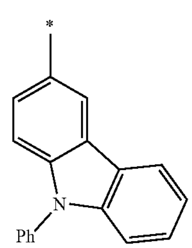

-continued
10-134
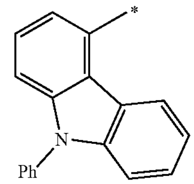
10-135
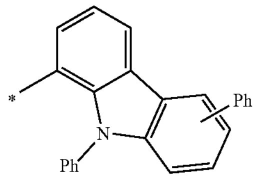
10-136
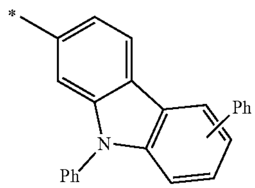
10-137
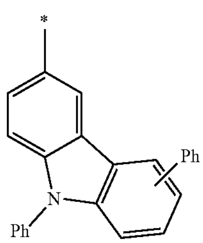
10-138
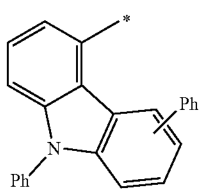
10-139
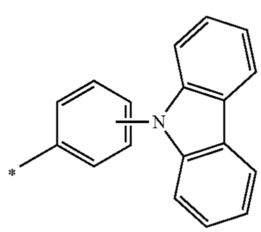
10-140
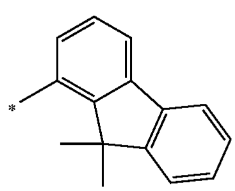
10-141
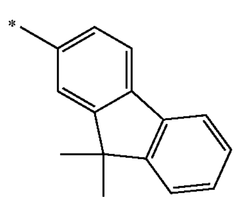
-continued
10-142
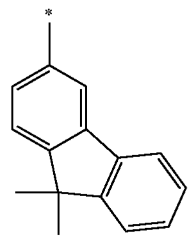
10-143
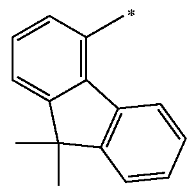
10-144
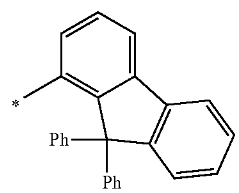
10-145
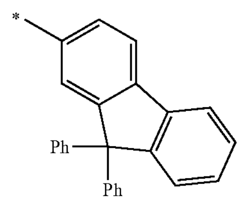
10-146
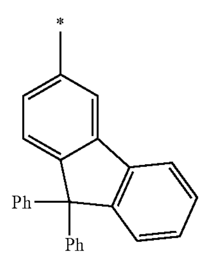
10-147
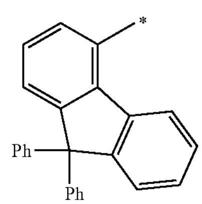
10-148
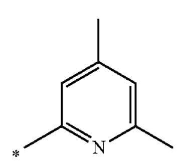
10-149
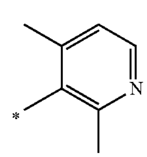

-continued
10-150
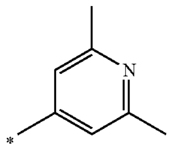
10-151
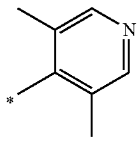
10-152
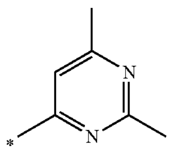
10-153
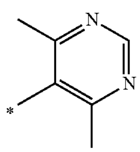
10-154
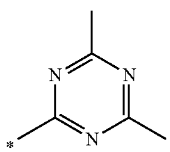
10-155
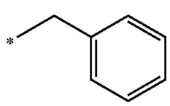
10-156
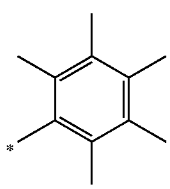
10-157
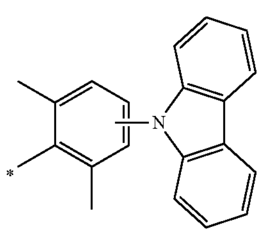
10-158
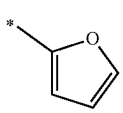
10-159
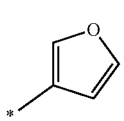
-continued
10-160
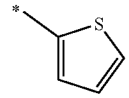
10-161
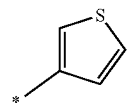
10-162
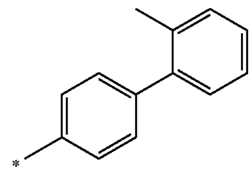
10-163
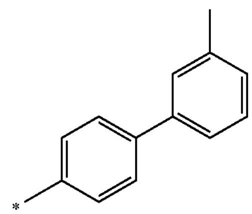
10-164
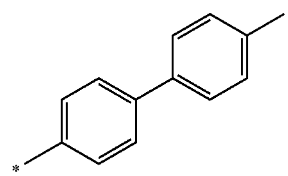
10-165
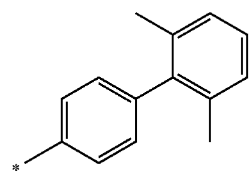
10-166
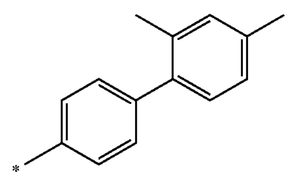
10-167
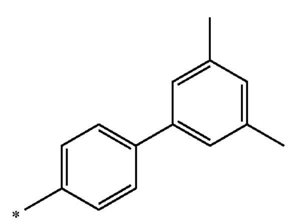
10-168
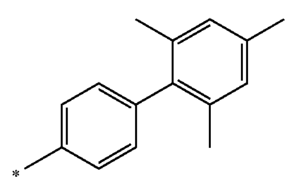

-continued
10-169
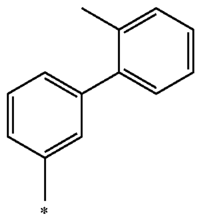
10-170
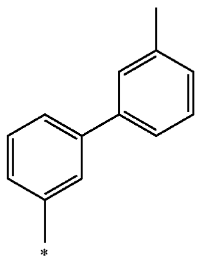
10-171
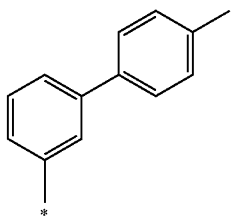
10-172
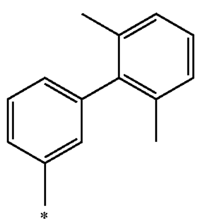
10-173
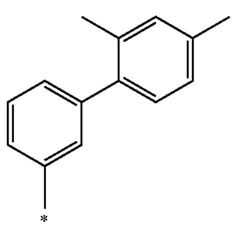
10-174
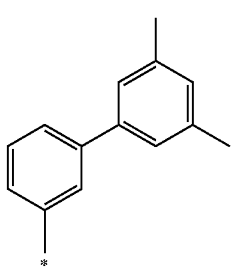
-continued
10-175
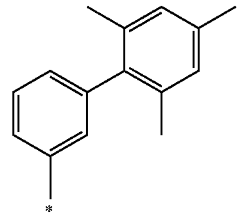
10-176
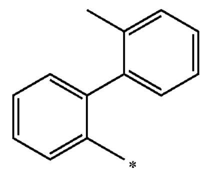
10-177
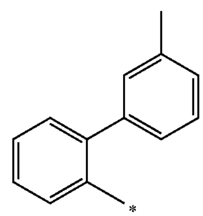
10-178
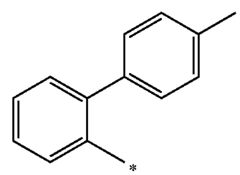
10-179
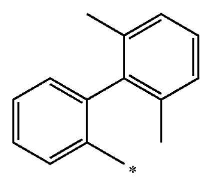
10-180
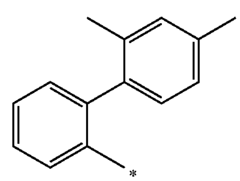
10-181
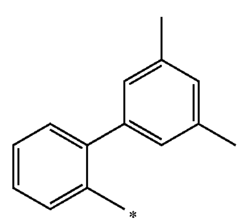
10-182
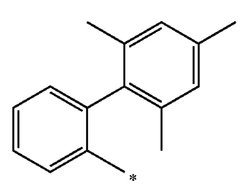

-continued
10-183
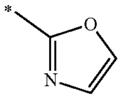
10-184
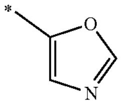
10-185
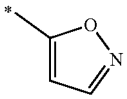
10-186
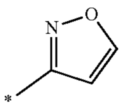
10-187
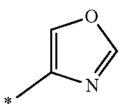
10-188
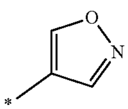
10-189
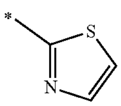
10-190
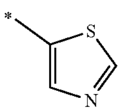
10-191
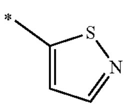
10-192
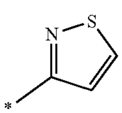
10-193
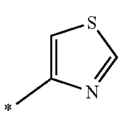
10-194
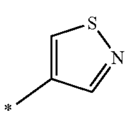
10-195
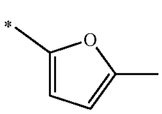
-continued
10-196
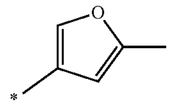
10-197
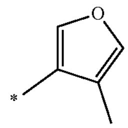
10-198
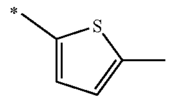
10-199
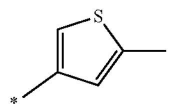
10-200
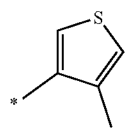
10-201
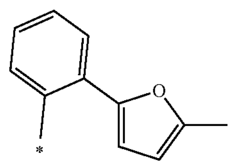
10-202
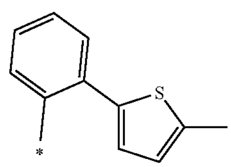
10-203
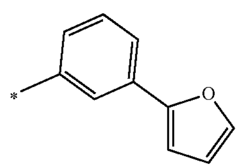
10-204
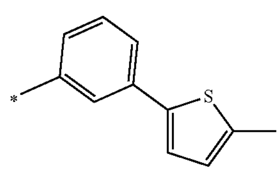
10-205
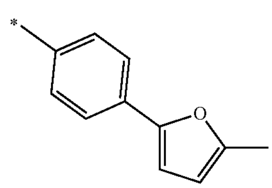

-continued
10-206
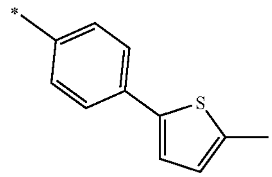
10-207
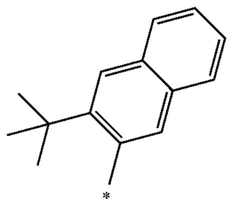
10-208
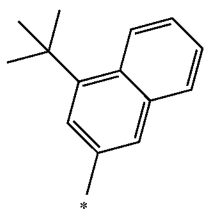
10-209
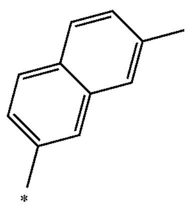
10-210
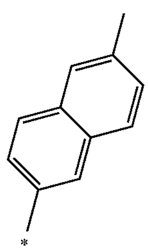
10-211
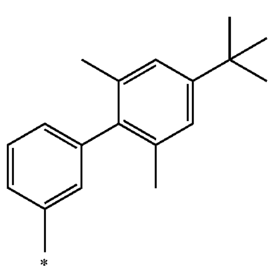
10-212
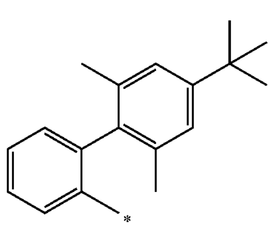
-continued
10-213
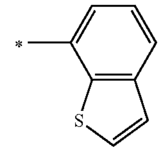
10-214
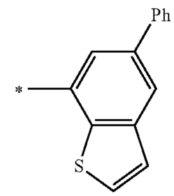
10-215
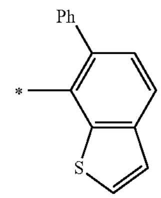
10-216
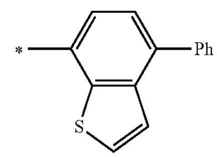
10-217
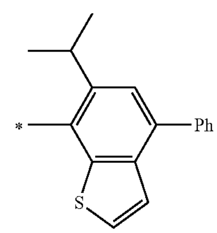
10-218
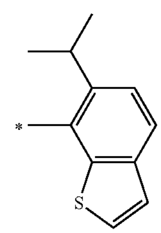
10-219
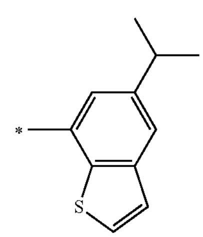
10-220
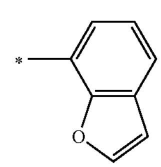

-continued
10-221
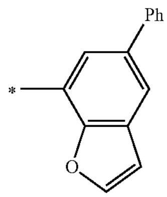
10-222
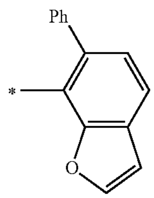
10-223
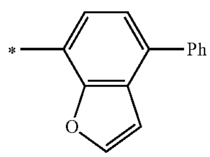
10-224
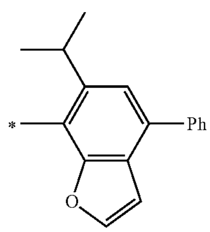
10-225
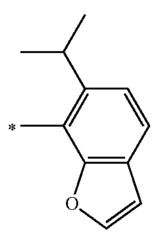
10-226
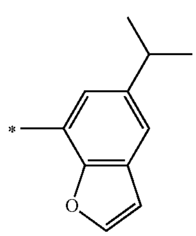
10-227
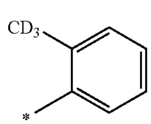
10-228
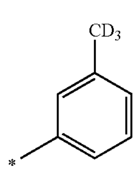
-continued
10-229
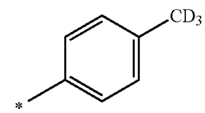
10-230
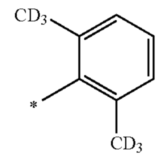
10-231
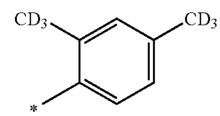
10-232
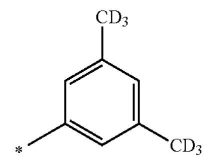
10-233
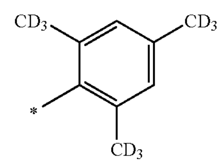
10-234
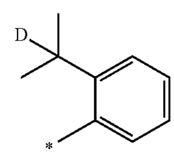
10-235
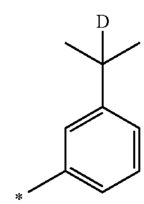
10-236
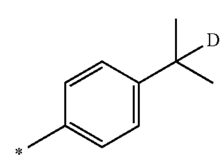
10-237
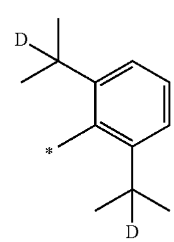

-continued 10-238

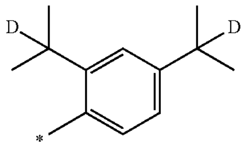

10-239

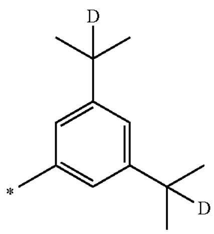

10-240

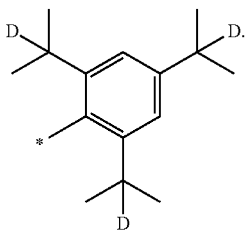

In Formulae 9-1 to 9-19 and 10-1 to 10-240,* indicates a binding site to a neighboring atom, Ph indicates a phenyl group, and TMS indicates a trimethylsilyl group.

In Formula 2, $L_{11}$ may be a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$, wherein $R_{10a}$ is the same as described above.

For example, $L_{11}$ may be a benzene group, a naphthalene group, an anthracene group, a phenanthrene group, a triphenylene group, a pyrene group, a chrysene group, a cyclopentadiene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, or a benzothiadiazole group, each unsubstituted or substituted with at least one $R_{10a}$, but embodiments of the present disclosure are not limited thereto.

In Formula 2, b11 indicates the number of $L_{11}$, and may be an integer from 0 to 10, wherein, when b11 is 0, a group represented by *-$(L_{11})_{b11}$-*' may be a single bond, and when b11 is 2 or more, two or more $L_{11}$(s) may be identical to or different from each other. For example, b11 may be 0, 1, 2, or 3, but embodiments of the present disclosure are not limited thereto.

In Formula 2, two of a plurality of neighboring $R_{21}$(s) may optionally be linked to form a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$ (for example, a benzene group, a cyclopentane group, a cyclopentadiene group, a furan group, a thiophene group, a pyrrole group, a silole group, an indene group, a benzofuran group, a benzothiophene group, an indole group, or a benzosilole group, each unsubstituted or substituted with at least one $R_{10a}$, wherein $R_{10a}$ is the same as defined in connection with $R_{21}$). Detailed descriptions of a $C_5$-$C_{30}$ carbocyclic group and a $C_2$-$C_{30}$ heterocyclic group are the same as described above.

In Formula 2, * and *' each indicate a binding site to M in Formula 1.

In one embodiment, a group represented by

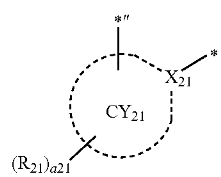

in Formula 2 may be a group represented by one of Formulae CY21-1 to CY21-25:

CY21-1

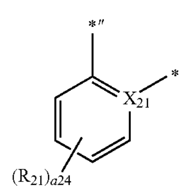

CY21-2

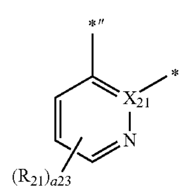

CY21-3

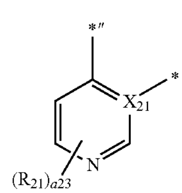

-continued
CY21-4
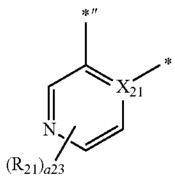
CY21-5
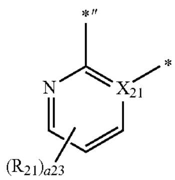
CY21-6
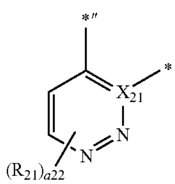
CY21-7
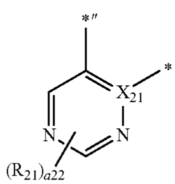
CY21-8
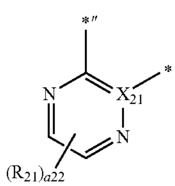
CY21-9
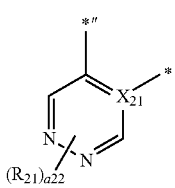
CY21-10
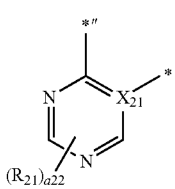
CY21-11
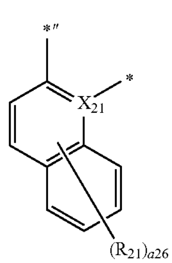
-continued
CY21-12
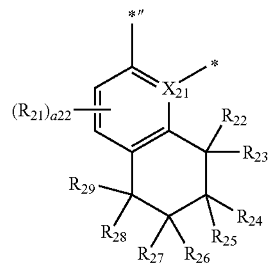
CY21-13
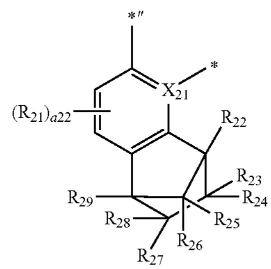
CY21-14
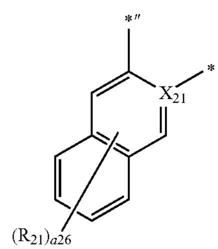
CY21-15
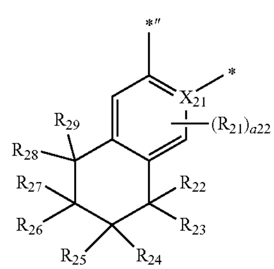
CY21-16
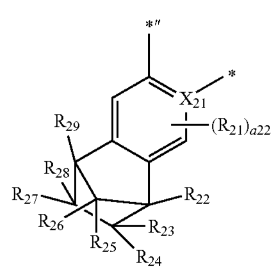
CY21-17
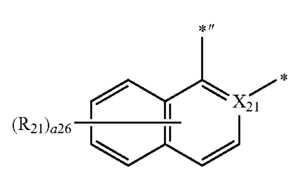

-continued

CY21-18

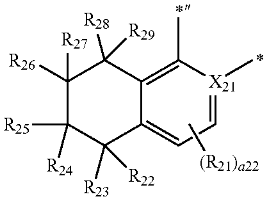

CY21-19

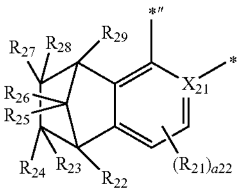

CY21-20

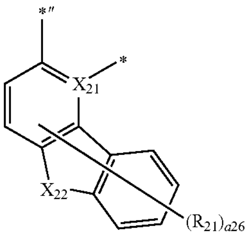

CY21-21

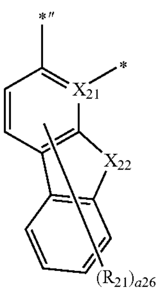

CY21-22

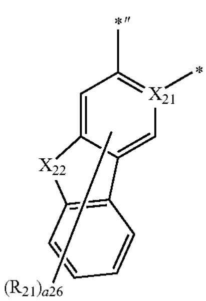

CY21-23

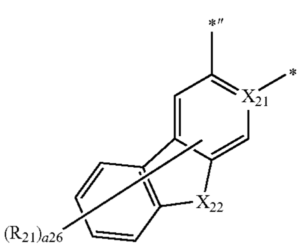

-continued

CY21-24

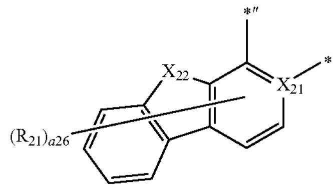

CY21-25

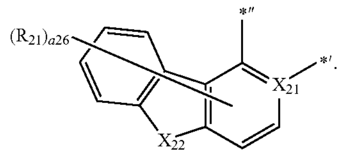

In Formulae CY21-1 to CY21-25, $X_{21}$ and $R_{21}$ may each independently be the same as described herein, $X_{22}$ may be $C(R_{22})(R_{23})$, $N(R_{22})$, O, S, or $Si(R_{22})(R_{23})$, $R_{22}$ to $R_{29}$ may each independently be the same as defined in connection with $R_{21}$, a26 may be an integer from 0 to 6, a24 may be an integer from 0 to 4, a23 may be an integer from 0 to 3, a22 may be an integer from 0 to 2,

*" indicates a binding site to a carbon atom of a neighboring 6-membered ring in Formula 2, and

* indicates a binding site to M in Formula 1.

In one embodiment, a group represented by

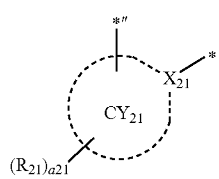

in Formula 2 may be a group represented by one of Formulae CY21(1) to CY21(56) or a group represented by Formulae CY21-20 to CY21-25:

CY21(1)

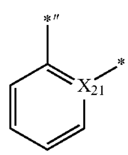

CY21(2)

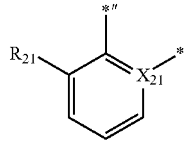

CY21(3)

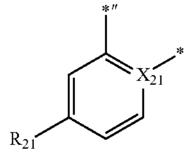

CY21(4)
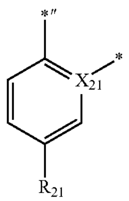
CY21(5)
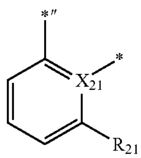
CY21(6)
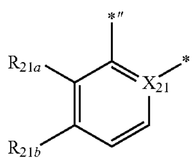
CY21(7)
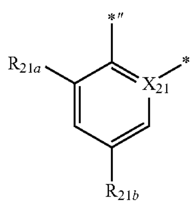
CY21(8)
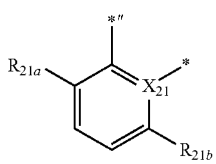
CY21(9)
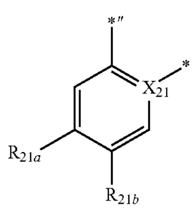
CY21(10)
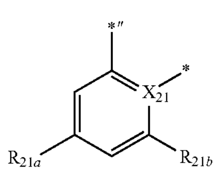
CY21(11)
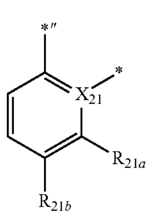
CY21(12)
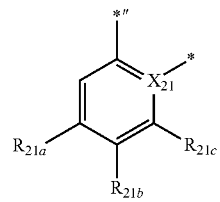
CY21(13)
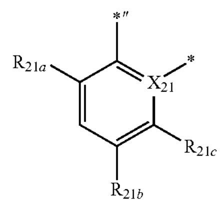
CY21(14)
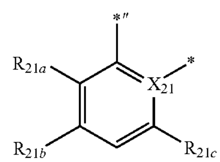
CY21(15)
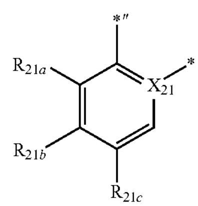
CY21(16)
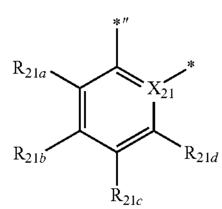
CY21(17)
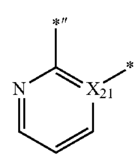
CY21(18)
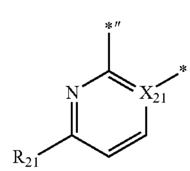
CY21(19)
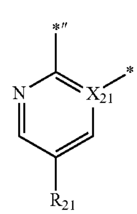

-continued
CY21(20)
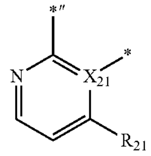
CY21(21)
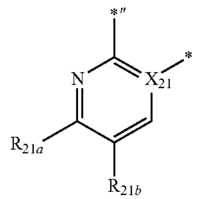
CY21(22)
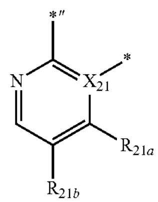
CY21(23)
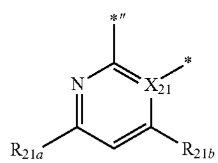
CY21(24)
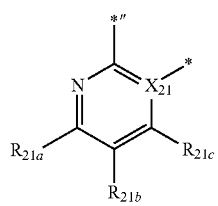
CY21(25)
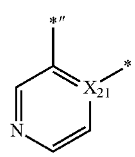
CY21(26)
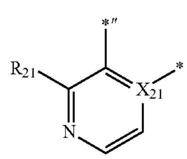
CY21(27)
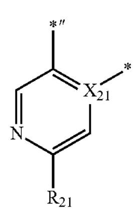
CY21(28)
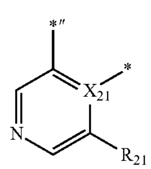
-continued
CY21(29)
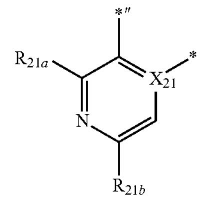
CY21(30)
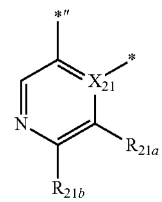
CY21(31)
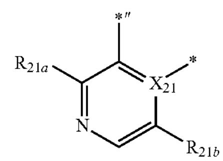
CY21(32)
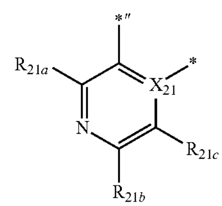
CY21(33)
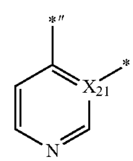
CY21(34)
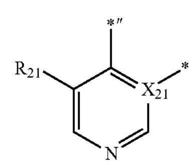
CY21(35)
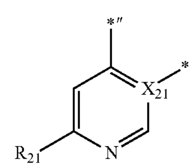
CY21(36)
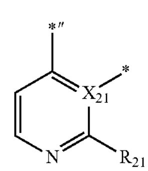
CY21(37)
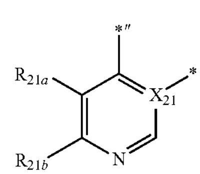

-continued
CY21(38)
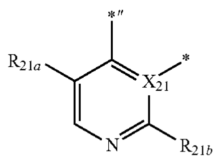
CY21(39)
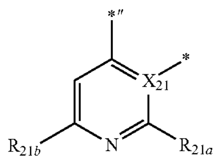
CY21(40)
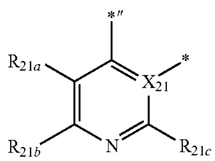
CY21(41)
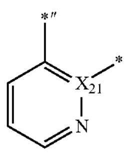
CY21(42)
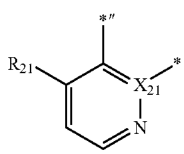
CY21(43)
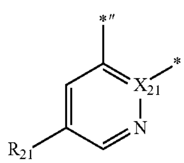
CY21(44)
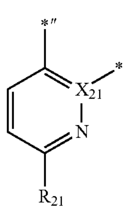
CY21(45)
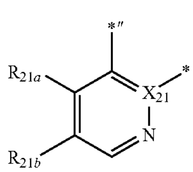
CY21(46)
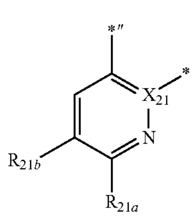
-continued
CY21(47)
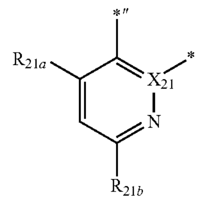
CY21(48)
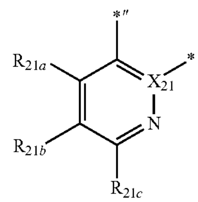
CY21(49)
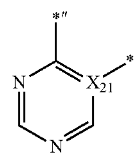
CY21(50)
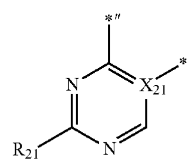
CY21(51)
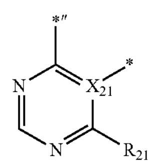
CY21(52)
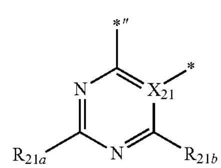
CY21(53)
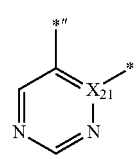
CY21(54)
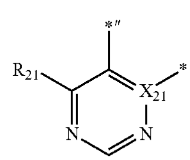
CY21(55)
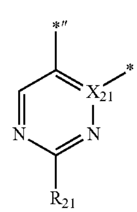

-continued

CY21(56)

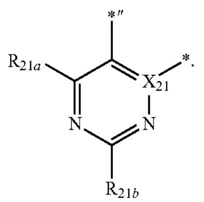

In Formulae CY21(1) to CY21(56), $X_{21}$ and $R_{21}$ may each independently be the same as described herein, $R_{21a}$ to $R_{21d}$ may each independently be the same as defined in connection with $R_{21}$, and $R_{21}$ and $R_{21a}$ to $R_{21d}$ are not each hydrogen,

*" indicates a binding site to a carbon atom of a neighboring 6-membered ring in Formula 2, and

* indicates a binding site to M in Formula 1.

In one embodiment, a group represented by

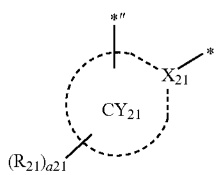

in Formula 2 may be a group represented by one of Formulae CY21(1), CY21(3), CY21(10) and a group represented by one of Formulae CY21-20 to CY21-25, but embodiments of the present disclosure are not limited thereto. For example, in Formula CY21(10), $R_{21a}$ and $R_{21b}$ may be identical to or different from each other. In one embodiment, in Formula CY21(10), $R_{21a}$ and $R_{21b}$ may be different from each other, and the number of carbon atoms included in $R_{21a}$ may be larger than the number of carbon atoms included in $R_{21b}$.

In one embodiment, in Formula 1, $L_1$ may be a ligand represented by Formula 2A or 2B, but embodiments of the present disclosure are not limited thereto:

Formula 2A

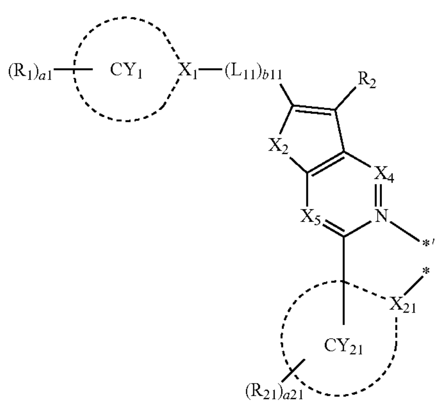

-continued

Formula 2B

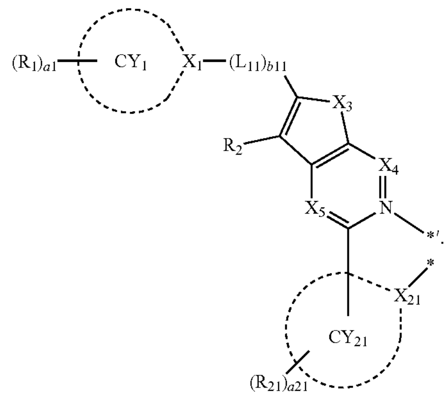

In Formulae 2A and 2B, $X_1$, $X_{21}$, ring $CY_1$, ring $CY_{21}$, $X_4$, $X_5$, $R_1$, $R_2$, $R_{21}$, a1, a21, $L_{11}$, b11*, and *' may each independently be the same as described herein, wherein $X_2$ and $X_3$ may each independently be O, S, or Se.

In Formula 1, $L_2$ may be a bidentate ligand linked to M of Formula 1 via O, S, N, C, P, Si, or As.

In one embodiment, in Formula 1, $L_2$ may be a bidentate ligand represented by Formula 3:

Formula 3

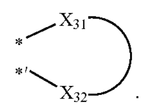

In Formula 3, $X_{31}$ and $X_{32}$ may each independently be O, S, N, C, P, Si, or As,

indicates an arbitrary atom group linking $X_{31}$ and $X_{32}$ to each other, and

* and *' each indicate a binding site to M in Formula 1.

For example, in Formula 3, i) $X_{31}$ and $X_{32}$ may each be O ii) $X_{31}$ may be O, and $X_{32}$ may be N, or iii) $X_{31}$ may be N, and $X_{32}$ may be C, but embodiments of the present disclosure are not limited thereto.

In one or more embodiments, in Formula 1, $L_2$ may be a monodentate ligand, for example, $I^-$, $Br^-$, $Cl^-$, sulfide, nitrate, azide, hydroxide, cyanate, isocyanate, thiocyanate, water, acetonitrile, pyridine, ammonia, carbon monoxide, $P(Ph)_3$, $P(Ph)_2CH_3$, $PPh(CH_3)_2$, or $P(CH_3)_3$, but embodiments of the present disclosure are not limited thereto.

In one or more embodiments, in Formula 1, $L_2$ may be a bidentate ligand, for example, oxalate, acetylacetonate, picolinic acid, 1,2-bis(diphenylphosphino)ethane, 1,1-bis(diphenylphosphino)methane, glycinate, or ethylenediamine, but embodiments of the present disclosure are not limited thereto.

In one or more embodiments, in Formula 1, $L_2$ may be a group represented by one of Formulae 3A to 3F:

3A

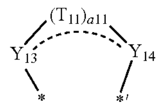

3B

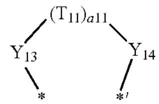

3C

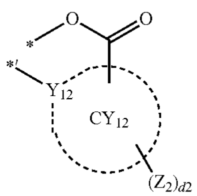

3D

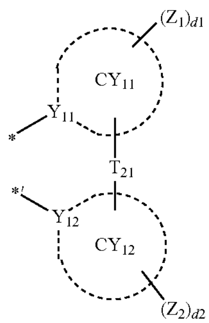

3E

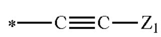

3F

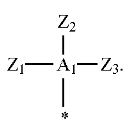

In Formulae 3A to 3F, $Y_{13}$ may be O, N, $N(Z_1)$, $P(Z_1)(Z_2)$, or $As(Z_1)(Z_2)$, $Y_{14}$ may be O, N, $N(Z_3)$, $P(Z_3)(Z_4)$, or $As(Z_3)(Z_4)$, $T_{11}$ may be a single bond, a double bond, *—C($Z_{11}$)($Z_{12}$)—*', *—C($Z_{11}$)═C($Z_{12}$)—*', *═C($Z_{11}$)—*', *—C($Z_{11}$)═*', *═C($Z_{11}$)—C($Z_{12}$)═C($Z_{13}$)—*', *—C($Z_{11}$)═C($Z_{12}$)—C($Z_{13}$)═*', *—N($Z_{11}$)—*', or a $C_5$-$C_{30}$ carbocyclic group that is unsubstituted or substituted with at least one $Z_{11}$, a11 may be an integer from 1 to 10, $Y_{11}$ and $Y_{12}$ may each independently be C or N, $T_{21}$ may be a single bond, a double bond, O, S, $C(Z_{11})(Z_{12})$, $Si(Z_{11})(Z_{12})$, or $N(Z_{11})$, ring $CY_{11}$ and ring $CY_{12}$ may each independently be a $C_5$-$C_{30}$ carbocyclic group or a $C_2$-$C_{30}$ heterocyclic group, $A_1$ may be P or As, $Z_1$ to $Z_4$ and $Z_{11}$ to $Z_{13}$ may each independently be the same as defined in connection with $R_{21}$, d1 and d2 may each independently be an integer from 0 to 10, and

* and *' each indicate a binding site to M in Formula 1.

In Formulae 3A to 3F, the $C_5$-$C_{30}$ carbocyclic group and the $C_2$-$C_{30}$ heterocyclic group may each independently be the same as defined in connection with ring $CY_{21}$.

For example, a moiety represented by

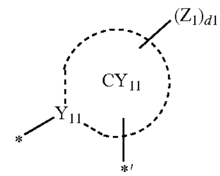

in Formula 3D may be a group represented by one of Formulae CY11-1 to CY11-34, and/or a moiety represented by

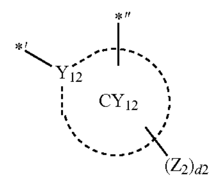

in Formulae 3C and 3D may be a group represented by Formulae one of CY12-1 to CY12-34:

CY11-1

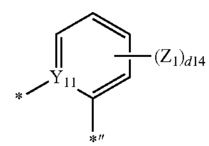

CY11-2

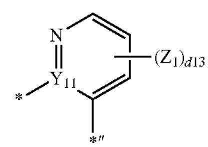

CY11-3

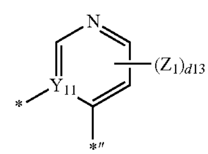

CY11-4

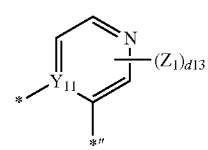

CY11-5

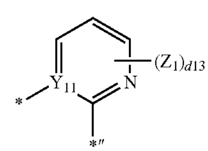

CY11-6

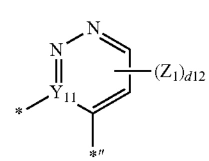

CY11-7
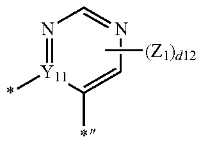
CY11-8
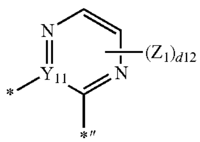
CY11-9
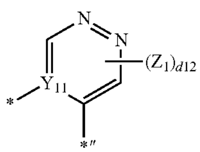
CY11-10
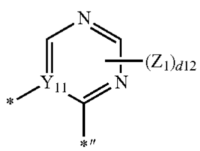
CY11-11
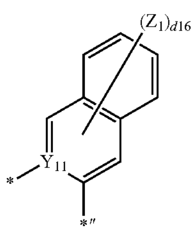
CY11-12
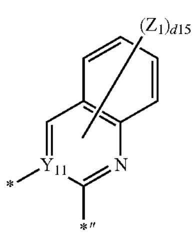
CY11-13
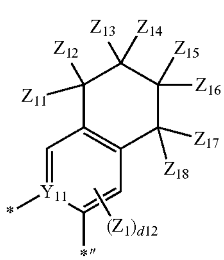
CY11-14
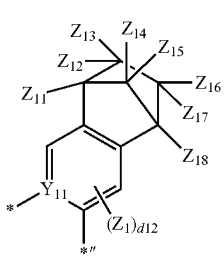
CY11-15
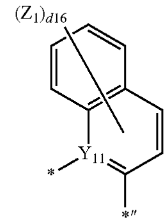
CY11-16
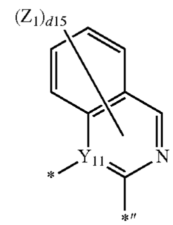
CY11-17
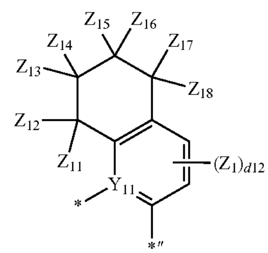
CY11-18
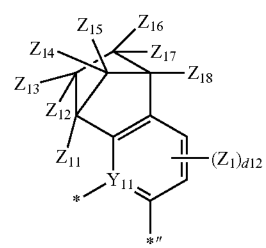
CY11-19
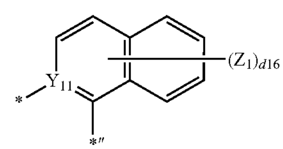
CY11-20
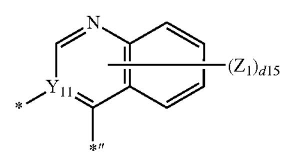
CY11-21
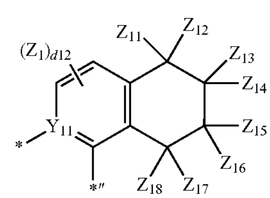
CY11-22
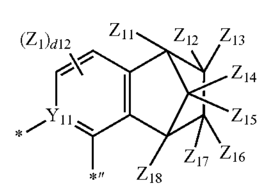

-continued
CY11-23
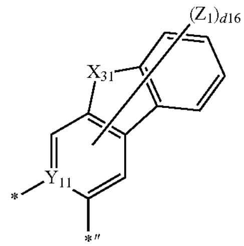
CY11-24
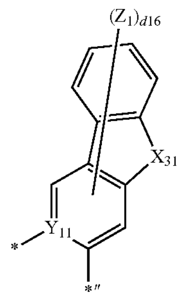
CY11-24
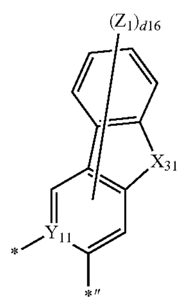
CY11-25
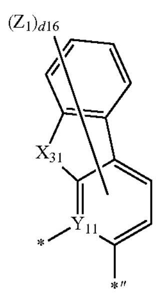
CY11-26
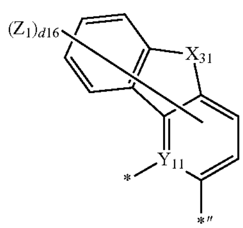
CY11-27
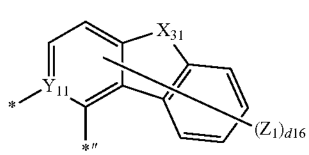
-continued
CY11-28
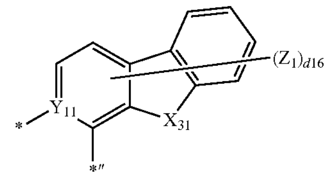
CY11-29
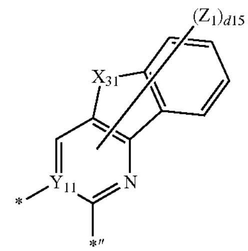
CY11-30
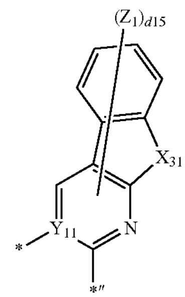
CY11-31
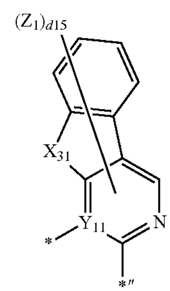
CY11-32
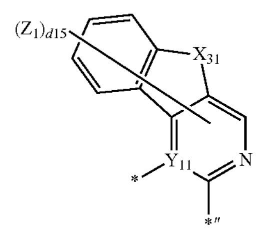
CY11-33
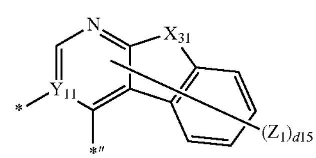
CY11-34
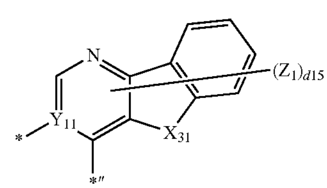

-continued
CY12-1
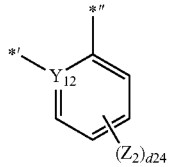
CY12-2
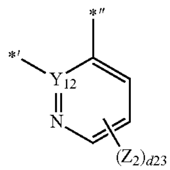
CY12-3
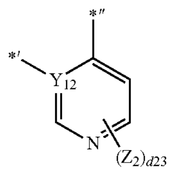
CY12-4
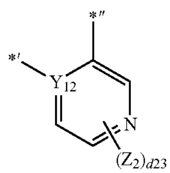
CY12-5
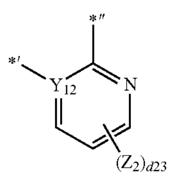
CY12-6
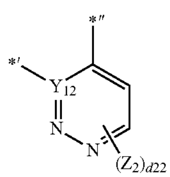
CY12-7
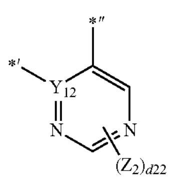
CY12-8
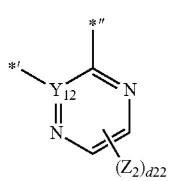
CY12-9
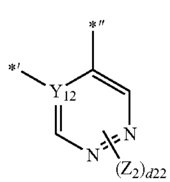
-continued
CY12-10
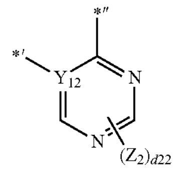
CY12-11
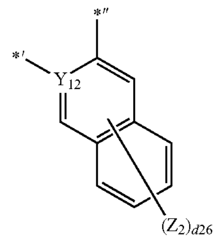
CY12-12
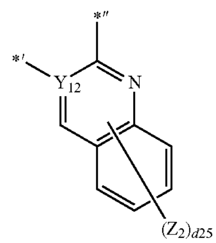
CY12-13
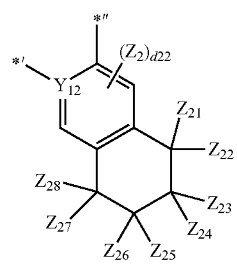
CY12-14
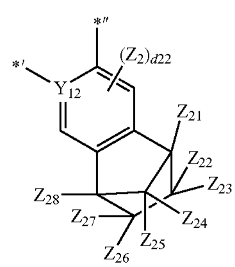
CY12-15
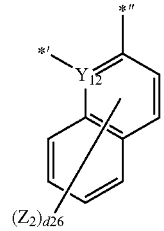

-continued
CY12-16
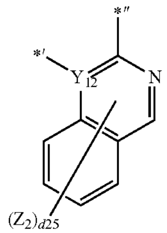
CY12-17
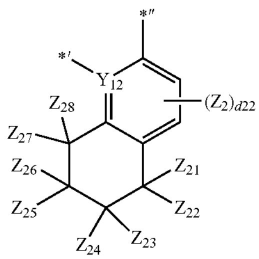
CY12-18
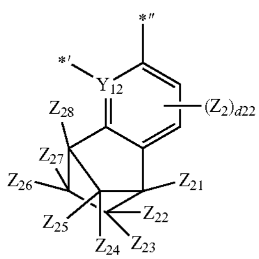
CY12-19
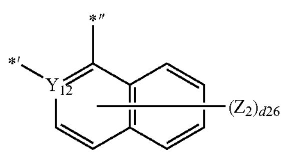
CY12-20
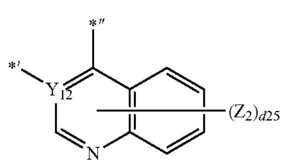
CY12-21
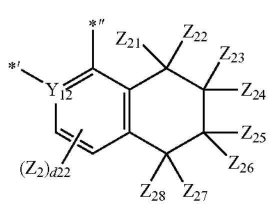
CY12-22
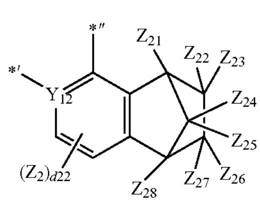
-continued
CY12-23
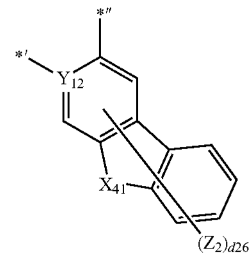
CY12-24
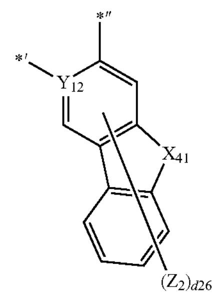
CY12-25
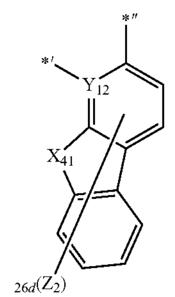
CY12-26
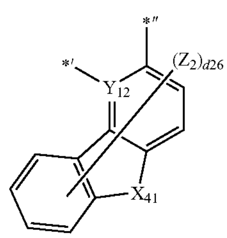
CY12-27
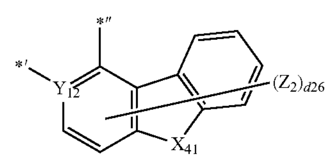
CY12-28
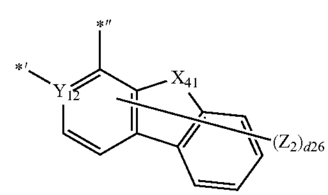

-continued

CY12-29

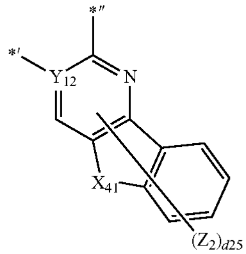

CY12-30

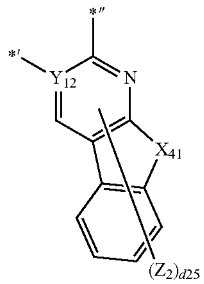

CY12-31

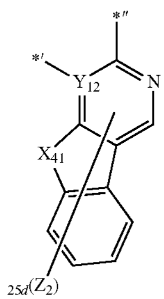

CY12-32

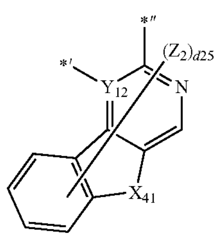

CY12-33

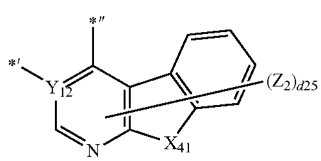

CY12-34

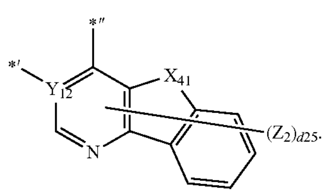

In Formulae CY11-1 to CY11-34 and CY12-1 to CY12-34, $X_{31}$ may be O, S, $N(Z_{11})$, $C(Z_{11})(Z_{12})$, or $Si(Z_{11})(Z_{12})$, $X_{41}$ may be O, S, $N(Z_{21})$, $C(Z_{21})(Z_{22})$, or $Si(Z_{21})(Z_{22})$, $Y_{11}$, $Y_{12}$, $Z_1$, and $Z_2$ may each independently be the same as described herein, $Z_{11}$ to $Z_{18}$ and $Z_{21}$ to $Z_{28}$ may each independently be the same as defined in connection with $R_{21}$, d12 and d22 may each independently be an integer from 0 to 2, d13 and d23 may each independently be an integer from 0 to 3, d14 and d24 may each independently be an integer from 0 to 4, d15 and d25 may each independently be an integer from 0 to 5, d16 and d26 may each independently be an integer from 0 to 6, and in Formulae CY11-1 to CY11-34 and CY12-1 to CY12-34, * and *' each indicate a binding site to M in Formula 1, and *" indicates a binding site to a neighboring atom in Formula 3C or $T_{21}$ in Formula 3D.

In one embodiment, in Formula 1, $L_2$ may be a group represented by one of Formulae 3-1(1) to 3-1(66) and 3-1(301) to 3-1(309), but embodiments of the present disclosure are not limited thereto:

3-1(1)

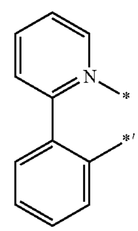

3-1(2)

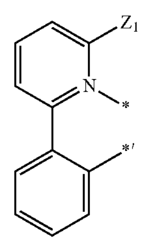

3-1(3)

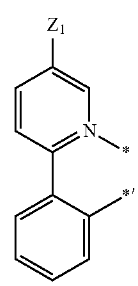

3-1(4)

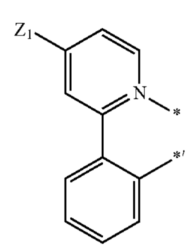

-continued
3-1(5)
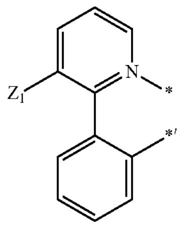
3-1(6)
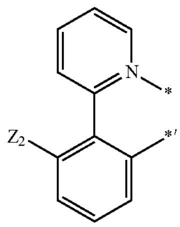
3-1(7)
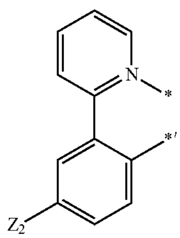
3-1(8)
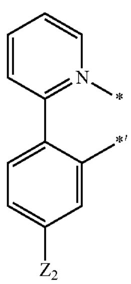
3-1(9)
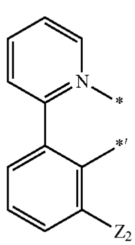
3-1(10)
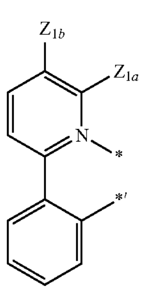
-continued
3-1(11)
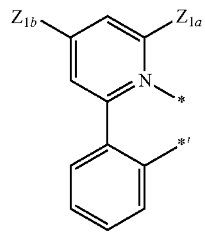
3-1(12)
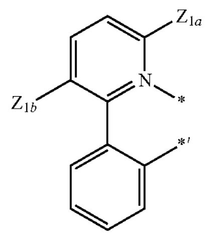
3-1(13)
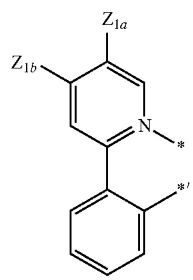
3-1(14)
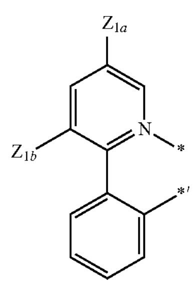
3-1(15)
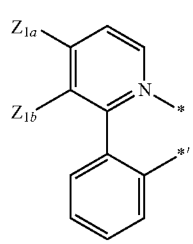
3-1(16)
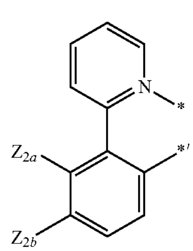

-continued
3-1(17)
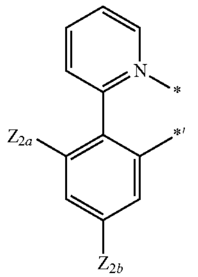
3-1(18)
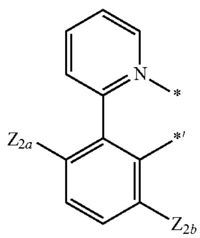
3-1(19)
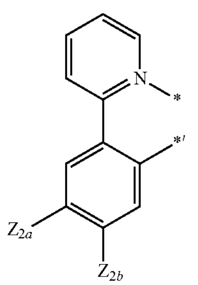
3-1(20)
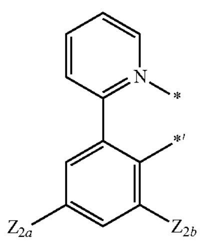
3-1(21)
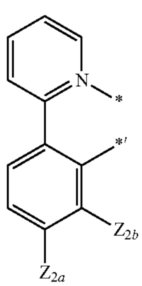
3-1(22)
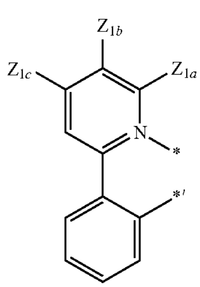
-continued
3-1(23)
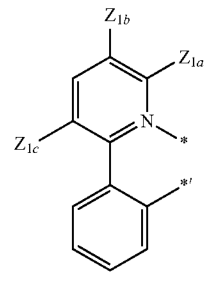
3-1(24)
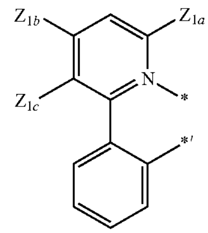
3-1(25)
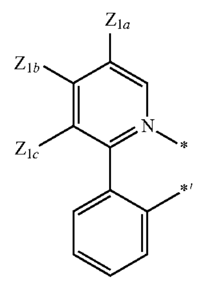
3-1(26)
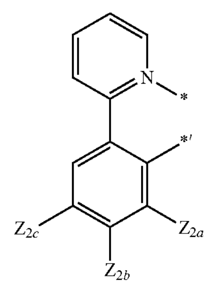
3-1(27)
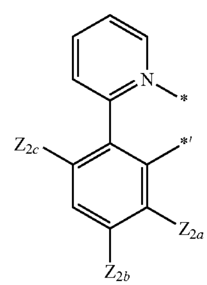
3-1(28)
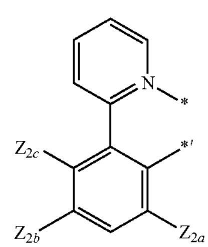

-continued
3-1(29)
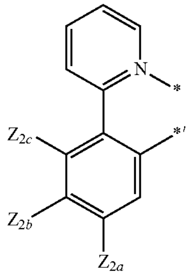
3-1(30)
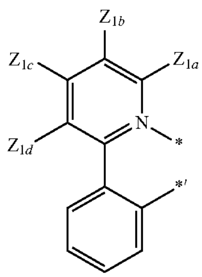
3-1(31)
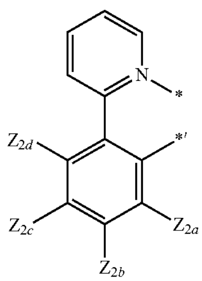
3-1(32)
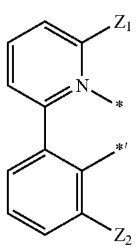
3-1(33)
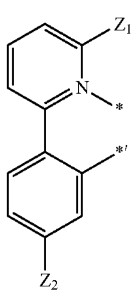
3-1(34)
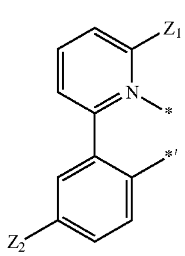
-continued
3-1(35)
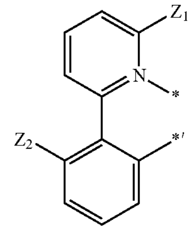
3-1(36)
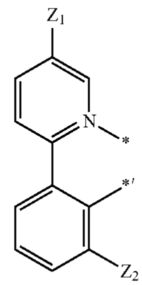
3-1(37)
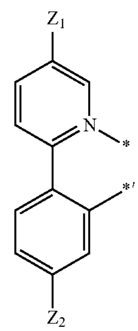
3-1(38)
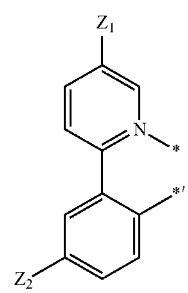
3-1(39)
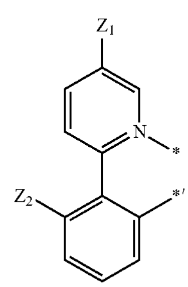

-continued
3-1(40)
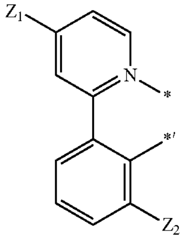
3-1(41)
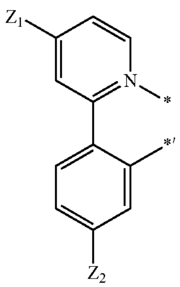
3-1(42)
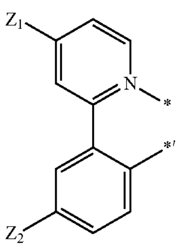
3-1(43)
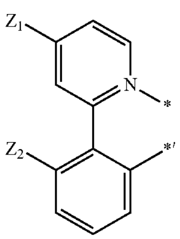
3-1(44)
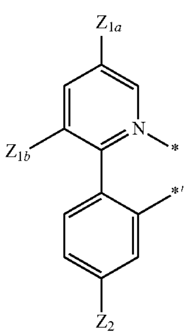
3-1(45)
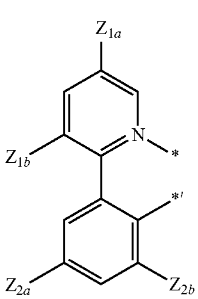
-continued
3-1(46)
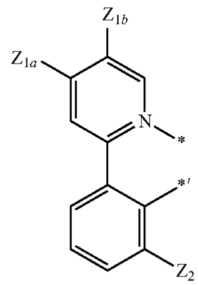
3-1(47)
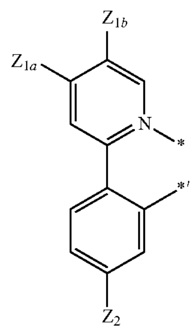
3-1(48)
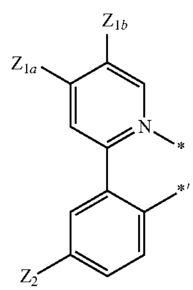
3-1(49)
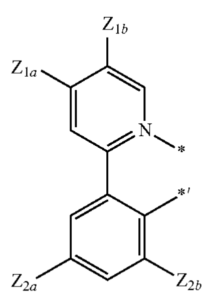
3-1(50)
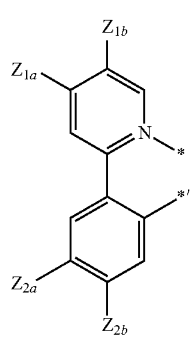

3-1(51)
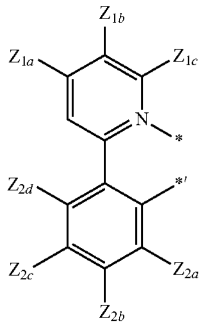
3-1(52)
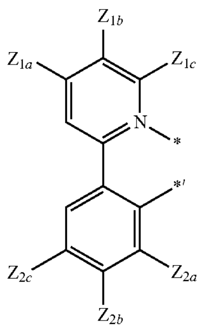
3-1(53)
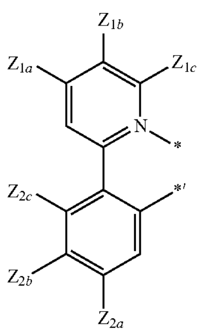
3-1(54)
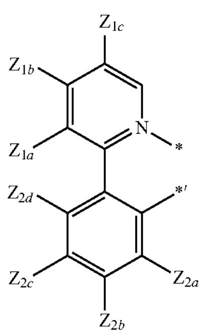
3-1(55)
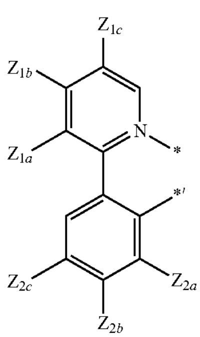
3-1(56)
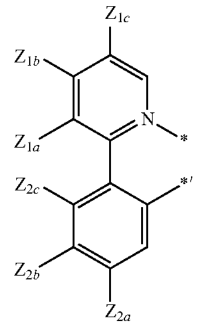
3-1(57)
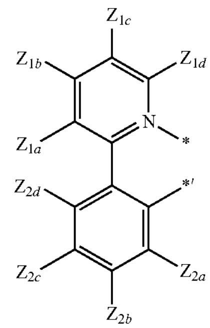
3-1(58)
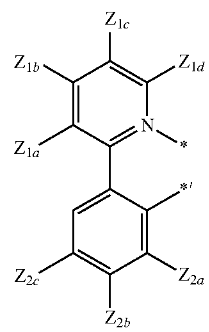
3-1(59)
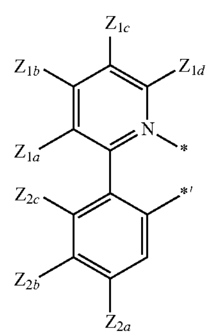
3-1(60)
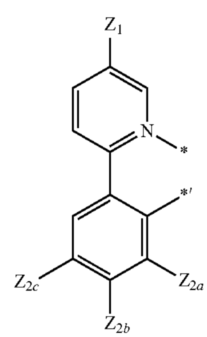

3-1(61)
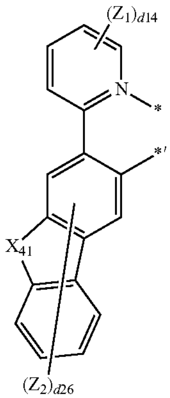
3-1(62)
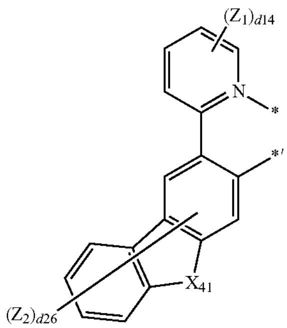
3-1(63)
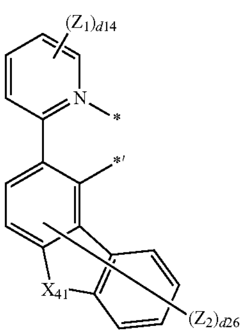
3-1(64)
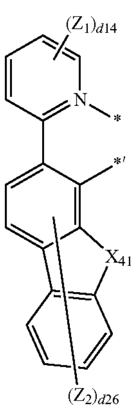
3-1(65)
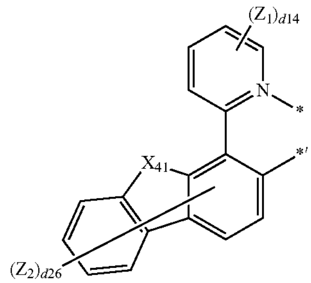
3-1(66)
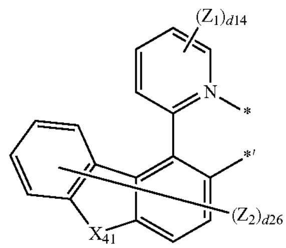
3-1(301)
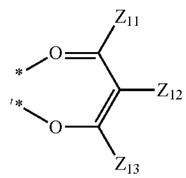
3-1(302)
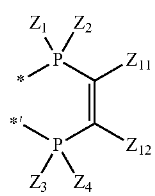
3-1(303)
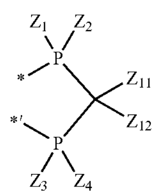
3-1(304)
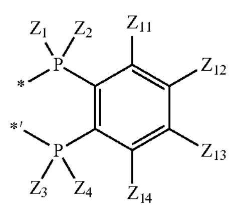
3-1(305)
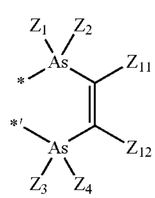

-continued 3-1(306)

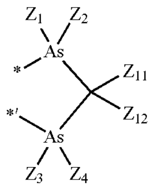

3-1(307)

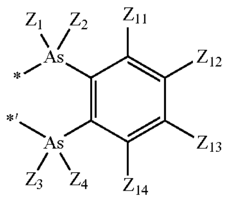

3-1(308)

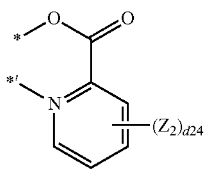

3-1(309)

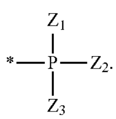

In Formulae 3-1(1) to 3-1(66) and 3-1(301) to 3-1(309), $X_{41}$ may be O, S, N($Z_{21}$), C($Z_{21}$)($Z_{22}$), or Si($Z_{21}$)($Z_{22}$), $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, $Z_{21}$ and $Z_{22}$ may each independently be the same as defined in connection with $R_{21}$, d14 may be an integer from 0 to 4, d26 may be an integer from 0 to 6, and

* and *' each indicate a binding site to M in Formula 1.

For example, $Z_{11}$ and $Z_{13}$ in Formula 3-1(301) may each independently be a methyl group.

In one embodiment, $Z_{11}$, $Z_{13}$, or a combination thereof in Formula 3-1(301) may each independently be a substituted or unsubstituted $C_2$-$C_{30}$ alkyl group or a substituted or unsubstituted $C_3$-$C_{10}$ cycloalkyl group, but embodiments of the present disclosure are not limited thereto.

In one embodiment, the organometallic compound represented by Formula 1 may emit red light or green light.

The terms "an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, and an azadibenzothiophene 5,5-dioxide group" as used herein each refer to a heterocyclic group having the same backbone as "an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, and a dibenzothiophene 5,5-dioxide group" in which at least one carbon atom constituting the cyclic groups is replaced with N.

In one or more embodiments, the organometallic compound represented by Formula 1 may be one of Compounds 1 to 469, but embodiments of the present disclosure are not limited thereto:

1

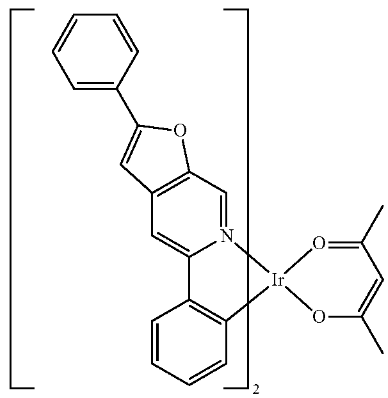

2

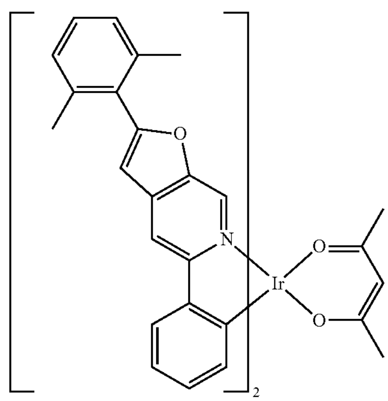

3

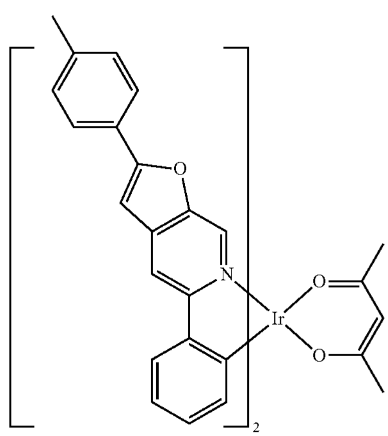

-continued
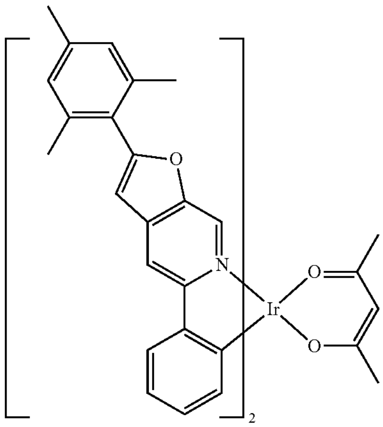
4
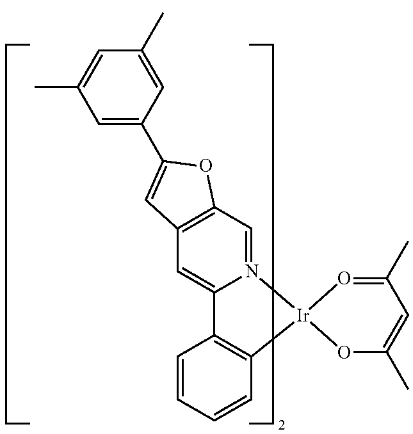
5
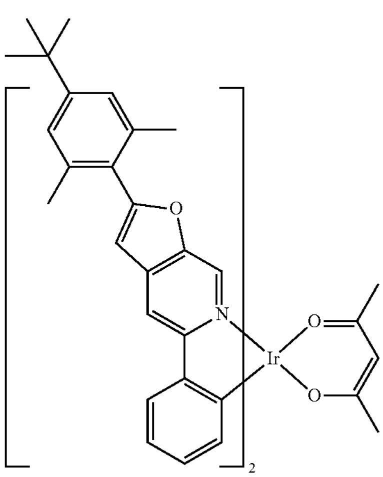
6
-continued
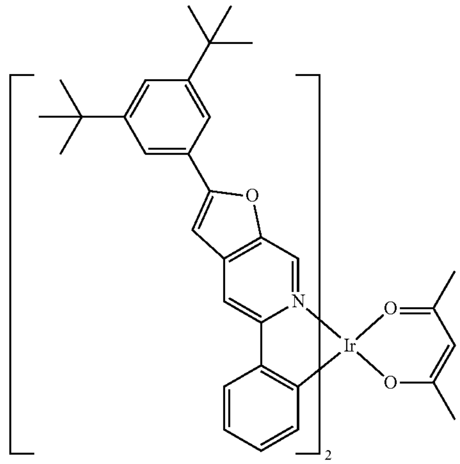
7
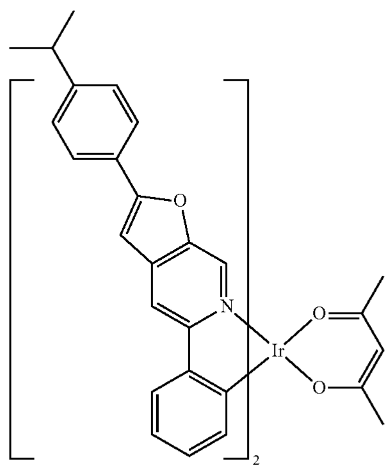
8
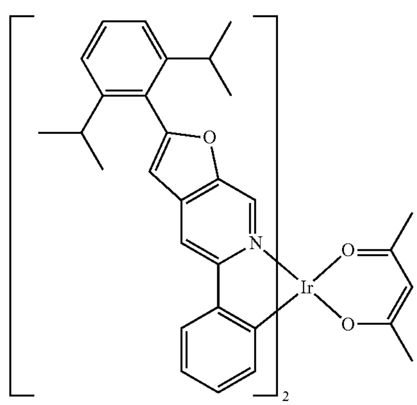
9

-continued
10
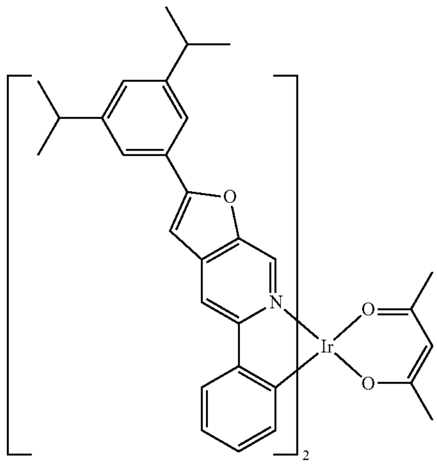
11
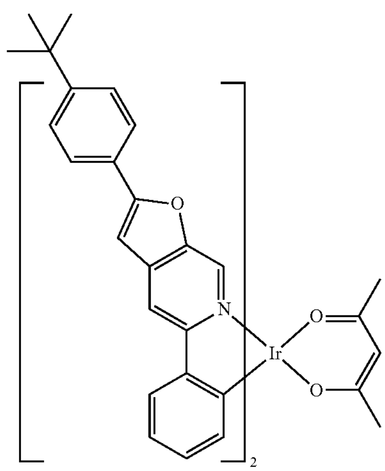
12
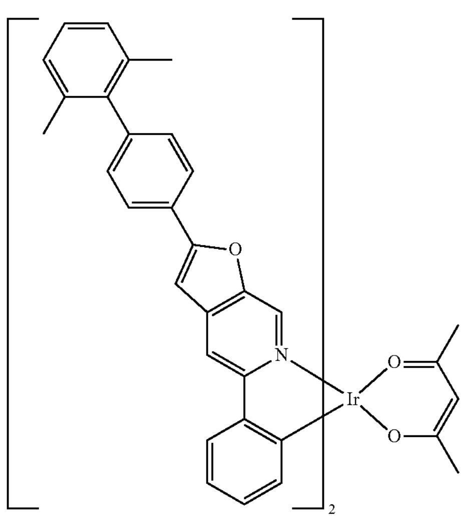
-continued
13
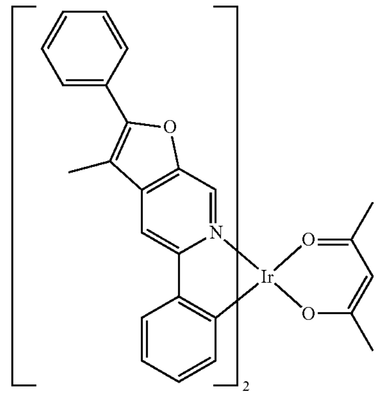
14
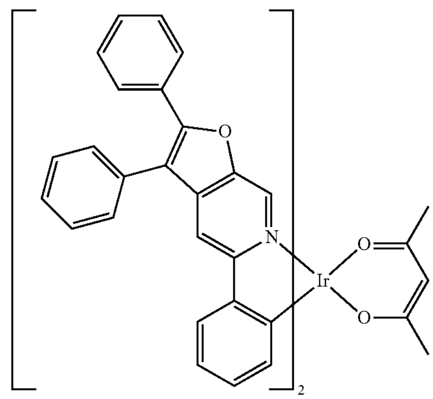
15
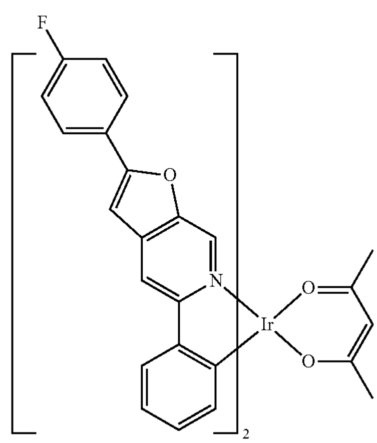
16
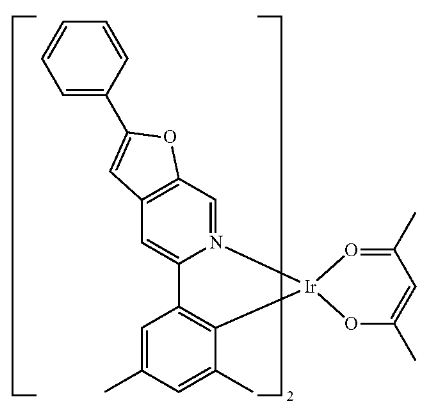

-continued
17
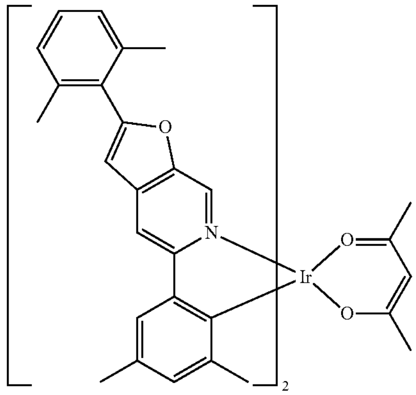
18
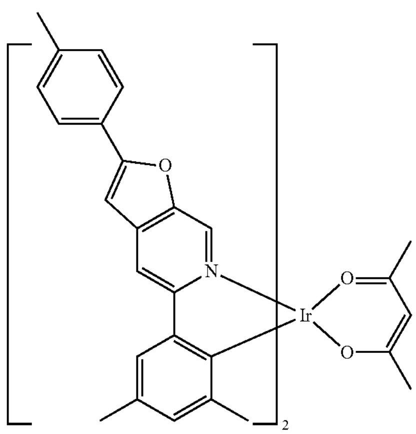
19
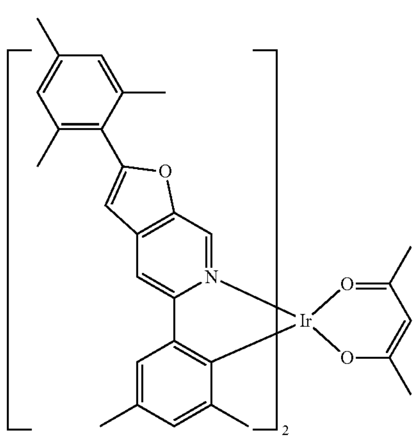
-continued
20
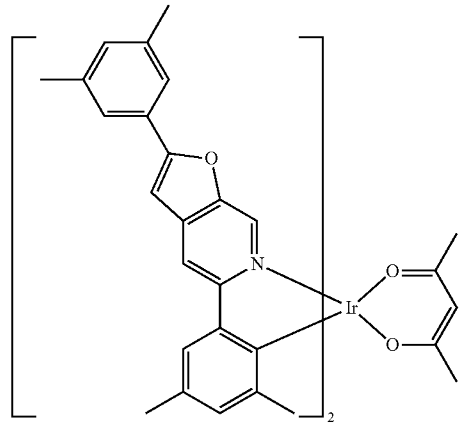
21
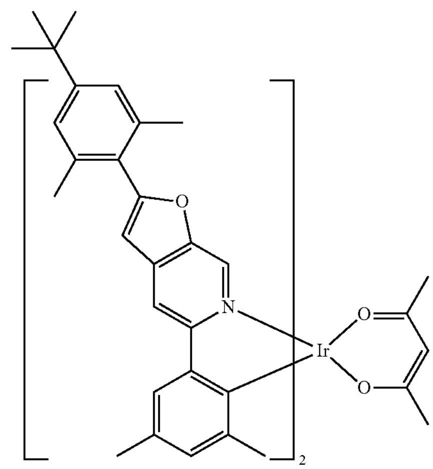
22
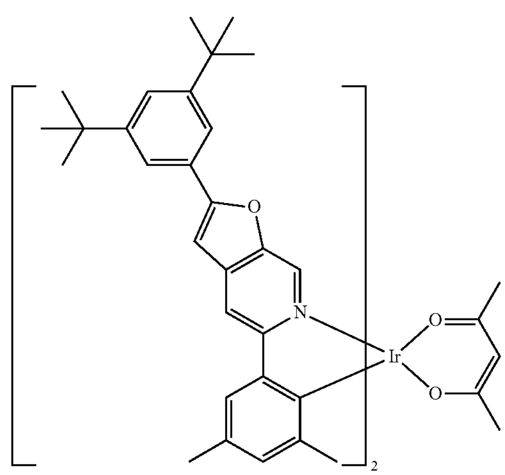

23
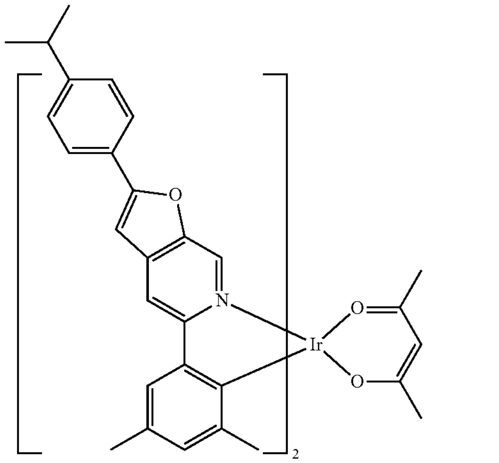
24
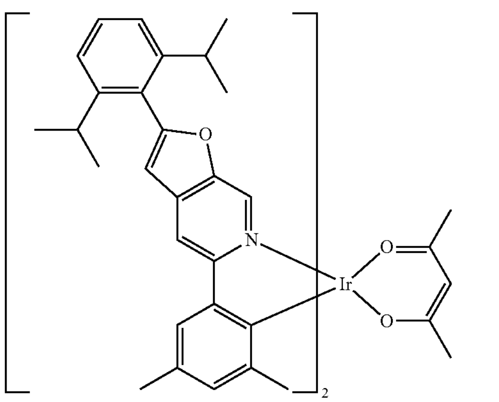
25
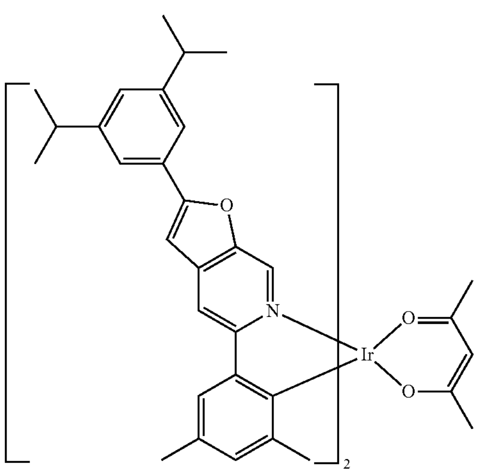
26
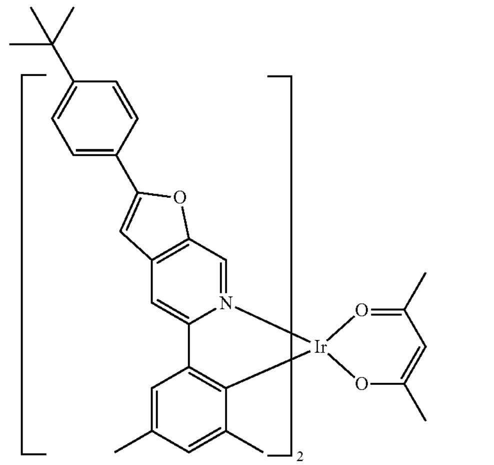
27
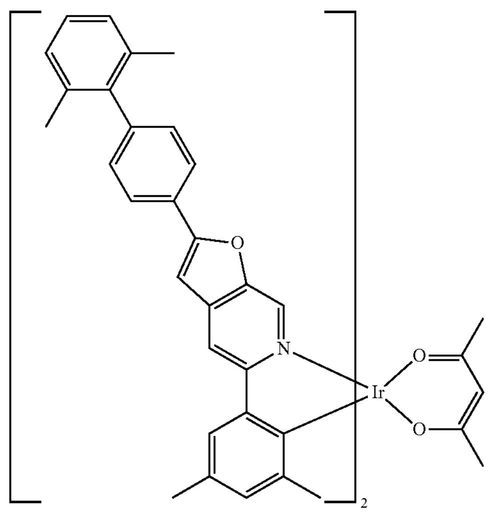
28
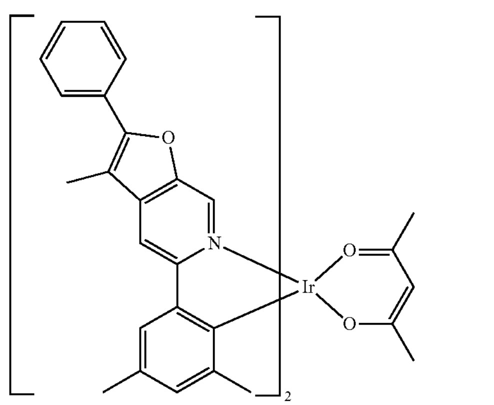

-continued
29
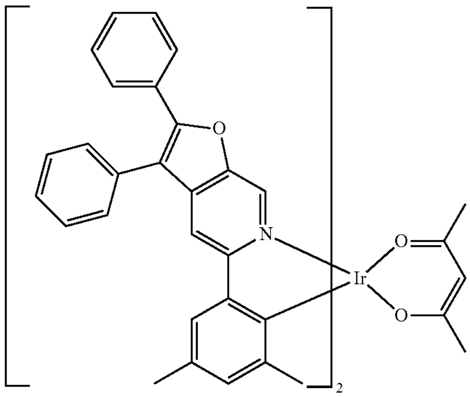
30
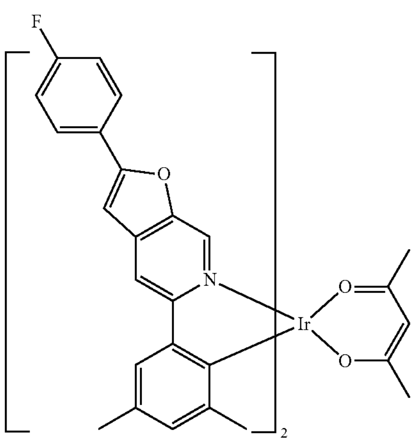
31
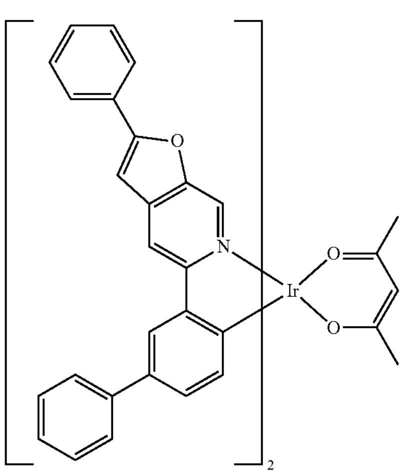
-continued
32
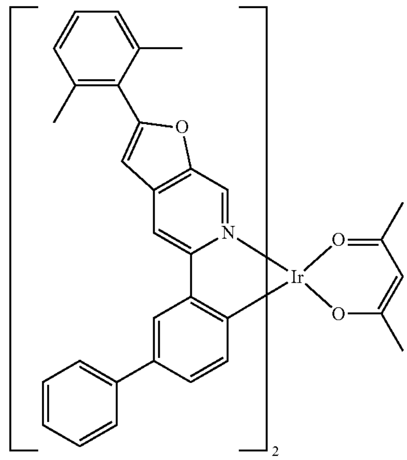
33
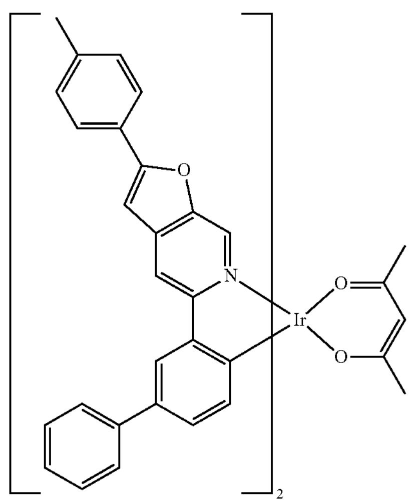
34
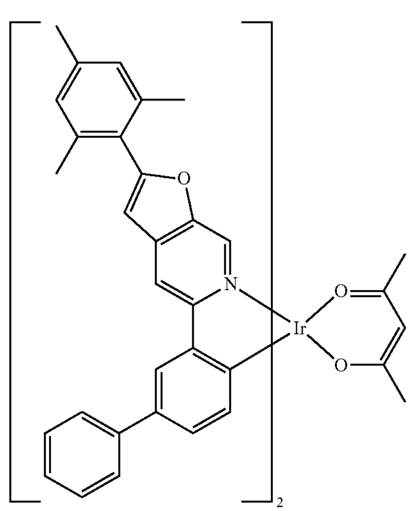

35
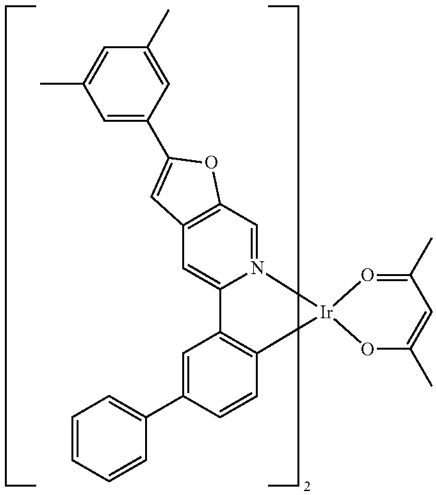
36
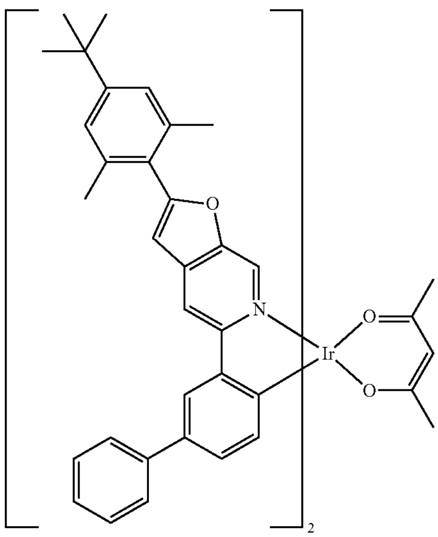
37
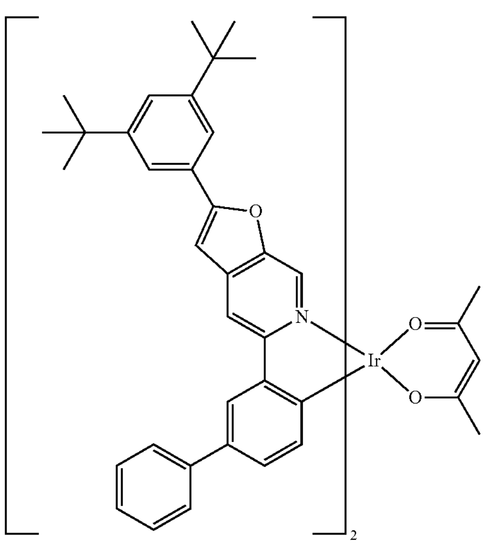
38
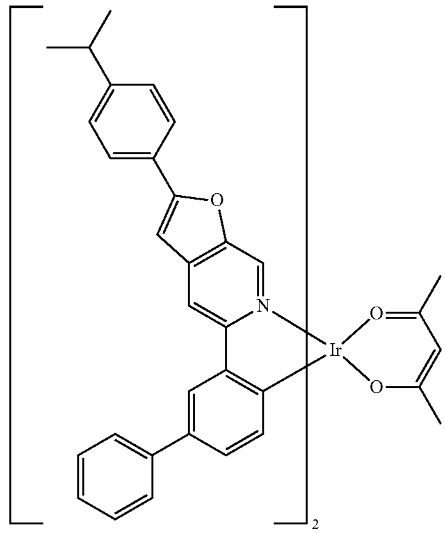
39
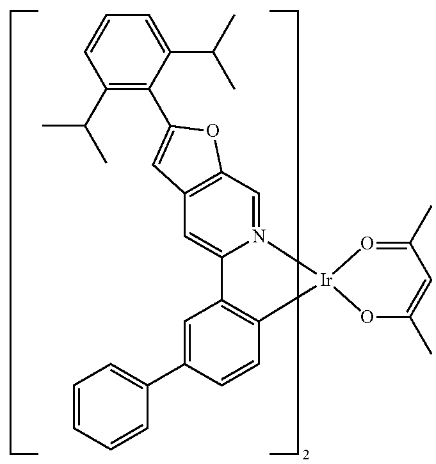
40
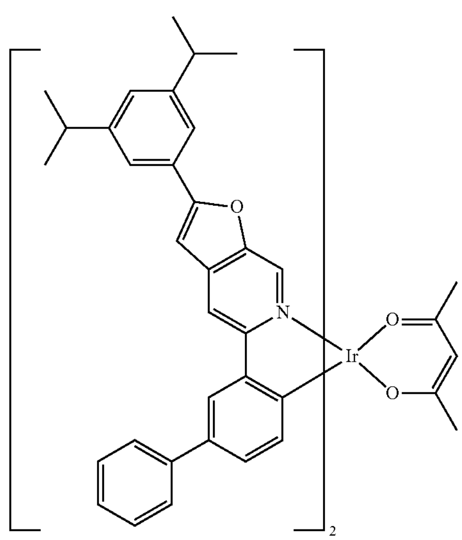

41
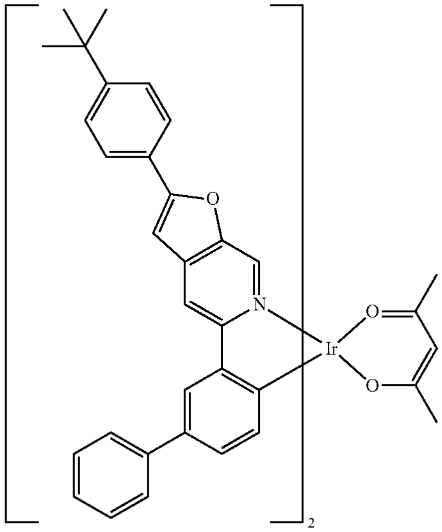
42
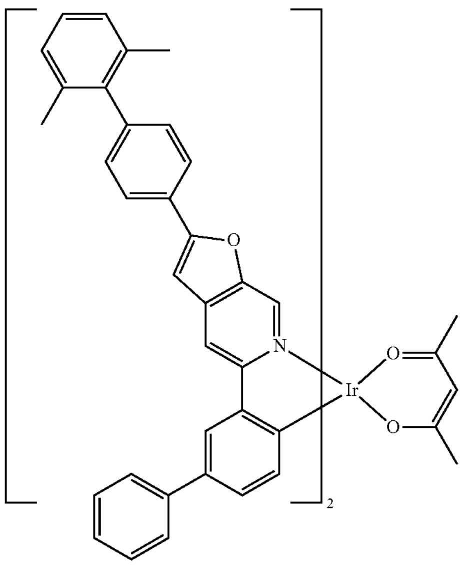
43
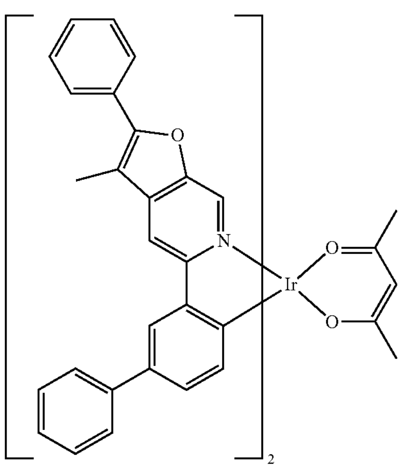
44
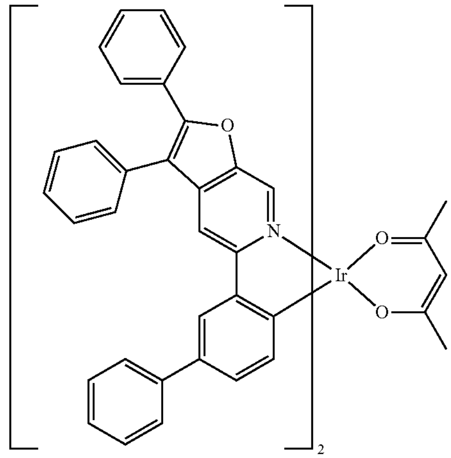
45
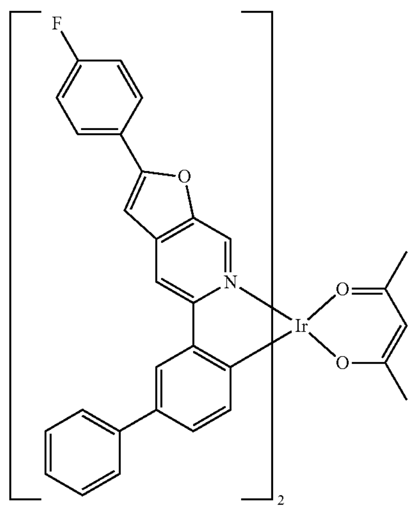
46
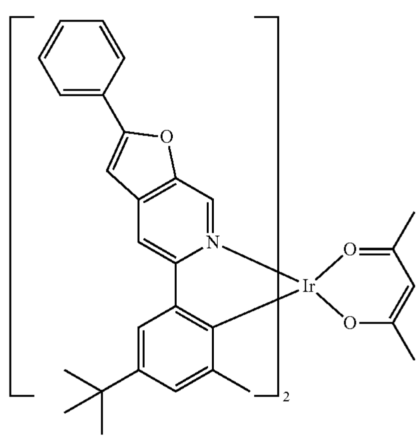

47
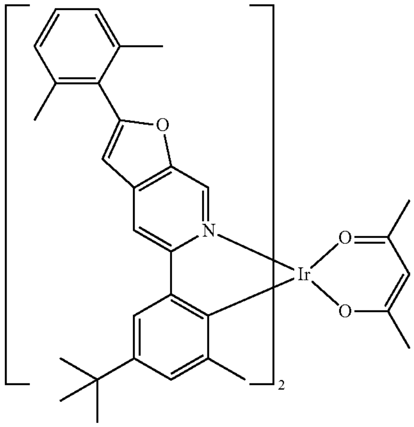
48
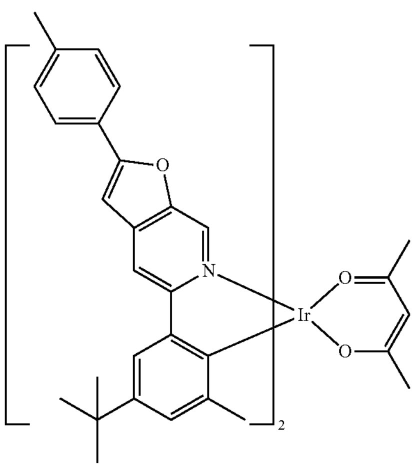
49
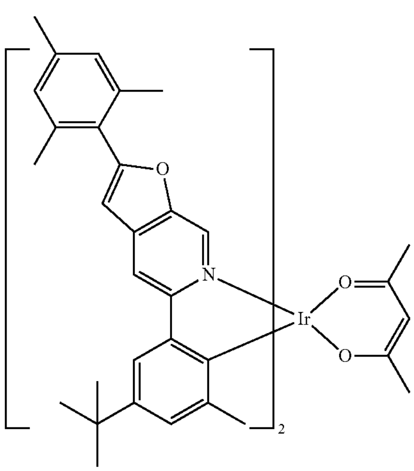
50
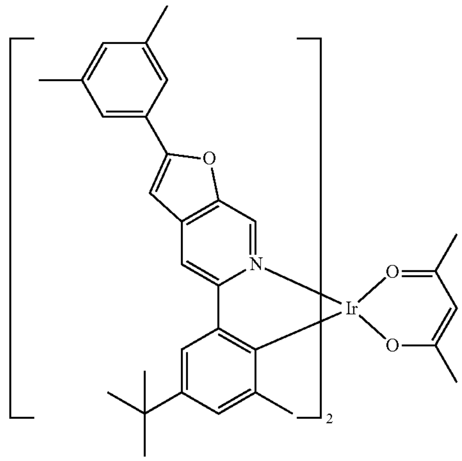
51
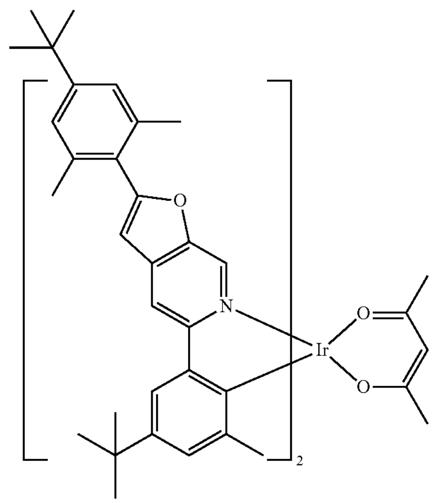
52
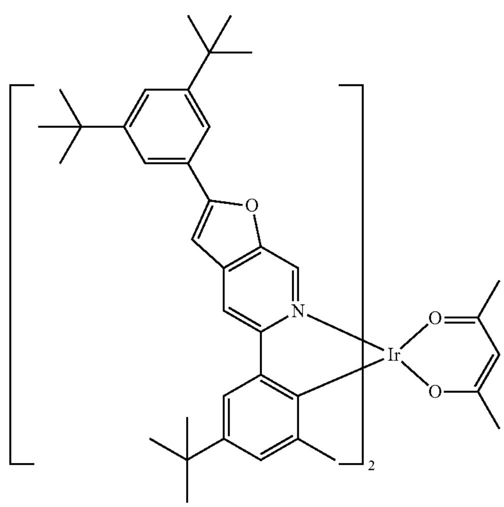

-continued
53
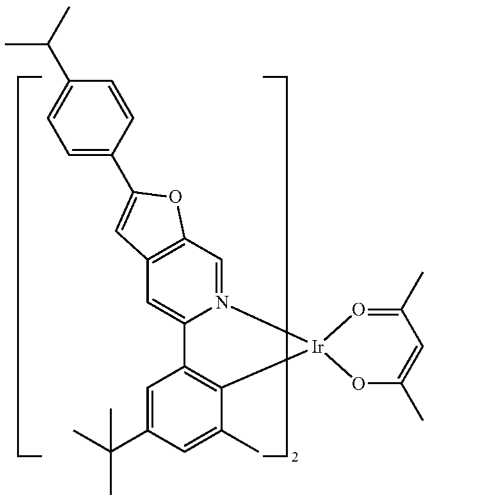
54
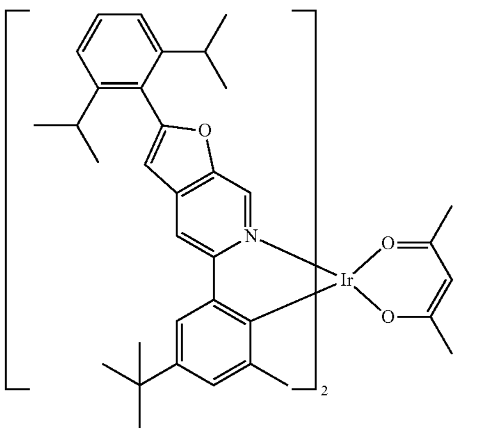
55
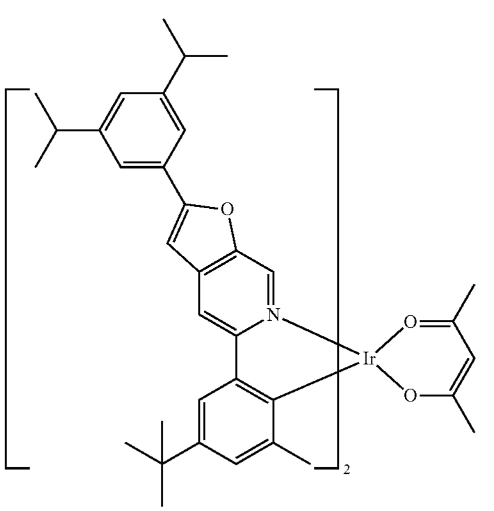
-continued
56
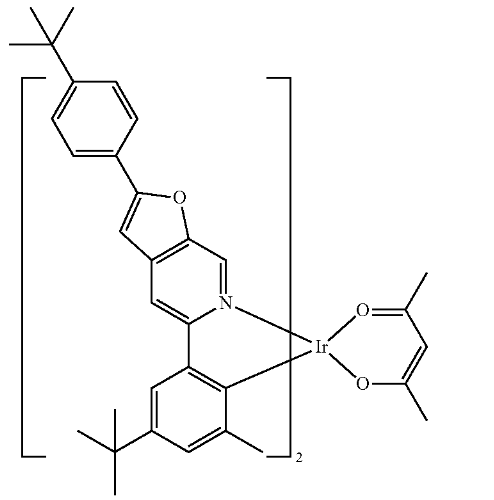
57
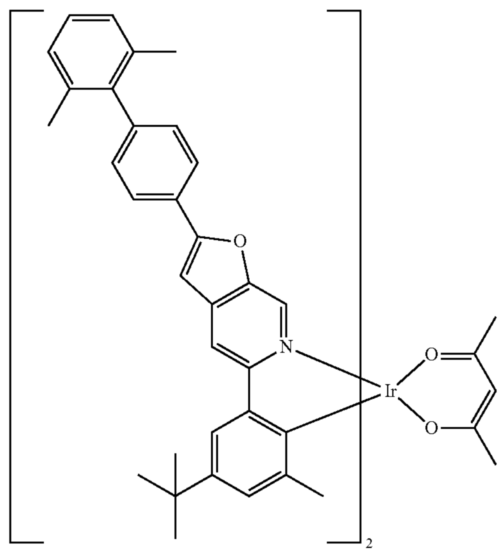
58
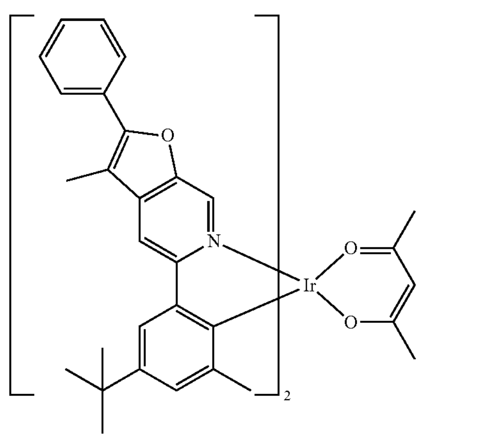

59
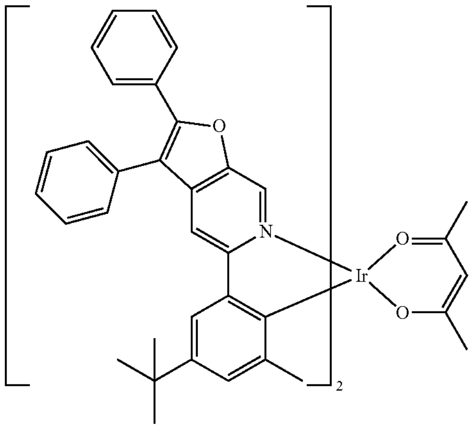
60
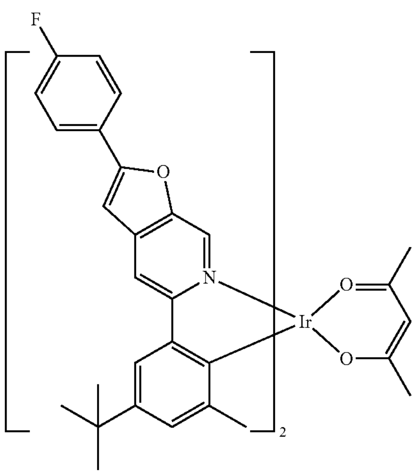
61
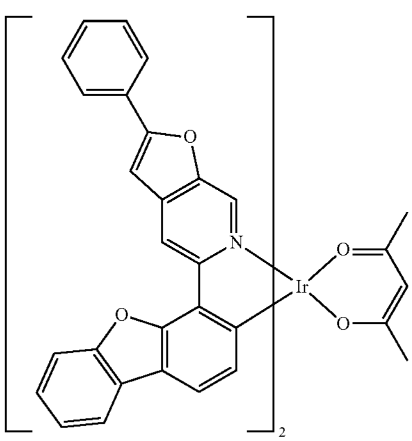
62
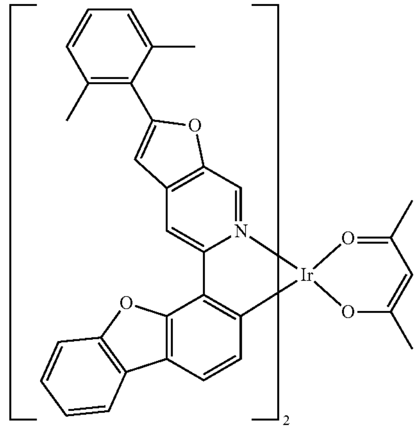
63
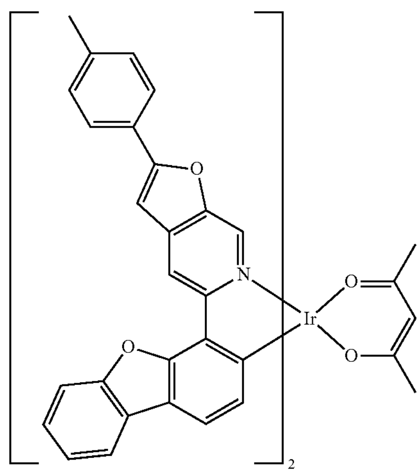
64
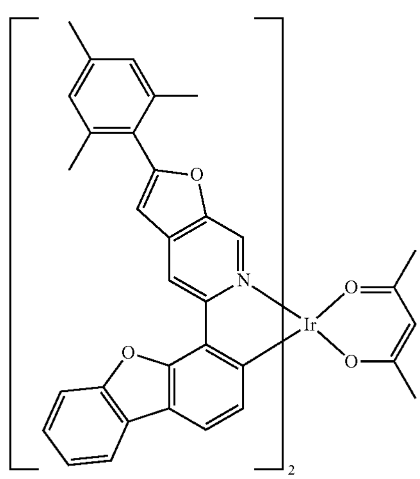

65
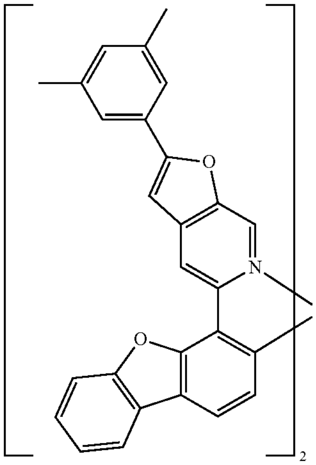
66
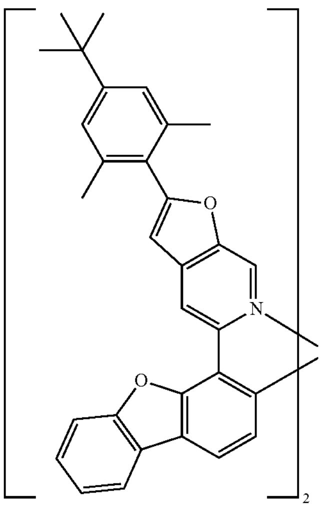
67
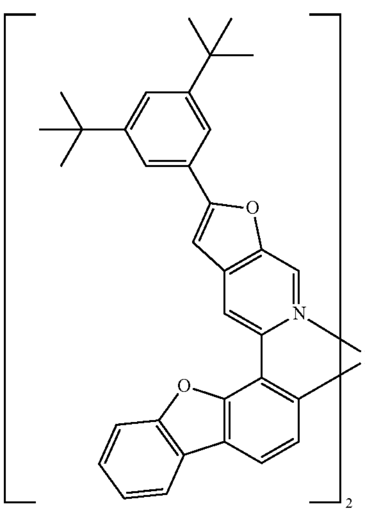
68
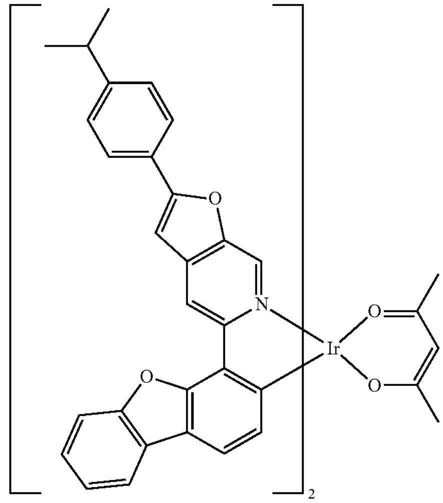
69
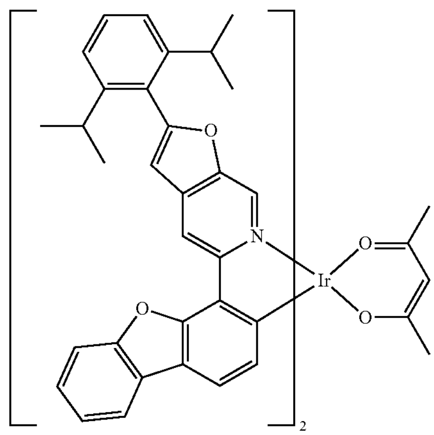
70
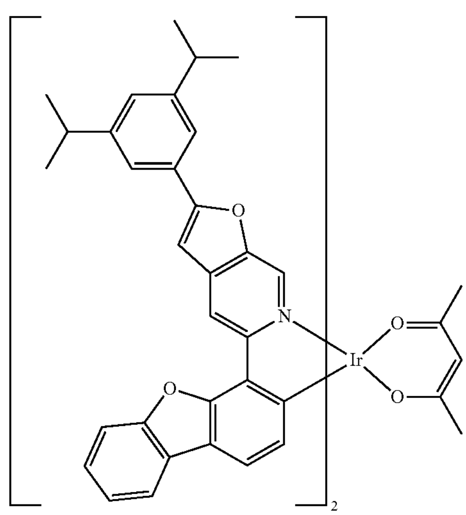

71
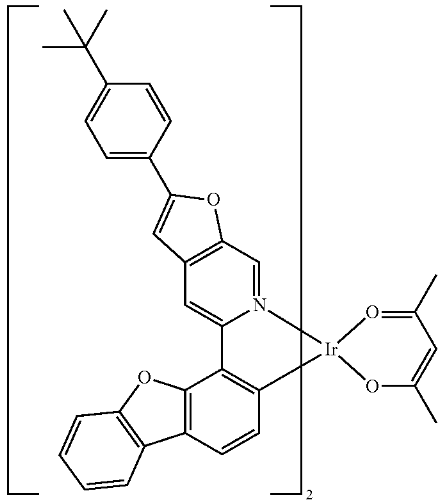
72
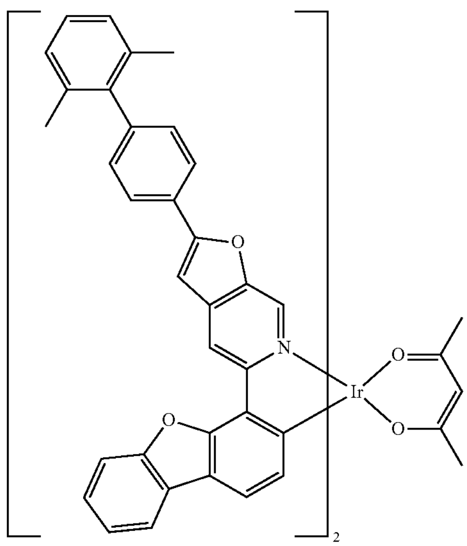
73
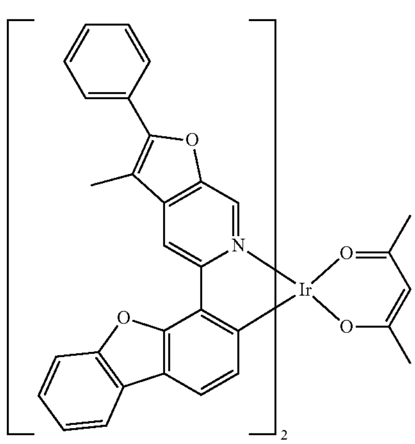
74
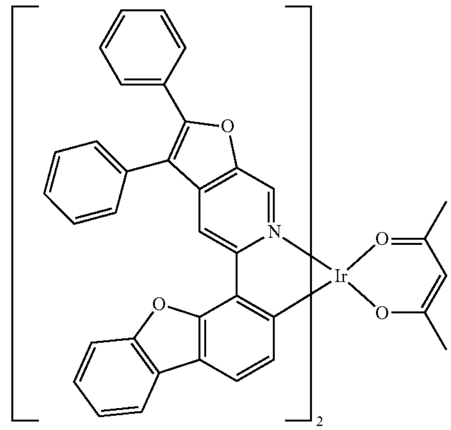
75
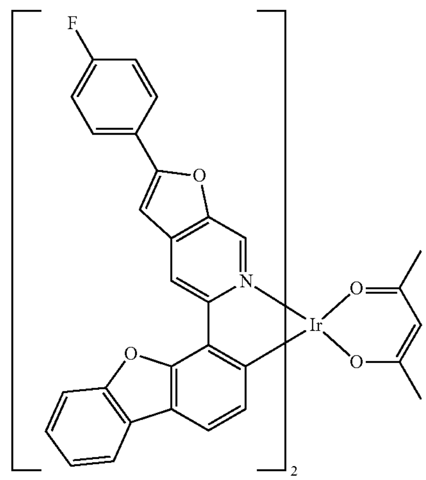
76
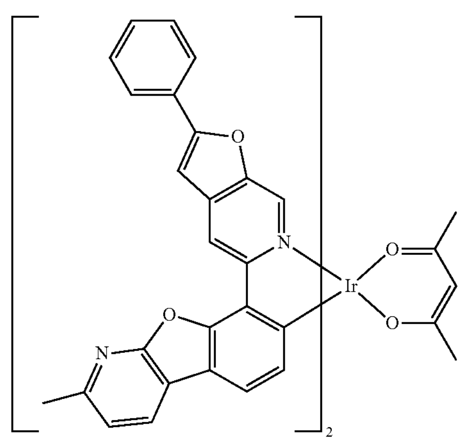

-continued
77
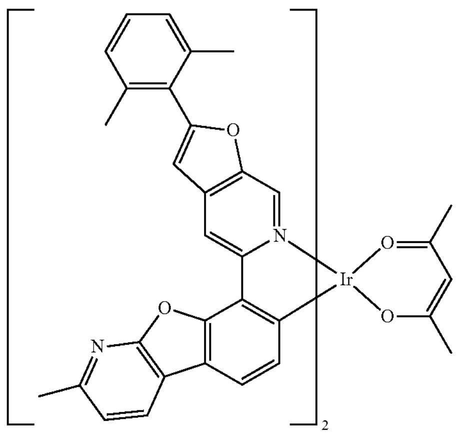
78
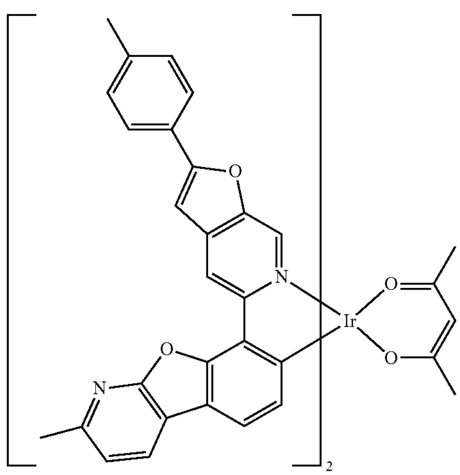
79
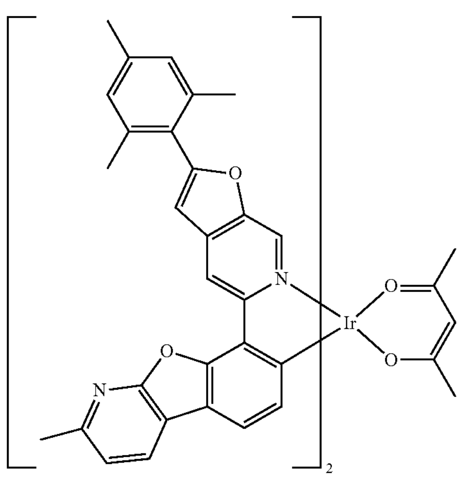
-continued
80
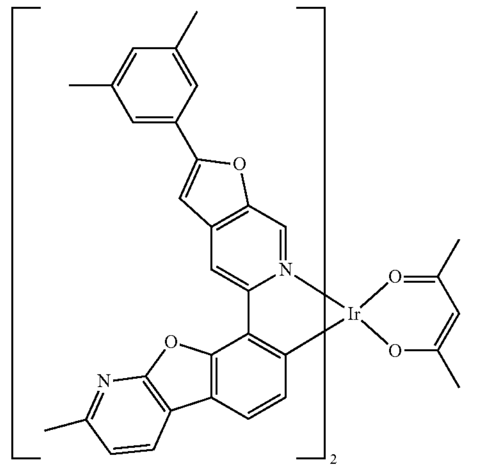
81
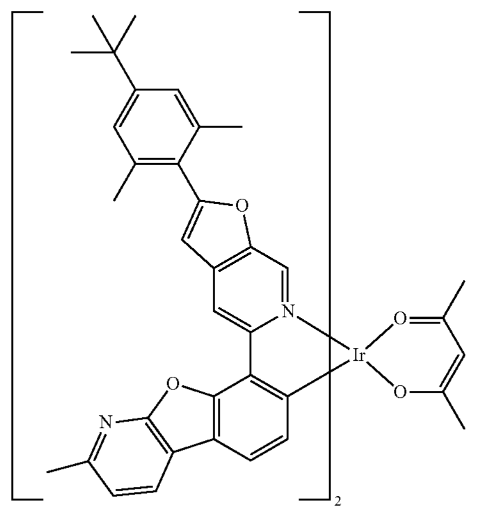
82
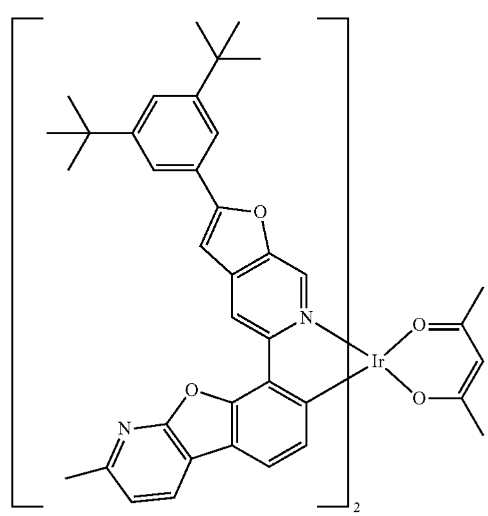

-continued
83
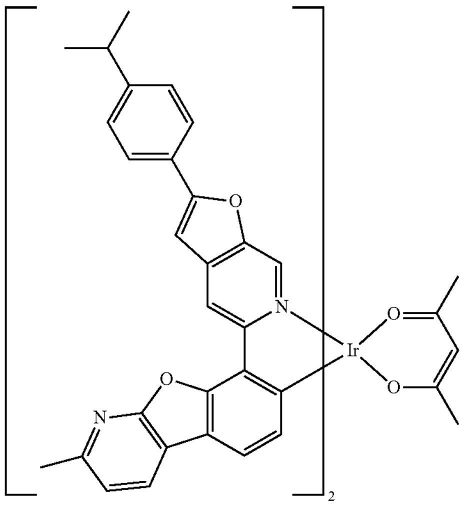
84
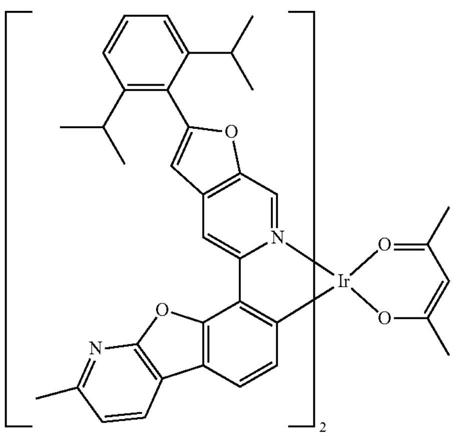
85
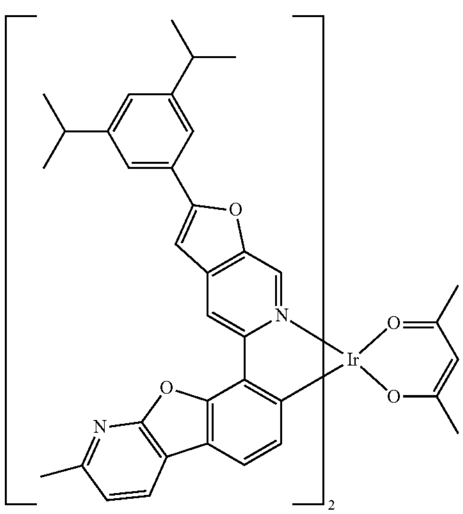
-continued
86
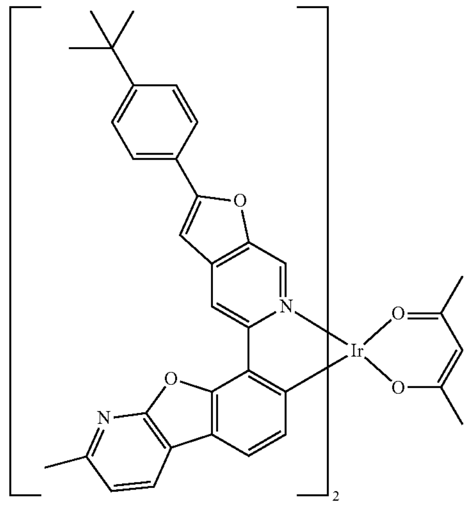
87
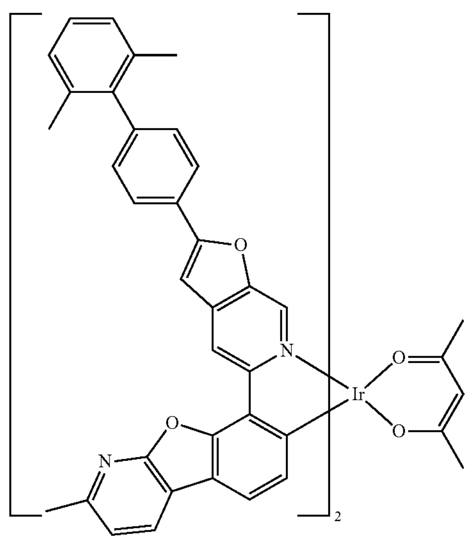
88
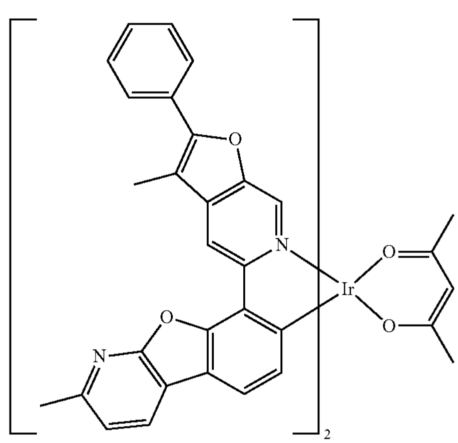

89
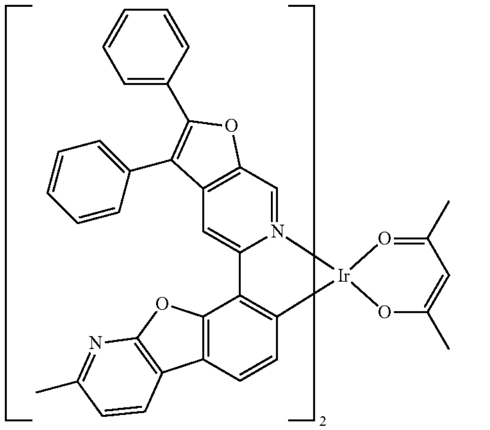
90
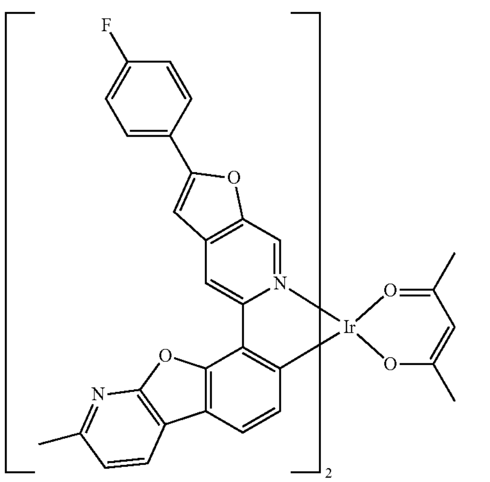
91
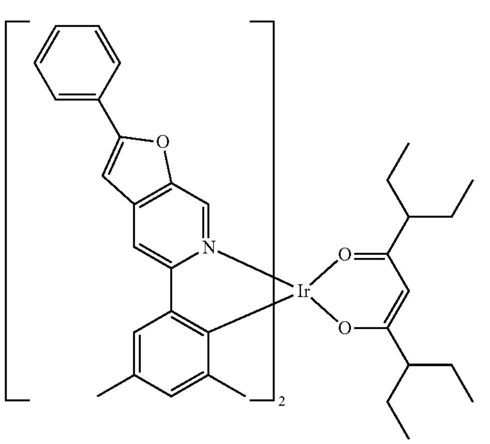
92
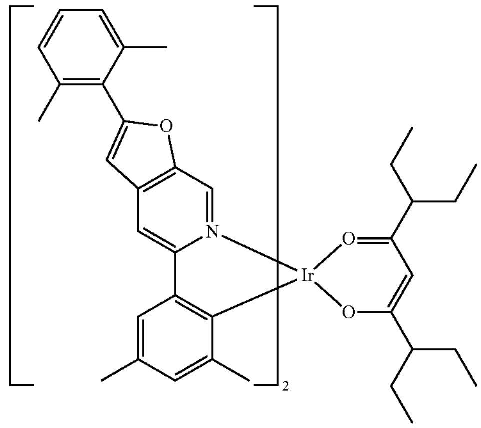
93
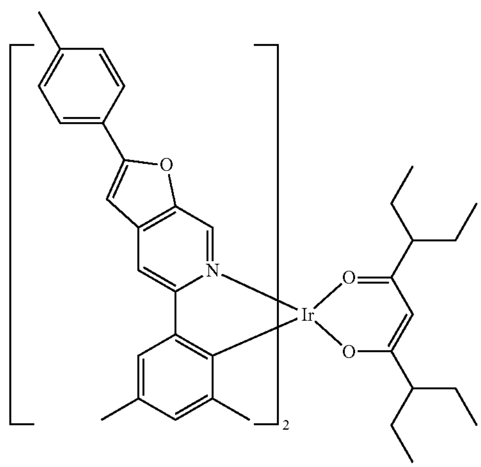
94
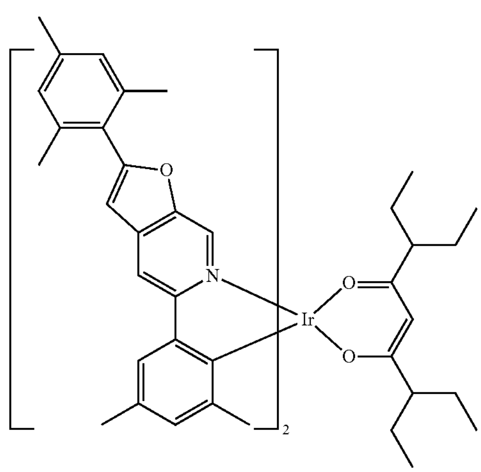

95
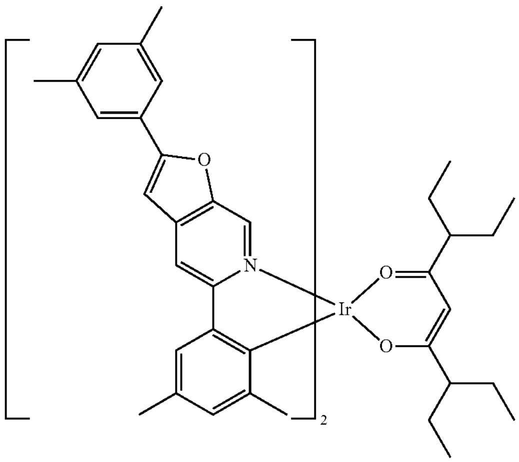
96
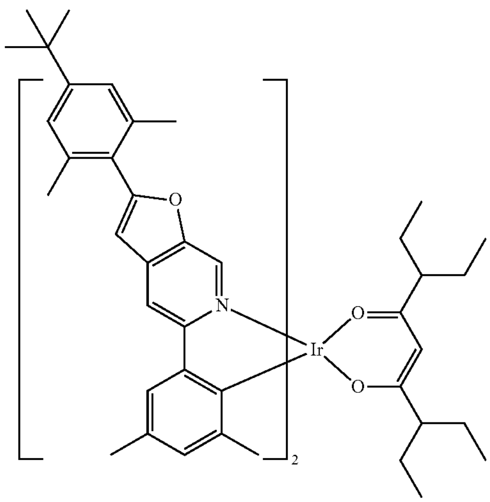
97
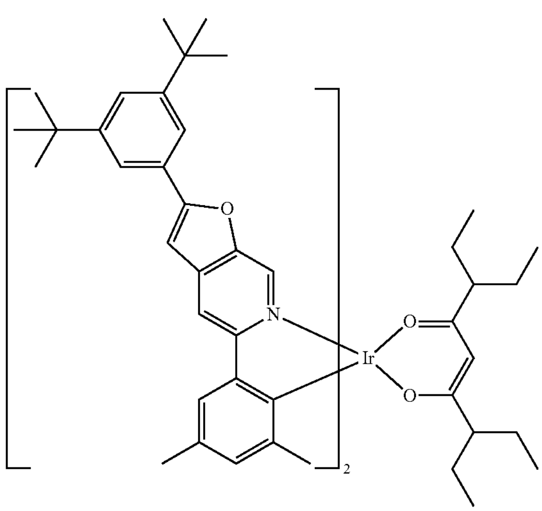
98
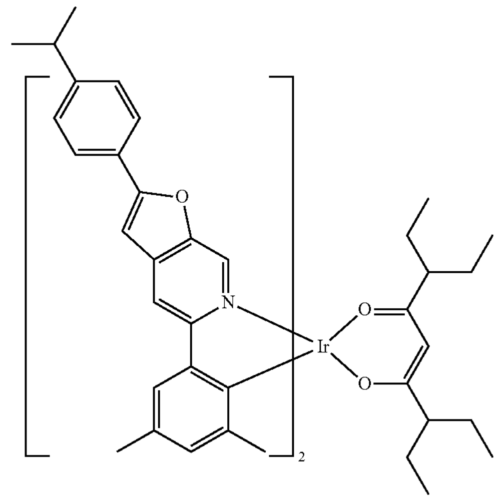
99
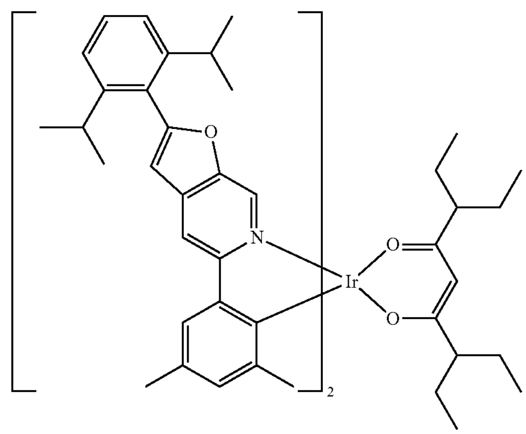
100
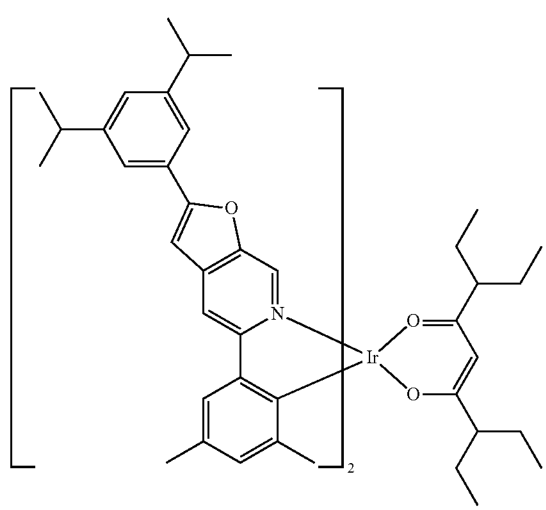

101
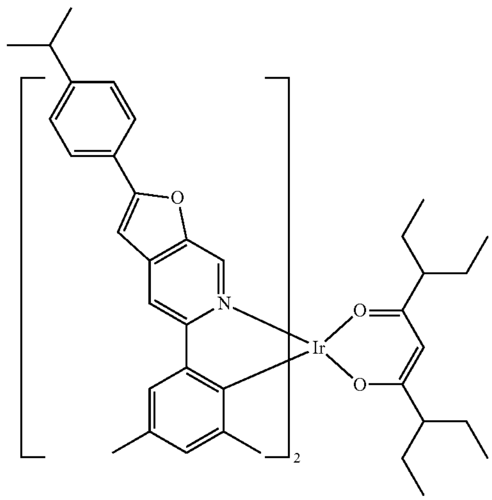
102
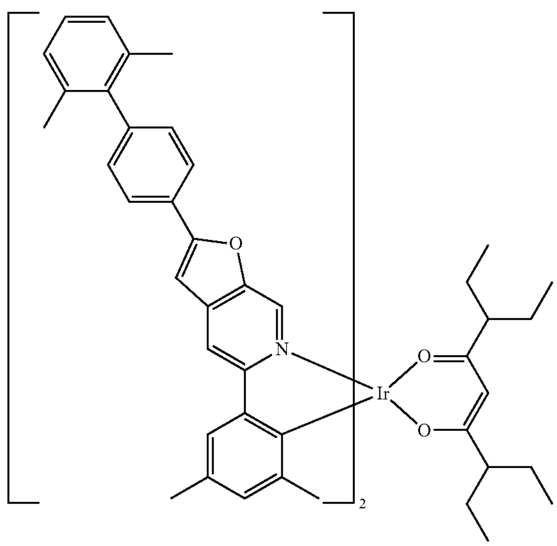
103
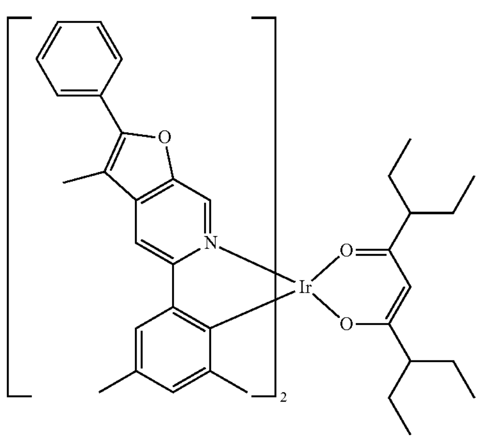
104
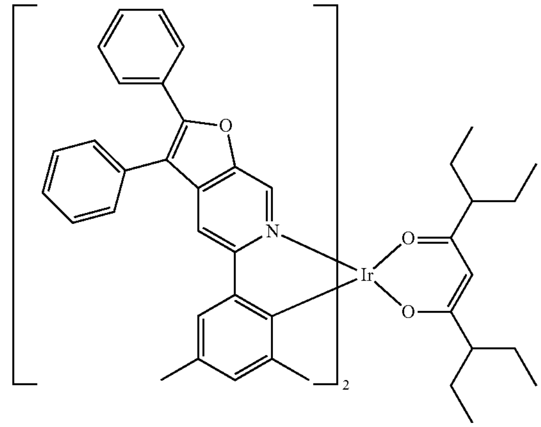
105
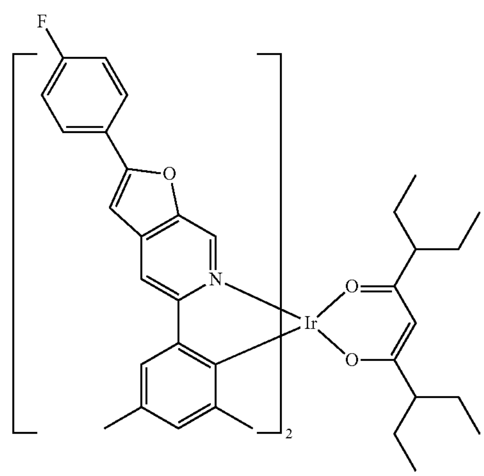
106
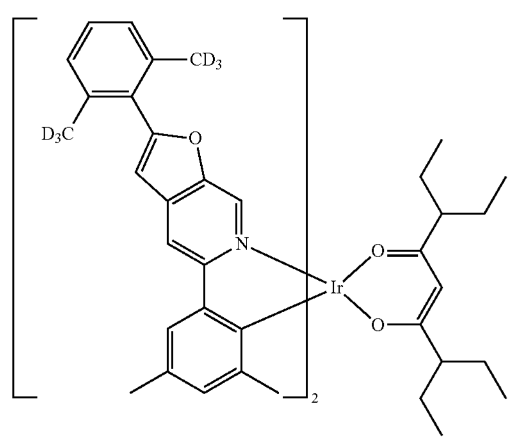

107
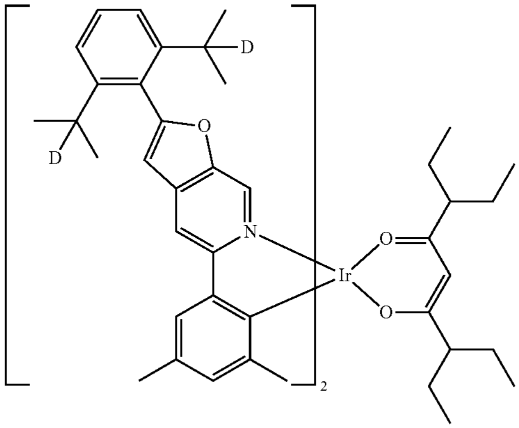
108
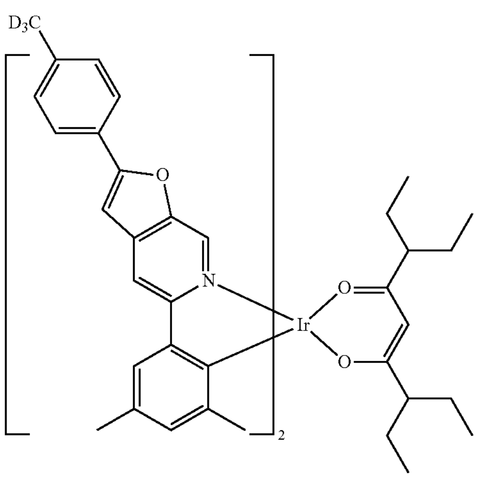
109
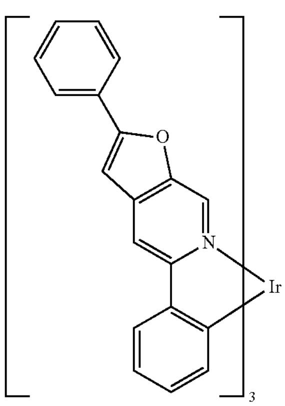
110
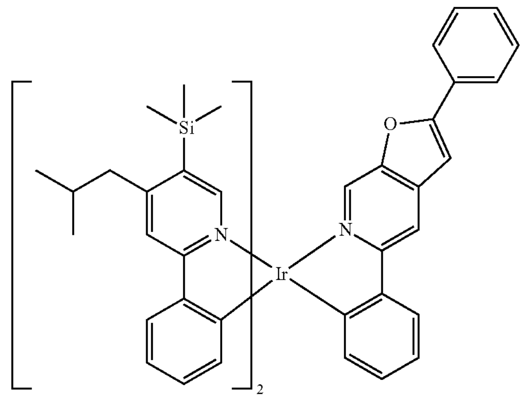
111
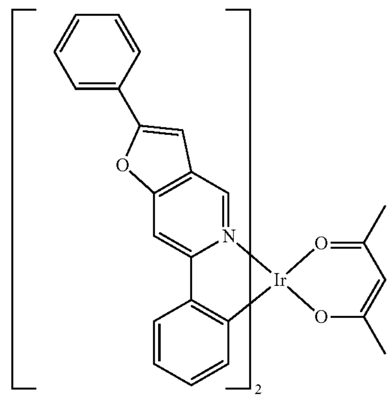
112
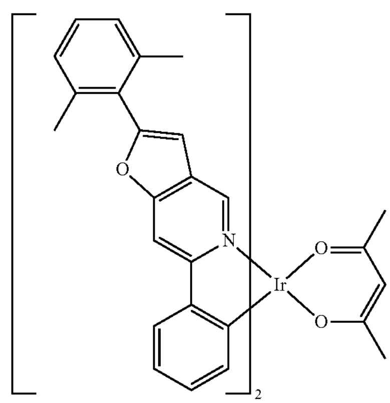
113
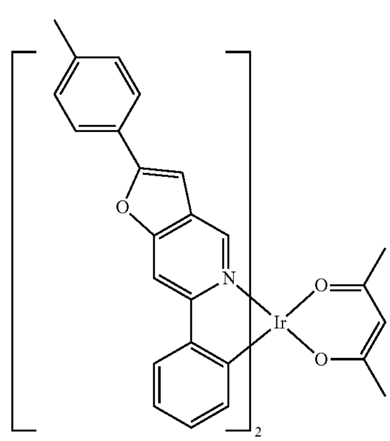

114
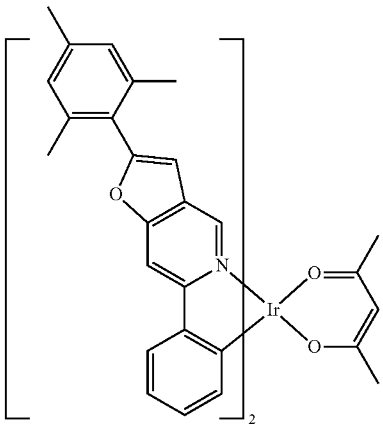
115
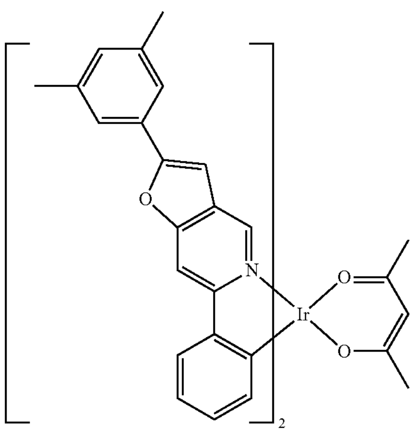
116
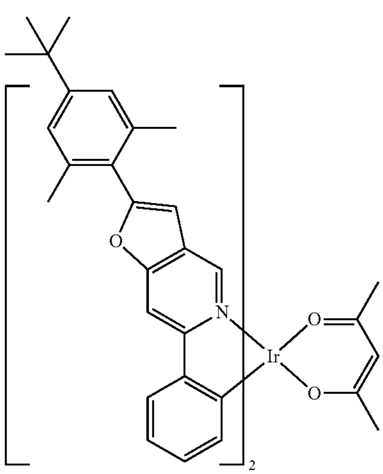
117
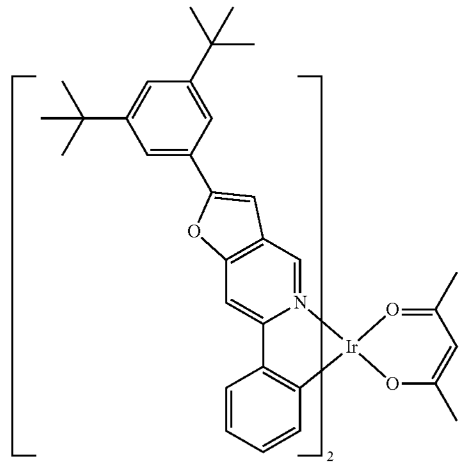
118
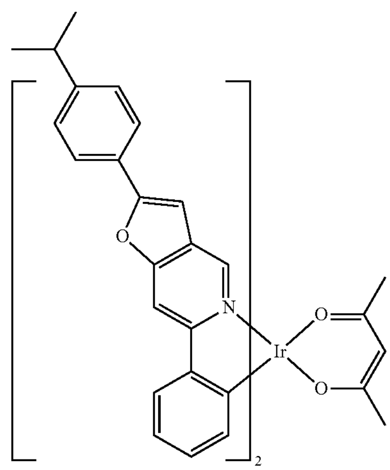
119
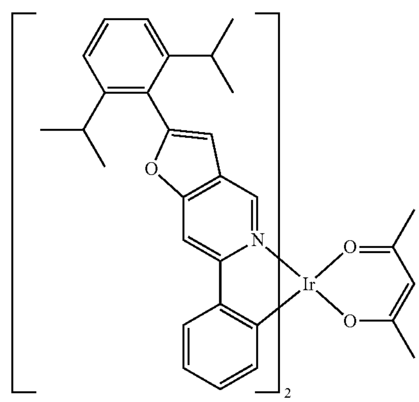

-continued
120
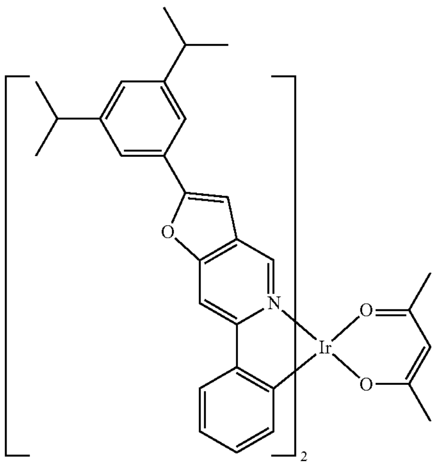
121
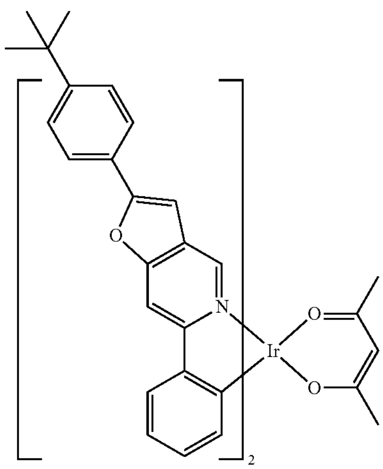
122
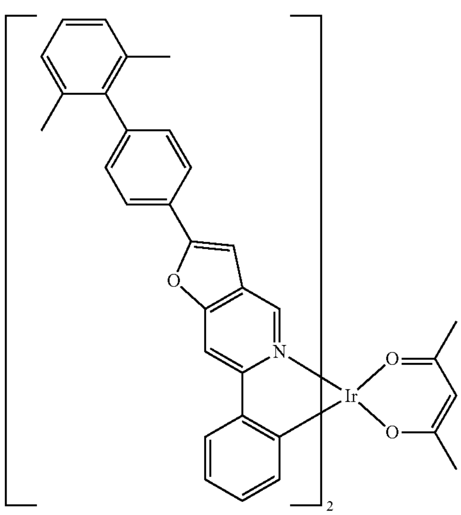
-continued
123
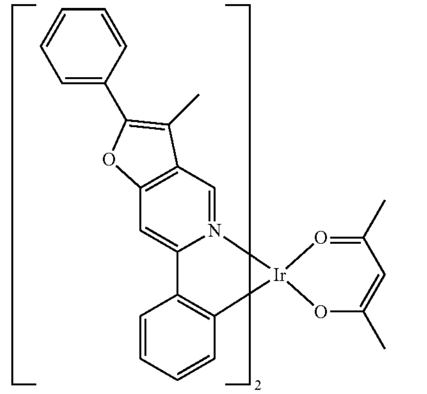
124
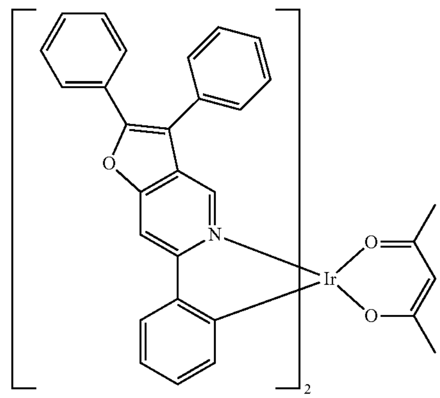
125
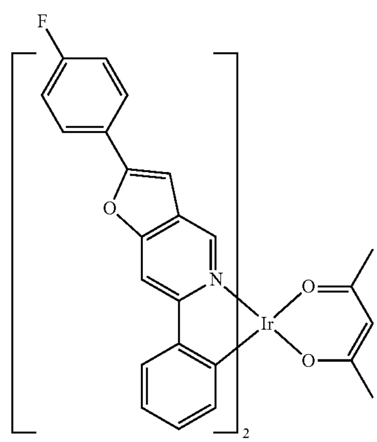
126
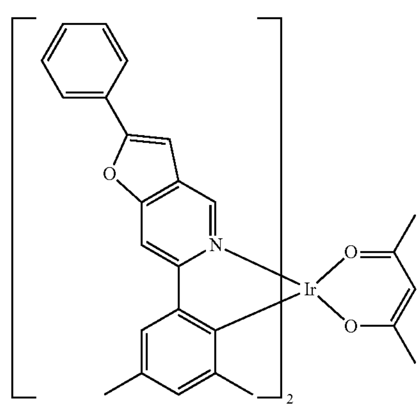

-continued
127
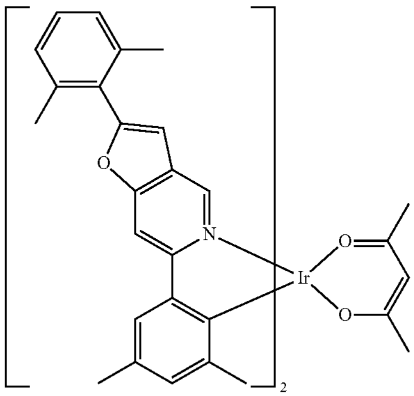
128
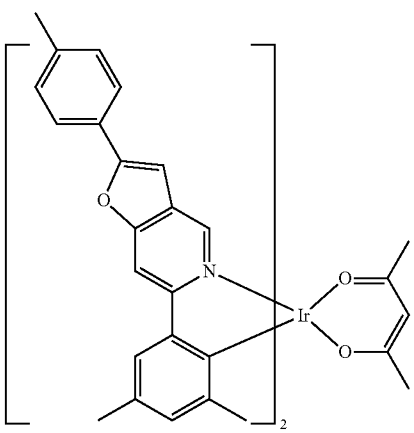
129
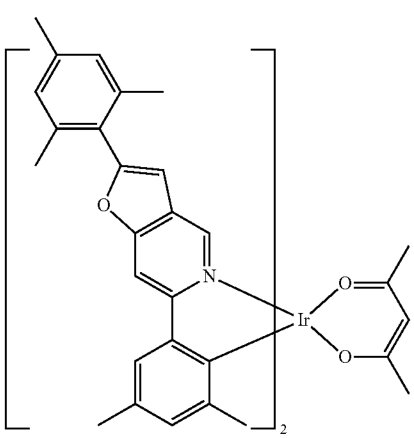
-continued
130
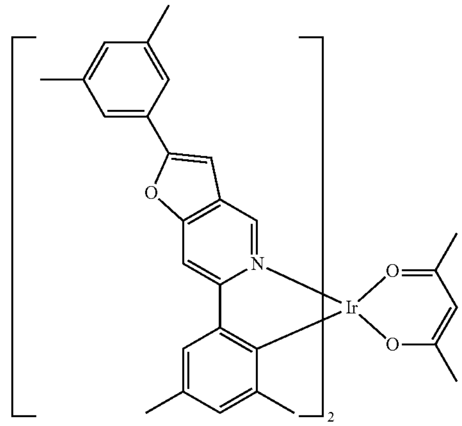
131
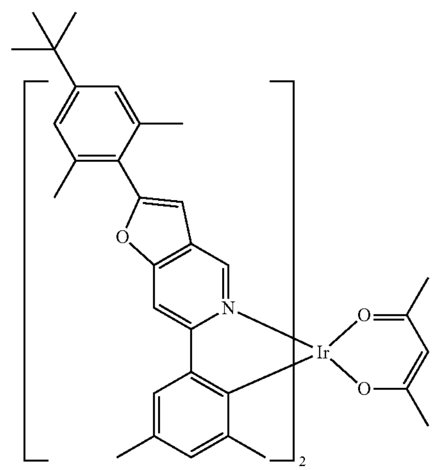
132
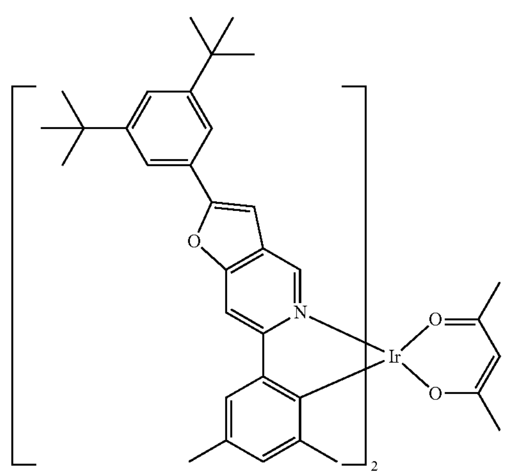

-continued
133
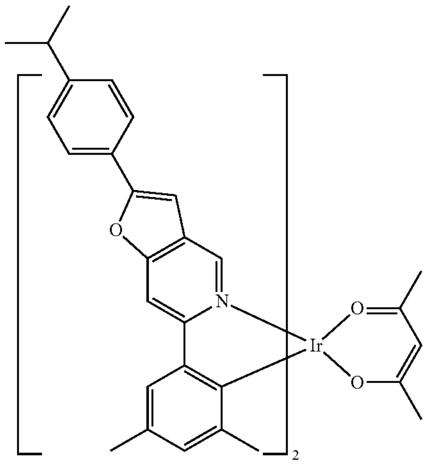
134
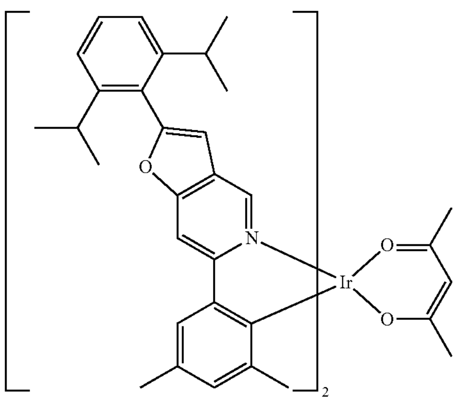
135
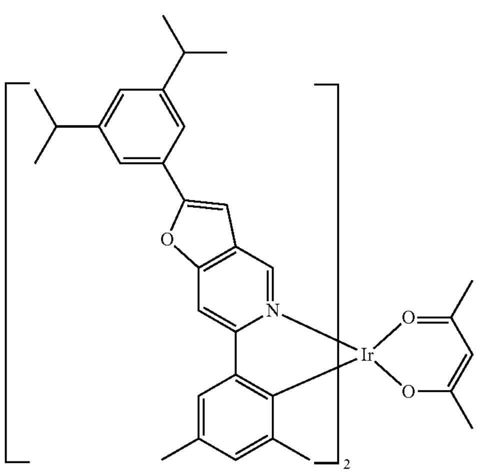
-continued
136
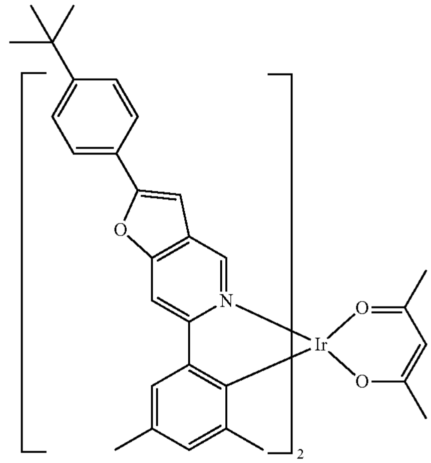
137
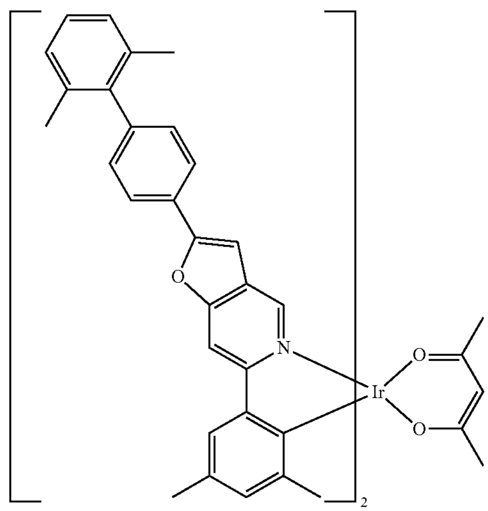
138
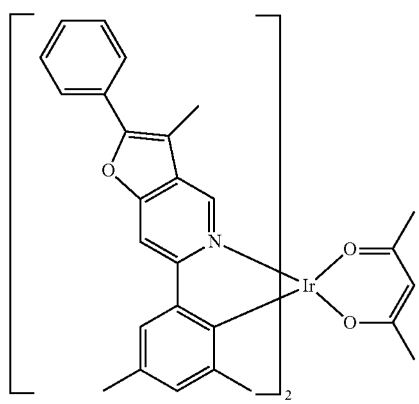

-continued
139
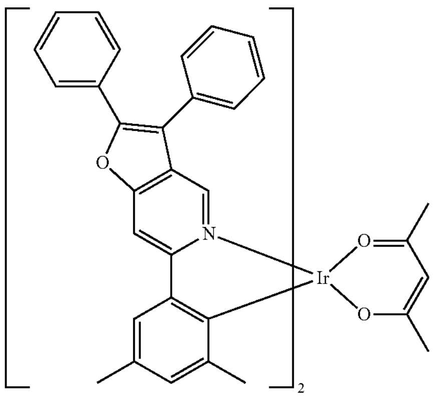
140
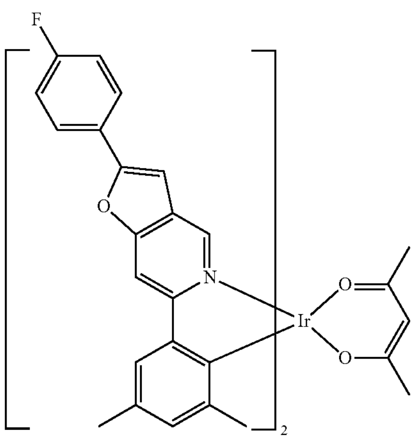
141
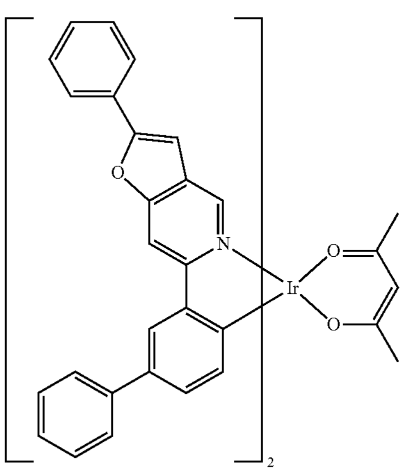
-continued
142
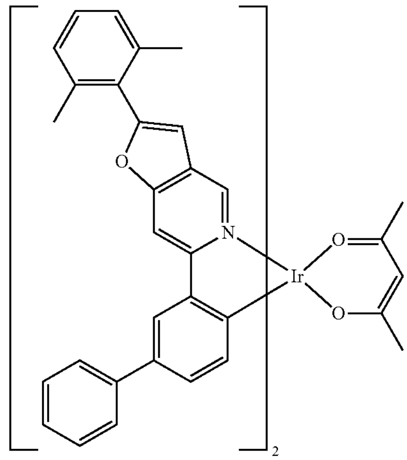
143
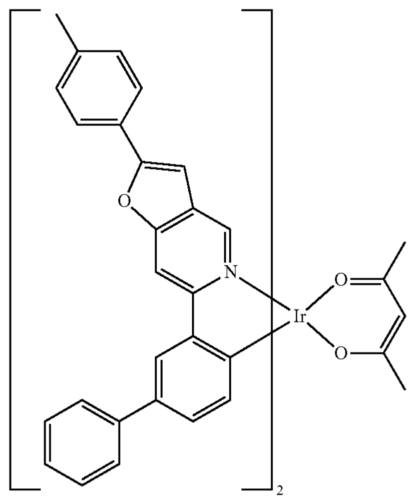
144
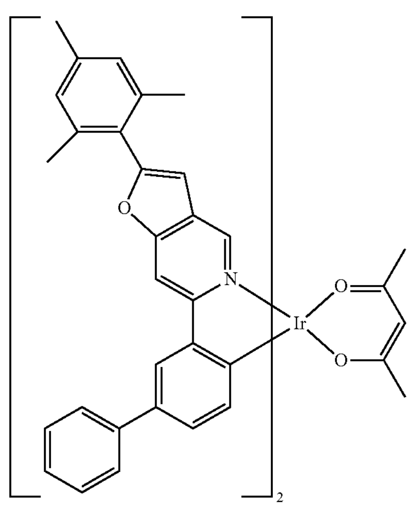

145
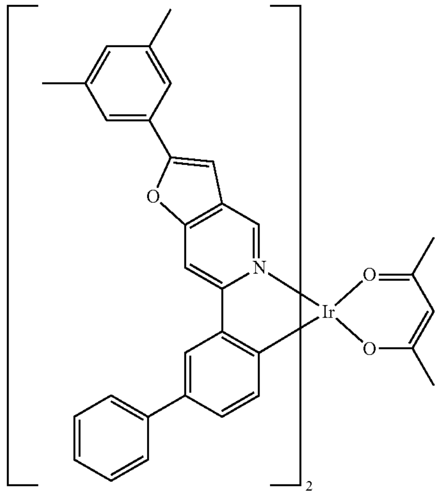
146
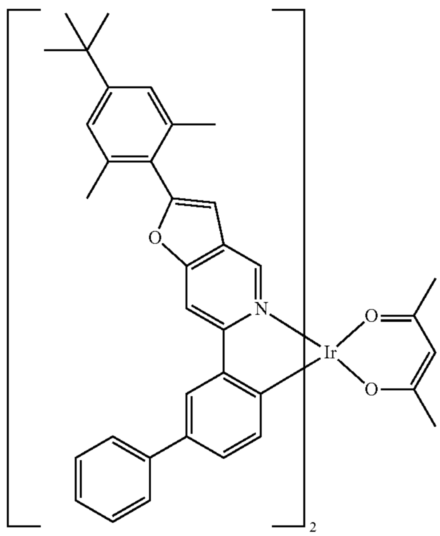
147
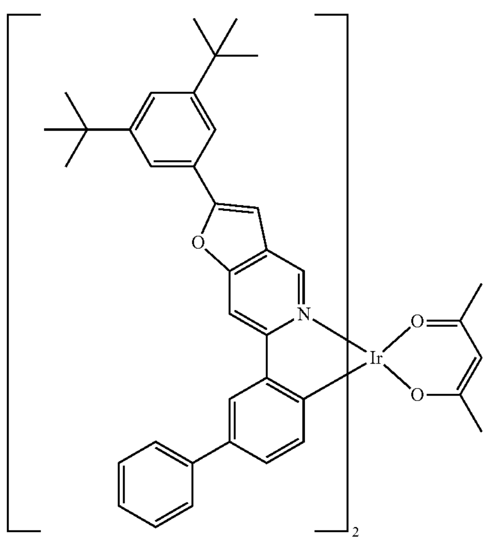
148
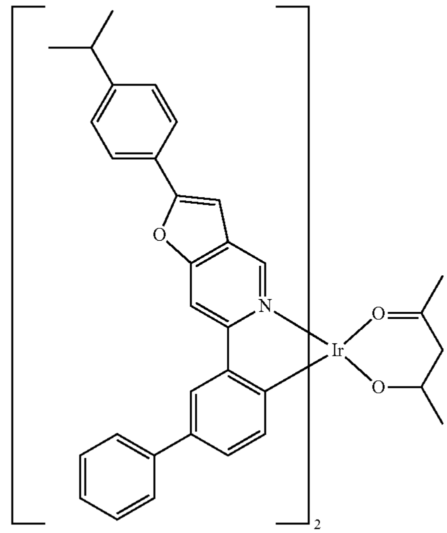
149
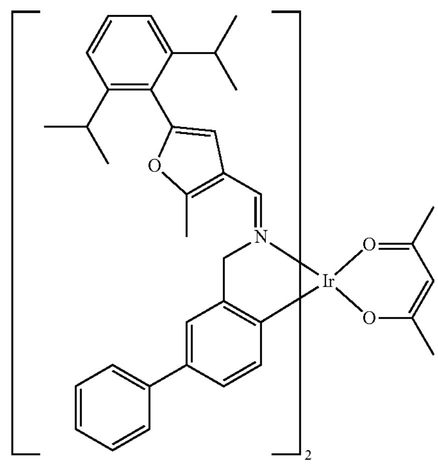
150
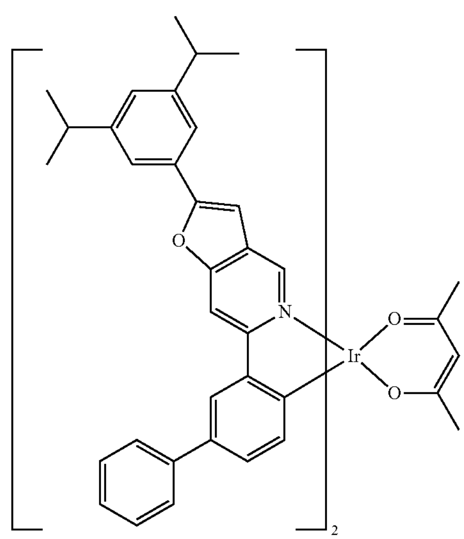

151
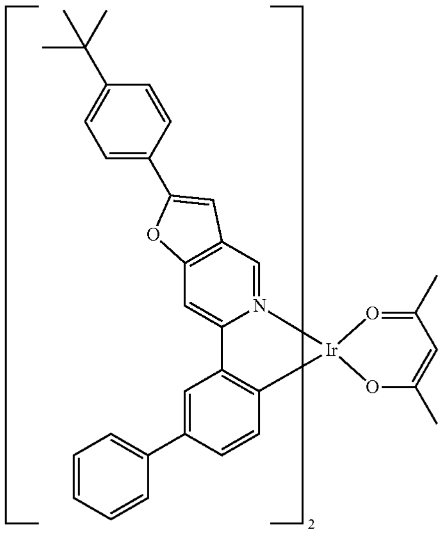
152
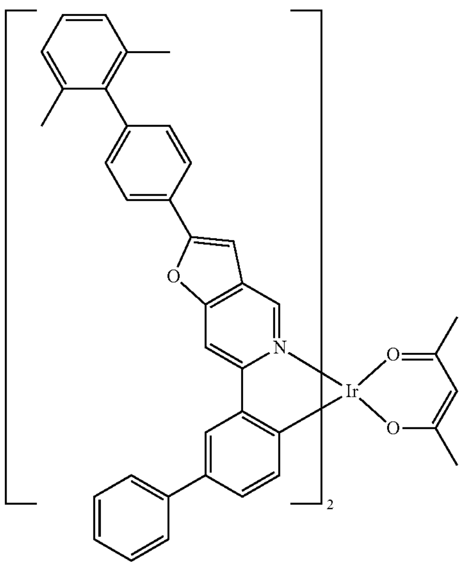
153
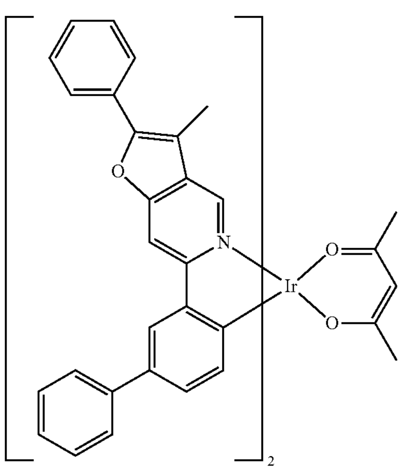
154
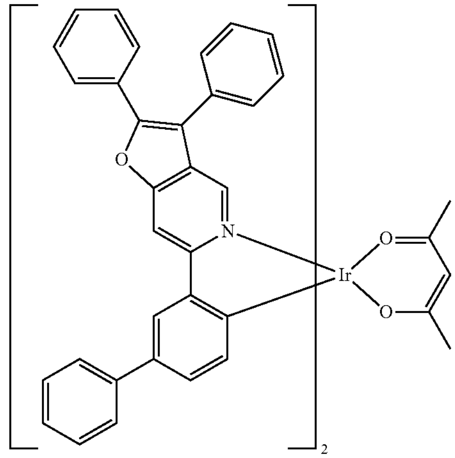
155
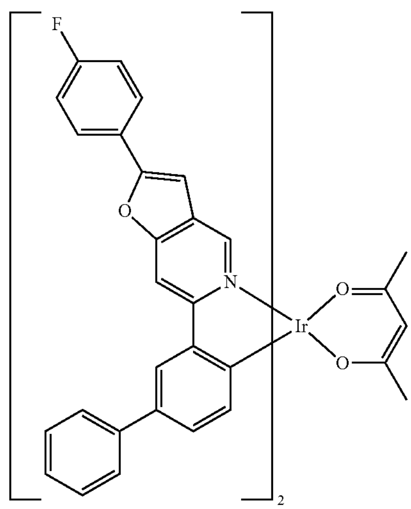
156
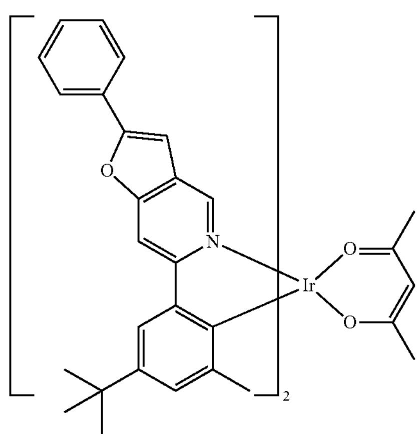

-continued
157
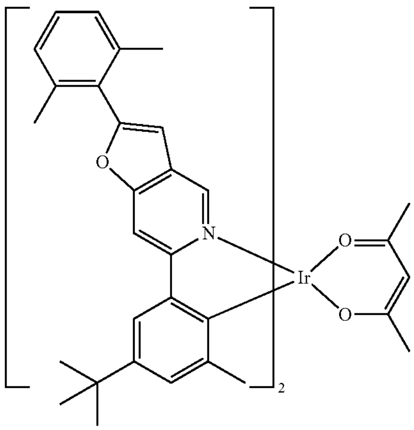
158
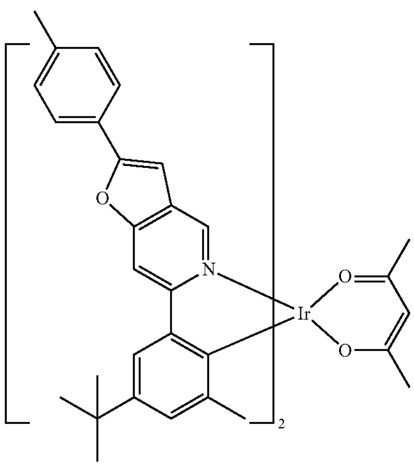
159
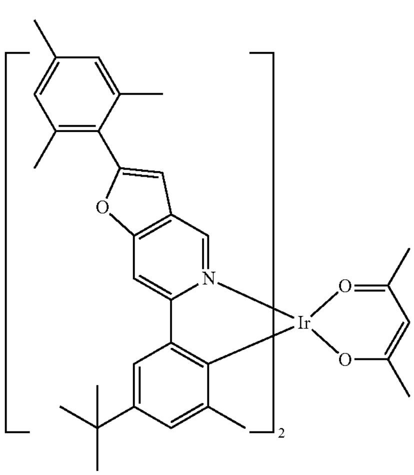
-continued
160
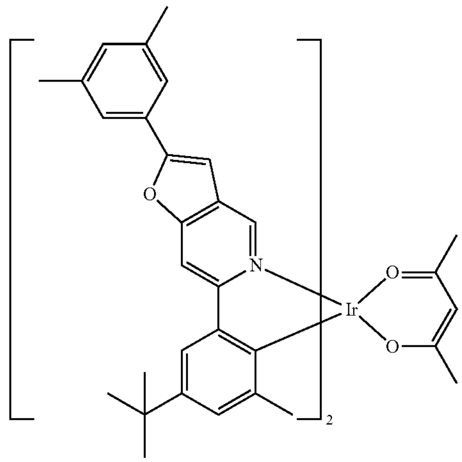
161
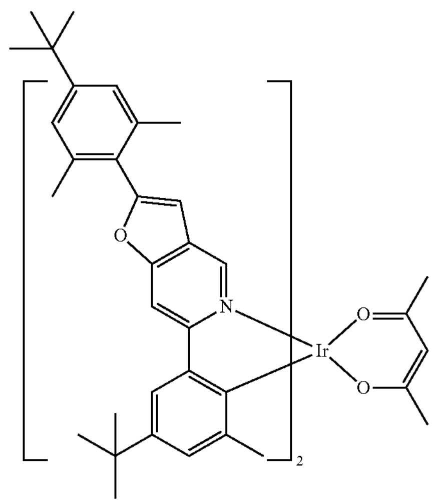
162
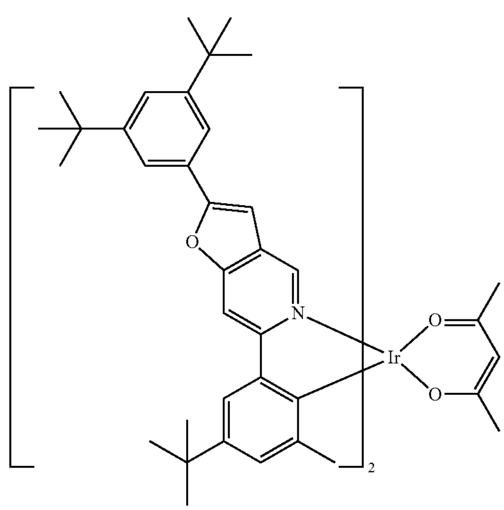

163
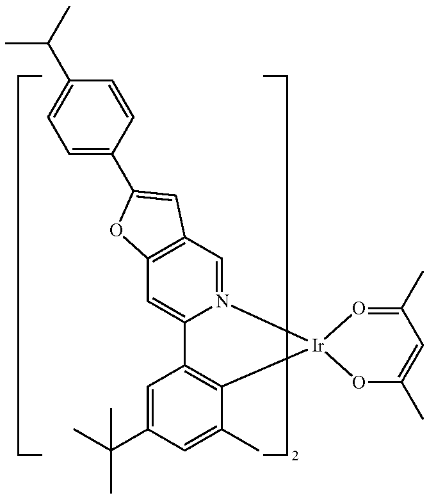
164
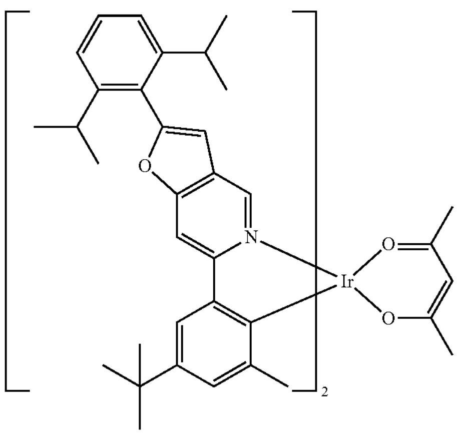
165
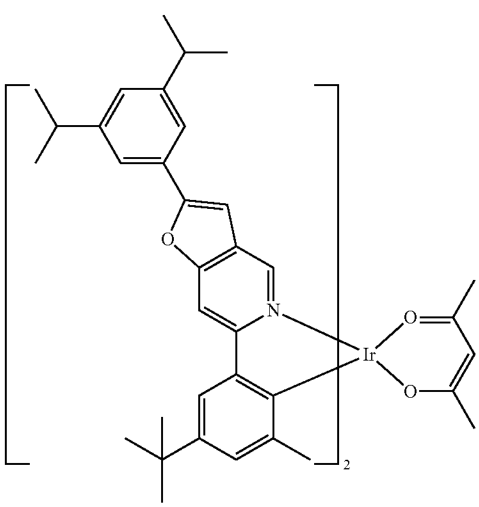
166
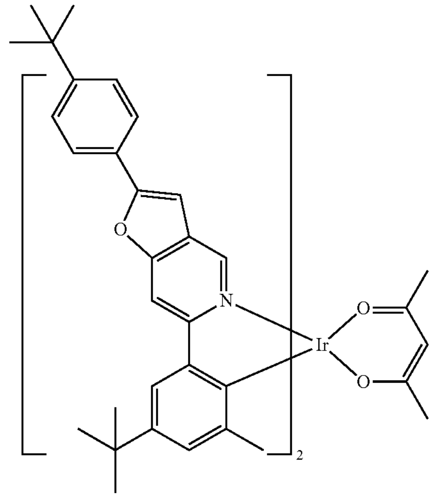
167
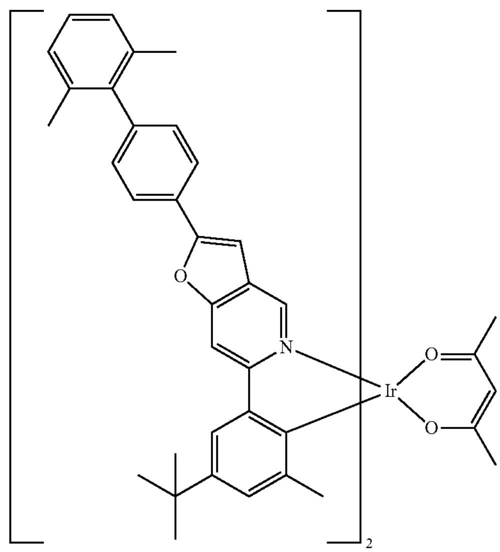
168
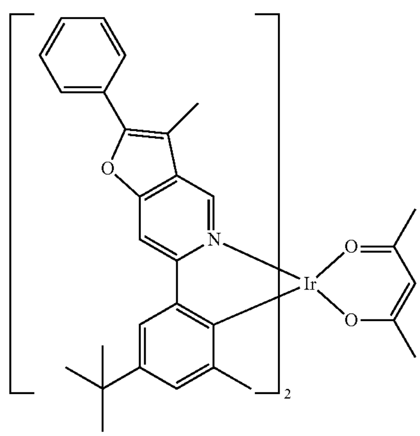

-continued
169
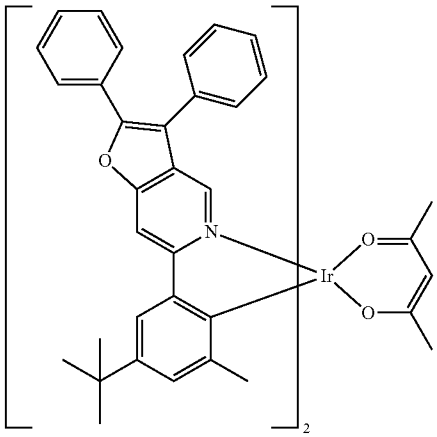
170
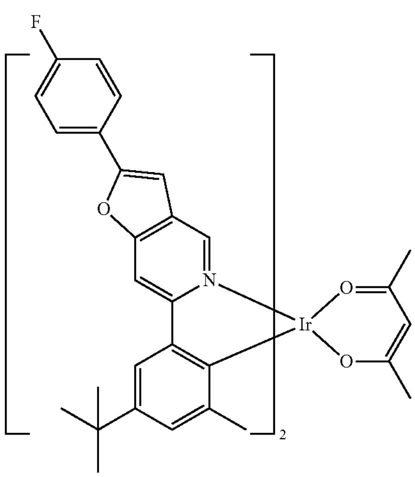
171
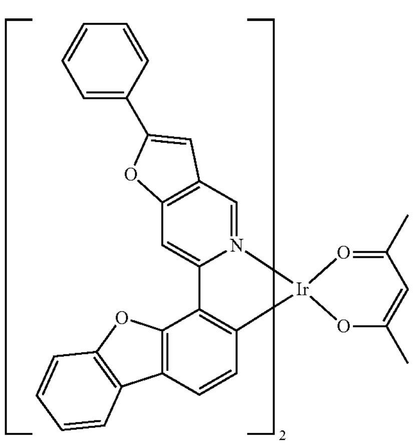
-continued
172
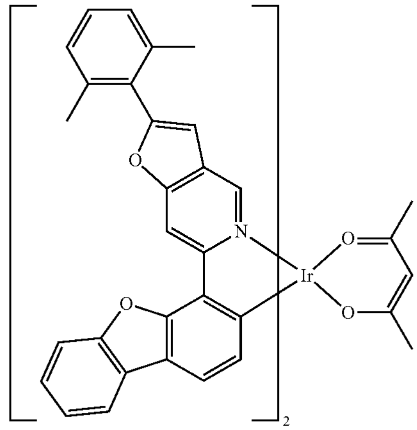
173
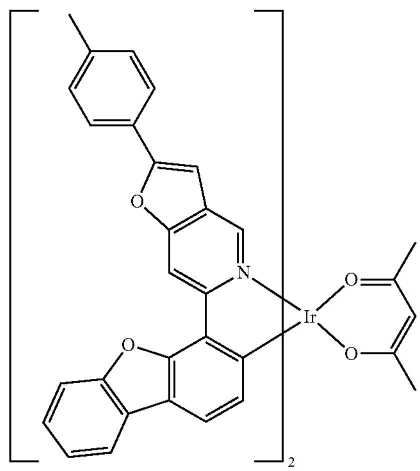
174
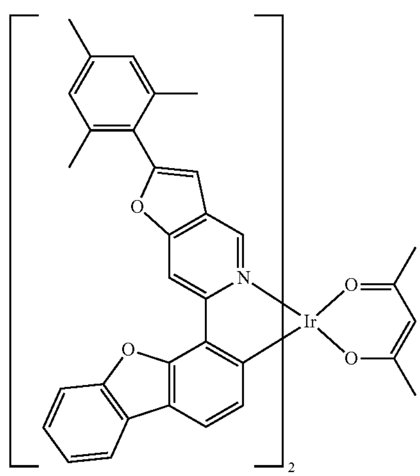

-continued
175
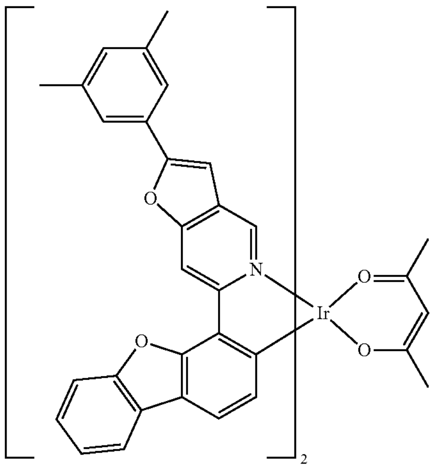
176
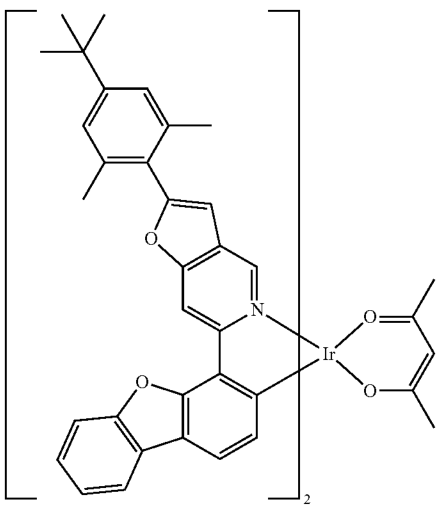
177
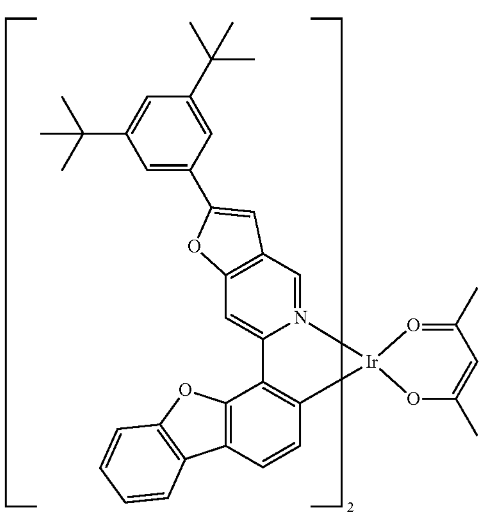
-continued
178
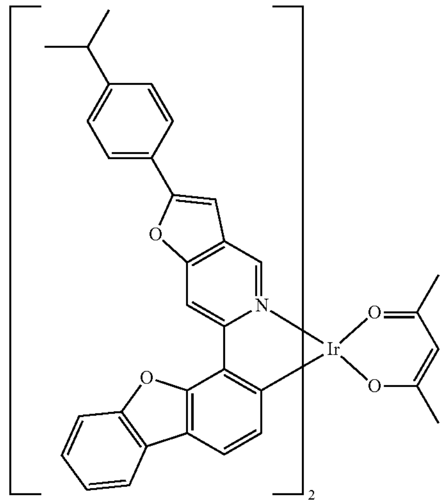
179
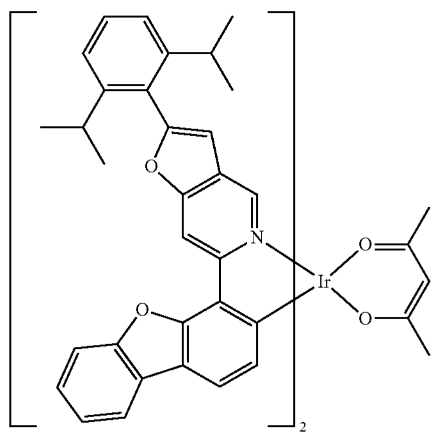
180
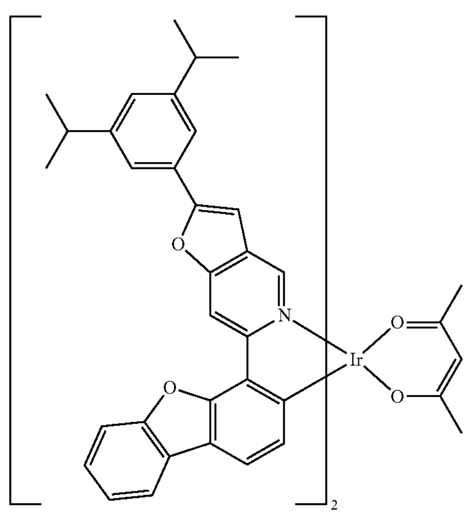

-continued
181
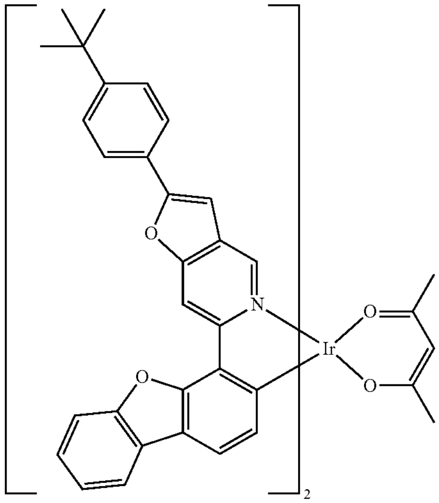
182
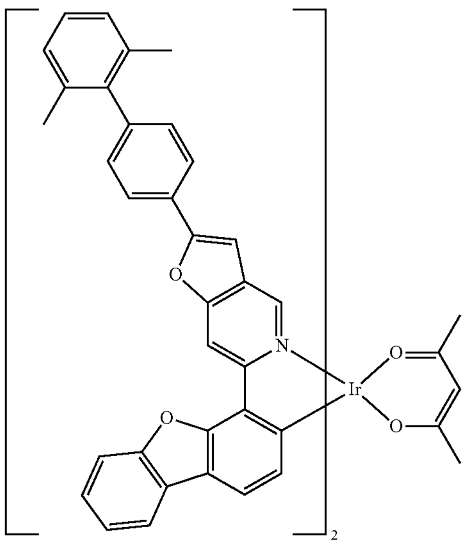
183
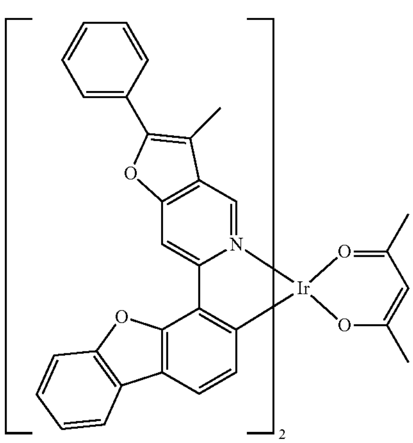
-continued
184
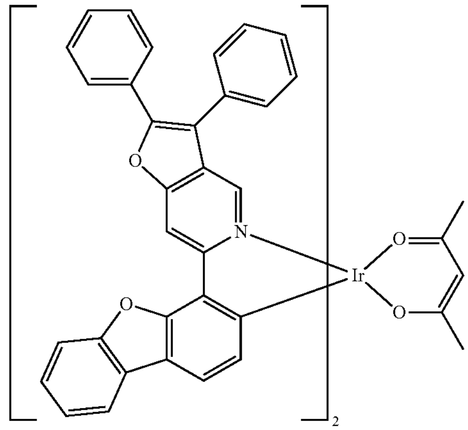
185
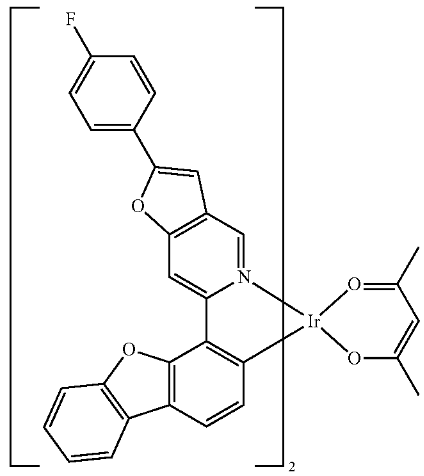
186
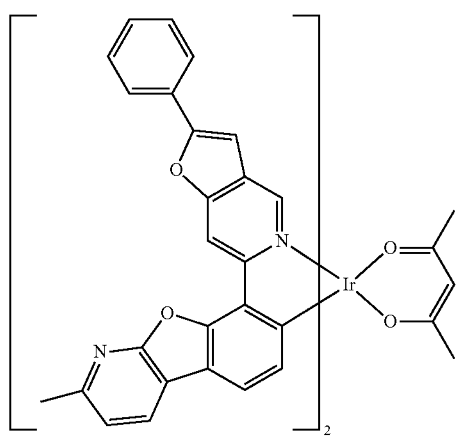

-continued
187
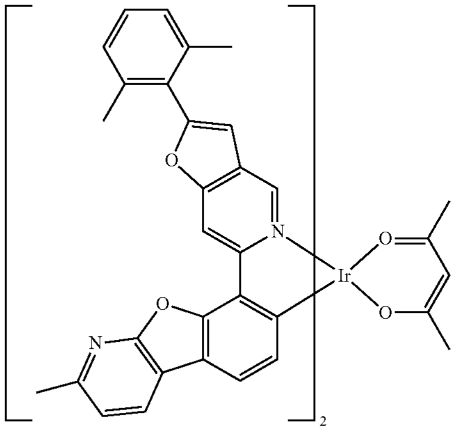
188
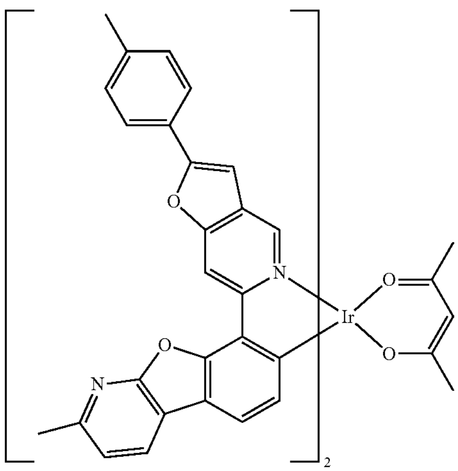
189
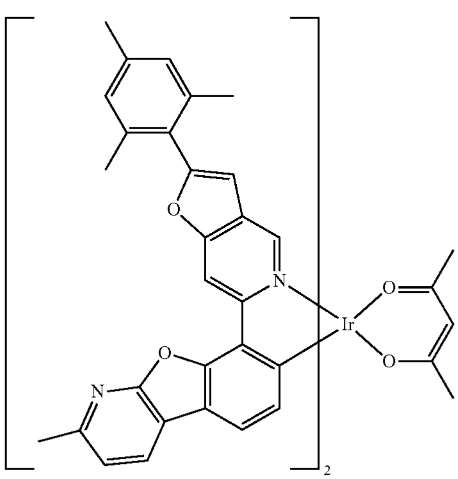
-continued
190
191
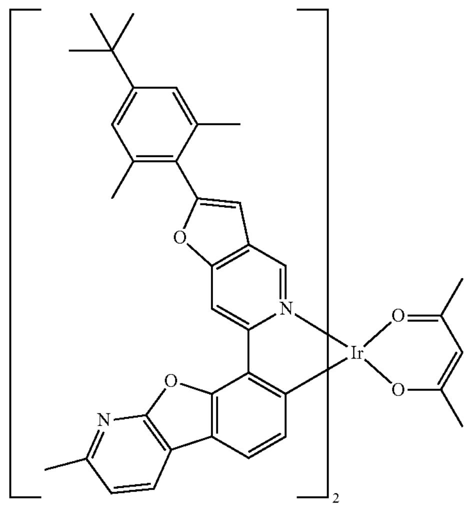
192
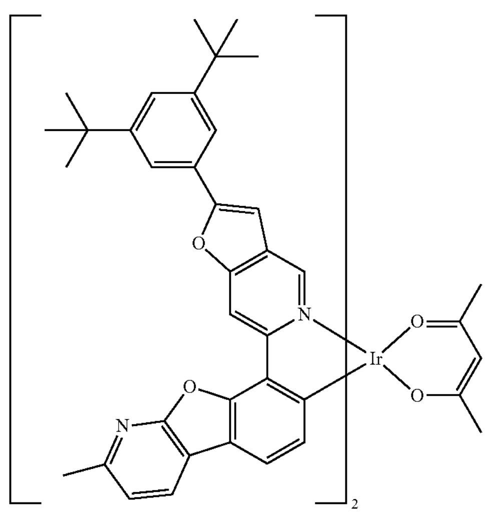

193
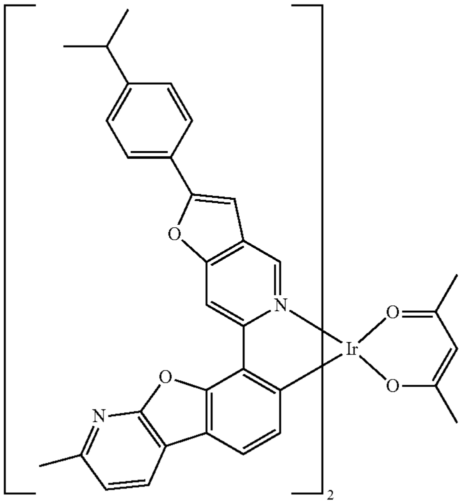
194
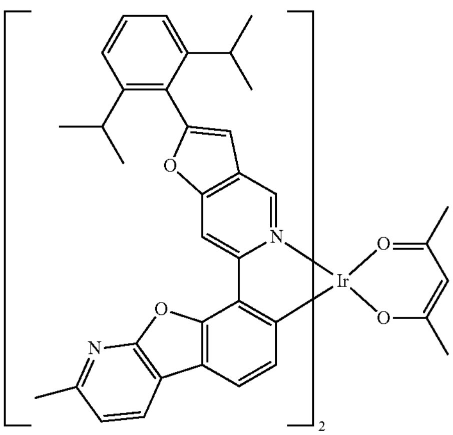
195
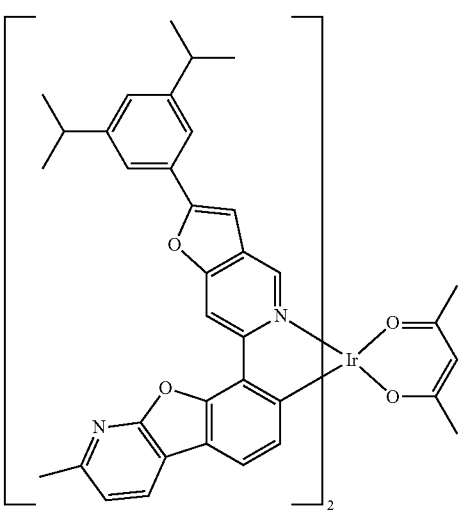
196
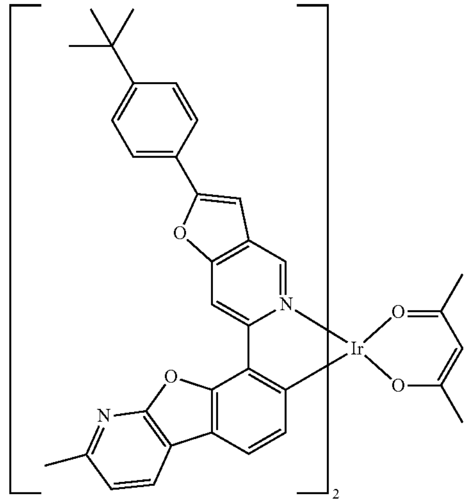
197
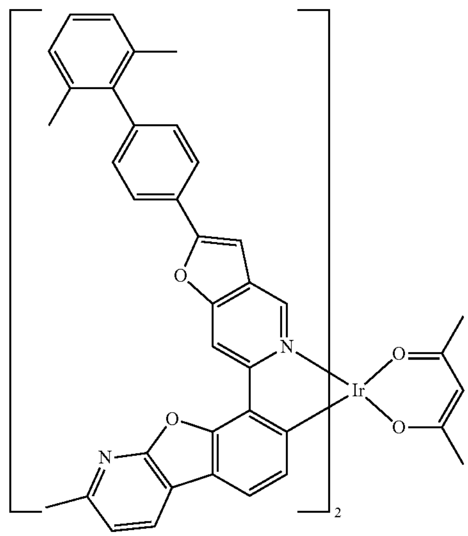
198
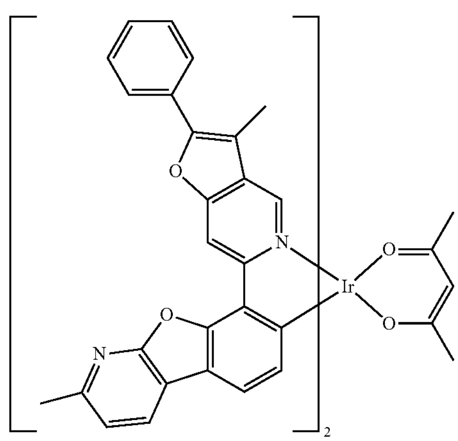

-continued
199
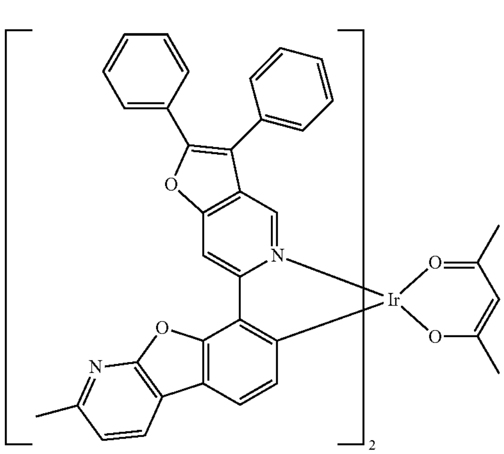
200
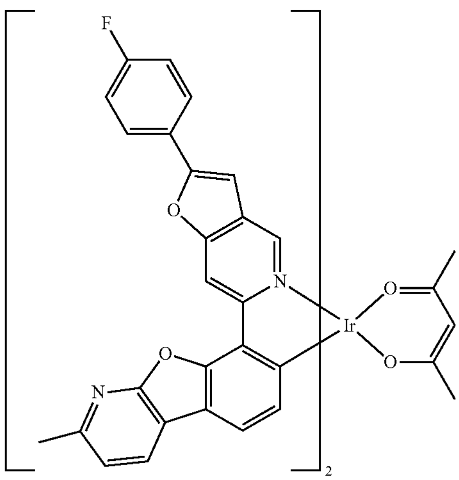
201
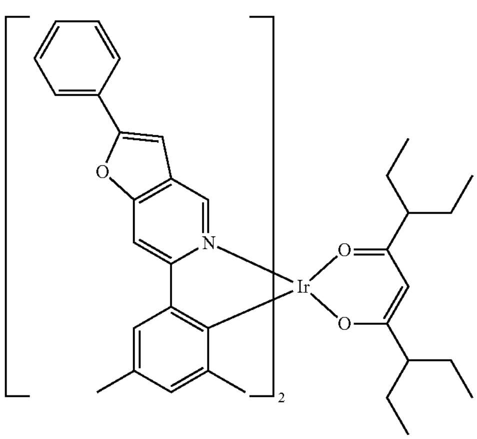
-continued
202
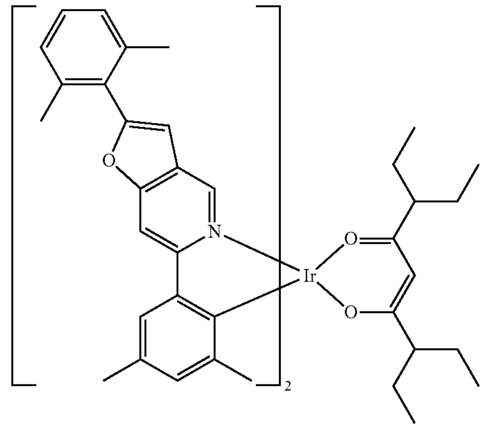
203
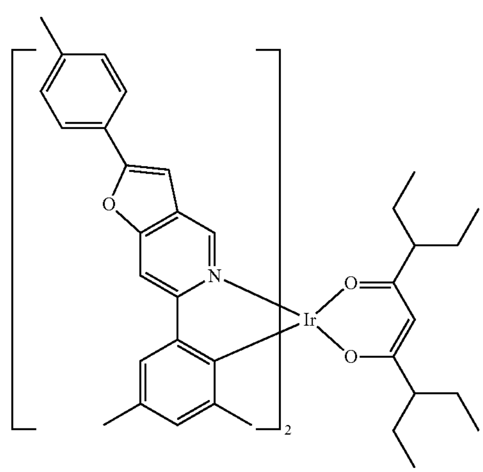
204
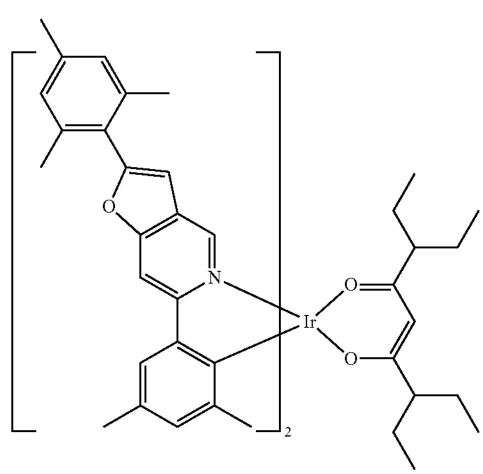

-continued
205
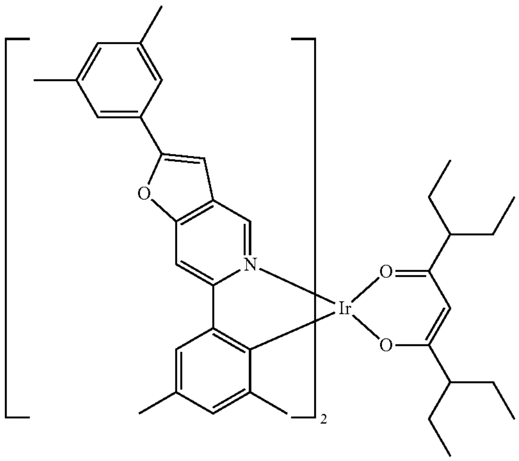
206
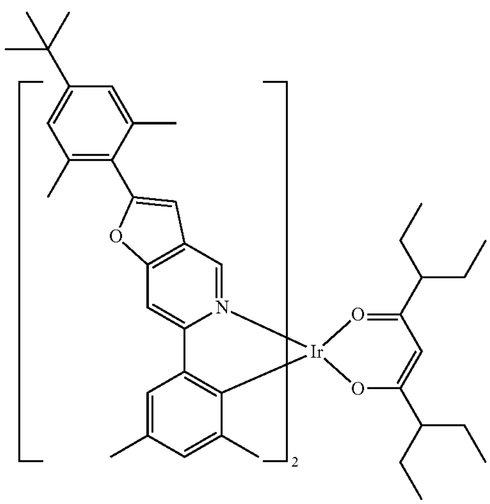
207
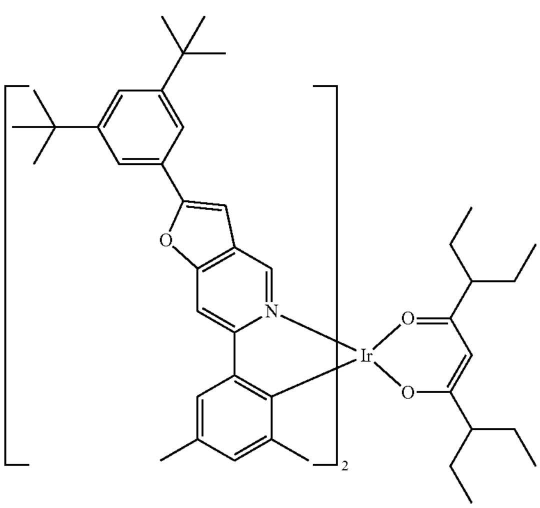
-continued
208
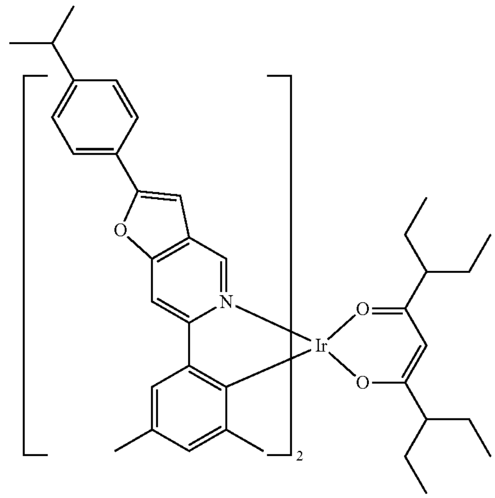
209
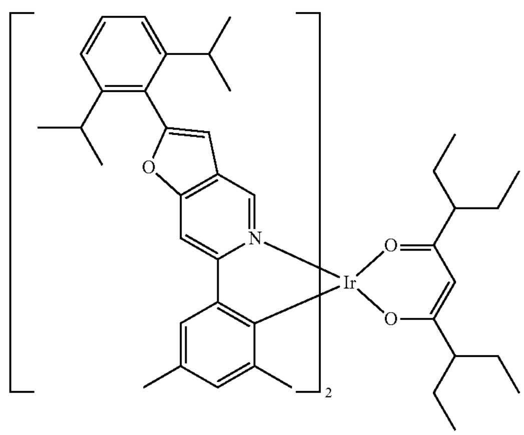
210
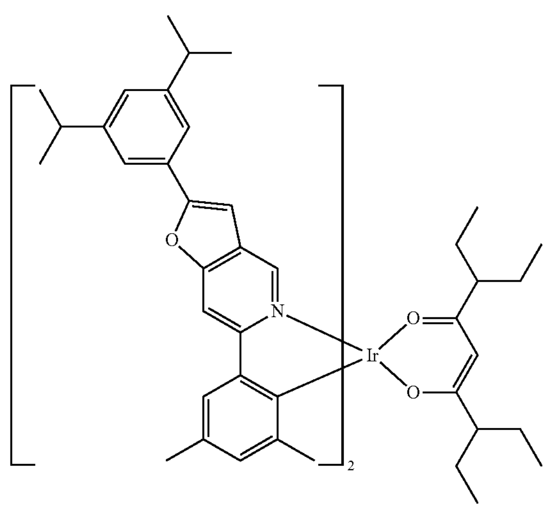

-continued
211
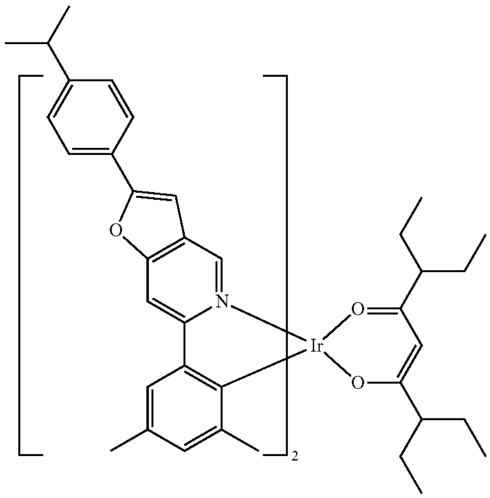
212
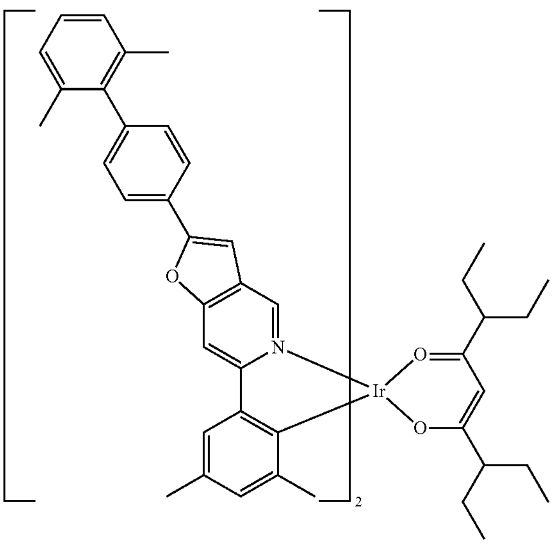
213
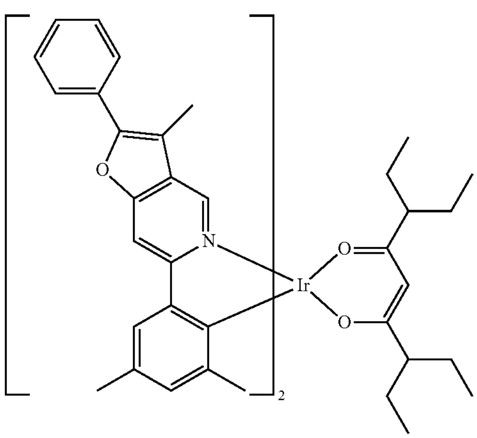
-continued
214
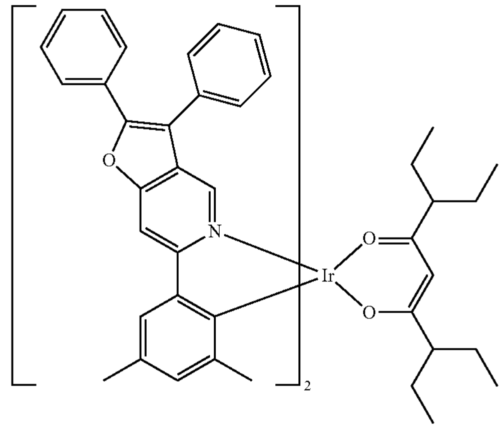
215
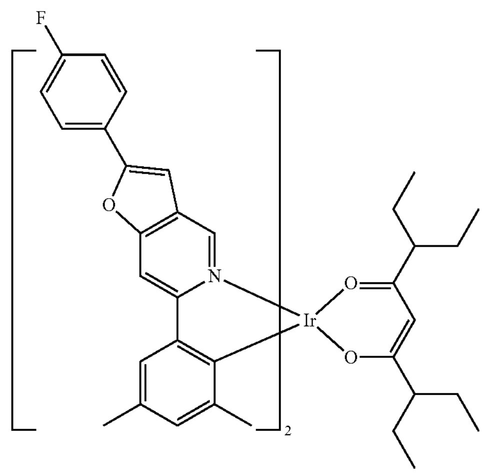
216
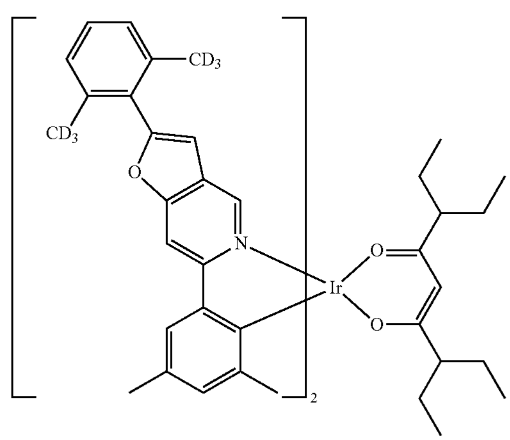

-continued
217
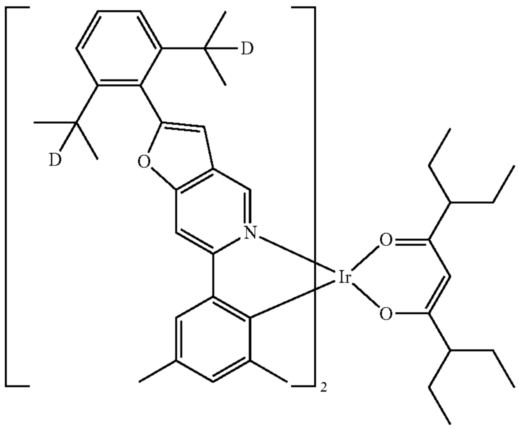
218
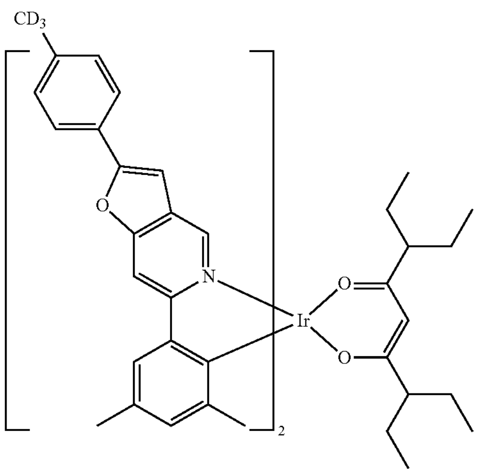
219
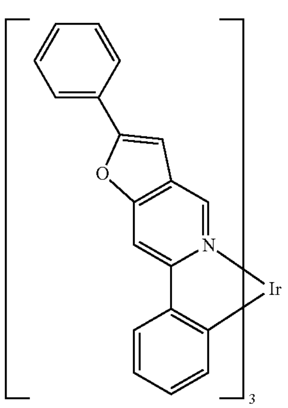
-continued
220
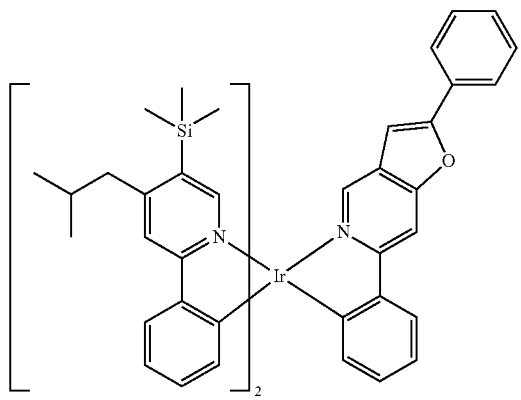
221
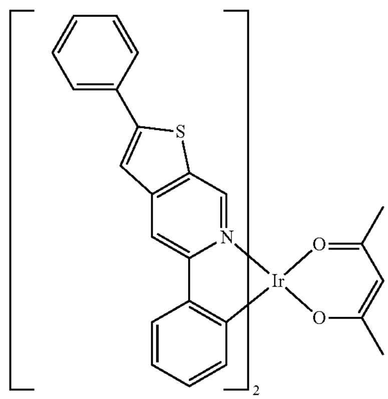
222
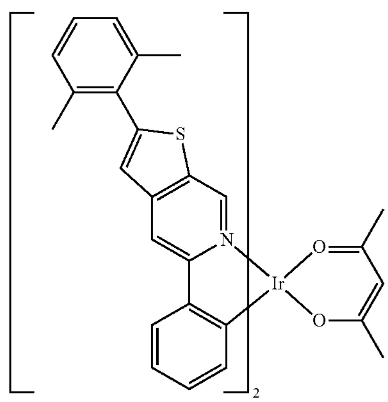
223
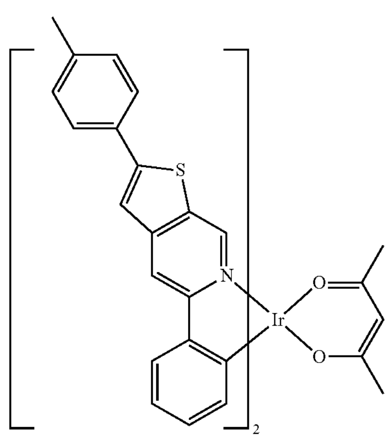

-continued
224
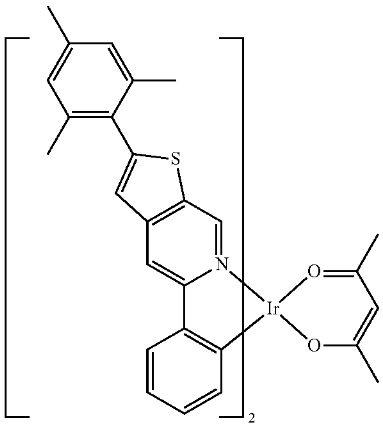
225
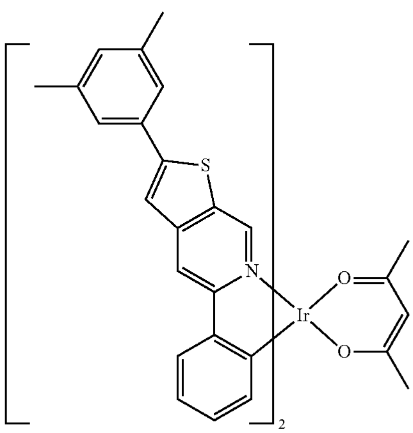
226
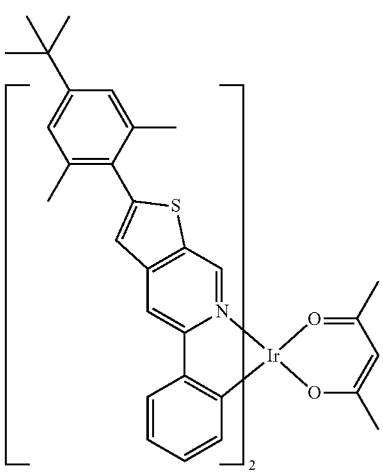
-continued
227
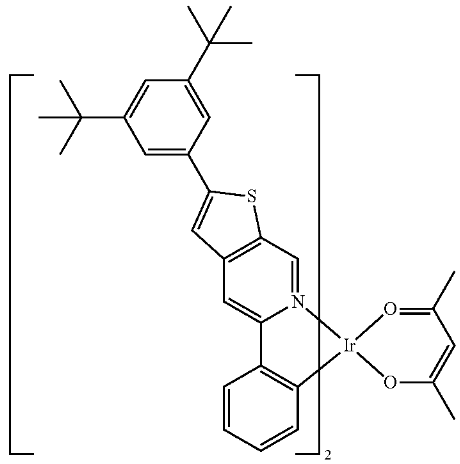
228
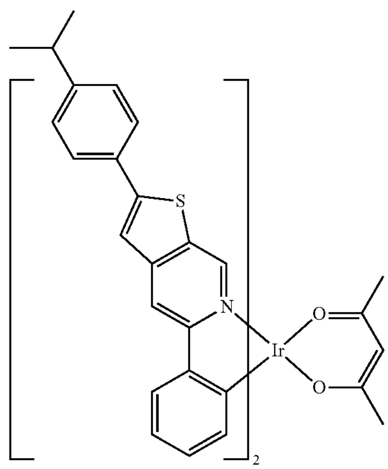
229
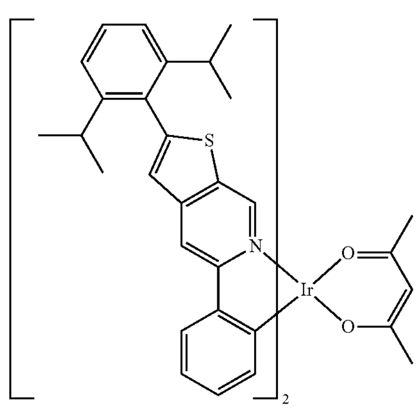

230
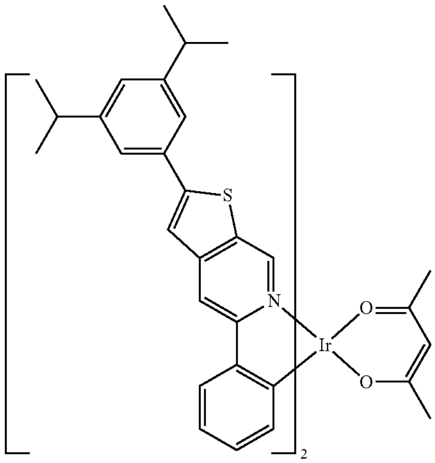
231
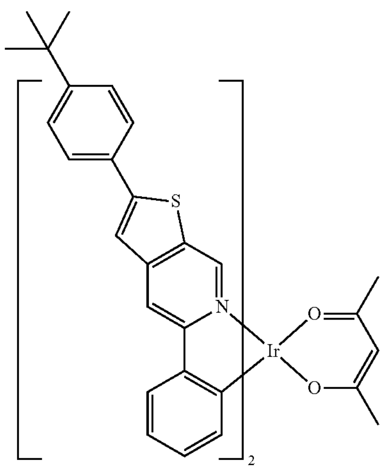
232
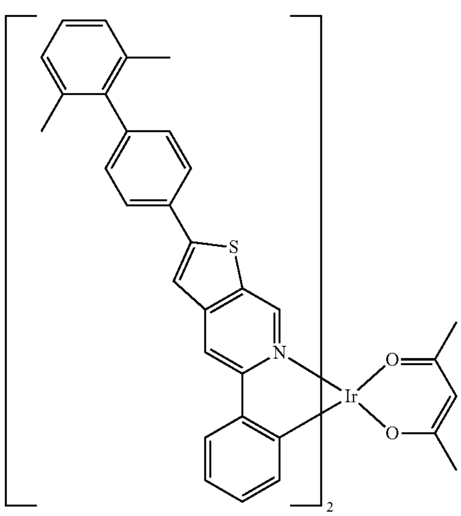
233
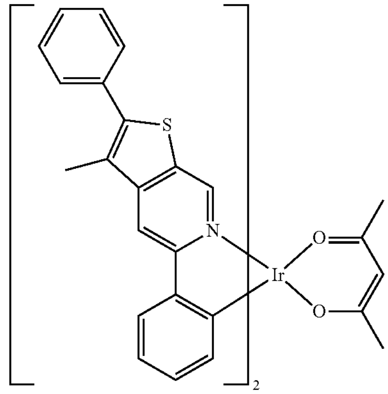
234
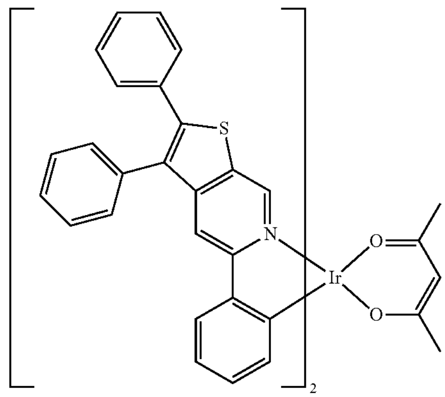
235
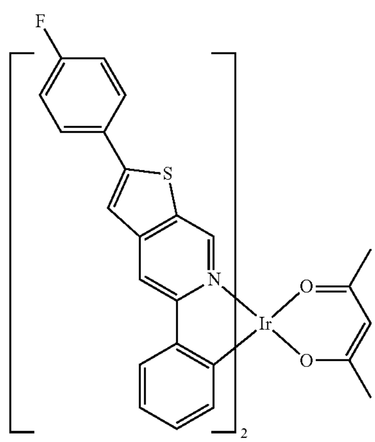
236
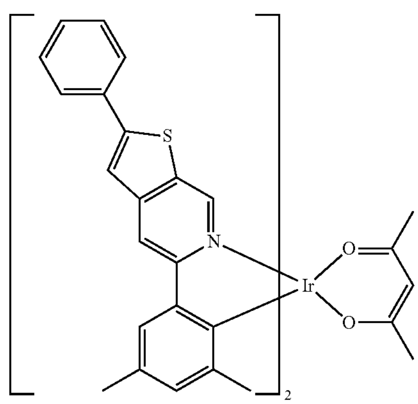

237
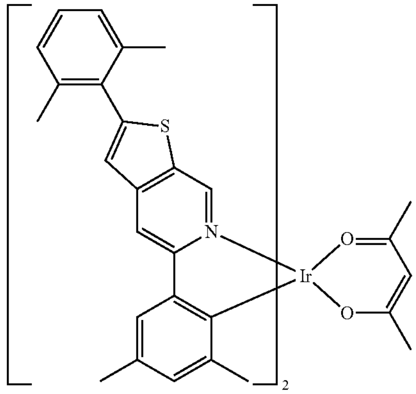
240
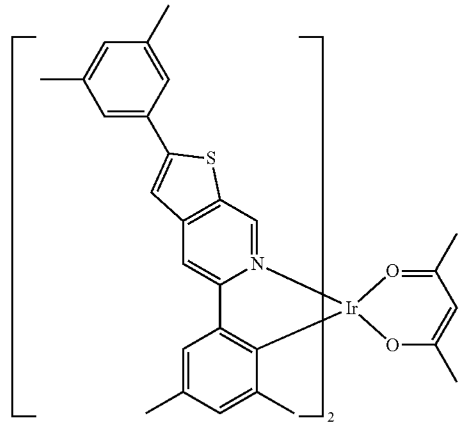
238
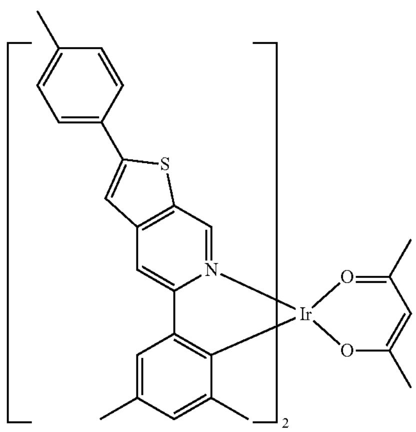
241
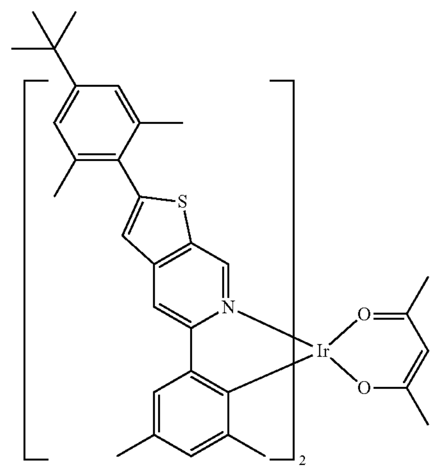
239
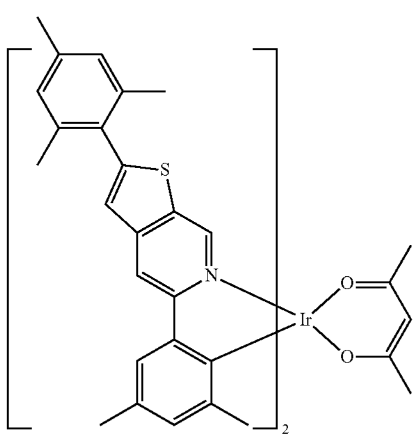
242
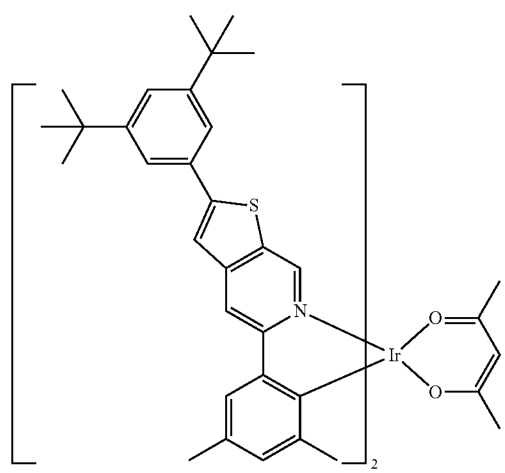

-continued
243
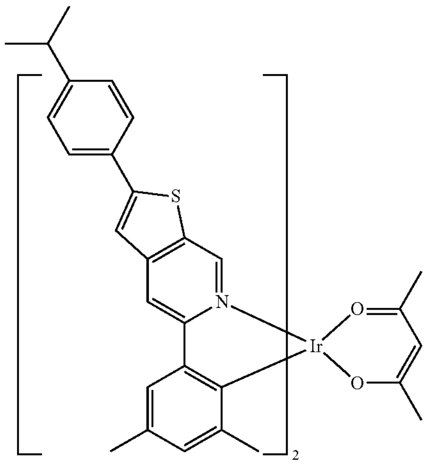
244
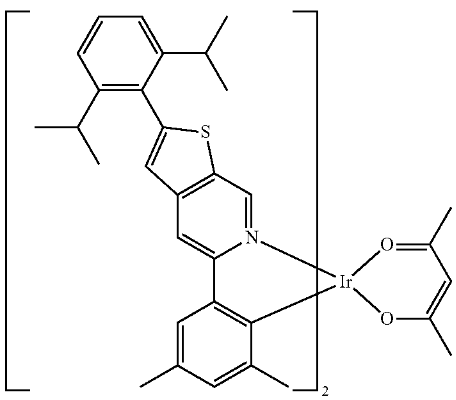
245
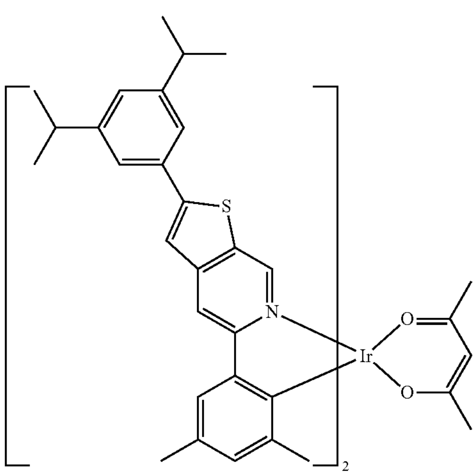
-continued
246
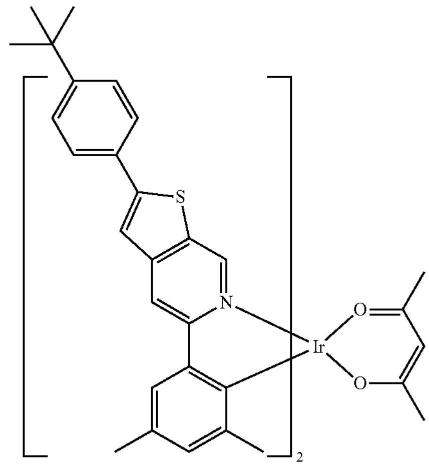
247
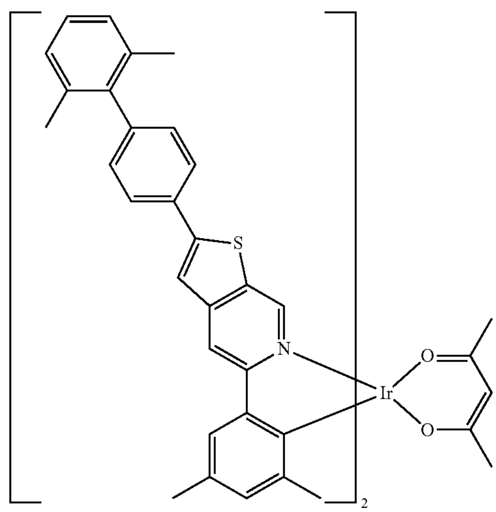
248
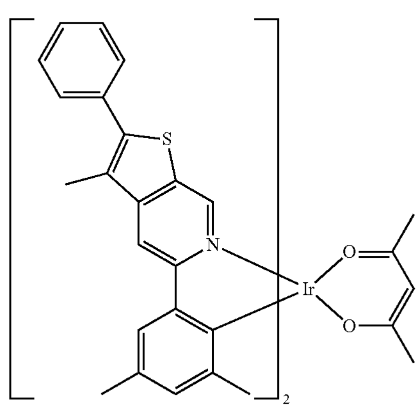

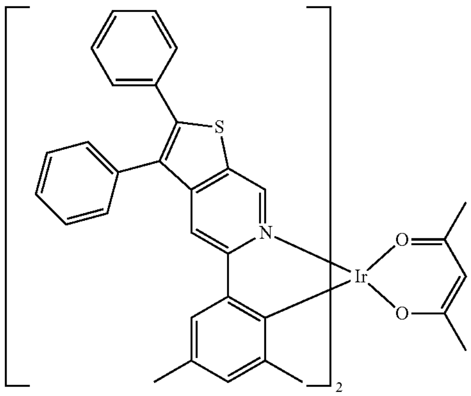
249
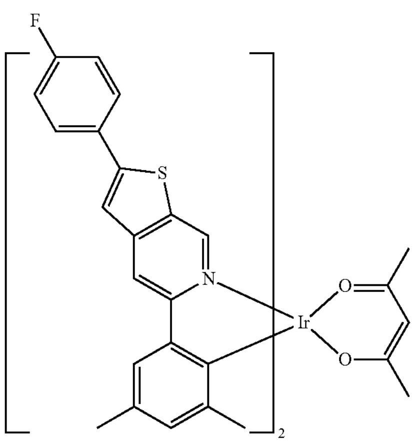
250
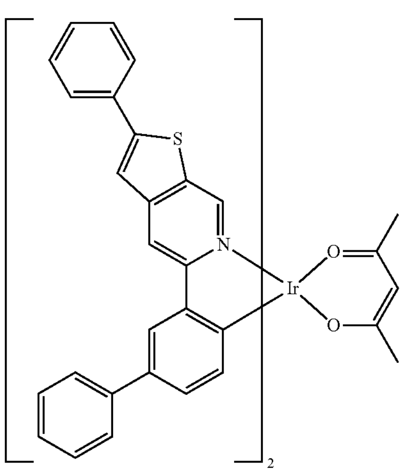
251
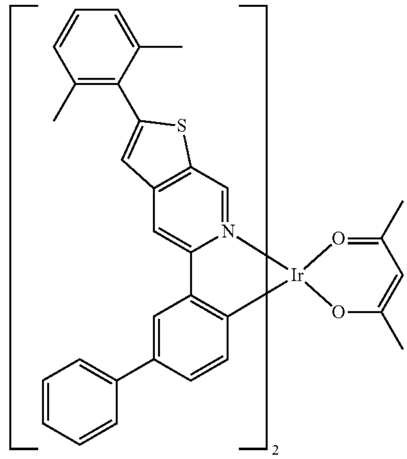
252
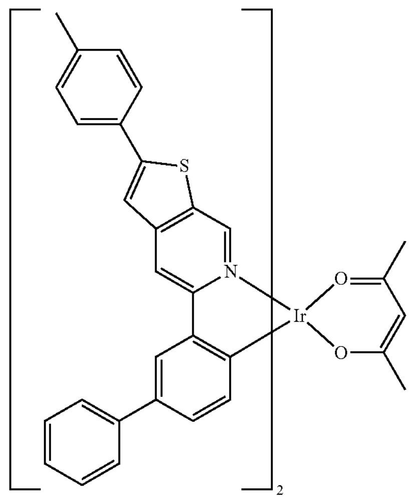
253
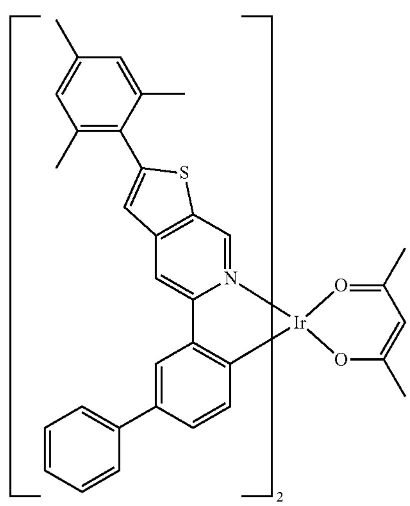
254

-continued
255
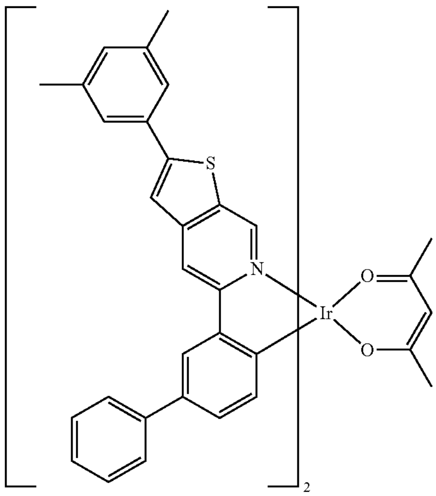
256
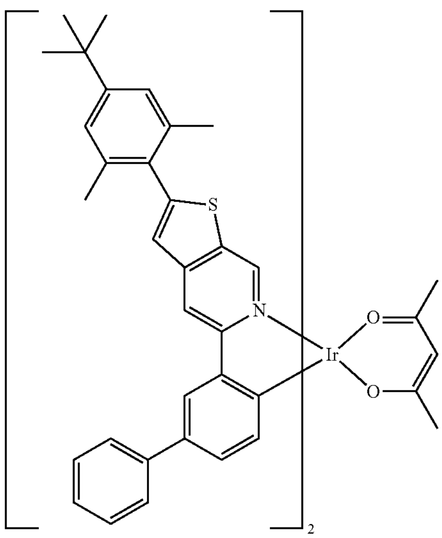
257
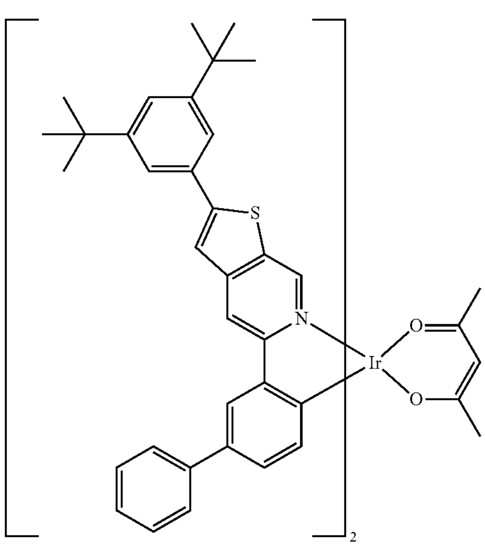
-continued
258
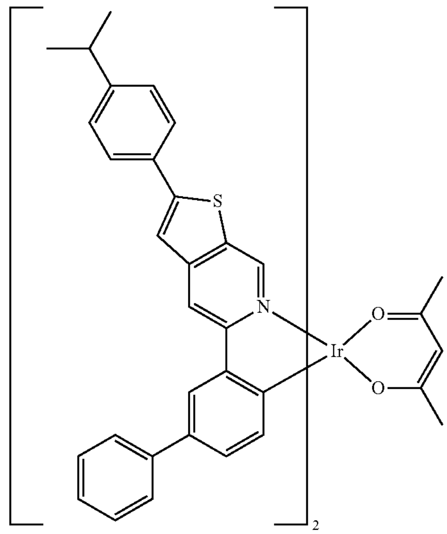
259
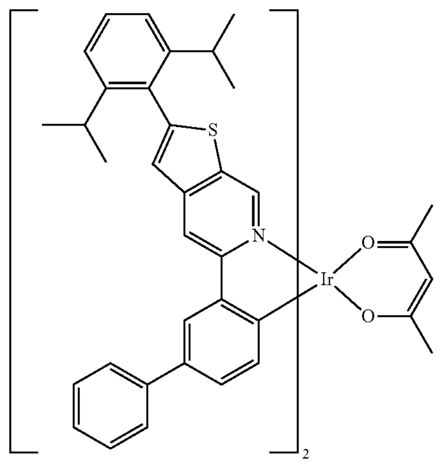
260
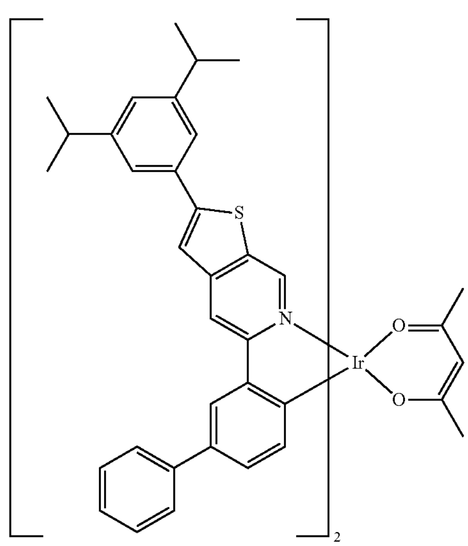

-continued
261
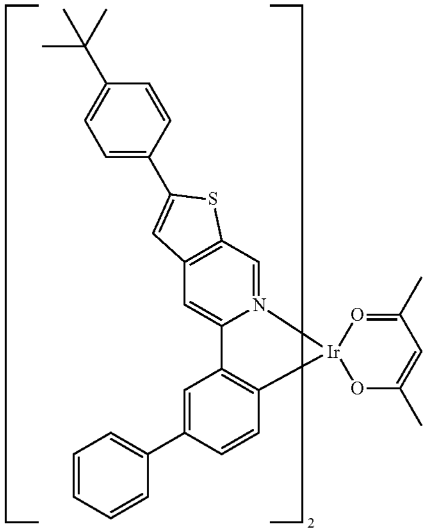
262
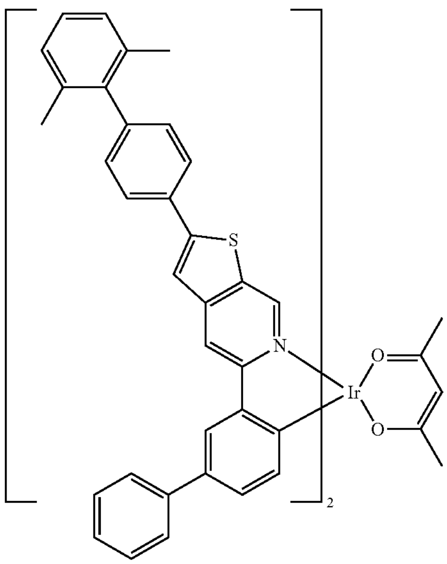
263
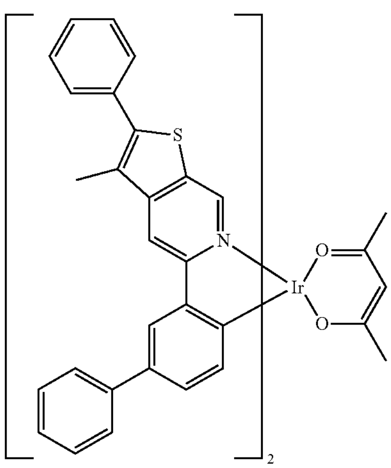
264
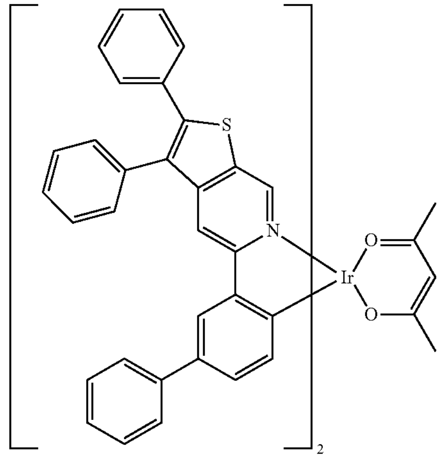
265
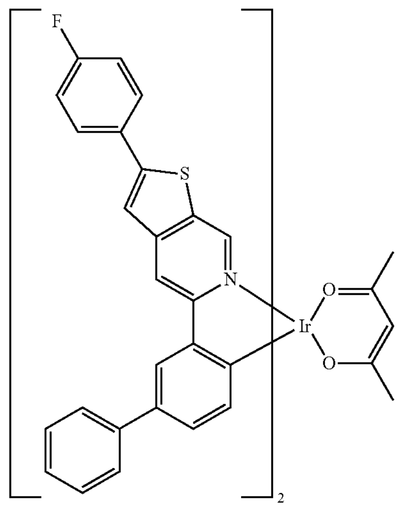
266
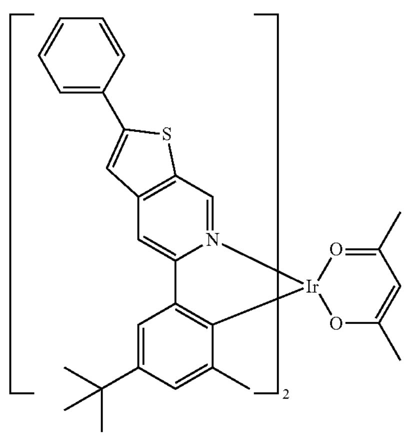

-continued
267
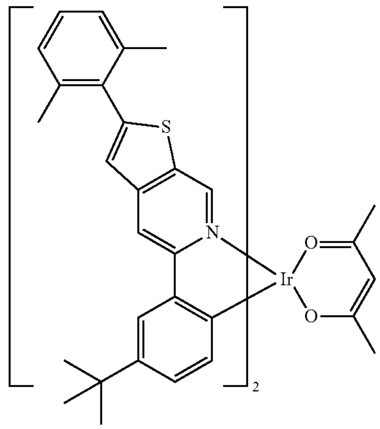
268
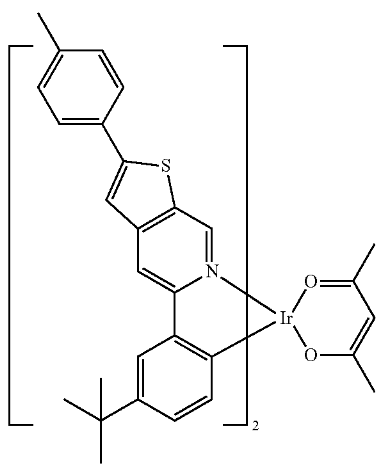
269
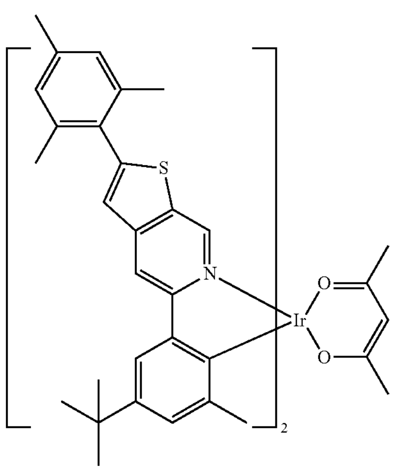
-continued
270
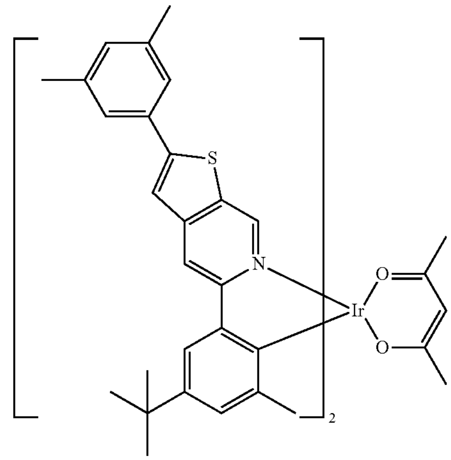
271
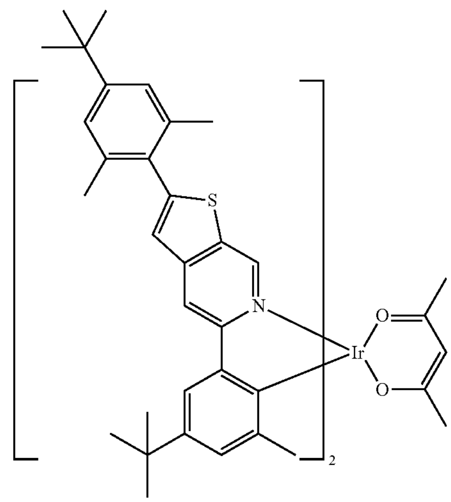
272
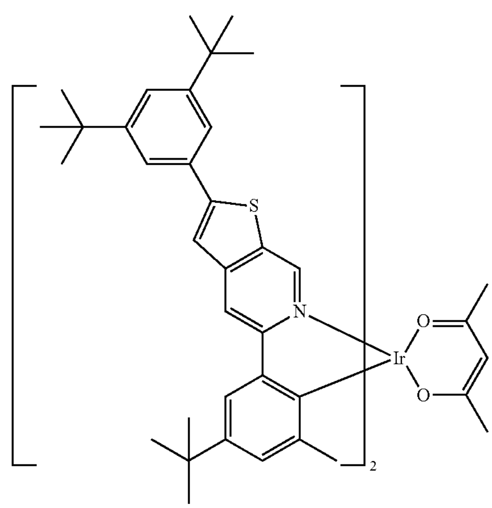

273
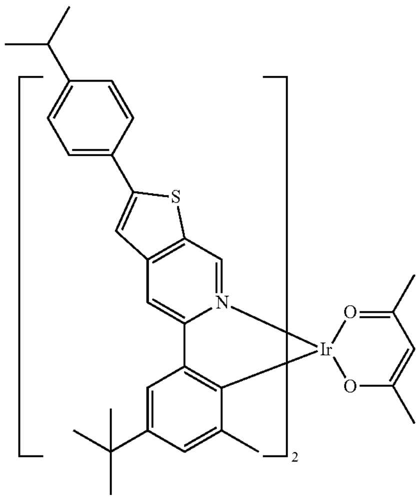
274
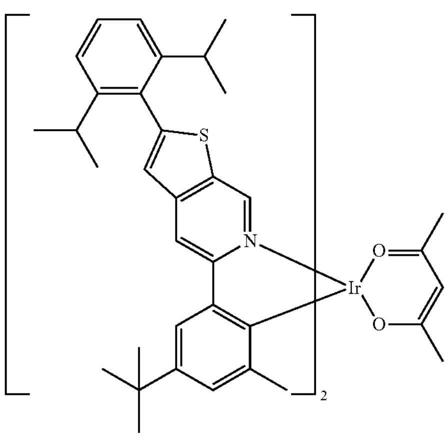
275
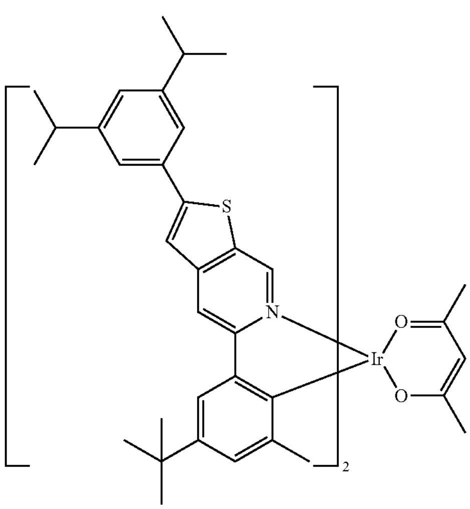
276
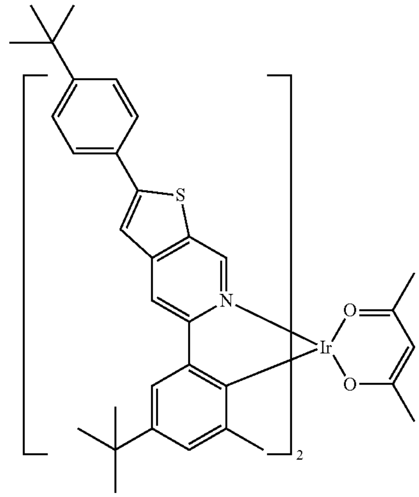
277
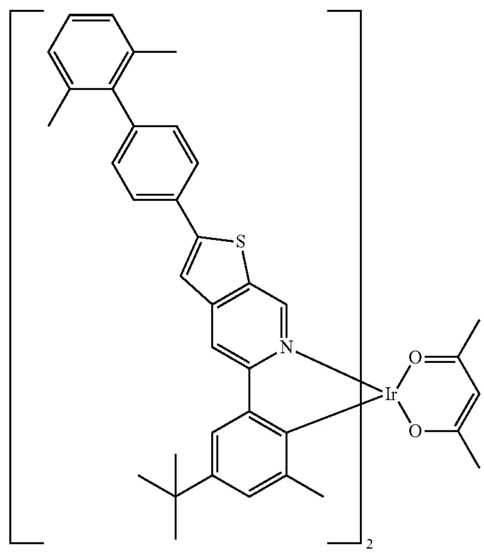
278
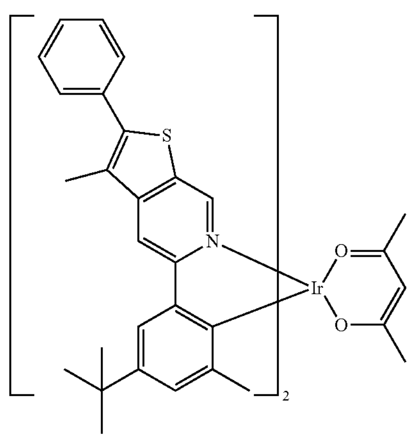

-continued
279
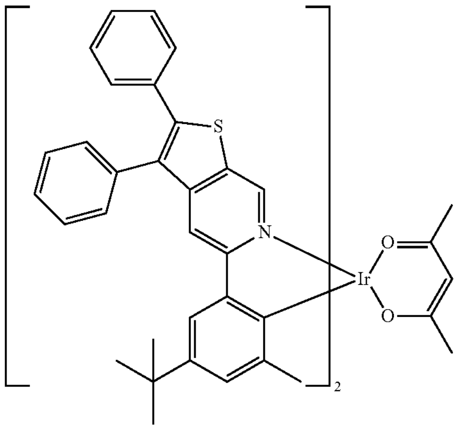
280
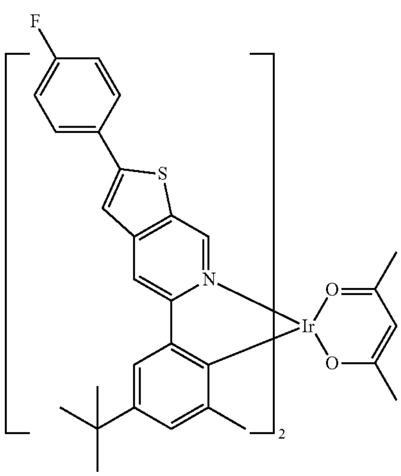
281
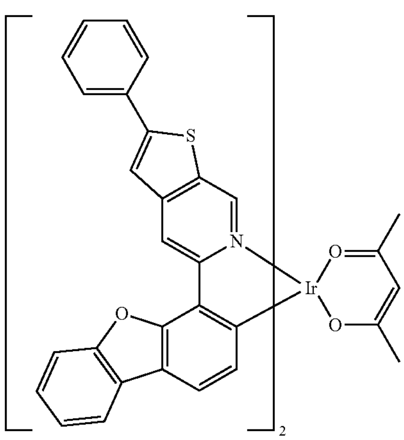
-continued
282
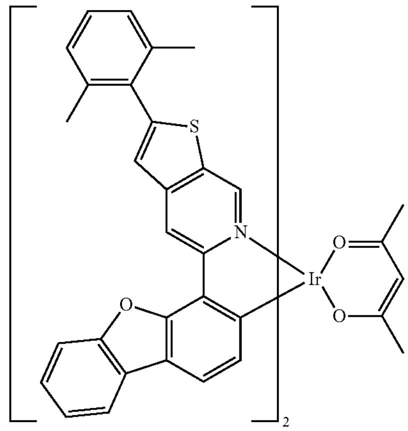
283
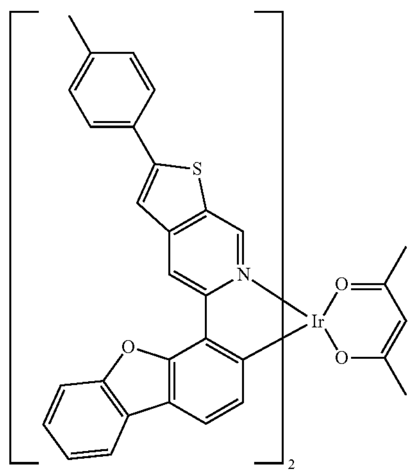
284
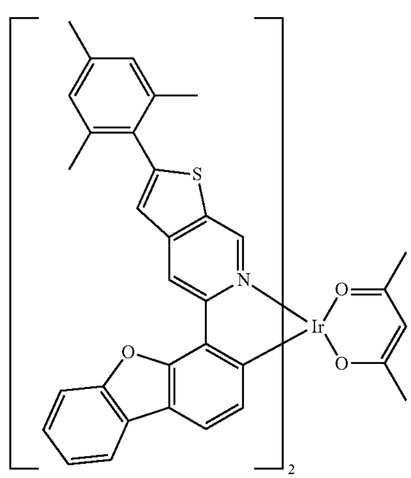

-continued
285
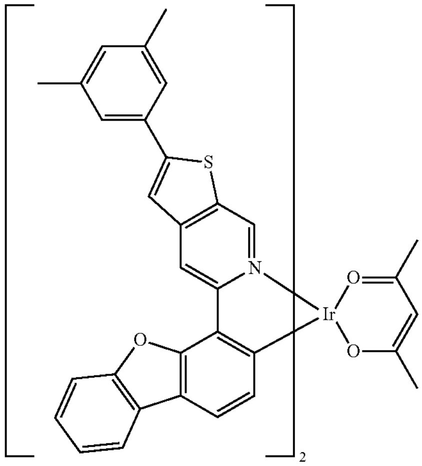
286
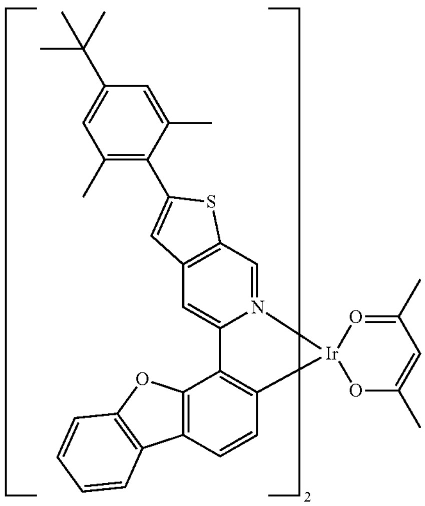
287
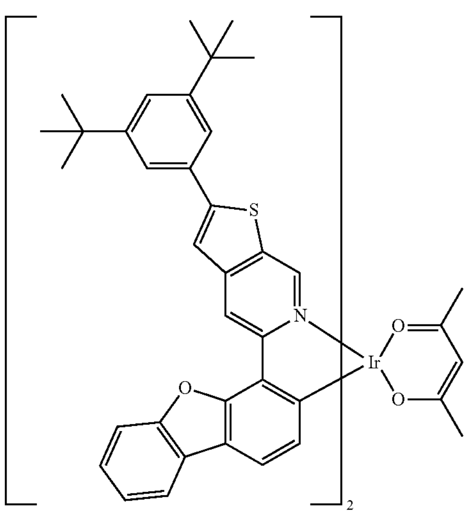
-continued
288
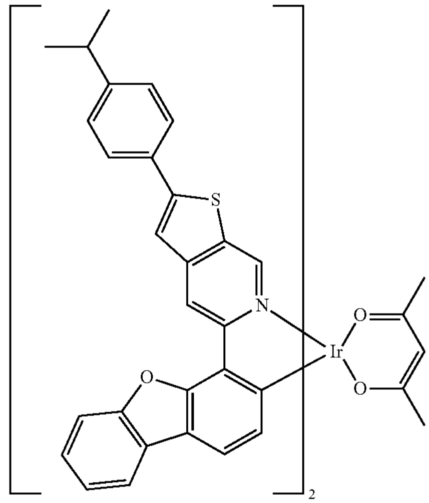
289
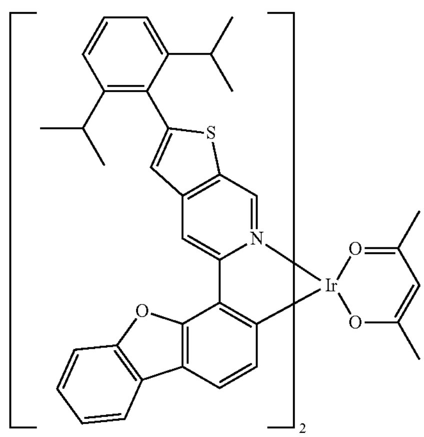
290
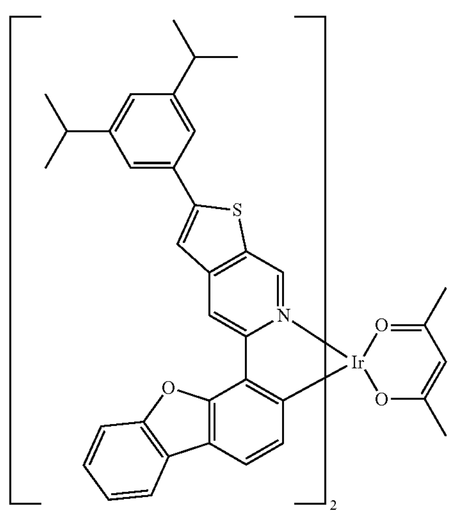

-continued
291
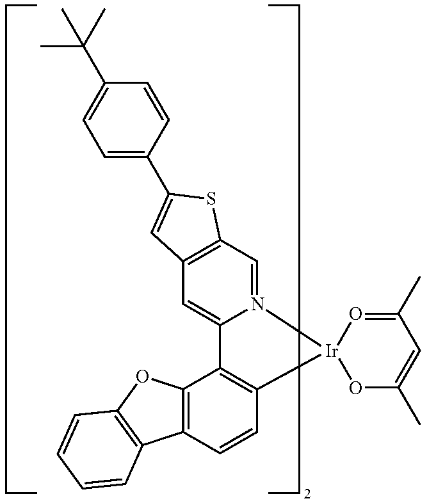
292
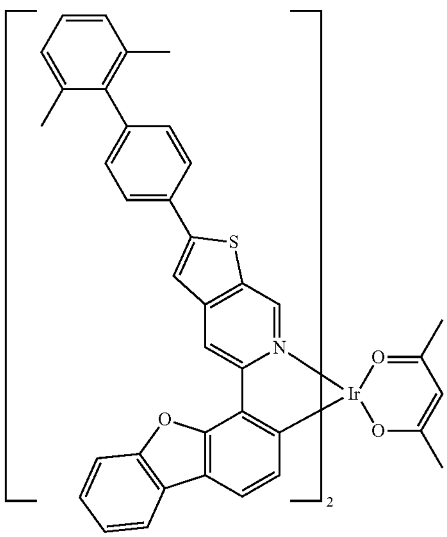
293
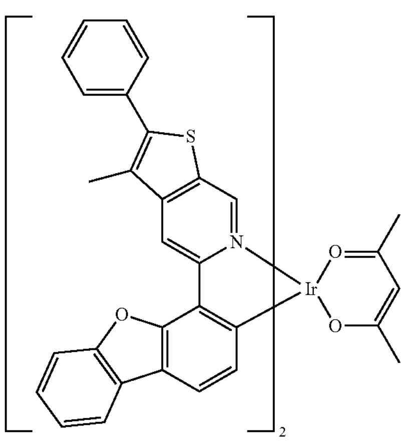
-continued
294
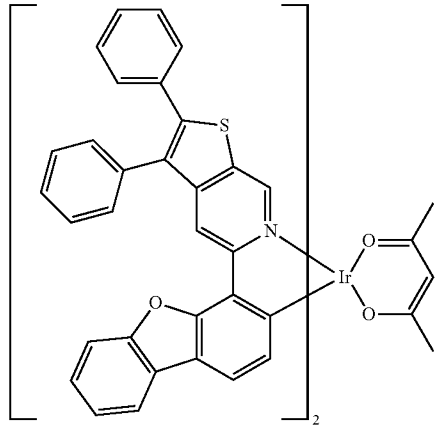
295
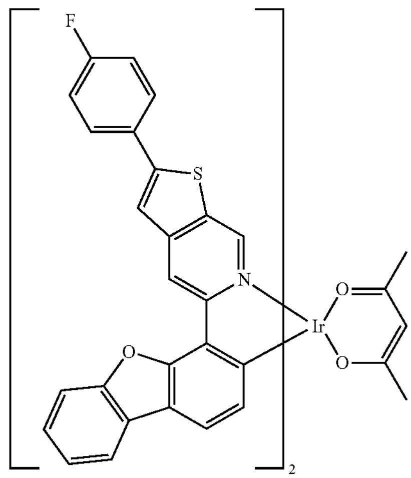
296

297
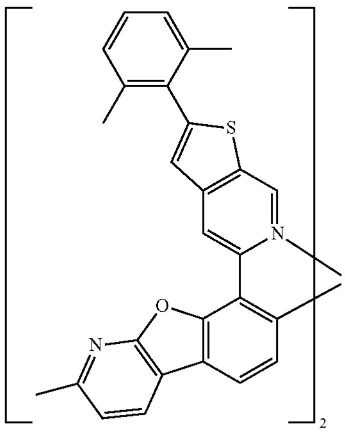
298
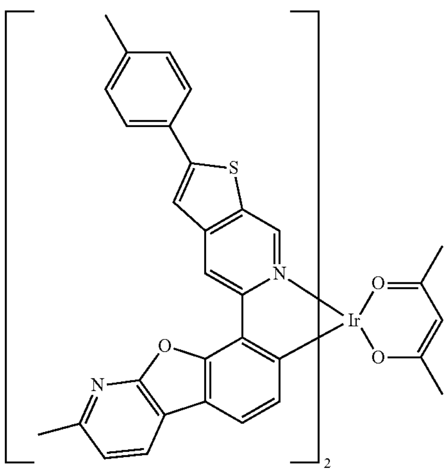
299
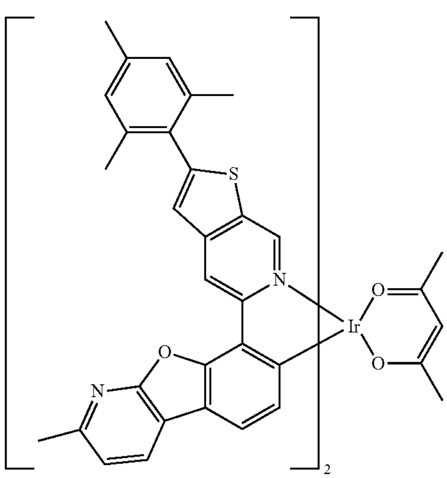
300
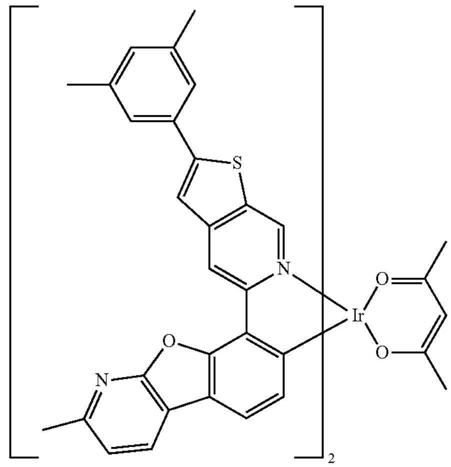
301
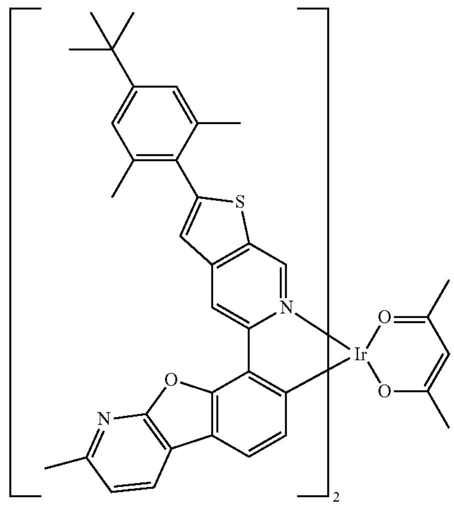
302
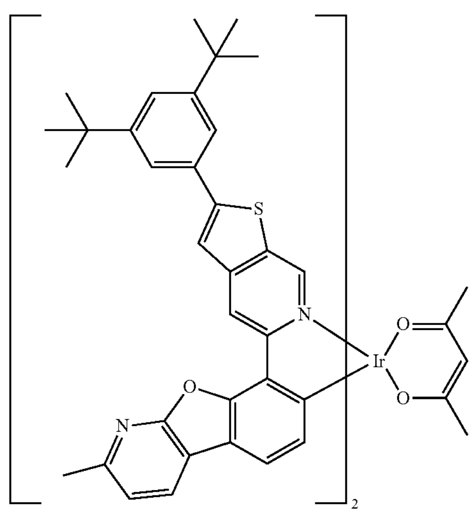

-continued
303
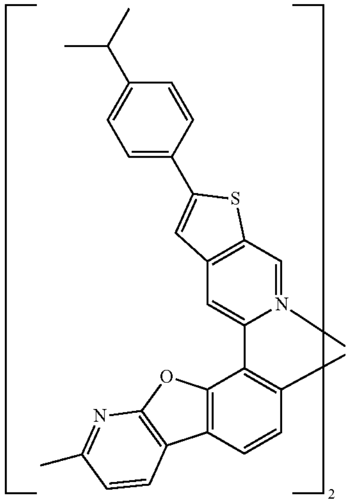
304
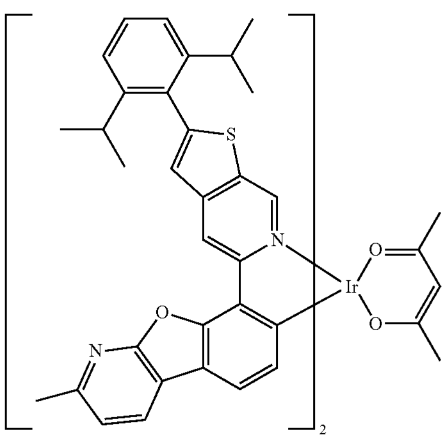
305
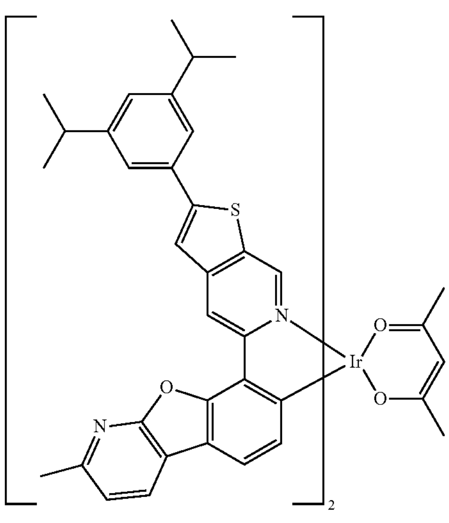
-continued
306
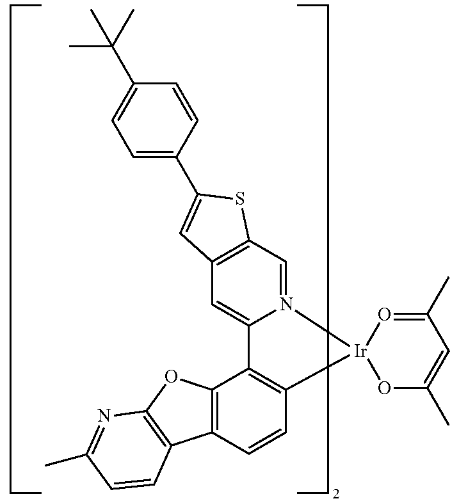
307
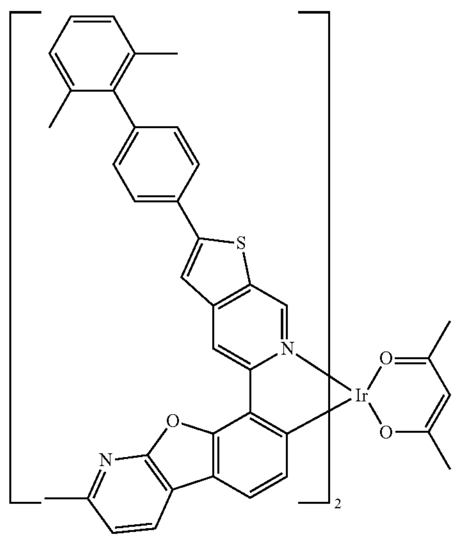
308
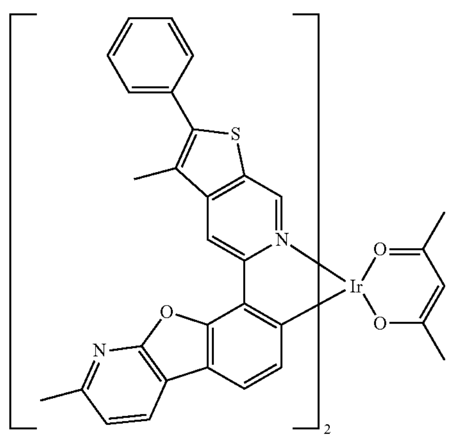

-continued
309
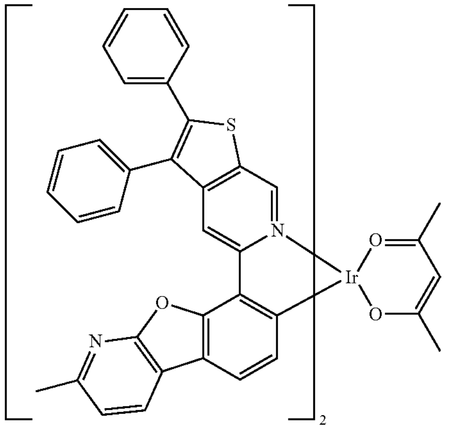
310
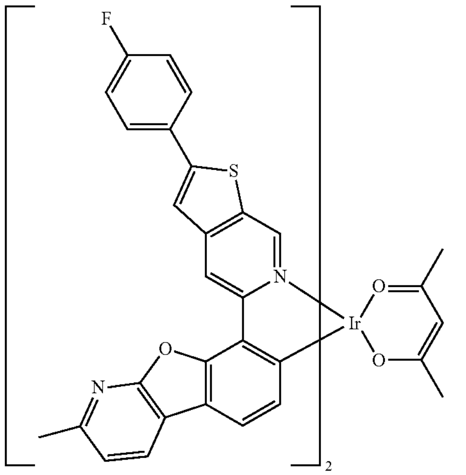
311
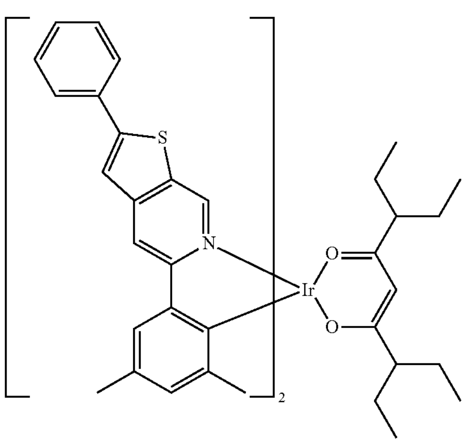
-continued
312
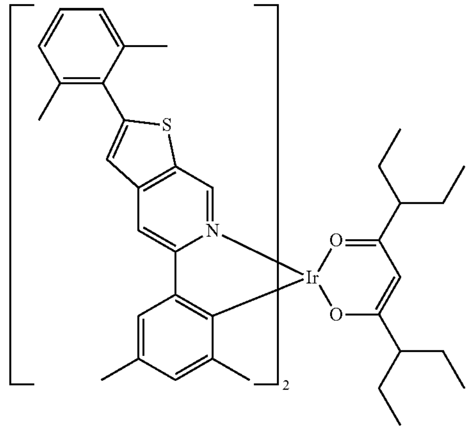
313
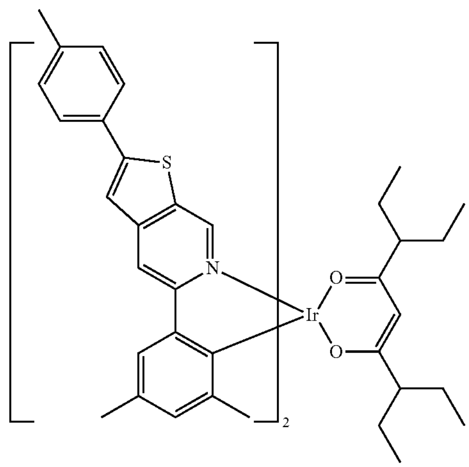
314
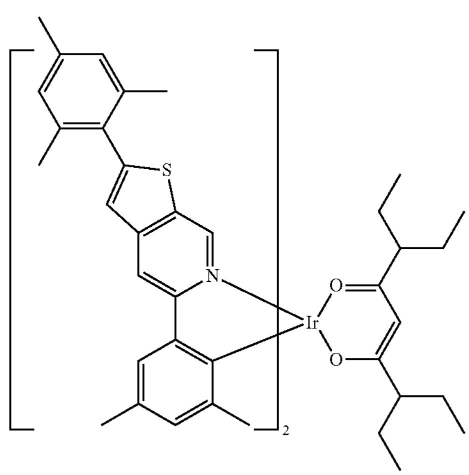

315
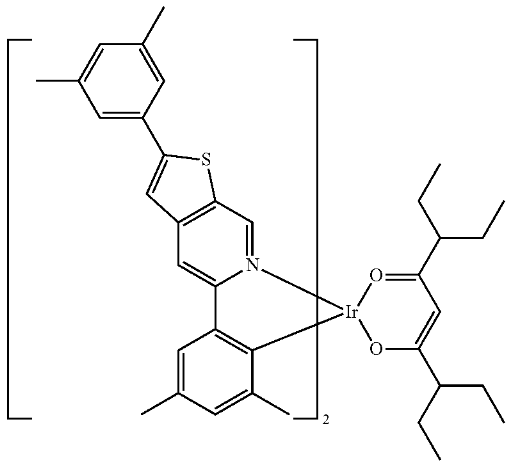
316
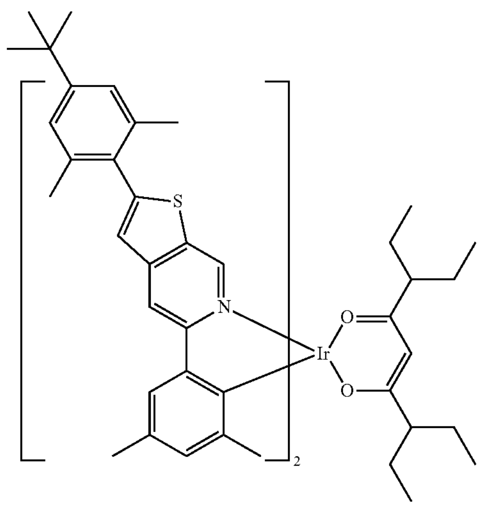
317
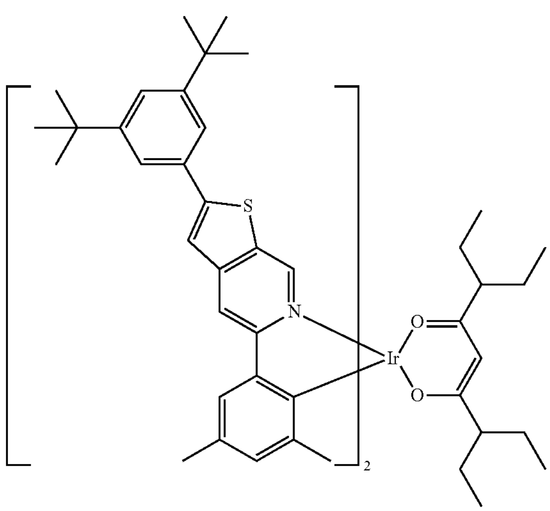
318
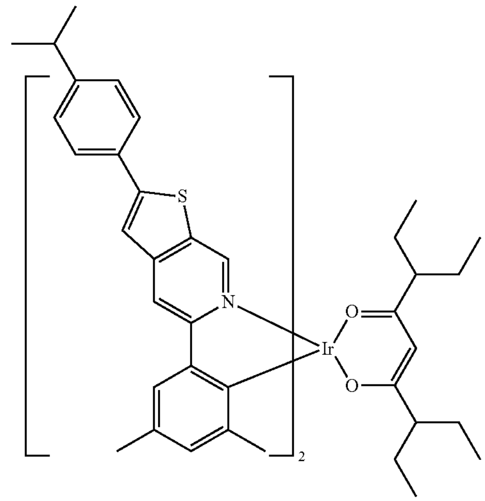
319
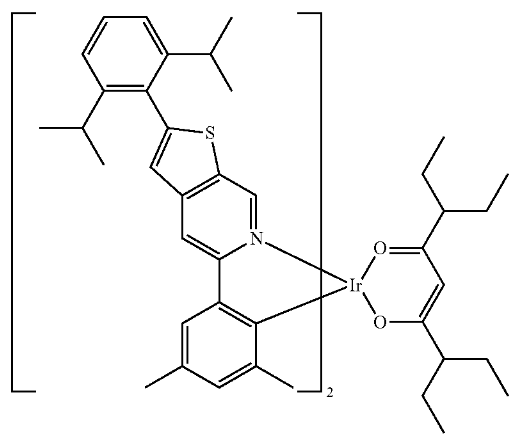
320
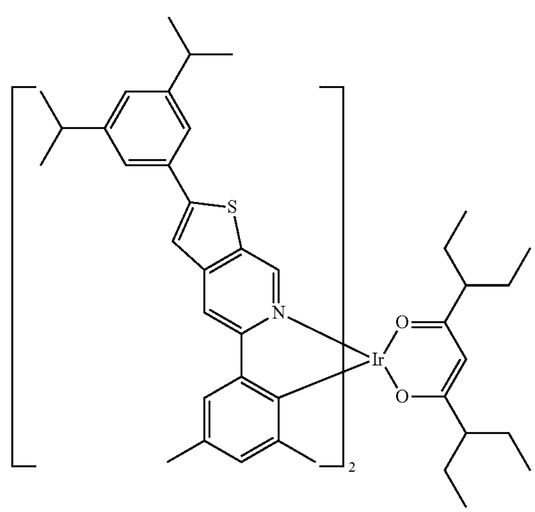

-continued
321
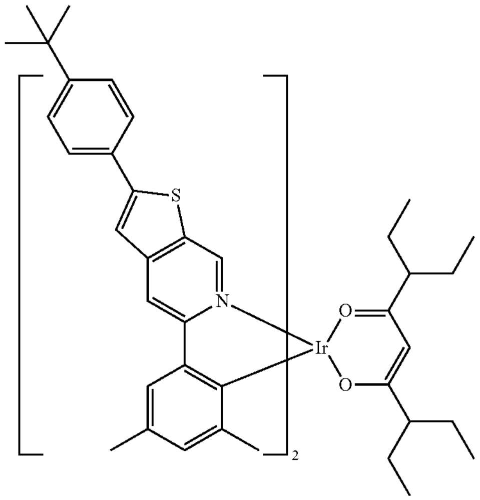
322
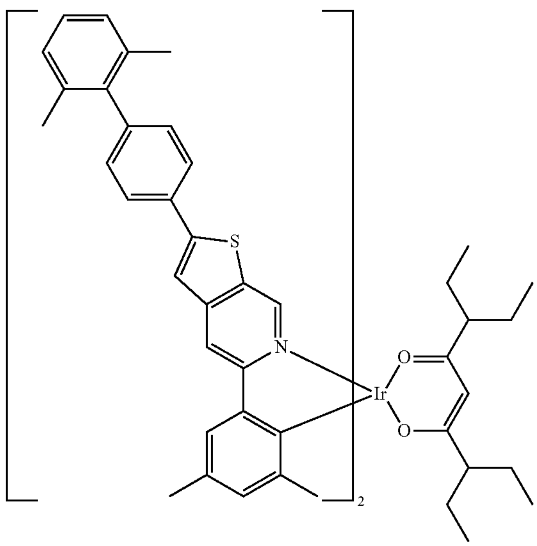
323
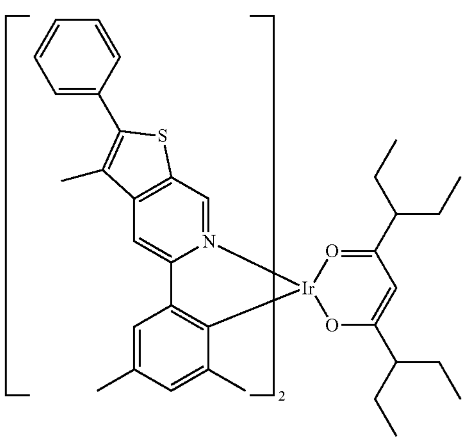
-continued
324
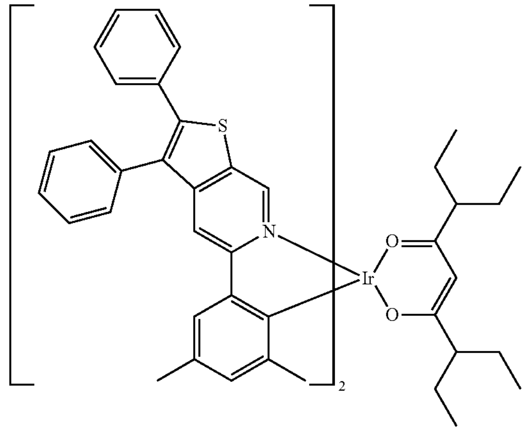
325
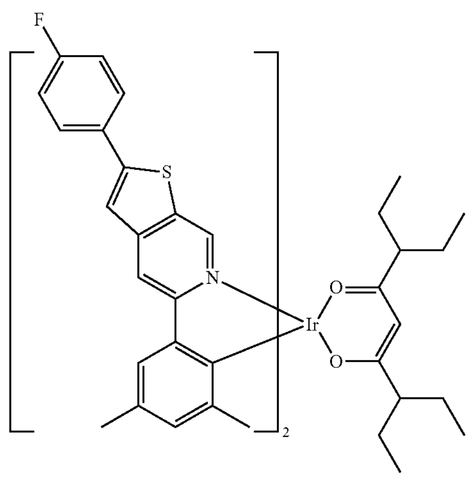
326
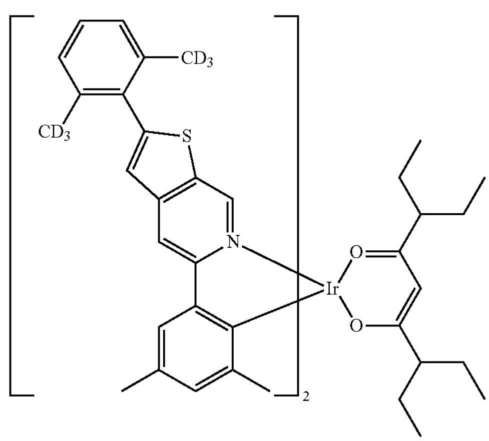

327
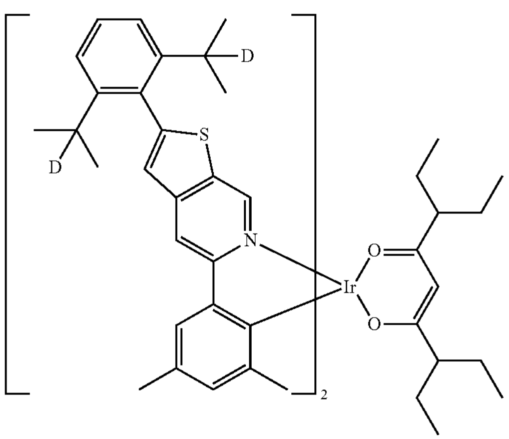
328
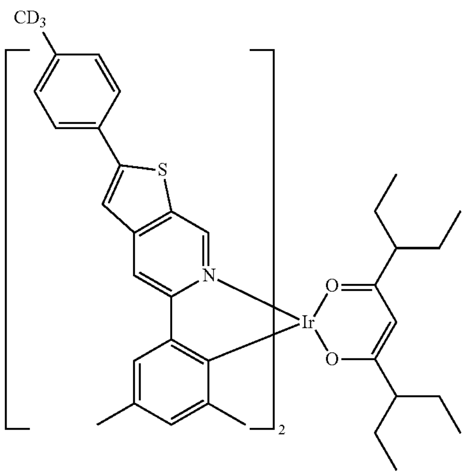
329
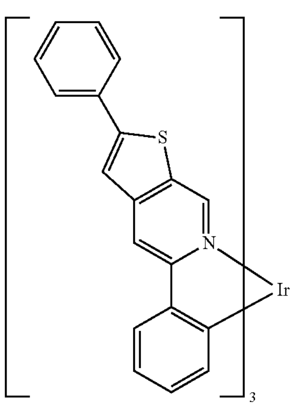
330
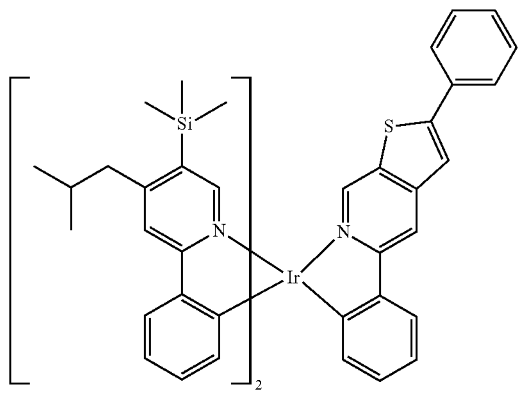
331
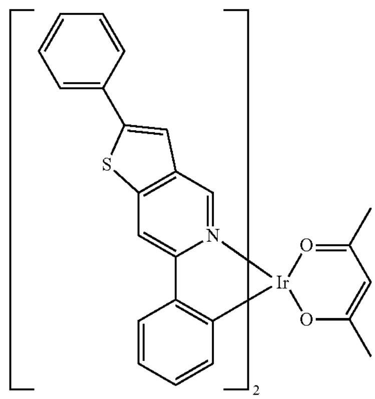
332
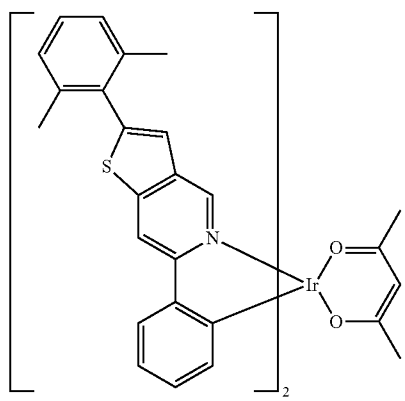
333
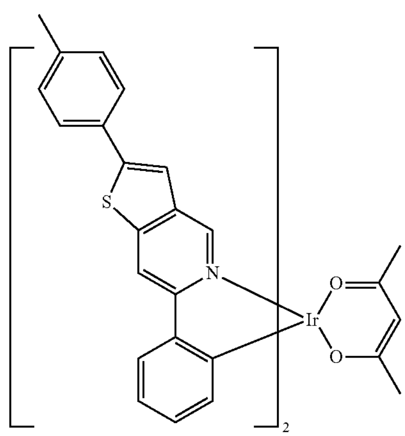

-continued
334
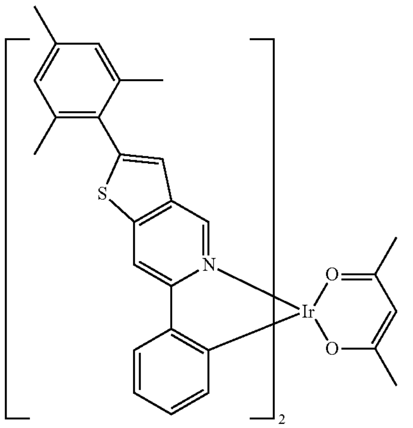
335
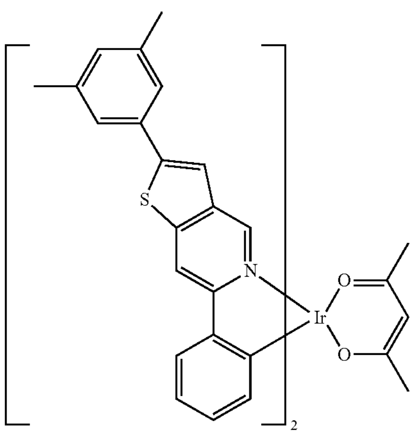
336
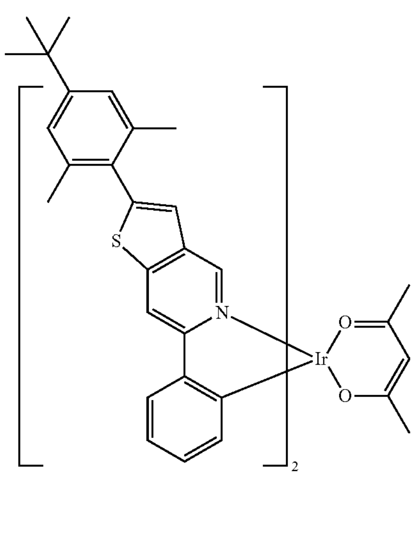
-continued
337
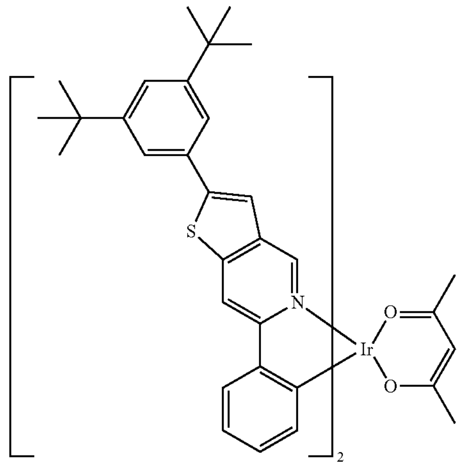
338
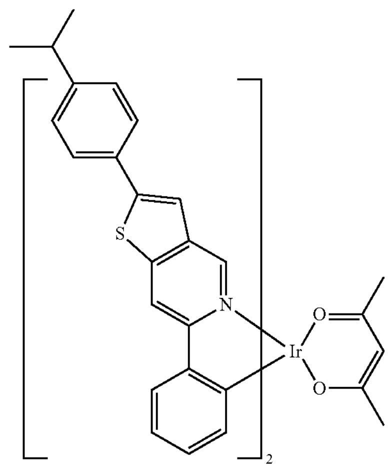
339
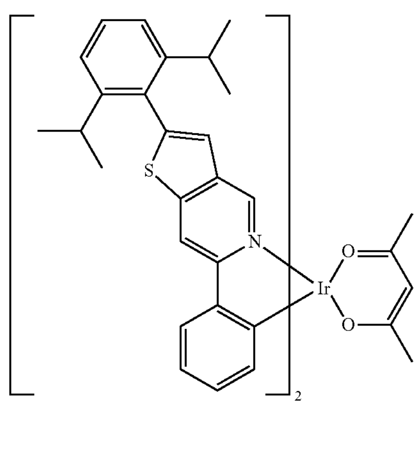

340
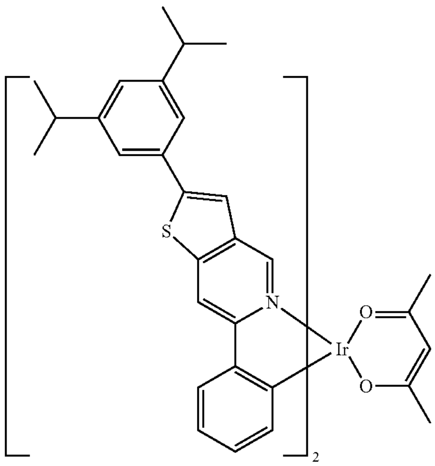
341
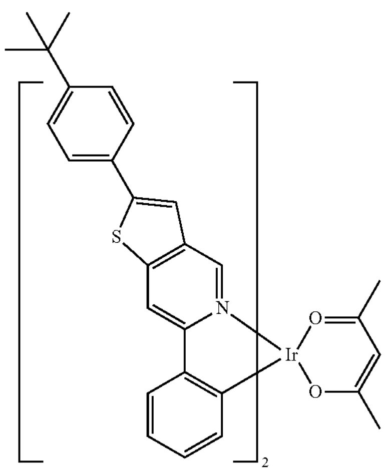
342
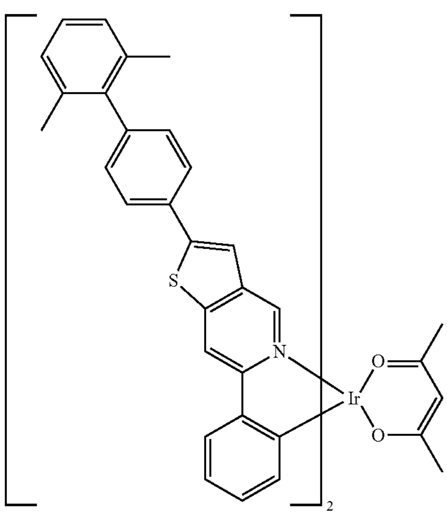
343
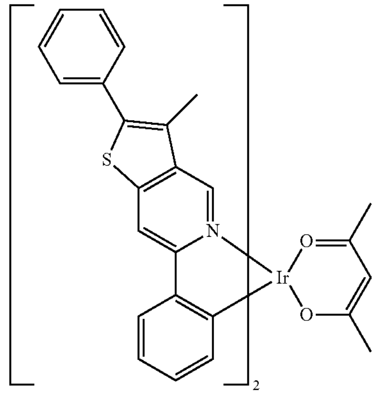
344
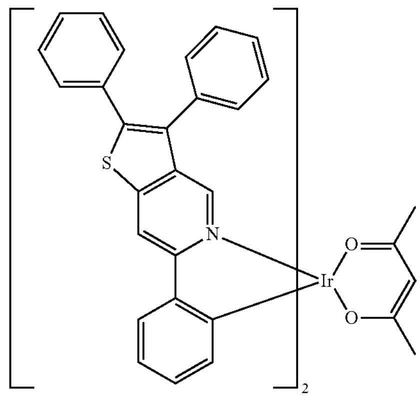
345
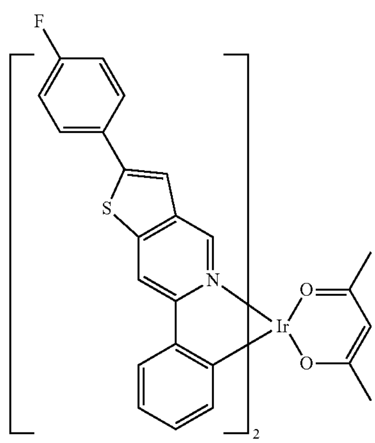
346
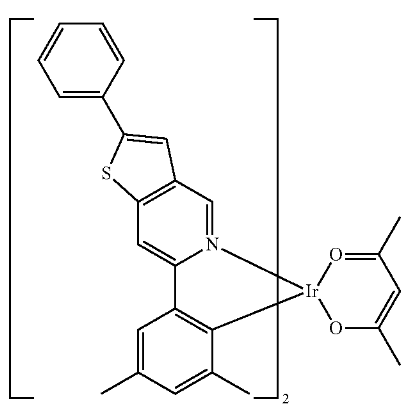

-continued
347
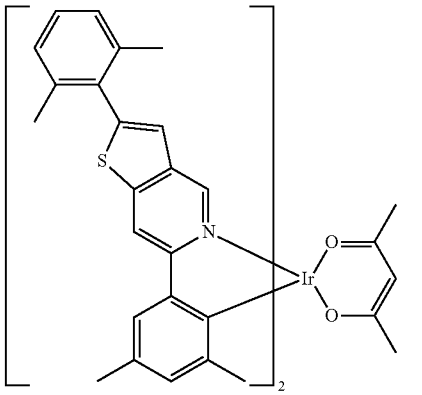
348
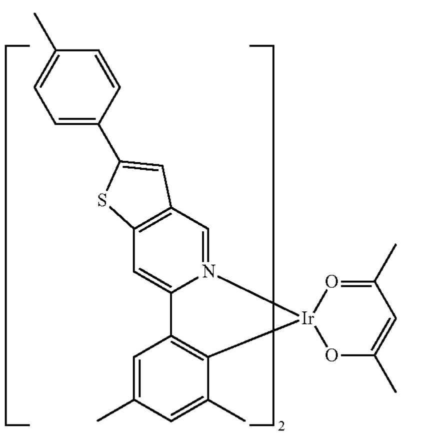
349
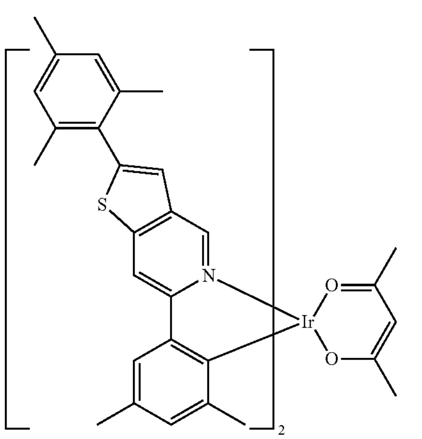
-continued
350
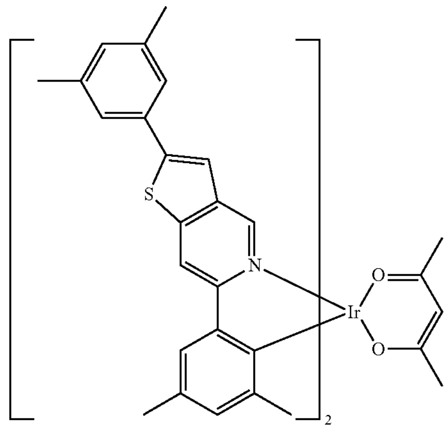
351
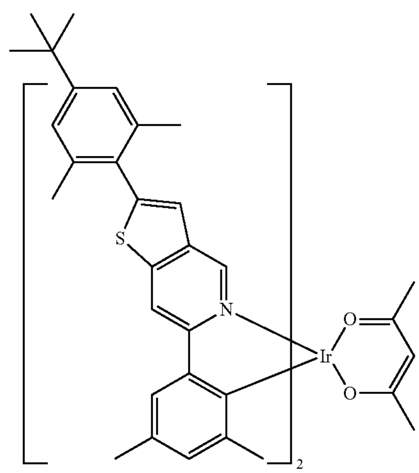
352
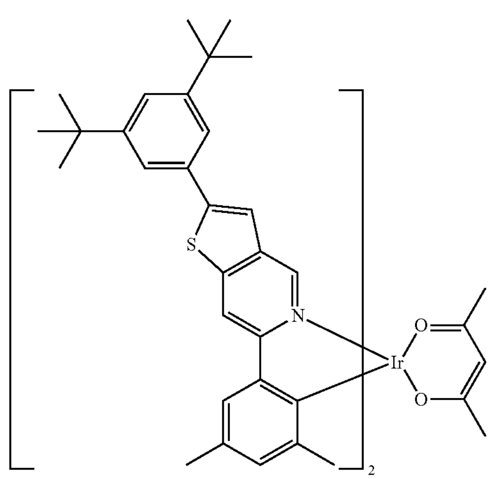

-continued
353
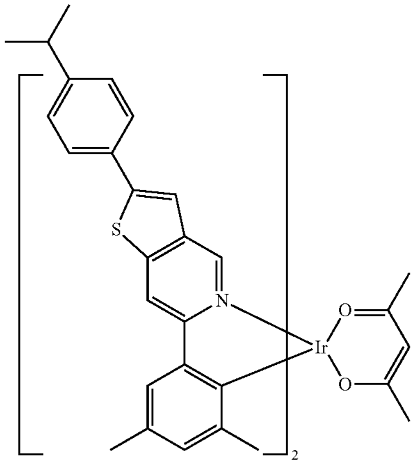
354
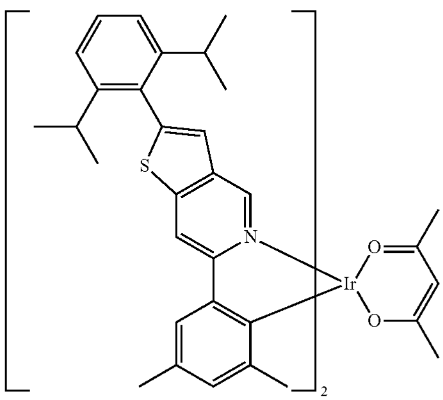
355
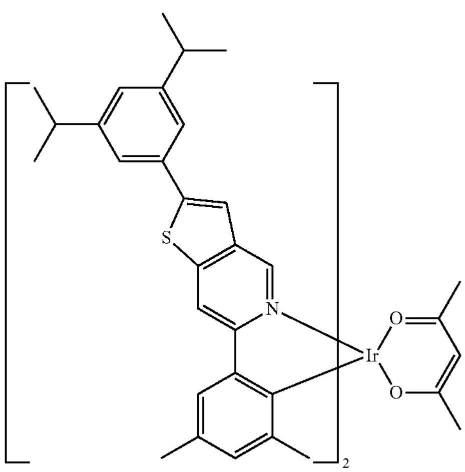
-continued
356
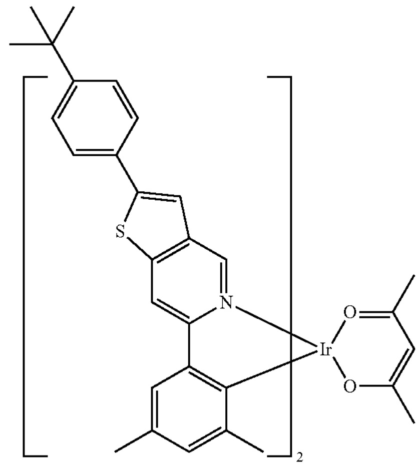
357
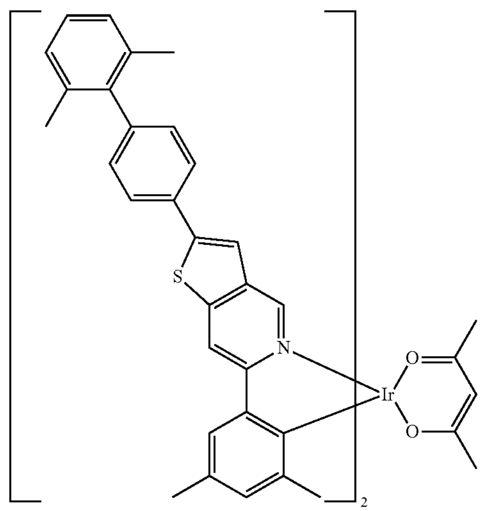
358
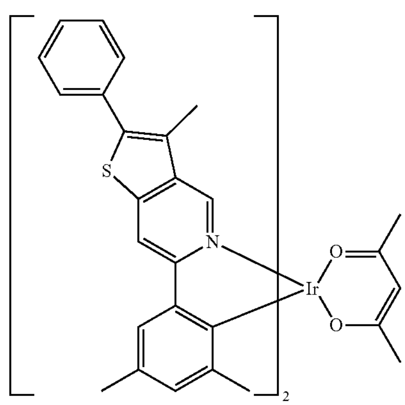

-continued
359
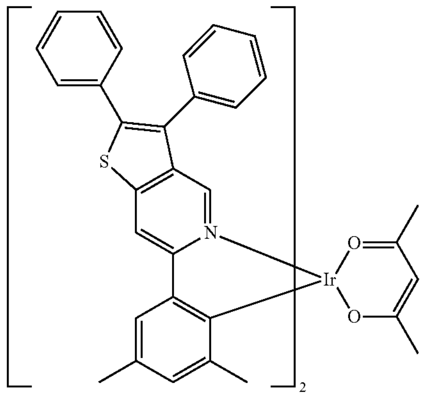
360
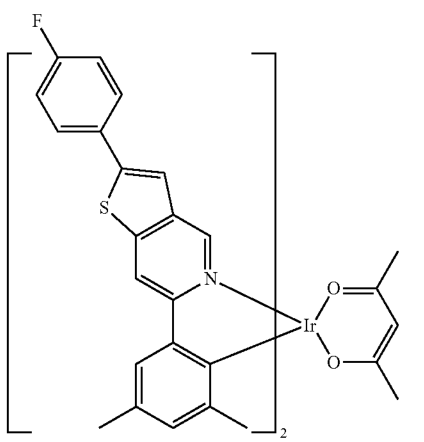
361
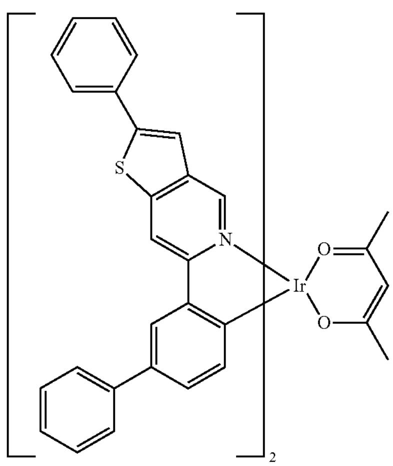
-continued
362
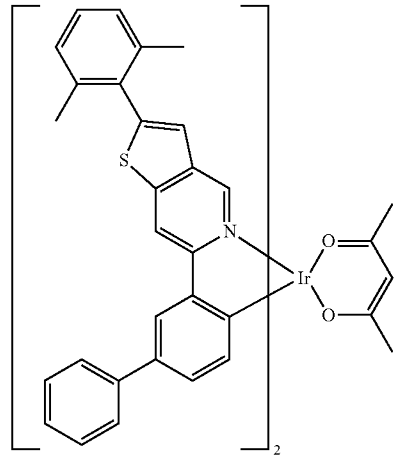
363
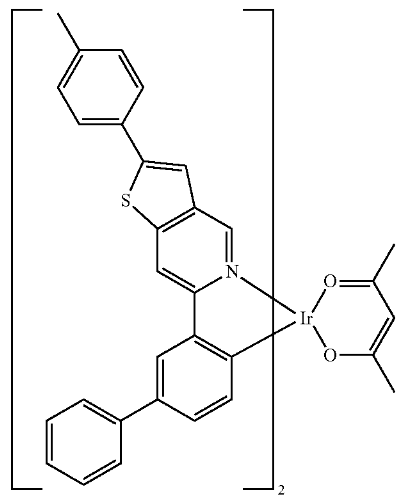
364
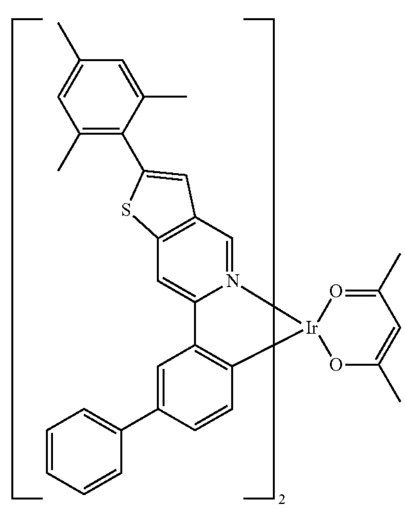

365
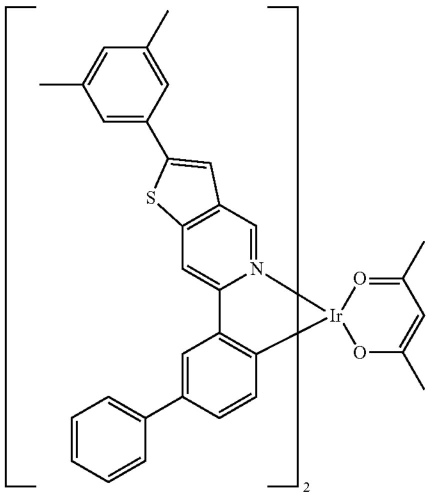
366
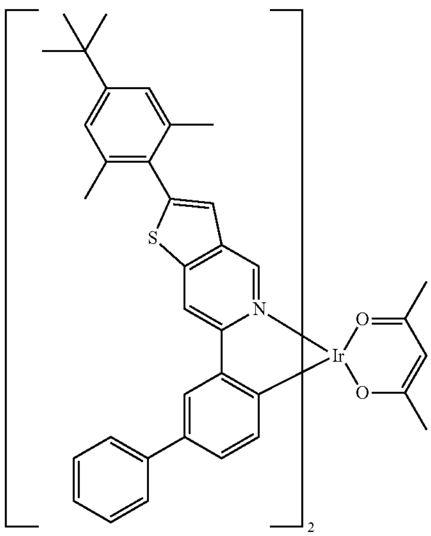
367
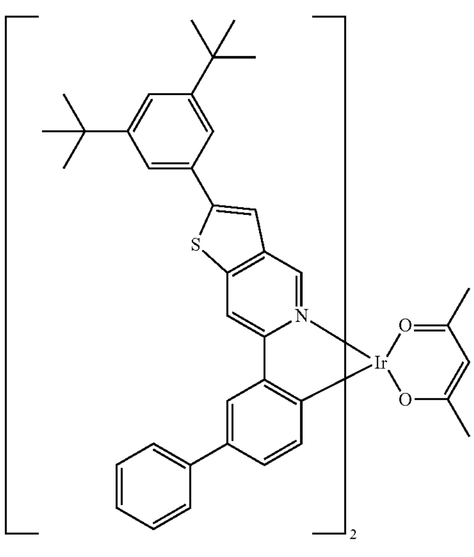
368
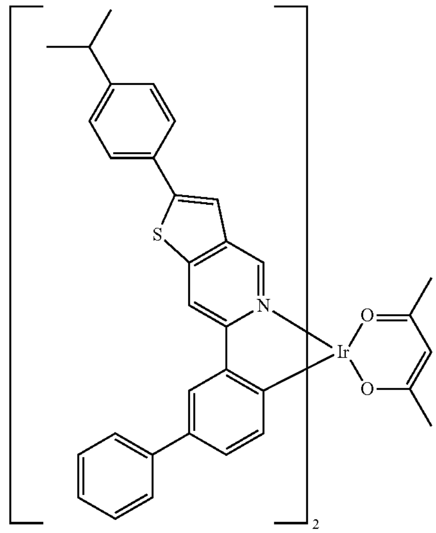
369
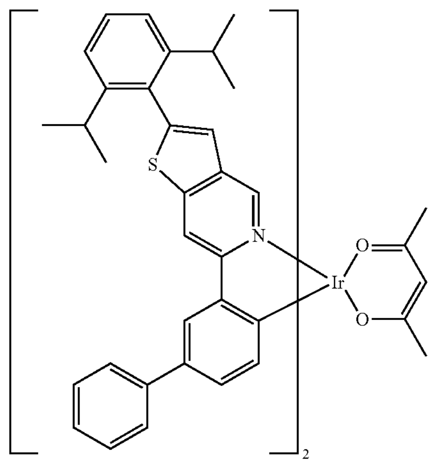
370
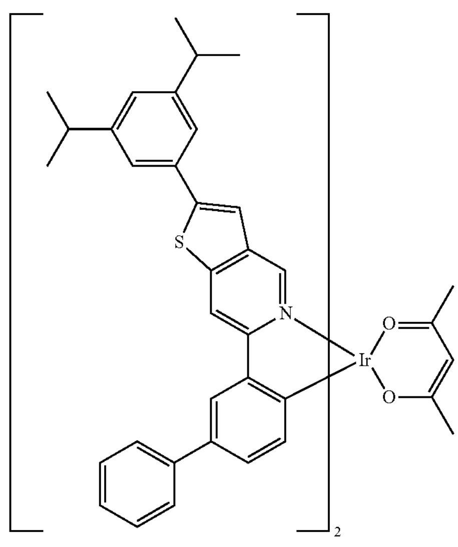

-continued
371
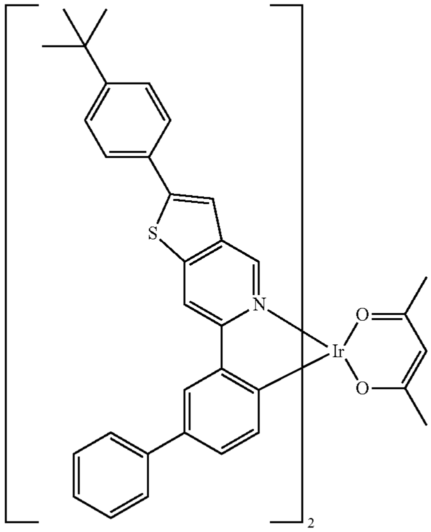
372
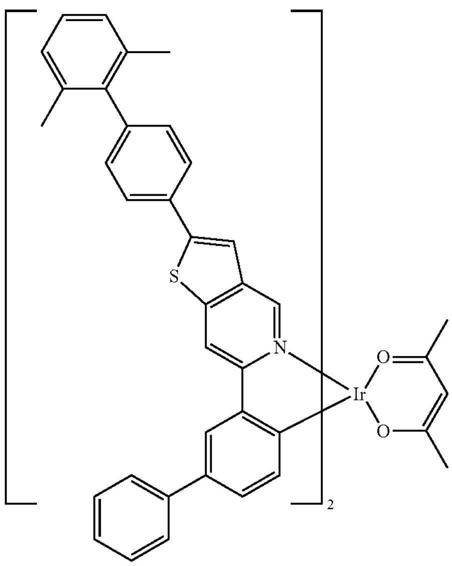
373
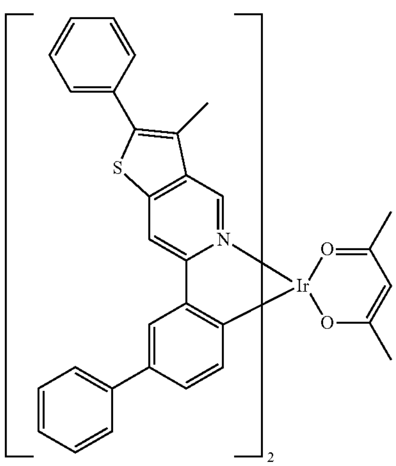
-continued
374
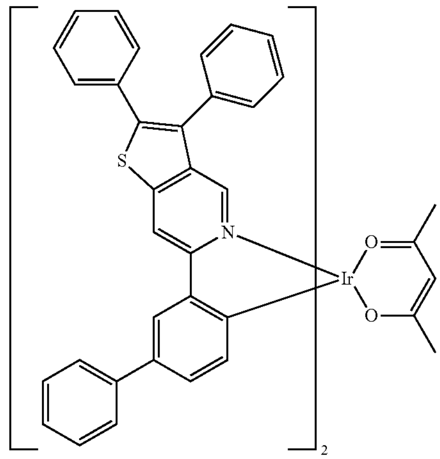
375
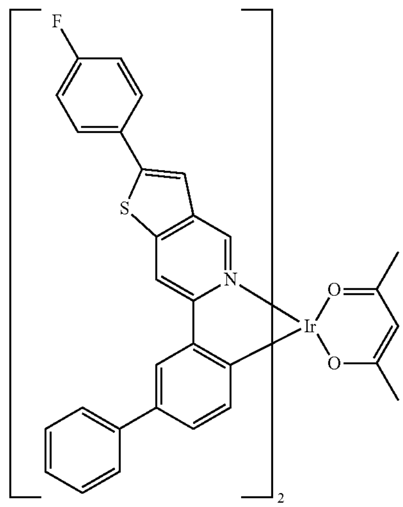
376
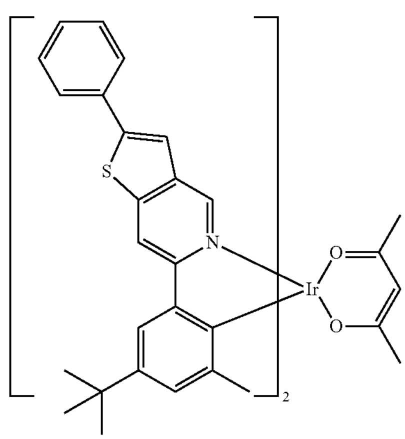

-continued
377
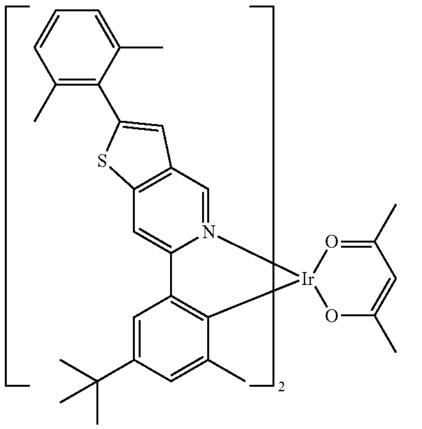
378
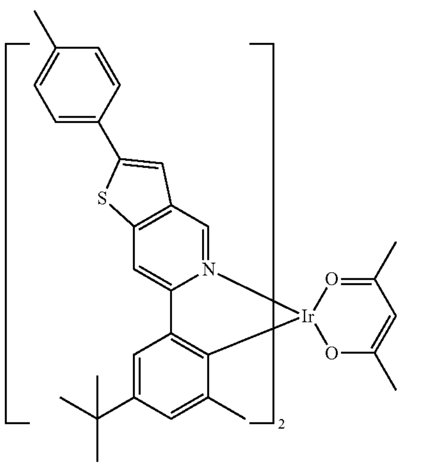
379
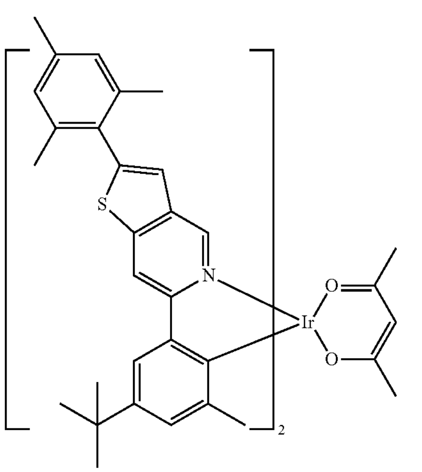
-continued
380
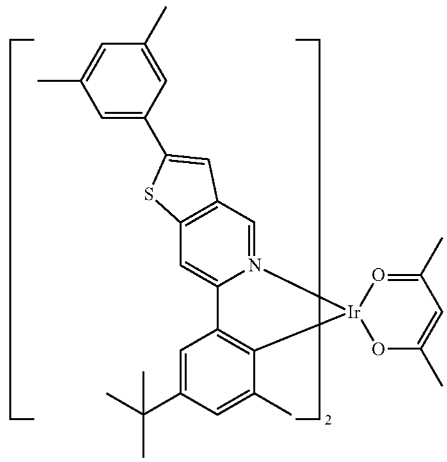
381
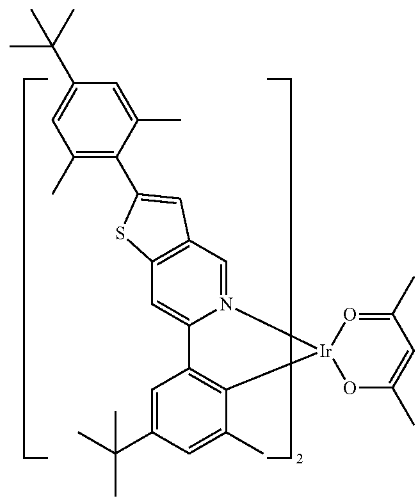
382
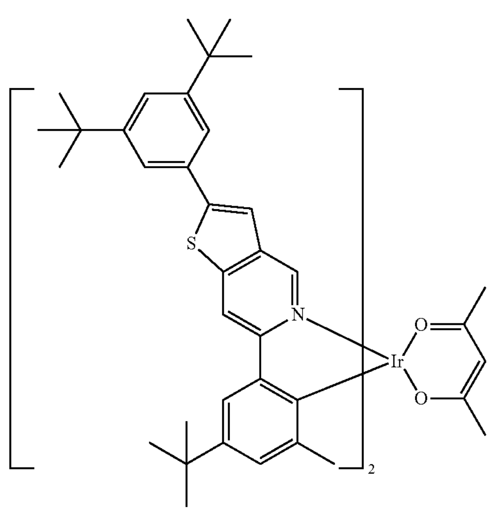

-continued
383
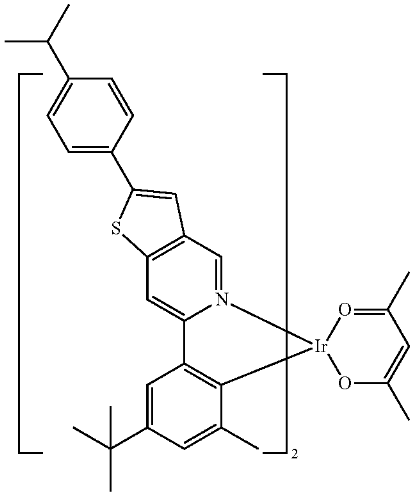
384
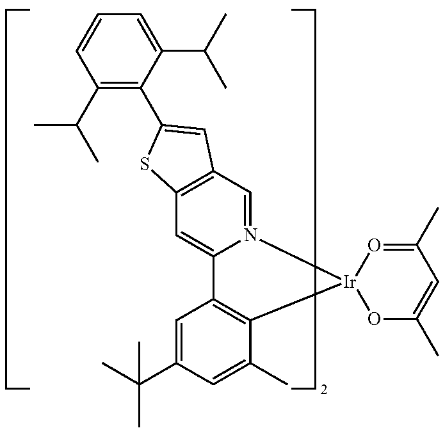
385
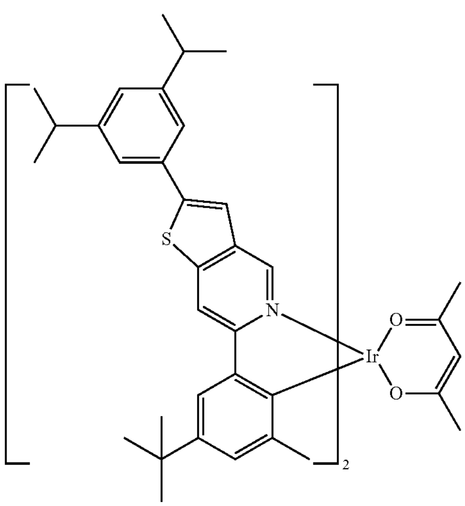
-continued
386
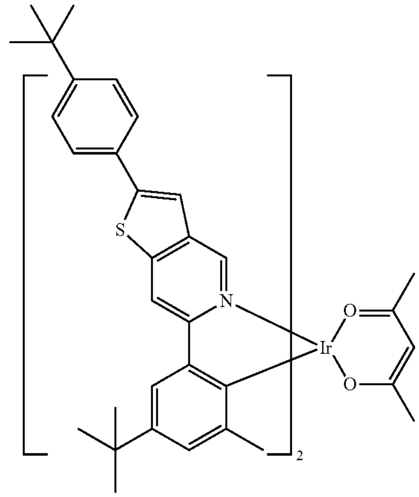
387
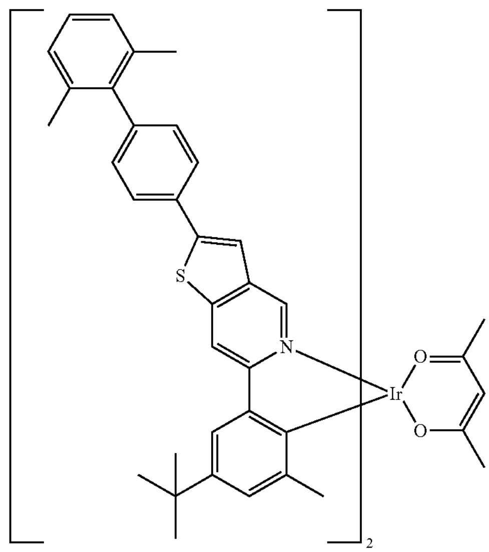
388
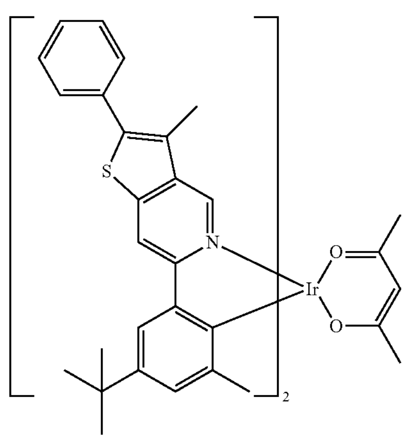

-continued
389
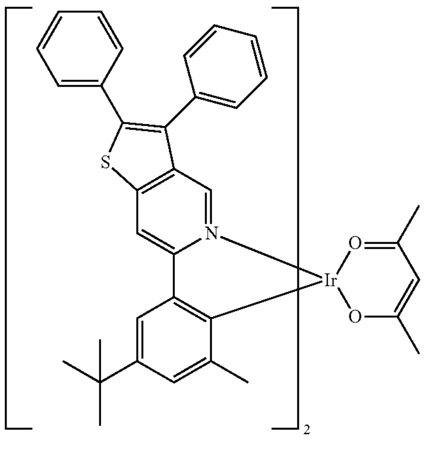
390
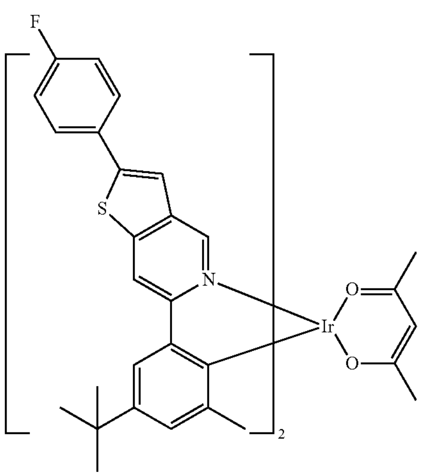
391
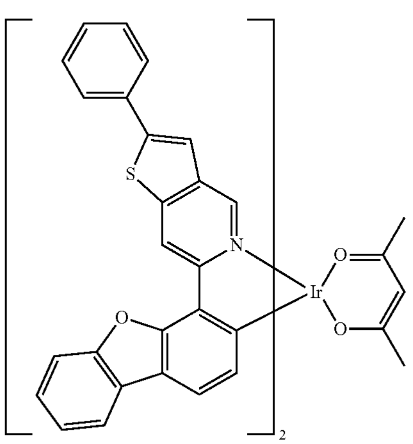
-continued
392
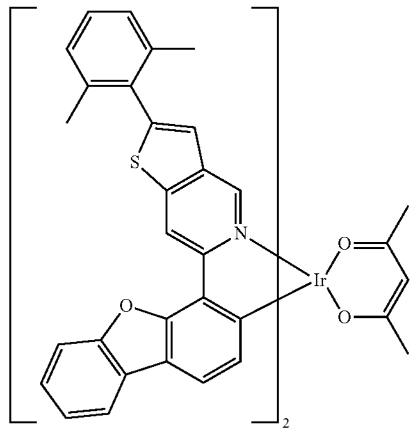
393
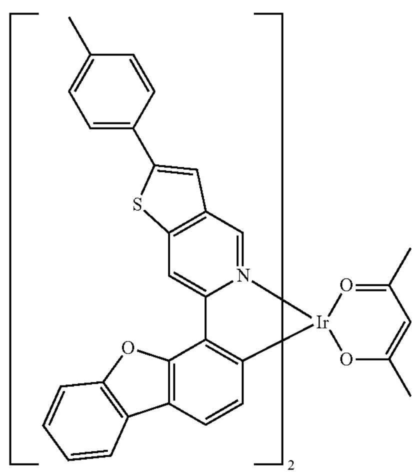
394
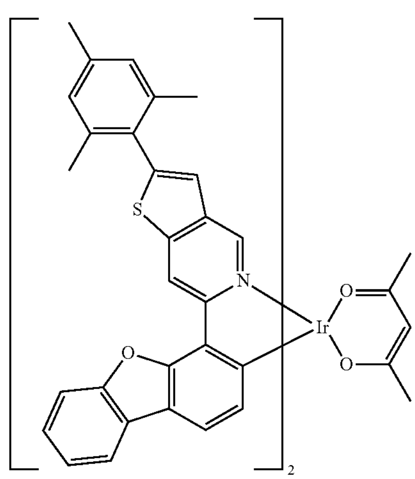

-continued
395
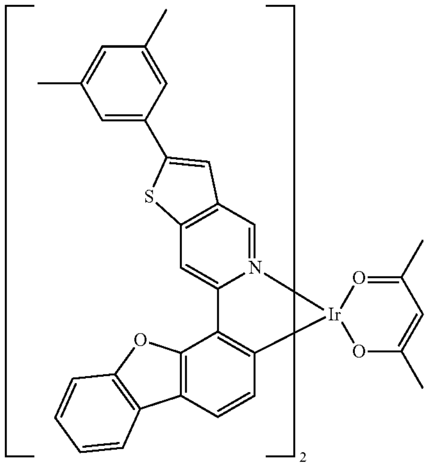
396
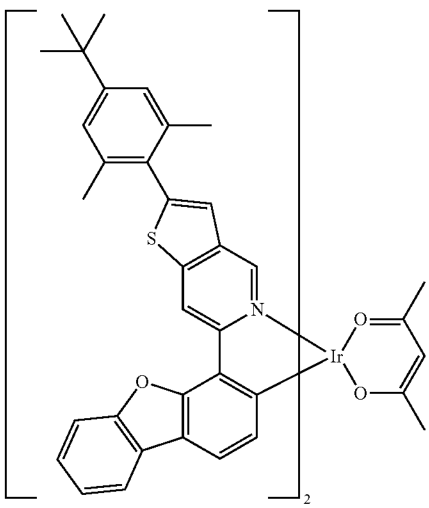
397
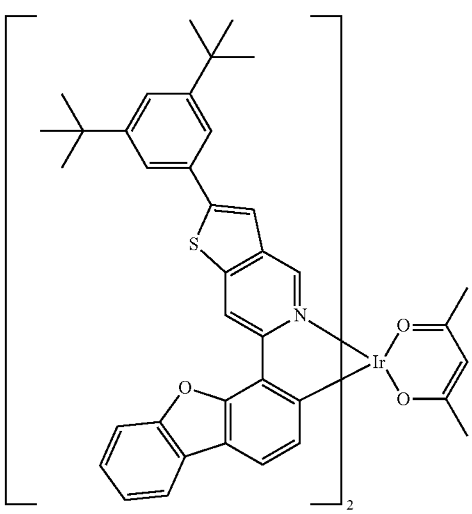
-continued
398
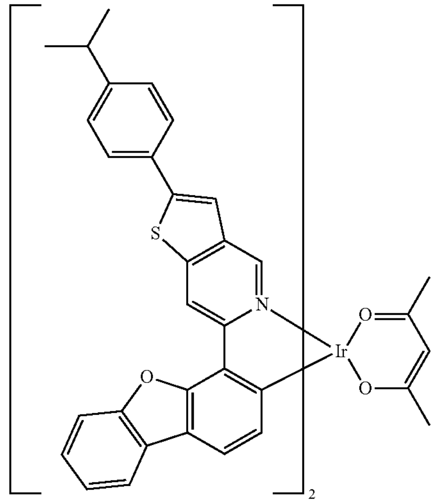
399
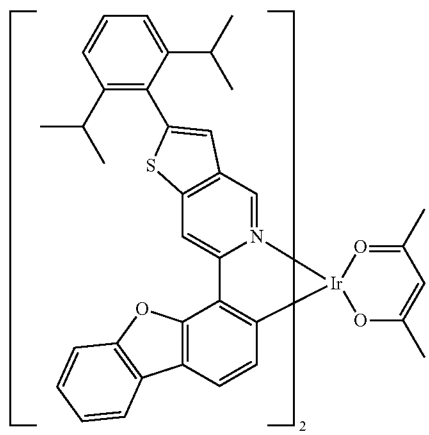
400
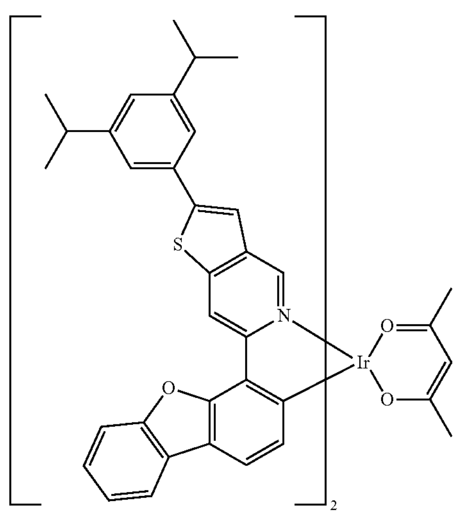

-continued
401
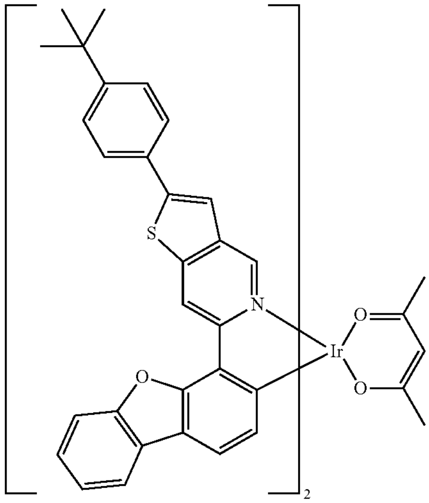
402
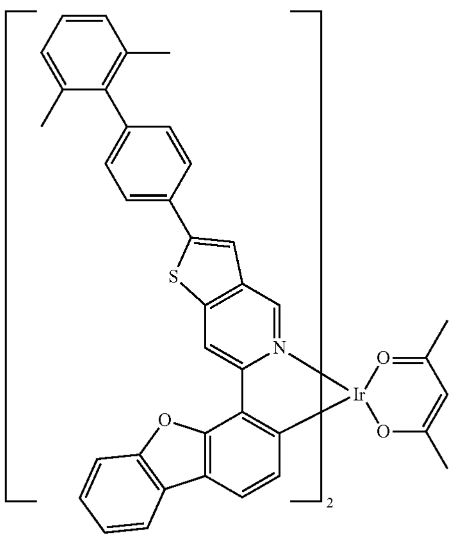
403
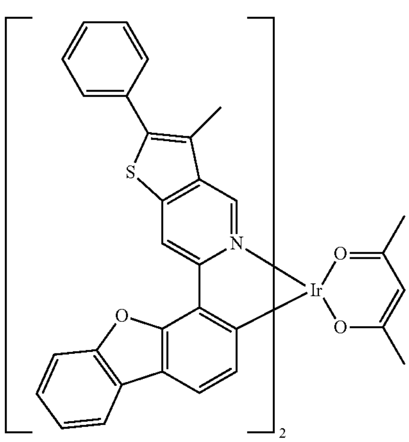
-continued
404
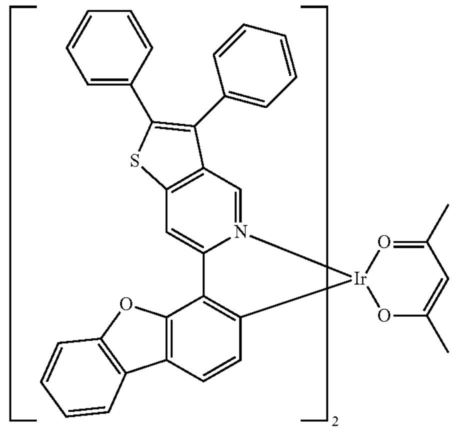
405
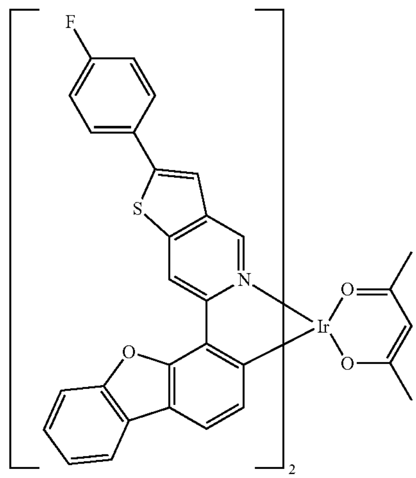
406
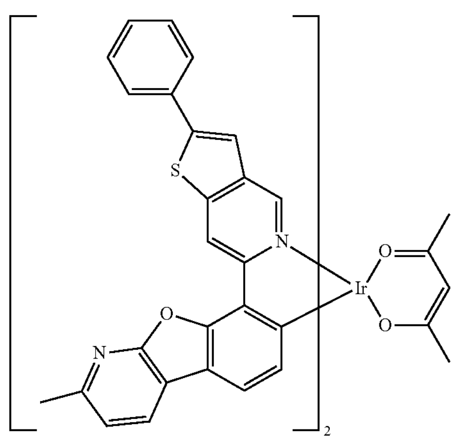

-continued
407
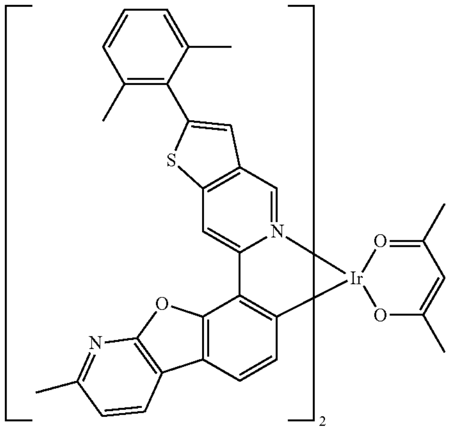
408
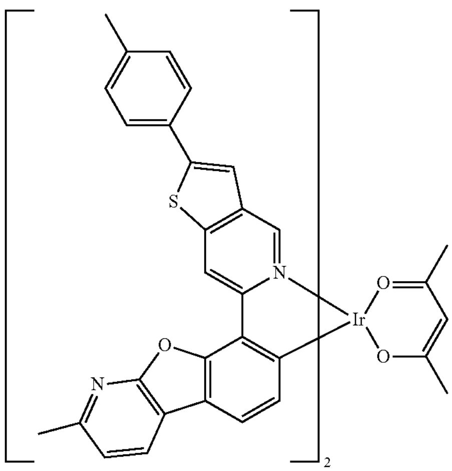
409
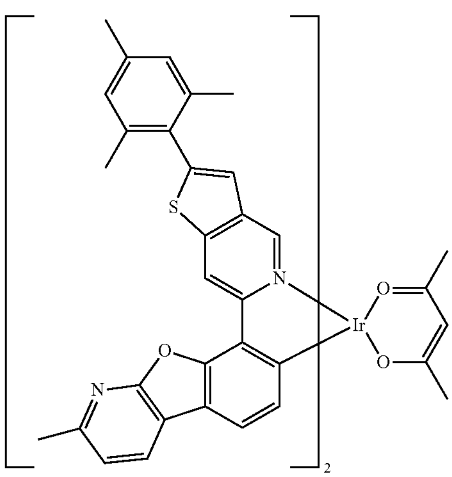
-continued
410
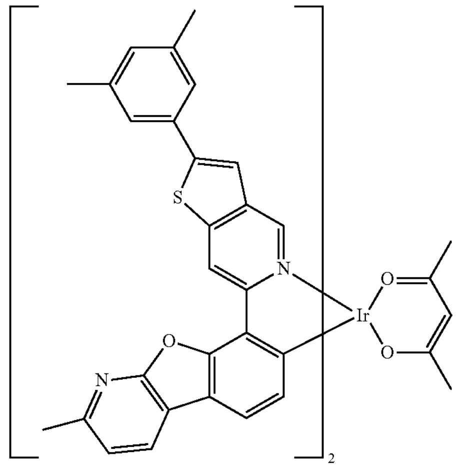
411
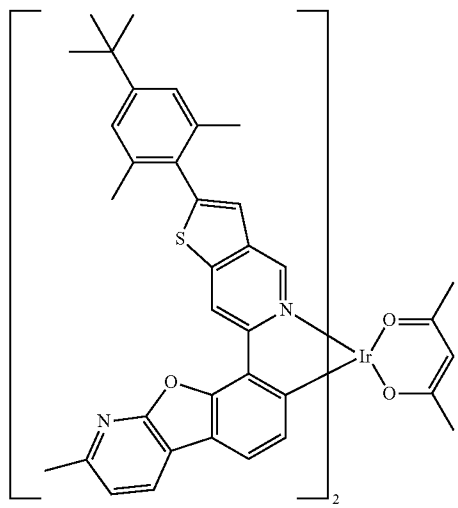
412
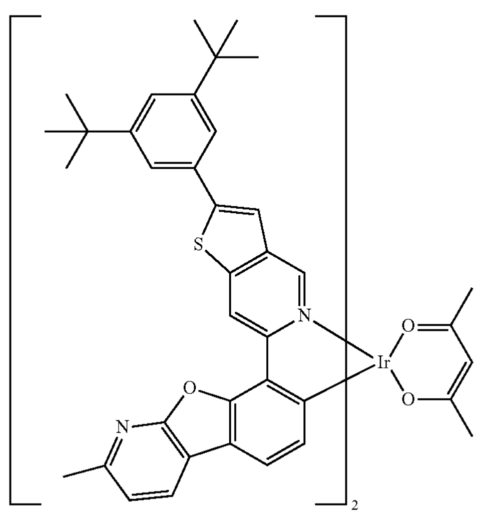

-continued
413
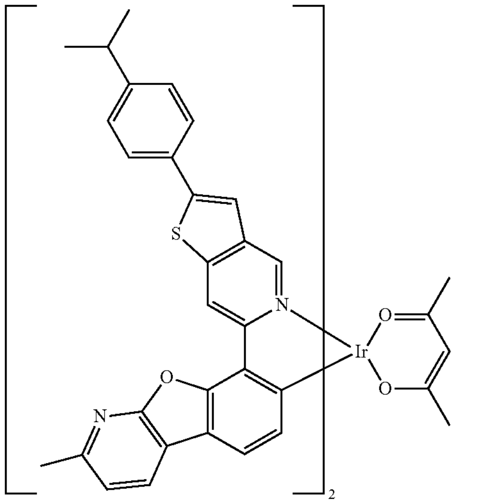
414
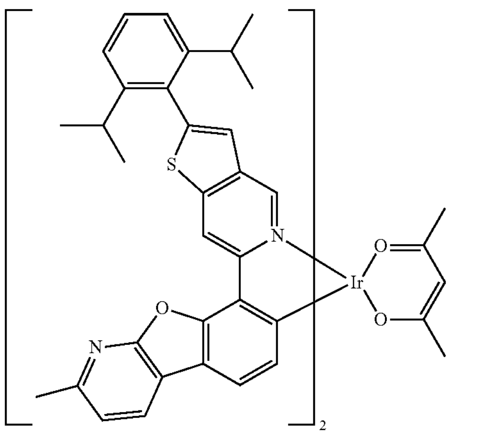
415
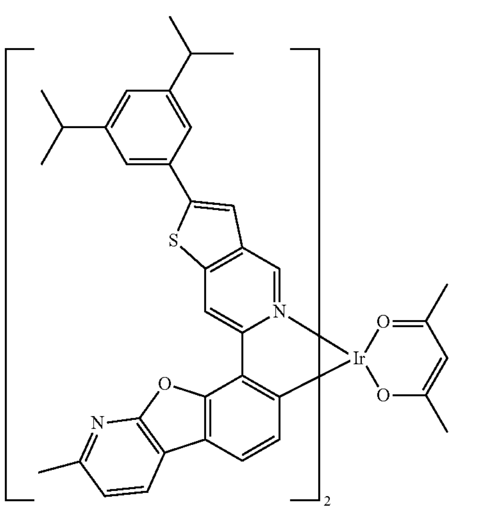
-continued
416
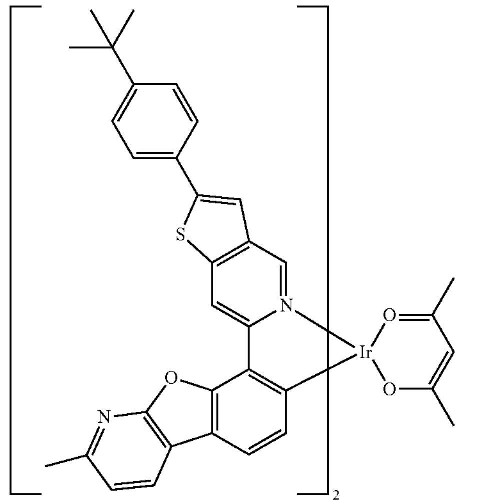
417
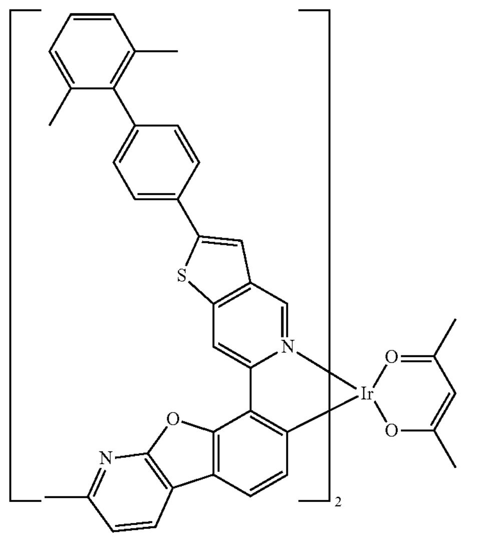
418
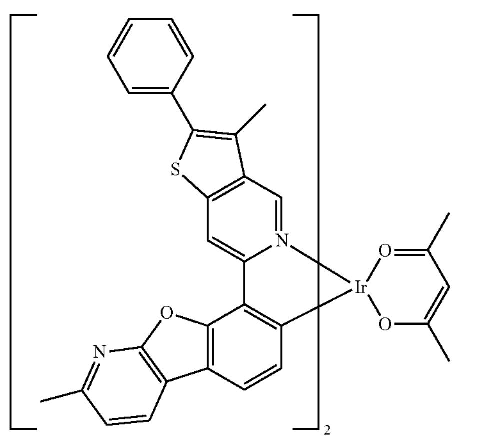

-continued
419
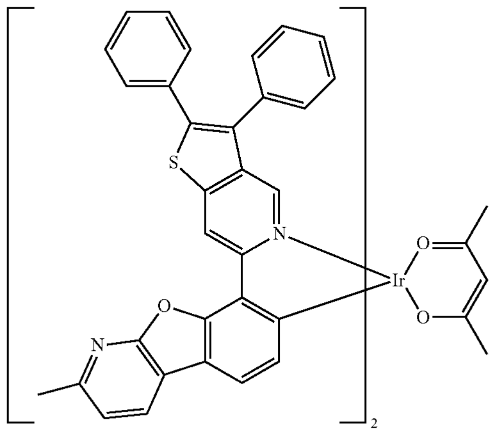
420
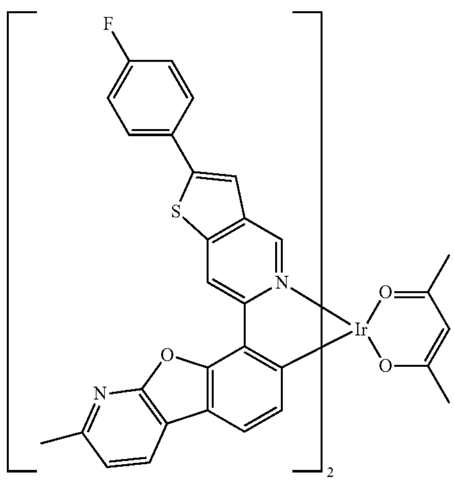
421
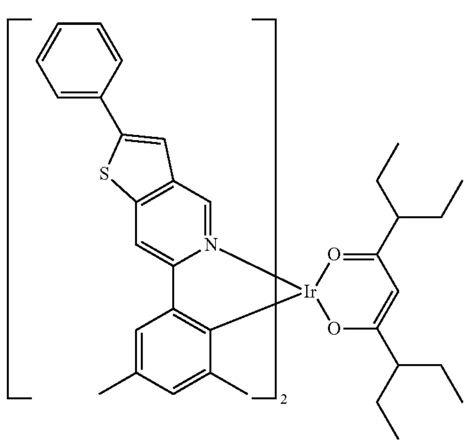
-continued
422
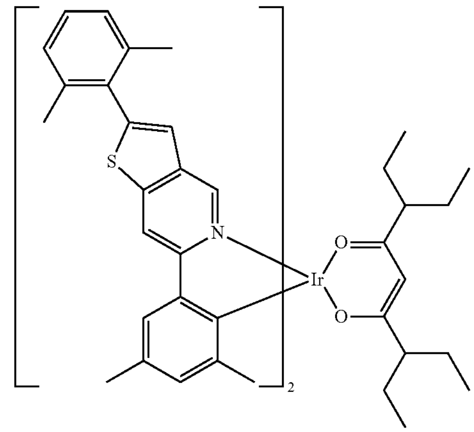
423
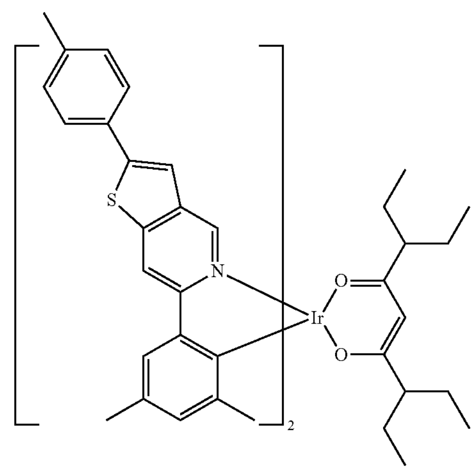
424
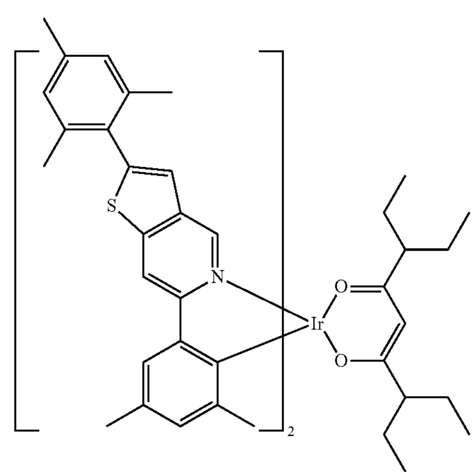

-continued
425
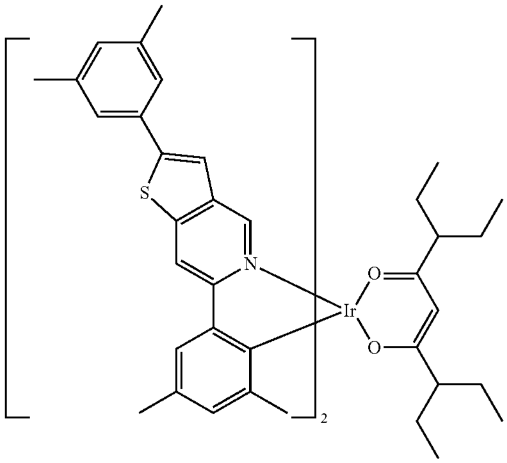
426
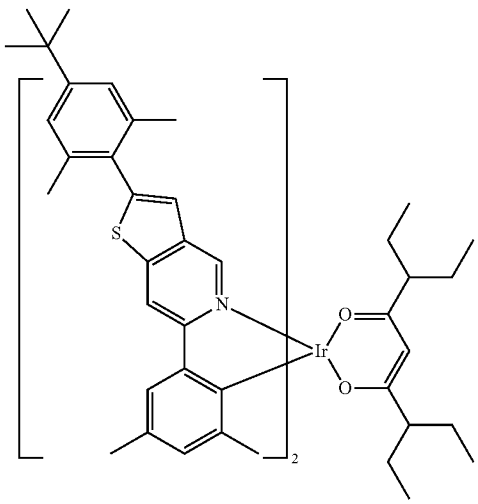
427
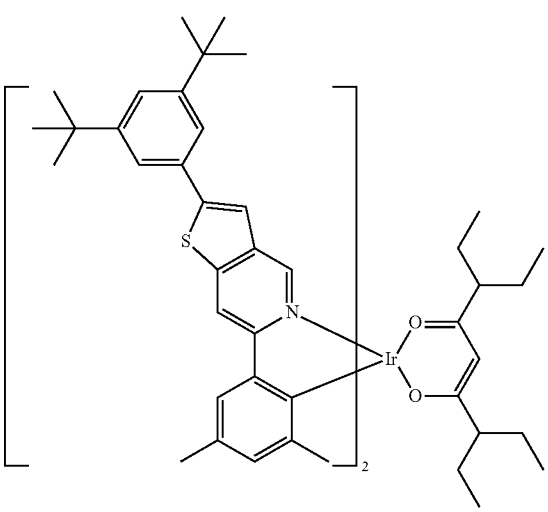
-continued
428
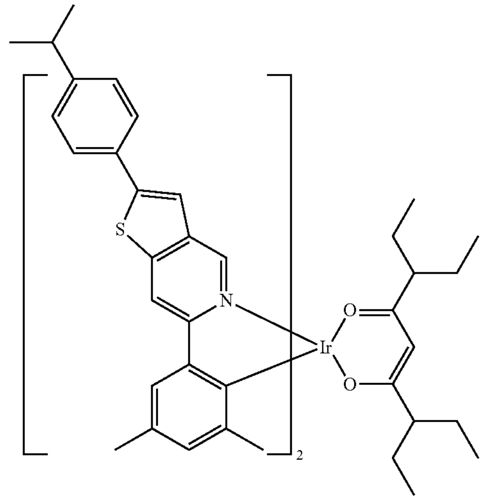
429
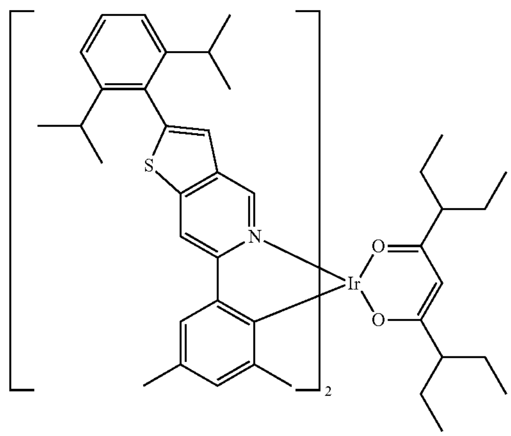
430
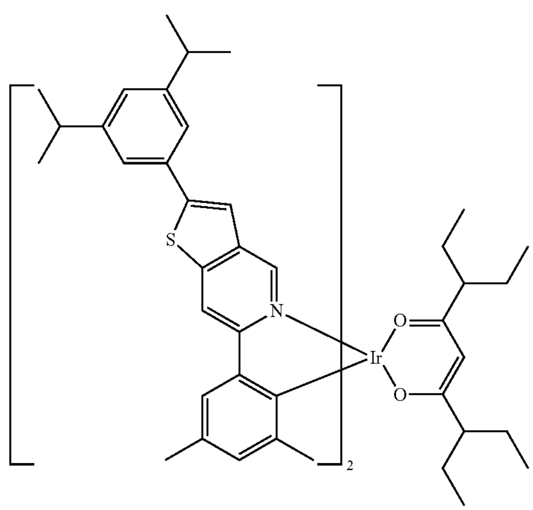

-continued
431
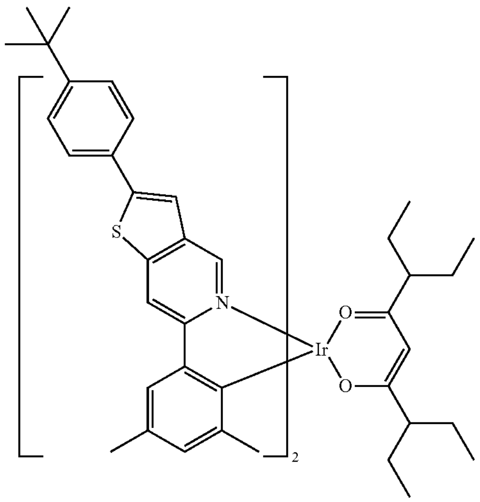
432
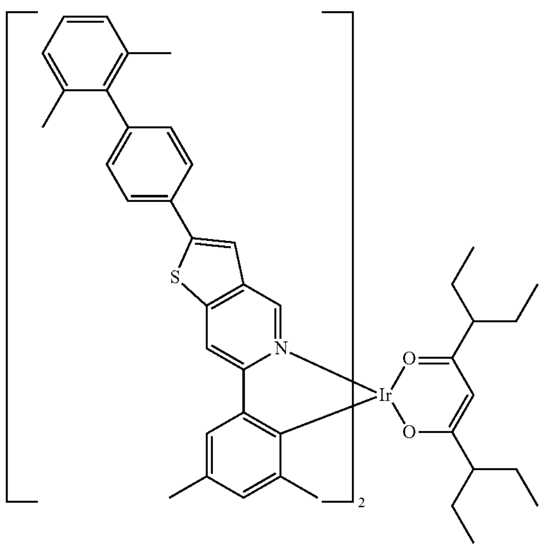
433
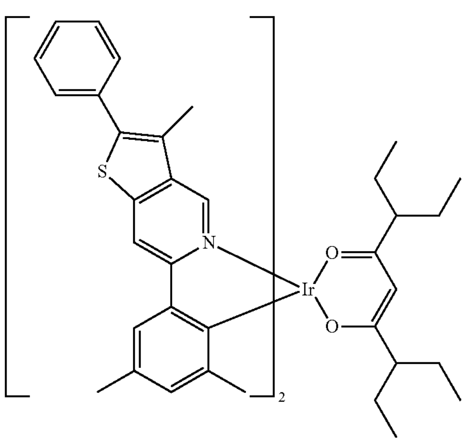
-continued
434
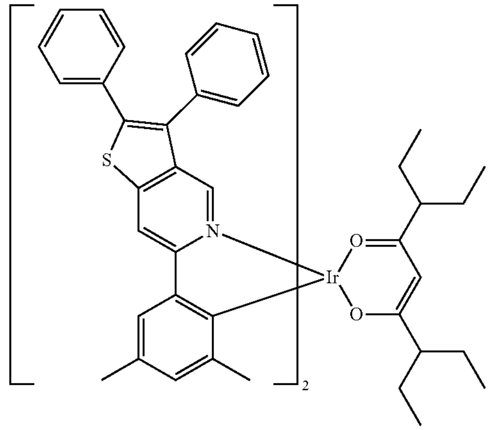
435
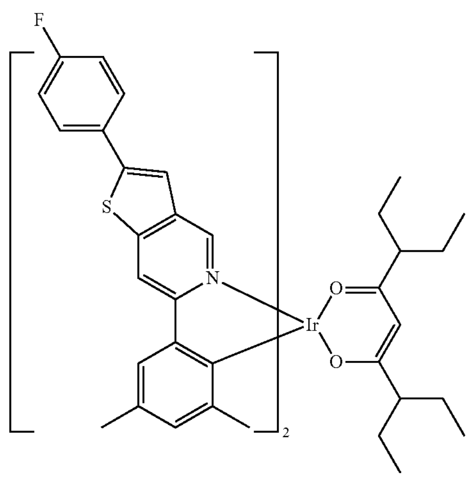
436
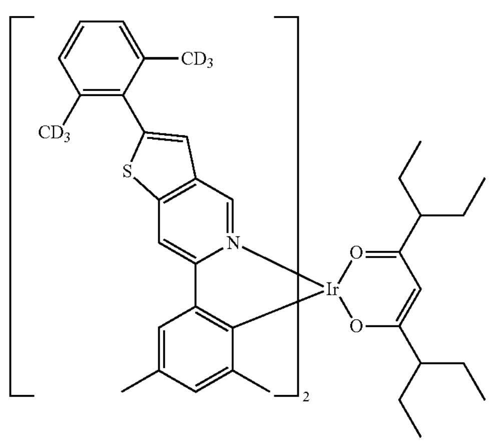

-continued
437
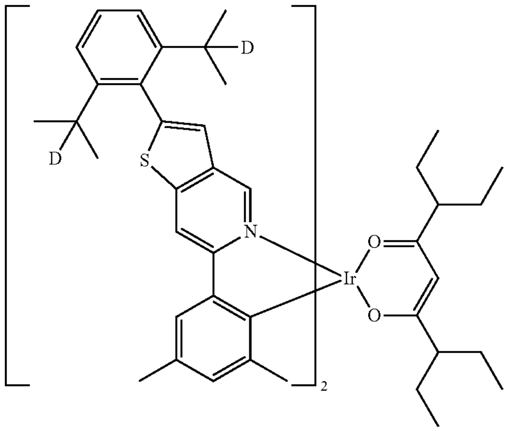
438
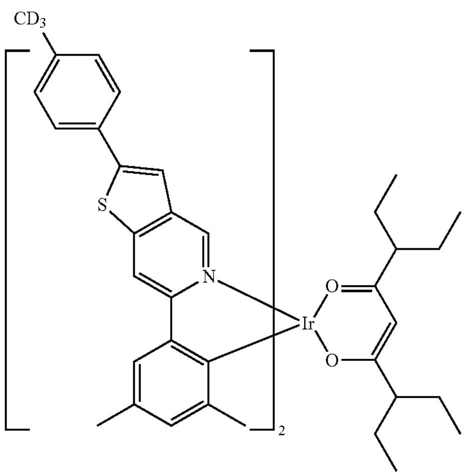
439
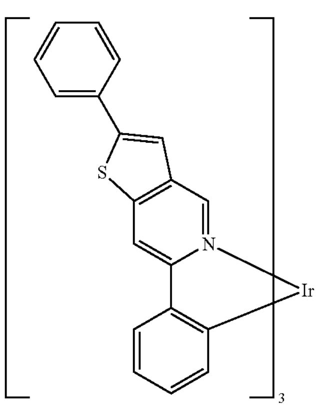
-continued
440
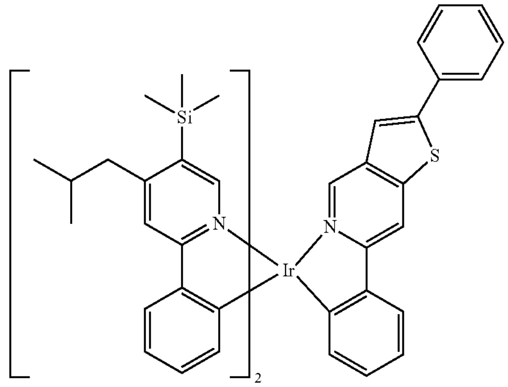
441
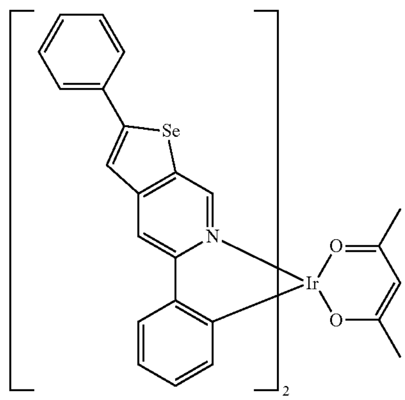
442
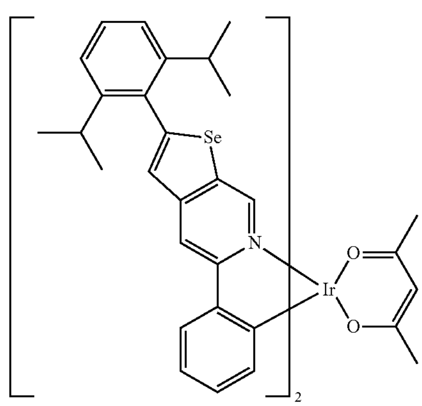

-continued
443
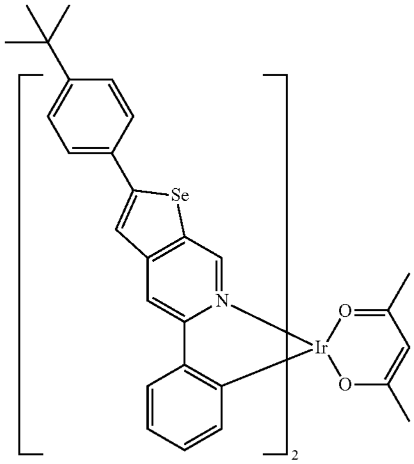
444
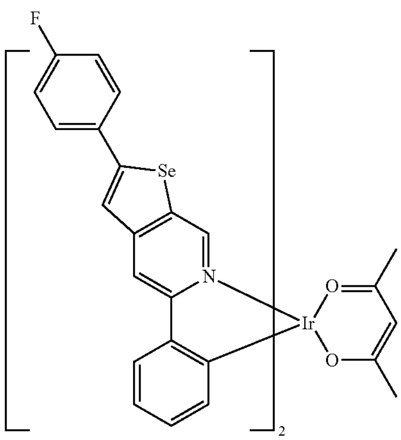
445
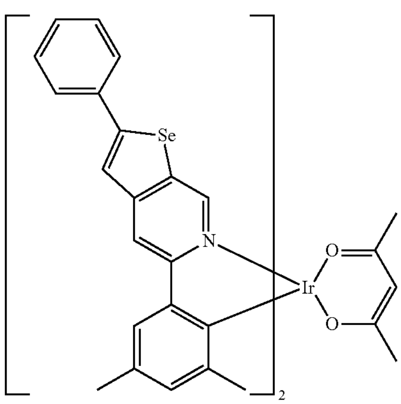
-continued
446
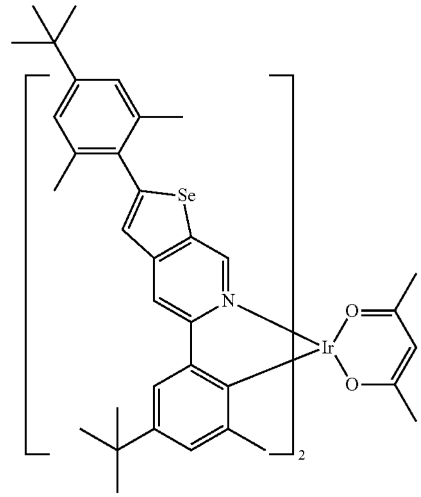
447
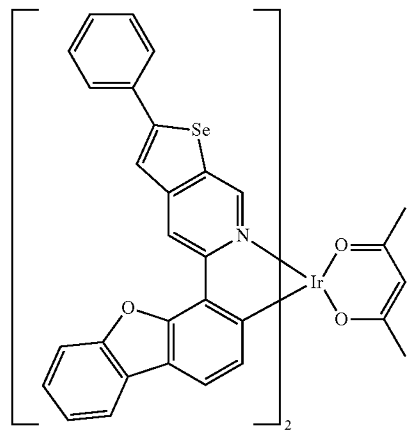
448
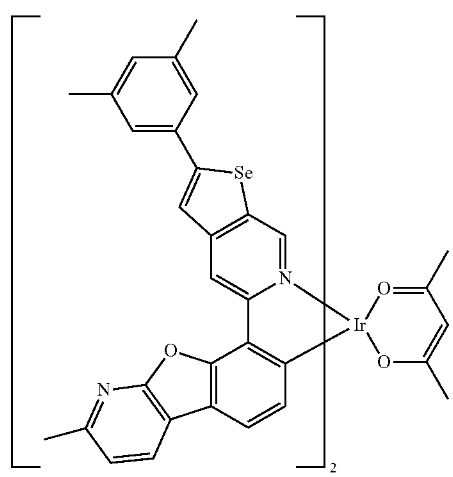

-continued
449
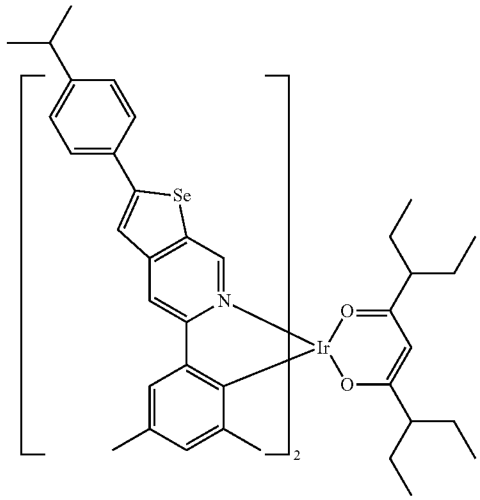
450
451
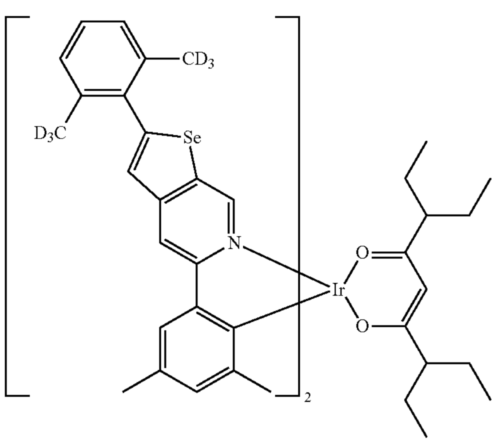
-continued
452
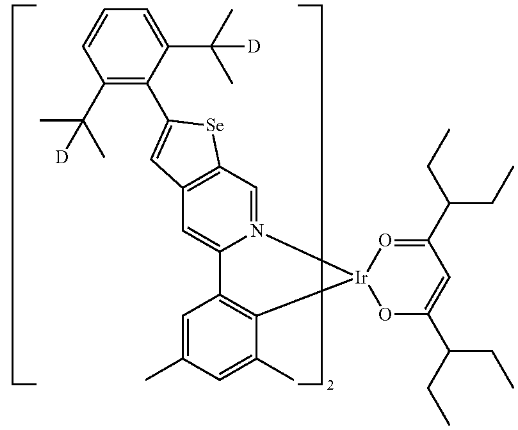
453
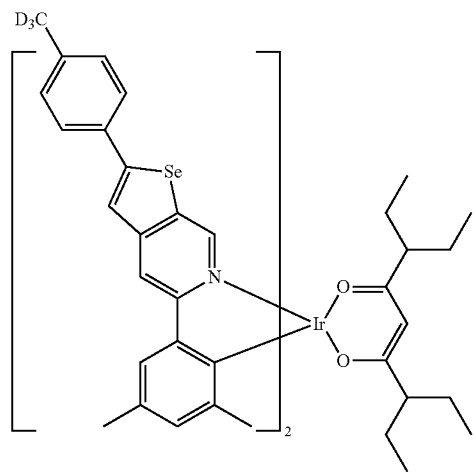
454
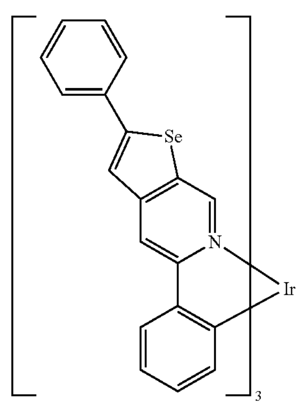

-continued
455
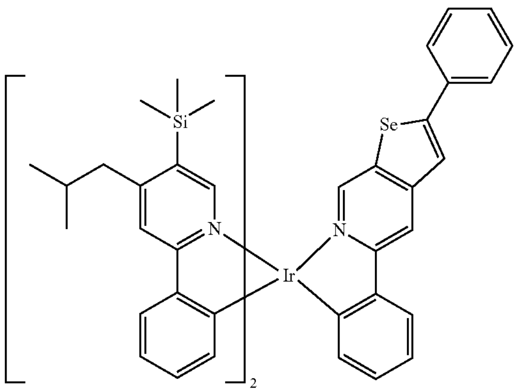
456
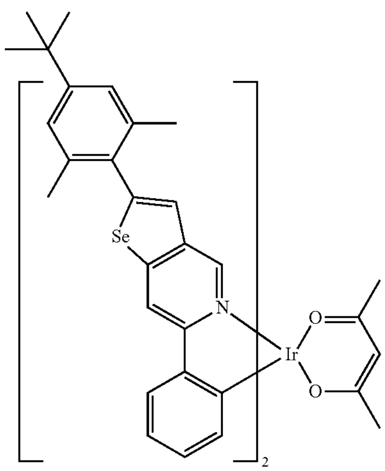
457
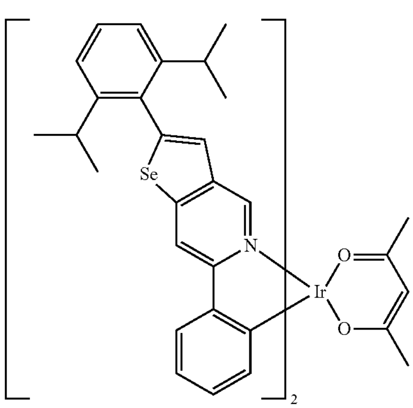
-continued
458
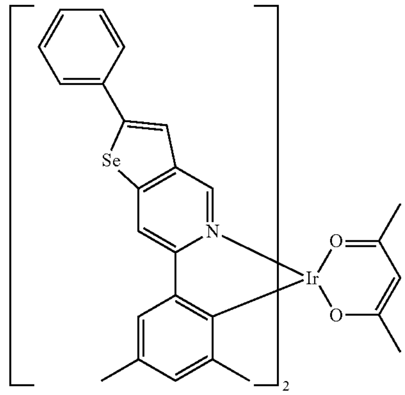
459
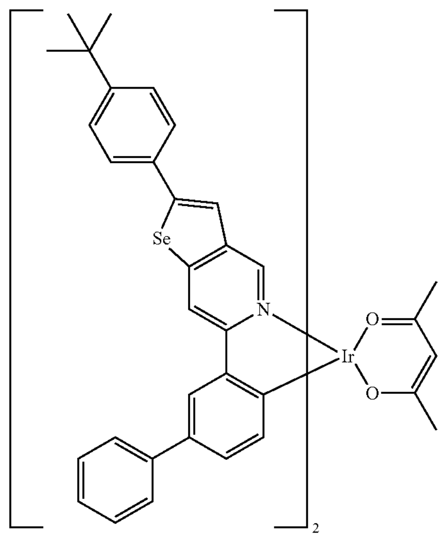
460
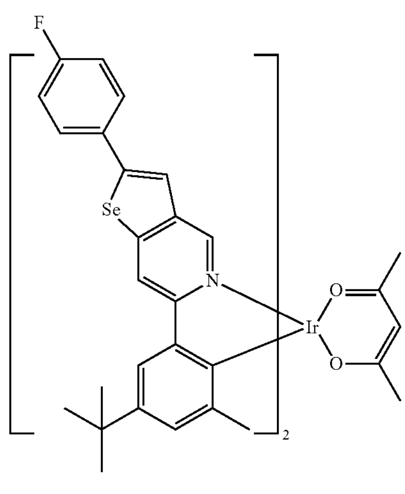

-continued
461
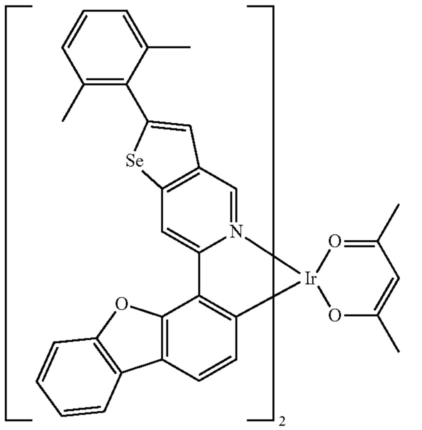
462
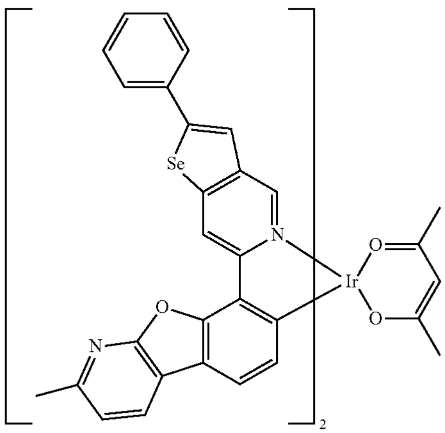
463
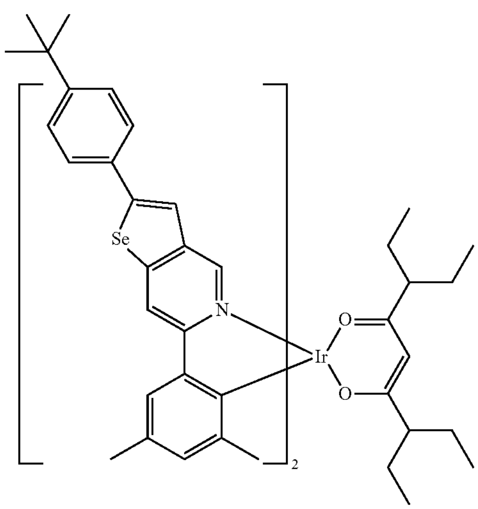
-continued
464
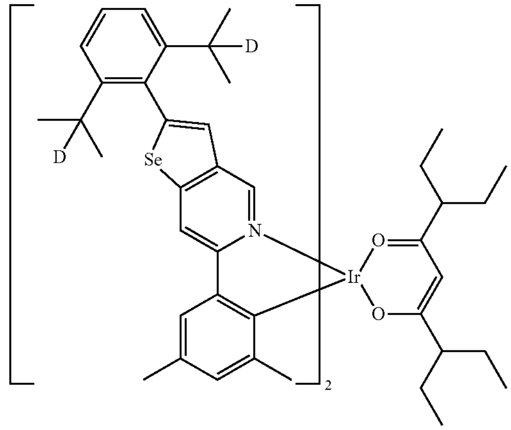
465
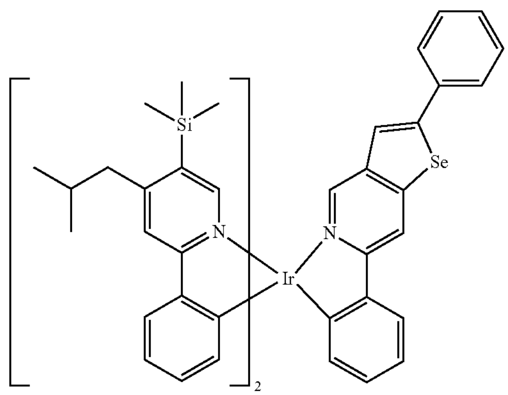
466
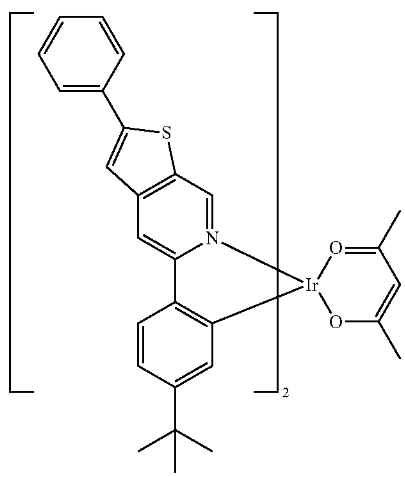

-continued

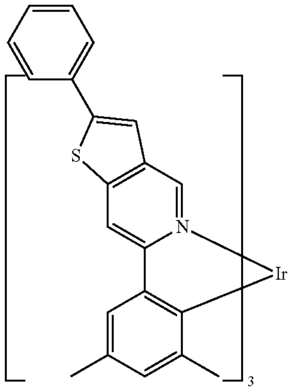

467

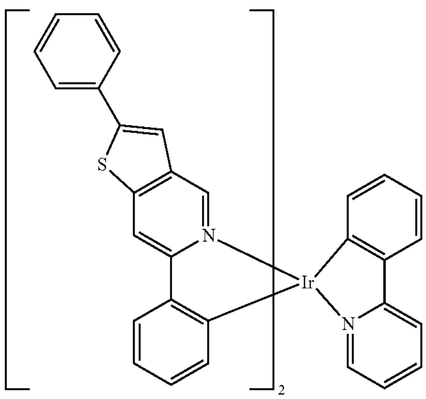

468

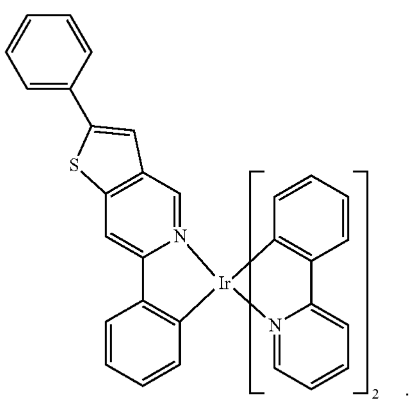

469

$L_1$ of the organometallic compound represented by Formula 1 may be a ligand represented by Formula 2A, and n1 which indicates the number of $L_1$ may be 1, 2, or 3. That is, the organometallic compound includes, as ligands linked to metal M, at least one ligand represented by Formula 2.

$X_2$ and $X_3$ in Formula 2 may each independently be O, S, Se, or $C(R_2)$, wherein $X_2$ or $X_3$ may be O, S, or Se. That is, in Formula 2, the 5-membered ring (see Formula 2') does not include *═N—*' (* and *' each indicate a binding site to a neighboring atom) as a ring-forming atom, and includes O, S, or Se. In addition, in Formula 2, the 5-membered ring is condensed with the 6-membered ring while sharing carbon 1 and carbon 2 (see Formula 2'). Therefore, a reduction in the intermolecular bonding force of the organometallic compound represented by Formula 1 may be prevented. Therefore, a reduction in the lifespan of an electronic device, for example, an organic light-emitting device, which includes the organometallic compound represented by Formula 1, may be prevented.

Formula 2'

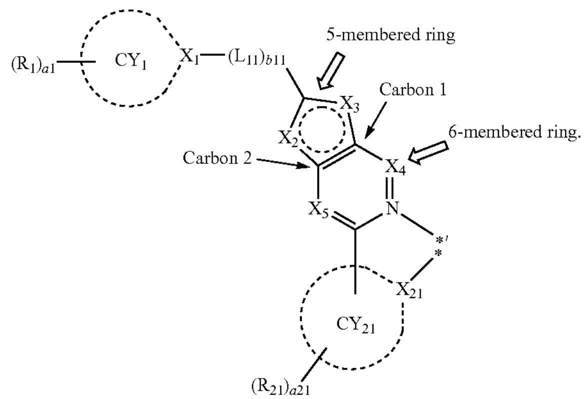

The ligand represented by Formula 2 includes "ring $CY_1$". Therefore, a transition dipole moment increases in an alignment axis direction of Formula 1, and the alignment of the organometallic compound represented by Formula 1 may be improved, thereby increasing the luminescence efficiency of an electronic device, for example, an organic light-emitting device, which includes the organometallic compound represented by Formula 1.

Meanwhile, in Formula 2, ring $CY_1$ and $R_2$ are not linked to each other, and $R_1$ and $R_2$ are not linked to each other. Therefore, it is possible to prevent the transition dipole moment of Formula 1 from being deviated to a direction other than the alignment axis direction of Formula 1, thereby increasing the luminescence efficiency of an electronic device, for example, an organic light-emitting device, which includes at least one organometallic compound represented by Formula 1.

A highest occupied molecular orbital (HOMO) energy level, a lowest unoccupied molecular orbital (LUMO) energy level, and a triplet ($T_1$) energy level of some compounds of the organometallic compound represented by Formula 1 are evaluated by a density functional theory (DFT) of Gaussian program with molecular structure optimization based on B3LYP, and results are shown in Table 1.

TABLE 1

| Compound No. | HOMO (eV) | LUMO (eV) | $T_1$ (eV) |
|---|---|---|---|
| 1 | −4.623 | −1.748 | 2.253 |
| 16 | −4.469 | −1.747 | 2.121 |
| 31 | −4.614 | −1.809 | 2.215 |
| 236 | −4.517 | −1.786 | 2.103 |
| 346 | −4.567 | −1.598 | 2.208 |
| 439 | −4.618 | −1.678 | 2.235 |
| 466 | −4.625 | −1.770 | 2.203 |
| 467 | −4.480 | −1.677 | 2.187 |
| 468 | −4.811 | −1.660 | 2.278 |
| 469 | −4.836 | −1.637 | 2.287 |

Referring to Table 1, it is confirmed that the organometallic compound represented by Formula 1 has such electrical characteristics that are suitable for use in an electronic device, for example, an organic light-emitting device, for use as a dopant.

Synthesis methods of the organometallic compound represented by Formula 1 may be understood by one of ordinary skill in the art by referring to Synthesis Examples provided below.

Therefore, the organometallic compound represented by Formula 1 may be suitable for use in an organic layer of an organic light-emitting device, for example, for use as a dopant in an emission layer of the organic layer. Another aspect of the present disclosure provides an organic light-emitting device including: a first electrode, a second electrode, and an organic layer disposed between the first electrode and the second electrode and including an emission layer, wherein the organic layer includes the organometallic compound represented by Formula 1.

The organic light-emitting device may have, due to the inclusion of an organic layer including the organometallic compound represented by Formula 1, a low driving voltage, high external quantum luminescence efficiency, a low roll-off ratio, and a long lifespan.

The organometallic compound represented by Formula 1 may be used between a pair of electrodes of an organic light-emitting device. For example, the organometallic compound represented by Formula 1 may be included in the emission layer. In this regard, the organometallic compound may act as a dopant, and the emission layer may further include a host (that is, an amount of the organometallic compound represented by Formula 1 is smaller than an amount of the host). The emission layer may emit, for example, green light or red light.

The expression "(an organic layer) includes at least one organometallic compound" as used herein may include a case in which "(an organic layer) includes identical organometallic compounds represented by Formula 1" and a case in which "(an organic layer) includes two or more different organometallic compounds represented by Formula 1".

For example, the organic layer may include, as the organometallic compound, only Compound 1. In this regard, Compound 1 may exist only in the emission layer of the organic light-emitting device. In one or more embodiments, the organic layer may include, as the organometallic compound, Compound 1 and Compound 2. In this regard, Compound 1 and Compound 2 may exist in an identical layer (for example, Compound 1 and Compound 2 both may exist in an emission layer).

The first electrode may be an anode, which is a hole injection electrode, and the second electrode may be a cathode, which is an electron injection electrode; or the first electrode may be a cathode, which is an electron injection electrode, and the second electrode may be an anode, which is a hole injection electrode.

For example, in the organic light-emitting device, the first electrode is an anode, and the second electrode is a cathode, and the organic layer further includes a hole transport region between the first electrode and the emission layer and an electron transport region between the emission layer and the second electrode, and the hole transport region includes a hole injection layer, a hole transport layer, an electron blocking layer, or any combination thereof, and the electron transport region includes a hole blocking layer, an electron transport layer, an electron injection layer, or any combination thereof.

The term "organic layer" as used herein refers to a single layer and/or a plurality of layers disposed between the first electrode and the second electrode of an organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment and a method of manufacturing an organic light-emitting device according to an embodiment will be described in connection with the FIGURE. The organic light-emitting device 10 includes a first electrode 11, an organic layer 15, and a second electrode 19, which are sequentially stacked.

A substrate may be additionally disposed under the first electrode 11 or above the second electrode 19. For use as the substrate, any substrate that is used in general organic light-emitting devices may be used, and the substrate may be a glass substrate or a transparent plastic substrate, each having excellent mechanical strength, thermal stability, transparency, surface smoothness, ease of handling, and water resistance.

The first electrode 11 may be formed by depositing or sputtering a material for forming the first electrode 11 on the substrate. The first electrode 11 may be an anode. The material for forming the first electrode 11 may be a material with a high work function to facilitate hole injection. The first electrode 11 may be a reflective electrode, a semi-reflective electrode, or a transmissive electrode. The material for forming the first electrode may be, for example, indium tin oxide (ITO), indium zinc oxide (IZO), tin oxide ($SnO_2$), or zinc oxide (ZnO). In one or more embodiments, the material for forming the first electrode 11 may be metal or metal alloy, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is disposed on the first electrode 11.

The organic layer 15 may include a hole transport region, an emission layer, and an electron transport region.

The hole transport region may be disposed between the first electrode 11 and the emission layer.

The hole transport region may include a hole injection layer, a hole transport layer, an electron blocking layer, a buffer layer, or any combination thereof.

The hole transport region may include only either a hole injection layer or a hole transport layer. In one or more embodiments, the hole transport region may have a hole injection layer/hole transport layer structure or a hole injection layer/hole transport layer/electron blocking layer structure, which are sequentially stacked in this stated order from the first electrode 11.

When the hole transport region includes a hole injection layer (HIL), the hole injection layer may be formed on the first electrode 11 by using one or more suitable methods, for example, vacuum deposition, spin coating, casting, and/or Langmuir-Blodgett (LB) deposition.

When a hole injection layer is formed by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Å/sec to about 100 Å/sec. However, the deposition conditions are not limited thereto.

When the hole injection layer is formed using spin coating, coating conditions may vary according to the material used to form the hole injection layer, and the structure and thermal properties of the hole injection layer. For example, a coating speed may be from about 2,000 rpm to about 5,000 rpm, and a temperature at which a heat treatment is performed to remove a solvent after coating may be from about 80° C. to about 200° C. However, the coating conditions are not limited thereto.

Conditions for forming a hole transport layer and an electron blocking layer may be understood by referring to conditions for forming the hole injection layer.

The hole transport region may include, for example, m-MTDATA, TDATA, 2-TNATA, NPB, β-NPB, TPD, spiro-TPD, spiro-NPB, methylated-NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201 below, a compound represented by Formula 202 below, or any combination thereof:

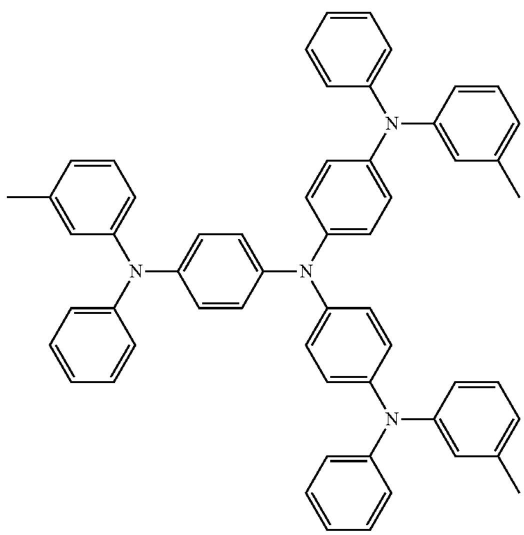

m-MTDATA

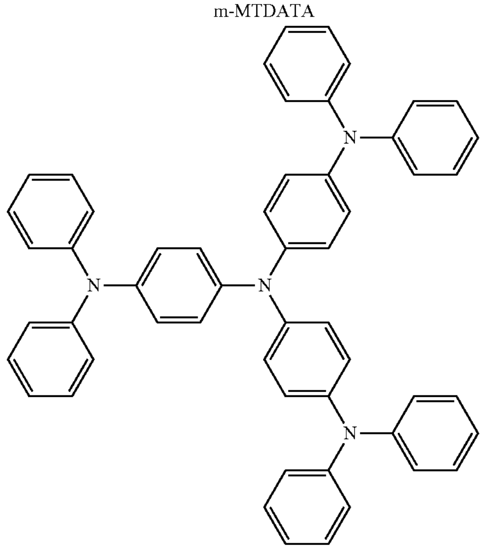

TDATA

-continued

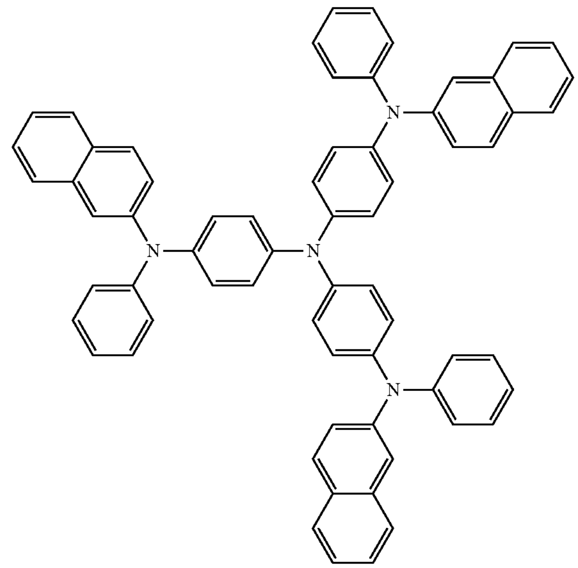

2-TNATA

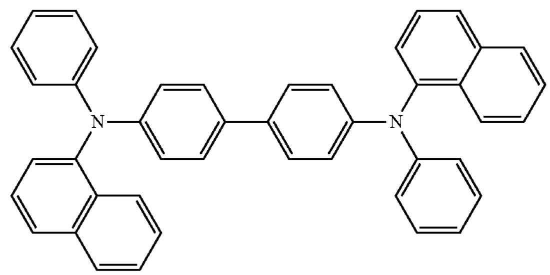

NPB

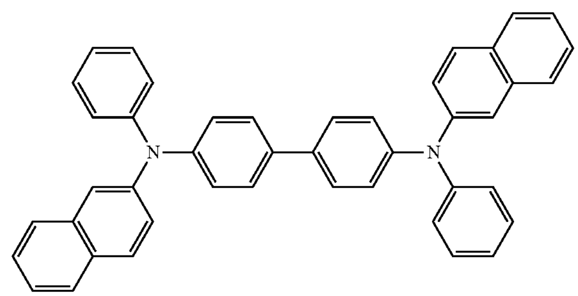

β-NPB

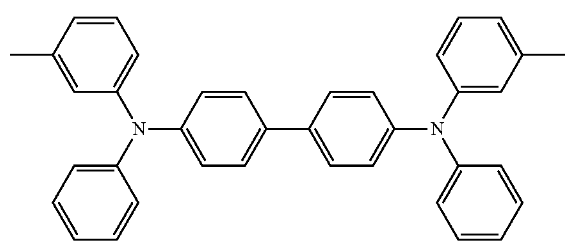

TPD

-continued

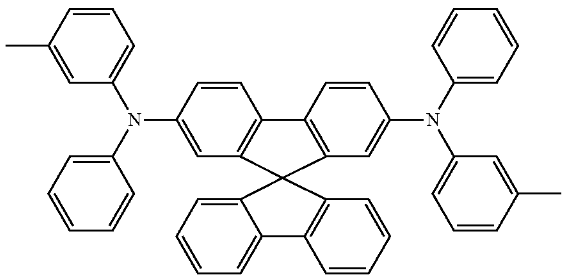

Spiro-TPD

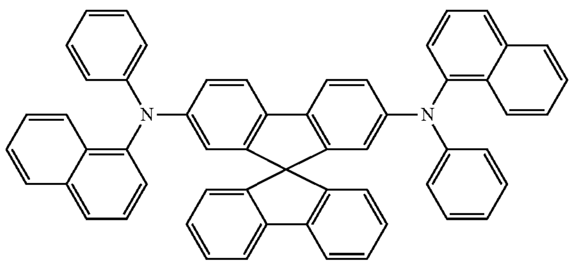

Spiro-NPB

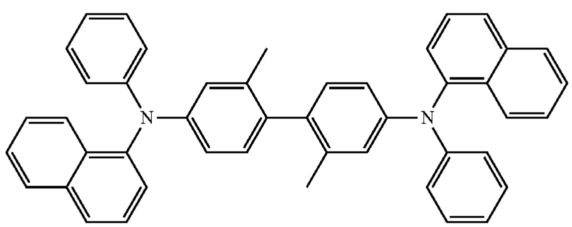

methylated NPB

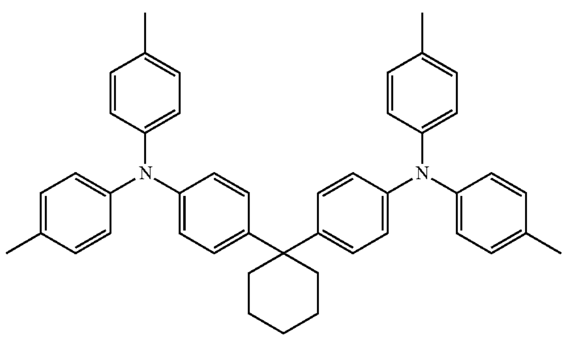

TAPC

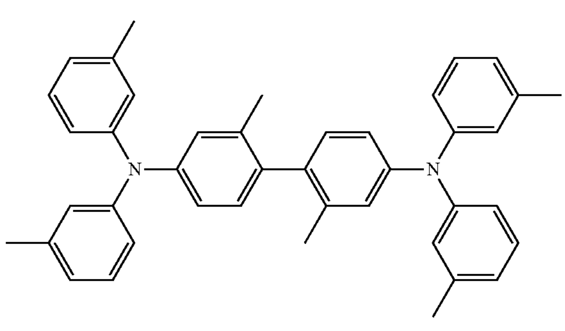

HMTPD

-continued

Formula 201

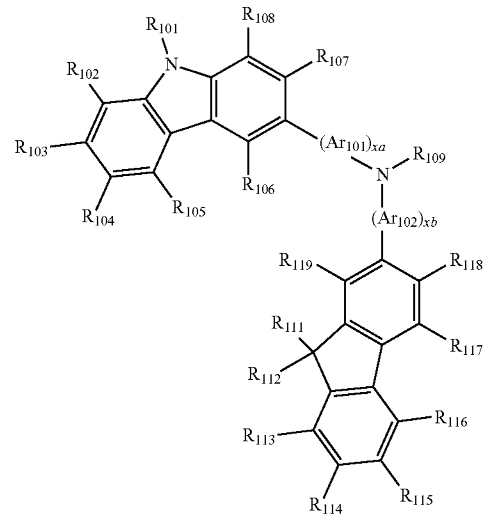

Formula 202

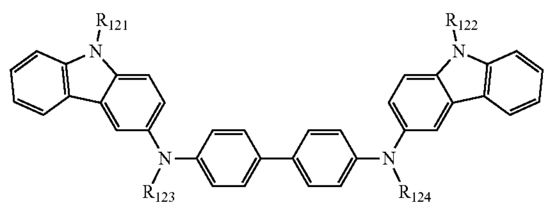

In Formula 201, $Ar_{101}$ and $Ar_{102}$ may each independently be a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_2$-$C_{10}$ heterocycloalkyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or may be 0, 1, or 2. For example, xa may be 1, and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group (for example, a methyl group, an ethyl group, a propyl group, a butyl group, pentyl group, a hexyl group, and the like), or a $C_1$-$C_{10}$ alkoxy group (for example, a methoxy group, an ethoxy group, a propoxy group, a butoxy group, a pentoxy group, and the like);

a $C_1$-$C_{10}$ alkyl group or a $C_1$-$C_{10}$ alkoxy group, each substituted with deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, or any combination thereof; or a phenyl group, a naphthyl group, an anthracenyl group, a fluorenyl group, or a pyrenyl group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, or any combination thereof, but embodiments of the present disclosure are not limited thereto.

In Formula 201, $R_{109}$ may be a phenyl group, a naphthyl group, an anthracenyl group, or a pyridinyl group, each unsubstituted or substituted with deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one embodiment, the compound represented by Formula 201 may be represented by Formula 201A below, but embodiments of the present disclosure are not limited thereto:

Formula 201A

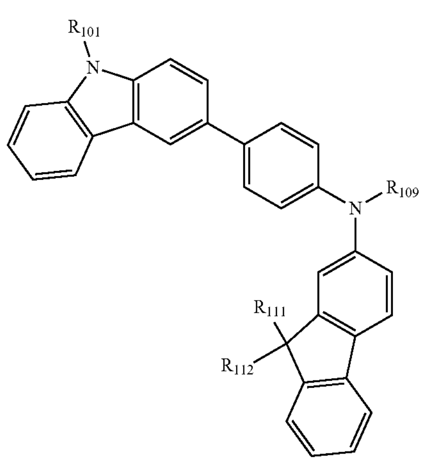

Detailed descriptions of $R_{101}$, $R_{111}$, $R_{112}$, and $R_{109}$ in Formula 201A are the same as described above.

For example, the compound represented by Formula 201 and the compound represented by Formula 202 may each include Compounds HT1 to HT20, but are not limited thereto:

HT1

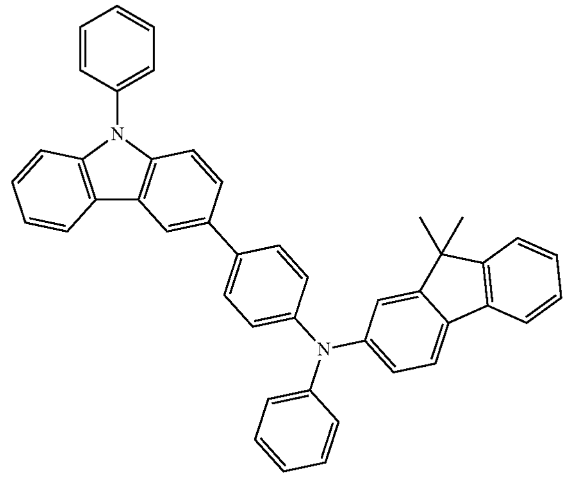

HT2

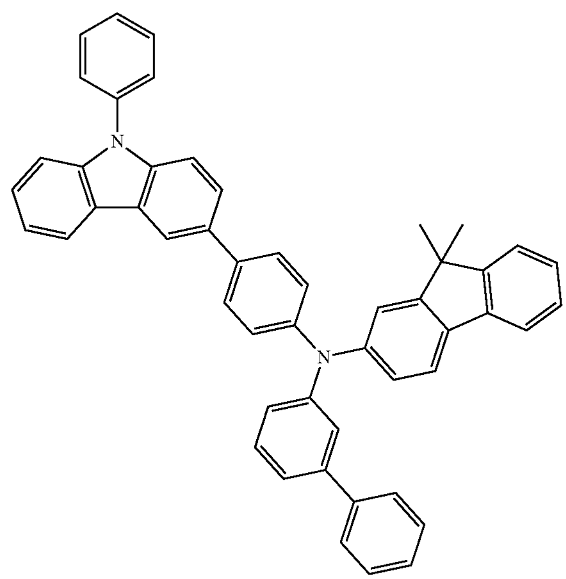

HT3
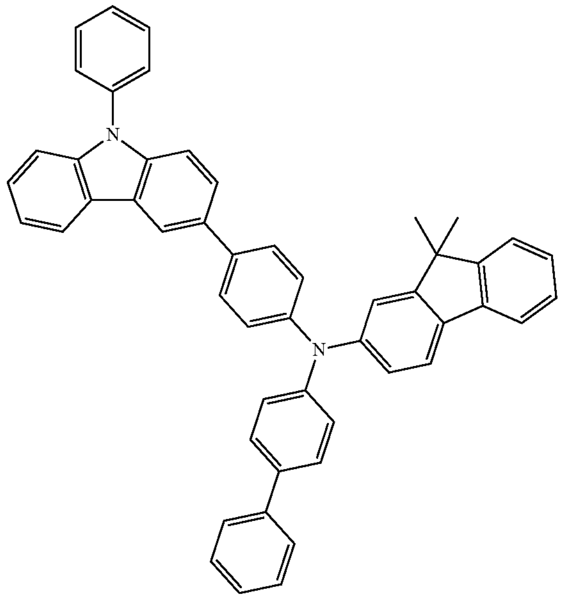
HT4
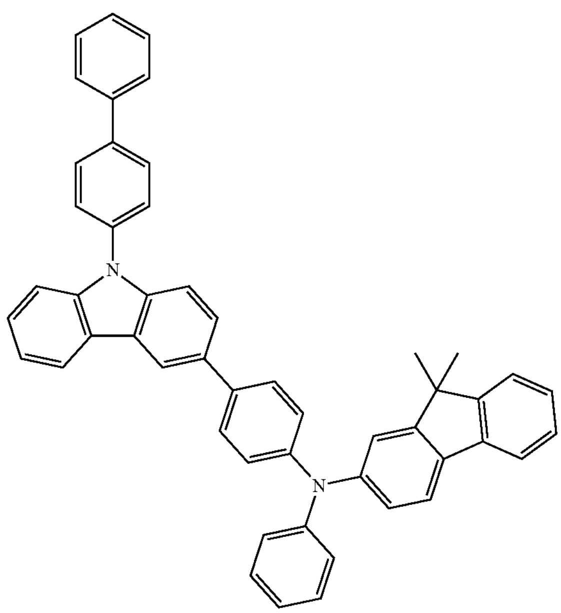
HT5
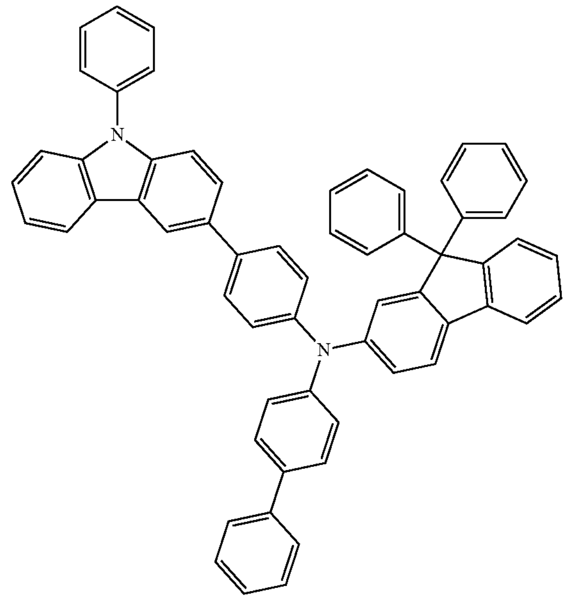
HT6
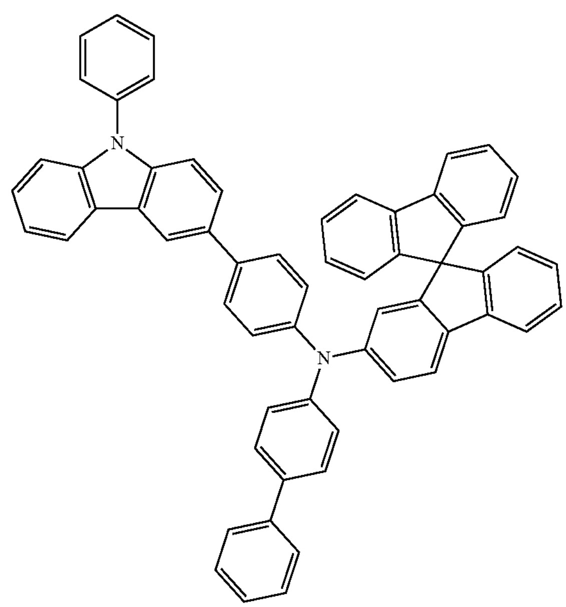

-continued
HT7
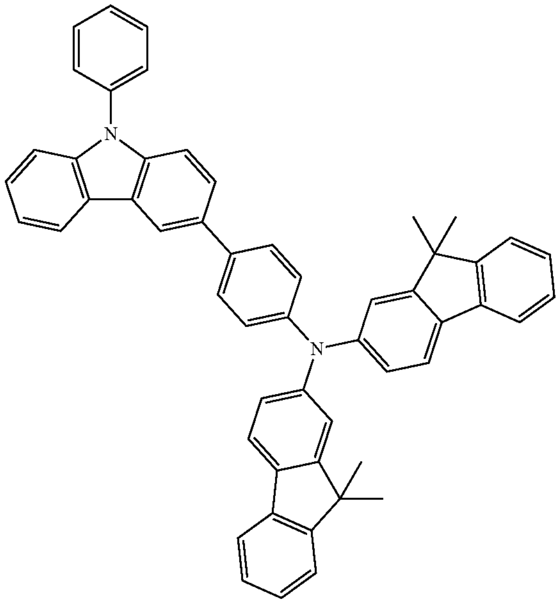
HT8
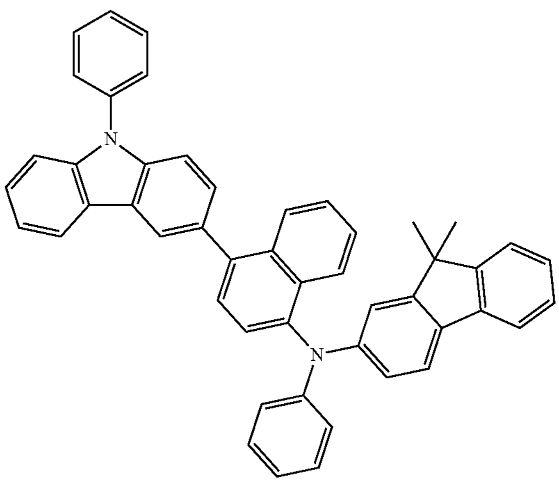
HT9
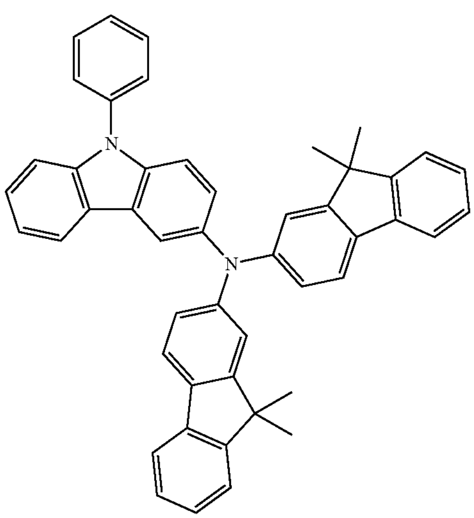
-continued
HT10
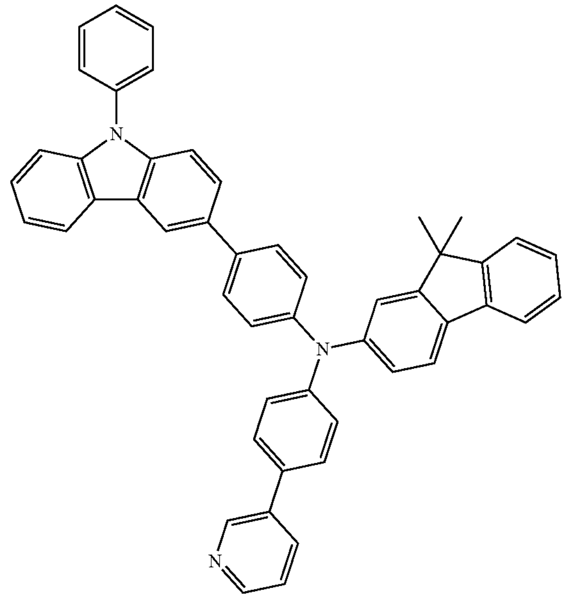
HT11
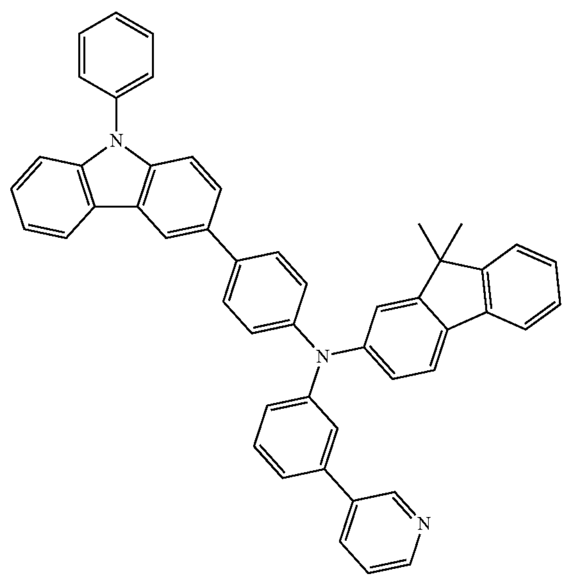

HT12
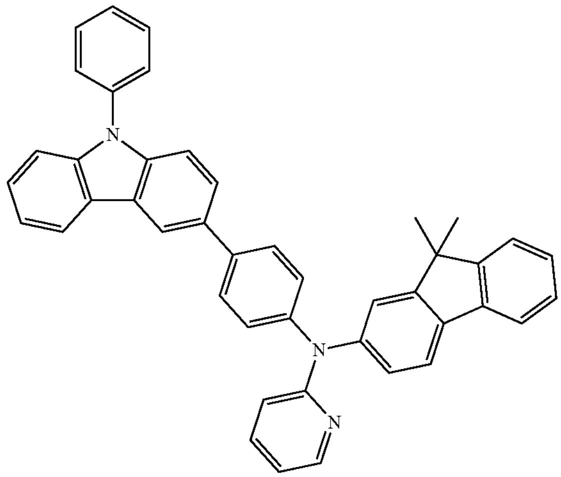
HT13
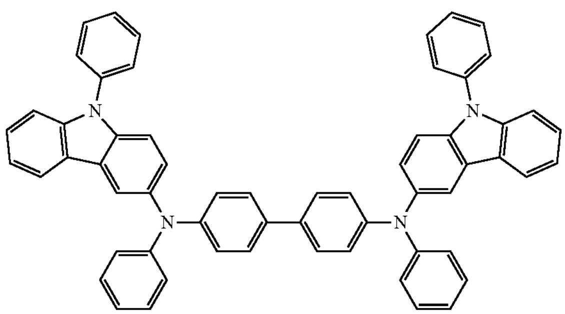
HT14
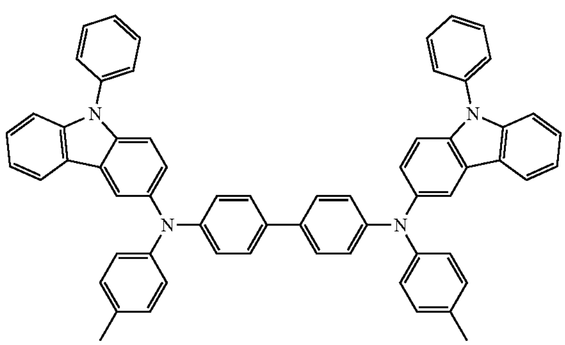
HT15
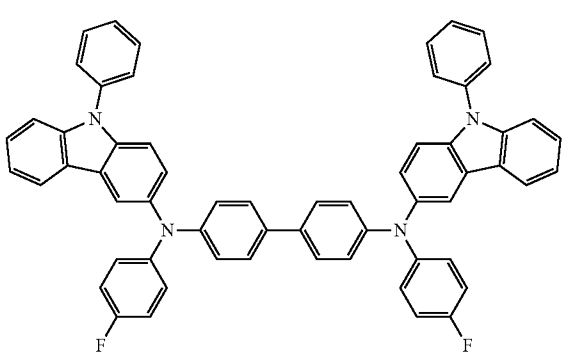
HT16
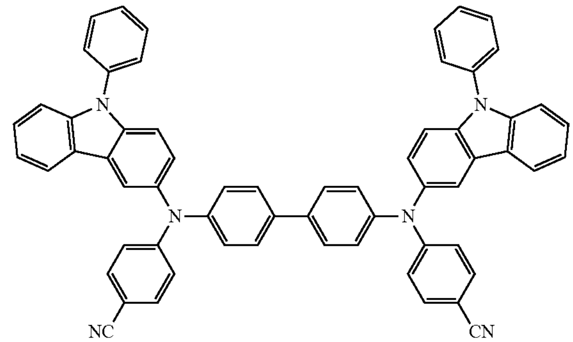
HT17
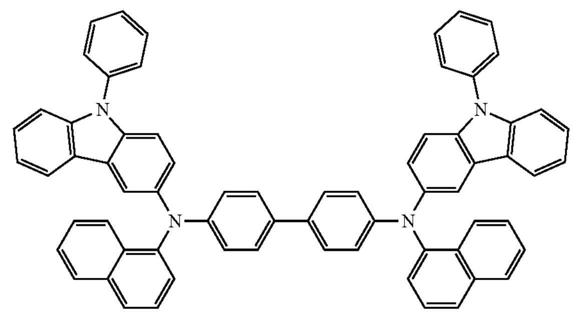
HT18
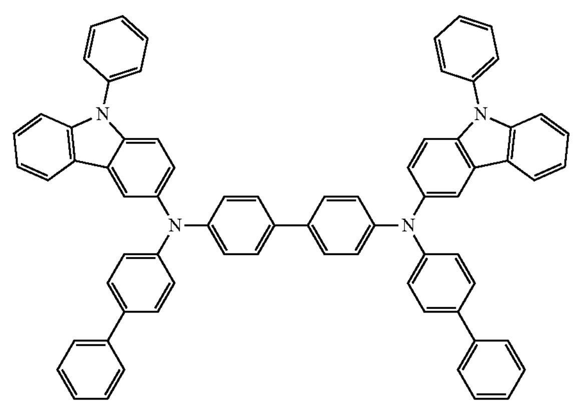
HT19
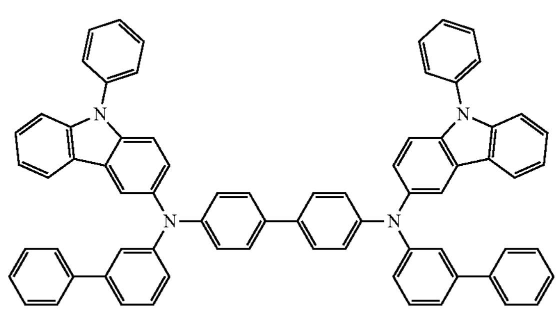

-continued

HT20

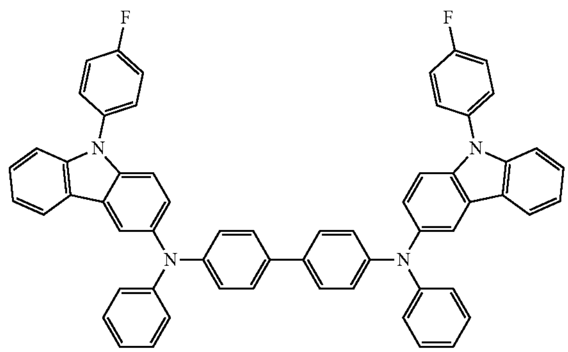

A thickness of the hole transport region may be from about 100 Å to about 10,000 Å, for example, about 100 Å to about 1,000 Å. When the hole transport region includes a hole injection layer, a hole transport layer, or any combination thereof, a thickness of the hole injection layer may be in a range of about 100 Å to about 10000 Å, for example, about 100 Å to about 1,000 Å, and a thickness of the hole transport layer may be in a range of about 50 Å to about 2,000 Å, for example about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be a quinone derivative, a metal oxide, a cyano group-containing compound, or any combination thereof, but embodiments of the present disclosure are not limited thereto. Non-limiting examples of the p-dopant are a quinone derivative, such as tetracyanoquinodimethane (TCNQ) or 2,3,5,6-tetrafluoro-tetracyano-1,4-benzoquinodimethane (F4-TCNQ); a metal oxide, such as a tungsten oxide or a molybdenum oxide; and a cyano group-containing compound, such as Compound HT-D1 below, but are not limited thereto:

HT-D1

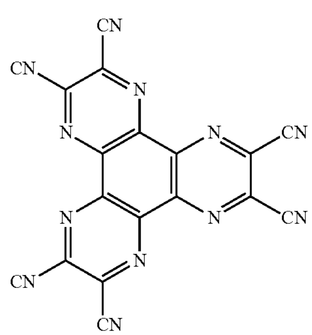

-continued

F4-TCNQ

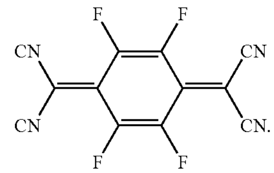

The hole transport region may include a buffer layer.

Also, the buffer layer may compensate for an optical resonance distance according to a wavelength of light emitted from the emission layer, and thus, efficiency of a formed organic light-emitting device may be improved.

Meanwhile, when the hole transport region includes an electron blocking layer, a material for the electron blocking layer may be a material as described for the hole transport region described above, a material for a host to be explained later, or any combination thereof. However, the material for the electron blocking layer is not limited thereto. For example, when the hole transport region includes an electron blocking layer, a material for the electron blocking layer may be mCP, which will be explained later.

An emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the emission layer.

The emission layer may include a host and a dopant, and the dopant may include the organometallic compound represented by Formula 1.

The host may include TPBi, TBADN, ADN (also referred to as “DNA”), CBP, CDBP, TCP, mCP, one of Compounds H50 to H52, or any combination thereof:

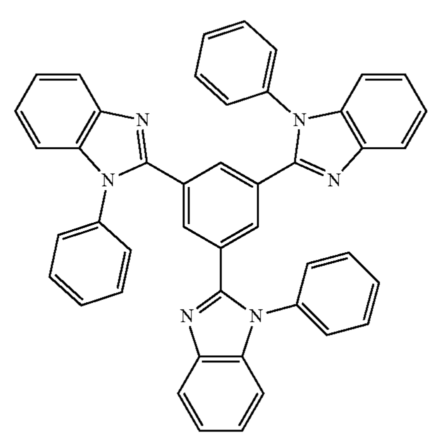

TPBi

-continued

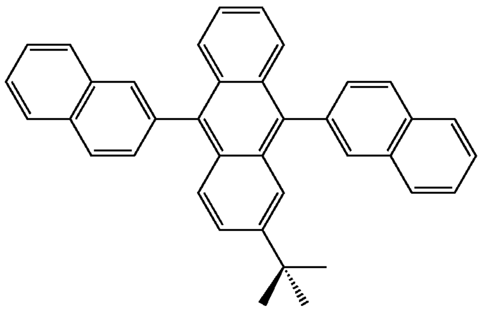

TBADN

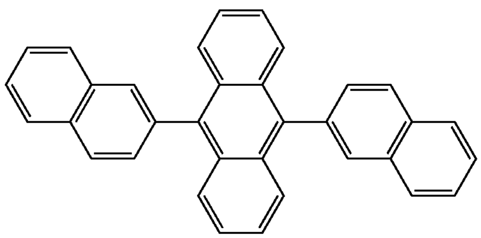

ADN

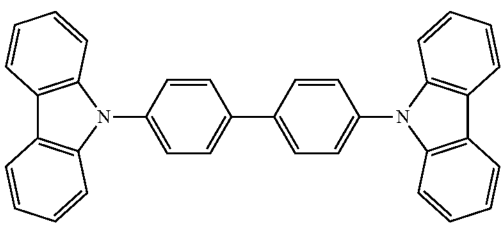

CPB

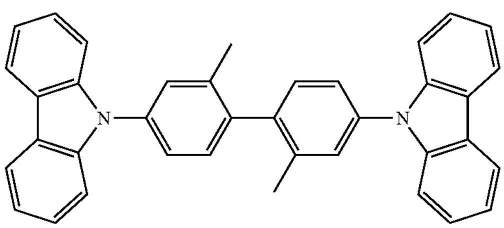

CDPB

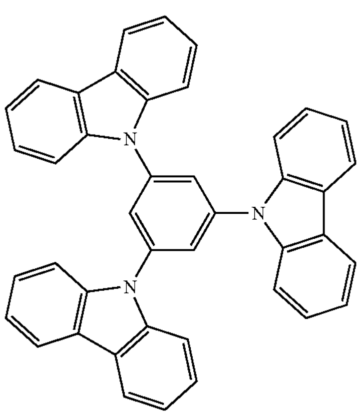

TCP

-continued

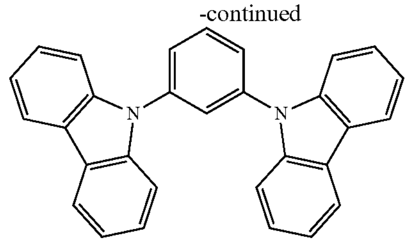

mCP

H50

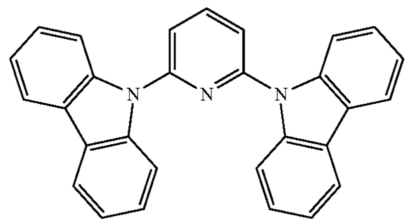

H51

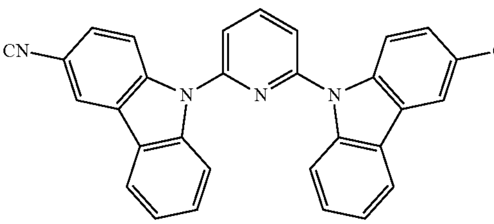

H52

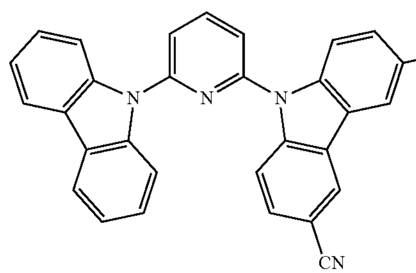

When the organic light-emitting device is a full-color organic light-emitting device, the emission layer may be patterned into a red emission layer, a green emission layer, and/or a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

A thickness of the emission layer may be in a range of about 100 Å to about 1,000 Å, for example, about 200 Å to about 600 Å. When the thickness of the emission layer is within this range, excellent light-emission characteristics may be obtained without a substantial increase in driving voltage.

An electron transport region may be disposed on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but the structure of the electron transport region is not limited thereto. The electron transport layer may have a single-layered structure or a multi-layered structure including two or more different materials.

Conditions for forming the hole blocking layer, the electron transport layer, and the electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

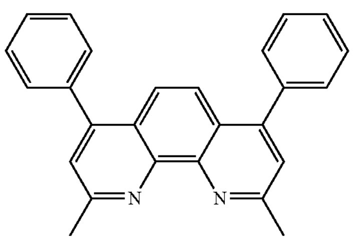

BCP

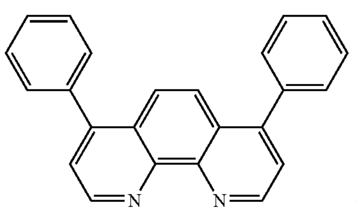

Bphen

A thickness of the hole blocking layer may be from about 20 Å to about 1,000 Å, for example, about 30 Å to about 300 Å. When the thickness of the hole blocking layer is within these ranges, the hole blocking layer may have excellent hole blocking characteristics without a substantial increase in driving voltage.

The electron transport layer may include BCP, Bphen, $Alq_3$, BAlq, TAZ, NTAZ, or any combination thereof:

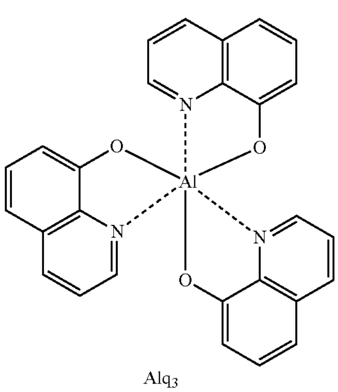

$Alq_3$

-continued

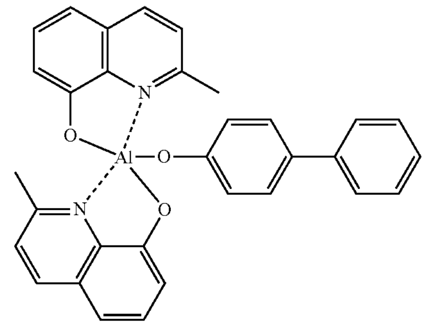

BAlq

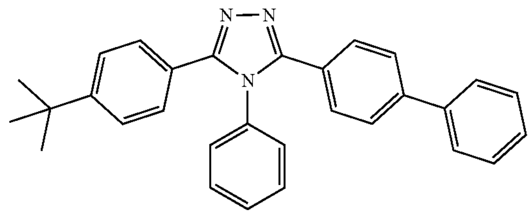

TAZ

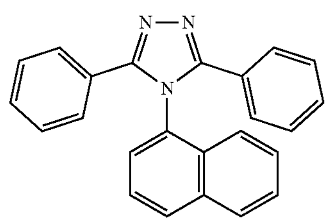

NTAZ

In one or more embodiments, the electron transport layer may include one of ET1 to ET25, but embodiments of the present disclosure are not limited thereto:

ET1

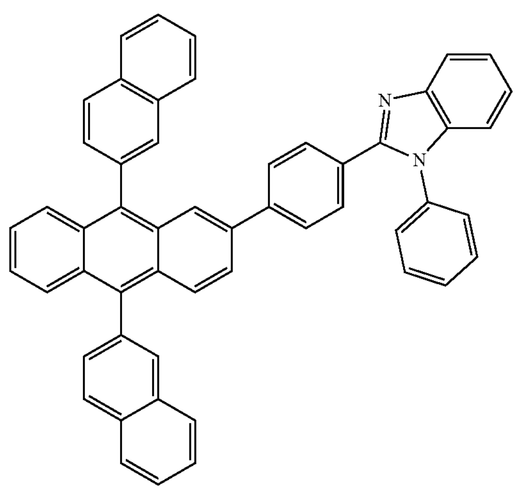

-continued
ET2
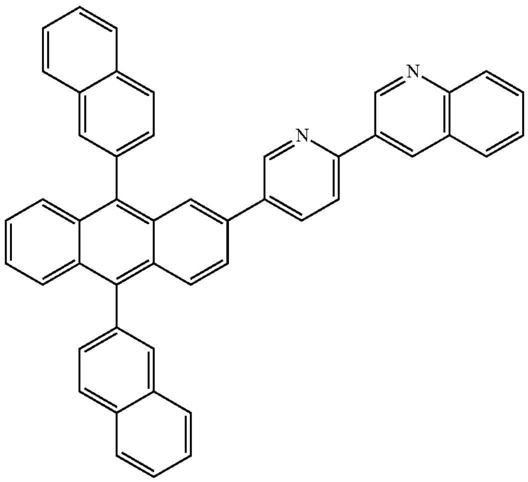
ET3
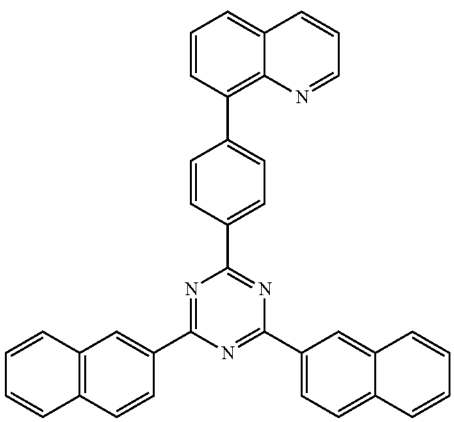
ET4
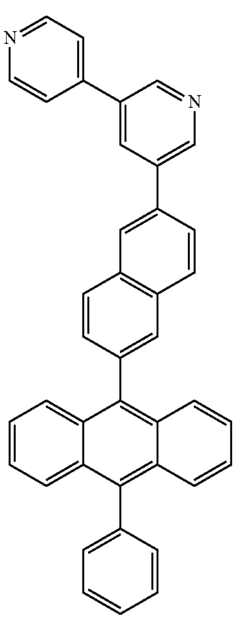
-continued
ET5
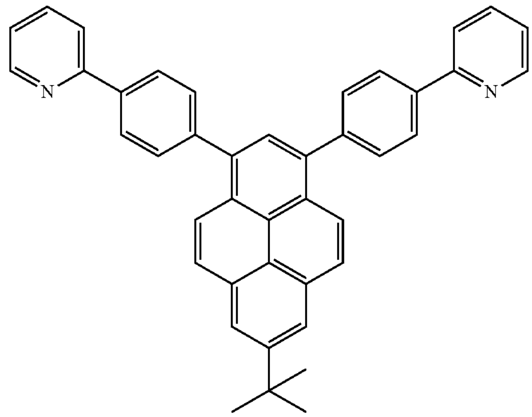
ET6
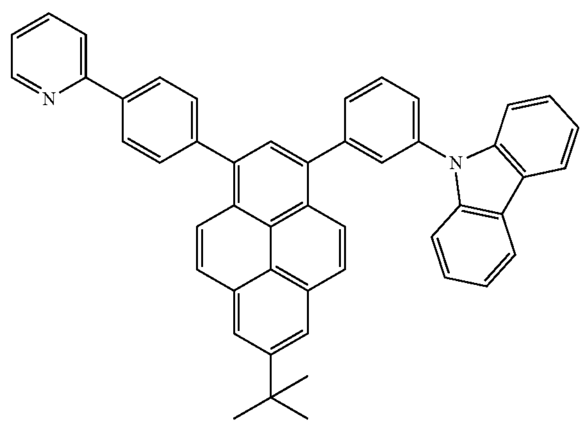
ET7
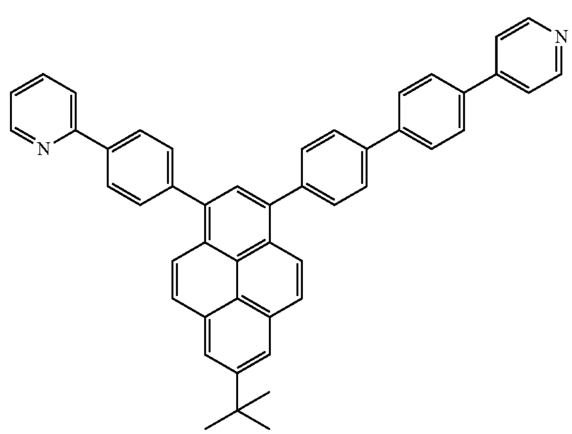

-continued
ET8
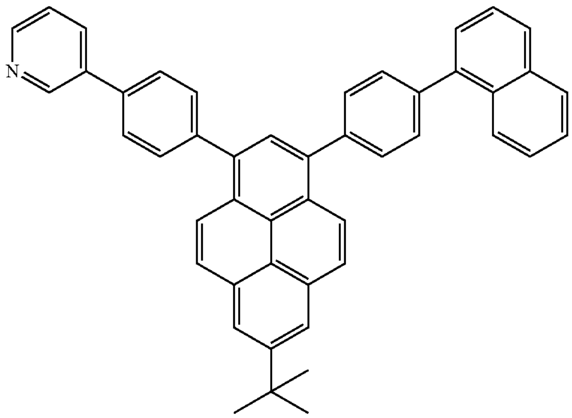
ET9
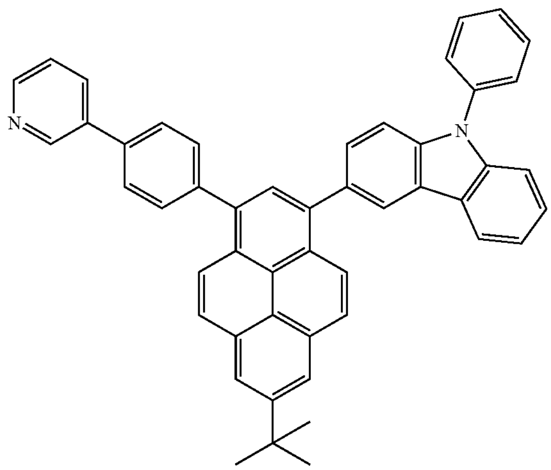
ET10
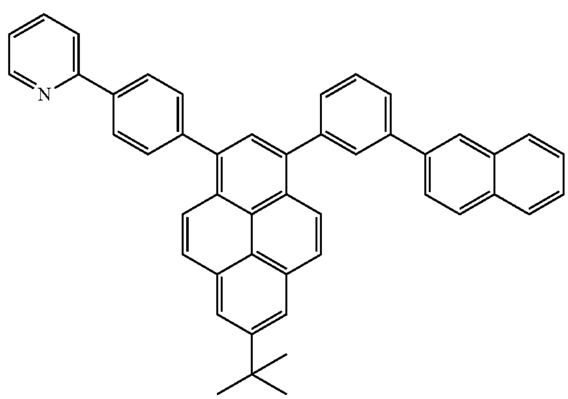
ET11
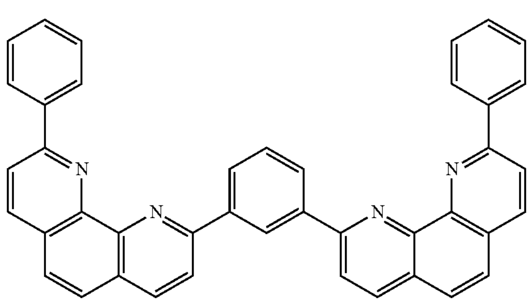
-continued
ET12
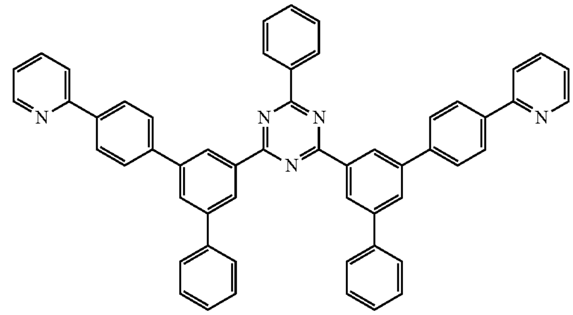
ET13
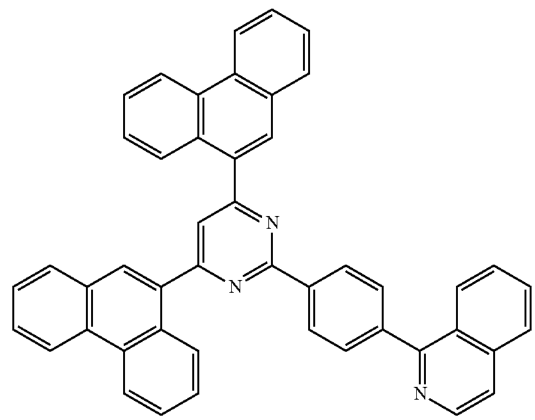
ET14
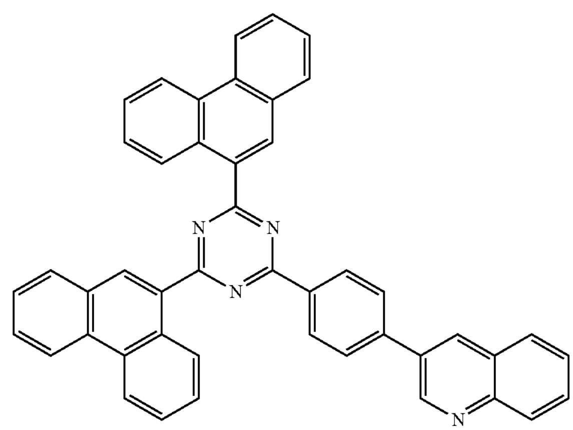
ET15
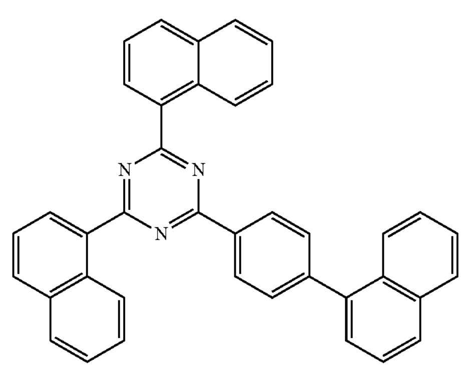

-continued
ET16
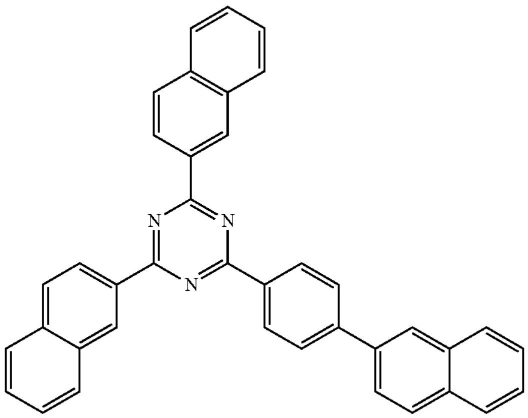
ET17
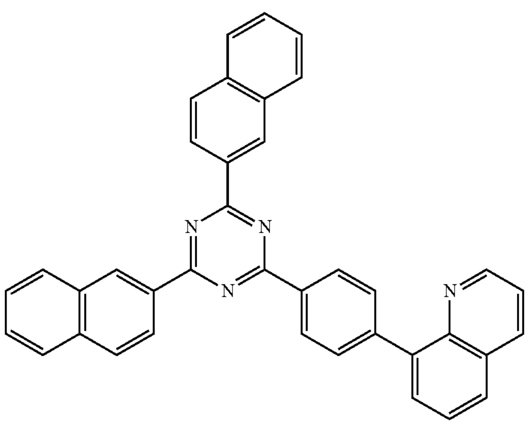
ET18
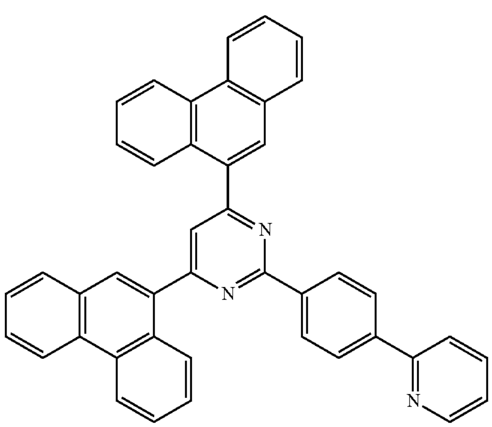
-continued
ET19
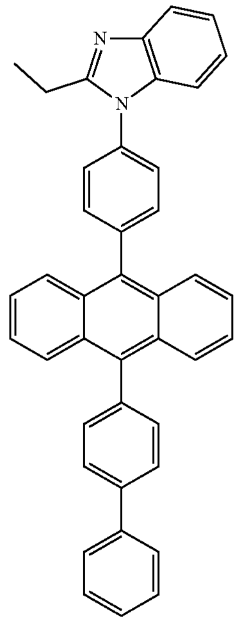
ET20
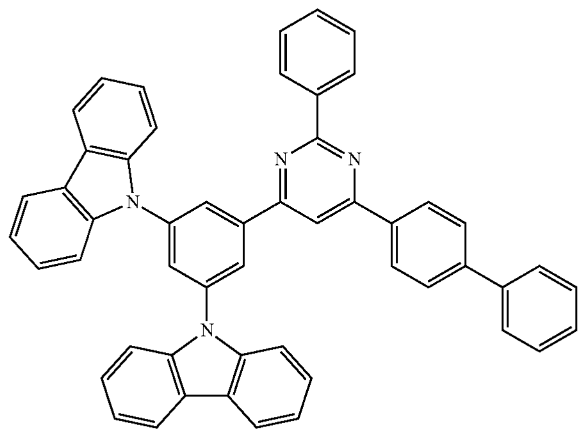
ET21
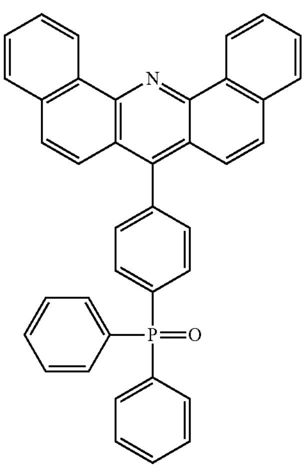

-continued

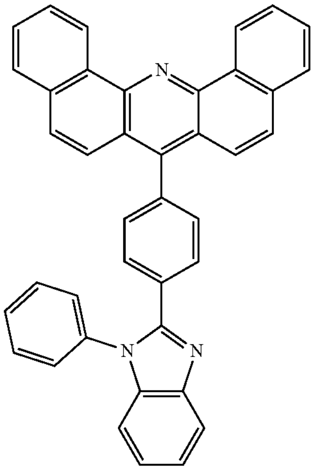

ET22

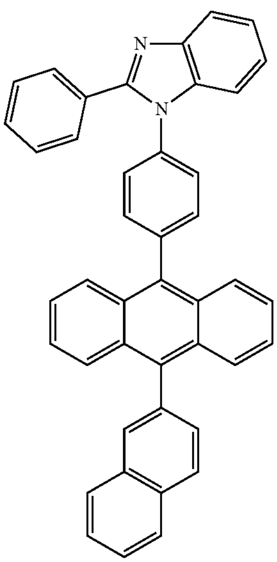

ET23

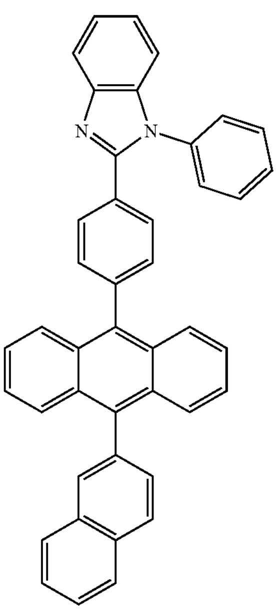

ET4

-continued

ET25

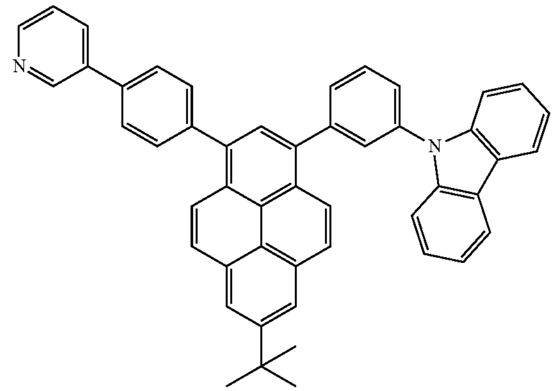

A thickness of the electron transport layer may be from about 100 Å to about 1,000 Å, for example, about 150 Å to about 500 Å. When the thickness of the electron transport layer is within the range described above, the electron transport layer may have satisfactory electron transport characteristics without a substantial increase in driving voltage.

Also, the electron transport layer may further include, in addition to the materials described above, a metal-containing material.

The metal-containing material may include a Li complex. The Li complex may include, for example, Compound ET-D1 (LiQ), ET-D2, or any combination thereof:

ET-D1

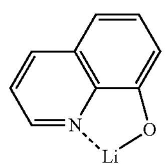

ET-D2

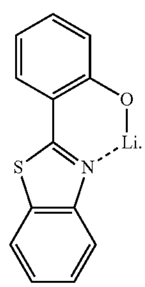

The electron transport region may include an electron injection layer that promotes the flow of electrons from the second electrode 19 thereinto.

The electron injection layer may include LiF, NaCl, CsF, $Li_2O$, BaO, or any combination thereof.

A thickness of the electron injection layer may be from about 1 Å to about 100 Å, for example, about 3 Å to about 90 Å. When a thickness of the electron injection layer is within these ranges, satisfactory electron injection characteristics may be obtained without substantial increase in driving voltage.

The second electrode 19 is disposed on the organic layer 15. The second electrode 19 may be a cathode. A material for forming the second electrode 19 may be metal, an alloy, an electrically conductive compound, or a combination thereof, which have a relatively low work function. For example, lithium (Li), magnesium (Mg), aluminum (Al), aluminum-lithium (Al—Li), calcium (Ca), magnesium-indium (Mg—In), or magnesium-silver (Mg—Ag) may be used as the material for forming the second electrode 19. To manufacture a top-emission type light-emitting device, a transmissive electrode formed using ITO or IZO may be used as the second electrode 19.

Hereinbefore, the organic light-emitting device according to an embodiment has been described in connection with the FIGURE.

Another aspect of the present disclosure provides a diagnostic composition including at least one organometallic compound represented by Formula 1.

The organometallic compound represented by Formula 1 provides high luminescence efficiency. Accordingly, a diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropyloxy group.

The term "$C_2$-$C_{60}$ alkenyl group" as used herein refers to a hydrocarbon group having at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group having at least one carbon-carbon triple bond in the middle or at the terminus of the $C_2$-$C_{60}$ alkyl group, and examples thereof include an ethynyl group, and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and non-limiting examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_2$-$C_{10}$ heterocycloalkyl group" as used herein refers to a monovalent saturated monocyclic group having N, O, P, Si, Se, S, or a combination thereof and 2 to 10 carbon atoms as ring-forming atoms, and non-limiting examples thereof include a tetrahydrofuranyl group, and a tetrahydrothiophenyl group. The term "$C_2$-$C_{10}$ heterocycloalkylene group" as used herein refers to a divalent group having the same structure as the $C_2$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and non-limiting examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_2$-$C_{10}$ heterocycloalkenyl group" as used herein refers to a monovalent monocyclic group that has N, O, P, Si, Se, S, or a combination thereof and 1 to 10 carbon atoms as ring-forming atoms, and a double bond in the ring. Examples of the $C_2$-$C_{10}$ heterocycloalkenyl group are a 2,3-dihydrofuranyl group, and a 2,3-dihydrothiophenyl group. The term "$C_2$-$C_{10}$ heterocycloalkenylene group" as used herein refers to a divalent group having the same structure as the $C_2$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

The term "$C_1$-$C_{60}$ heteroaryl group" as used herein refers to a monovalent group having a heterocyclic aromatic system that has N, O, P, Si, Se, S, or a combination thereof and 1 to 60 carbon atoms as ring-forming atoms. The term "$C_1$-$C_{60}$ heteroarylene group" as used herein refers to a divalent group having a heterocyclic aromatic system that has N, O, P, Si, Se, S, or a combination thereof as ring-forming atoms. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. Examples of the monovalent non-aromatic condensed polycyclic group include a fluorenyl group. The term "divalent non-aromatic condensed polycyclic group" as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, N, O, P, Si, Se, S, or any combination thereof, other than carbon atoms, as ring-forming atoms, and no aromaticity in its entire molecular structure. Non-limiting examples of the monovalent non-aromatic condensed heteropolycyclic group include a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as ring-forming atoms, 5 to 30 carbon atoms only. The $C_5$-$C_{30}$ carbocyclic group may be a monocyclic group or a polycyclic group.

The term "$C_2$-$C_{30}$ heterocyclic group" as used herein refers to a saturated or unsaturated cyclic group having, N, O, Si, P, Se, S, or any combination thereof and 2 to 30 carbon atoms as ring-forming atoms. The $C_2$-$C_{30}$ heterocyclic group may be a monocyclic group or a polycyclic group.

A substituent(s) of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —C, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof;

$—N(Q_{31})(Q_{32})$, $—Si(Q_{33})(Q_{34})(Q_{35})$, $—B(Q_{36})(Q_{37})$, or $—P(=O)(Q_{38})(Q_{39})$; or any combination thereof.

In the present specification, $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —C, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

Hereinafter, a compound and an organic light-emitting device according to embodiments are described in detail with reference to Synthesis Example and Examples. However, the organic light-emitting device is not limited thereto. The wording "B was used instead of A" used in describing Synthesis Examples means that an amount of A used was identical to an amount of B used, in terms of a molar equivalent.

EXAMPLES

Synthesis Example 1 (Compound 1)

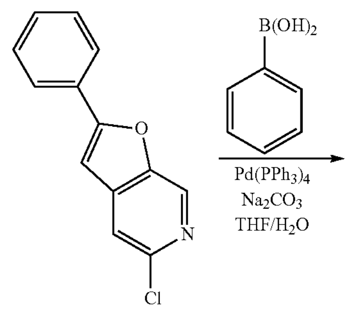

-continued

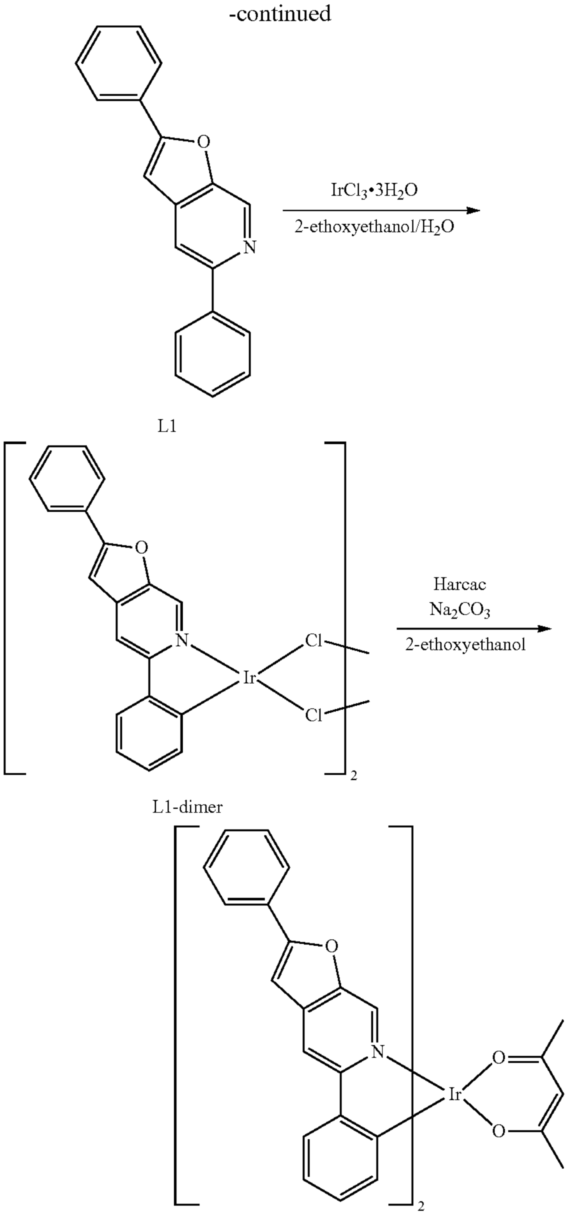

L1

L1-dimer

1

Synthesis of Intermediate L1

5-chloro-2-phenylfuro[2,3-c]pyridine (2.55 g, 11.1 mmol), phenylboronic acid (2.603 g, 16.64 mmol), $Pd(PPh_3)_4$ (1.03 g, 0.89 mmol), and $K_2CO_3$ (3.83 g, 27.7 mmol) were mixed with 60 mL of tetrahydrofuran and 30 mL of distilled water, stirred at a temperature of 90° C. for 18 hours, and then cooled to room temperature. The reaction mixture was extracted with ethyl acetate, dried by using anhydrous magnesium sulfate ($MgSO_4$), and filtered to obtain a filtrate. The filtrate was concentrated under vacuum to obtain a residue. The residue was purified by column chromatography using ethyl acetate:hexane=1:2 (V/V) as an eluent to obtain Intermediate L1 (2.90 g, 83%).

LC-MS m/z=272.31 $(M+H)^+$.

Synthesis of Intermediate L1-dimer

Intermediate L1 (1.99 g, 7.32 mmol) and Iridium chloride hydrate (1.15 g, 3.25 mmol) were mixed with 21 mL of 2-ethoxy ethanol and 7 mL of distilled water, stirred at a temperature of 120° C. for 24 hours under reflux, and then cooled to room temperature. A solid obtained therefrom was filtered, and the filtered solid was sufficiently washed in the order of water/methanol/hexane. The solid was dried in a vacuum oven to obtain Intermediate L1-dimer (1.95 g, 78%). The obtained compound was used in a next reaction without additional purification.

Synthesis of Compound 1

30 mL of 2-ethoxy ethanol was added to Intermediate L1-dimer (1.94 g, 1.26 mmol), acetyl acetone (1.26 g, 12.6 mmol), and $Na_2CO_3$ (1.33 g, 12.6 mmol), and stirred at room temperature for 12 hours. The reaction mixture was extracted using ethyl acetate, dried by using anhydrous magnesium sulfate ($MgSO_4$), and filtered to obtain a filtrate. The filtrate was concentrated under vacuum to obtain a residue. The residue was purified by column chromatography using methylene chloride:hexane=1:4 (V/V) as an eluent to obtain Compound 1 (0.453 g, 22%). The obtained compound was identified by Mass Spectrometry (MS) and HPLC analysis.

HRMS(MALDI-TOF) calcd for $C_{43}H_{31}IrN_2O_4$: m/z 832.1913, Found: 832.1912.

Synthesis Example 2 (Compound 16)

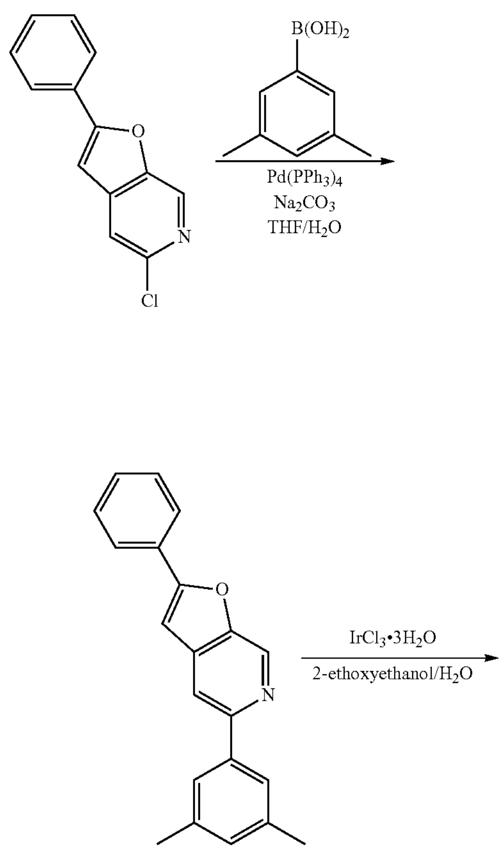

L16

-continued

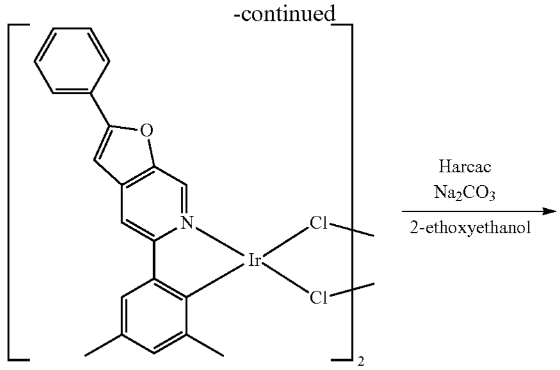

L16-dimer

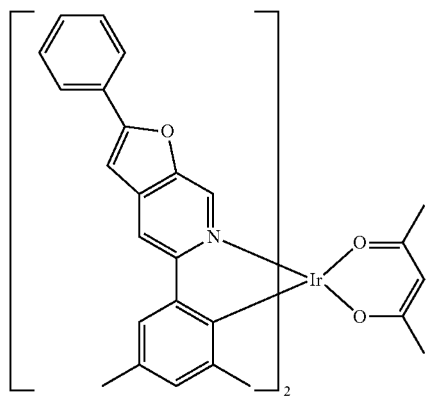

16

Synthesis of Intermediate L16

5-chloro-2-phenylfuro[2,3-c]pyridine (2.69 g, 11.71 mmol), (3,5-dimethylphenyl)boronic acid (2.64 g, 17.56 mmol), $Pd(PPh_3)_4$ (1.08 g, 0.94 mmol), and $K_2CO_3$ (4.05 g, 29.3 mmol) were mixed with 60 mL of tetrahydrofuran and 30 mL of distilled water, stirred at a temperature of 90° C. for 18 hours, and then cooled to room temperature. The reaction mixture was extracted using ethyl acetate, dried by using anhydrous magnesium sulfate ($MgSO_4$), and filtered to obtain a filtrate. The filtrate was concentrated under vacuum to obtain a residue. The residue was purified by column chromatography using ethyl acetate:hexane=1:2 (V/V) as an eluent to obtain Intermediate L16 (3.02 g, 86%).

LC-MS m/z=300.13 $(M+H)^+$.

Synthesis of Intermediate L16-dimer

Intermediate L16 (2.04 g, 6.82 mmol) and iridium chloride hydrate (1.07 g, 3.03 mmol) were mixed with 21 mL of 2-ethoxy ethanol and 7 mL of distilled water, stirred at a temperature of 120° C. for 24 hours under reflux, and then cooled to room temperature. A solid obtained therefrom was filtered, and the filtered solid sufficiently washed in the order of water/methanol/hexane. The solid was dried in a vacuum oven to obtain Intermediate L16-dimer (2.17 g, 87%). The obtained compound was used in a next reaction without additional purification.

Synthesis of Compound 16

30 mL of 2-ethoxy ethanol was added to Intermediate L16-dimer (2.14 g, 1.29 mmol), acetyl acetone (1.29 g, 12.9 mmol), and $Na_2CO_3$ (1.37 g, 12.9 mmol), and stirred at room temperature for 12 hours. The reaction mixture was extracted using ethyl acetate, dried by using anhydrous magnesium sulfate ($MgSO_4$), and filtered to obtain a filtrate. The filtrate was concentrated under vacuum to obtain a residue. The residue was purified by column chromatography using methylene chloride:hexane=1:4 (V/V) as an eluent to obtain Compound 16 (0.47 g, 20%). The obtained compound was identified by MS and HPLC analysis.

HRMS(MALDI-TOF) calcd for $C_{47}H_{39}IrN_2O_4$: m/z 888.2539, Found: 888.2541.

Synthesis Example 3 (Compound 31)

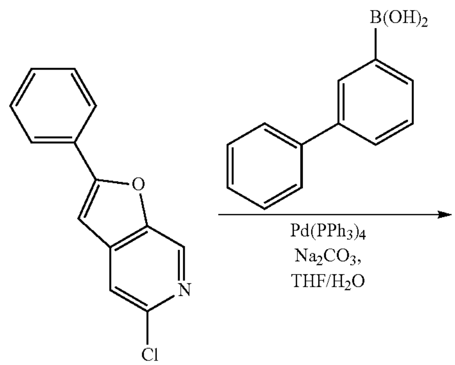

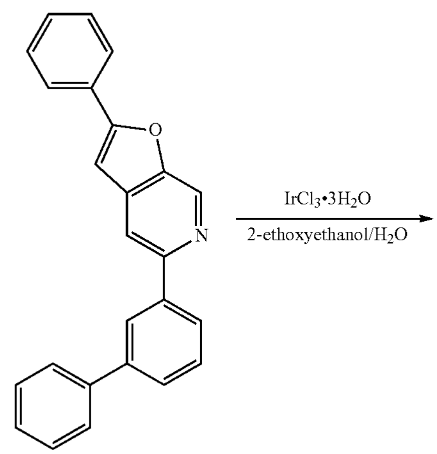

L31

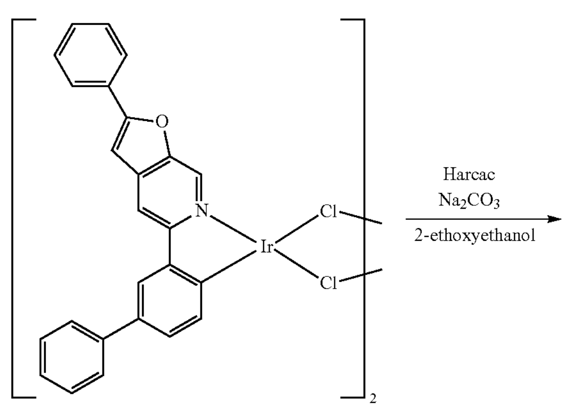

L31-dimer

-continued

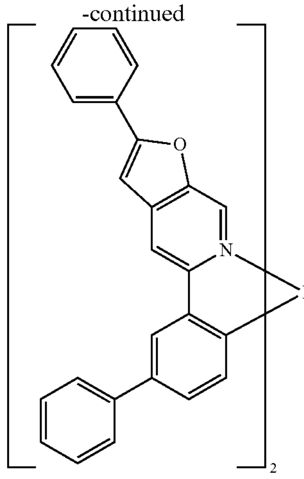

31

Synthesis of Intermediate L31

Intermediate L31 (2.54 g, 85%) was obtained in the same manner as in Synthesis of Intermediate L1 of Synthesis Example 1, except that diphenyl 3-boronic acid ([1,1'-biphenyl]-3-ylboronic acid) (2.57 g, 12.9 mmol) was used instead of phenylboronic acid (2.603 g, 16.64 mmol).

LC-MS m/z=348 $(M+H)^+$.

Synthesis of Intermediate L31-dimer

Intermediate L31-dimer (1.89 g, 76%) was obtained in the same manner as in Synthesis of Intermediate L1-dimer of Synthesis Example 1, except that Intermediate L31 (2.12 g, 6.11 mmol) was used instead of Intermediate L1.

Synthesis of Compound 31

Compound 31 (0.45 g, 23%) was obtained in the same manner as in Synthesis of Compound 1 of Synthesis Example 1, except that Intermediate L31-dimer (1.87 g, 1.25 mmol) was used instead of Intermediate L1-dimer. The obtained compound was identified by MS and HPLC analysis.

HRMS(MALDI-TOF) calcd for $C_{55}H_{39}IrN_2O_4$: m/z 984.2539, Found: 984.2539.

Synthesis Example 4 (Compound 236)

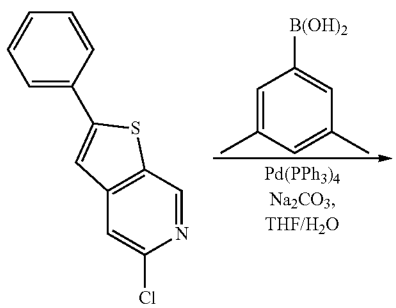

-continued

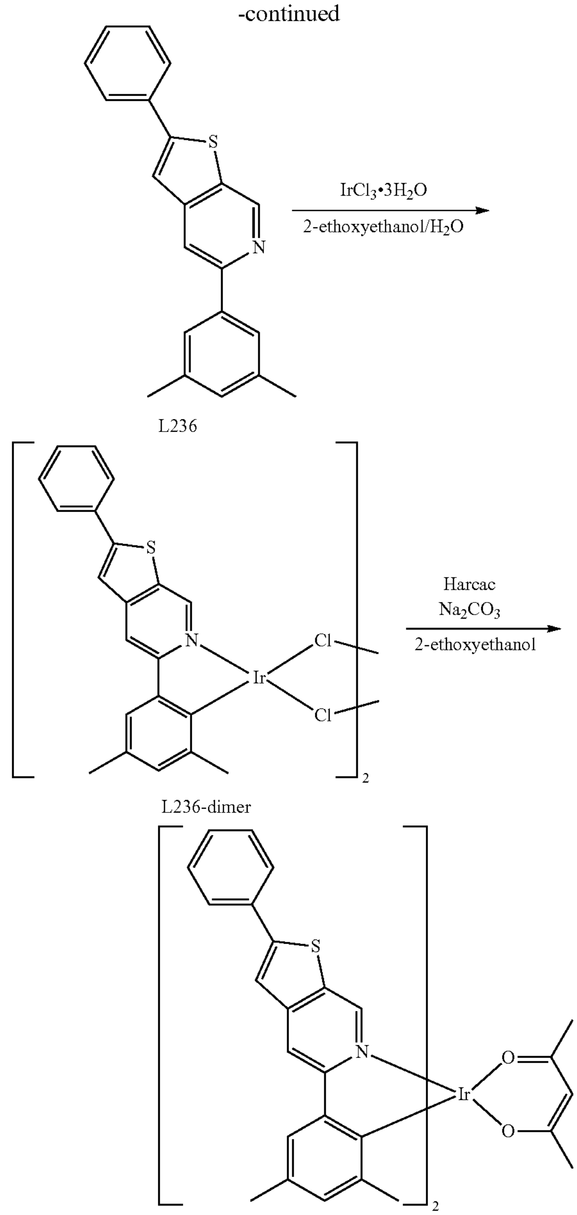

236

Synthesis of Intermediate L236

Intermediate L236 (2.54 g, 85%) was obtained in the same manner as in Synthesis of Intermediate L16 of Synthesis Example 2, except that 5-chloro-2-phenylthieno[2,3-c]pyridine (2.34 g, 9.51 mmol) was used instead of 5-chloro-2-phenylfuro[2,3-c]pyridine (2.69 g, 11.71 mmol).

LC-MS m/z=316 $(M+H)^+$.

Synthesis of Intermediate L236-dimer

Intermediate L236-dimer (2.11 g, 84%) was obtained in the same manner as in Synthesis of Intermediate L16-dimer of Synthesis Example 2, except that Intermediate L236 (2.07 g, 6.57 mmol) was used instead of Intermediate L16.

Synthesis of Compound 236

Compound 236 (0.41 g, 19%) was obtained in the same manner as in Synthesis of Compound 16 of Synthesis Example 2, except that Intermediate L236-dimer (2.05 g, 1.20 mmol) was used instead of Intermediate L16-dimer. The obtained compound was identified by MS and HPLC analysis.

HRMS (MALDI-TOF) calcd for $C_{47}H_{39}IrN_2O_2S_2$: m/z 920.2082, Found: 920.2080.

Synthesis Example 5 (Compound 346)

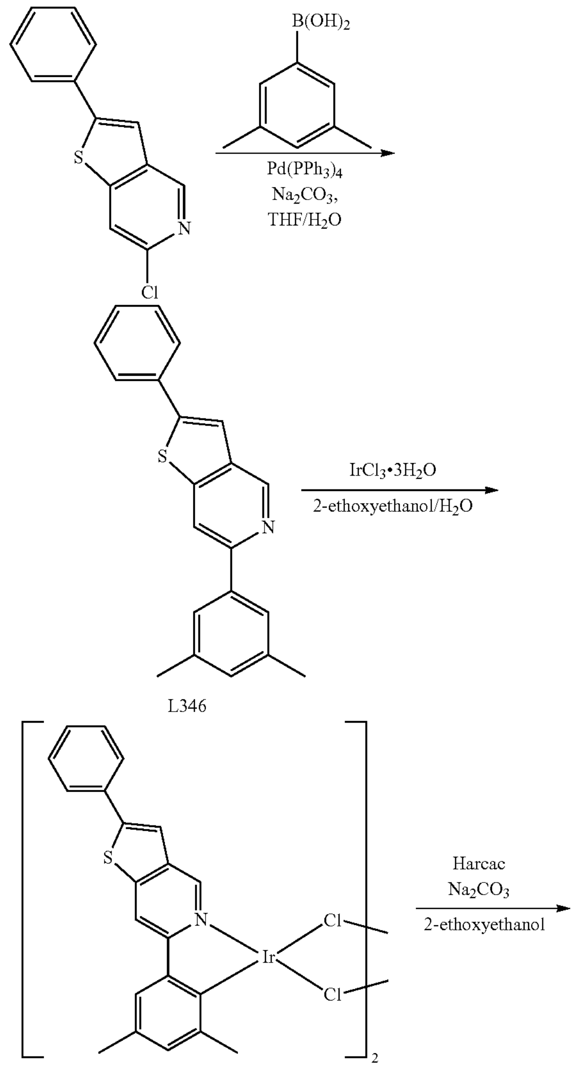

L346

L346-dimer

-continued

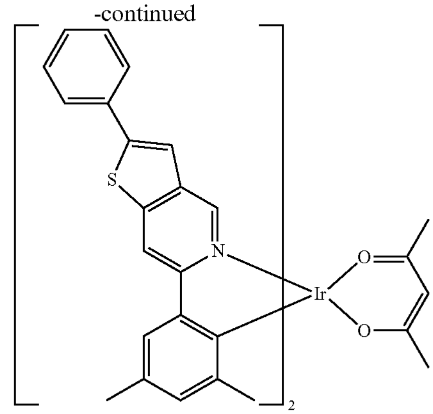

346

Synthesis of Intermediate L346

Intermediate L346 (2.67 g, 87%) was obtained in the same manner as in Synthesis of Intermediate L16 of Synthesis Example 2, except that 6-chloro-2-phenylthieno[3,2-c]pyridine (2.34 g, 9.51 mmol) was used instead of 5-chloro-2-phenylfuro[2,3-c]pyridine (2.69 g, 11.71 mmol).

LC-MS m/z=316 $(M+H)^+$.

Synthesis of Intermediate L346-dimer

Intermediate L346-dimer (2.25 g, 80%) was obtained in the same manner as in Synthesis of Intermediate L16-dimer of Synthesis Example 2, except that Intermediate L346 (2.32 g, 7.36 mmol) was used instead of Intermediate L16.

Synthesis of Compound 346

Compound 346 (0.526 g, 23%) was obtained in the same manner as in Synthesis of Compound 16 of Synthesis Example 2, except that Intermediate L346-dimer (2.14 g, 1.25 mmol) was used instead of Intermediate L16-dimer. The obtained compound was identified by MS and HPLC analysis.

HRMS (MALDI-TOF) calcd for $C_{47}H_{39}IrN_2O_2$ $S_2$: m/z 920.2082, Found: 920.2081.

Synthesis Example 6 (Compound 468)

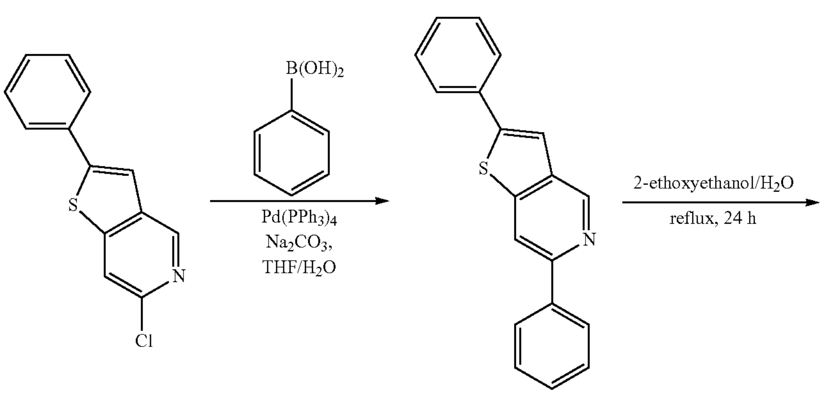

L468

-continued

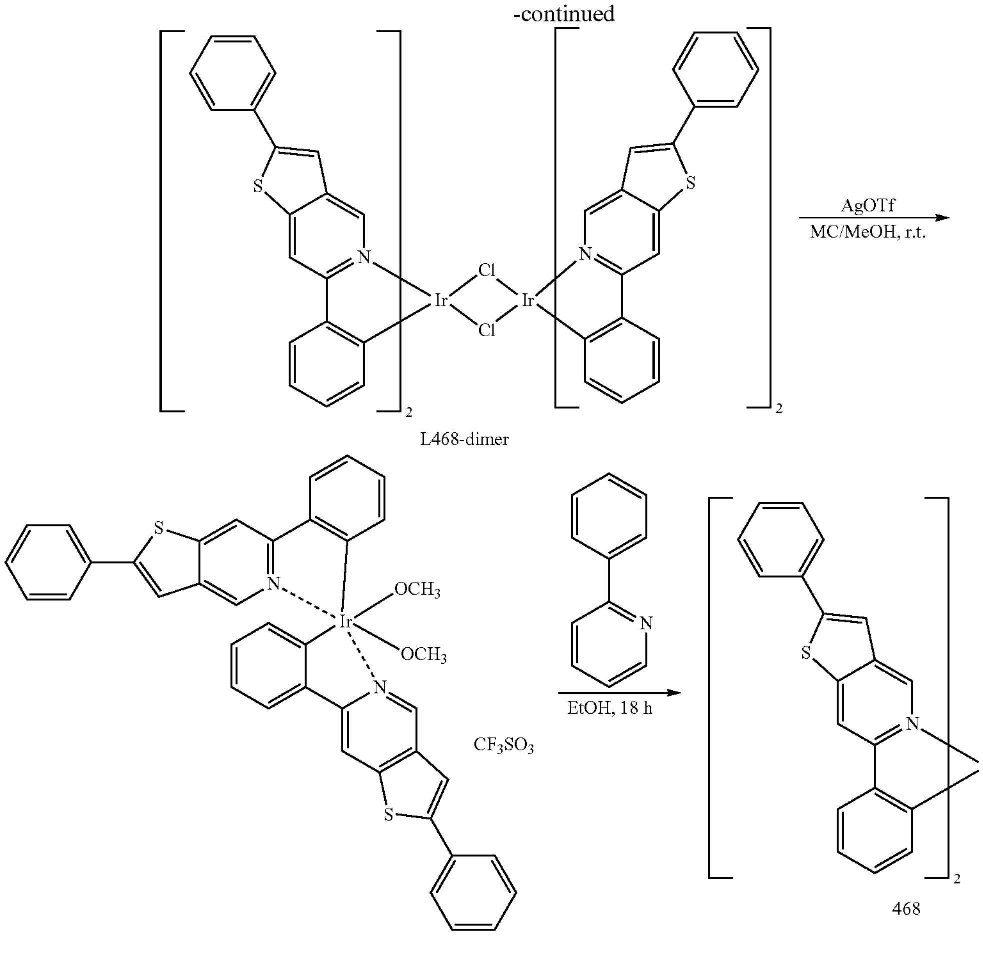

L468-dimer

L468-dimer-OTf

468

Synthesis of Intermediate L468

Intermediate L468 (3.02 g, 74%) was obtained in the same manner as in Synthesis of Intermediate L1 of Synthesis Example 1, except that 6-chloro-2-phenylthieno[3,2-c]pyridine (3.51 g, 14.3 mmol) was used instead of 5-chloro-2-phenylfuro[2,3-c]pyridine (2.69 g, 11.71 mmol).

Synthesis of Intermediate L468-dimer

Intermediate L468-dimer (2.11 g, 96%) was obtained in the same manner as in Synthesis of Intermediate L1-dimer of Synthesis Example 1, except that Intermediate L468 (1.78 g, 6.19 mmol) was used instead of Intermediate L1.

Synthesis of Intermediate L468-dimer-OTf 60 mL of methylene chloride (MC) was mixed with Intermediate L468-dimer (1.97 g, 1.23 mmol), and AgOTf (0.631 g, 2.46 mmol) was dissolved in 20 mL of methanol and added thereto. Then, the reaction proceeded with stirring at room temperature for 18 hours in a state in which light was blocked by an aluminum foil. The reaction mixture was filtered through celite, and a filtrate was concentrated under vacuum to obtain Intermediate L468-dimer-OTf. Intermediate L468-dimer-OTf was used in a next reaction without additional purification.

Synthesis of Compound 468

Intermediate L468-dimer-OTf (2.23 g, 2.28 mmol) and 2-phenylpyridine (0.39 g, 2.51 mmol) were mixed with 100 mL of ethanol, stirred for 18 hours under reflux, and then cooled. A mixture obtained therefrom was filtered to obtain a solid. The solid was sufficiently washed with ethanol and hexane, and column chromatography using MC:hexane=40:60 (V/V) as an eluent was performed thereon to obtain Compound 468 (0.32 g, 19%). The obtained compound was identified by MS and HPLC analysis.

HRMS (MALDI-TOF) calcd for $C_{49}H_{32}IrN_3S_2$: m/z 919.1667, Found: 919.1666.

Synthesis Example 7 (Compound 469)

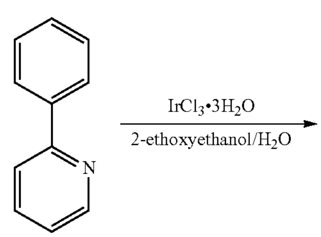

-continued

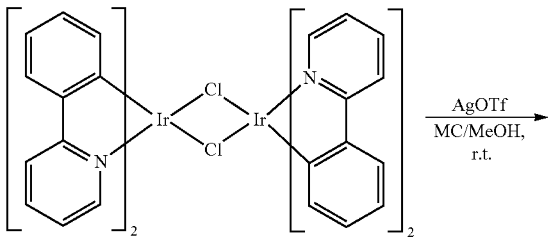

469(1)

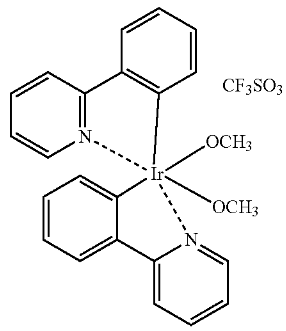

469(2)

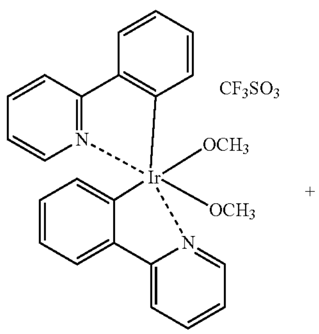

469(2)

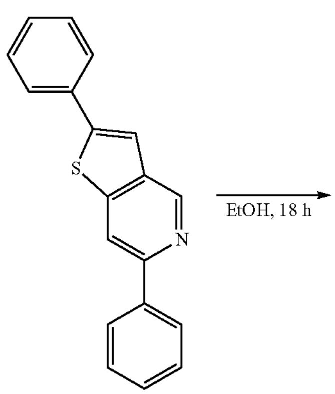

L468

-continued

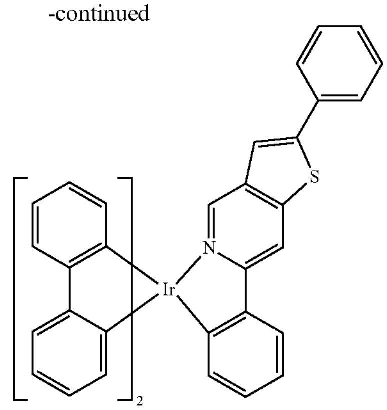

469

Synthesis of Intermediate 469(1)

2-phenylpyridine (14.66 g, 94.44 mmol) and Iridium chloride (14.80 g, 41.97 mmol) were mixed with 210 mL of 2-ethoxy ethanol and 70 mL of distilled water, stirred for 24 hours under reflux, and then cooled to room temperature. A solid obtained therefrom was filtered, and sufficiently washed in the order of water/methanol/hexane. The solid was dried in a vacuum oven to obtain Intermediate 469(1) (19.5 g, 87%).

Synthesis of Intermediate 469(2)

60 mL of MC was mixed with Intermediate 469(1) (1.88 g, 1.75 mmol), and AgOTf (0.90 g, 3.50 mmol) was dissolved in 20 mL of methanol and added thereto. Then, the reaction proceeded while stirring at room temperature for 18 hours in a state in which light was blocked by an aluminum foil. The reaction mixture was filtered through celite, and a filtrate was concentrated under vacuum to obtain Intermediate L469(2). Intermediate L469(2) was used in a next reaction without additional purification.

Synthesis of Compound 469

Intermediate 469(2) (1.27 g, 1.78 mmol) and Intermediate L468 (0.562 g, 1.96 mmol) were mixed with 40 mL of ethanol, stirred for 18 hours under reflux, and then cooled.

A mixture obtained therefrom was filtered to obtain a solid. The solid was sufficiently washed with ethanol and hexane, and column chromatography using MC:hexane=40:60 (V/V) as an eluent was performed thereon to obtain Compound 469 (0.31 g, 22%). The obtained compound was identified by MS and HPLC analysis.

HRMS (MALDI-TOF) calcd for $C_{41}H_{28}IrN_3S$: m/z 787.1633, Found: 787.1633.

Evaluation Example 1: Evaluation of Radiative Decay Rate

CBP and Compound 1 were co-deposited at a weight ratio of 9:1 under a vacuum pressure of 10-7 torr to manufacture a film having a thickness of 40 nm.

A PL spectrum of the film was evaluated at room temperature by using a PicoQuant TRPL measurement system FluoTime 300 and a PicoQuant pumping source PLS340 (excitation wavelength=340 nm, spectral width=20 nm), a wavelength of a main peak of the spectrum was determined, and PLS340 repeatedly measured the number of photons emitted from the film at the wavelength of the main peak due to a photon pulse (pulse width=500 ps) applied to the film according to time based on time-correlated single photon counting (TCSPC), thereby obtaining a sufficiently fittable TRPL curve. A decay time $T_{decay}$ of the film was obtained by fitting one or more exponential decay functions to the result obtained therefrom. The function used for fitting is expressed by Equation 10, and the greatest value among the values obtained from each exponential decay function used for fitting was taken as $T_{decay}$. At this time, a baseline or background signal curve was obtained by repeating the same measurement once more for the same measurement time as the measurement time for obtaining the TRPL curve in a dark state (a state in which a pumping signal applied to the predetermined film was blocked), and the baseline or background signal curve was used for fitting as a baseline.

$$f(t)=\sum_{i=1}^{n} A_i \exp(-t/T_{decay,i}) \quad \text{Equation 10}$$

Then, the quantum efficiency of the film was measured by using a Hamamatsu Quantaurus-QY Absolute PL quantum yield spectrometer (provided with a xenon light source, a monochromator, a photonic multichannel analyzer, and an integrating sphere and using PLQY measurement software (Hamamatsu Photonics, Ltd., Shizuoka, Japan)). Upon measurement of the quantum efficiency, the excitation wavelength was measured while scanning from 320 nm to 380 nm at an interval of 10 nm, and the greatest value was taken as the quantum efficiency (ϕ).

The radiative decay rate ($k_r$) of Compound 1 was obtained by substituting $T_{decay}$ and ϕ into Equation 11, and results thereof are shown in Table 2.

$$k_r=\phi/T_{decay} \quad \text{Equation 11}$$

The measurement of the radiative decay rate was repeated on Compounds 16, 31, 236, 346, 468, 469, A1, A2, B, C1, C2, and D, and results thereof are shown in Table 2.

TABLE 2

| Compound No. | Radiative decay rate ($s^{-1}$) |
|---|---|
| 1 | $6.70 \times 10^5$ |
| 16 | $8.94 \times 10^5$ |
| 31 | $8.26 \times 10^5$ |
| 236 | $1.36 \times 10^6$ |
| 346 | $1.17 \times 10^6$ |
| 468 | $6.46 \times 10^5$ |
| 469 | $5.56 \times 10^5$ |
| A1 | $3.17 \times 10^5$ |
| A2 | $3.32 \times 10^5$ |
| B | $4.62 \times 10^5$ |
| C1 | $1.27 \times 10^5$ |
| C2 | $2.93 \times 10^5$ |
| D | $3.25 \times 10^5$ |

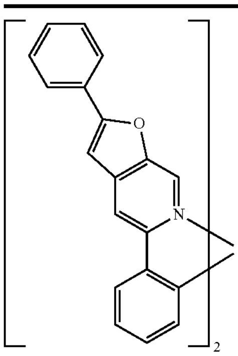

1

TABLE 2-continued

| Compound No. | Radiative decay rate ($s^{-1}$) |
|---|---|

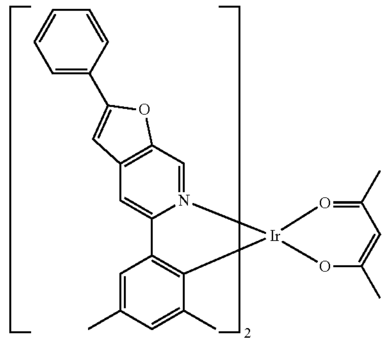

16

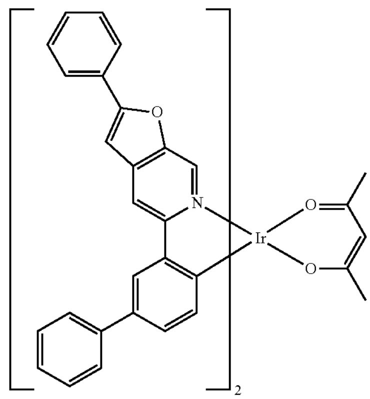

31

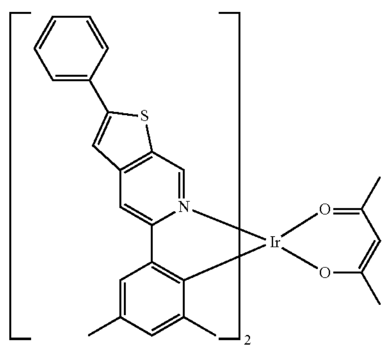

236

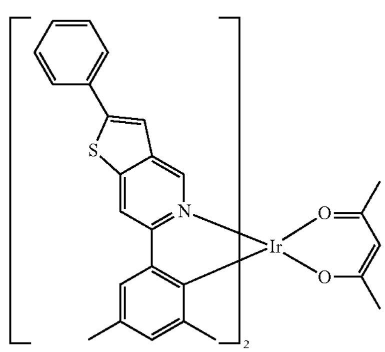

346

TABLE 2-continued

| Compound No. | Radiative decay rate ($s^{-1}$) |
|---|---|
| 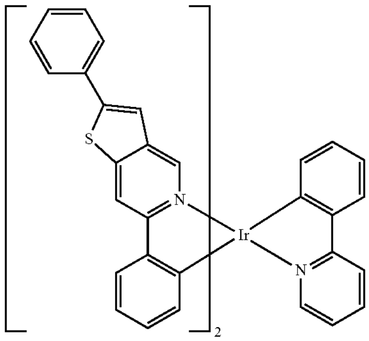 468 | |
| 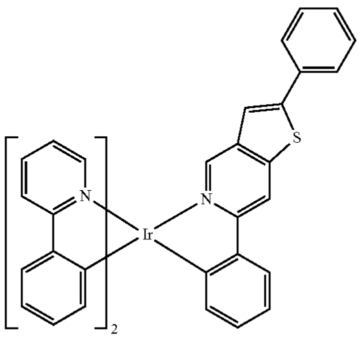 469 | |
| 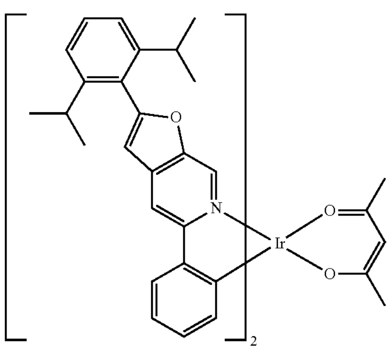 A1 | |
| 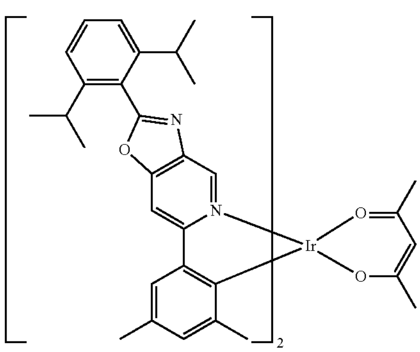 A2 | |
| 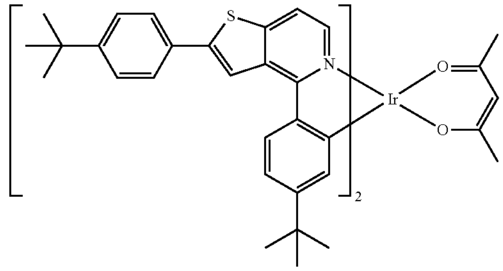 B | |
| 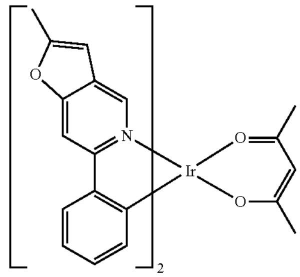 C1 | |
| 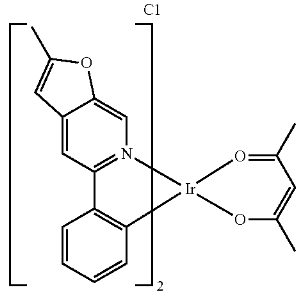 C2 | |
| 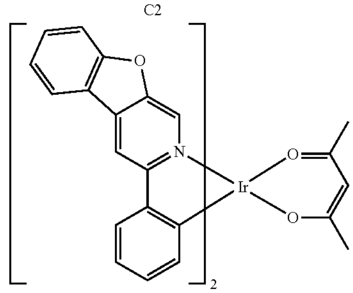 D | |

From Table 2, it is confirmed that Compounds 1, 16, 31, 236, 346, 468, and 469 have high radiative decay rates, as compared with those of Compounds A1, A2, B, C1, C2, and D.

Example 1

As an anode, a glass substrate, on which ITO/Ag/ITO were deposited to thicknesses of 70 Å/1,000 Å/70 Å, was cut to a size of 50 mm×50 mm×0.5 mm, sonicated with isopropyl alcohol and pure water each for 5 minutes, and then cleaned by exposure to ultraviolet rays and ozone for 30 minutes. Then, the glass substrate was provided to a vacuum deposition apparatus.

2-TNATA was vacuum-deposited on the anode to form a hole injection layer having a thickness of 600 Å, and 4,4'-bis[N-(1-naphthyl)-N-phenylamino]biphenyl (NPB)

was vacuum-deposited on the hole injection layer to form a hole transport layer having a thickness of 1,350 Å.

Then, CBP (host) and Compound 1 (dopant) were co-deposited on the hole transport layer at a weight ratio of 98:2 to form an emission layer having a thickness of 400 Å.

Then, BCP was vacuum-deposited on the emission layer to form a hole blocking layer having a thickness of 50 Å, Alq3 was vacuum-deposited on the hole blocking layer to form an electron transport layer having a thickness of 350 Å, LiF was vacuum-deposited on the electron transport layer to form an electron injection layer having a thickness of 10 Å, and Mg and Ag were co-deposited on the electron injection layer at a weight ratio of 90:10 to form a cathode having a thickness of 120 Å, thereby completing the manufacture of an organic light-emitting device (which emits red light).

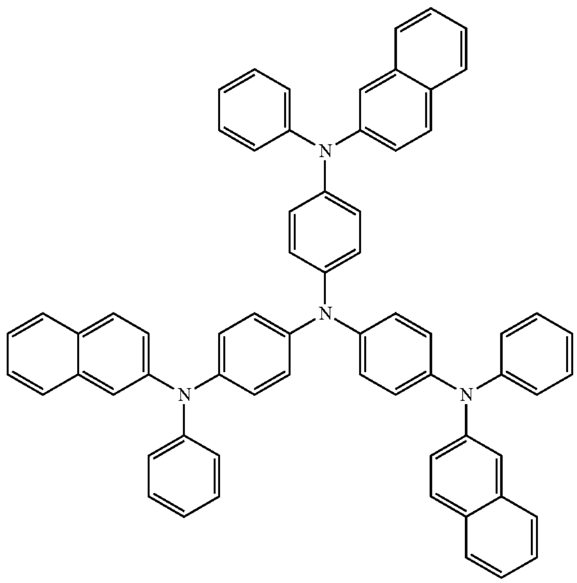

2-TNATA

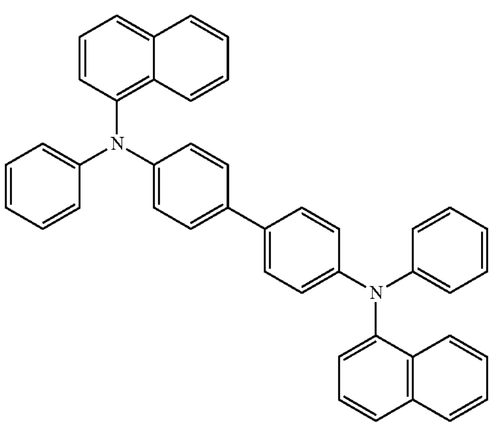

NPB

-continued

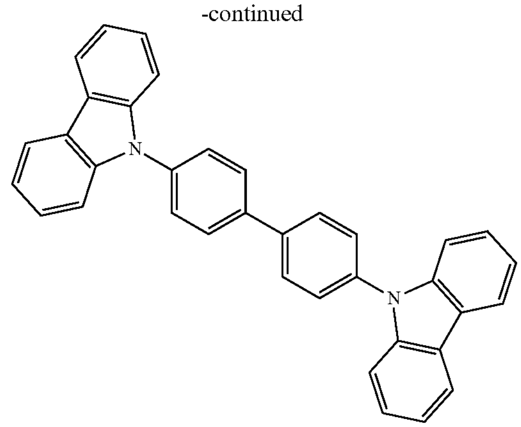

CBP

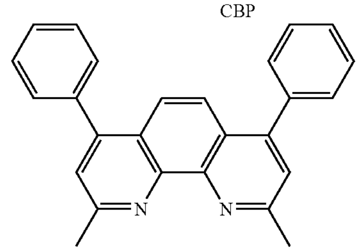

BCP

Examples 2 to 7 and Comparative Examples A1, A2, B, C1, C2, and D

Organic light-emitting devices were manufactured in the same manner as in Example 1, except that Compounds shown in Table 3 were each used instead of Compound 1 as a dopant informing an emission layer.

Evaluation Example 2: Evaluation of Characteristics of Organic Light-Emitting Devices The driving voltage, maximum value of external quantum efficiency (Max EQE), roll-off ratio, maximum emission wavelength of main peak of EL spectrum, and lifespan ($T_{97}$) of the organic light-emitting devices manufactured according to Examples 1 to 7 and Comparative Examples A1, A2, B, C1, C2, and D were evaluated, and results thereof are shown in Table 3. A current-voltage meter (Keithley 2400) and a luminance meter (Minolta Cs-1000A) were used as the evaluation devices, and the lifespan ($T_{97}$) (at 3,500 nit) indicates an amount of time that lapsed when luminance was 97% of initial luminance (100%). The roll-off ratio was calculated by Equation 20:

Roll off ratio={1−(efficiency(at 3,500 nit)/maximum luminescence efficiency)}×100% Equation 20

TABLE 3

| | Compound No. of dopant in emission layer | Driving voltage (V) | Max EQE (%) | Roll-Off ratio (%) | Maximum emission wave-length (nm) | $LT_{97}$ (hr) (at 3,500 nit) |
|---|---|---|---|---|---|---|
| Example 1 | 1 | 4.0 | 28.4 | 8 | 524 | 273 |
| Example 2 | 16 | 3.7 | 30.1 | 9 | 558 | 205 |
| Example 3 | 31 | 3.8 | 26.6 | 6 | 533 | 155 |
| Example 4 | 236 | 3.5 | 31.9 | 7 | 582 | 320 |

TABLE 3-continued

| | Compound No. of dopant in emission layer | Driving voltage (V) | Max EQE (%) | Roll-Off ratio (%) | Maximum emission wave-length (nm) | $LT_{97}$ (hr) (at 3,500 nit) |
|---|---|---|---|---|---|---|
| Example 5 | 346 | 3.7 | 31.7 | 10 | 565 | 232 |
| Example 6 | 468 | 3.6 | 28.4 | 9 | 540 | 253 |
| Example 7 | 469 | 4.0 | 26.8 | 8 | 538 | 212 |
| Comparative Example A1 | A1 | 5.2 | 24.8 | 13 | 530 | 120 |
| Comparative Example A2 | A2 | 4.8 | 24.0 | 11 | 540 | 65 |
| Comparative Example B | B | 4.3 | 26.0 | 12 | 580 | 60 |
| Comparative Example Cl | C1 | 4.8 | 21.8 | 12 | 515 | 108 |
| Comparative Example C2 | C2 | 5.4 | 22.9 | 15 | 510 | 34 |
| Comparative Example D | D | 4.6 | 22.0 | 12 | 552 | 33 |

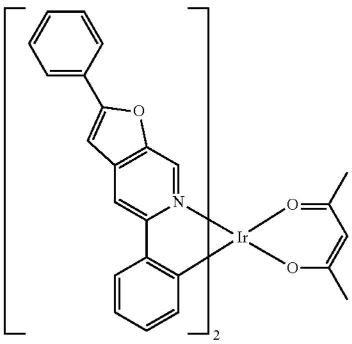

1

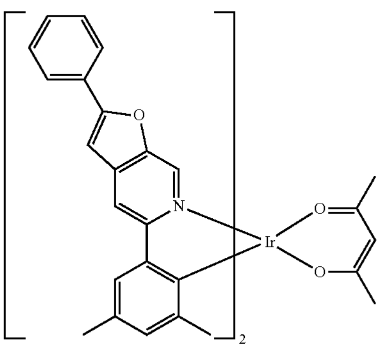

16

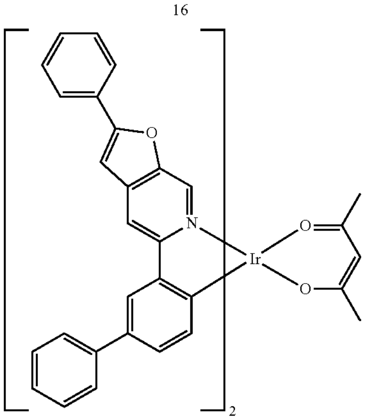

31

TABLE 3-continued

| | Compound No. of dopant in emission layer | Driving voltage (V) | Max EQE (%) | Roll-Off ratio (%) | Maximum emission wave-length (nm) | $LT_{97}$ (hr) (at 3,500 nit) |
|---|---|---|---|---|---|---|

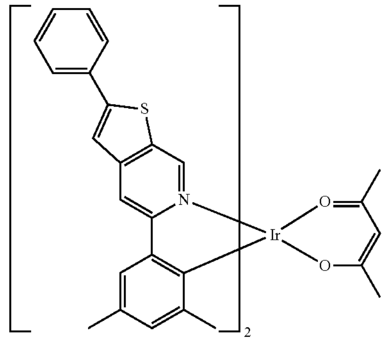

236

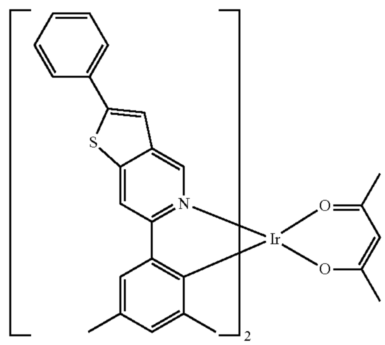

346

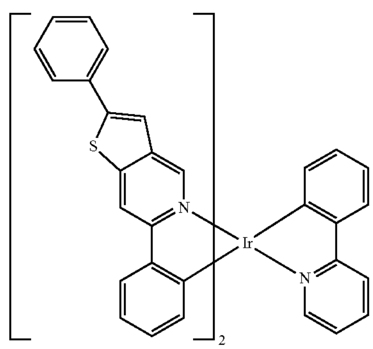

468

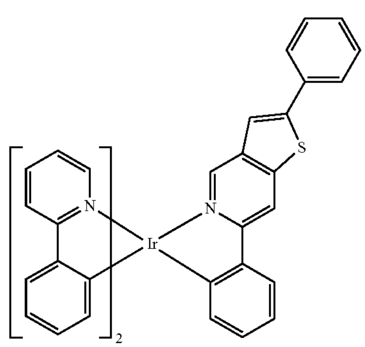

469

TABLE 3-continued

| Compound No. of dopant in emission layer | Driving voltage (V) | Max EQE (%) | Roll-Off ratio (%) | Maximum emission wave-length (nm) | $LT_{97}$ (hr) (at 3,500 nit) |
|---|---|---|---|---|---|

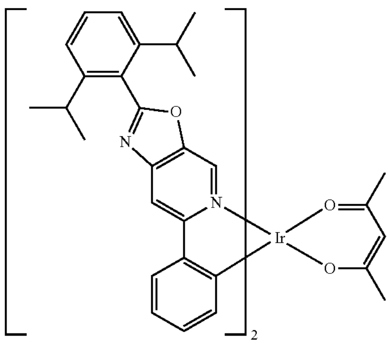

A1

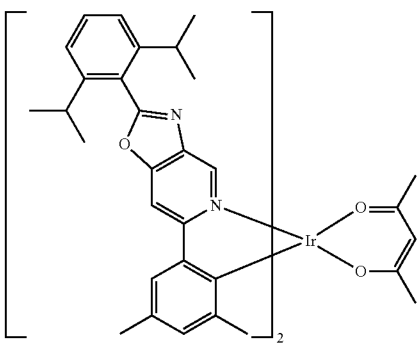

A2

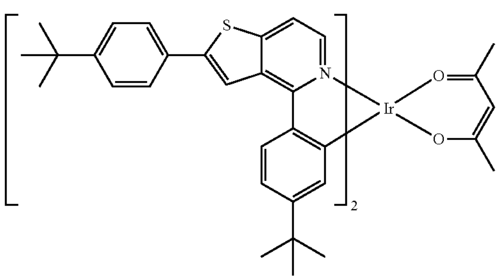

B

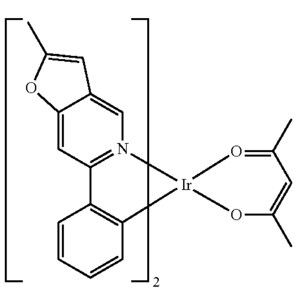

C1

TABLE 3-continued

| Compound No. of dopant in emission layer | Driving voltage (V) | Max EQE (%) | Roll-Off ratio (%) | Maximum emission wave-length (nm) | $LT_{97}$ (hr) (at 3,500 nit) |
|---|---|---|---|---|---|

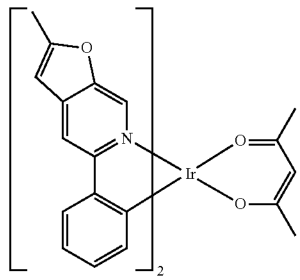

C2

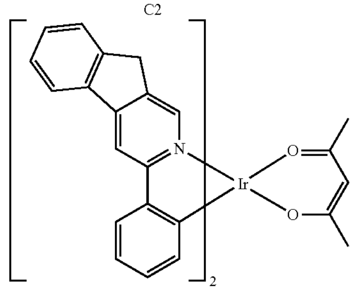

D

From Table 3, it is confirmed that the organic light-emitting devices of Examples 1 to 7 emit red light and have improved driving voltage, improved external quantum efficiency, improved roll-off ratio, and improved lifespan characteristics, as compared with those of the organic light-emitting devices of Comparative Examples A1, A2, B, C1, C2, and D.

Since the organometallic compound represented by Formula 1 has a high radiative decay rate, an electronic device, for example, an organic light-emitting device, which includes the organometallic compound represented by Formula 1, may have improved driving voltage, improved external quantum luminescence efficiency, improved roll-off ratio, and improved lifespan characteristics. In addition, since the organometallic compound represented by Formula 1 has excellent phosphorescent luminescent characteristics, a diagnostic composition having high diagnostic efficiency may be provided by using the organometallic compound.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the FIGURES, it will be understood by those of ordinary skill in the art that various changes in form and details may be made therein without departing from the spirit and scope as defined by the following claims.

What is claimed is:

1. An organometallic compound represented by Formula 1:

$$M(L_1)n_1(L_2)n_2, \quad \text{Formula 1}$$

wherein, in Formula 1,

M is a transition metal, $L_1$ is a ligand represented by Formula 2, n1 is 1, 2, or 3, wherein, when n1 is 2 or more, two or more $L_1$ are identical to or different from each other, $L_2$ is a monodentate ligand, a bidentate ligand, a tridentate ligand, or a tetradentate ligand, n2 is 0, 1, 2, 3, or 4, wherein, when n2 is 2 or more, two or more $L_2$ are identical to or different from each other, and $L_1$ and $L_2$ are different from each other:

Formula 2

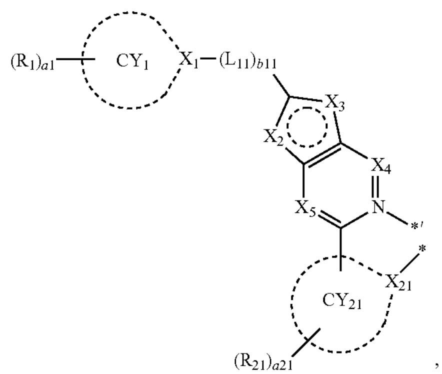

wherein, in Formula 2, $X_1$ is C, N, Si, or P, $X_{21}$ is C, ring $CY_1$ and ring $CY_{21}$ are each independently a $C_5$-$C_{30}$ carbocyclic group or a $C_2$-$C_{30}$ heterocyclic group, i) $X_2$ is O, S, or Se, and $X_3$ is $C(R_2)$; or ii) $X_2$ is $C(R_2)$, and $X_3$ is O, S, or Se, $X_4$ is $C(R_4)$, $X_5$ is $C(R_5)$, $R_1$, $R_2$, $R_4$, $R_5$, and $R_{21}$ are each independently hydrogen, deuterium, —F, —Cl, —Br, —I, —$SF_5$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, —$P(=O)(Q_8)(Q_9)$ or —$P(Q_5)(Q_9)$, a1 and a21 are each independently an integer from 0 to 20, ring $CY_1$ and $R_2$ are not linked to each other, and $R_1$ and $R_2$ are not linked to each other, $L_{11}$ is a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$, b11 is 0, wherein, when b11 is 0, a group represented by *-$(L_{11})_{b11}$-*' is a single bond, two of a plurality of neighboring $R_{21}$ are optionally linked to form a $C_5$-$C_{30}$ carbocyclic group that is unsubstituted or substituted with at least one $R_{10a}$ or a $C_2$-$C_{30}$ heterocyclic group that is unsubstituted or substituted with at least one $R_{10a}$, $R_{10a}$ is the same as defined in connection with $R_{21}$,

* and *' each indicate a binding site to M in Formula 1, a substituent of the substituted $C_5$-$C_{30}$ carbocyclic group, the substituted $C_2$-$C_{30}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropoly cyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof;

—$N(Q_{31})(Q_{32})$, —$Si(Q_{33})(Q_{34})(Q_{35})$, —$B(Q_{36})(Q_{37})$, or —$P(=O)(Q_{38})(Q_{39})$; or any combination thereof, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryl group substituted with a $C_1$-$C_{60}$ alkyl group, a $C_6$-$C_{60}$ aryl group, or any combination thereof, a $C_6$-$C_{60}$ aryloxy group, a $C_6$-$C_{60}$ arylthio group, a $C_1$-$C_{60}$ heteroaryl group, a monovalent non-aromatic condensed polycyclic group, or a monovalent non-aromatic condensed heteropolycyclic group.

2. The organometallic compound of claim 1, wherein

M is Ir, and the sum of n1 and n2 is 3; or

M is Os, and the sum of n1 and n2 is 4; or

M is Pt, and the sum of n1 and n2 is 2.

3. The organometallic compound of claim 1, wherein, ring $CY_1$ and ring $CY_{21}$ are each independently a cyclopentene group, a cyclohexene group, a benzene group, a naphthalene group, an anthracene group, a phenanthrene group, a triphenylene group, a pyrene group, a chrysene group, a cyclopentadiene group, a 1,2,3,4-tetrahydronaphthalene group, a thiophene group, a furan group, an indole group, a benzoborole group, a benzophosphole group, an indene group, a benzosilole group, a benzogermole group, a benzothiophene group, a benzoselenophene group, a benzofuran group, a carbazole group, a dibenzoborole group, a dibenzophosphole group, a fluorene group, a dibenzosilole group, a dibenzogermole group, a dibenzothiophene group, a dibenzoselenophene group, a dibenzofuran group, a dibenzothiophene 5-oxide group, a 9H-fluorene-9-one group, a dibenzothiophene 5,5-dioxide group, an azaindole group, an azabenzoborole group, an azabenzophosphole group, an azaindene group, an azabenzosilole group, an azabenzogermole group, an azabenzothiophene group, an azabenzoselenophene group, an azabenzofuran group, an azacarbazole group, an azadibenzoborole group, an azadibenzophosphole group, an azafluorene group, an azadibenzosilole group, an azadibenzogermole group, an azadibenzothiophene group, an azadibenzoselenophene group, an azadibenzofuran group, an azadibenzothiophene 5-oxide group, an aza-9H-fluorene-9-one group, an azadibenzothiophene 5,5-dioxide group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, an oxazole group, an isoxazole group, a thiazole group, an isothiazole group, an oxadiazole group, a thiadiazole group, a benzopyrazole group, a benzimidazole group, a benzoxazole group, a benzothiazole group, a benzoxadiazole group, a benzothiadiazole group, a 5,6,7,8-tetrahydroisoquinoline group, or a 5,6,7,8-tetrahydroquinoline group.

4. The organometallic compound of claim 1, wherein $R_1$, $R_2$, $R_4$, $R_5$, $R_{21}$, and $R_{10a}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a pyridinyl group, a pyrimidinyl group, or any combination thereof;

a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cycloctyl group, an adamantyl group, a norbornenyl group, a cyclopentenyl group, a cyclohexenyl group, a cycloheptenyl group, a cyclooctenyl group, a bicyclo[1.1.1]pentyl group, a bicyclo[2.1.1]hexyl group, a bicyclo[2.2.1]heptyl group, a bicyclo[2.2.2]octyl group, a phenyl group, a biphenyl group, a terphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, $—Si(Q_{33})(Q_{34})(Q_{35})$, or any combination thereof; or $N(Q_1)(Q_2)$, $—Si(Q_3)(Q_4)(Q_5)$, $—B(Q_6)(Q_7)$, $—P(=O)(Q_8)(Q_9)$, or $—P(Q_8)(Q_9)$, and $Q_1$ to $Q_9$ and $Q_{33}$ to $Q_{35}$ are each independently:

$—CH_3$, $—CD_3$, $—CD_2H$, $—CDH_2$, $—CH_2CH_3$, $—CH_2CD_3$, $—CH_2CD_2H$, $—CH_2CDH_2$, $—CHDCH_3$, $—CHDCD_2H$, $—CHDCDH_2$, $—CHDCD_3$, $—CD_2CD_3$, $—CD_2CD_2H$, or $—CD_2CDH_2$; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each unsubstituted or substituted with deuterium, a $C_1$-$C_{10}$ alkyl group, a phenyl group, or any combination thereof.

5. The organometallic compound of claim 1, wherein a group represented by

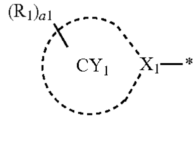

in Formula 2 is a $C_3$-$C_{10}$ cycloalkenyl group, a $C_2$-$C_{10}$ heterocycloalkenyl group, a $C_6$-$C_{30}$ aryl group, a $C_2$-$C_{30}$ heteroaryl group, a monovalent non-aromatic condensed polycyclic group, or a monovalent non-aromatic condensed heteropoly cyclic group, each unsubstituted or substituted with $R_1$ in the number of a1, in Formula 2, $R_1$ and $R_2$ are each independently:

hydrogen, deuterium, —F, —Cl, —Br, —I, a cyano group, or $—SF_5$; or a $C_1$-$C_{60}$ alkyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, or $C_2$-$C_{10}$ heterocycloalkenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a cyano group, a $C_1$-$C_{20}$ alkyl group, a cyclopentyl group, a cyclohexyl group, a cycloheptyl group, a cycloctyl group, an adamantyl group, a norbornyl group, a norbornenyl group, a cyclopentenyl group, a cyclohexenyl group, a cycloheptenyl group, a phenyl group, a biphenyl group, a naphthyl group, a pyridinyl group, a pyrimidinyl group, or any combination thereof, and a1 is an integer from 0 to 10.

6. The organometallic compound of claim 1, wherein a group represented by

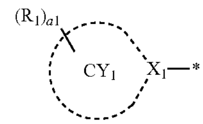

in Formula 2 is a phenyl group, a biphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each unsubstituted or substituted with $R_1$ in the number of a1, in Formula 2, $R_1$ and $R_2$ are each independently:

hydrogen, deuterium, —F, —Cl, —Br, —I, a cyano group, or $—SF_5$; or a methyl group, an ethyl group, a propyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonanyl group, an isononanyl group, a sec-nonanyl group, a tert-nonanyl group, an n-decanyl group, an isodecanyl group, a sec-decanyl group, a tert-decanyl group, a $C_1$-$C_{10}$ alkoxy, a cyclopentyl group, a cyclohexyl group, a cycloheptyl group, a cycloctyl group, an adamantyl group, a norbornyl group, a norbomenyl group, a cyclopentenyl group, a cyclohexenyl group, or a cycloheptenyl group, each unsubstituted or substituted with deuterium, —F, —Cl, —Br, —I, $—CD_3$, $—CD_2H$, $—CDH_2$, $—CF_3$, $—CF_2H$, $—CFH_2$, a cyano group, a $C_1$-$C_{20}$ alkyl group, a cyclopentyl group, a cyclohexyl group, a cycloheptyl group, a cycloctyl group, an adamantyl group, a norbornyl group, a norbomenyl group, a cyclopentenyl group, a cyclohexenyl group, a cycloheptenyl group, a phenyl group, a biphenyl group, a naphthyl group, a pyridinyl group, a pyrimidinyl group, or any combination thereof, and a1 is an integer from 0 to 5.

7. The organometallic compound of claim 1, wherein a group represented by

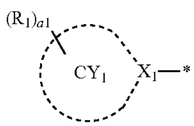

is a group represented by one of Formulae 10-13(1) to 10-13(18) and 10-13:

10-13(1)

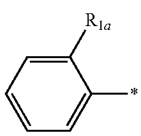

10-13(2)

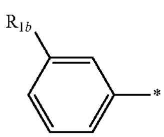

10-13(3)

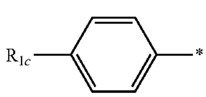

10-13(4)

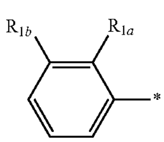

10-13(5)

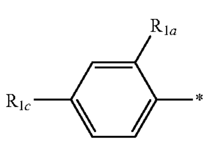

10-13(6)

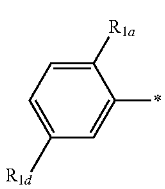

-continued 10-13(7)

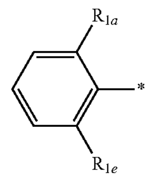

10-13(8)

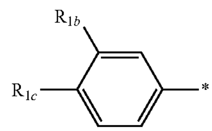

10-13(9)

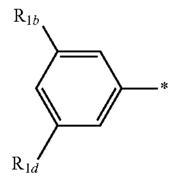

10-13(10)

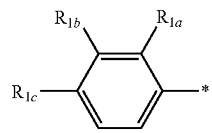

10-13(11)

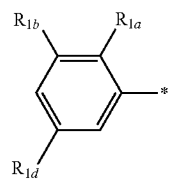

10-13(12)

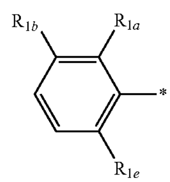

10-13(13)

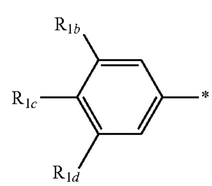

10-13(14)

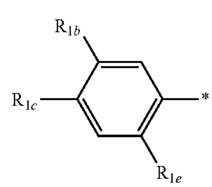

10-13(15)

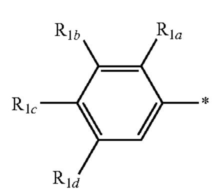

-continued 10-13(16)

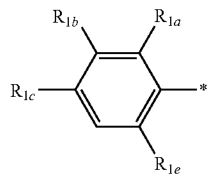

19-13(17)

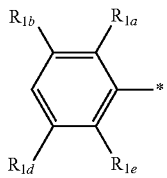

10-13(18)

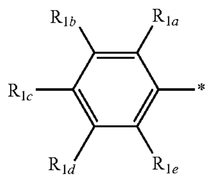

10-13

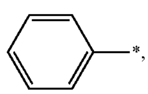

wherein, in Formulae 10-13(1) to 10-13(18) and 10-13, $R_{1a}$ to $R_{1e}$ are each independently the same as defined in connection with $R_1$ in claim 1, wherein $R_{1a}$ to $R_{1e}$ are each not hydrogen, and * indicates a binding site to a neighboring atom.

8. The organometallic compound of claim 1, wherein a group represented by

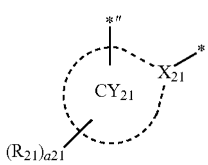

in Formula 2 is a group represented by one of Formulae CY21-1 to CY21-25:

CY21-1

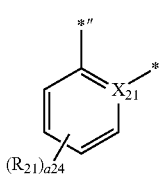

CY21-2

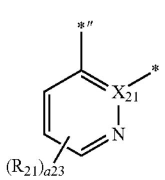

-continued

CY21-3

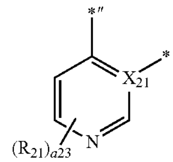

CY21-4

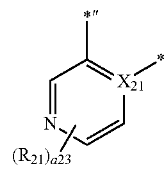

CY21-5

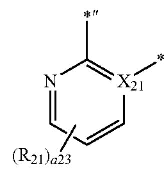

CY21-6

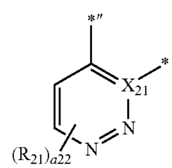

CY21-7

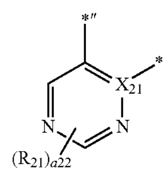

CY21-8

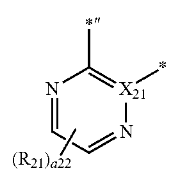

CY21-9

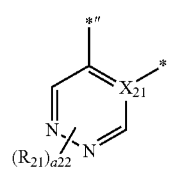

CY21-10

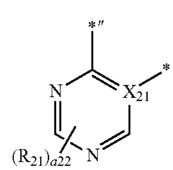

CY21-11

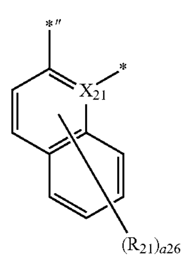

-continued
CY21-12
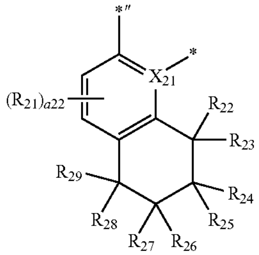
CY21-13
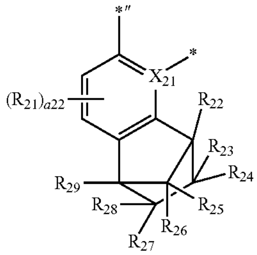
CY21-14
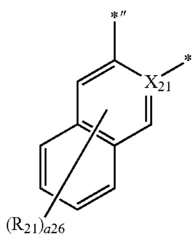
CY21-15
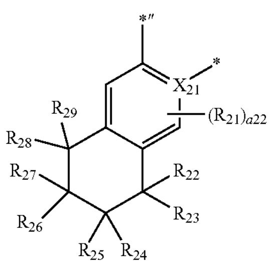
CY21-16
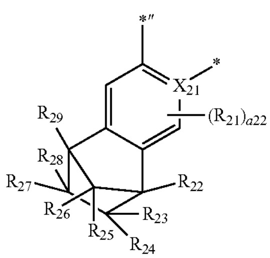
CY21-17
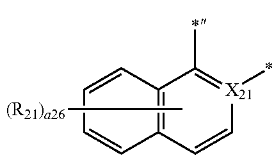
CY21-18
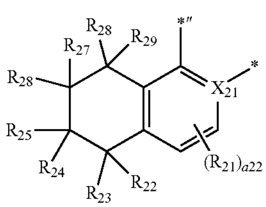
-continued
CY21-19
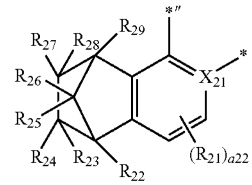
CY21-20
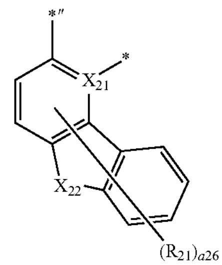
CY21-21
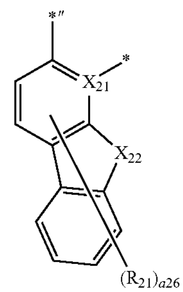
CY21-22
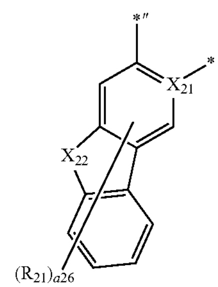
CY21-23
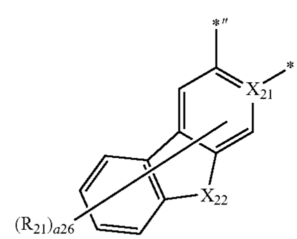
CY21-24
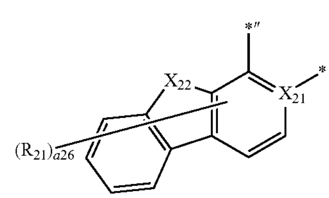

-continued

CY21-25

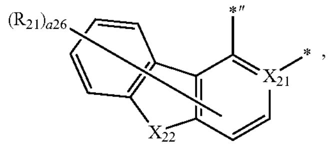

wherein, in Formulae CY21-1 to CY21-25, $X_{21}$ and $R_{21}$ are each independently the same as described in claim 1, $X_{22}$ is $C(R_{22})(R_{23})$, $N(R_{22})$, O, S, or $Si(R_{22})(R_{23})$, $R_{22}$ to $R_{29}$ are each independently the same as defined in connection with $R_{21}$ in claim 1, a26 is an integer from 0 to 6, a24 is an integer from 0 to 4, a23 is an integer from 0 to 3, a22 is an integer from 0 to 2,

*" indicates a binding site to a carbon atom of a neighboring 6-membered ring in Formula 2, and

* indicates a binding site to M in Formula 1.

9. The organometallic compound of claim 8, wherein a group represented by

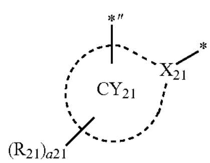

in Formula 2 is a group represented by one of Formulae CY21(1) to CY21(56) or a group represented by one of Formulae CY21-20 to CY21-25:

CY21(1)

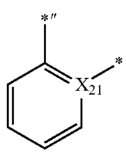

CY21(2)

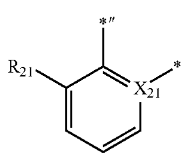

CY21(3)

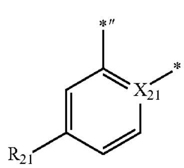

CY21(4)

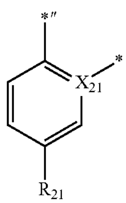

-continued

CY21(5)

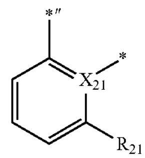

CY21(6)

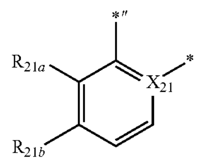

CY21(7)

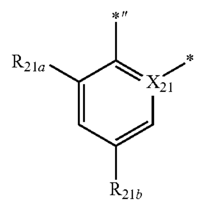

CY21(8)

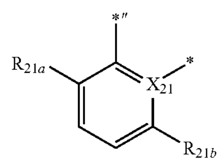

CY21(9)

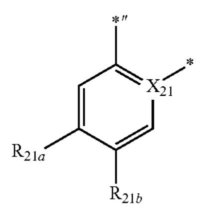

CY21(10)

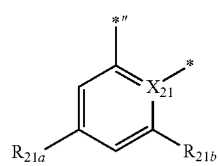

CY21(11)

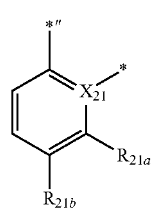

CY21(12)

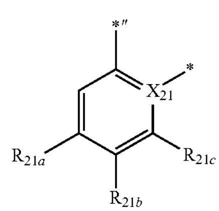

CY21(13)
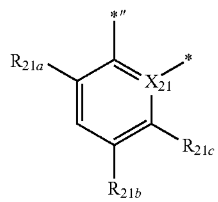
CY21(14)
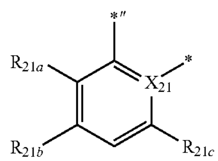
CY21(15)
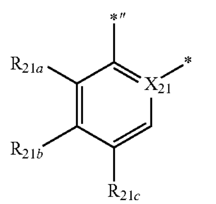
CY21(16)
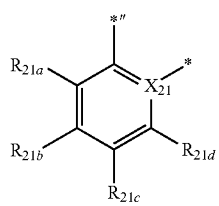
CY21(17)
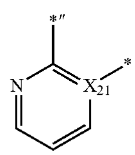
CY21(18)
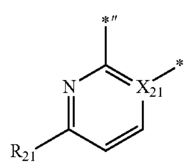
CY21(19)
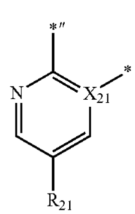
CY21(20)
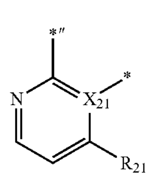
CY21(21)
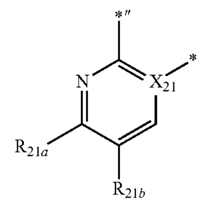
CY21(22)
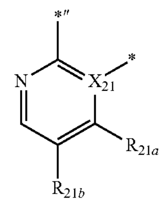
CY21(23)
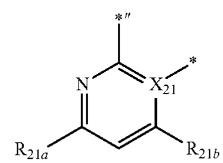
CY21(24)
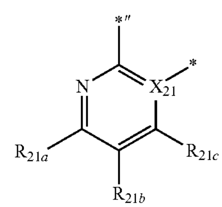
CY21(25)
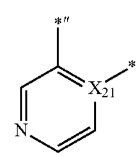
CY21(26)
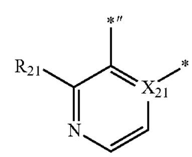
CY21(27)
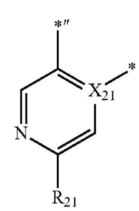
CY21(28)
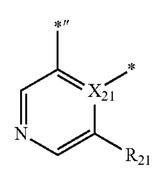

CY21(29)
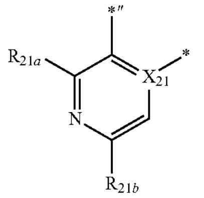
CY21(30)
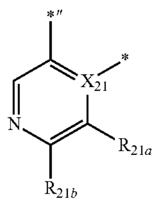
CY21(31)
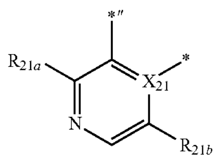
CY21(32)
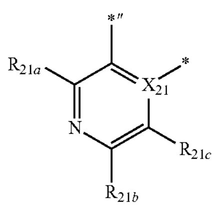
CY21(33)
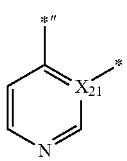
CY21(34)
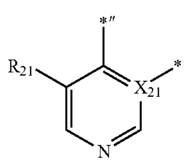
CY21(35)
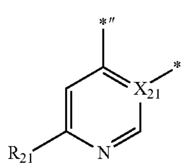
CY21(36)
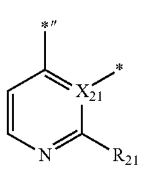
CY21(37)
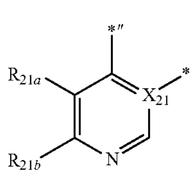
CY21(38)
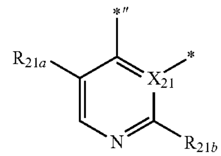
CY21(39)
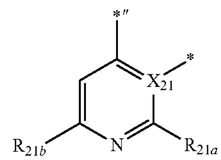
CY21(40)
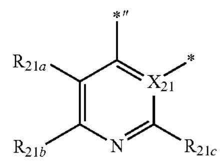
CY21(41)
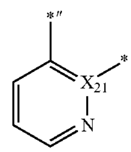
CY21(42)
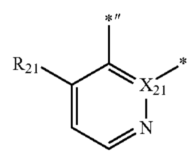
CY21(43)
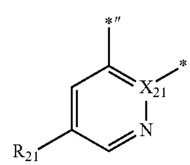
CY21(44)
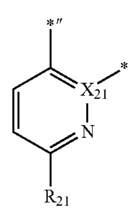
CY21(45)
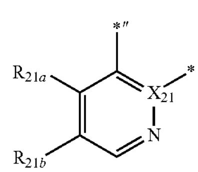
CY21(46)
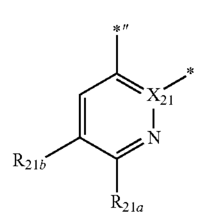

-continued

CY21(47)

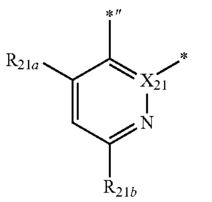

CY21(48)

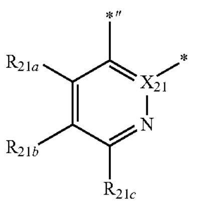

CY21(49)

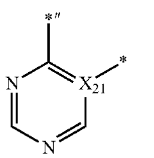

CY21(50)

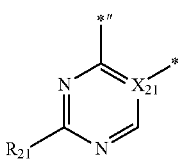

CY21(51)

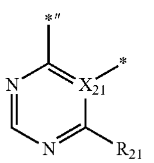

CY21(52)

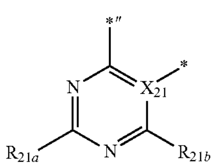

CY21(53)

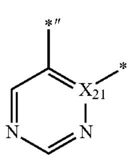

CY21(54)

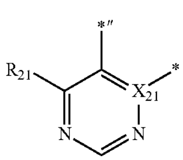

CY21(55)

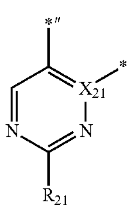

-continued

CY21(56)

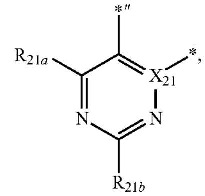

wherein, in Formulae CY21(1) to CY21(56), $X_{21}$ and $R_{21}$ are each independently the same as described in claim 1, $R_{21a}$ to $R_{21d}$ are each independently the same as defined in connection with $R_{21}$ in claim 1, wherein $R_{21}$ and $R_{21a}$ to $R_{21d}$ are each not hydrogen,

*" indicates a binding site to a carbon atom of a neighboring 6-membered ring in Formula 2, and

* indicates a binding site to M in Formula 1.

10. The organometallic compound of claim 1, wherein $L_1$ is a ligand represented by Formula 2A or 2B:

Formula 2A

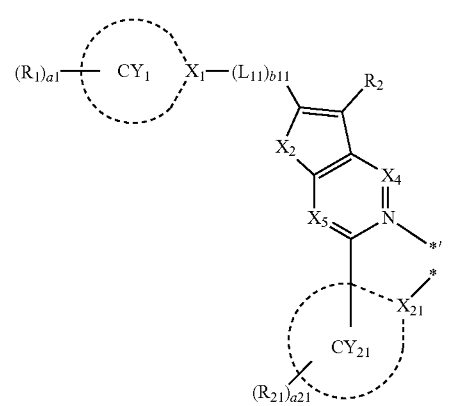

Formula 2B

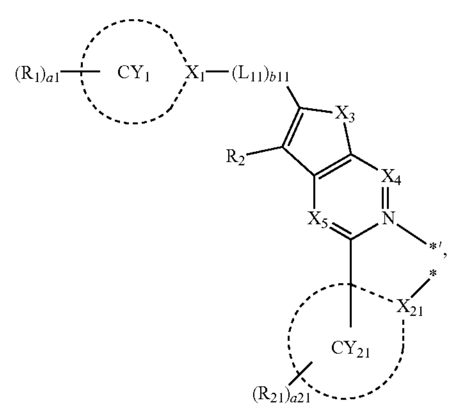

wherein, in Formulae 2A and 2B, $X_1$, $X_{21}$, ring $CY_1$, ring $CY_{21}$, $X_4$, $X_5$, $R_1$, $R_2$, $R_{21}$, a1, a21, $L_{11}$, b11, *, and *' are each independently the same as described in claim 1, wherein $X_2$ and $X_3$ are each independently O, S, or Se.

11. The organometallic compound of claim 1, wherein, in Formula 1, $L_2$ is a bidentate ligand linked to M in Formula 1 via O, S, N, C, P, Si, or As.

12. The organometallic compound of claim 1, wherein, in Formula 1, $L_2$ is a bidentate ligand represented by Formula 3:

Formula 3

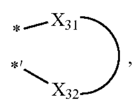

wherein, in Formula 3, $X_{31}$ and $X_{32}$ are each O;

$X_{31}$ is O and $X_{32}$ is N; or $X_{31}$ is N and $X_{32}$ is C,

indicates any atomic group linking $X_{31}$ and $X_{32}$ to each other, and * and *' each indicate a binding site to M in Formula 1.

13. The organometallic compound of claim 1, wherein, in Formula 1, $L_2$ is a group represented by one of Formulae 3A to 3F:

3A

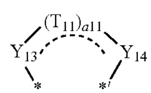

3B

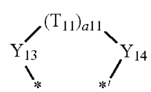

3C

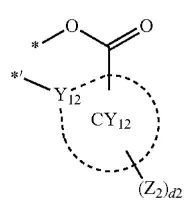

3D

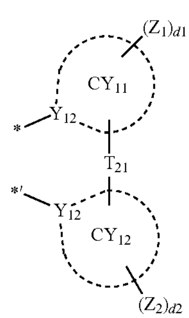

3E $*—C\equiv C—Z_1$

3F

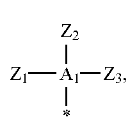

wherein, in Formulae 3A to 3F, $Y_{13}$ is O, N, $N(Z_1)$, $P(Z_1)(Z_2)$, or $As(Z_1)(Z_2)$, $Y_{14}$ is O, N, $N(Z_3)$, $P(Z_3)(Z_4)$, or $As(Z_3)(Z_4)$, $T_{11}$ is a single bond, a double bond, $*—C(Z_{11})(Z_{12})—*'$, $*—C(Z_{11})=C(Z_{12})—*'$, $*=C(Z_{11})—*'$, $*—C(Z_{11})=*'$, $*=C(Z_{11})—C(Z_{12})=C(Z_{13})—*'$, $*—C(Z_{11})=C(Z_{12})—C(Z_{13})=*'$, $*—N(Z_{11})—*'$, or a $C_5$-$C_{30}$ carbocyclic group unsubstituted or substituted with at least one $Z_{11}$, a11 is an integer from 1 to 10, $Y_{11}$ and $Y_{12}$ are each independently C or N, $T_{21}$ is a single bond, a double bond, O, S, $C(Z_{11})(Z_{12})$, $Si(Z_{11})(Z_{12})$, or $N(Z_{11})$, ring $CY_{11}$ and ring $CY_{12}$ are each independently a $C_5$-$C_{30}$ carbocyclic group or a $C_2$-$C_{30}$ heterocyclic group, $A_1$ is P or As, $Z_1$ to $Z_4$ and $Z_{11}$ to $Z_{13}$ are each independently the same as defined in connection with $R_{21}$ in claim 1, d1 and d2 are each independently an integer from 0 to 10, and

* and *' each indicate a binding site to M in Formula 1.

14. The organometallic compound of claim 1, wherein, in Formula 1, $L_2$ is a group represented by one of Formulae 3-1(1) to 3-1(66) and 3-1(301) to 3-1(309):

3-1(1)

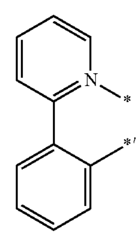

3-1(2)

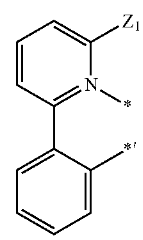

3-1(3)

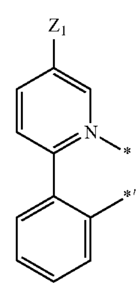

3-1(4)

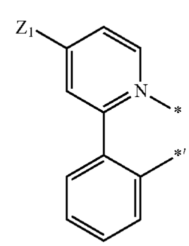

-continued
3-1(5)
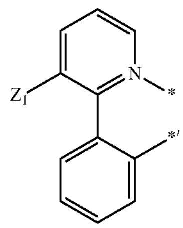
3-1(6)
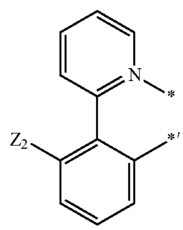
3-1(7)
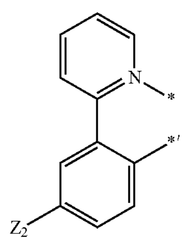
3-1(8)
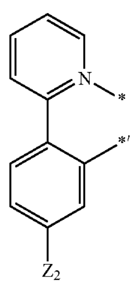
3-1(9)
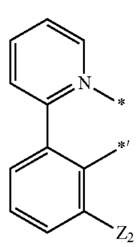
3-1(10)
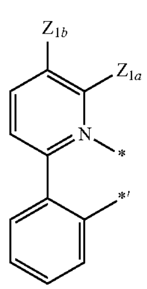
-continued
3-1(11)
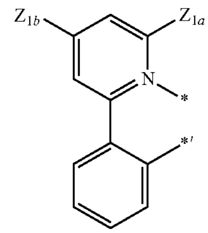
3-1(12)
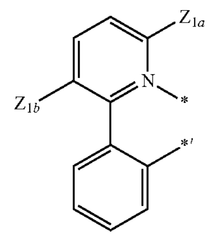
3-1(13)
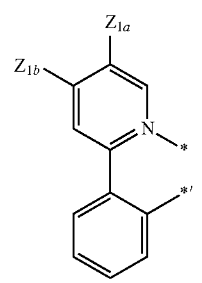
3-1(14)
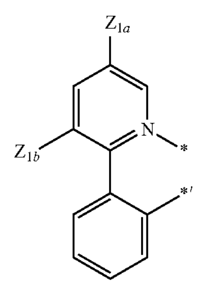
3-1(15)
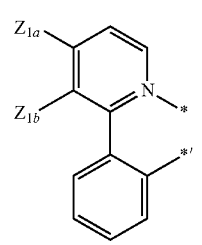
3-1(16)
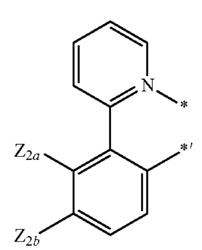

-continued
3-1(17)
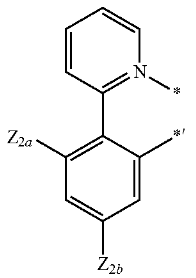
3-1(18)
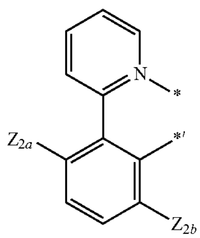
3-1(19)
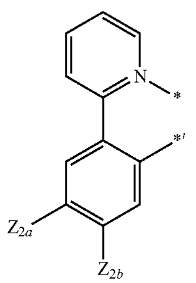
3-1(20)
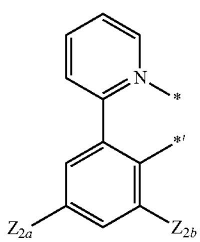
3-1(21)
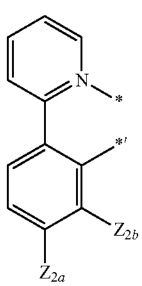
3-1(22)
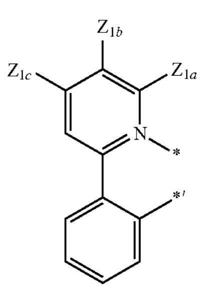
-continued
3-1(23)
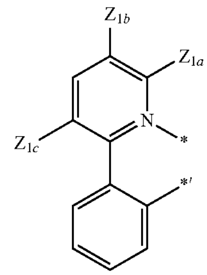
3-1(24)
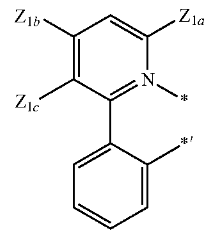
3-1(25)
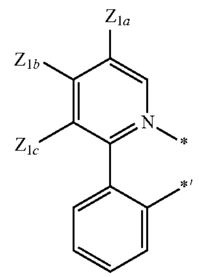
3-1(26)
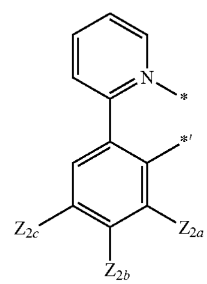
3-1(27)
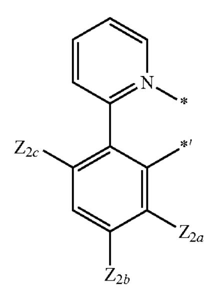
3-1(28)
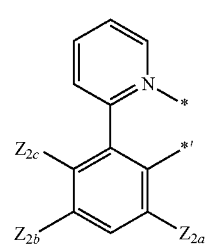

-continued
3-1(29)
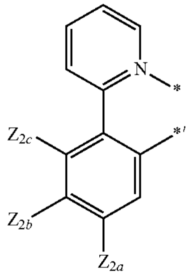
3-1(30)
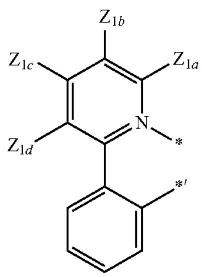
3-1(31)
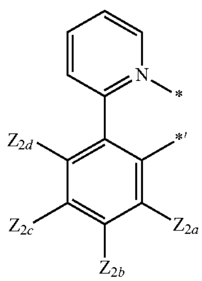
3-1(32)
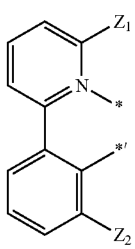
3-1(33)
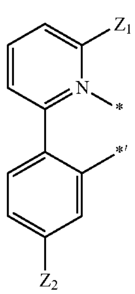
3-1(34)
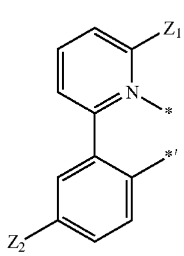
-continued
3-1(35)
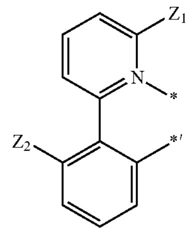
3-1(36)
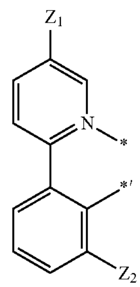
3-1(37)
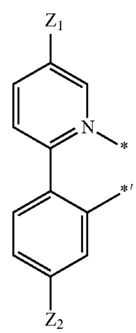
3-1(38)
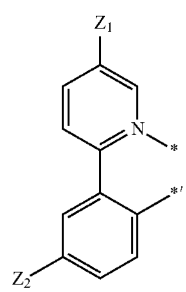
3-1(39)
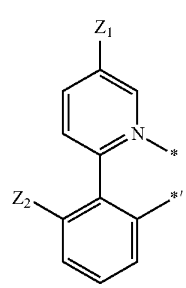

-continued
3-1(40)
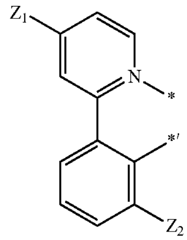
3-1(41)
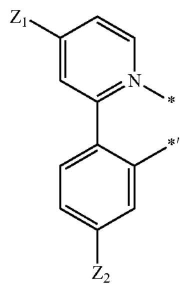
3-1(42)
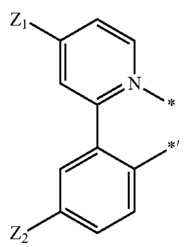
3-1(43)
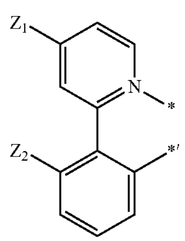
3-1(44)
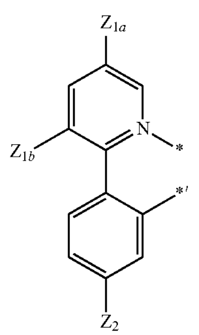
3-1(45)
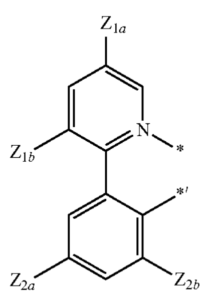
-continued
3-1(46)
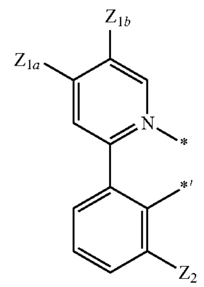
3-1(47)
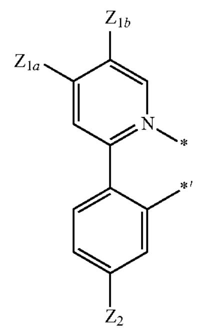
3-1(48)
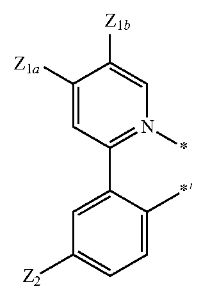
3-1(49)
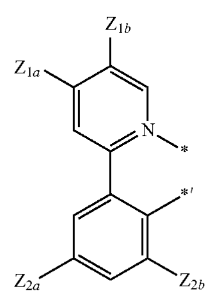
3-1(50)
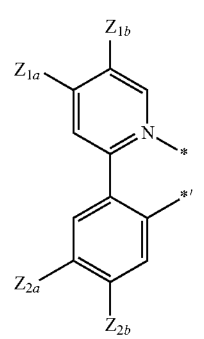

-continued
3-1(51)
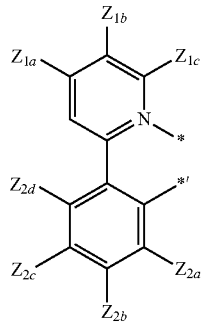
3-1(52)
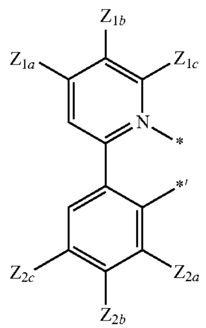
3-1(53)
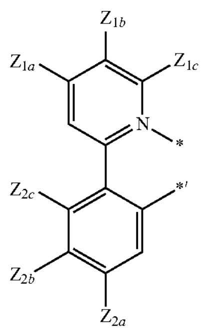
3-1(54)
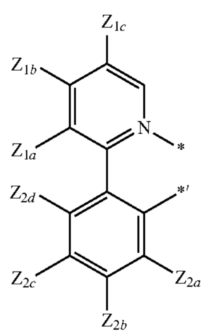
3-1(55)
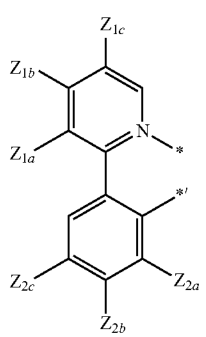
-continued
3-1(56)
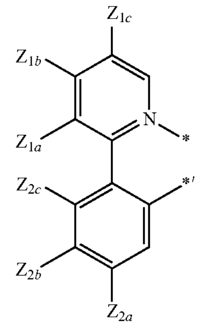
3-1(57)
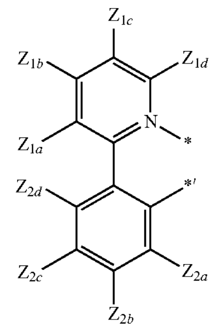
3-1(58)
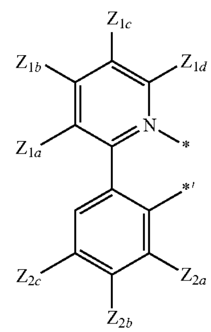
3-1(59)
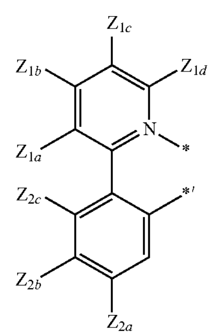
3-1(60)
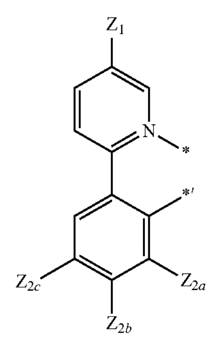

-continued
3-1(61)
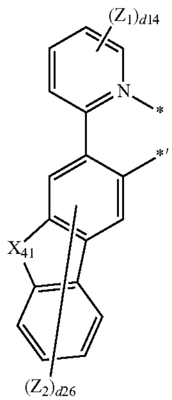
3-1(62)
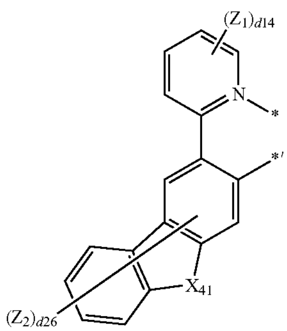
3-1(63)
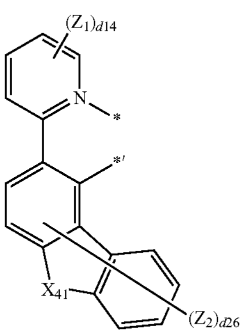
3-1(64)
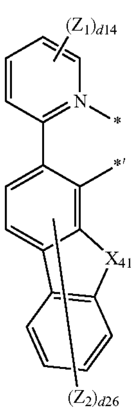
-continued
3-1(65)
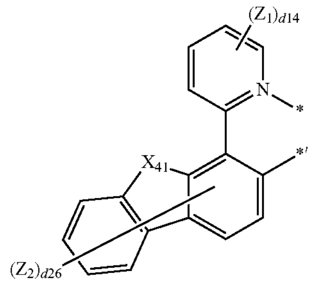
3-1(66)
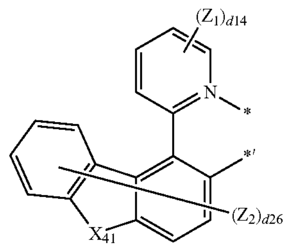
3-1(301)
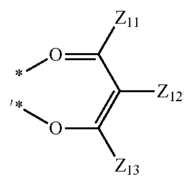
3-1(302)
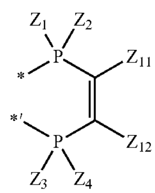
3-1(303)
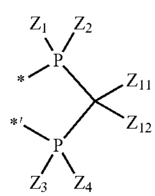
3-1(304)
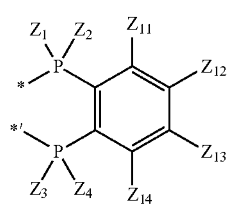
3-1(305)
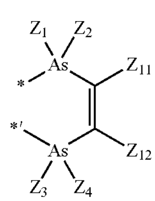

-continued

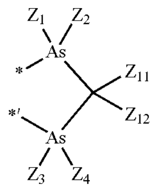

3-1(306)

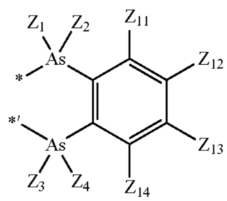

3-1(307)

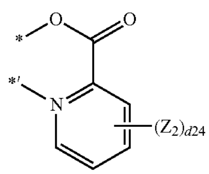

3-1(308)

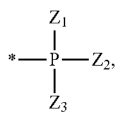

3-1(309)

wherein, in Formulae 3-1(1) to 3-1(66) and 3-1(301) to 3-1(309), $X_{41}$ is O, S, $N(Z_{21})$, $C(Z_{21})(Z_{22})$, or $Si(Z_{21})(Z_{22})$, $Z_1$ to $Z_4$, $Z_{1a}$, $Z_{1b}$, $Z_{1c}$, $Z_{1d}$, $Z_{2a}$, $Z_{2b}$, $Z_{2c}$, $Z_{2d}$, $Z_{11}$ to $Z_{14}$, $Z_{21}$ and $Z_{22}$ are each independently the same as defined in connection with $R_{21}$ in claim 1, d14 is an integer from 0 to 4, d26 is an integer from 0 to 6, and

* and *' each indicate a binding site to M in Formula 1.

15. The organometallic compound of claim 1, wherein the organometallic compound is one of Compounds 1 to 469:

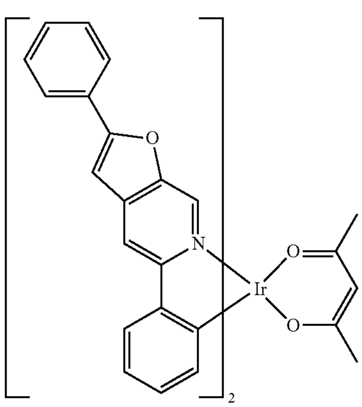

1

-continued

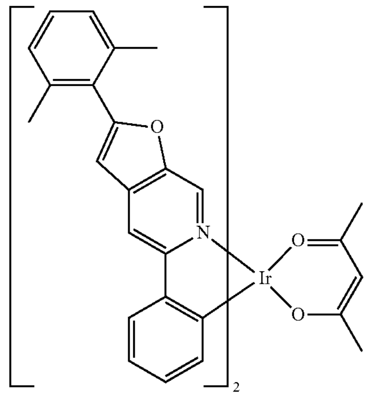

2

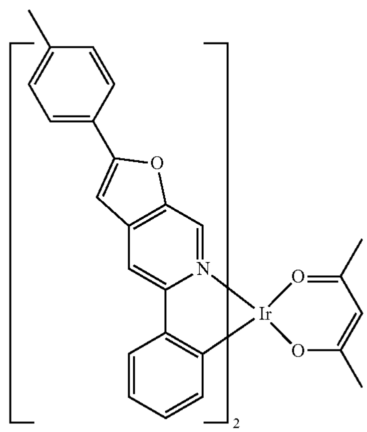

3

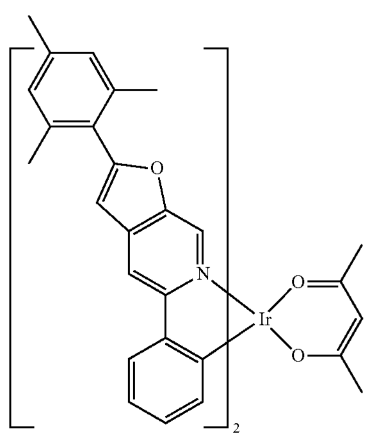

4

-continued
5
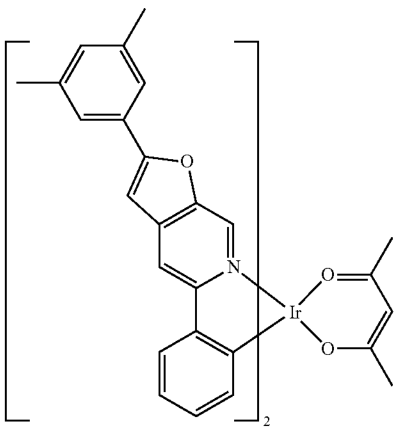
6
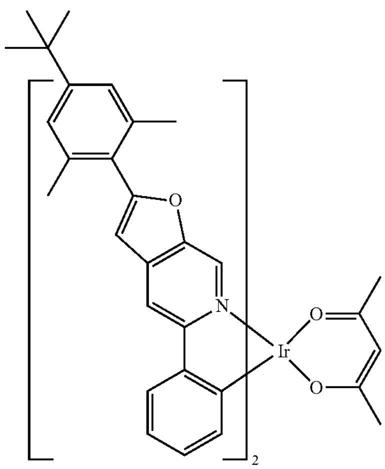
7
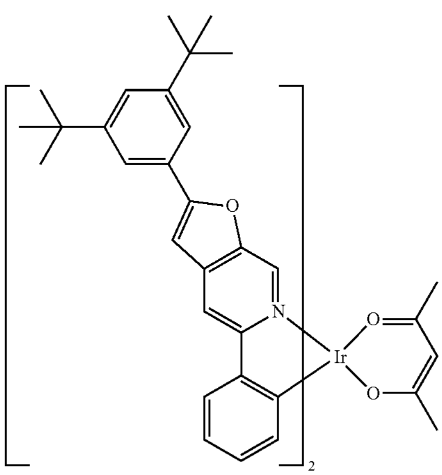
-continued
8
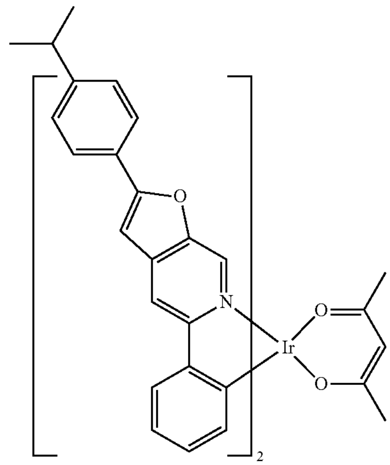
9
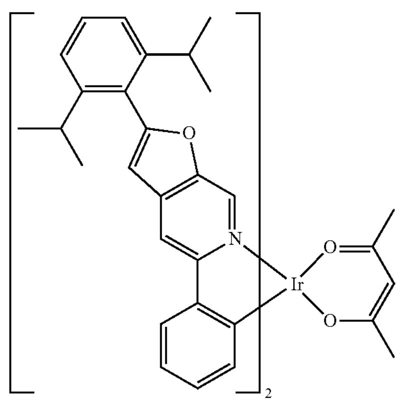
10
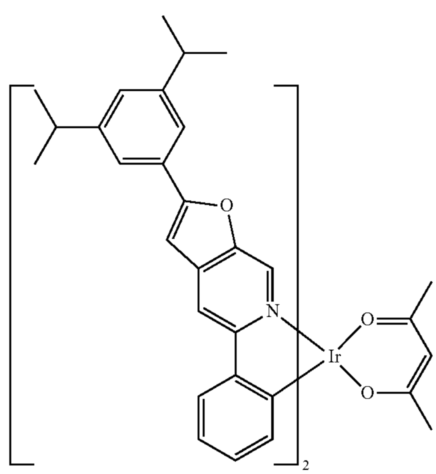

-continued
11
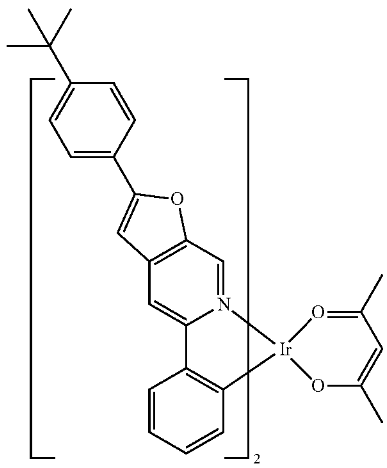
12
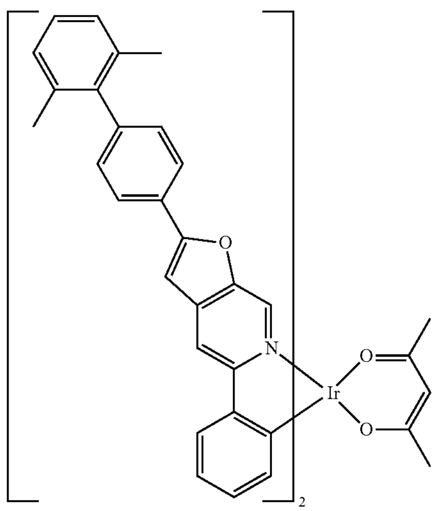
13
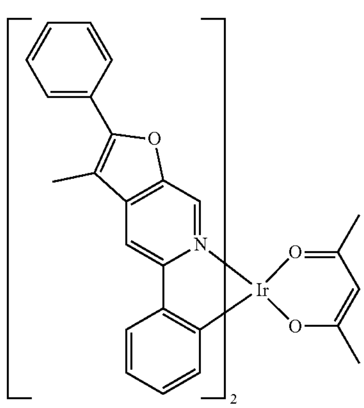
-continued
14
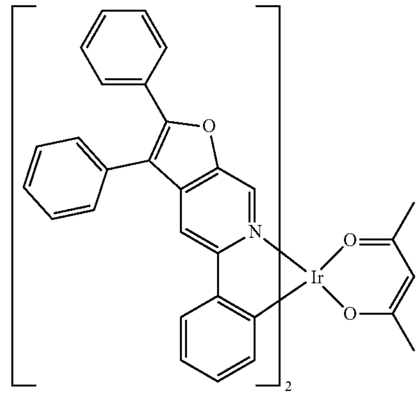
15
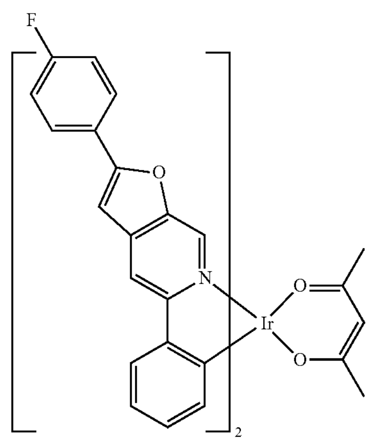
16
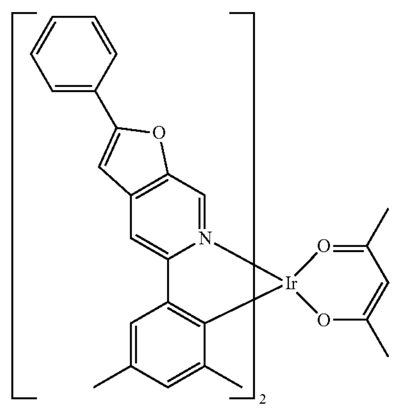
17
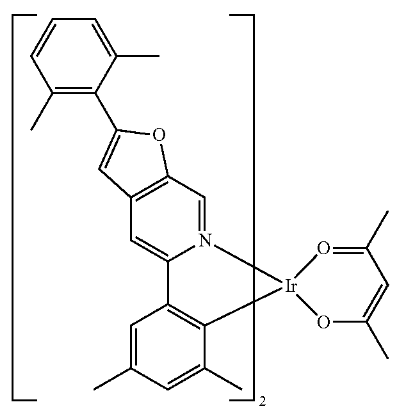

-continued
18
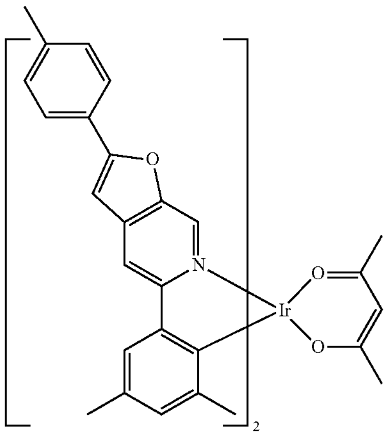
19
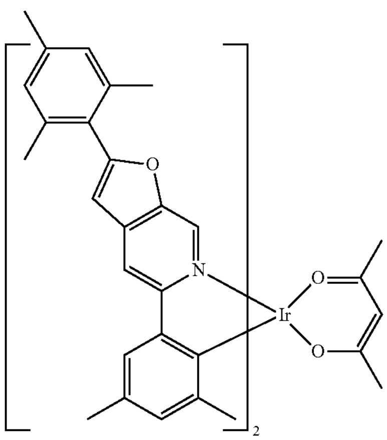
20
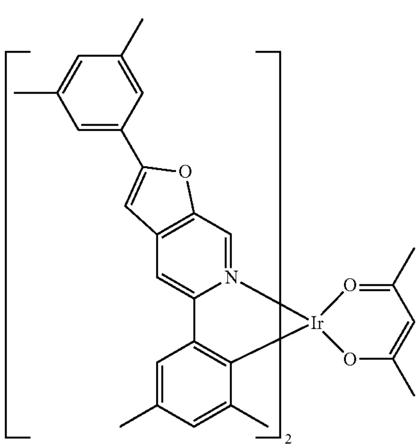
-continued
21
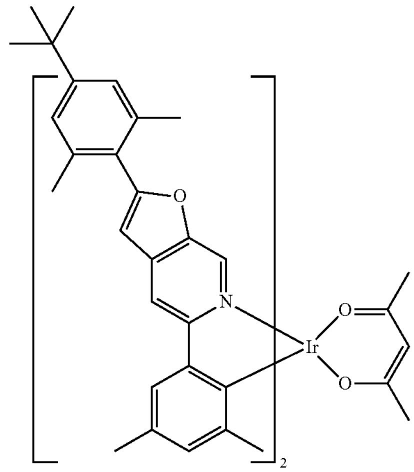
22
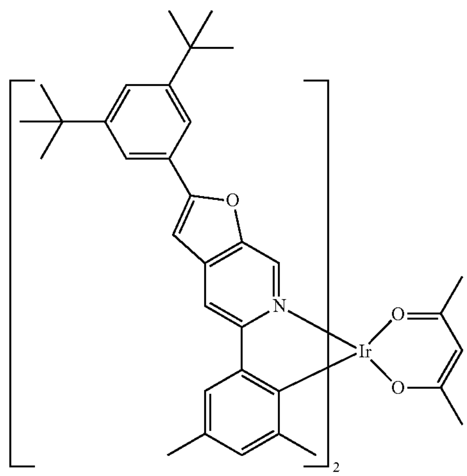
23
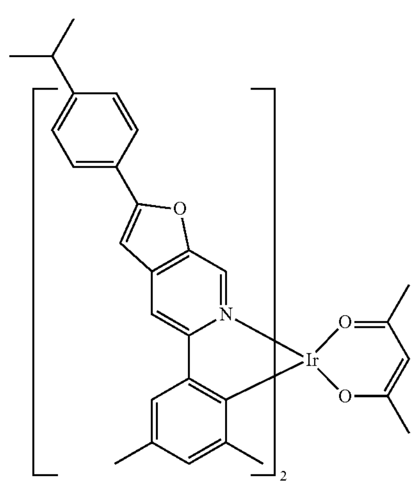

-continued
24
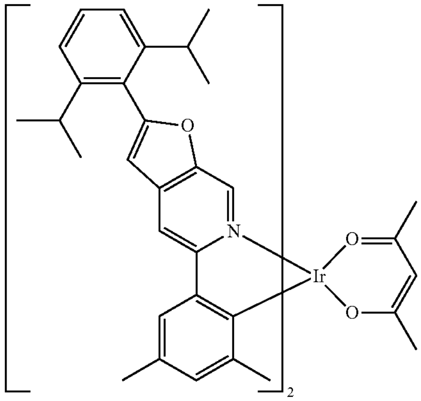
25
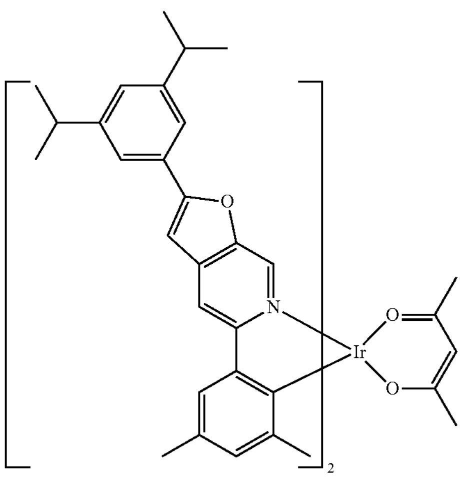
26
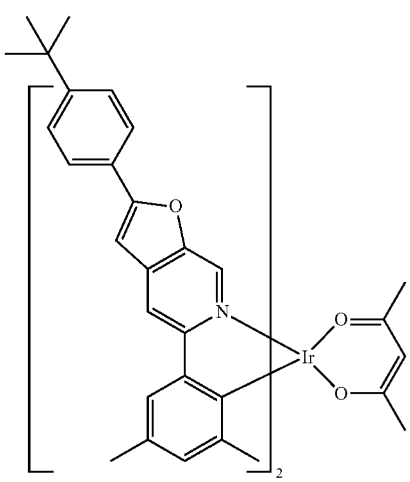
27
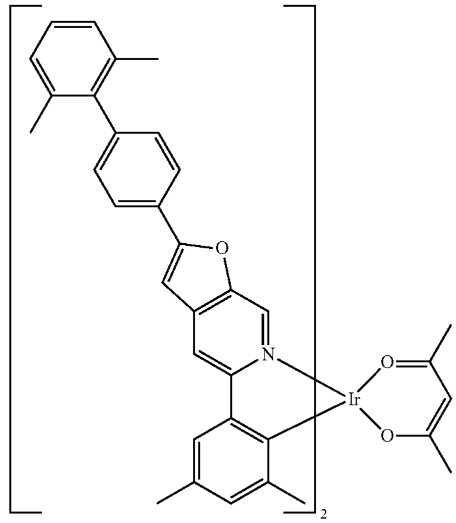
28
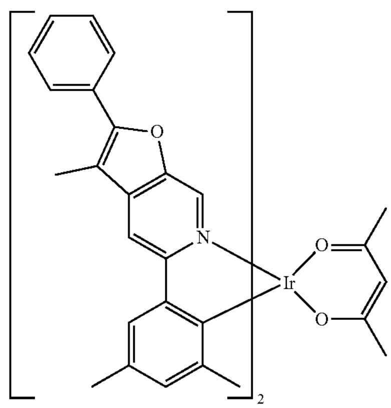
29
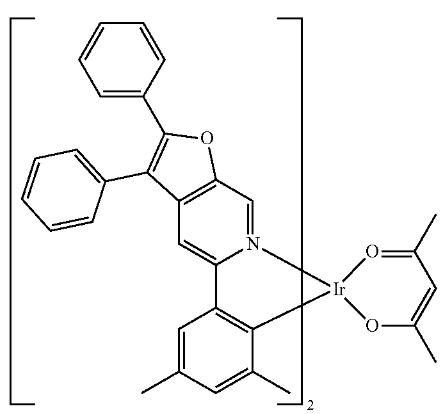

-continued
30
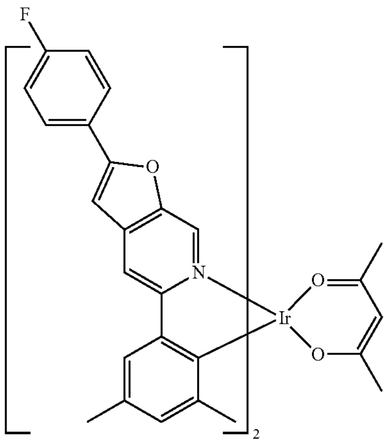
31
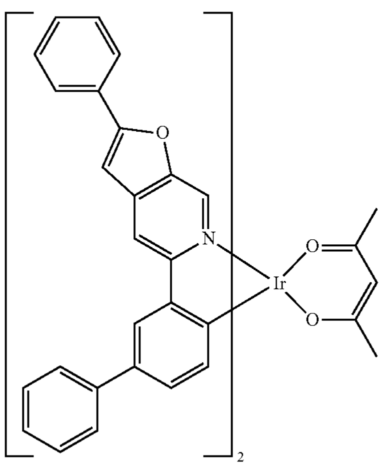
32
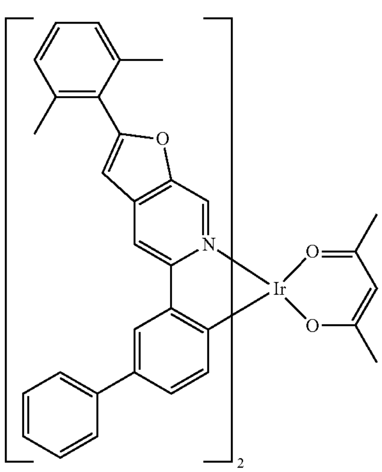
-continued
33
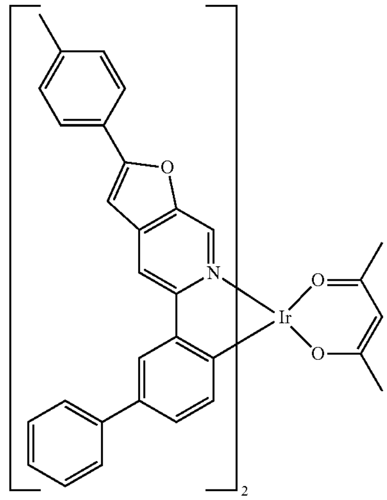
34
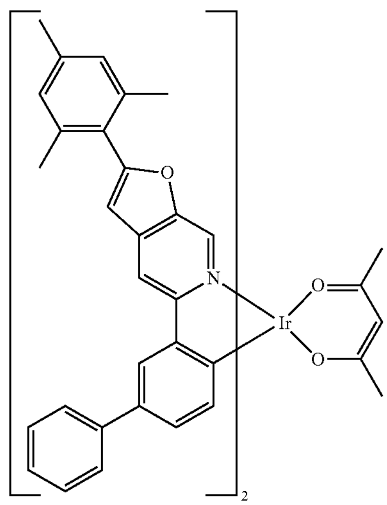
35
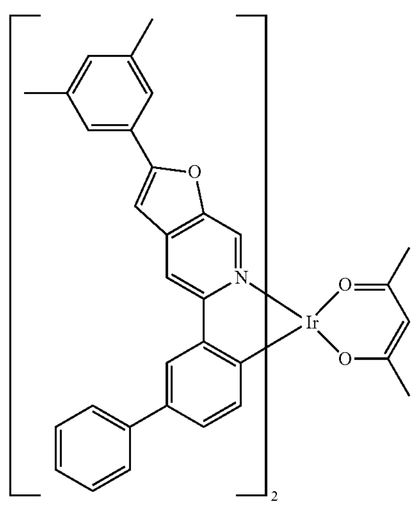

-continued
36
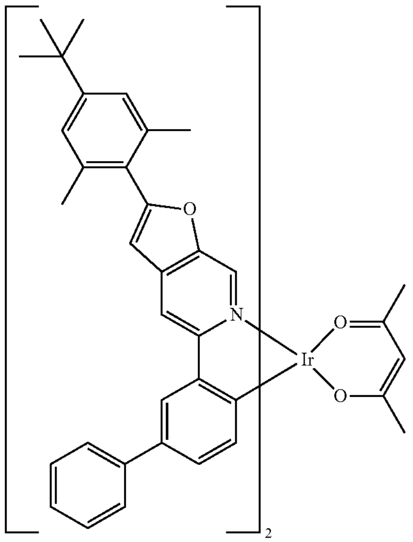
37
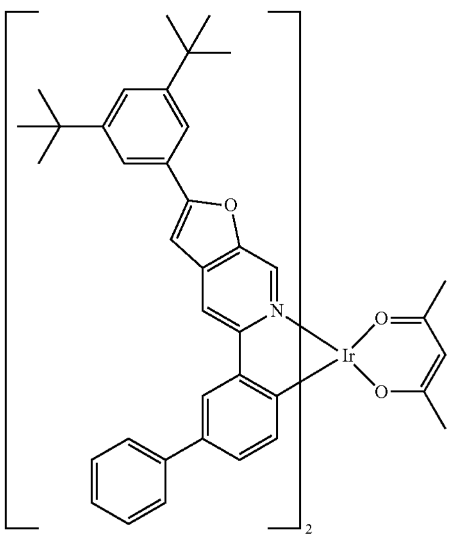
38
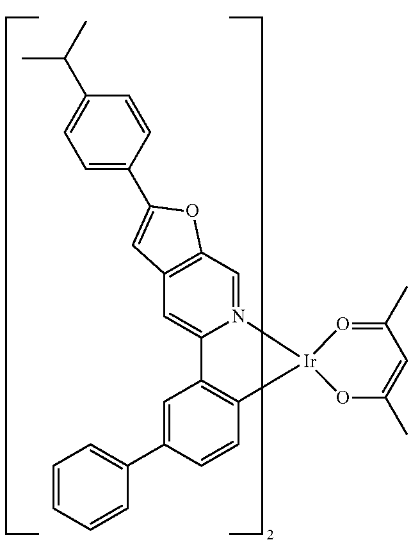
-continued
39
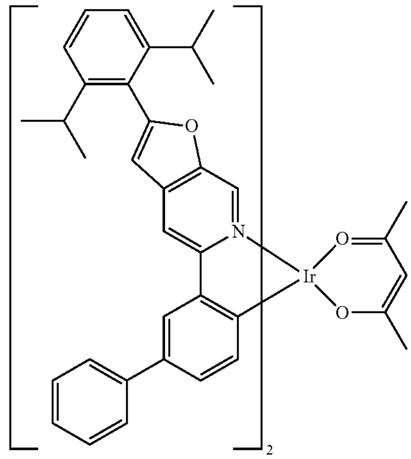
40
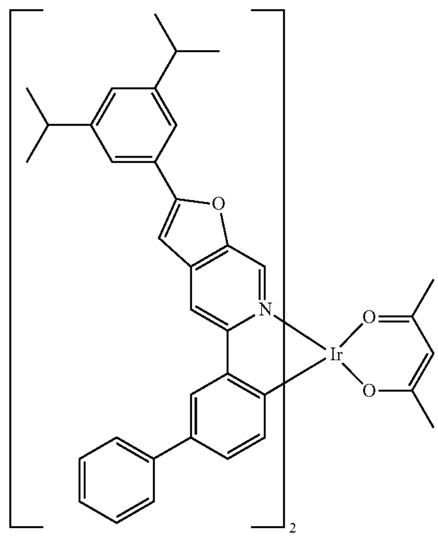
41
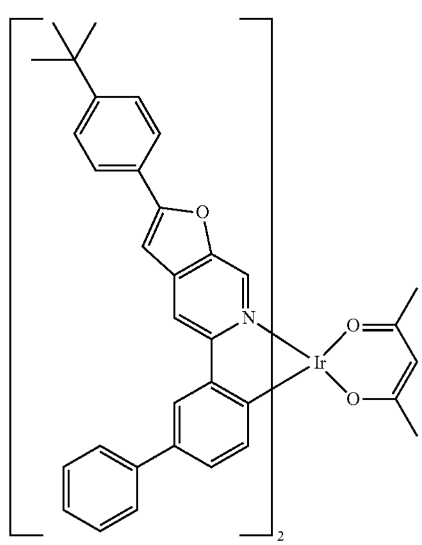

-continued
42
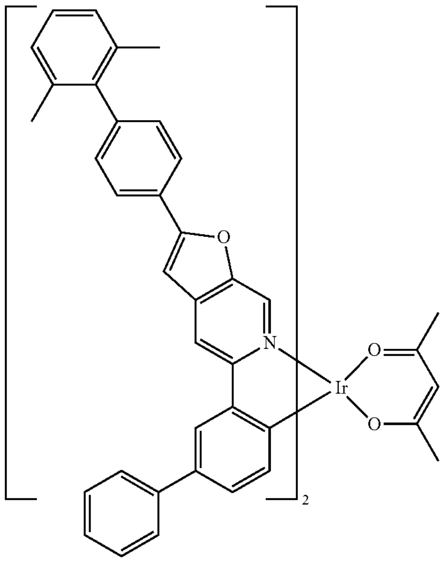
43
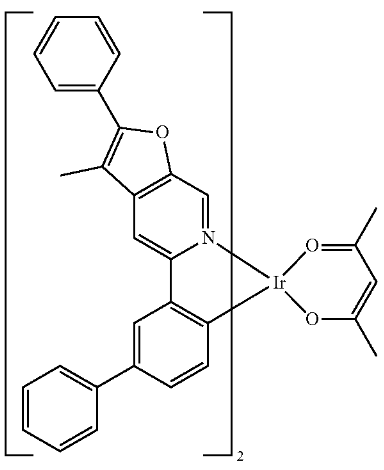
44
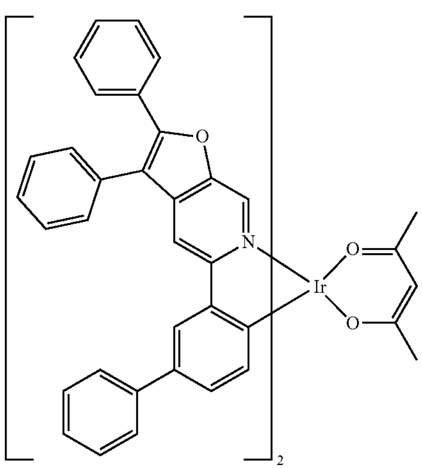
-continued
45
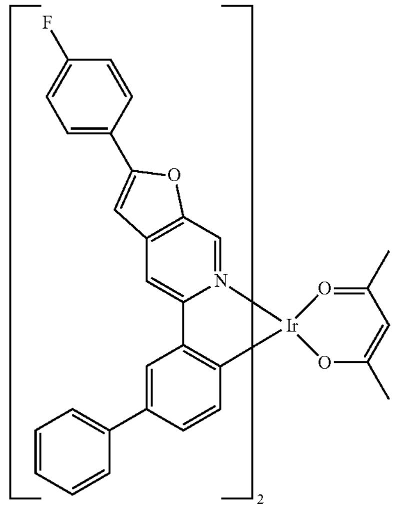
46
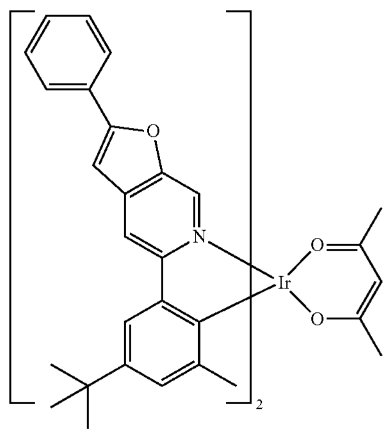
47
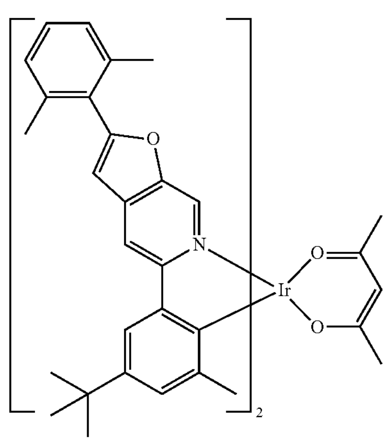

48
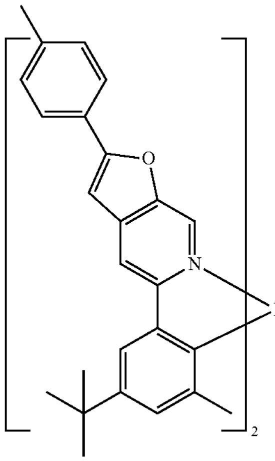
49
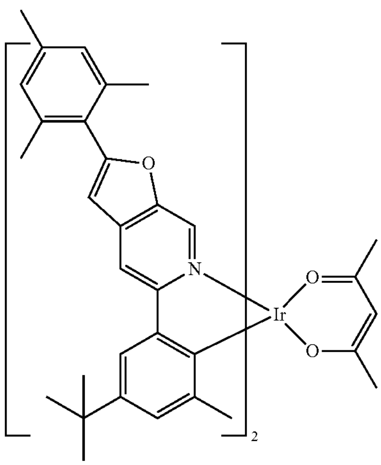
50
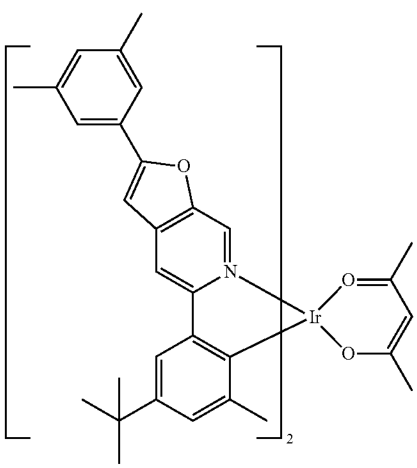
51
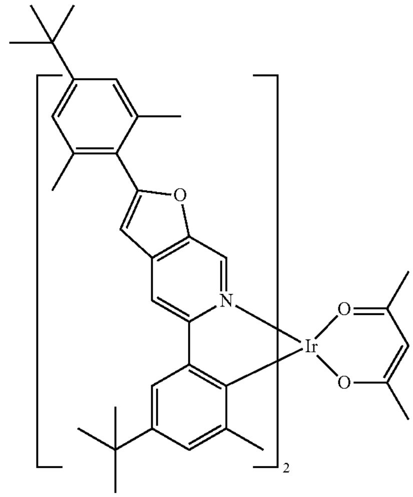
52
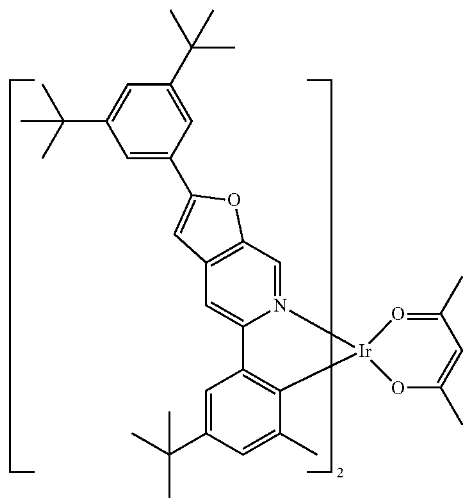
53
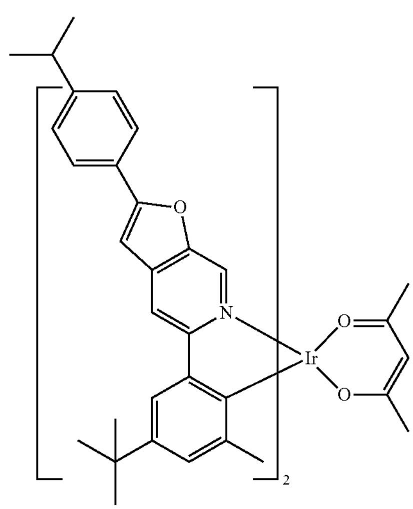

-continued
54
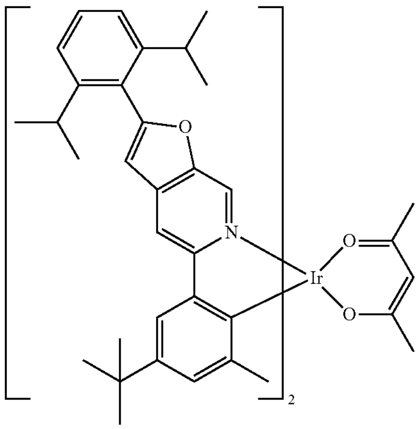
55
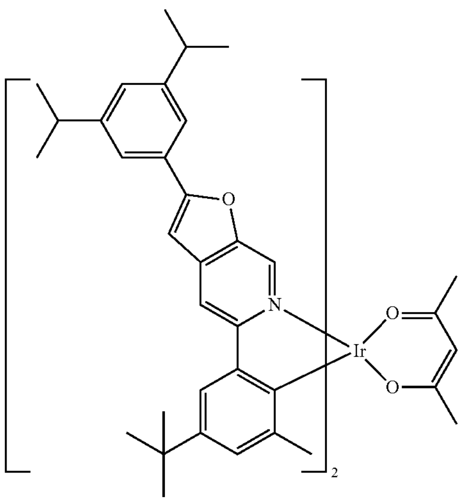
56
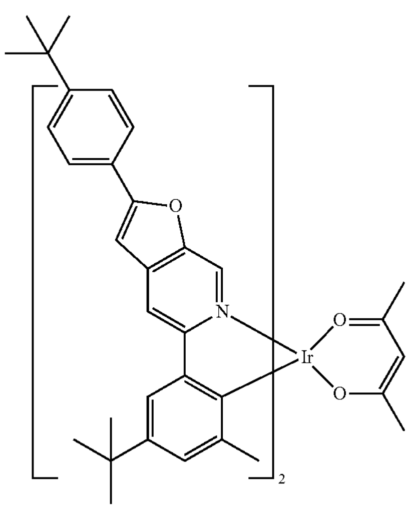
-continued
57
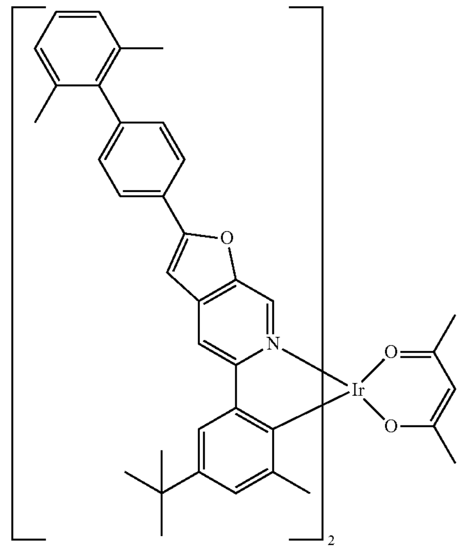
58
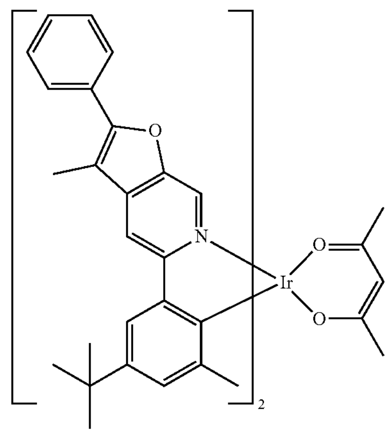
59
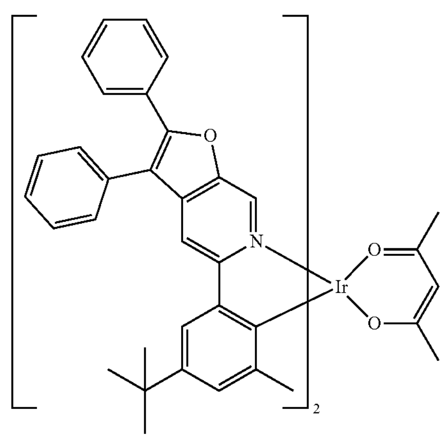

-continued
60
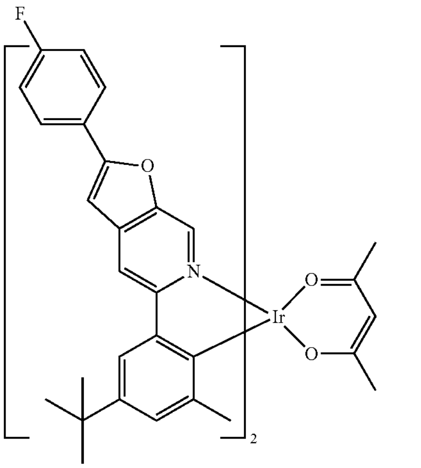
61
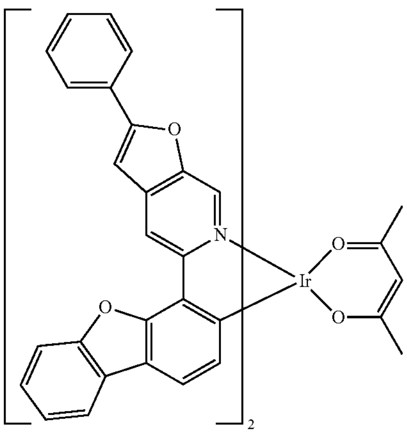
62
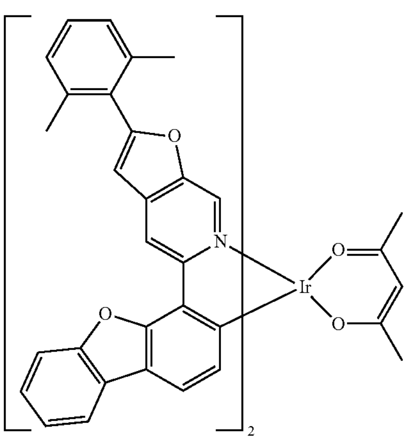
-continued
63
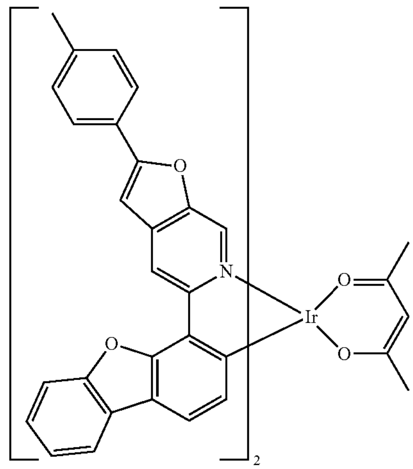
64
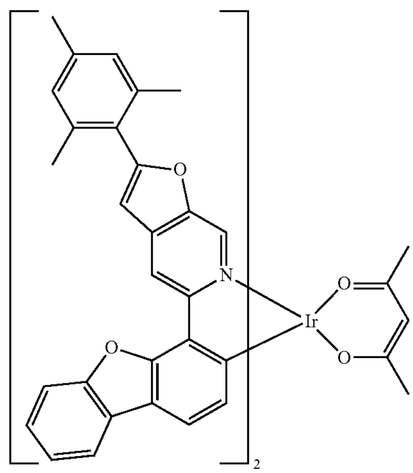
65
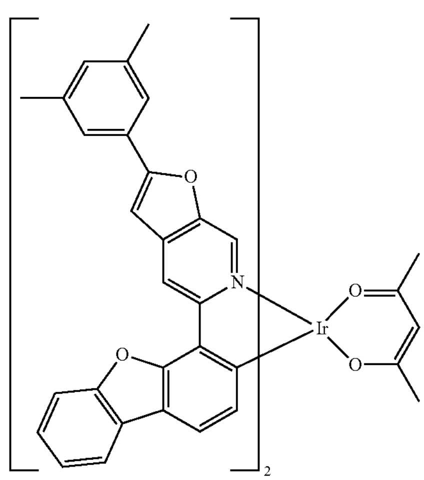

-continued
66
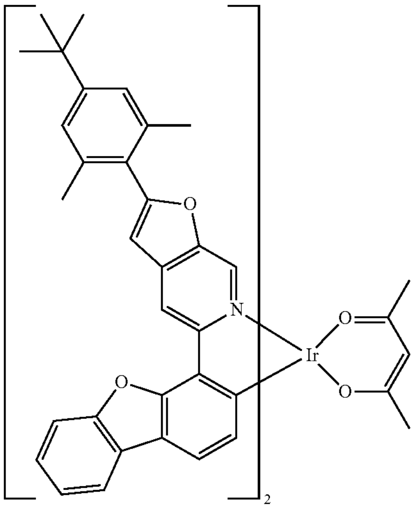
67
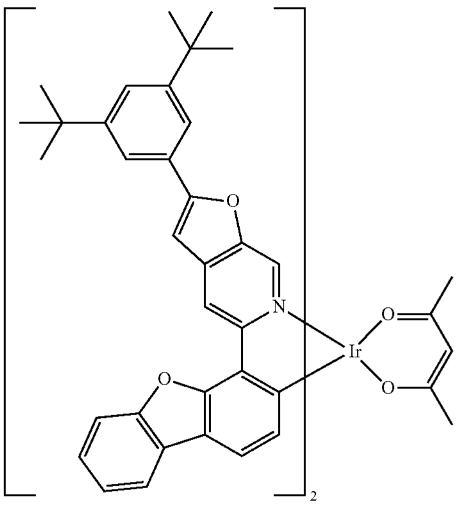
68
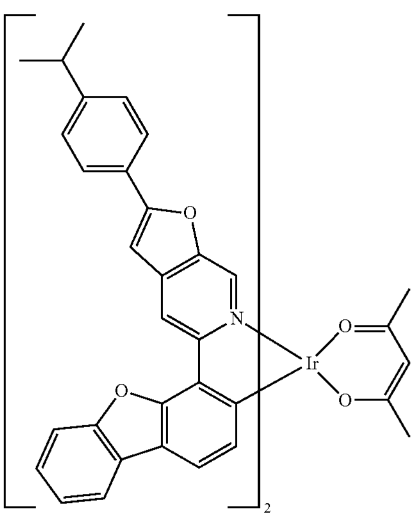
-continued
69
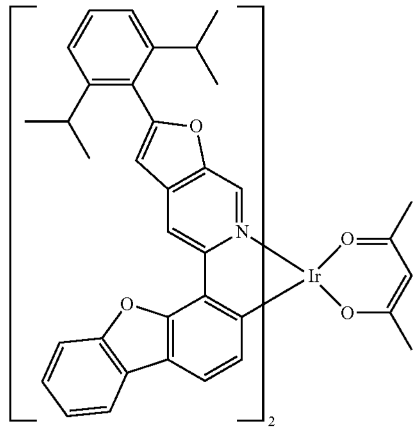
70
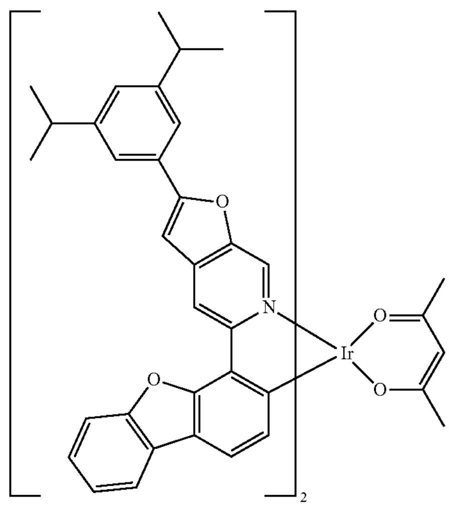
71
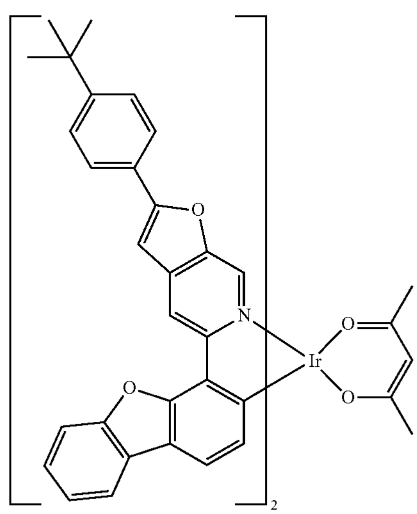

72
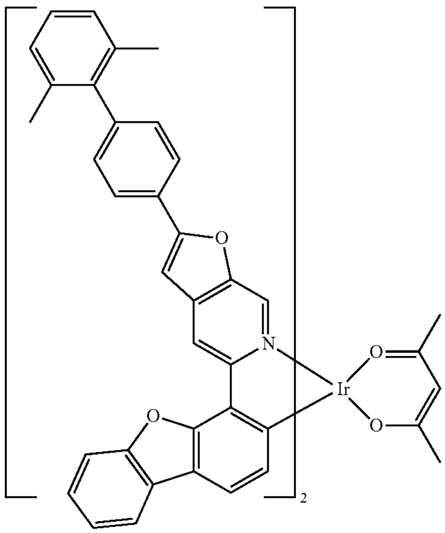
73
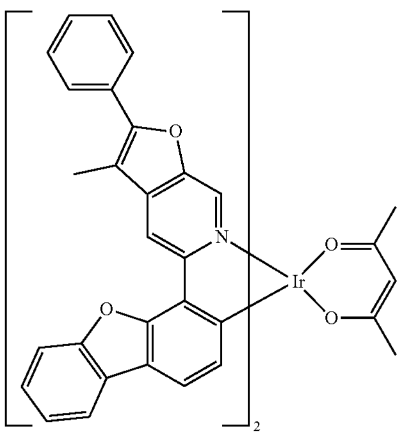
74
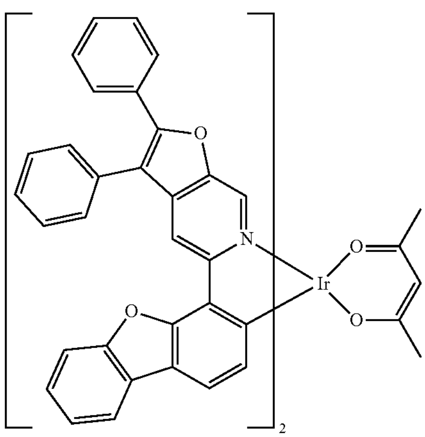
75
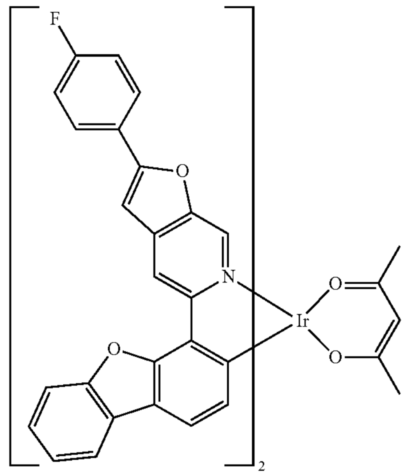
76
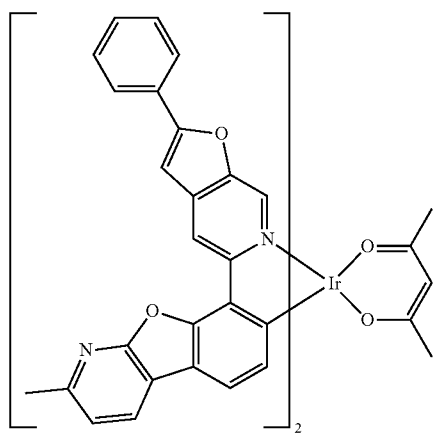
77
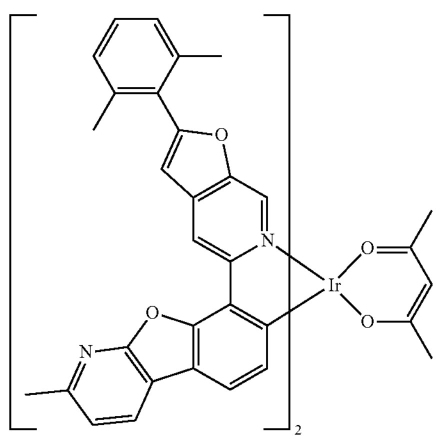

78
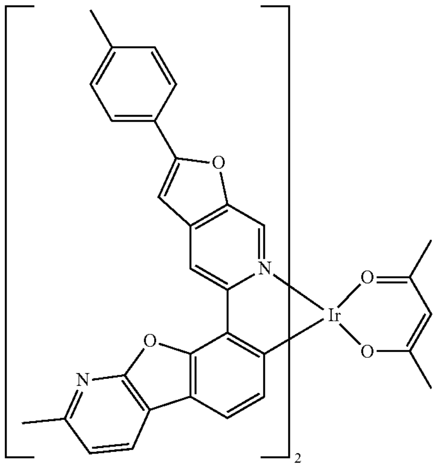
79
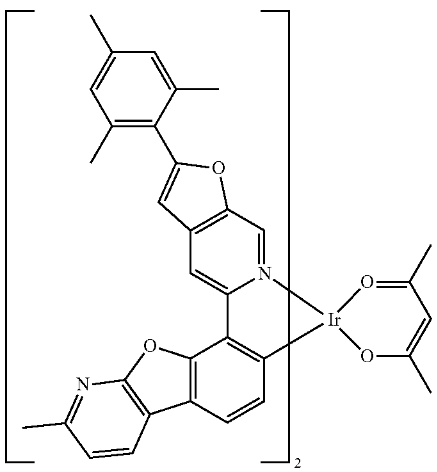
80
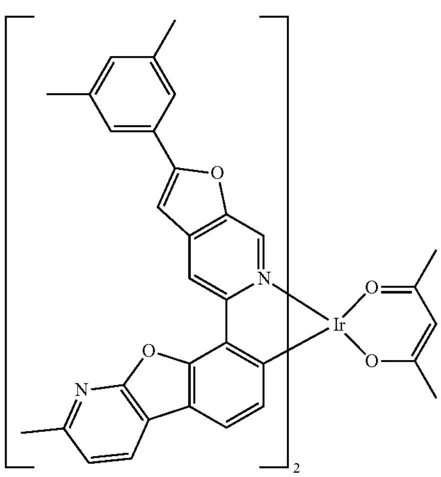
81
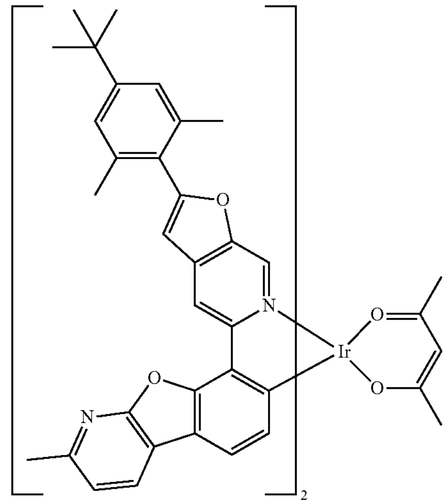
82
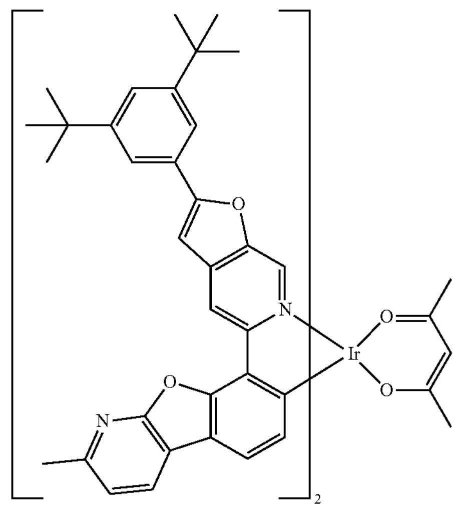
83
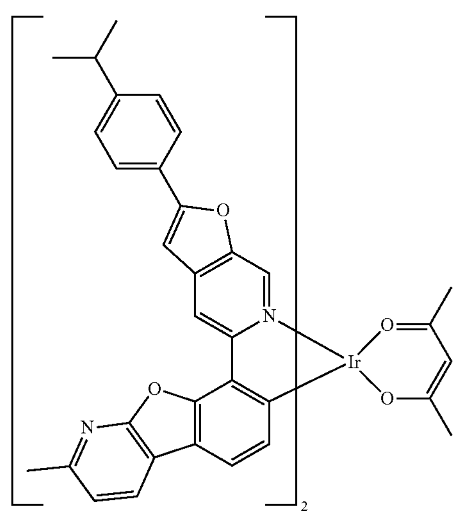

84
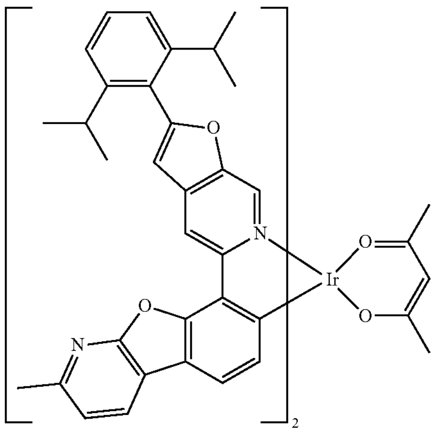
85
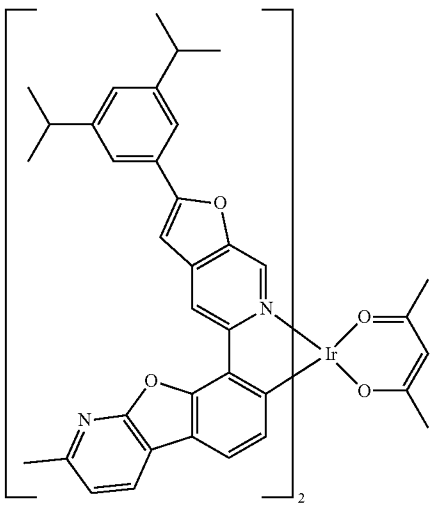
86
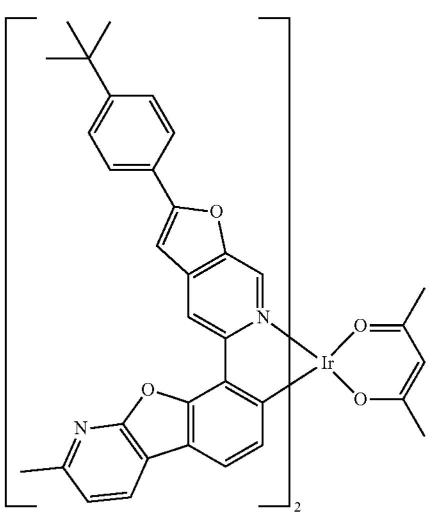
87
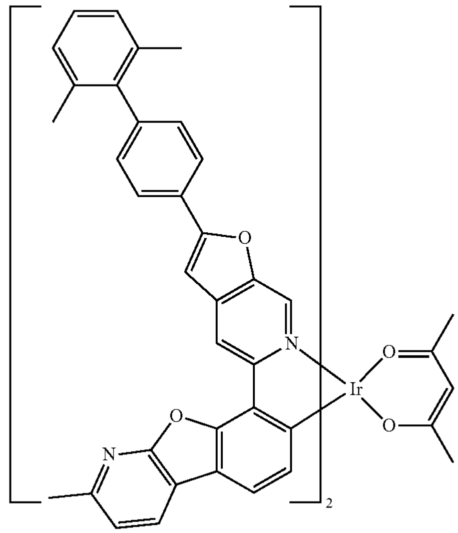
88
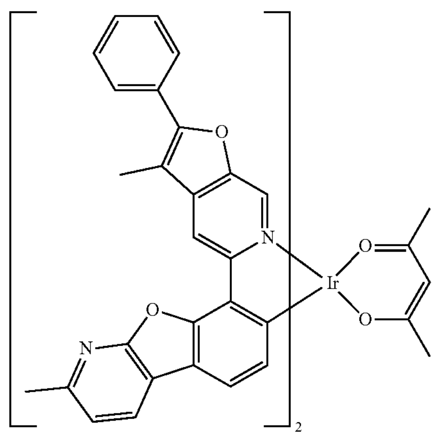
89

-continued
90
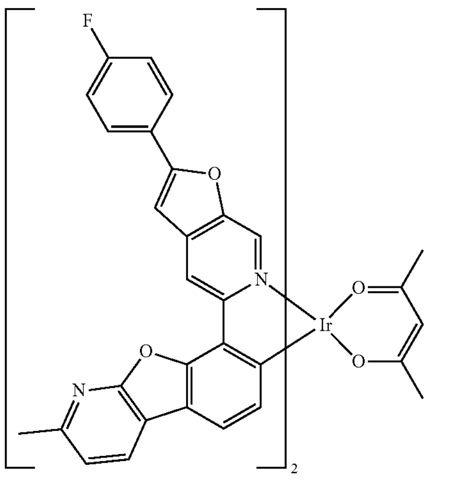
91
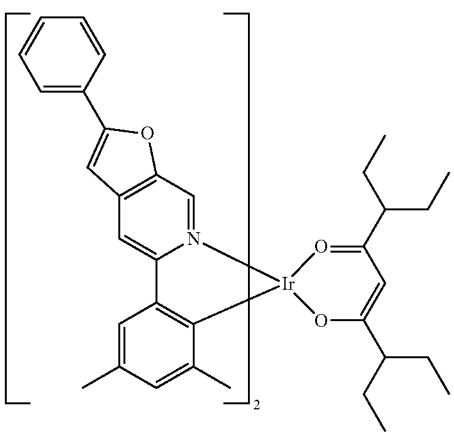
92
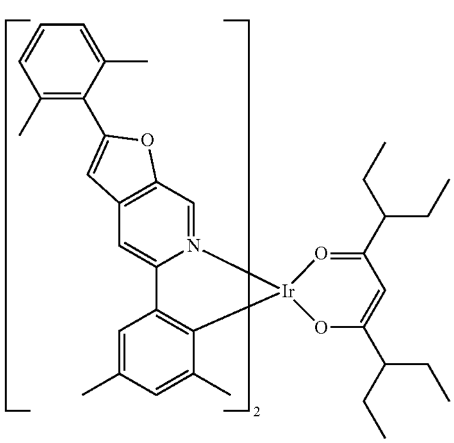
-continued
93
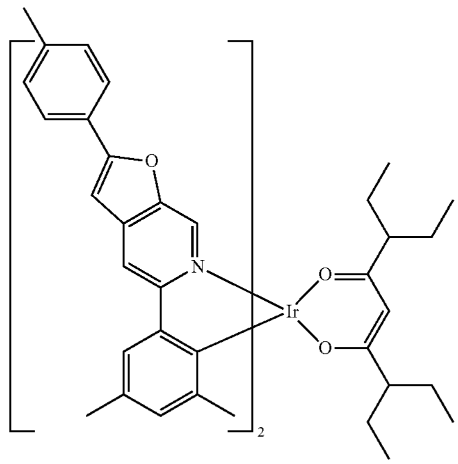
94
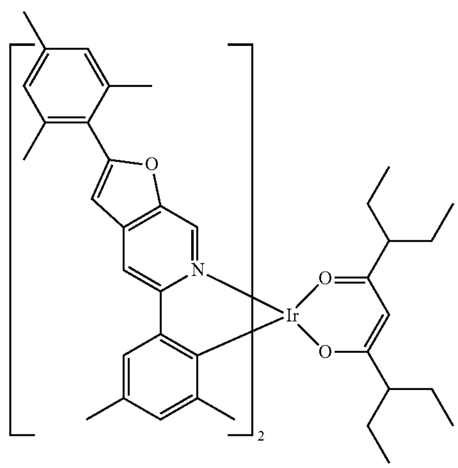
95
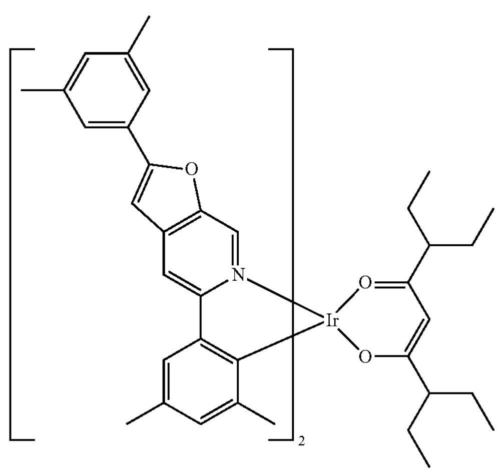

-continued
96
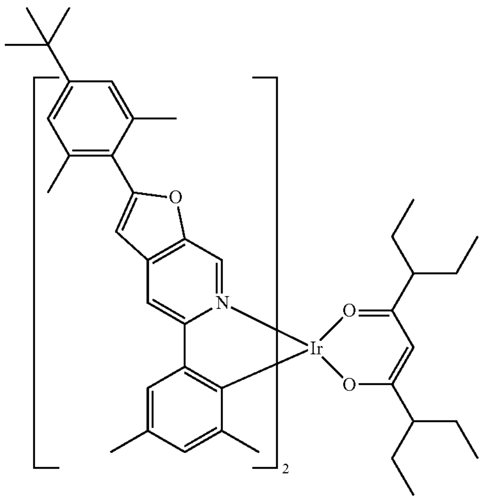
97
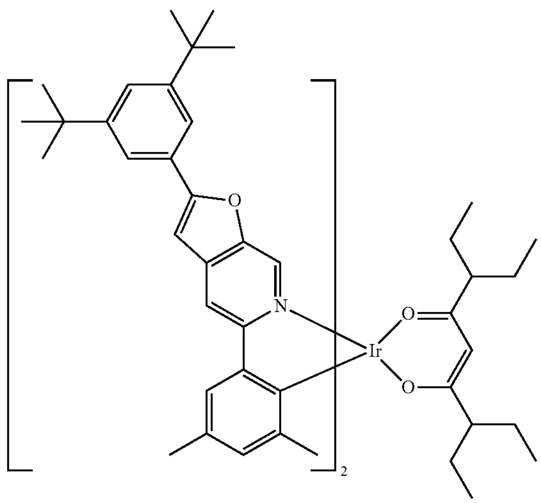
98
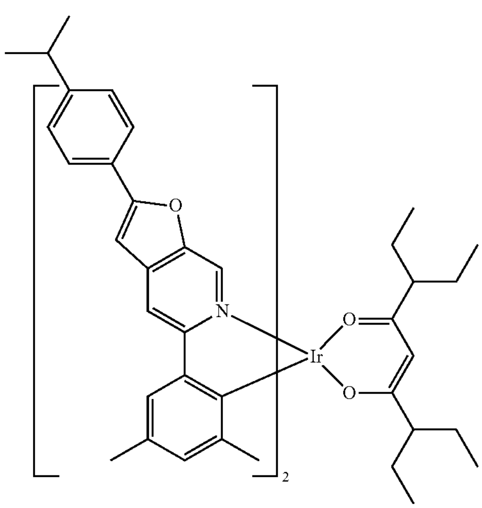
-continued
99
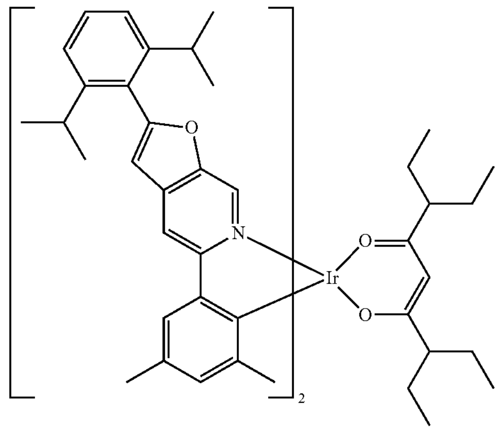
100
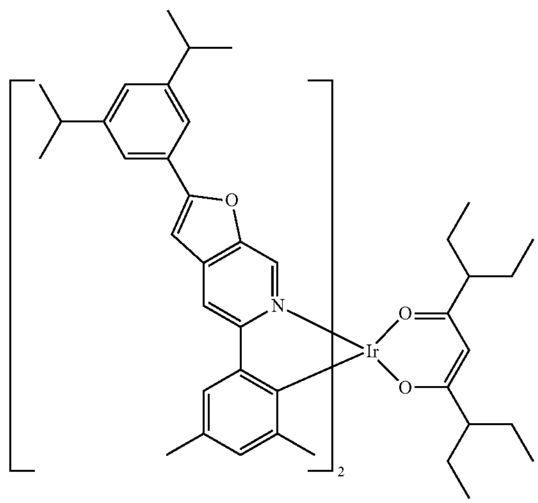
101
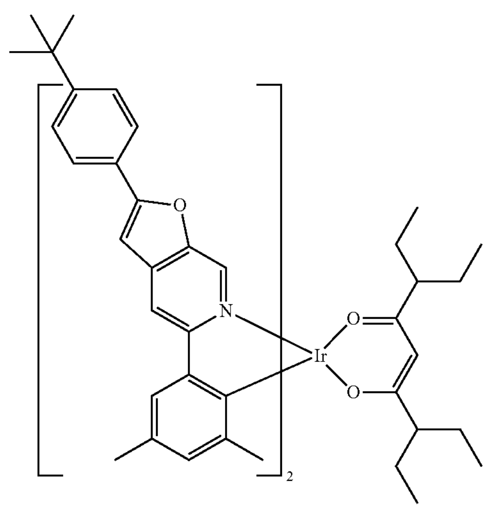

-continued
102
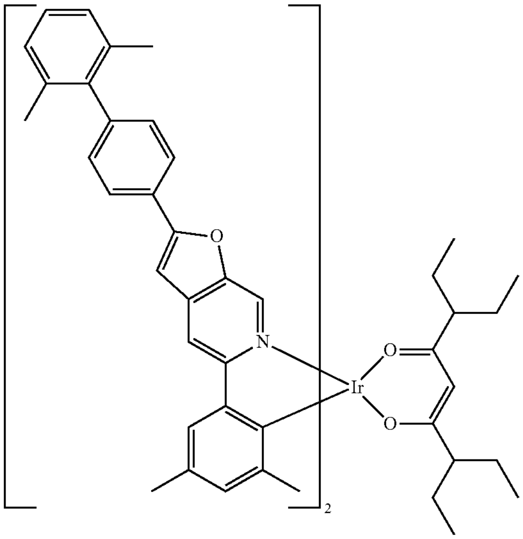
103
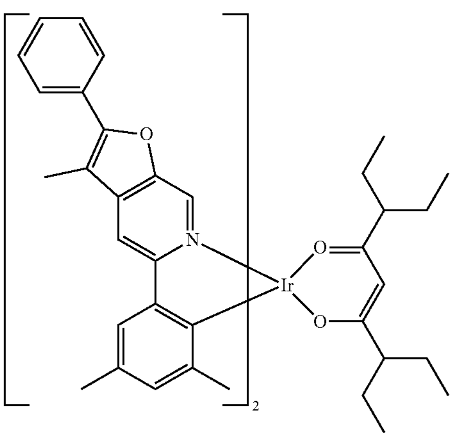
104
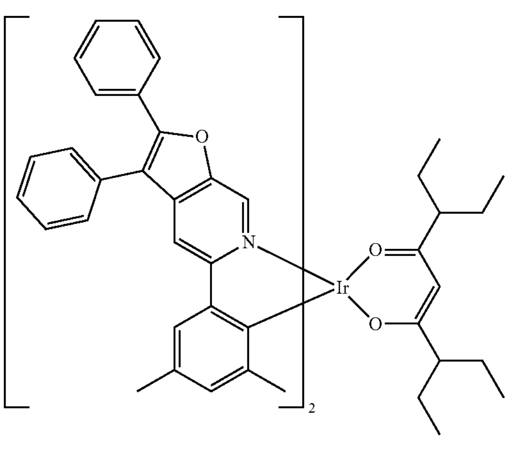
-continued
105
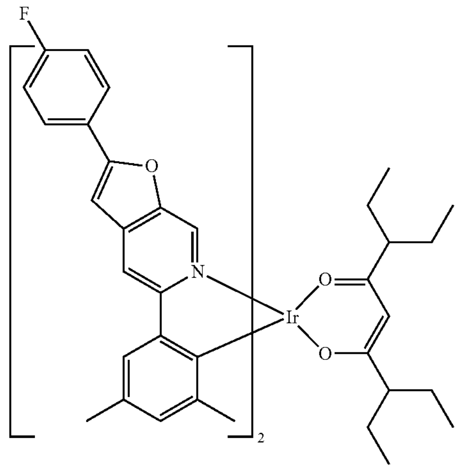
106
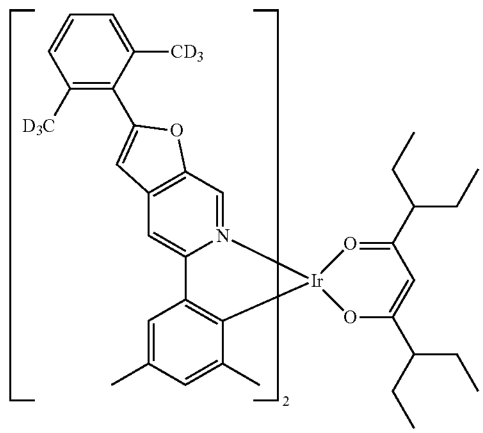
107
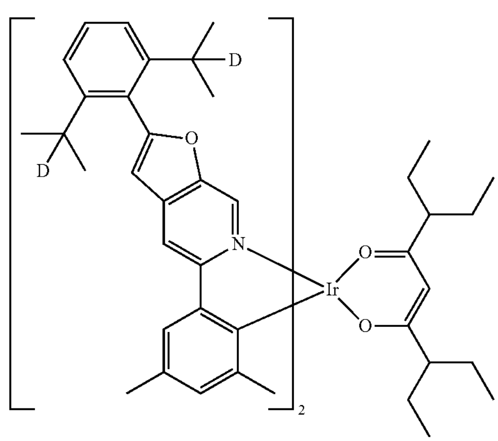

-continued
108
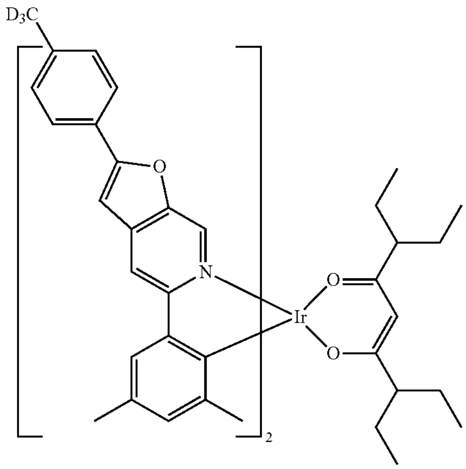
109
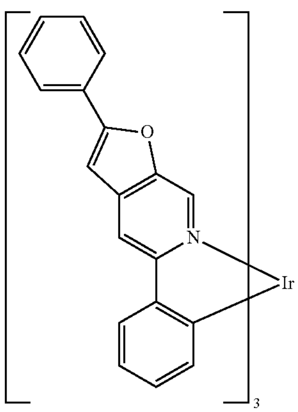
110
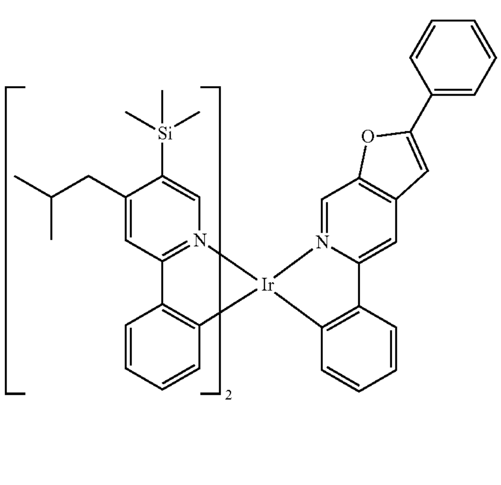
-continued
111
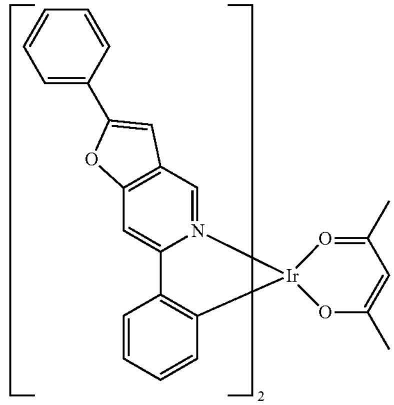
112
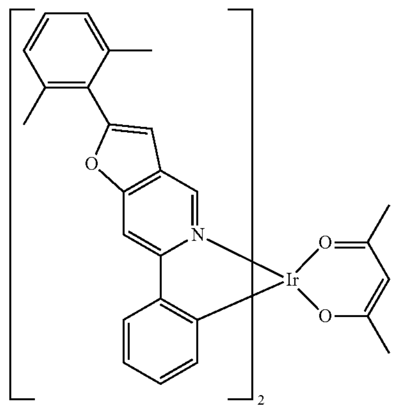
113
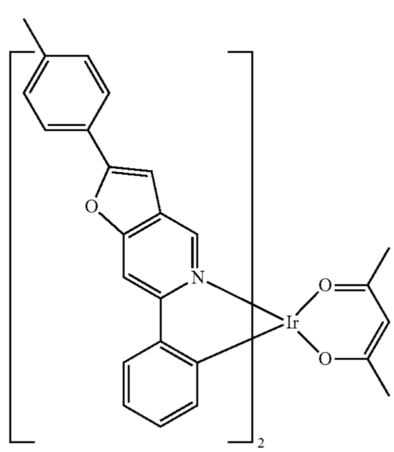

-continued
114
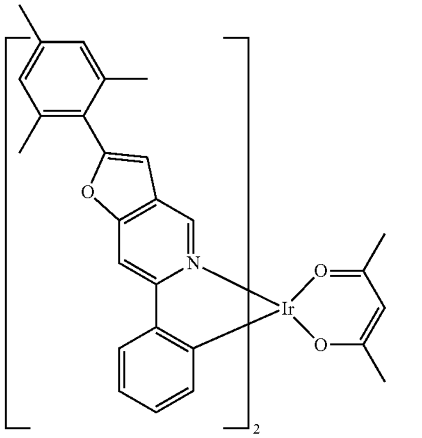
115
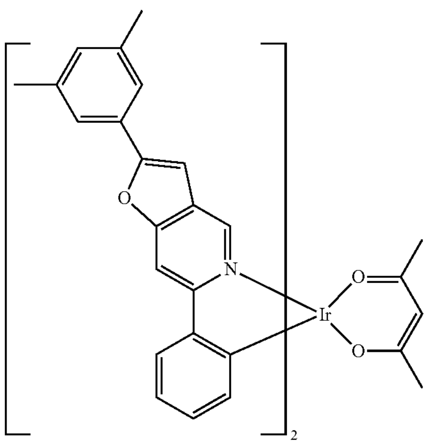
116
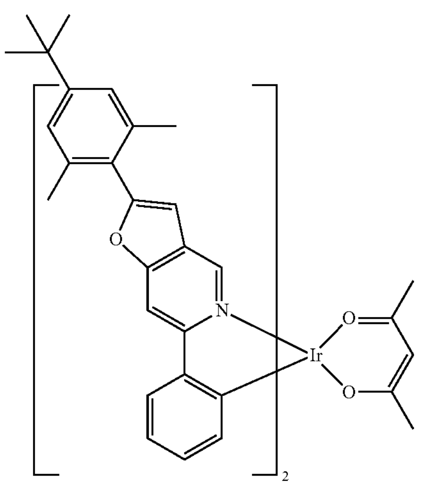
-continued
117
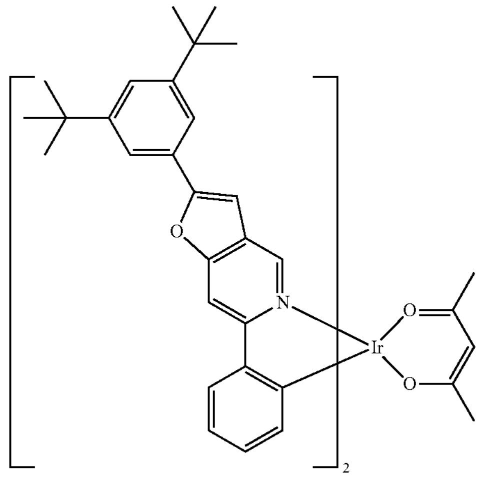
118
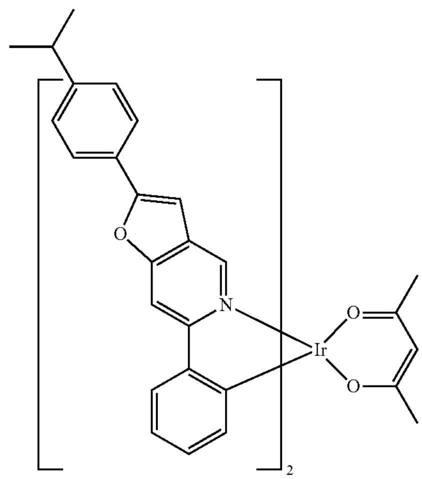
119
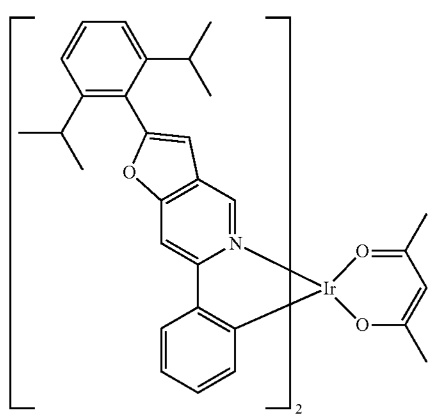

-continued
120
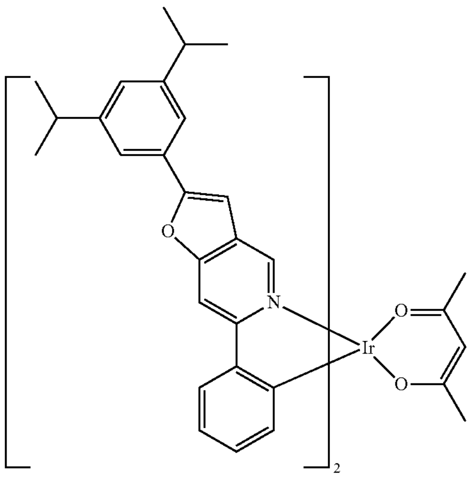
121
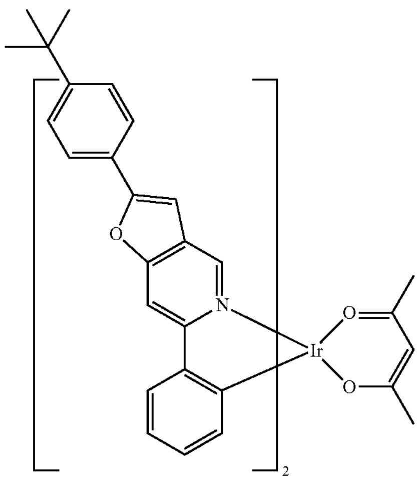
122
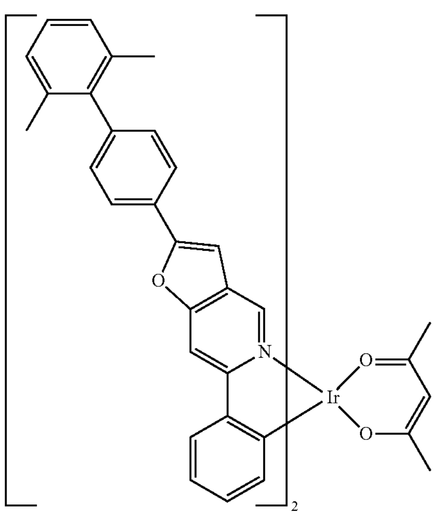
-continued
123
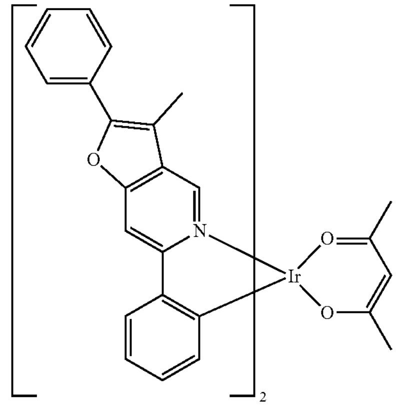
124
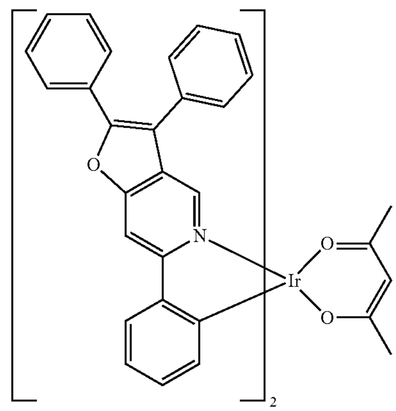
125
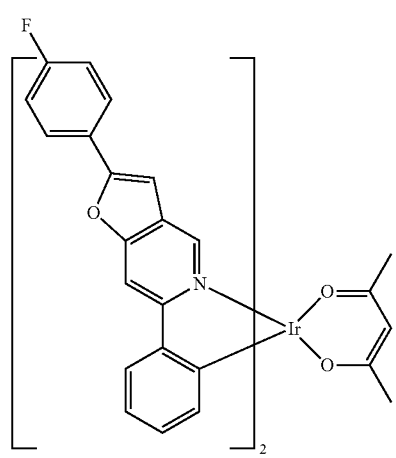

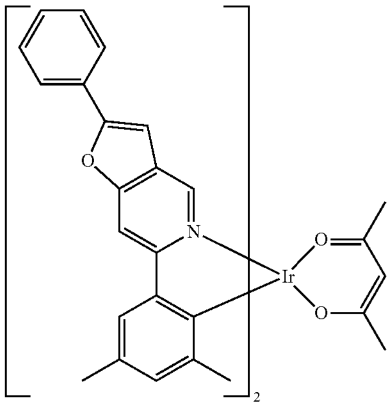
126
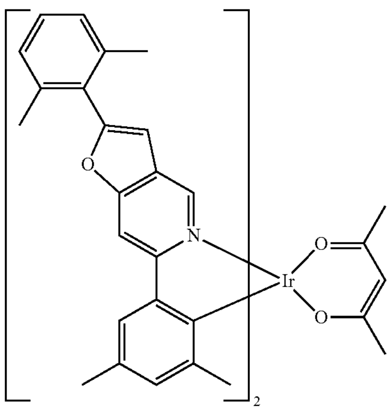
127
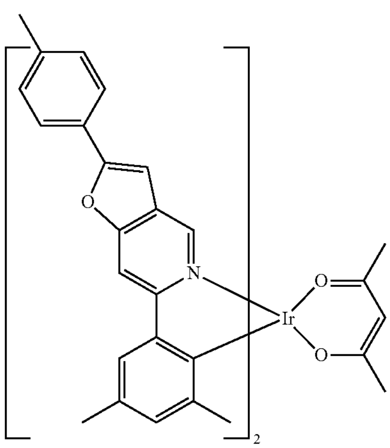
128
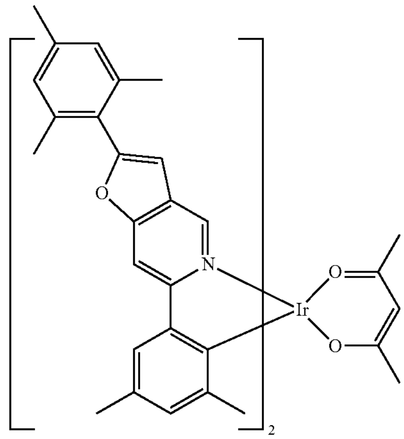
129
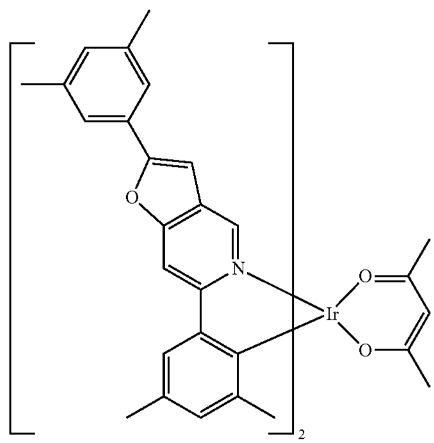
130
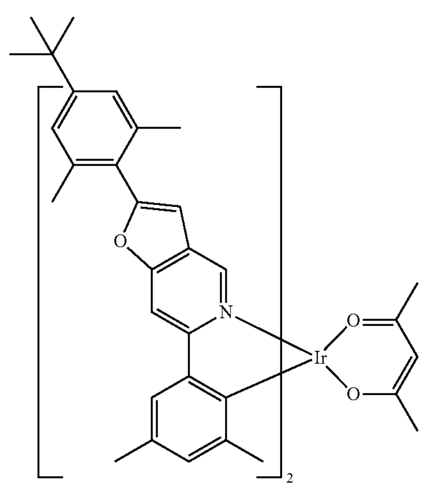
131

-continued
132
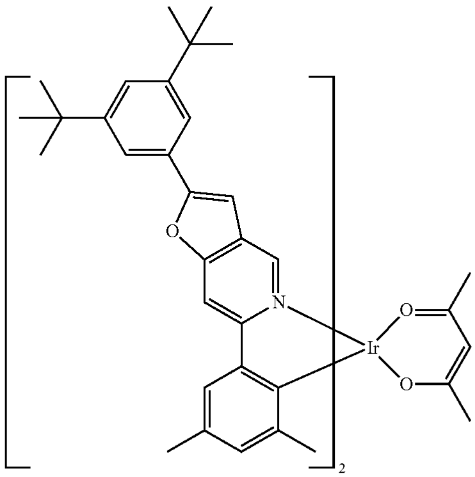
133
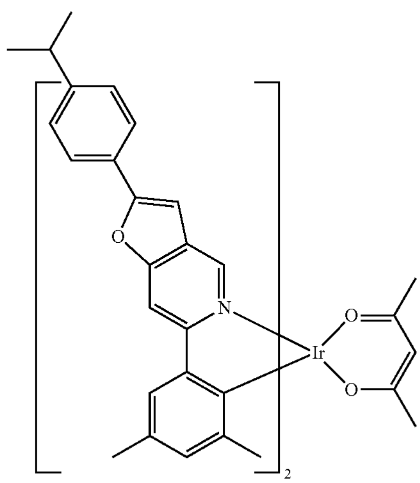
134
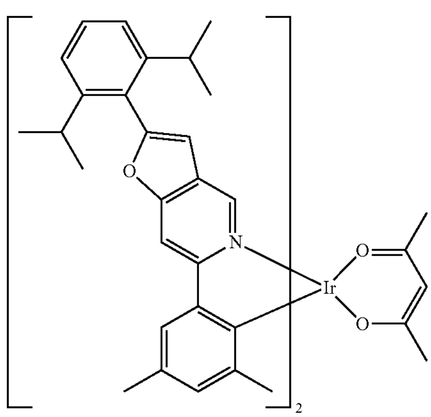
-continued
135
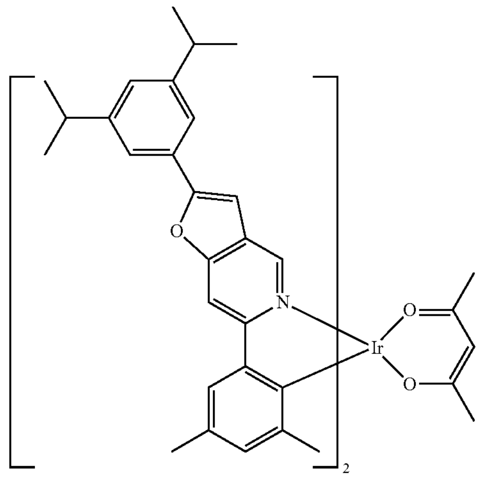
136
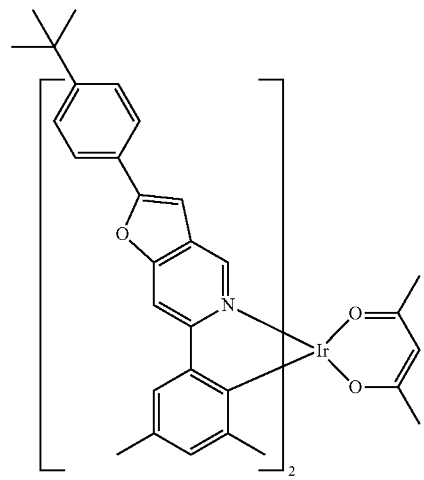
137
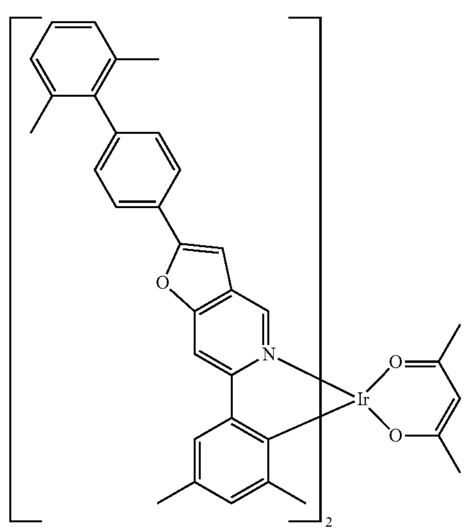

-continued
138
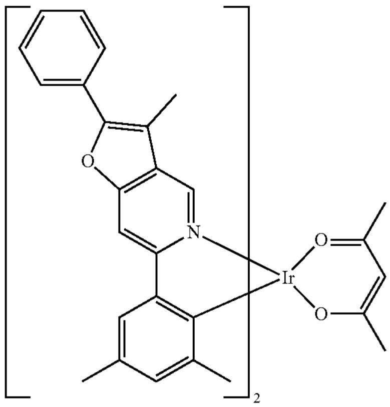
139
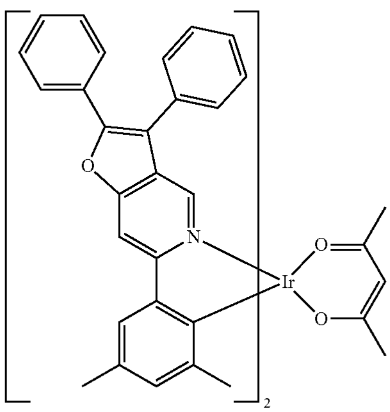
140
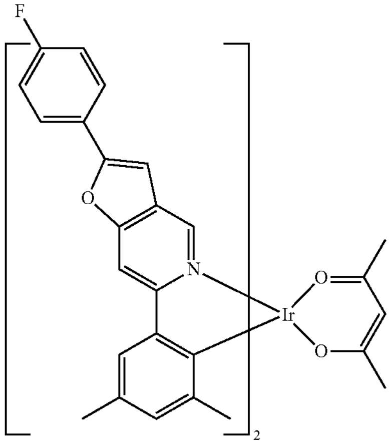
-continued
141
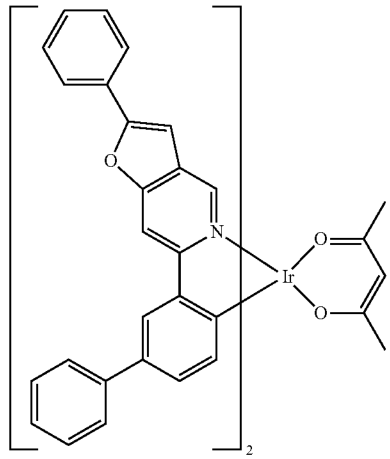
142
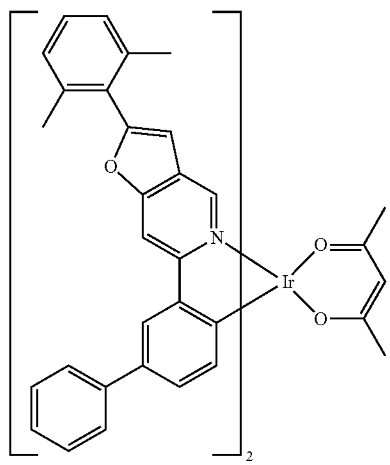
143
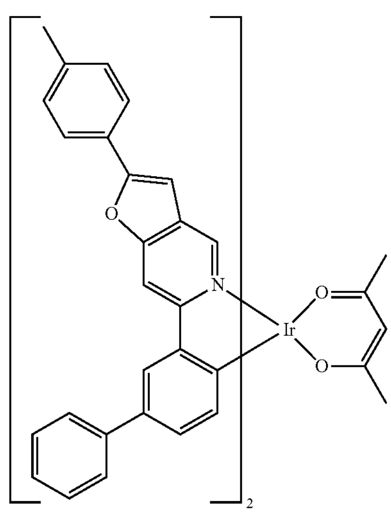

-continued
144
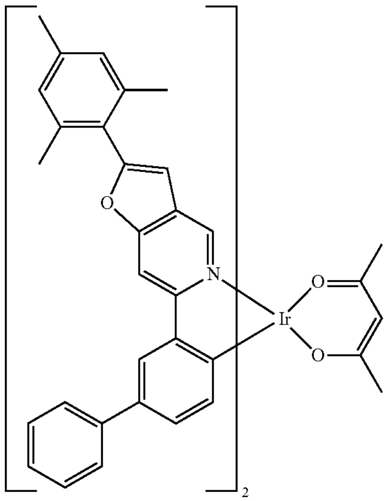
145
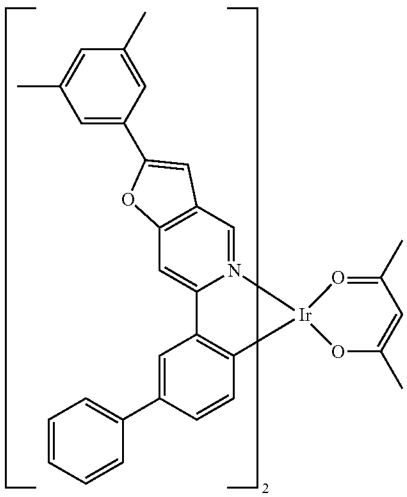
146
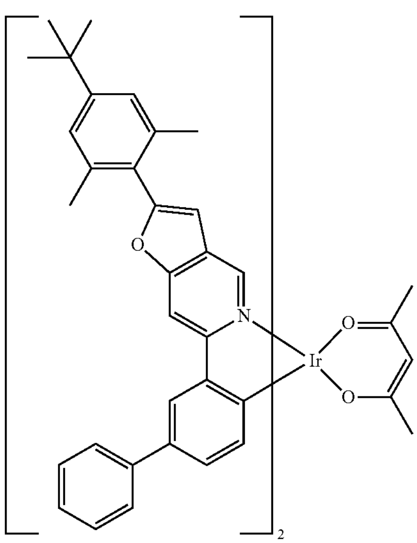
147
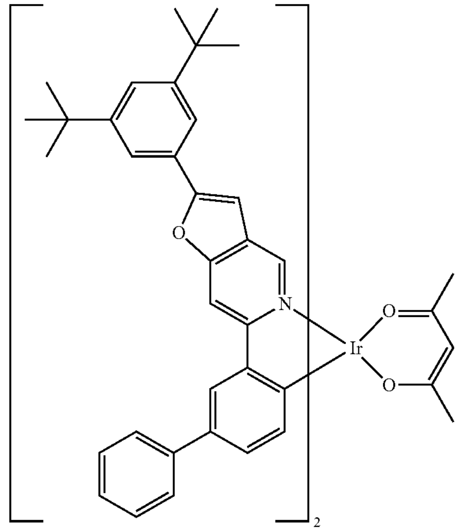
148
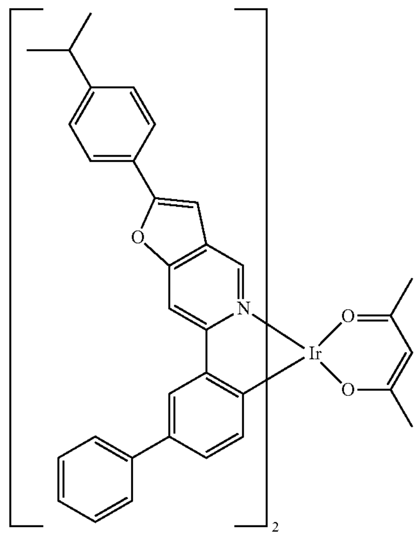
149
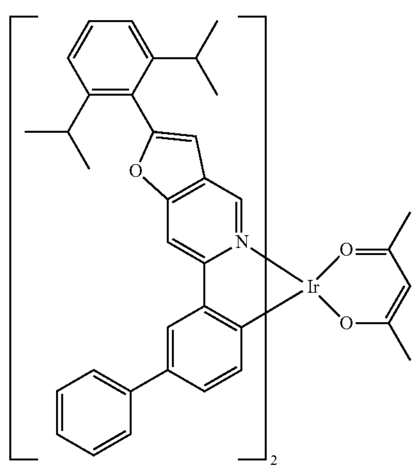

-continued
150
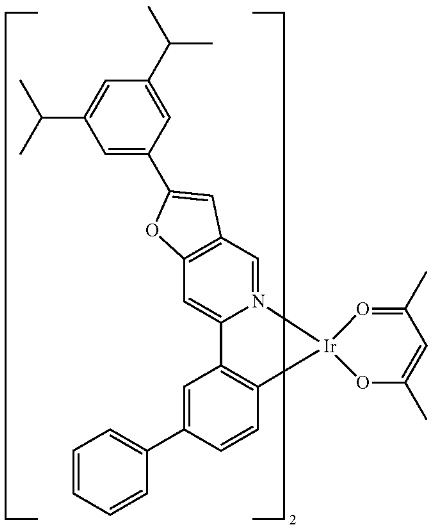
151
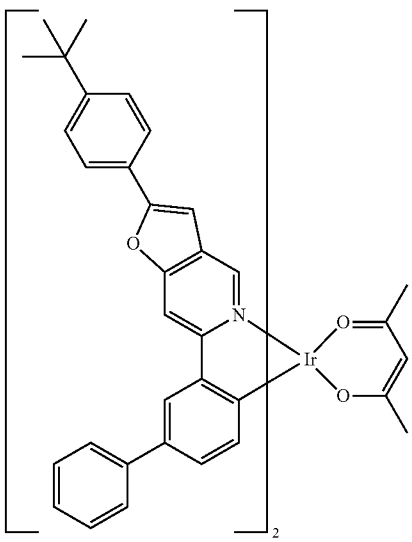
152
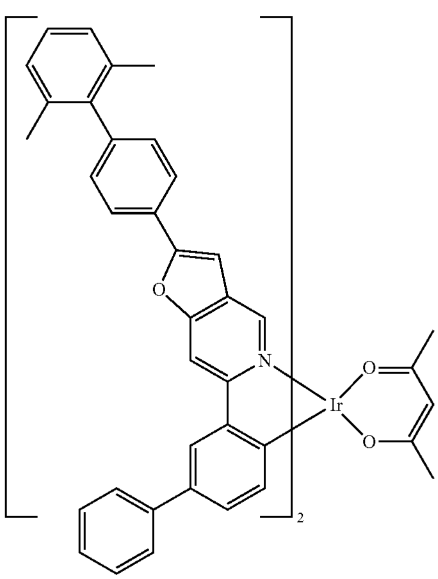
-continued
153
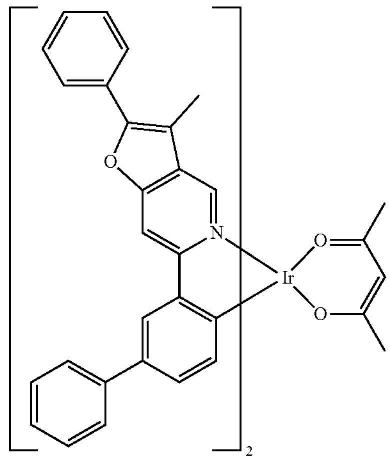
154
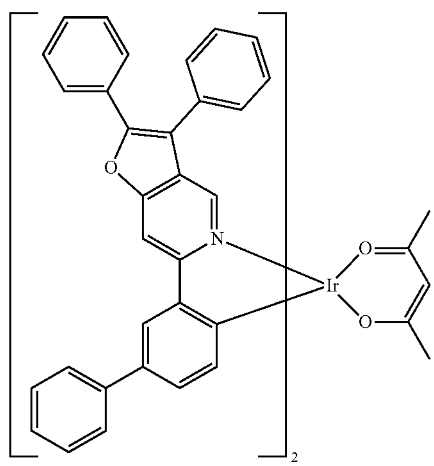
155
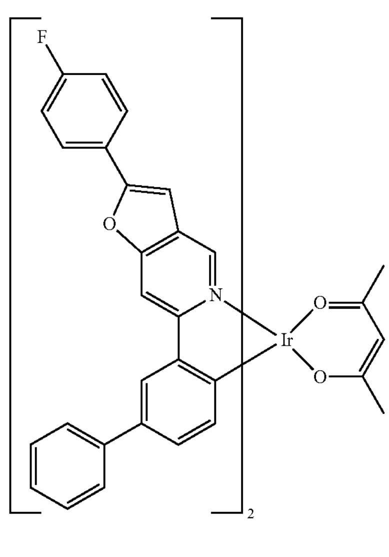

-continued
156
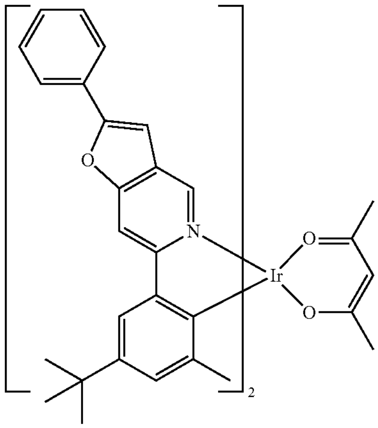
157
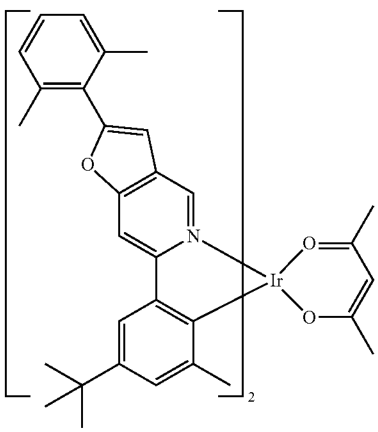
158
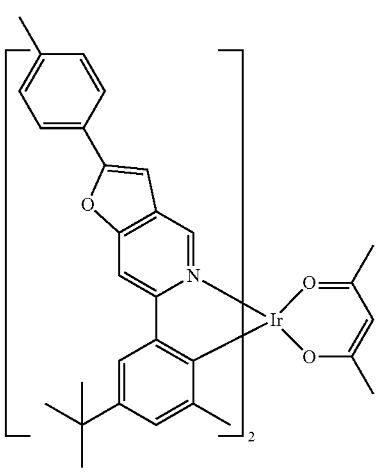
-continued
159
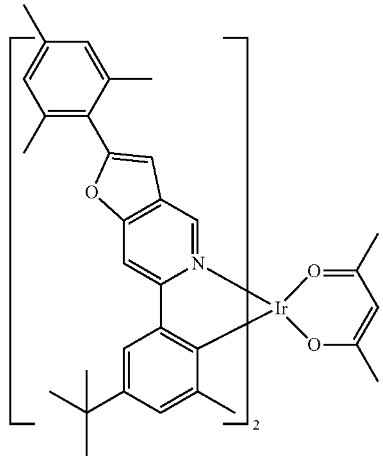
160
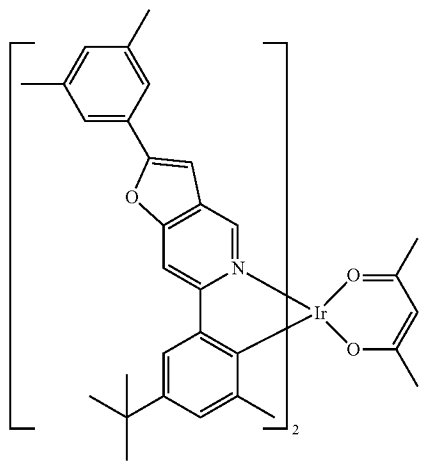
161
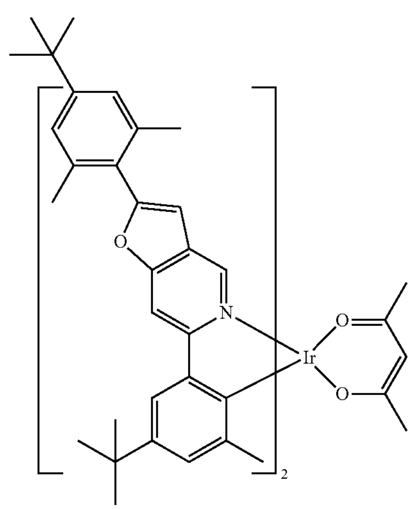

-continued
162
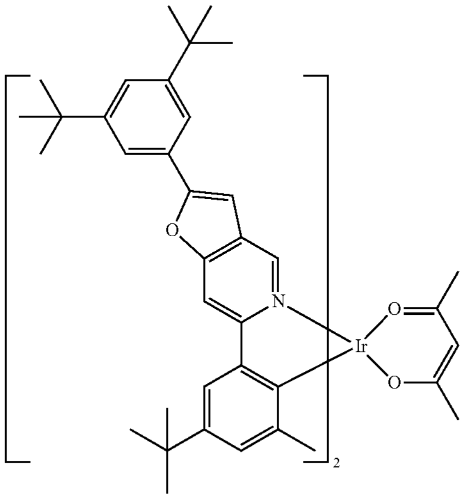
163
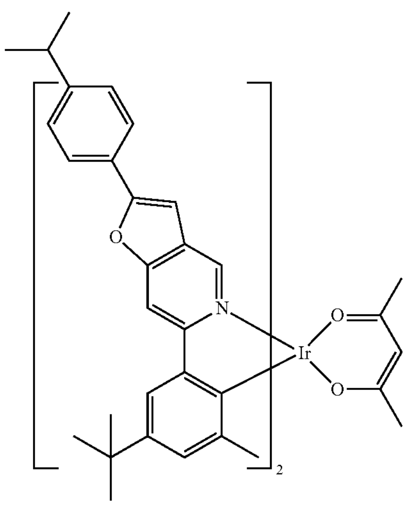
164
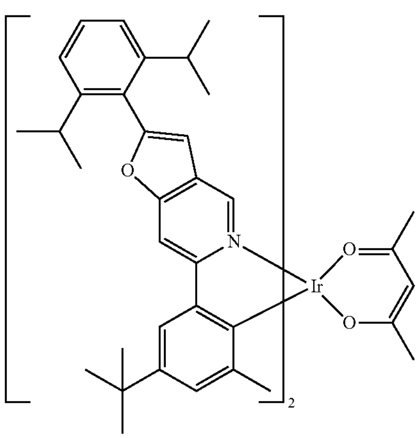
-continued
165
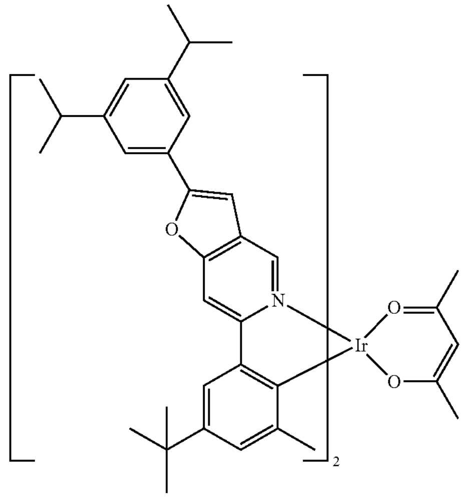
166
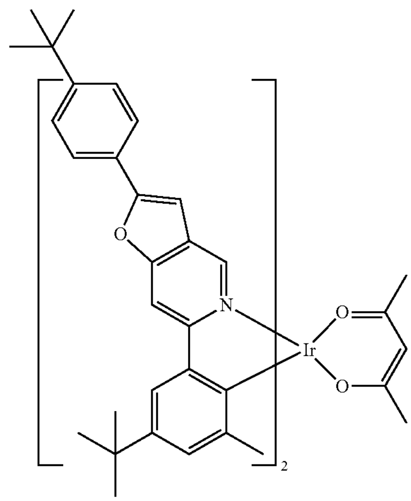
167
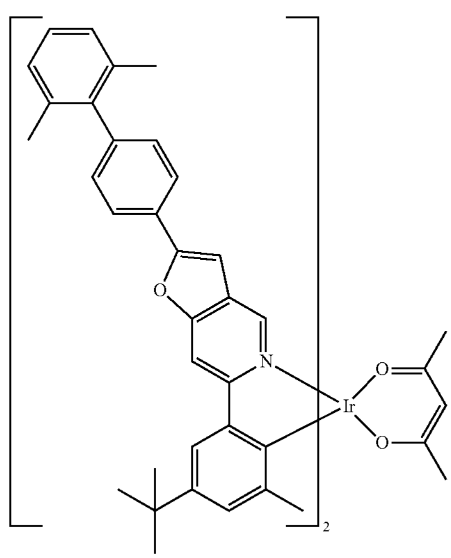

-continued
168
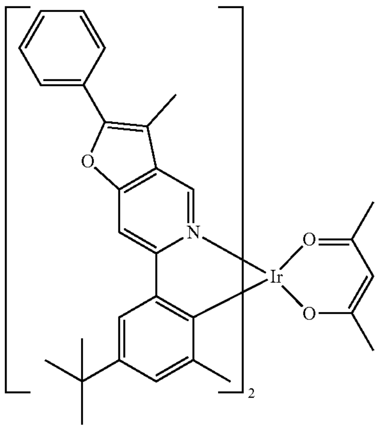
169
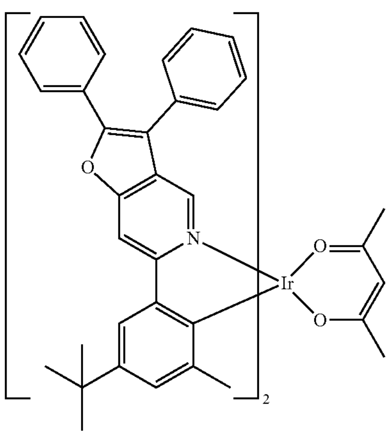
170
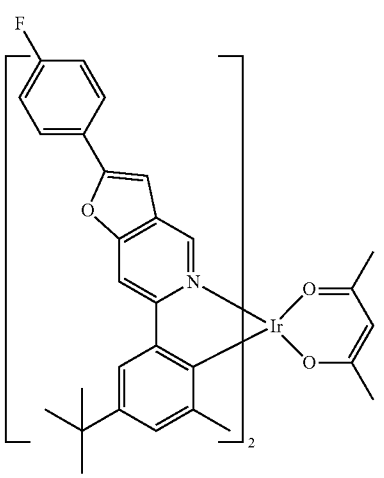
171
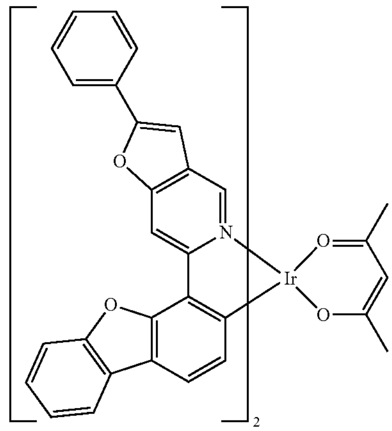
172
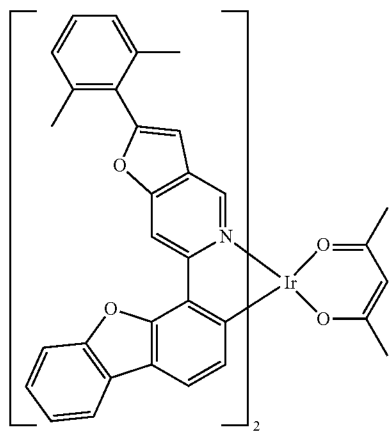
173
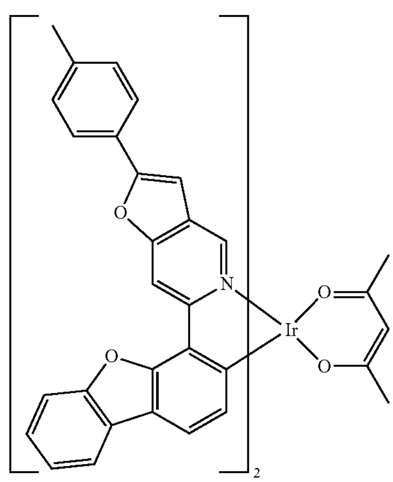

-continued
174
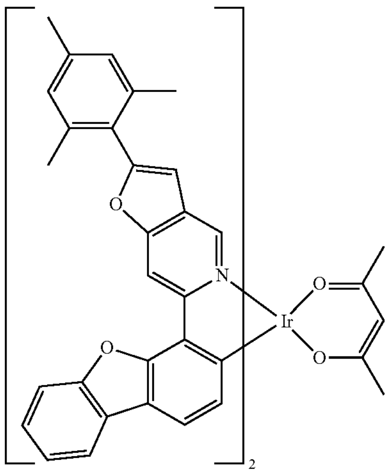
175
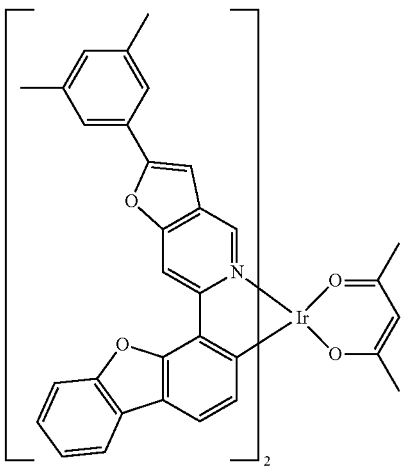
176
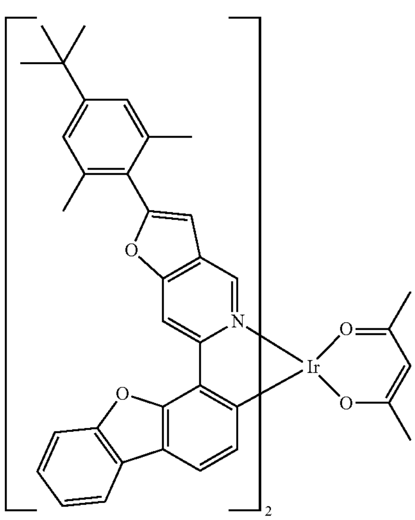
-continued
177
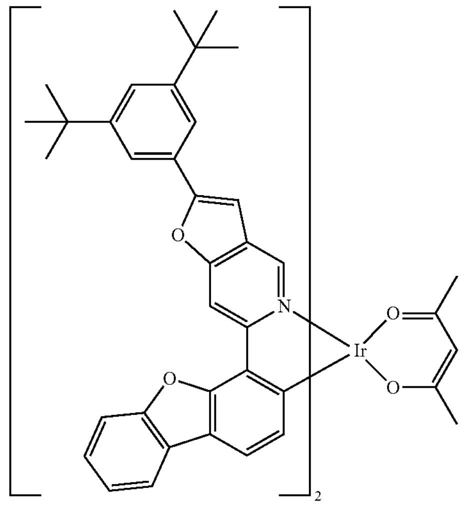
178
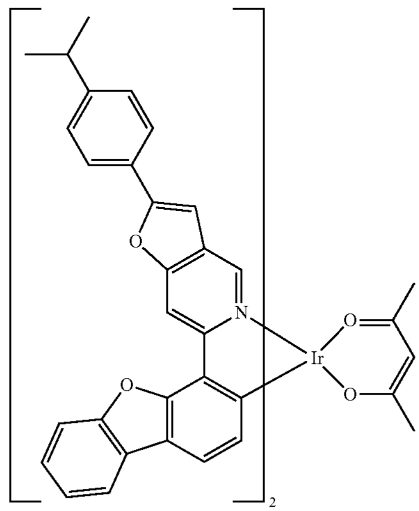
179
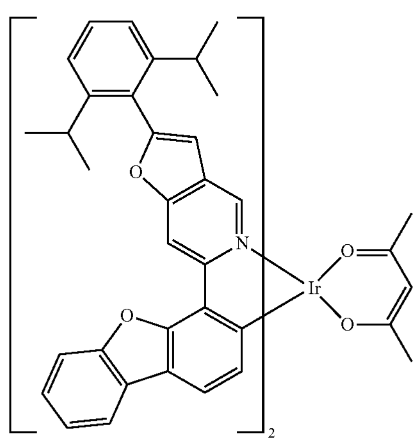

-continued
180
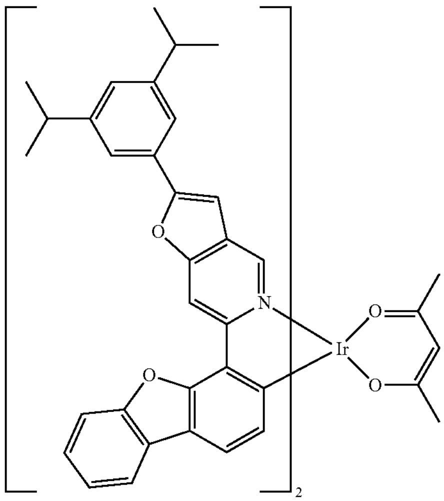
181
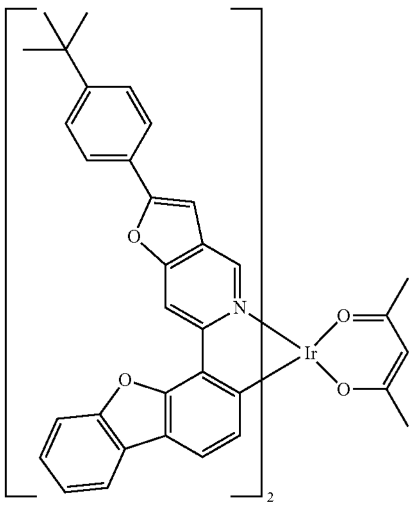
182
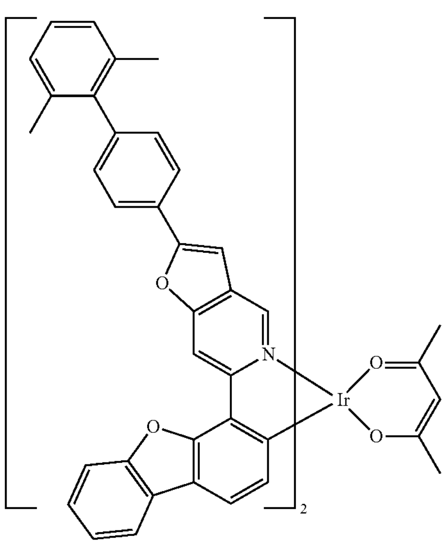
-continued
183
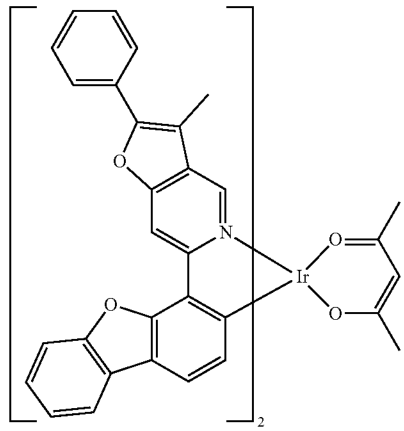
184
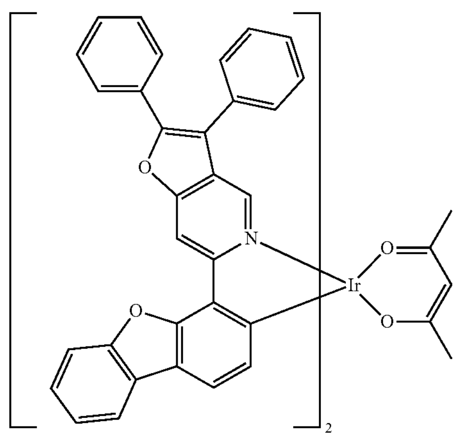
185
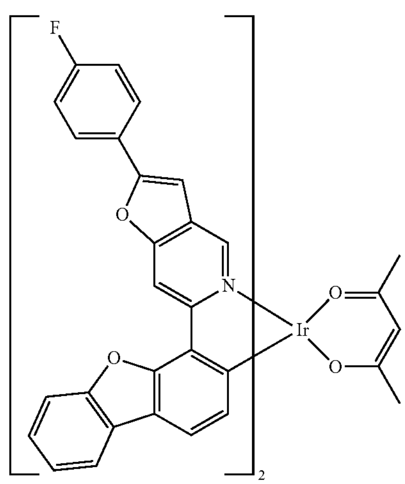

-continued
186
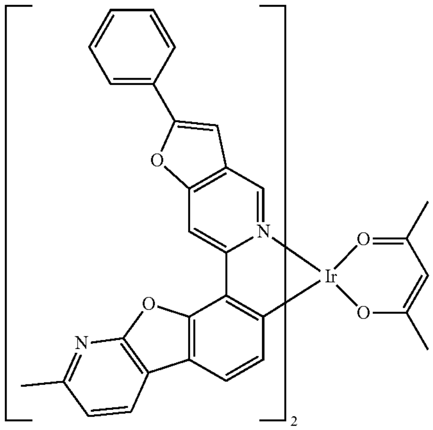
187
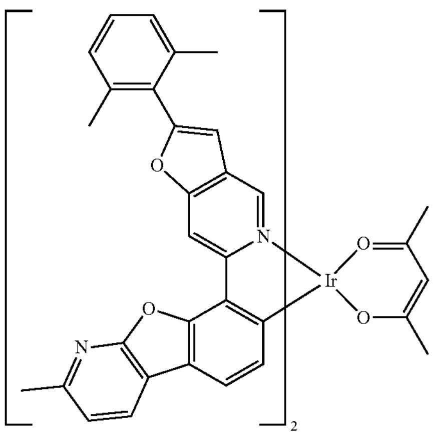
188
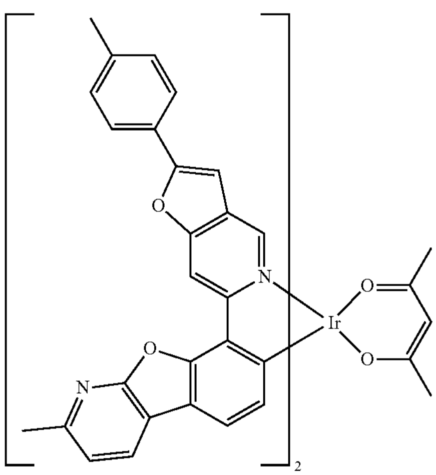
-continued
189
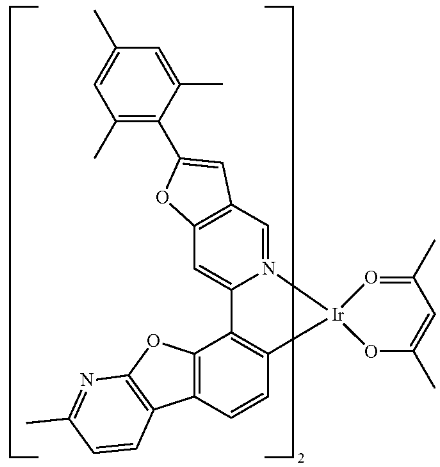
190
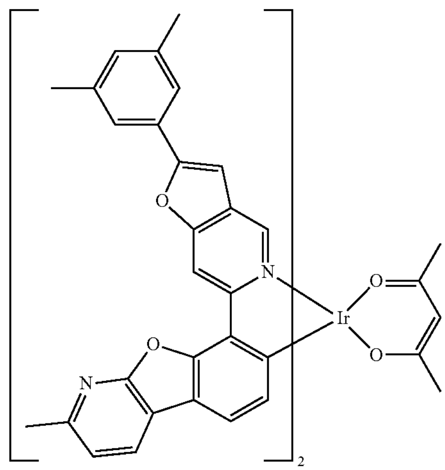
191
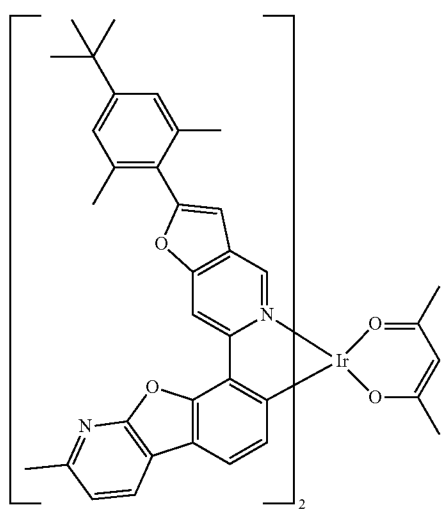

-continued
192
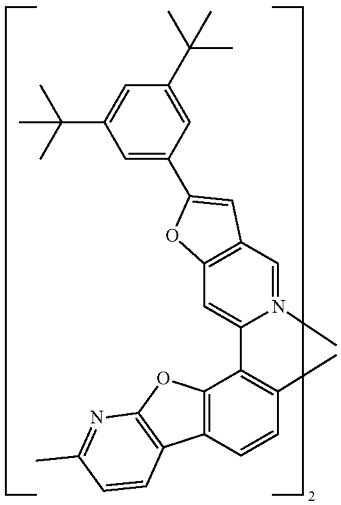
193
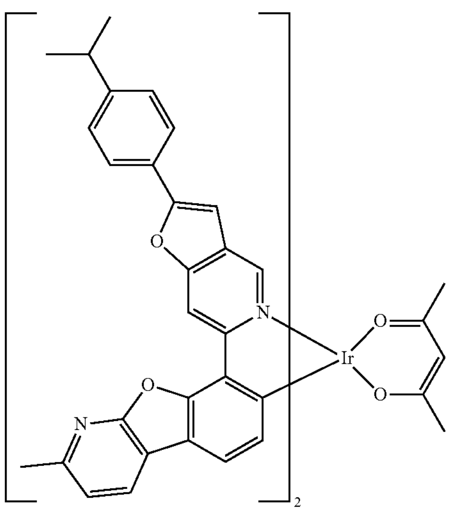
194
-continued
195
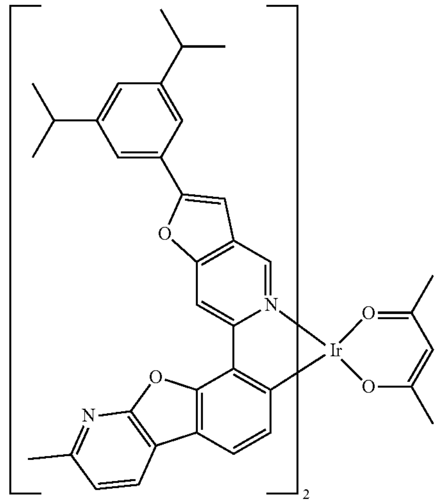
196
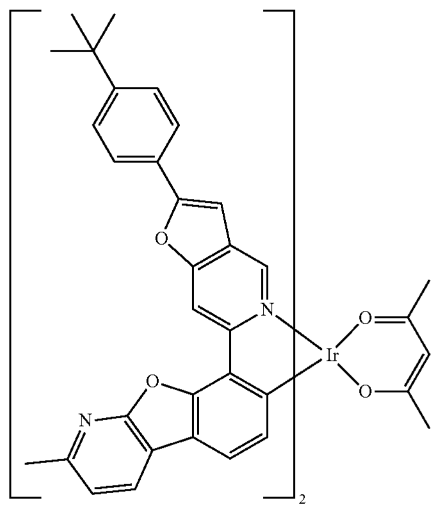
197
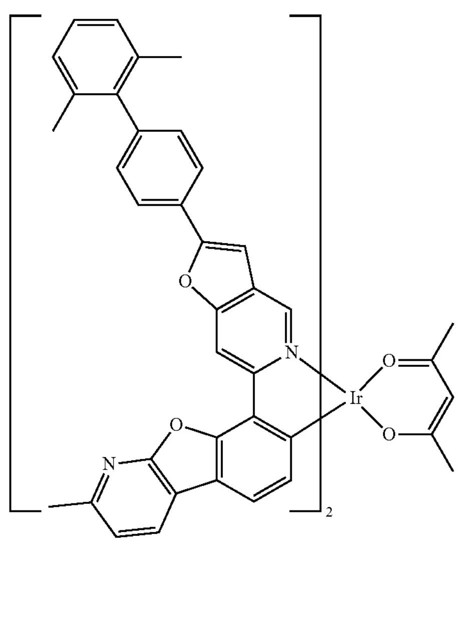

-continued
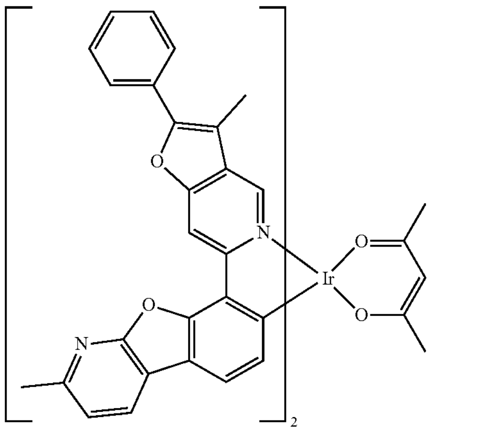
198
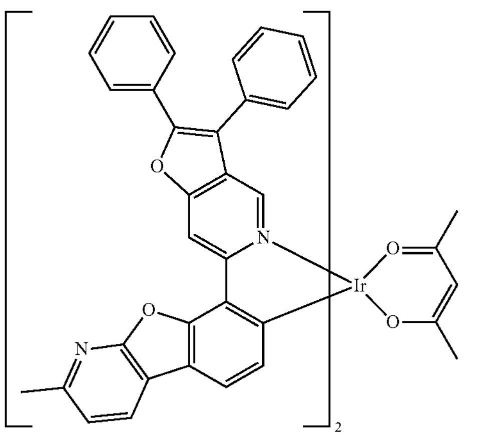
199
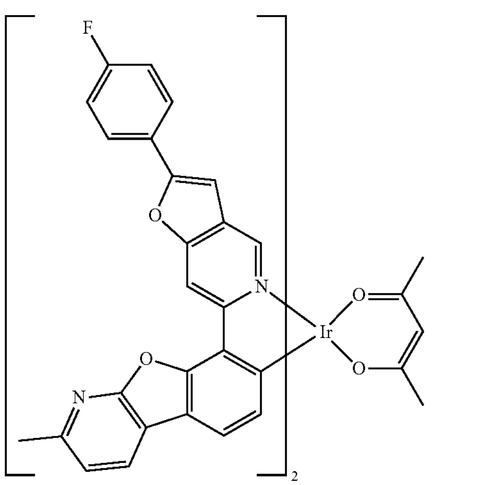
200
-continued
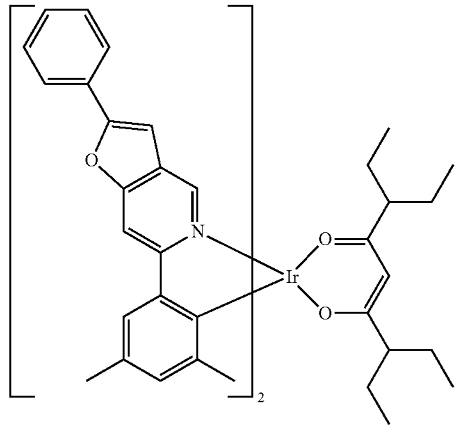
201
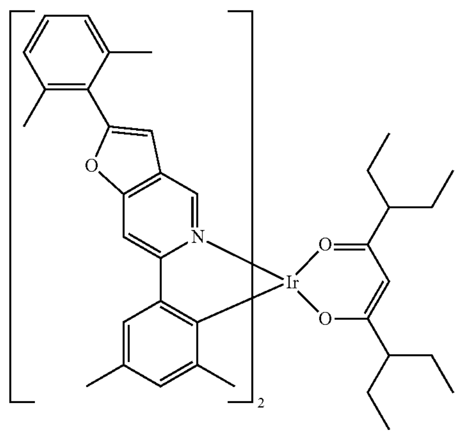
202
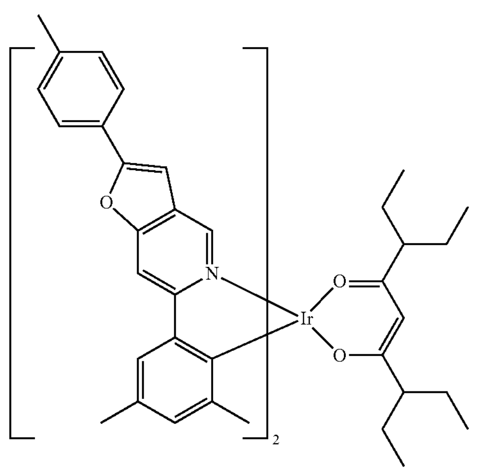
203

-continued
204
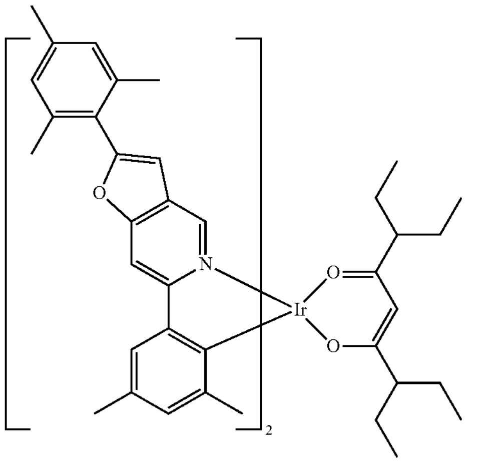
205
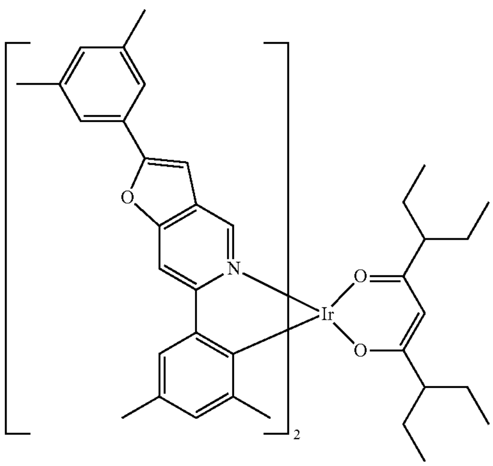
206
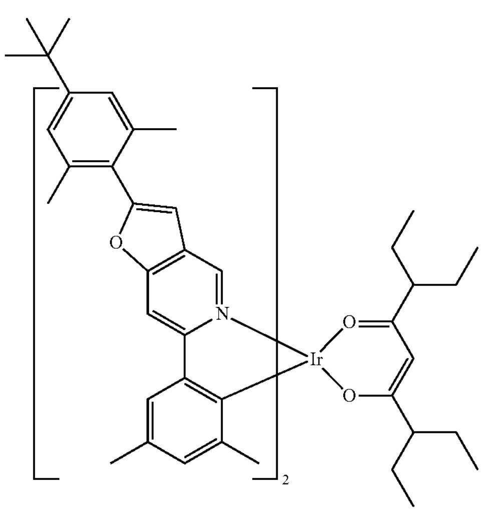
-continued
207
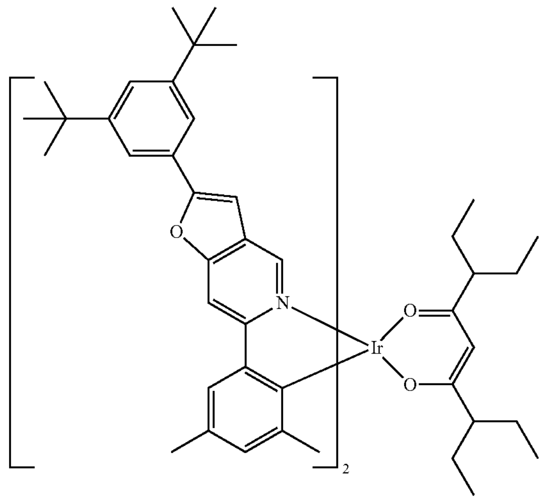
208
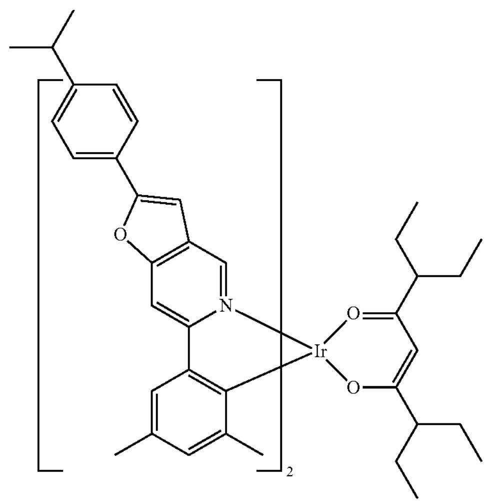
209
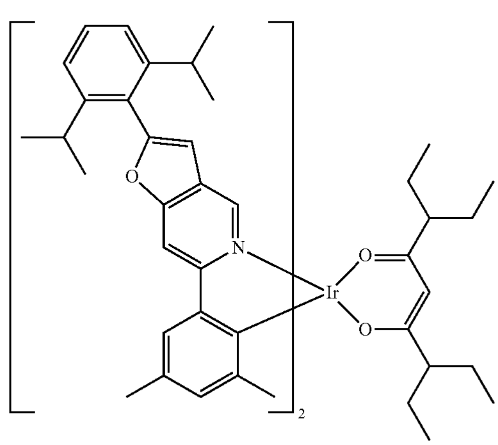

210
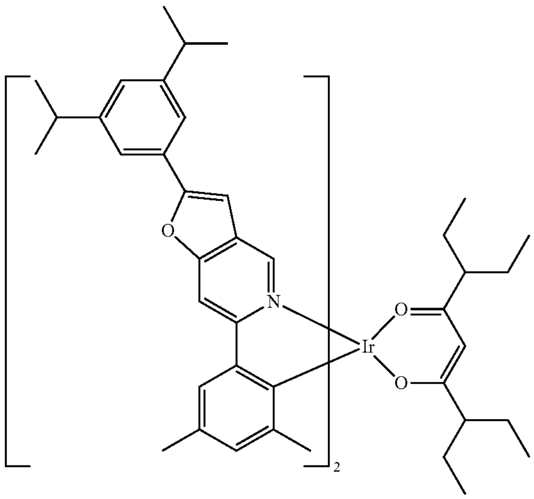
211
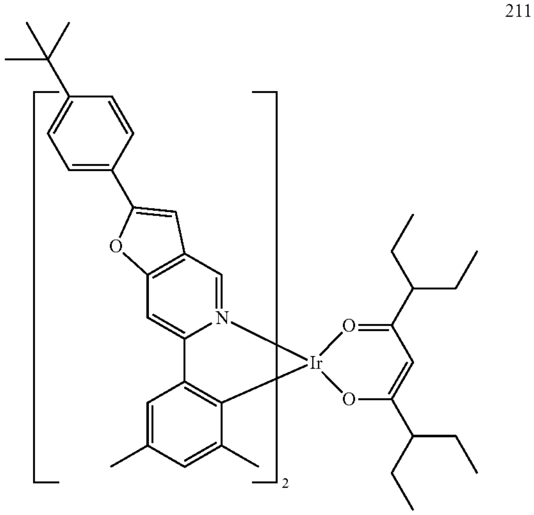
212
213
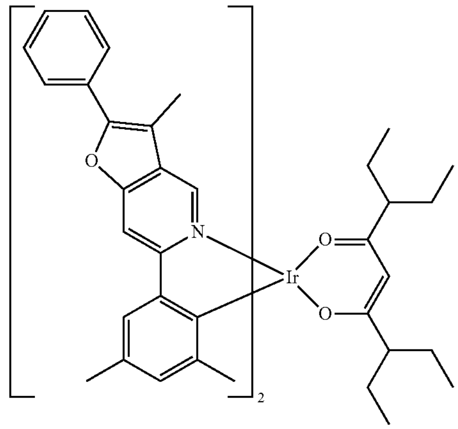
214
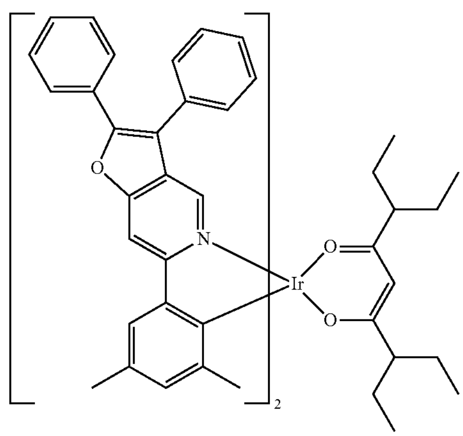
215
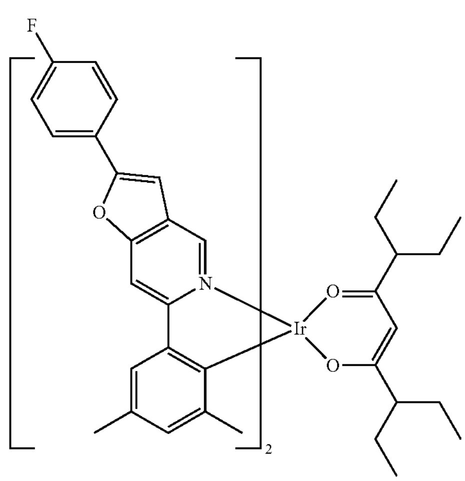

-continued
216
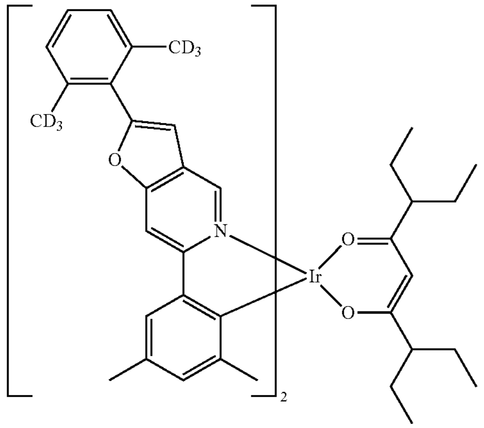
217
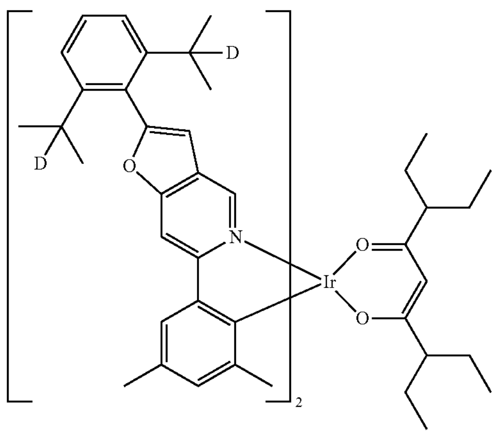
218
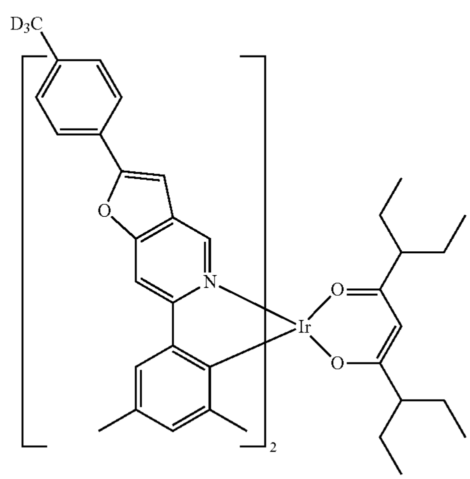
-continued
219
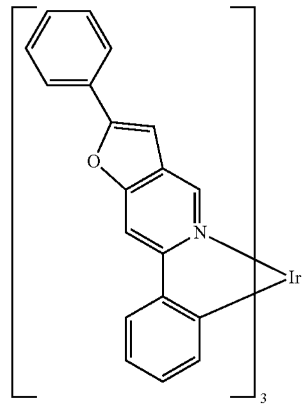
220
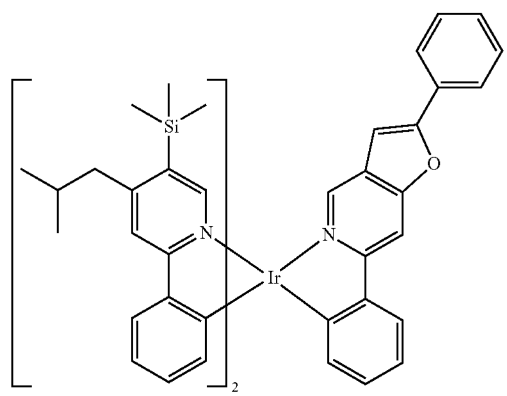
221
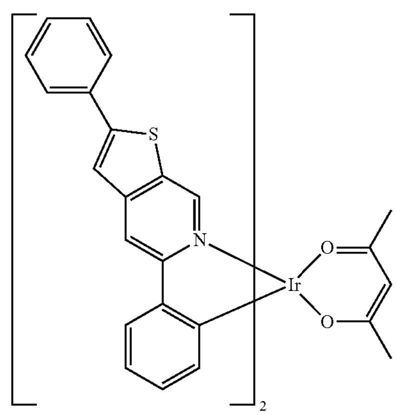
222
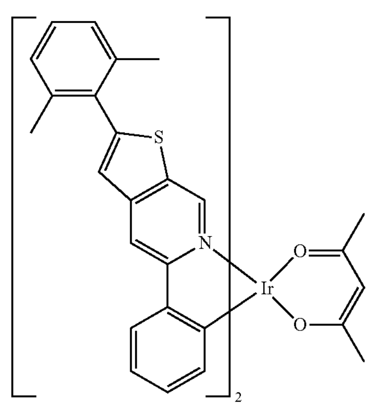

223
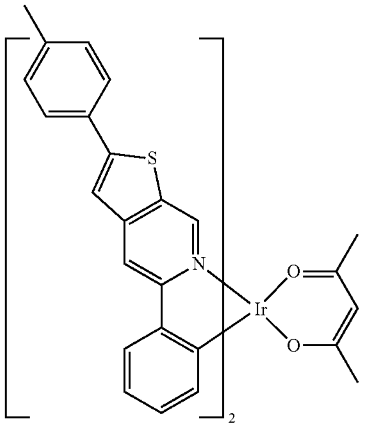
224
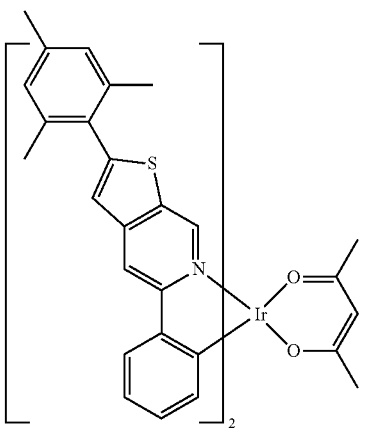
225
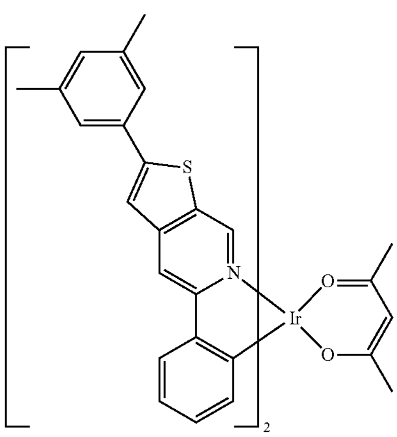
226
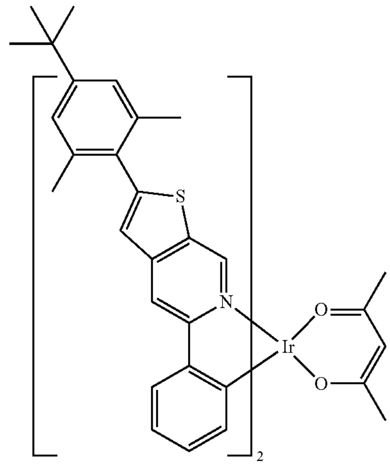
227
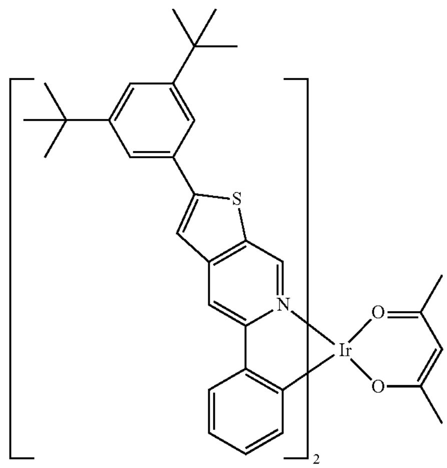
228
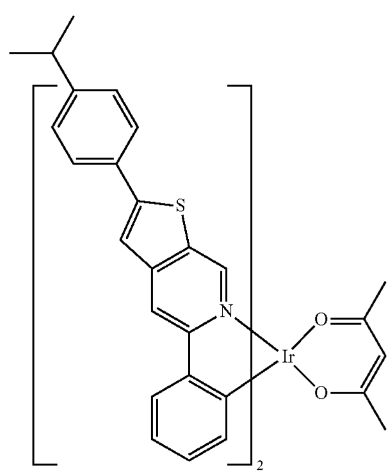

-continued
229
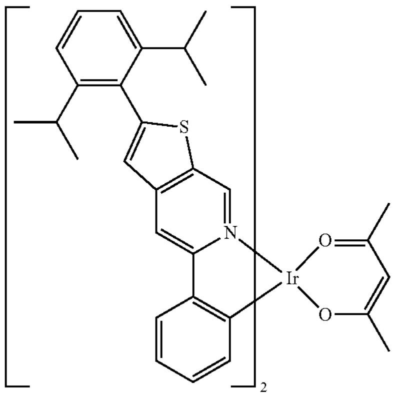
230
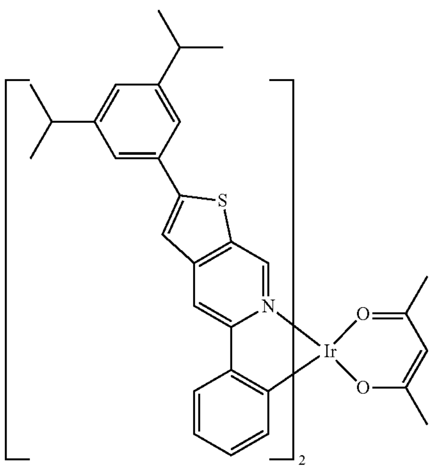
231
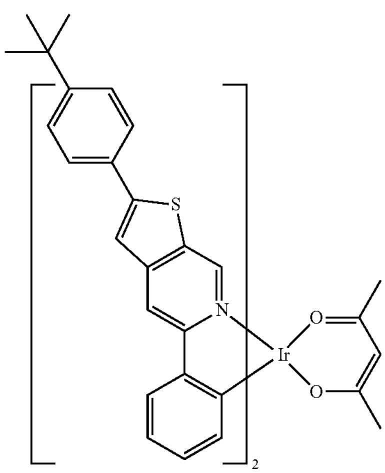
-continued
232
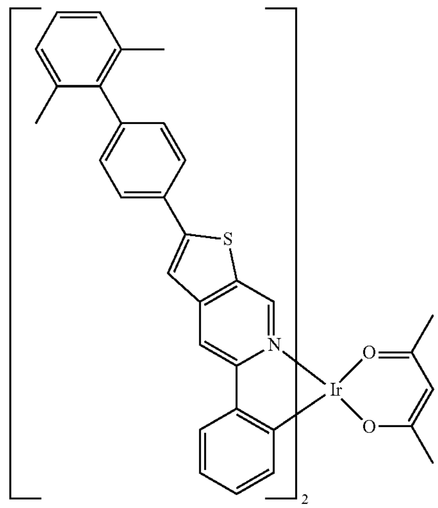
233
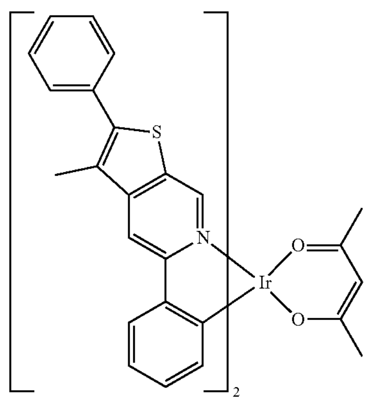
234
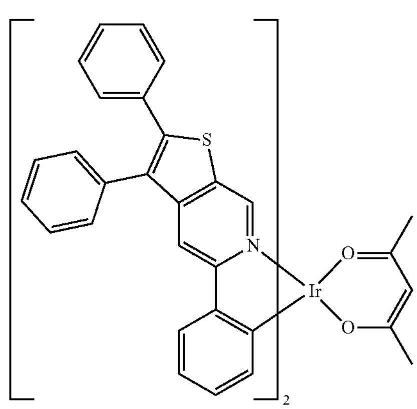

-continued
235
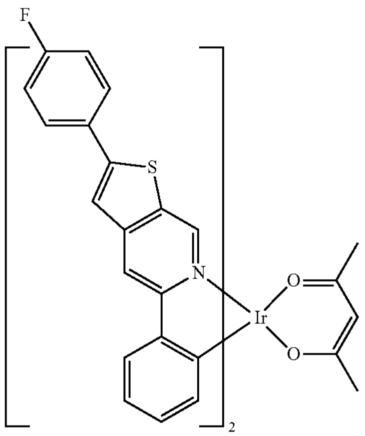
236
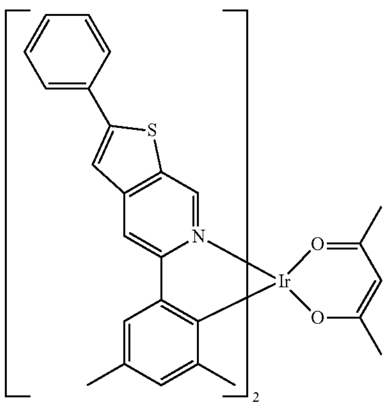
237
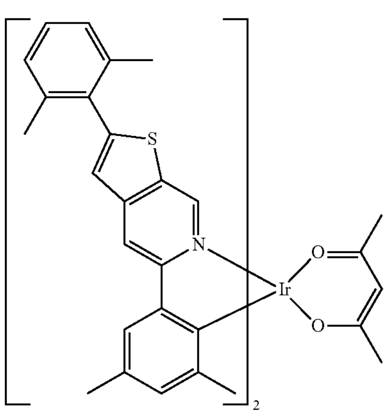
-continued
238
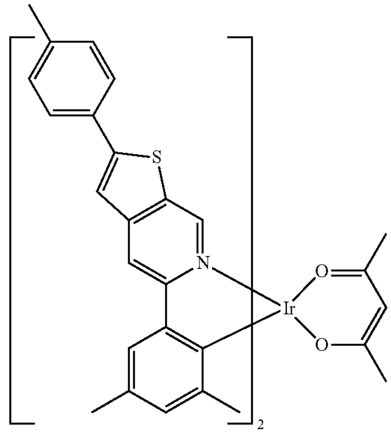
239
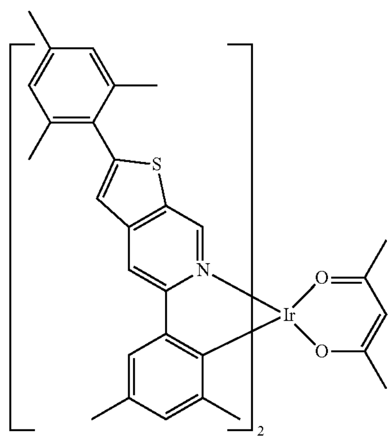
240
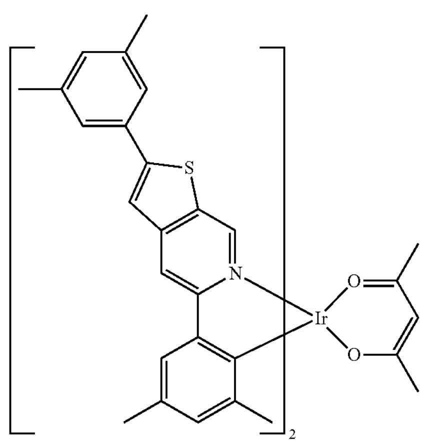

241
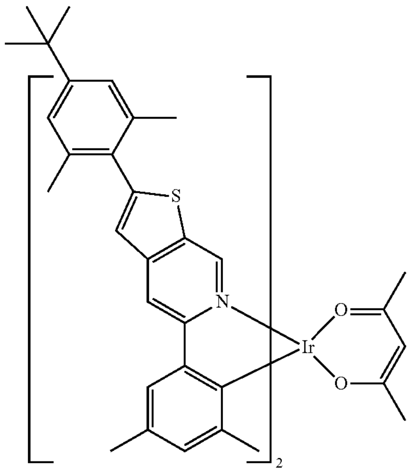
242
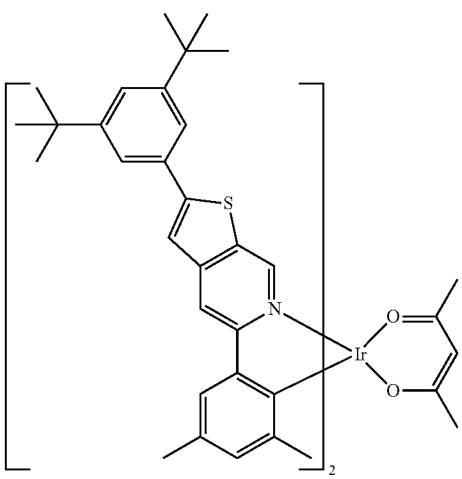
243
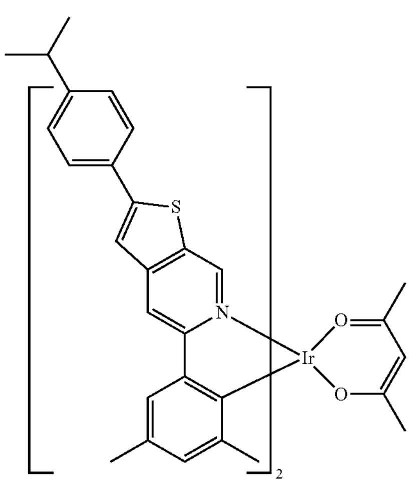
244
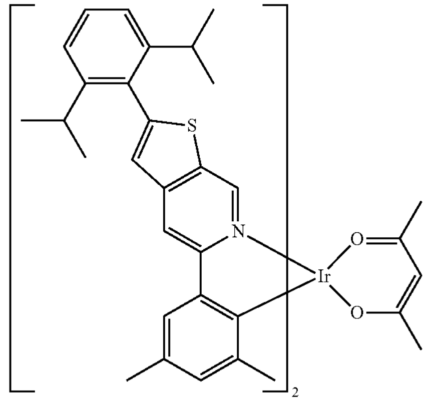
245
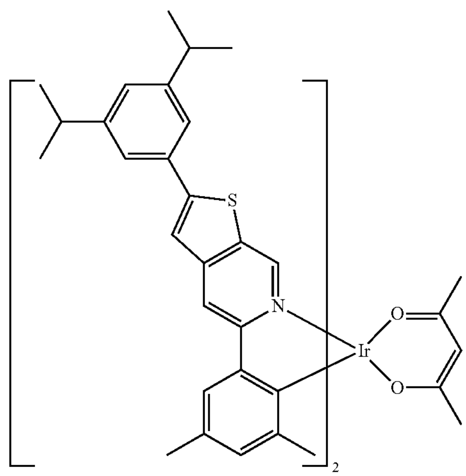
246
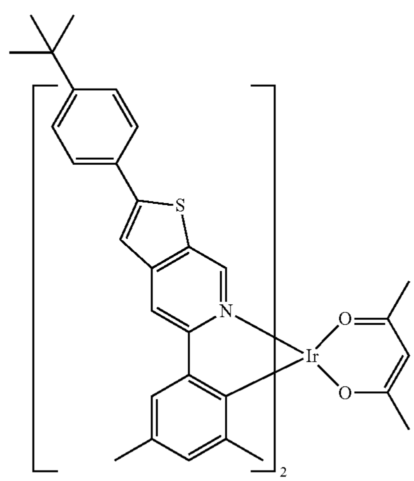

-continued
247
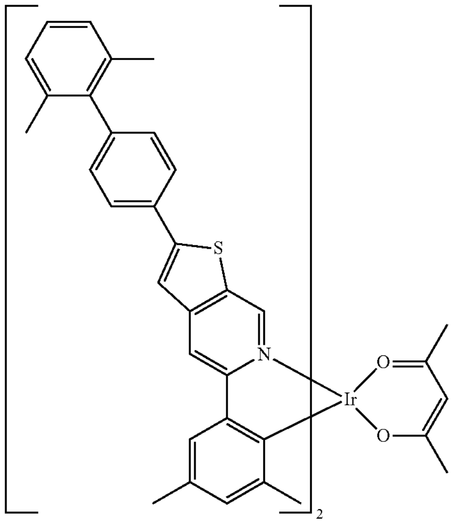
248
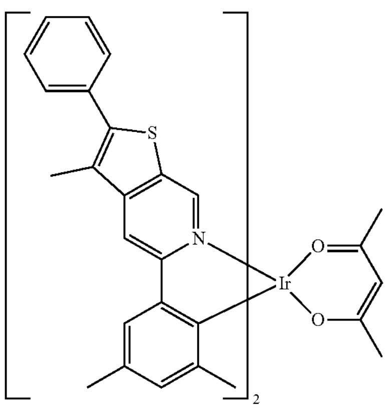
249
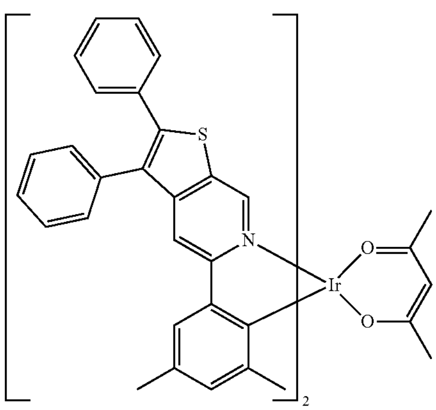
-continued
250
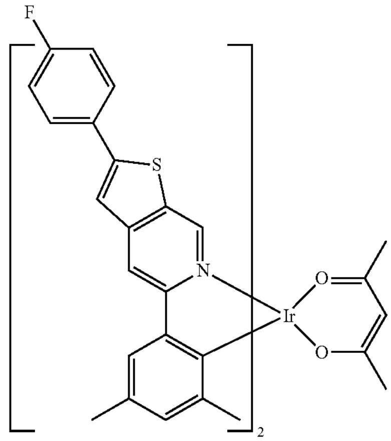
251
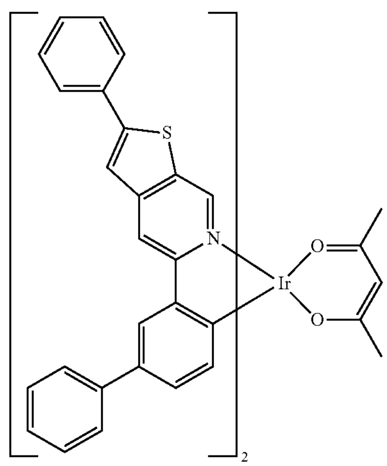
252
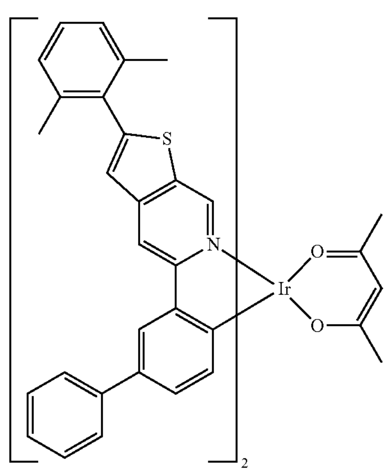

-continued
253
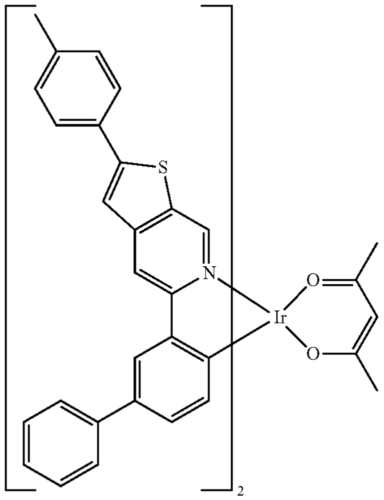
254
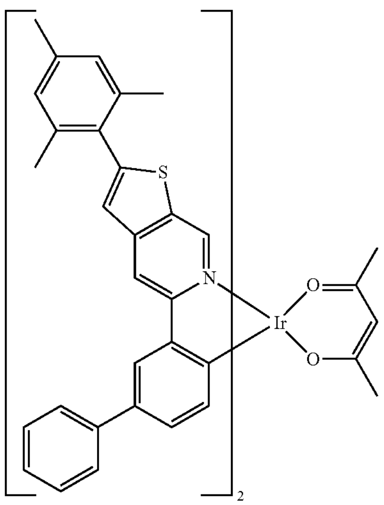
255
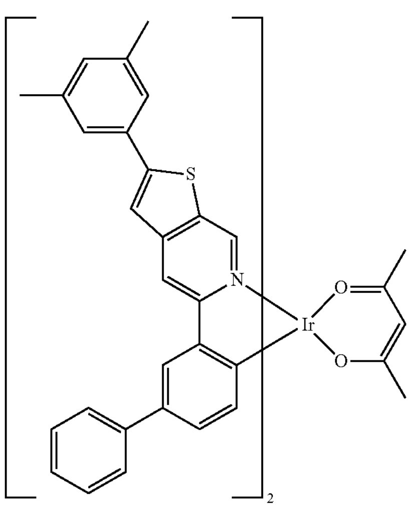
-continued
256
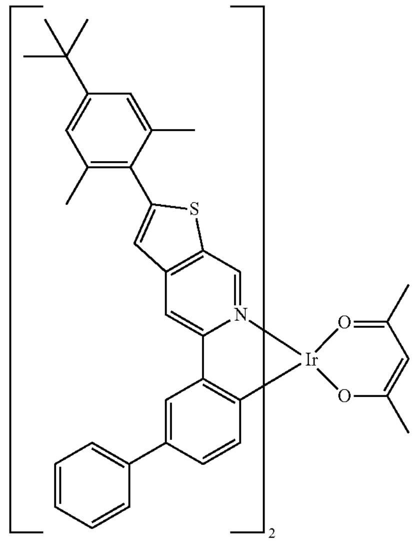
257
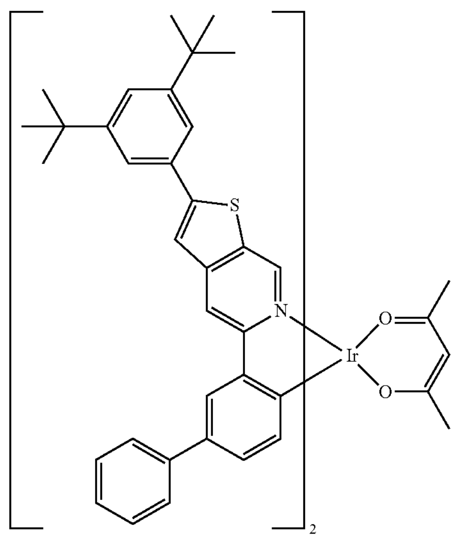
258
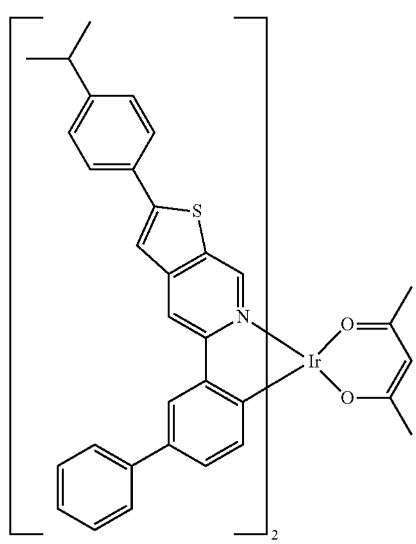

-continued
259
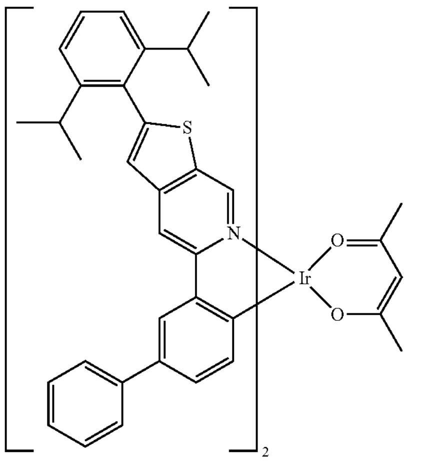
260
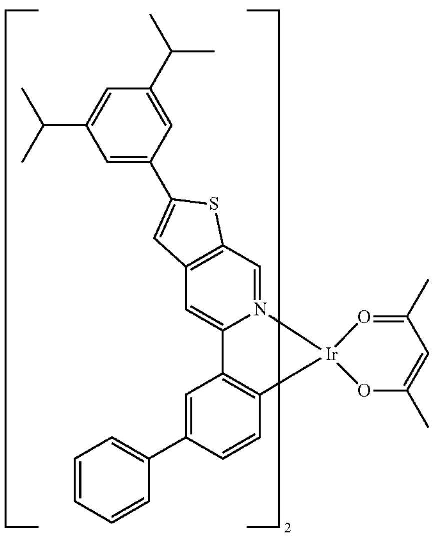
261
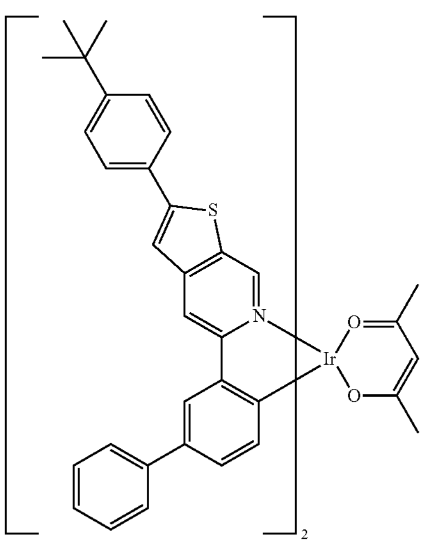
-continued
262
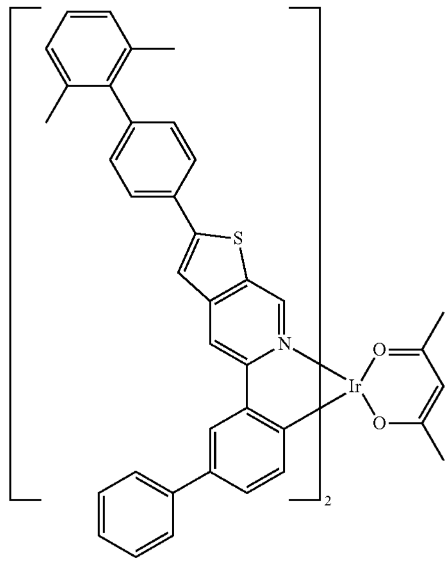
263
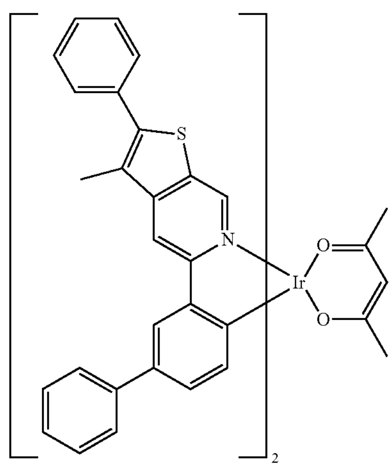
264
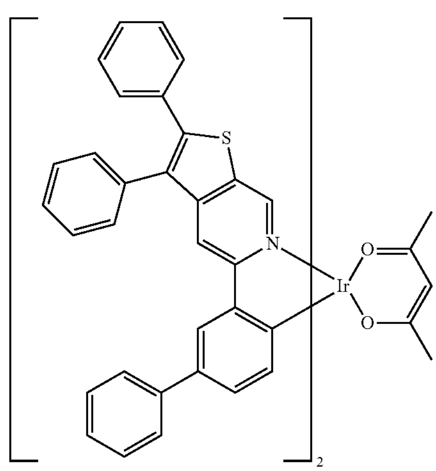

414
-continued
265
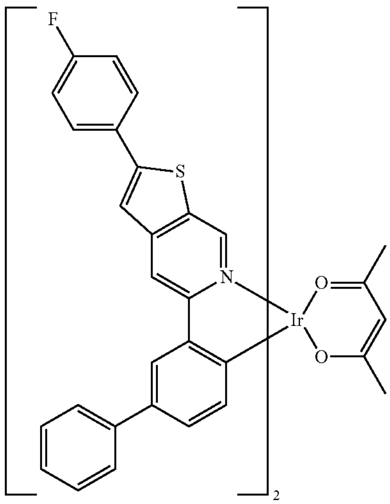
266
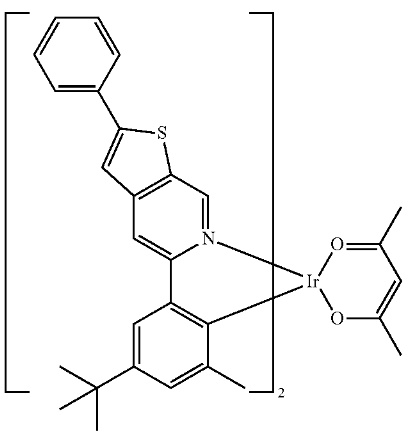
267
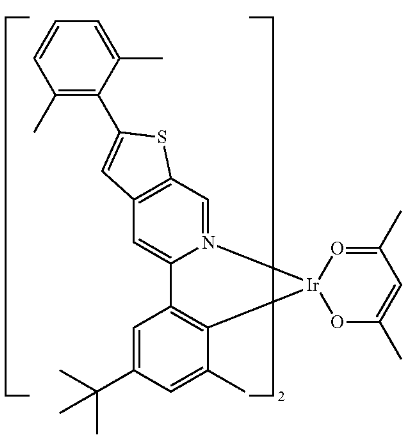
268
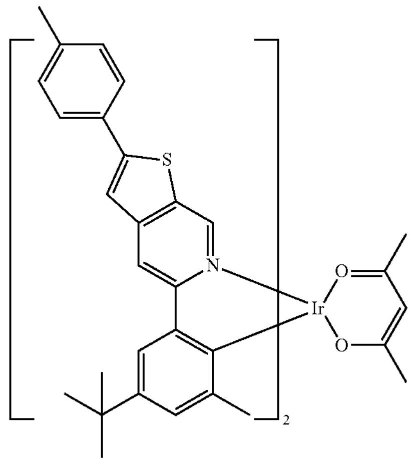
269
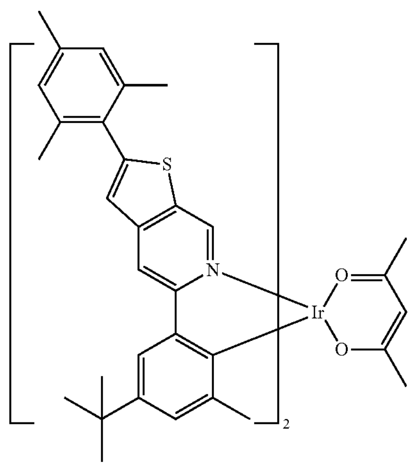
270
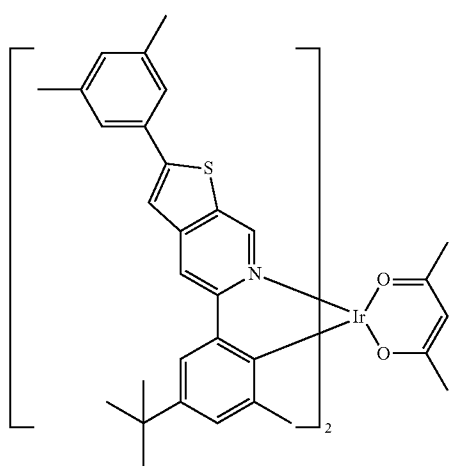

271
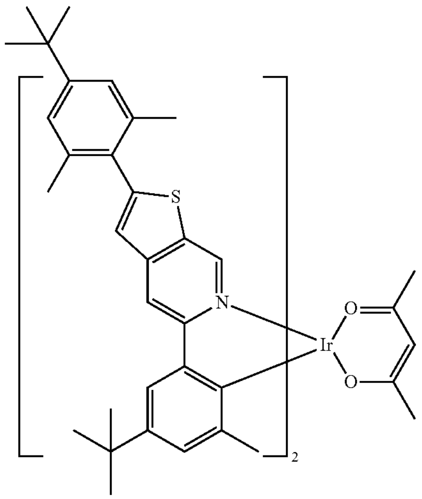
272
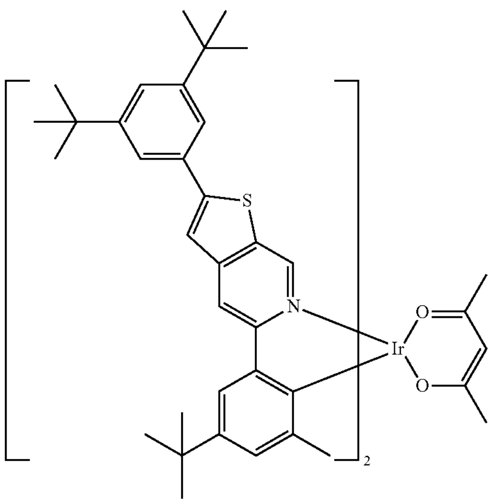
273
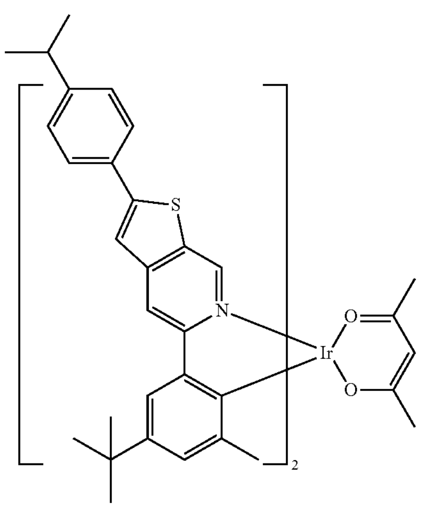
274
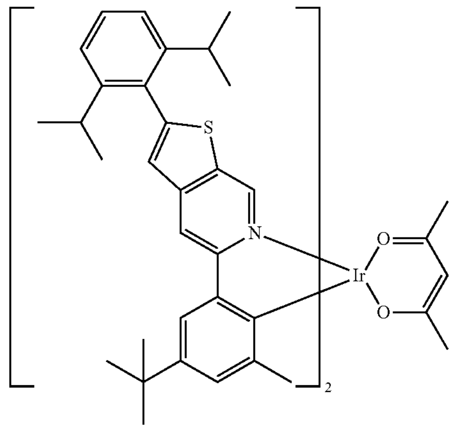
275
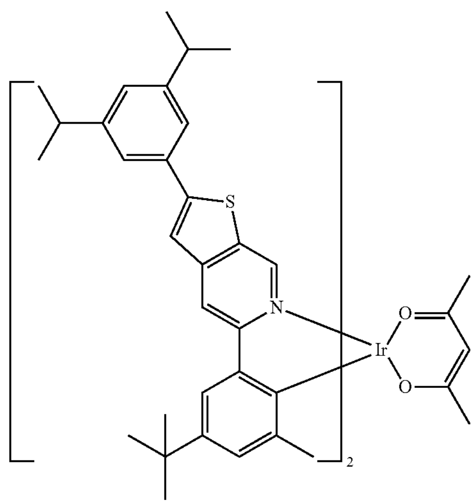
276
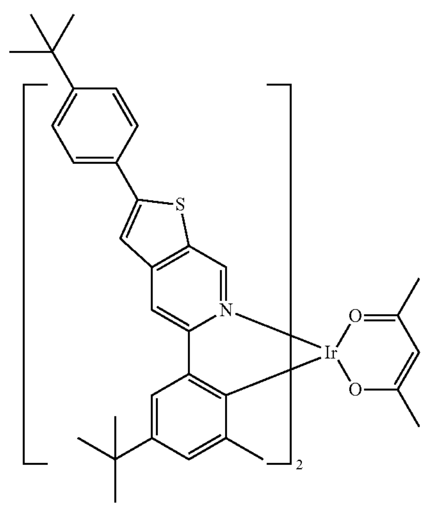

-continued
277
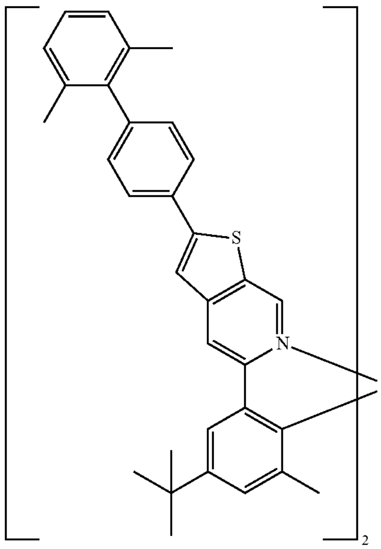
278
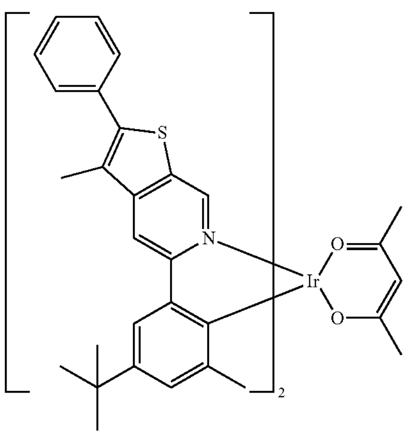
279
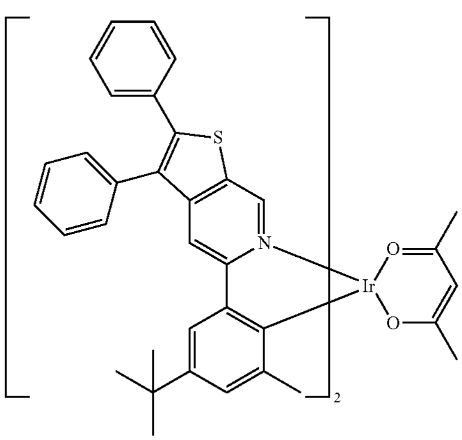
-continued
280
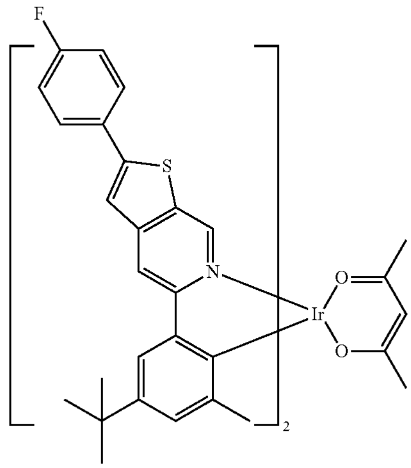
281
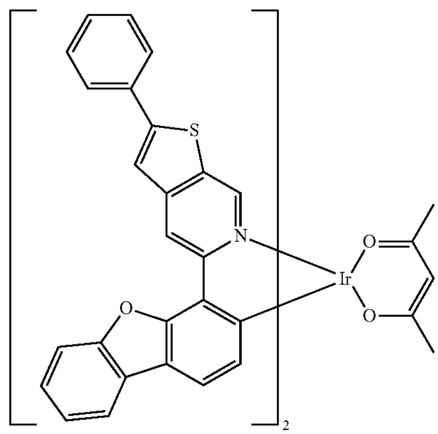
282
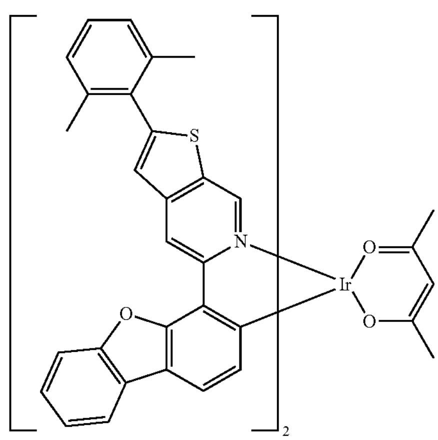

-continued
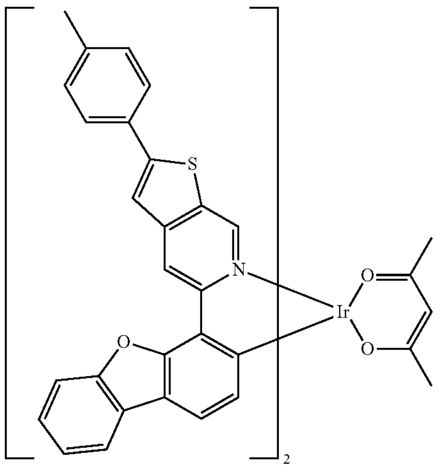
283
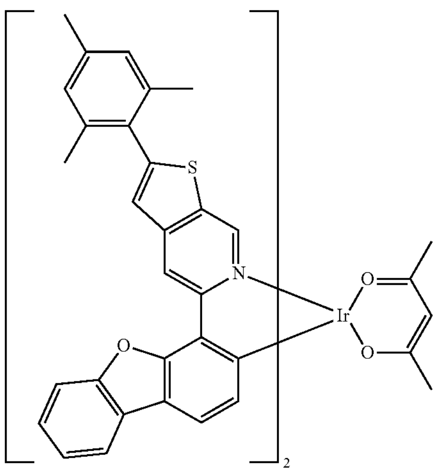
284
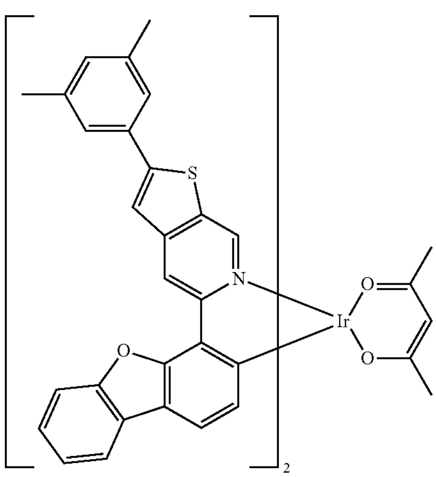
285
-continued
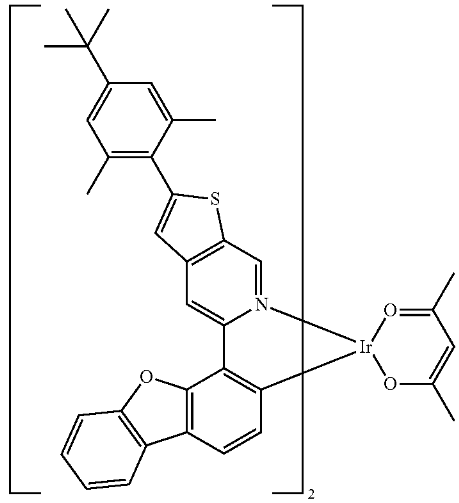
286
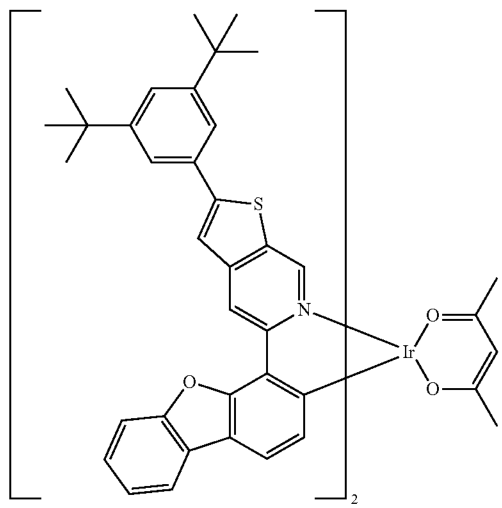
287
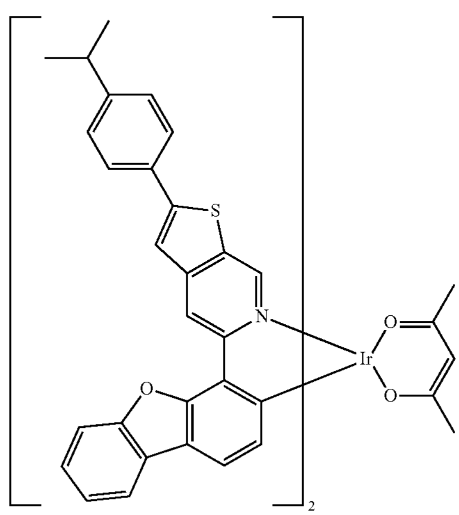
288

-continued
289
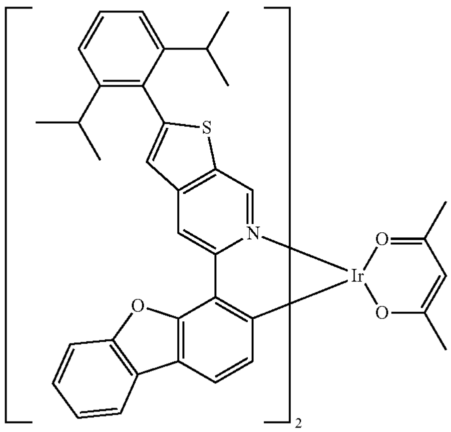
290
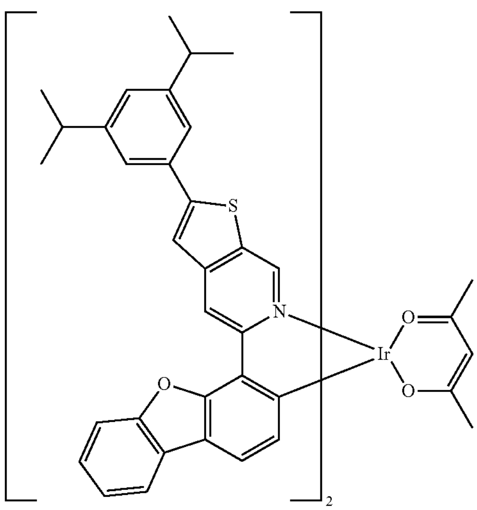
291
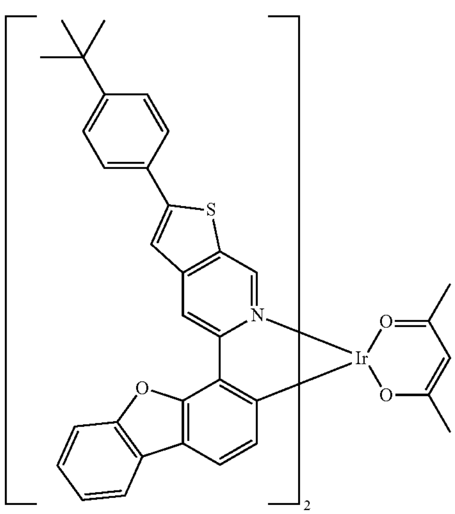
-continued
292
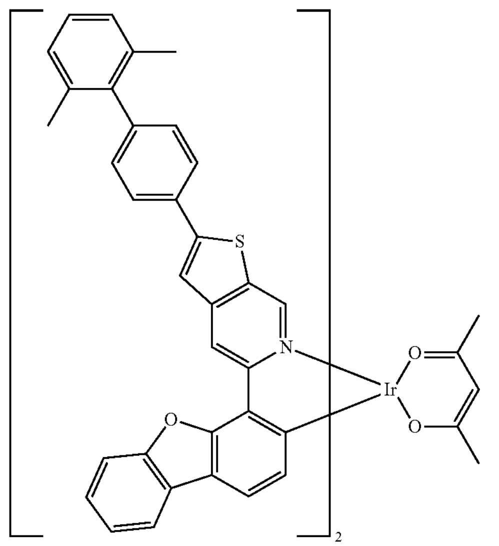
293
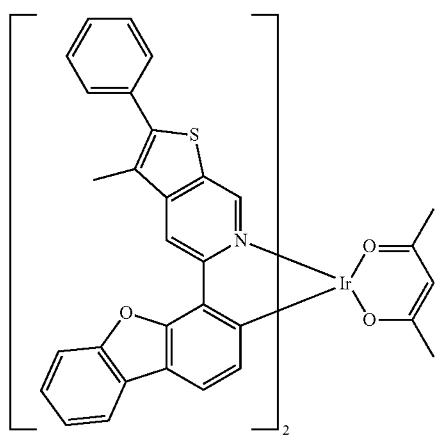
294
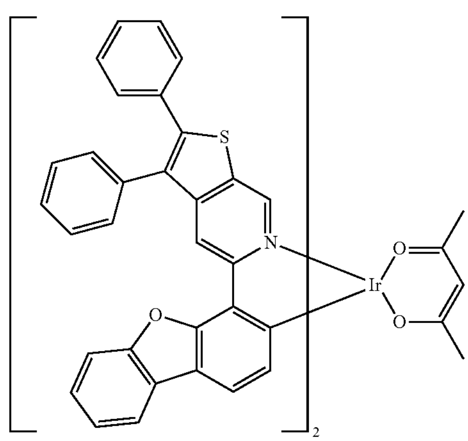

295
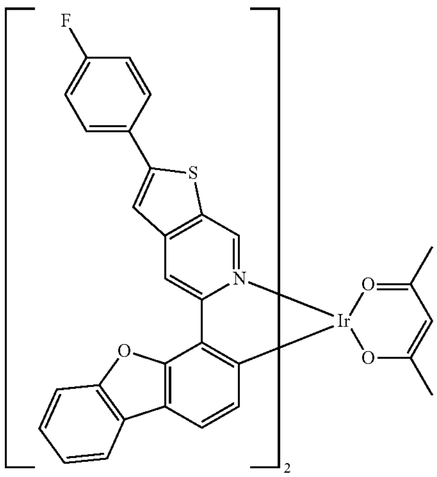
296
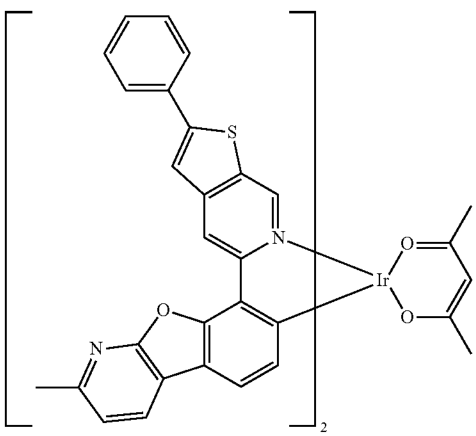
297
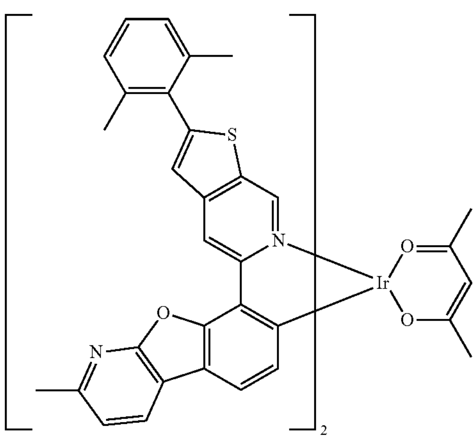
298
299
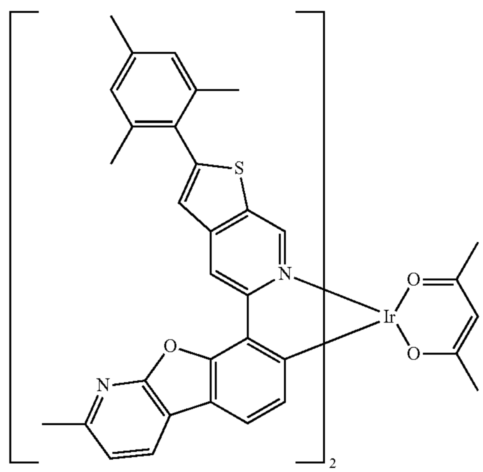
300

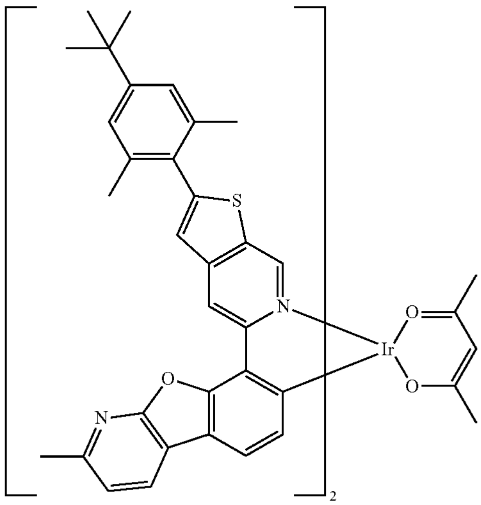
301
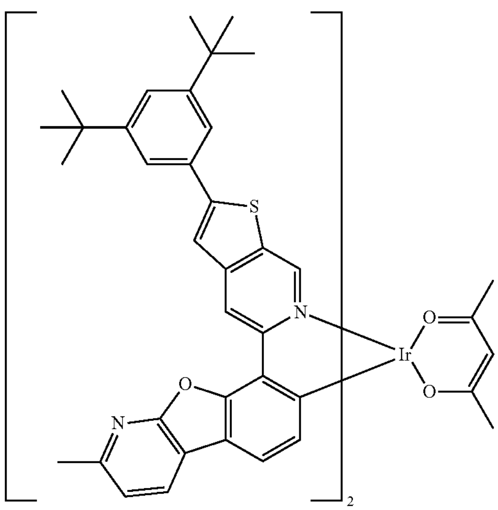
302
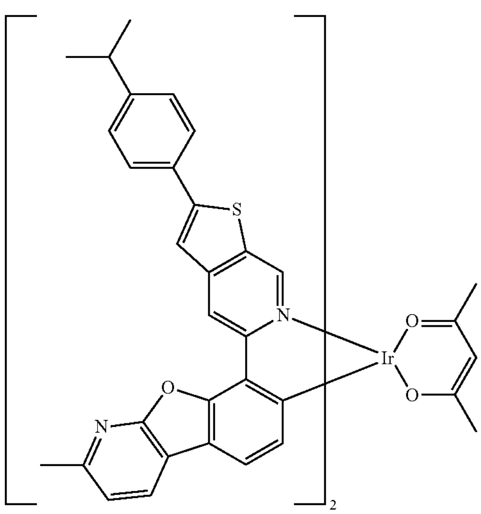
303
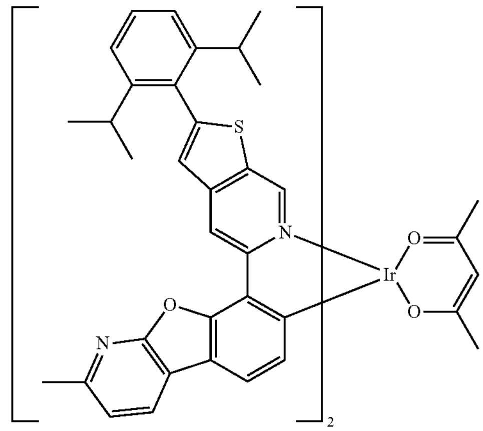
304
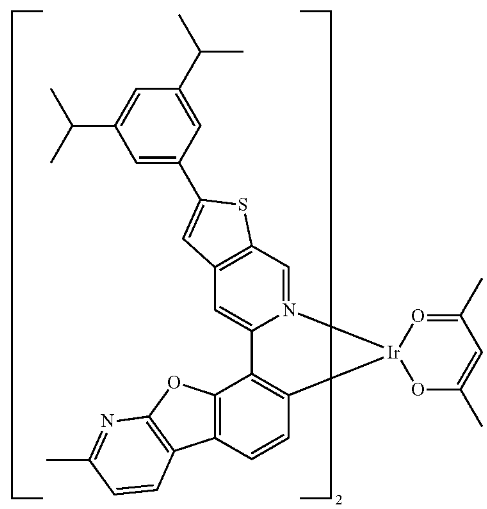
305
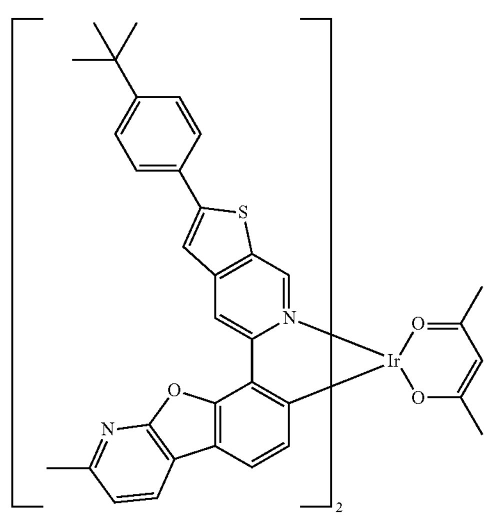
306

-continued
307
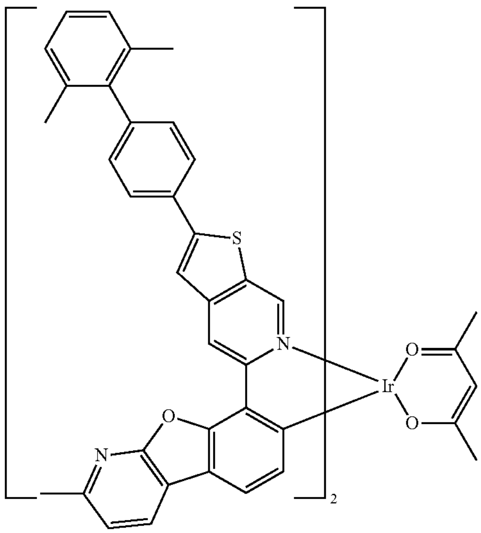
308
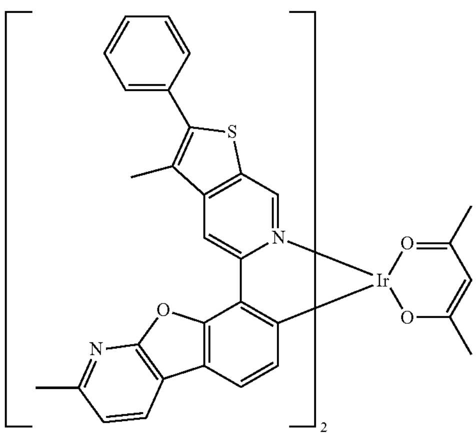
309
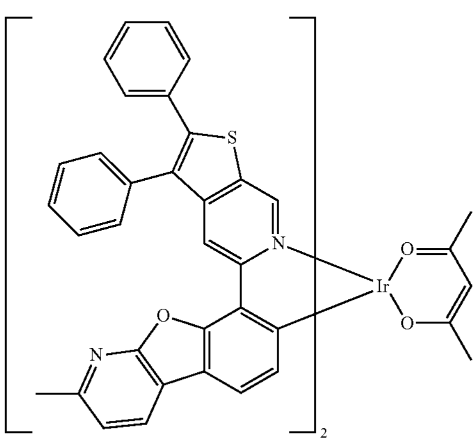
-continued
310
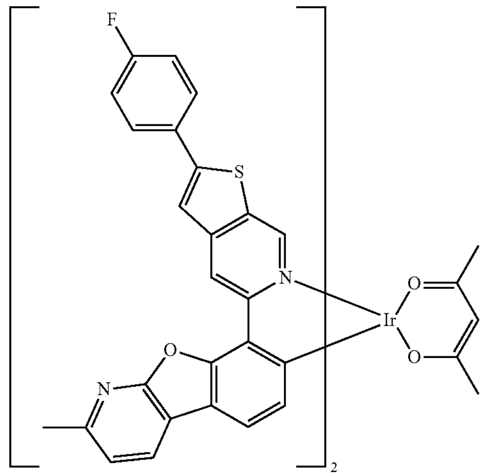
311
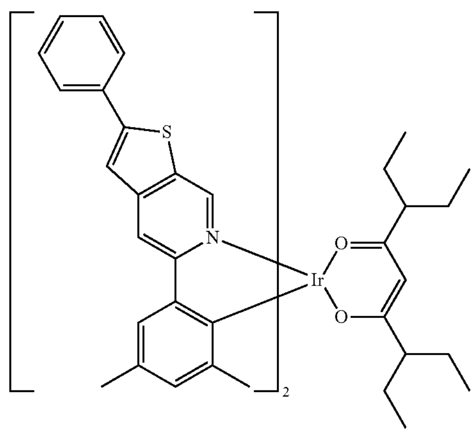
312
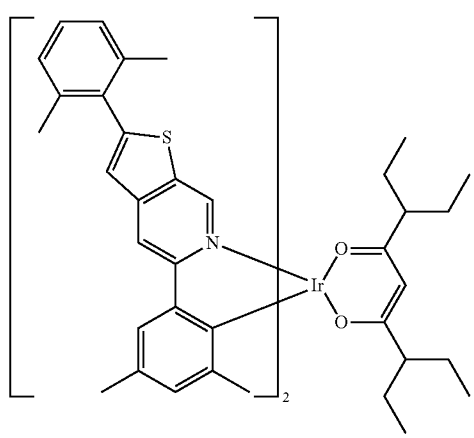

-continued
313
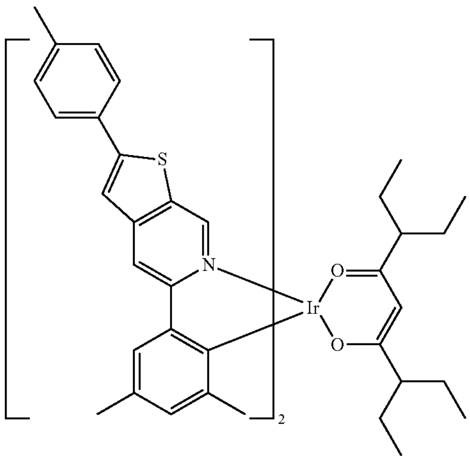
314
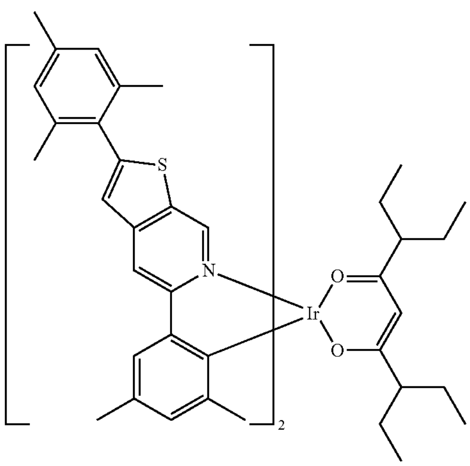
315
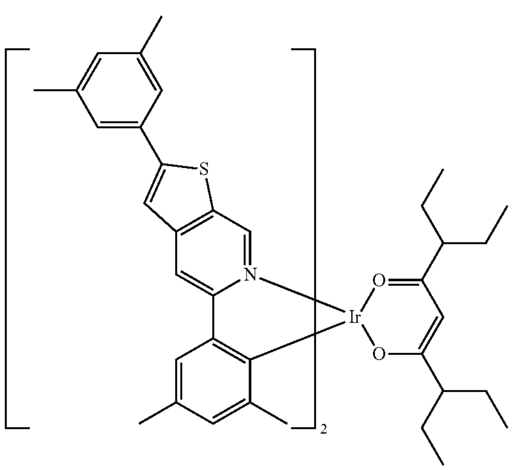
-continued
316
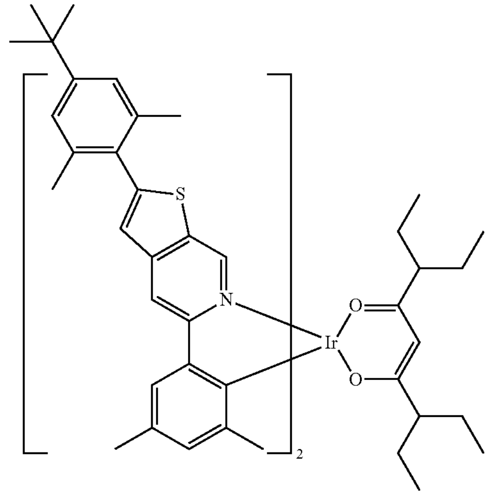
317
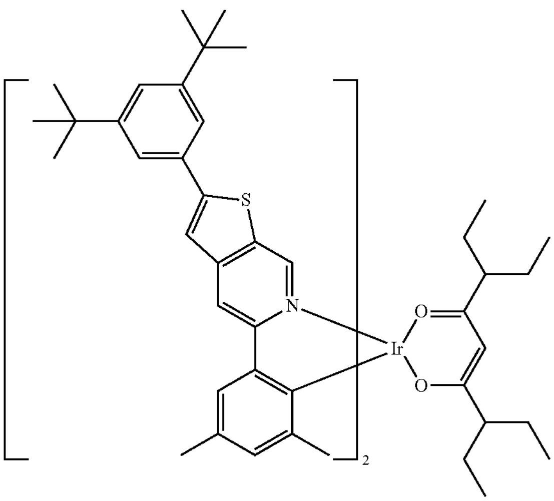
318
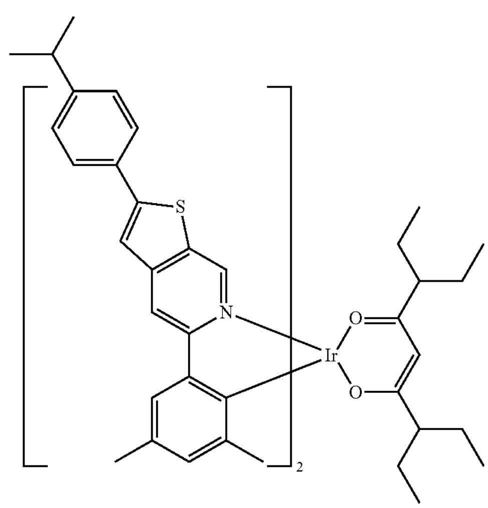

-continued
319
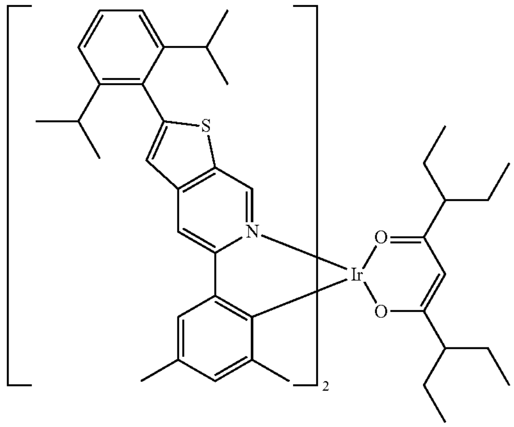
320
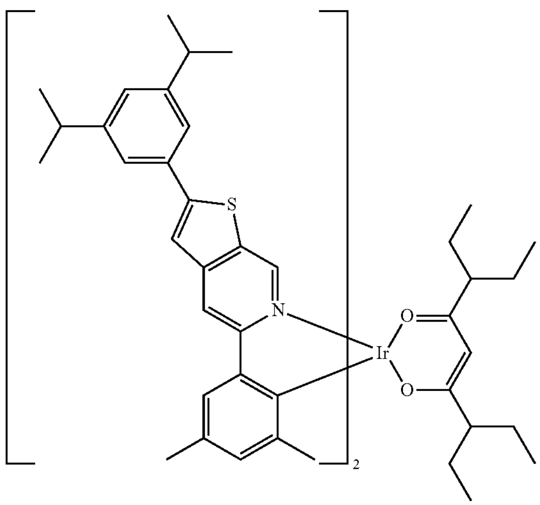
321
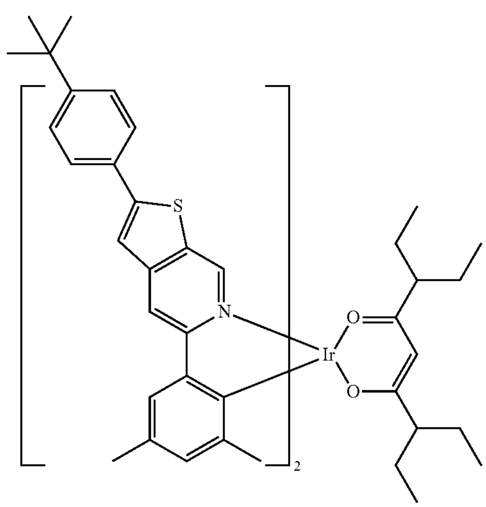
-continued
322
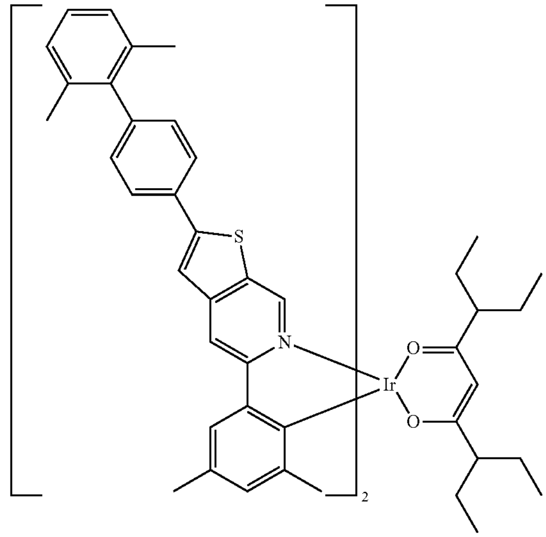
323
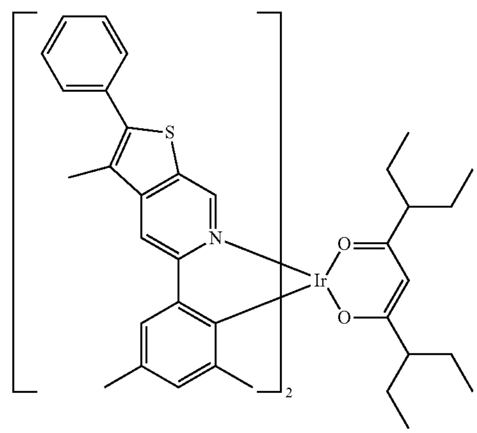
324
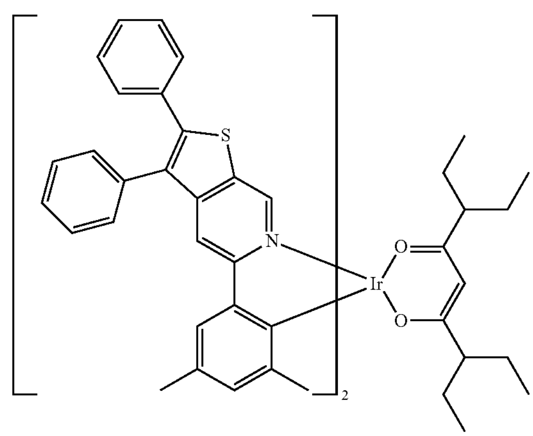

-continued
325
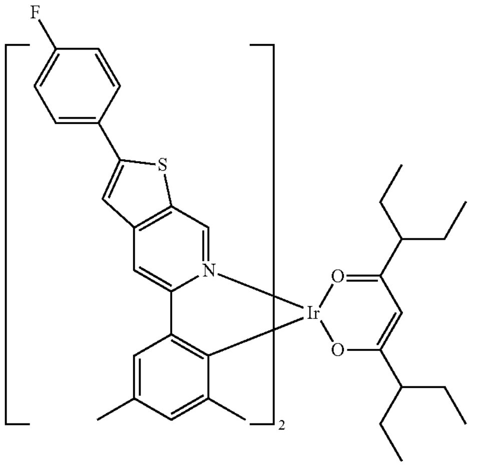
326
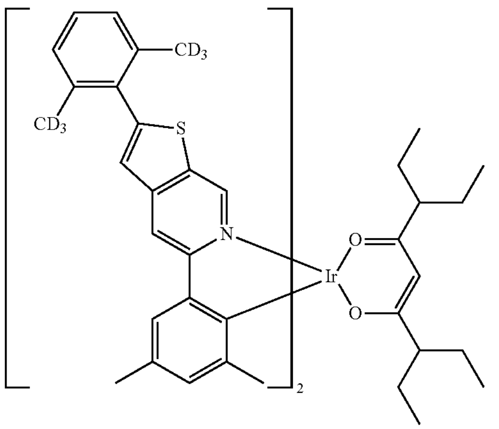
327
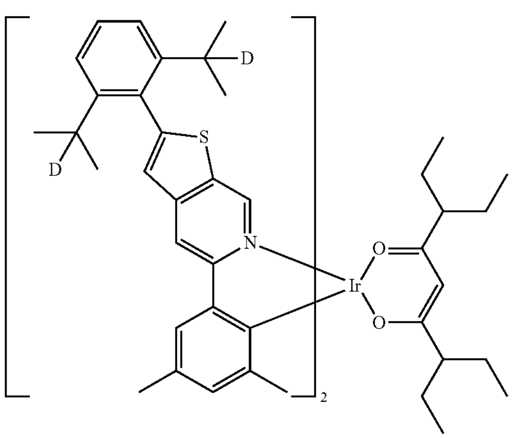
-continued
328
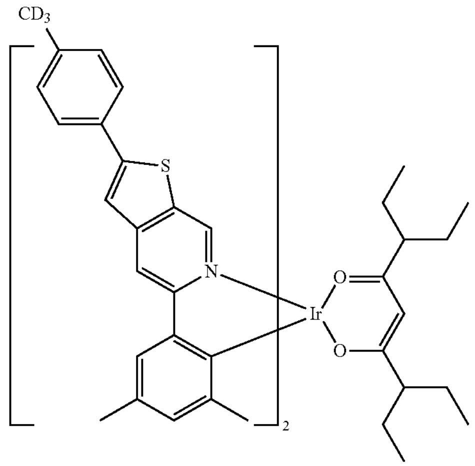
329
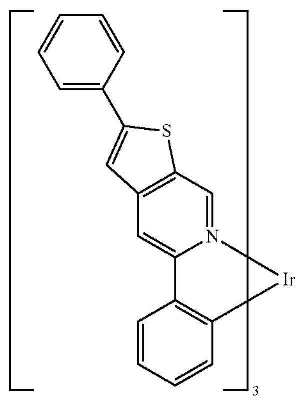
330
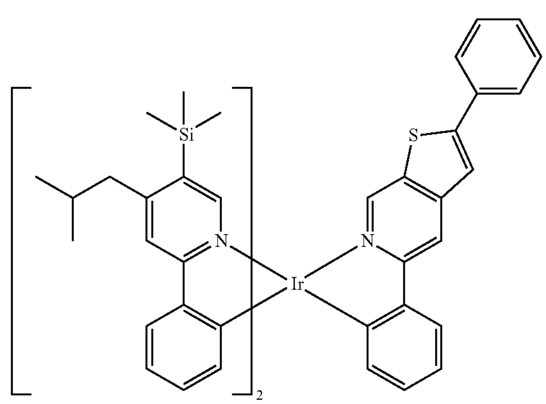

-continued
331
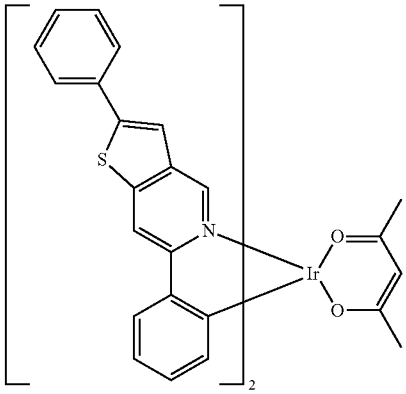
332
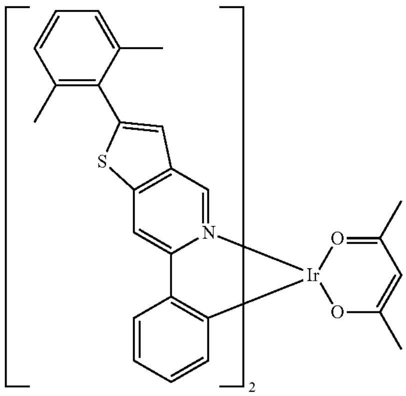
333
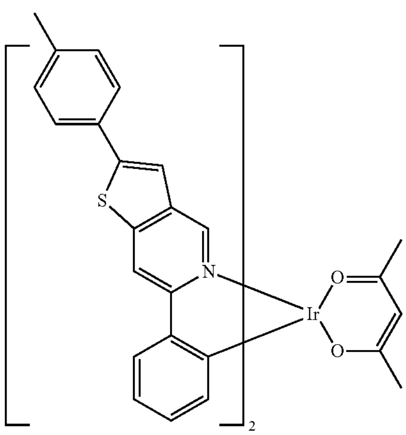
334
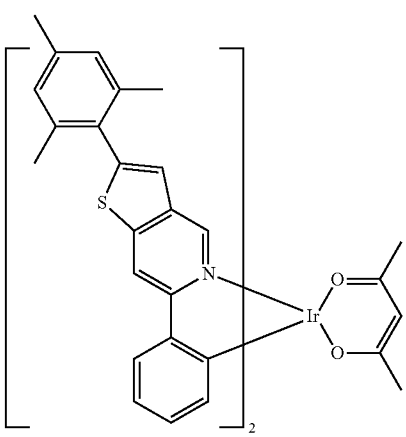
-continued
335
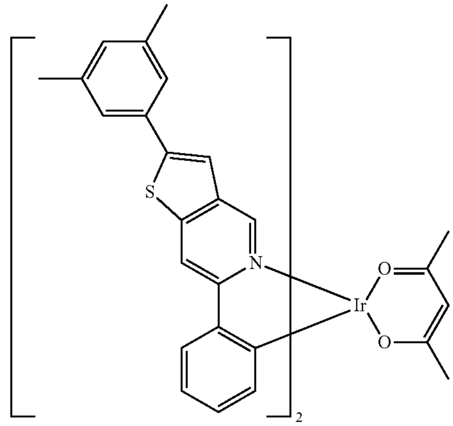
336
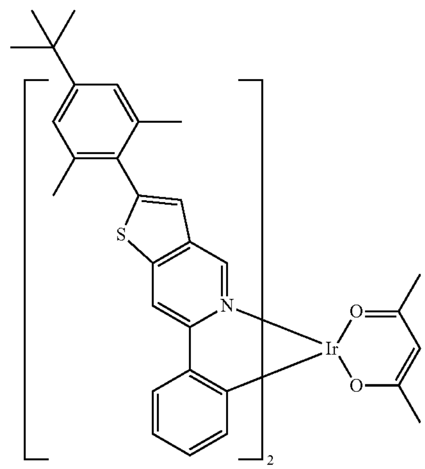
337
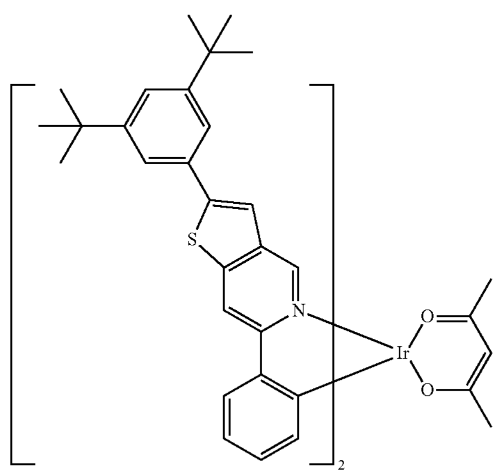

-continued
338
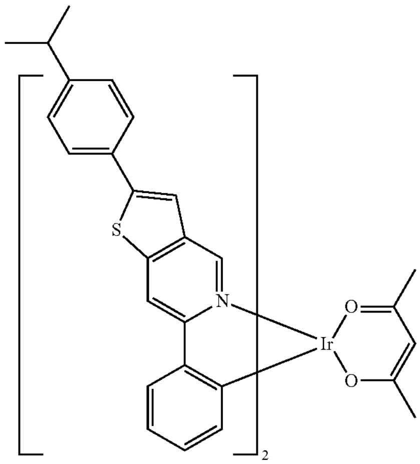
339
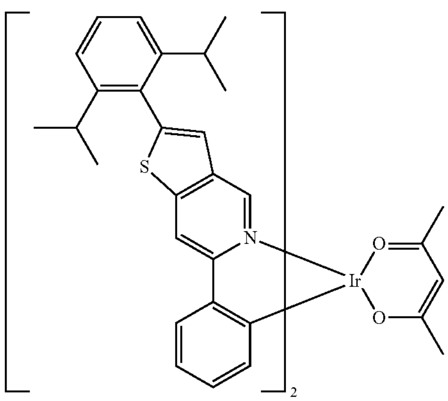
340
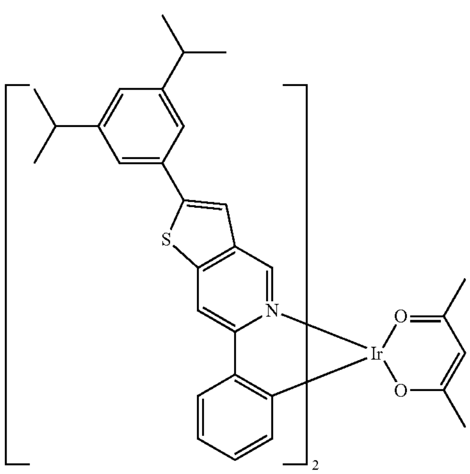
-continued
341
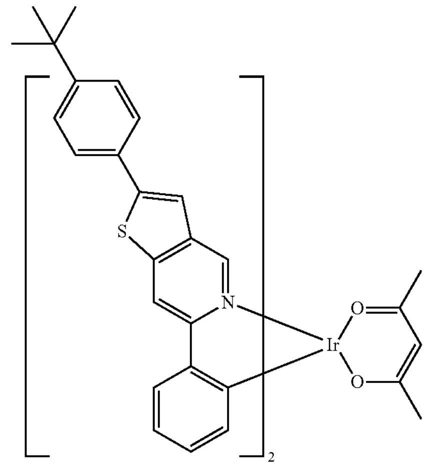
342
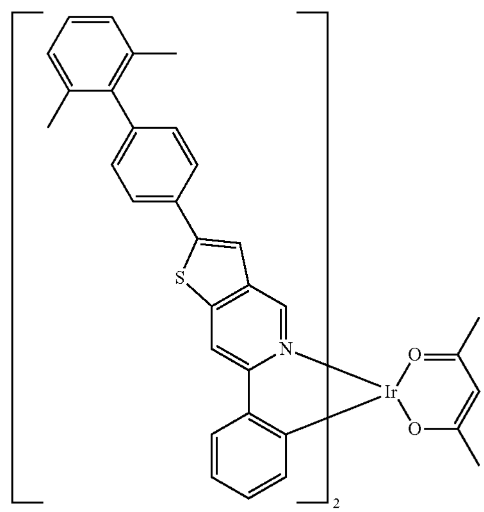
343
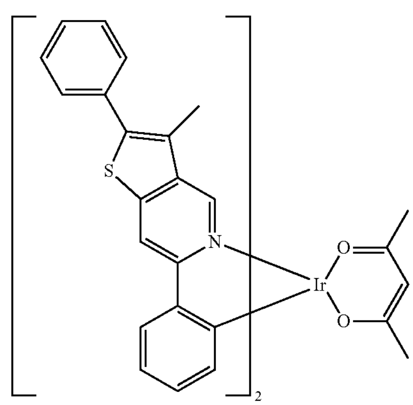

-continued
344
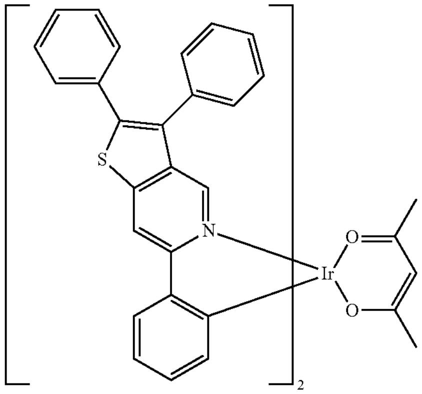
345
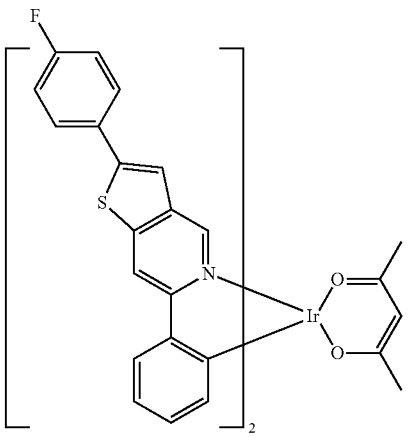
346
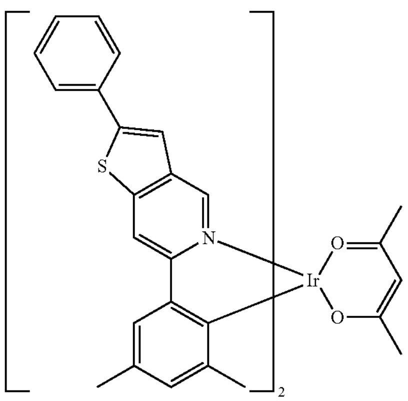
347
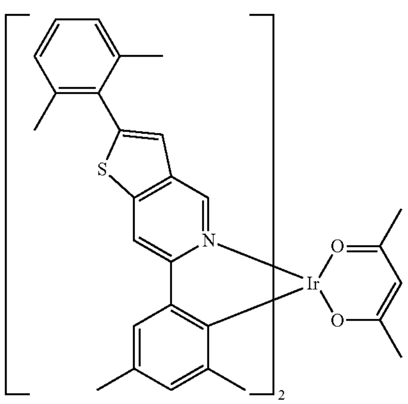
-continued
348
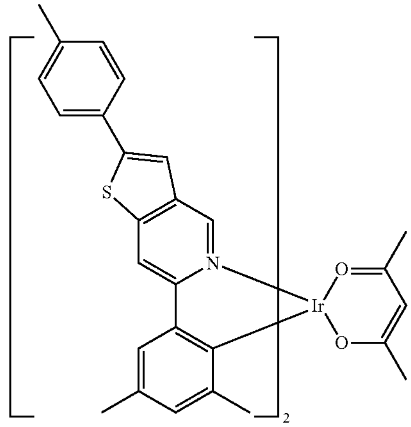
349
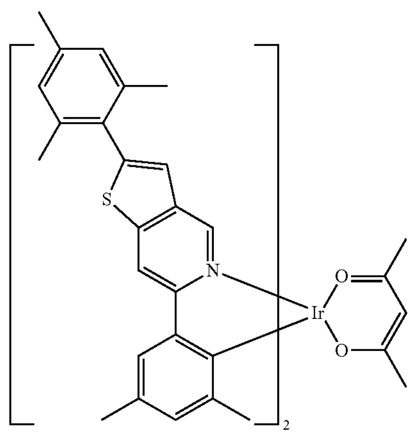
350
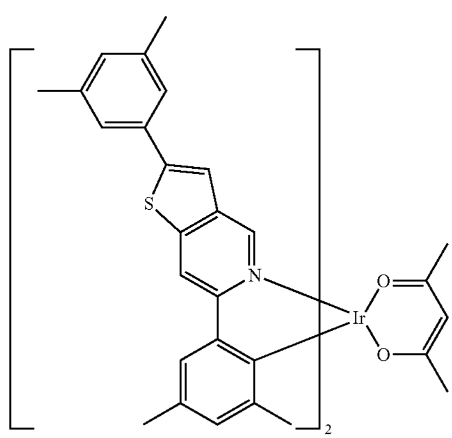

351
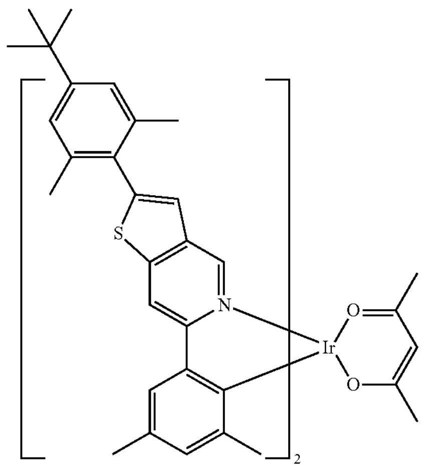
352
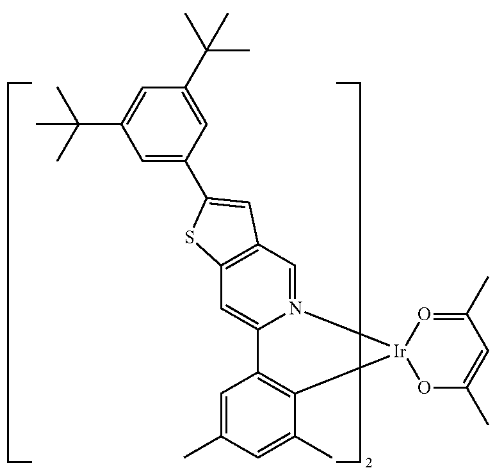
353
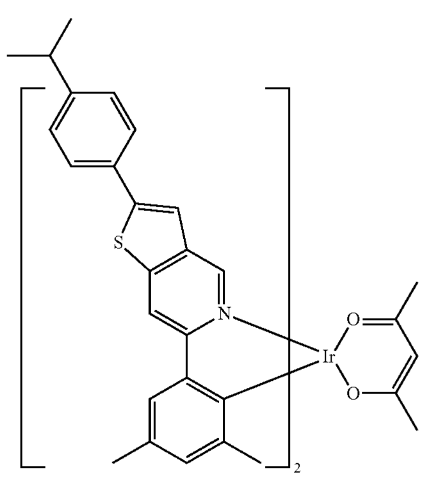
354
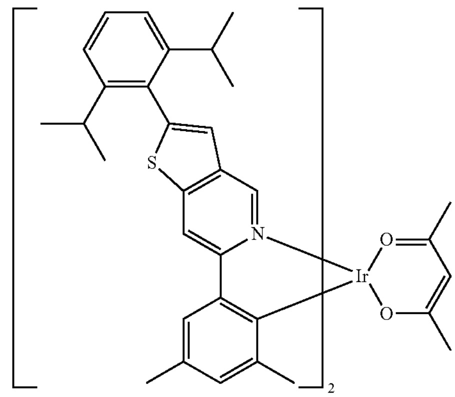
355
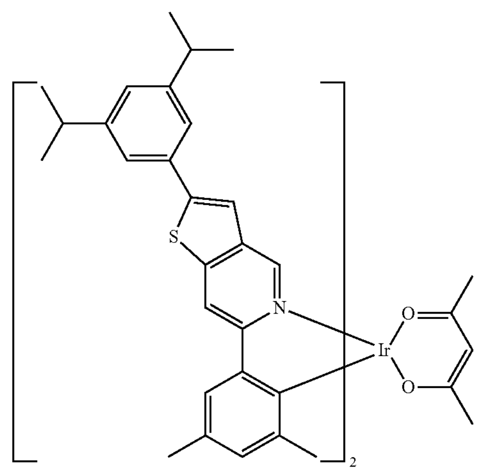
356
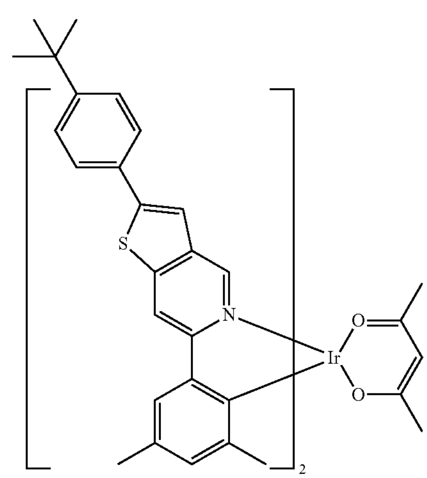

-continued
357
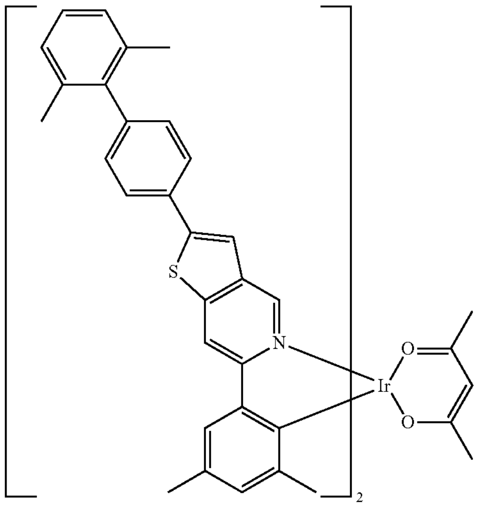
358
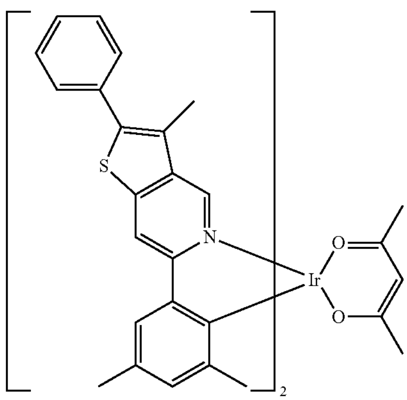
359
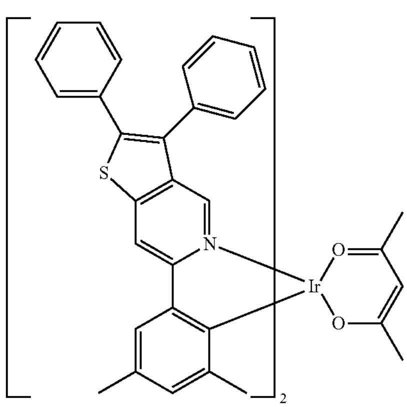
-continued
360
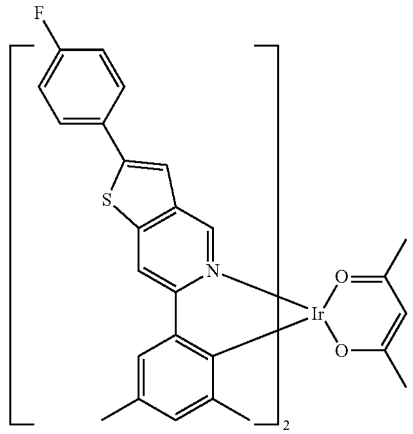
361
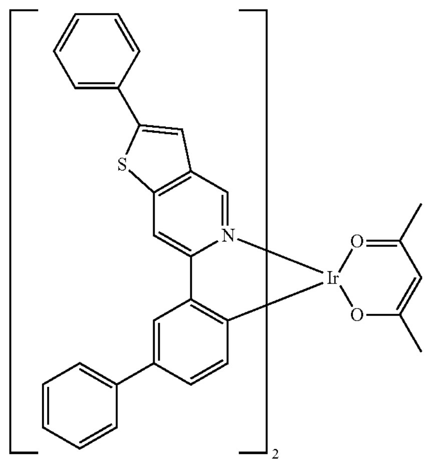
362
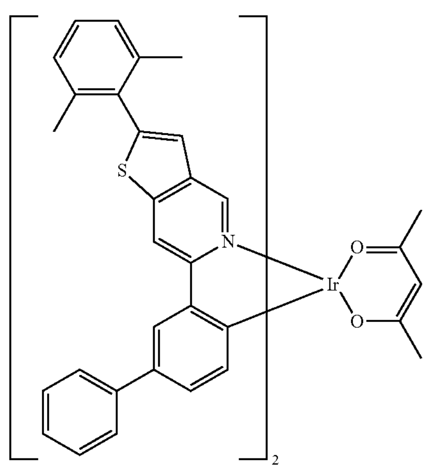

363
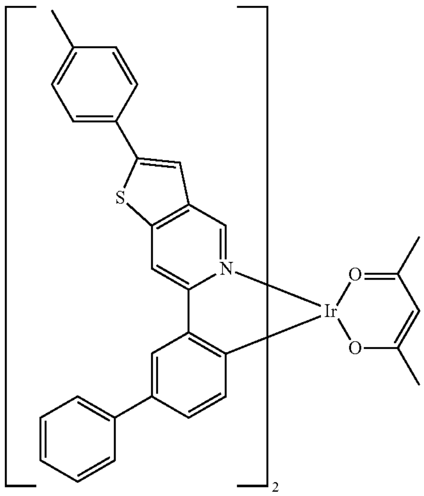
364
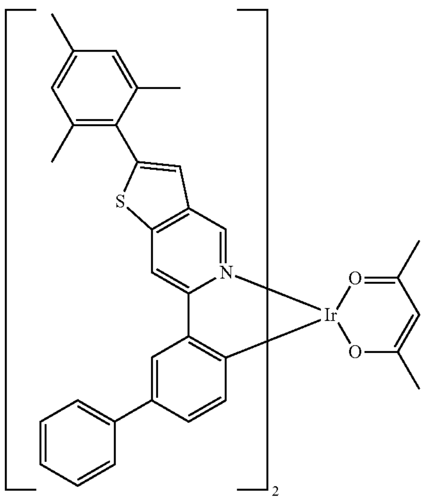
365
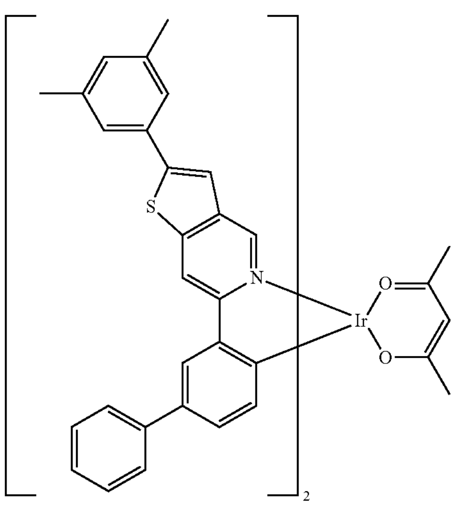
366
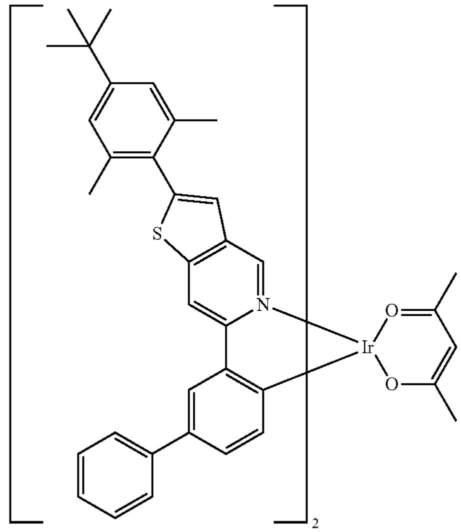
367
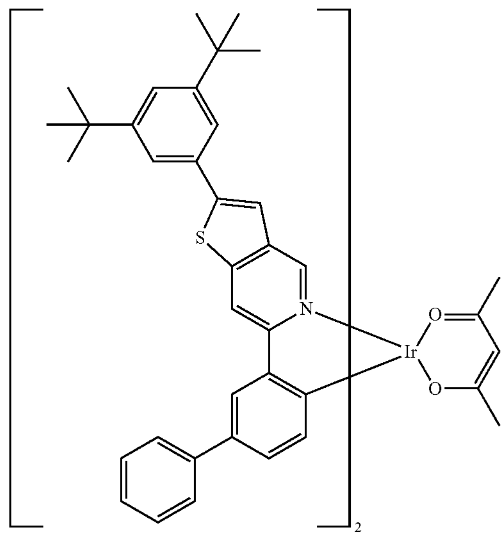
368
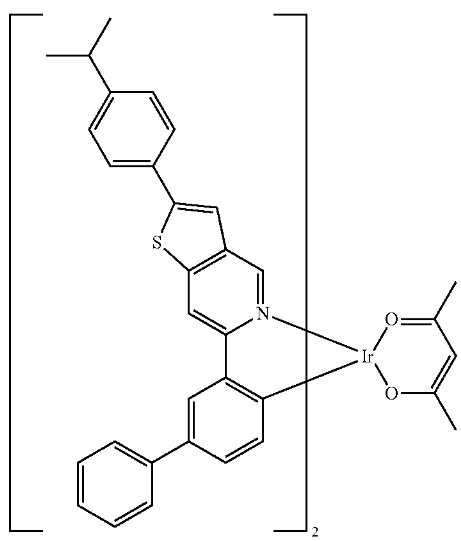

-continued
369
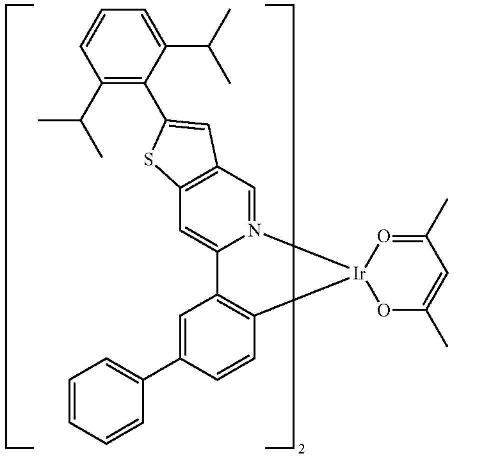
370
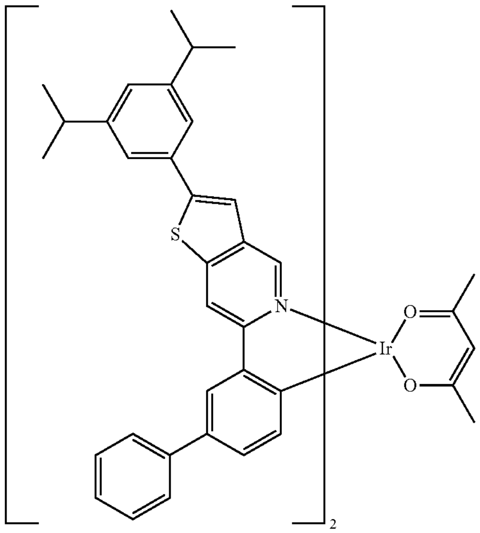
371
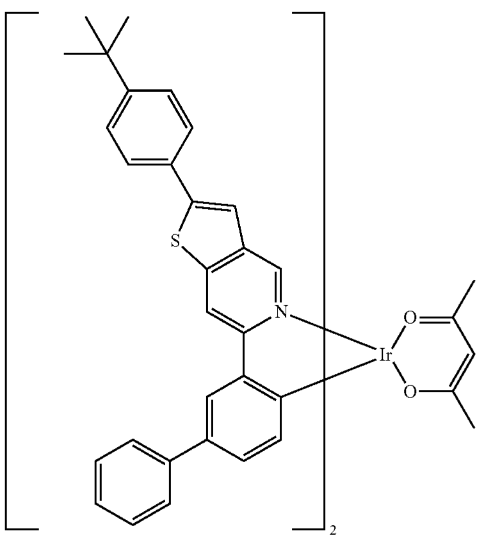
-continued
372
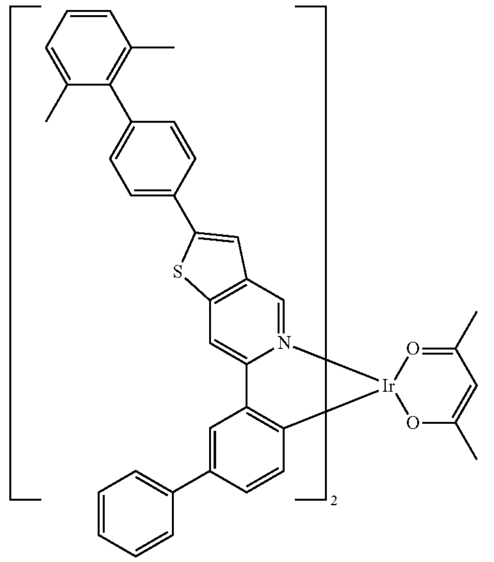
373
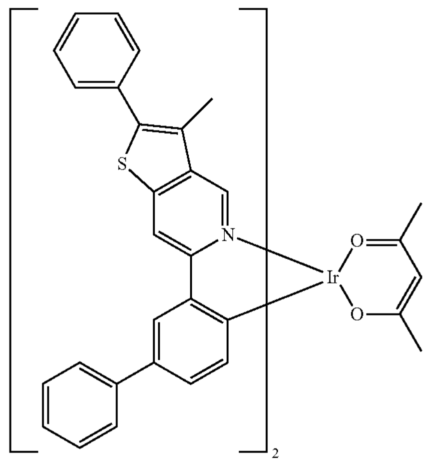
374
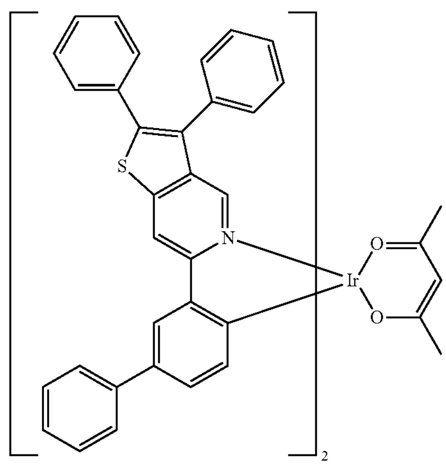

375
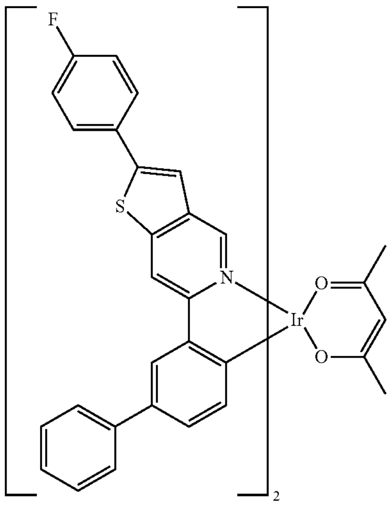
376
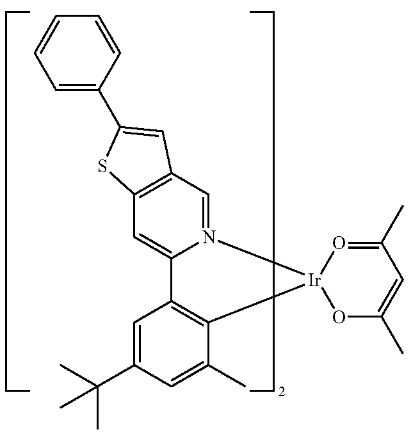
377
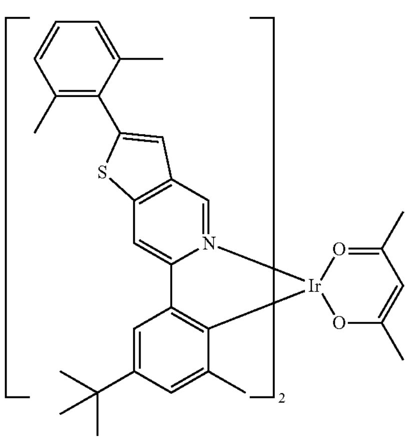
378
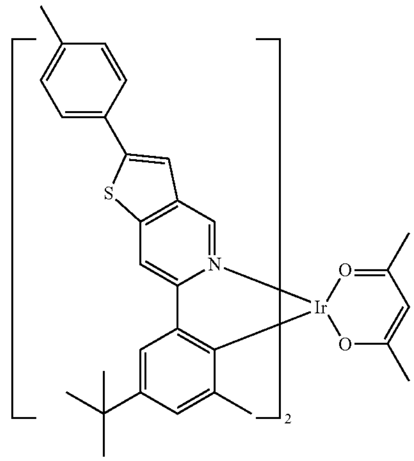
379
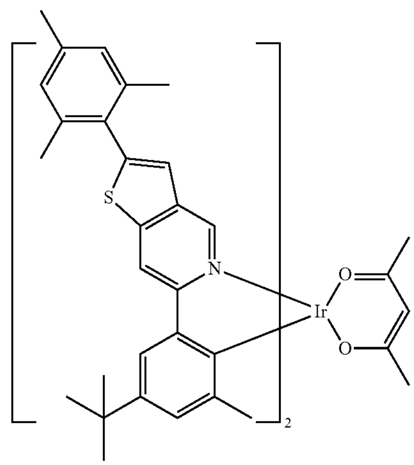
380
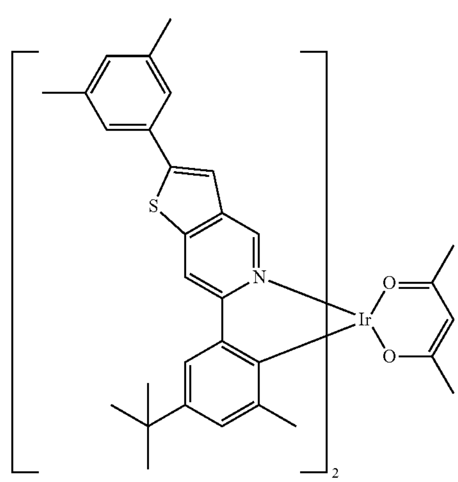

-continued
381
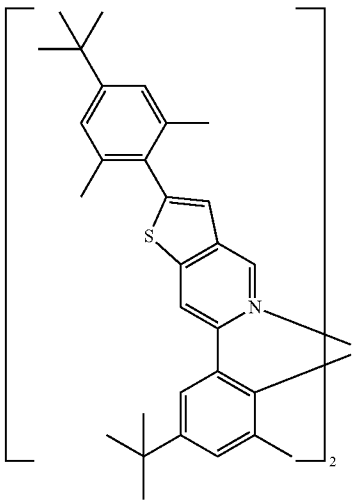
382
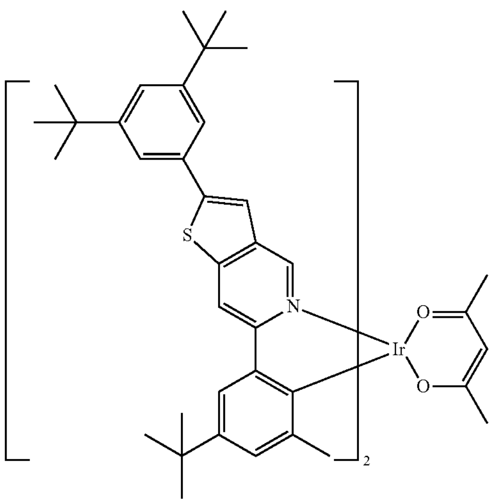
383
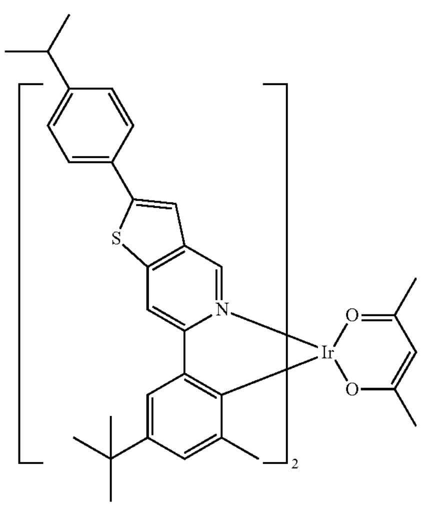
-continued
384
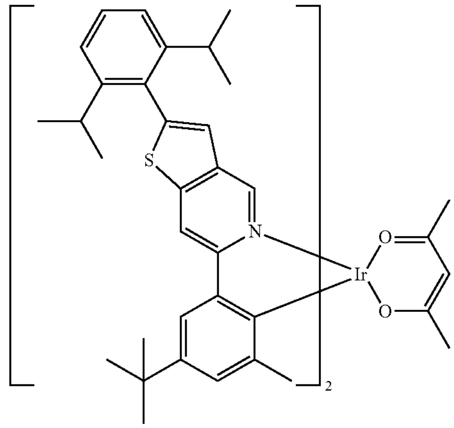
385
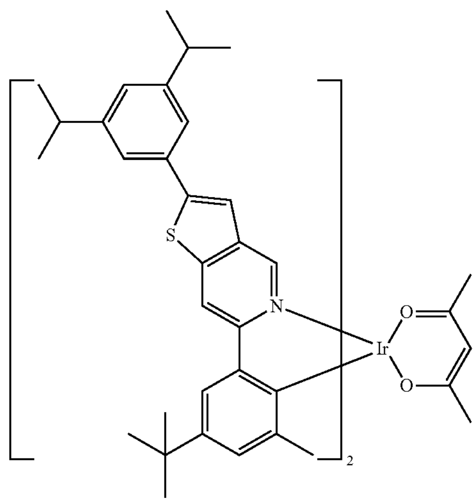
386
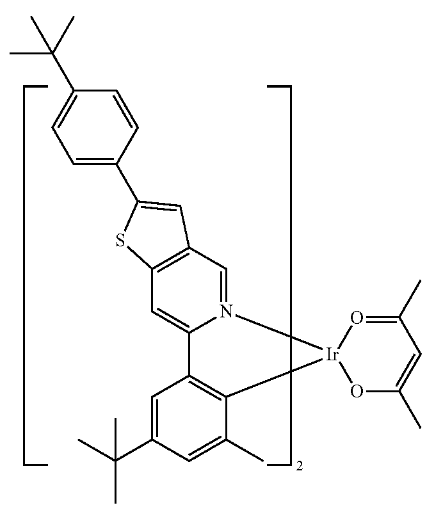

-continued
387
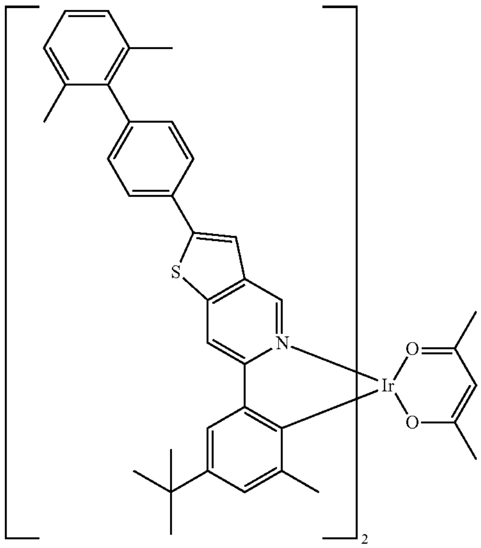
388
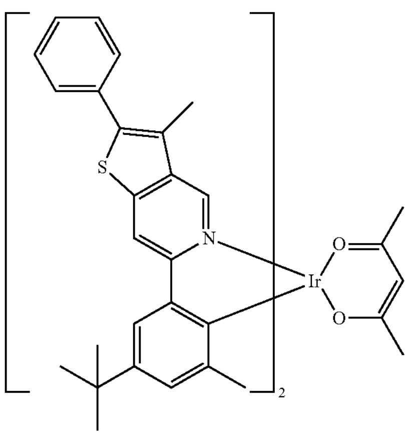
389
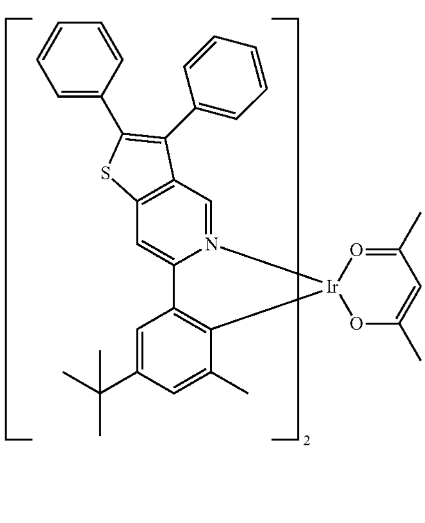
-continued
390
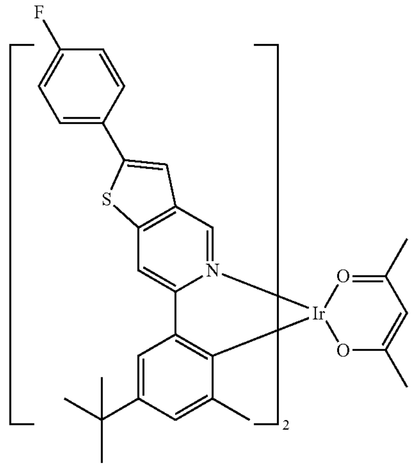
391
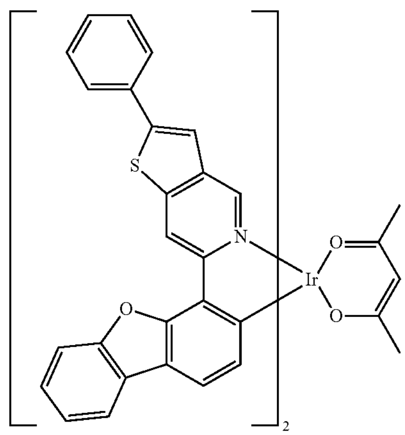
392
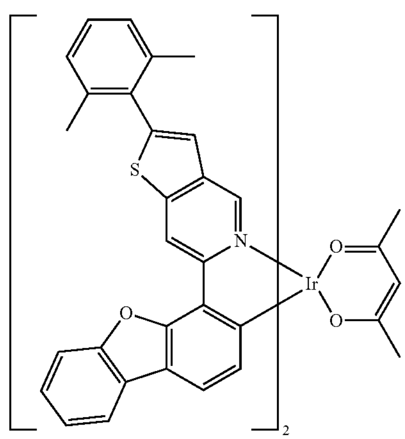

-continued
393
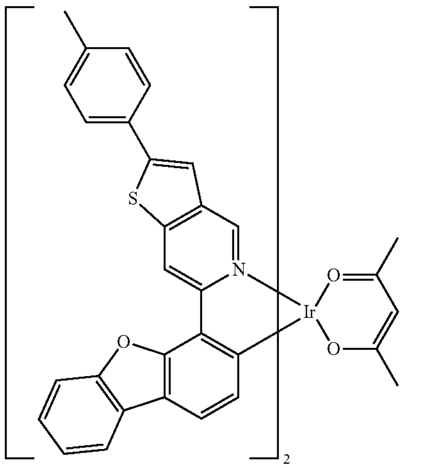
394
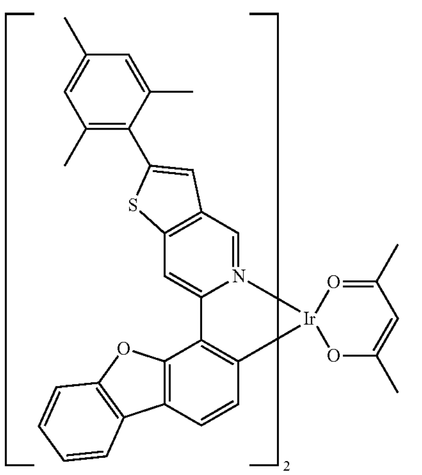
395
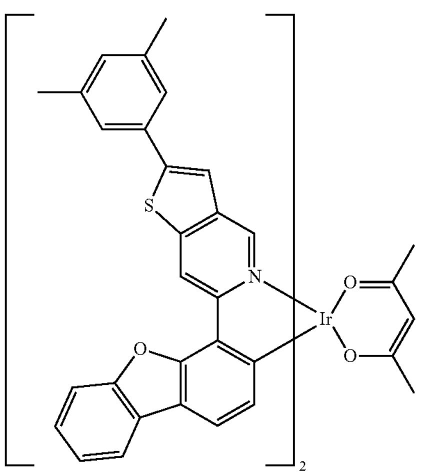
-continued
396
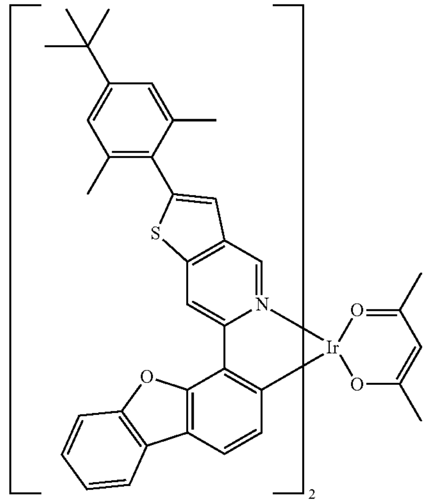
397
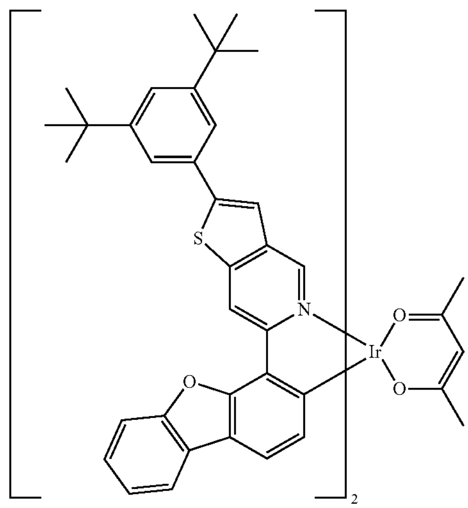
398
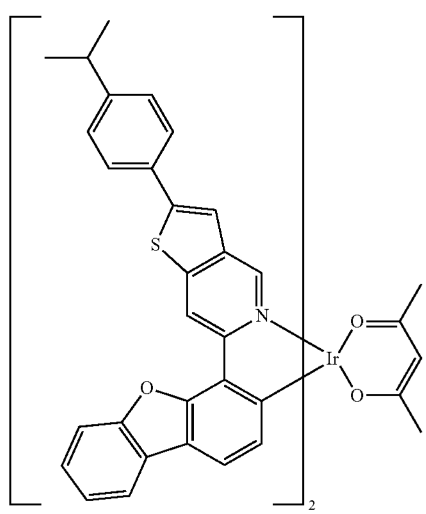

399
400
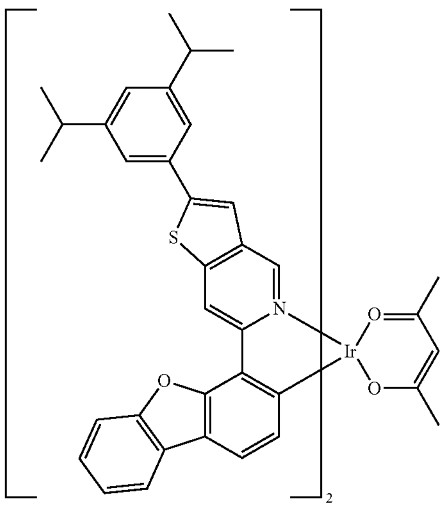
401
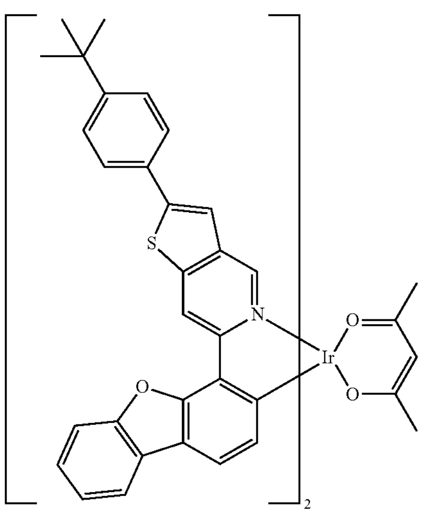
402
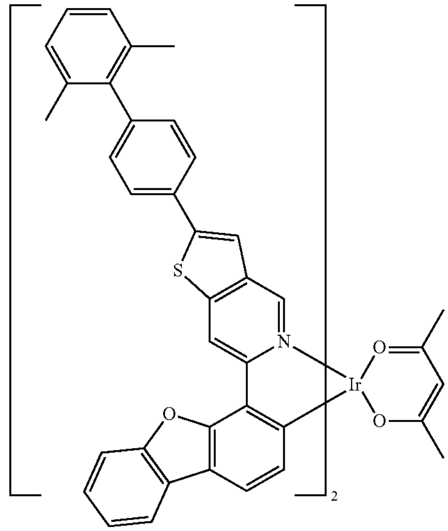
403
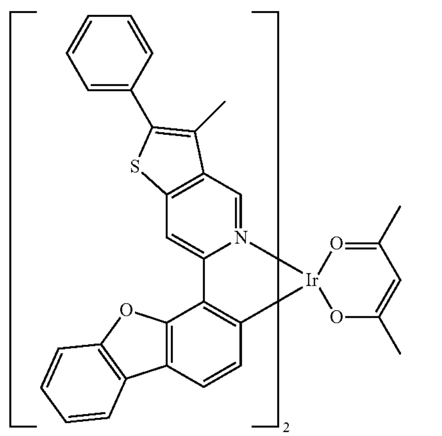
404
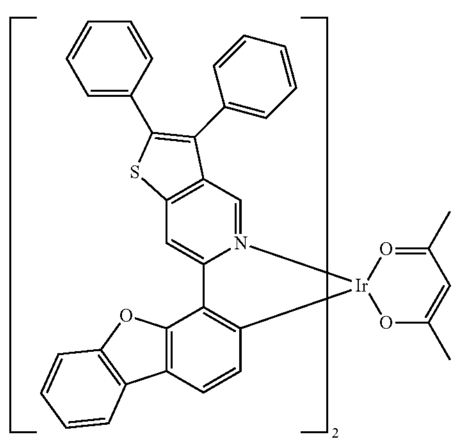

-continued
405
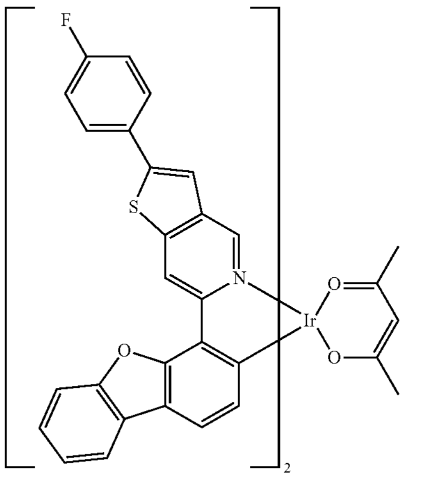
406
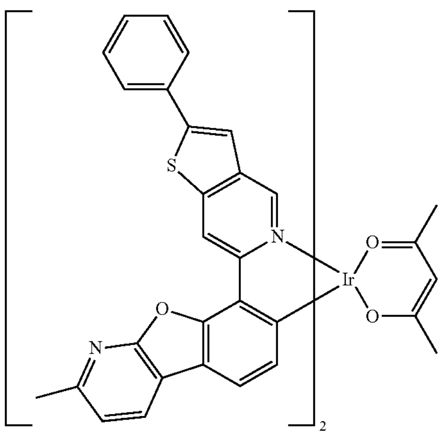
407
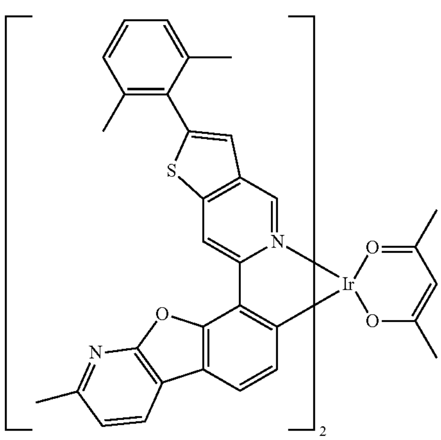
-continued
408
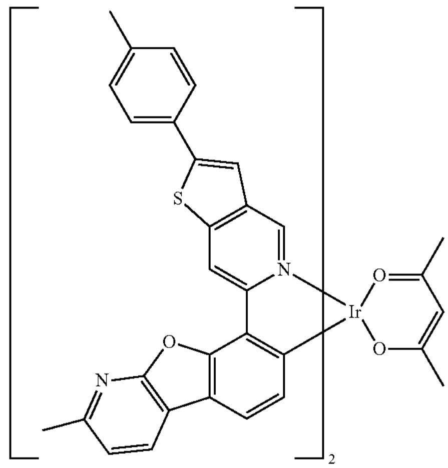
409
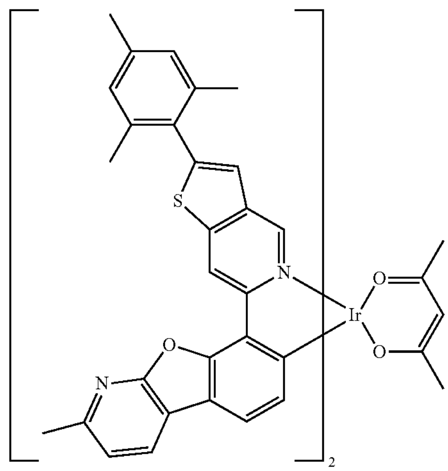
410
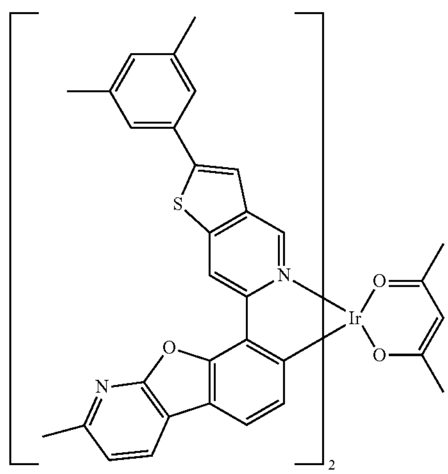

-continued
411
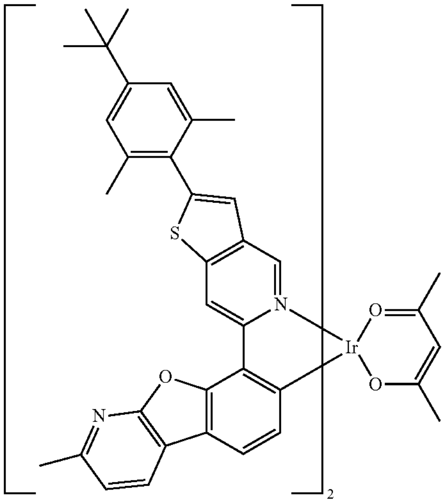
412
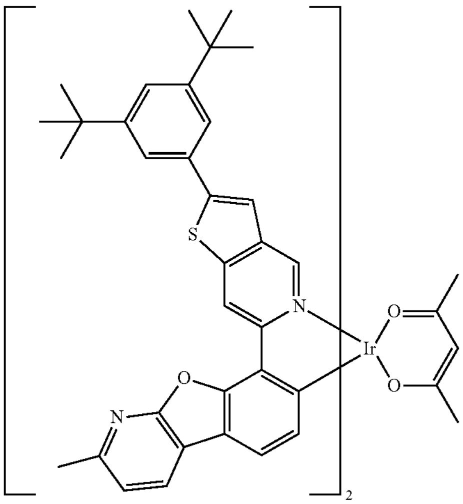
413
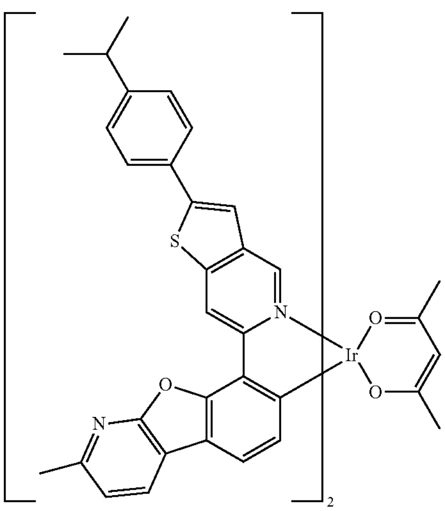
-continued
414
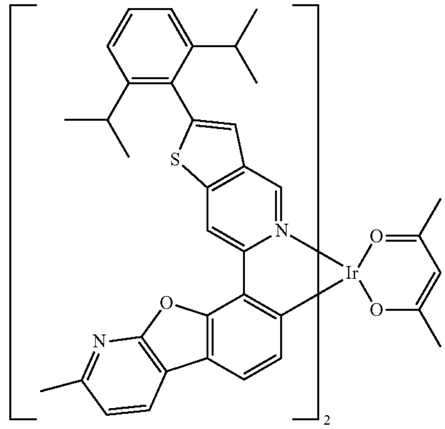
415
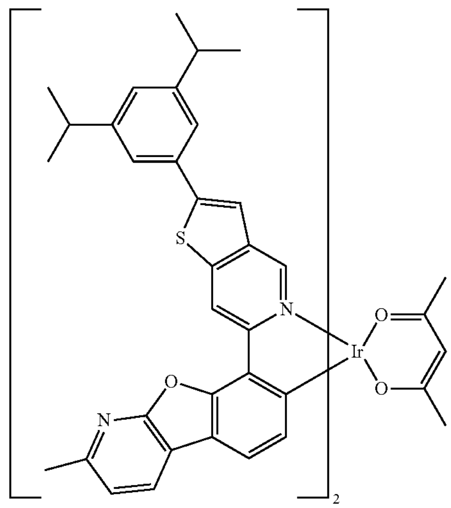
416
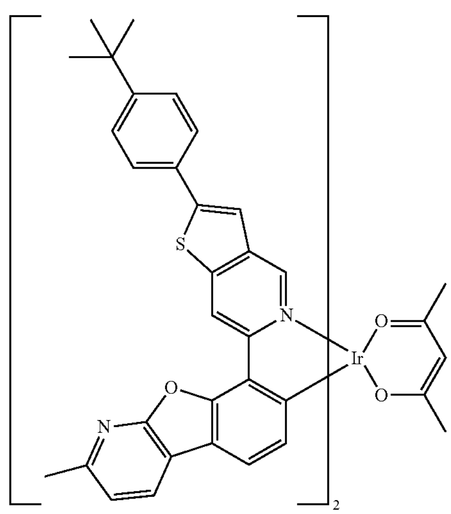

-continued
417
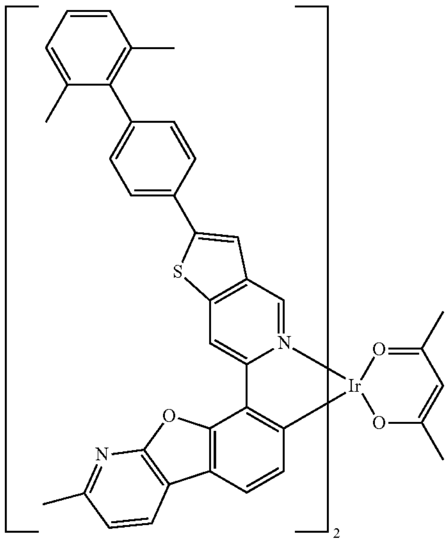
418
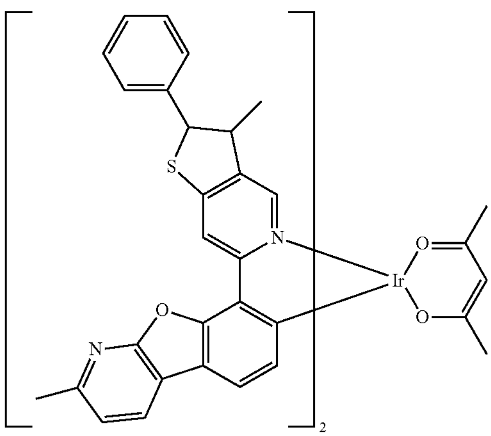
419
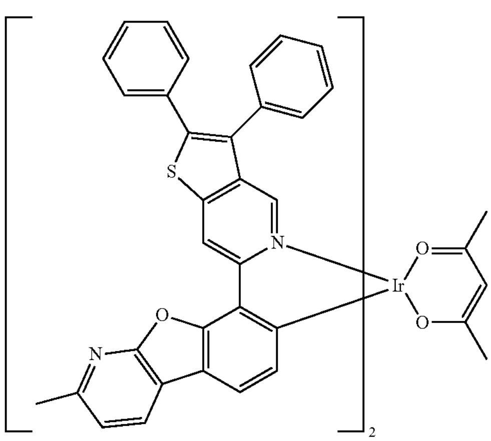
-continued
420
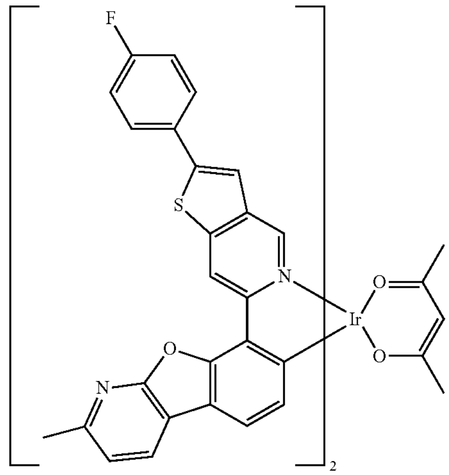
421
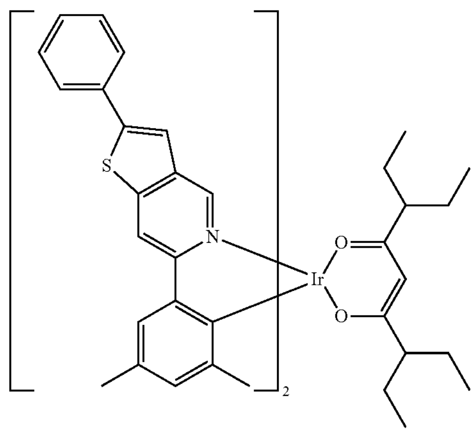
422
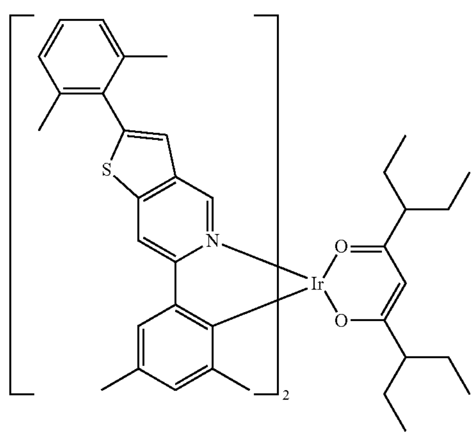

-continued
423
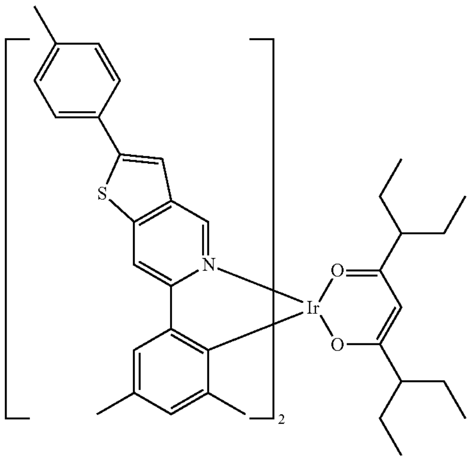
424
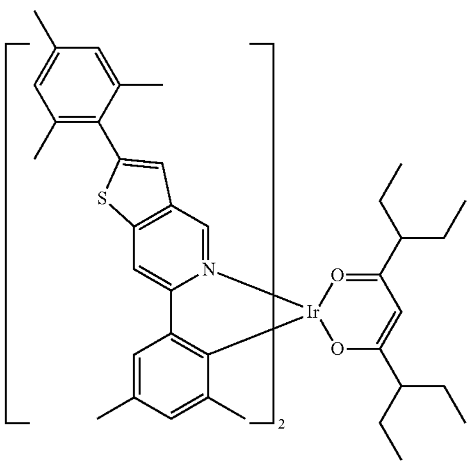
425
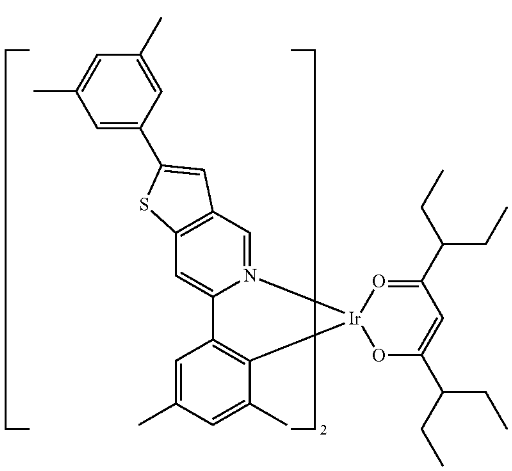
-continued
426
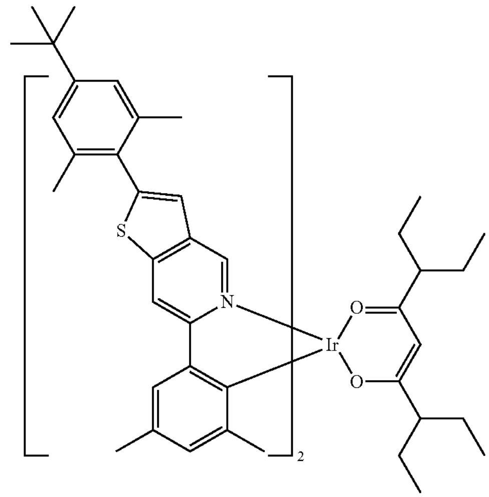
427
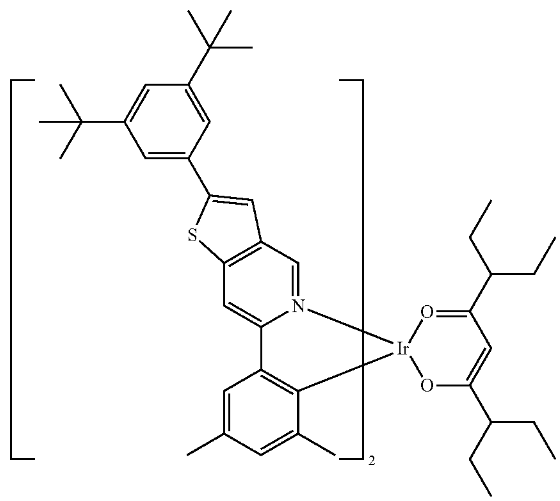
428
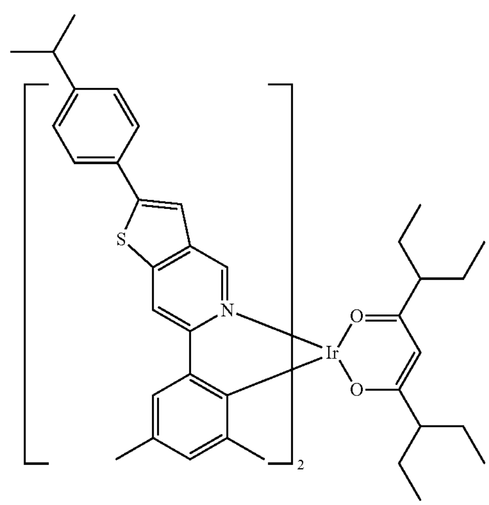

-continued
429
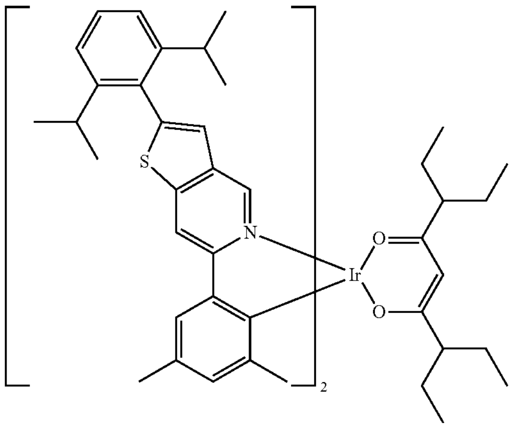
430
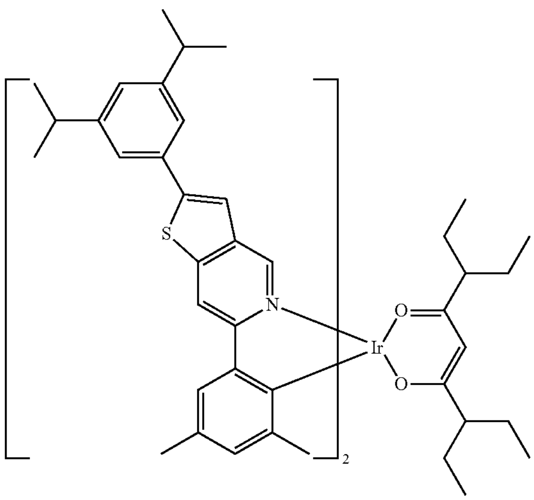
431
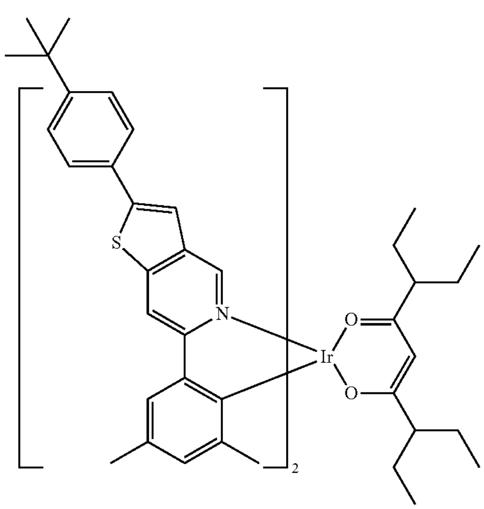
-continued
432
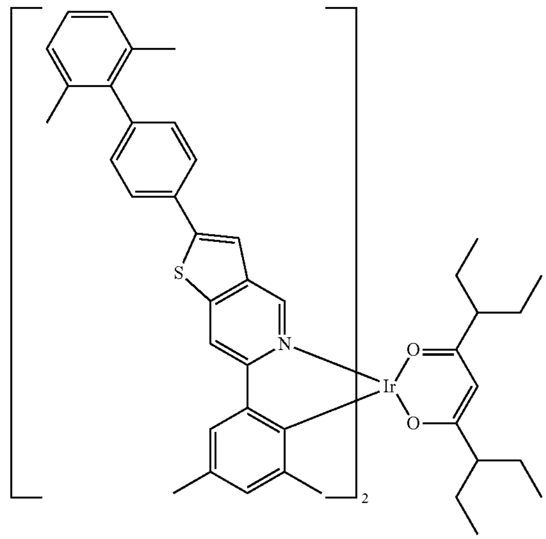
433
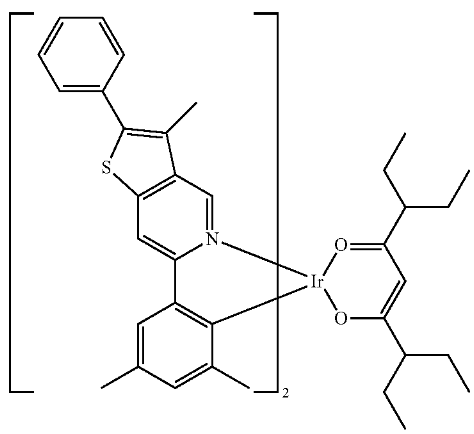
434
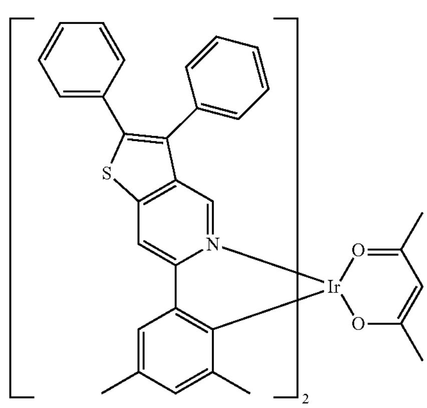

-continued
435
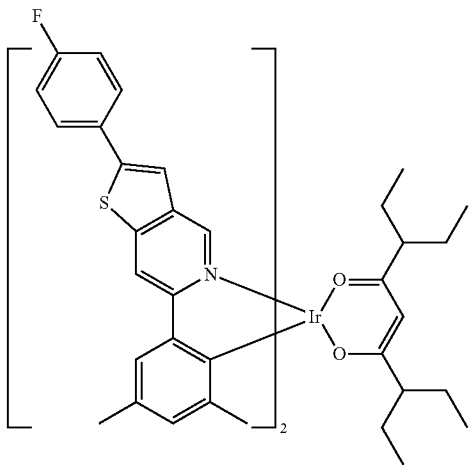
436
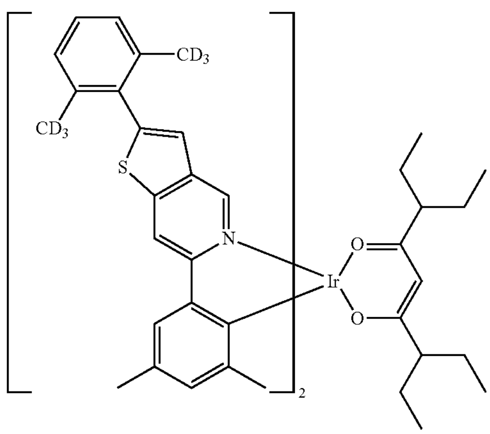
437
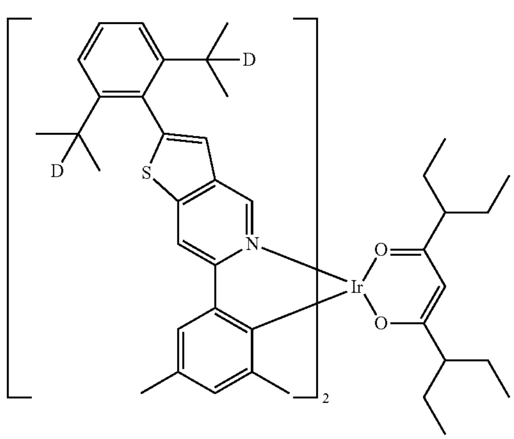
-continued
438
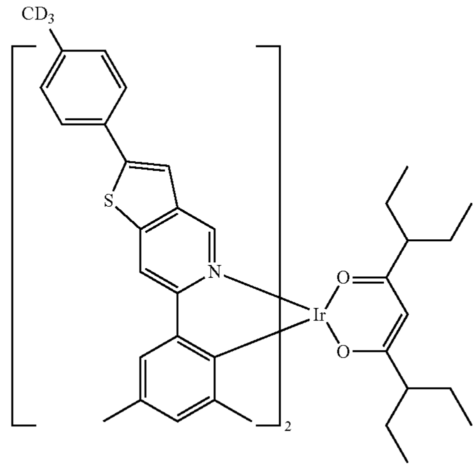
439
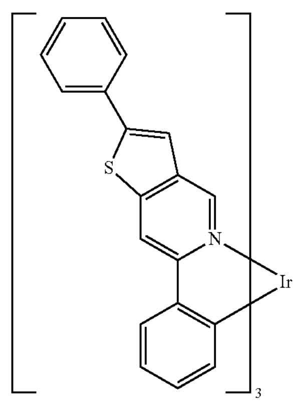
440
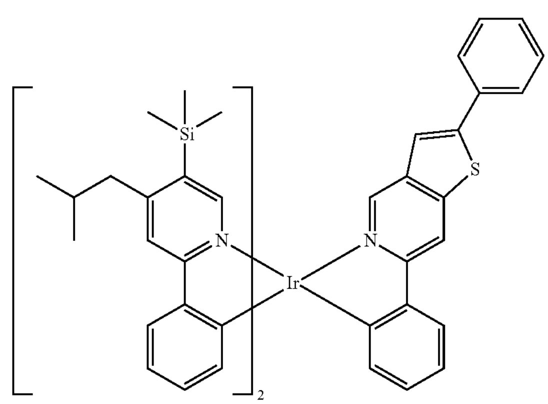

-continued
441
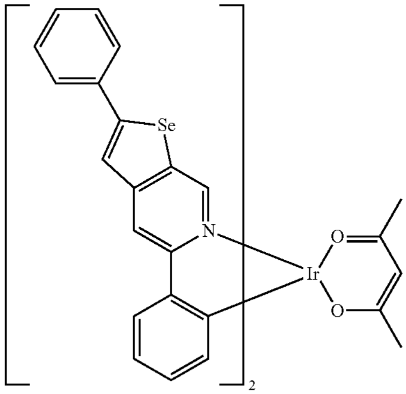
442
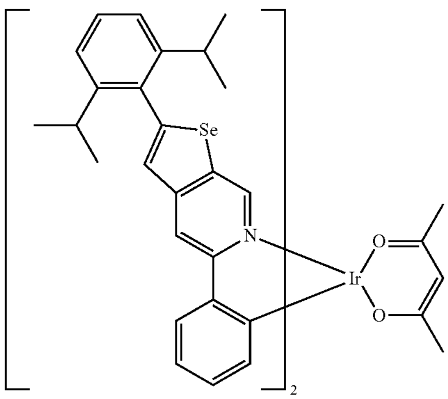
443
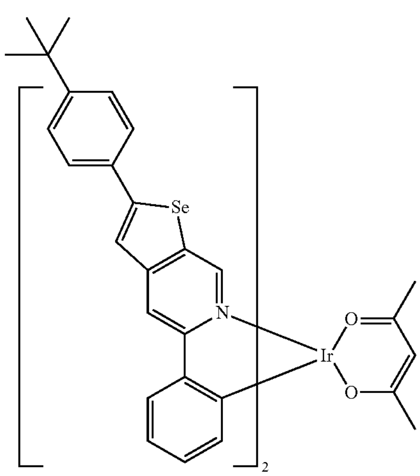
-continued
444
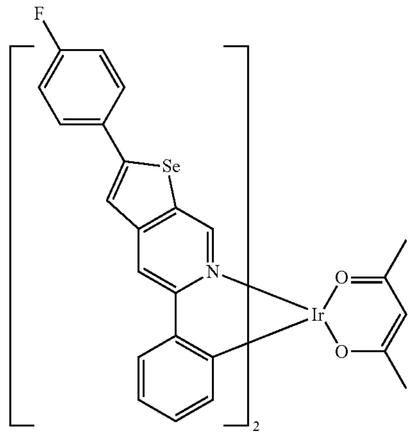
445
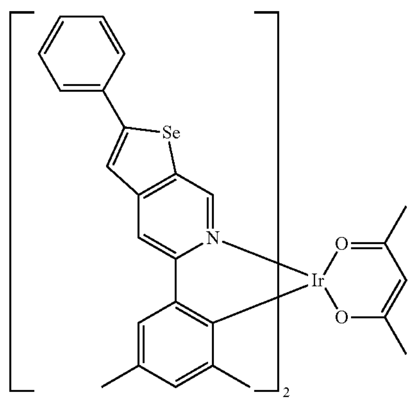
446
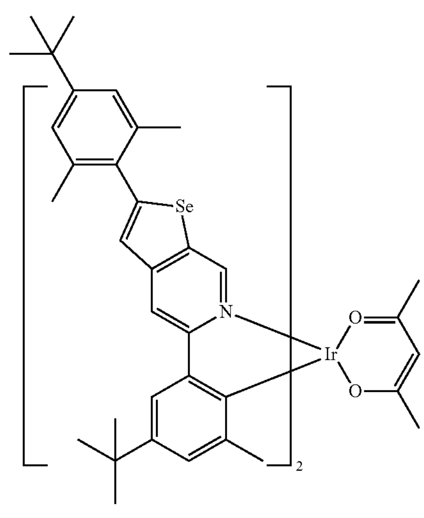

-continued
447
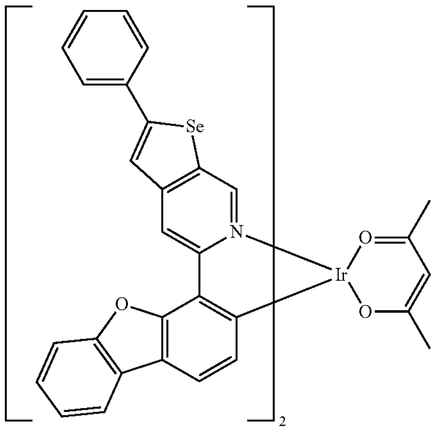
448
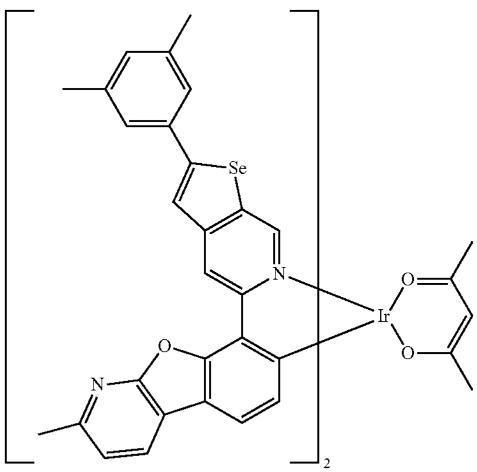
449
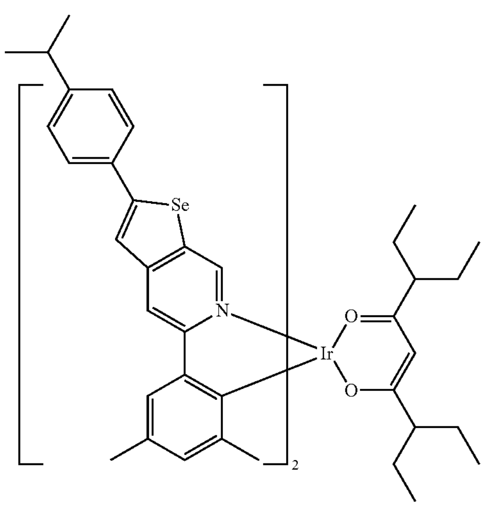
-continued
450
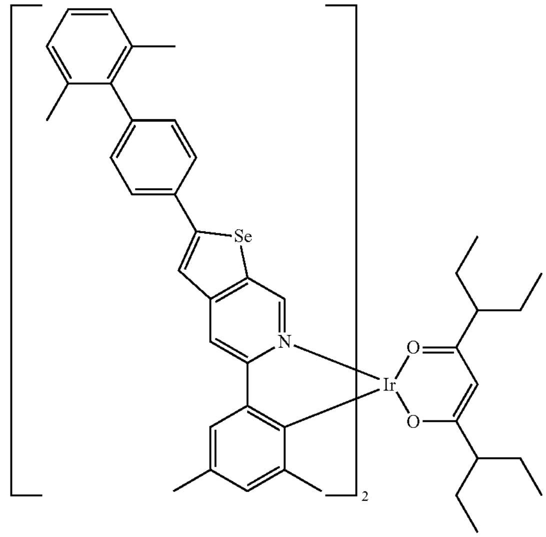
451
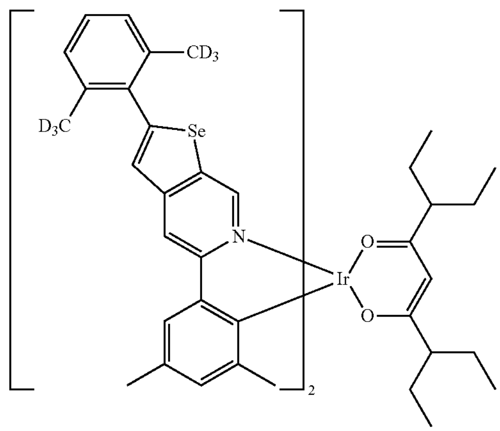
452
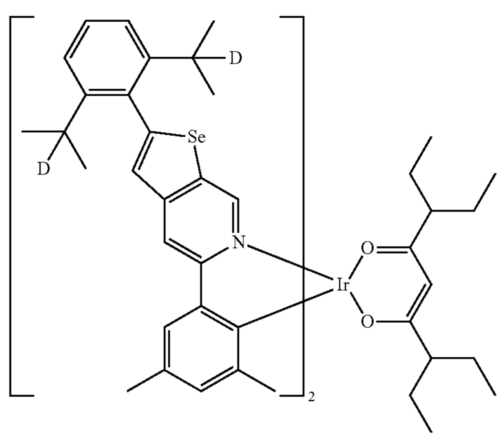

-continued
453
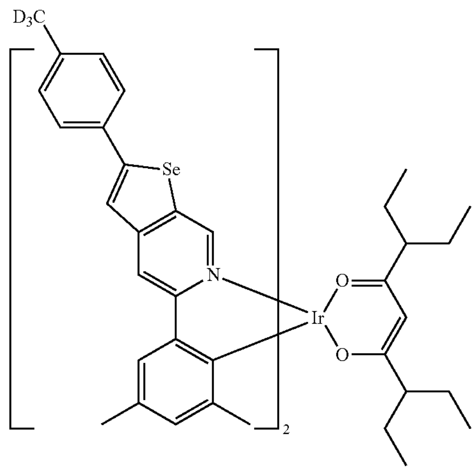
454
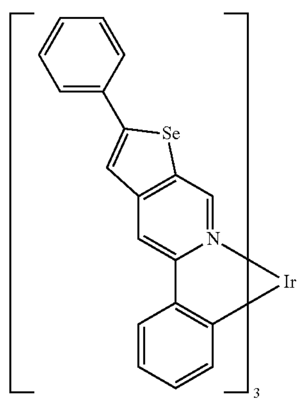
455
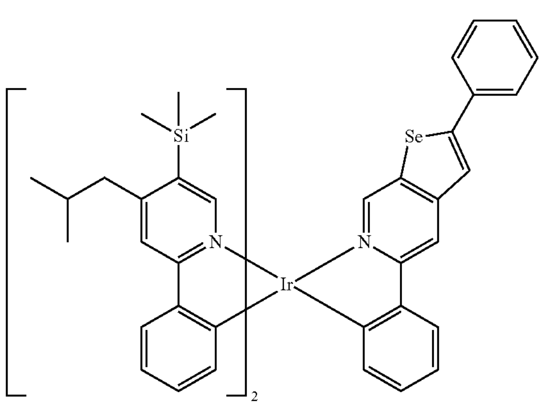
-continued
456
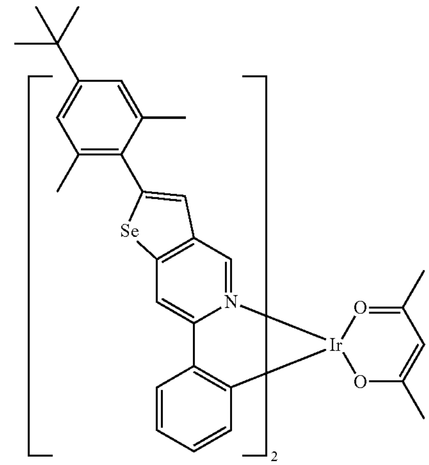
457
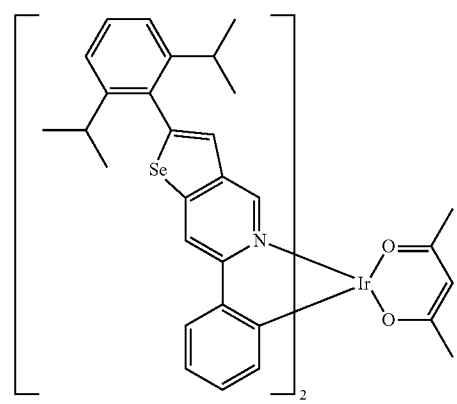
458
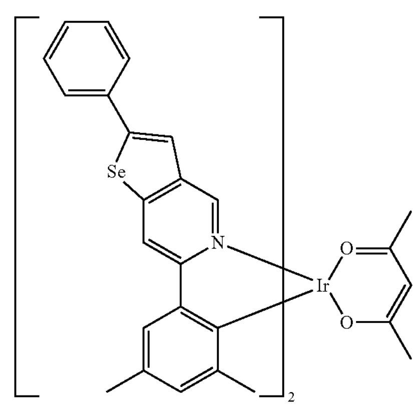

-continued
459
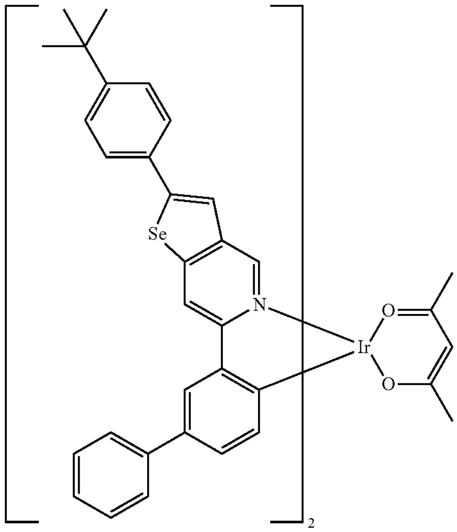
460
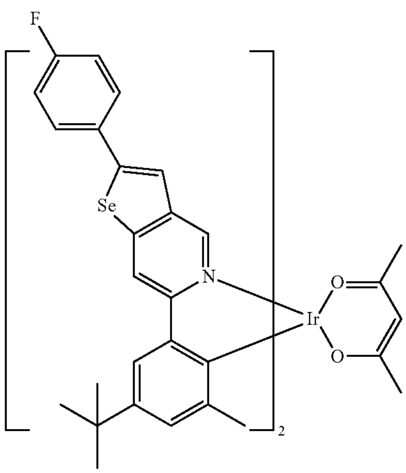
461
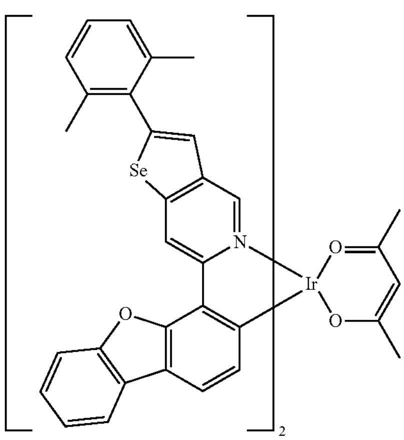
-continued
462
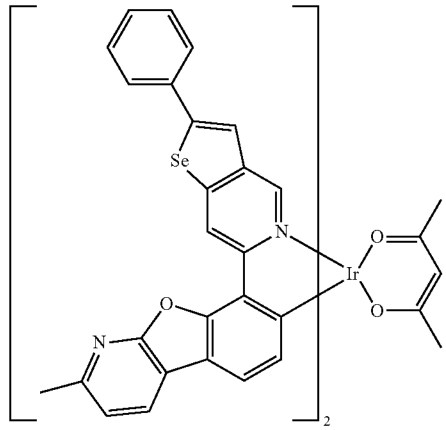
463
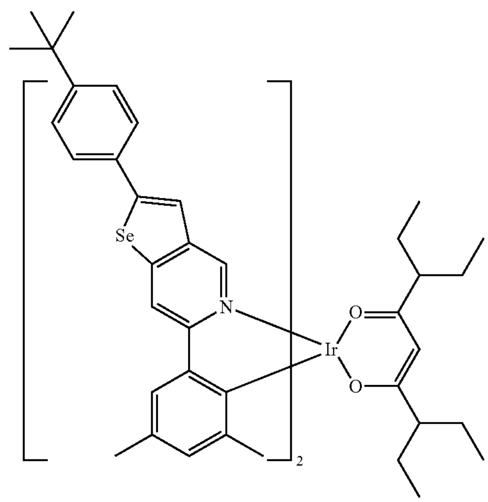
464
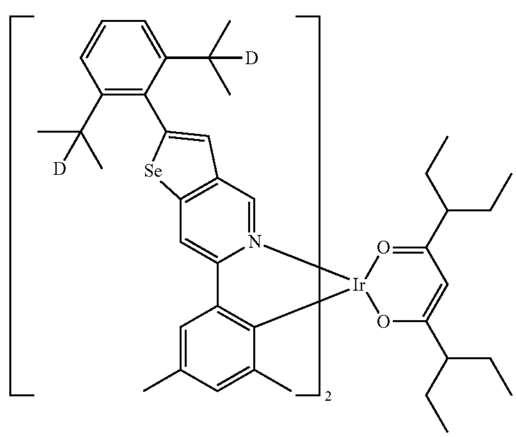

-continued

465

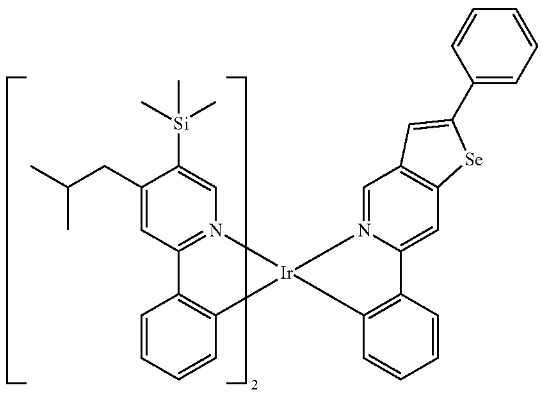

466

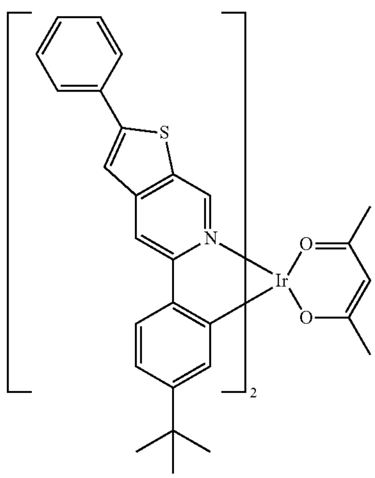

467

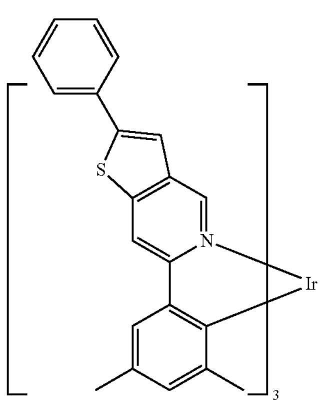

-continued

468

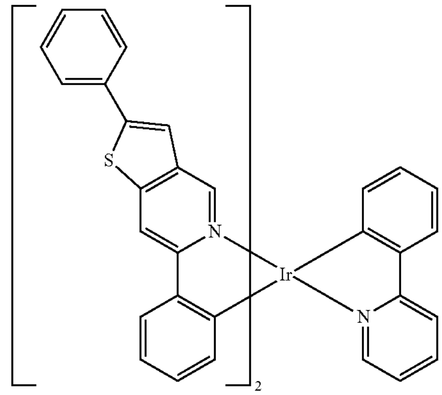

469

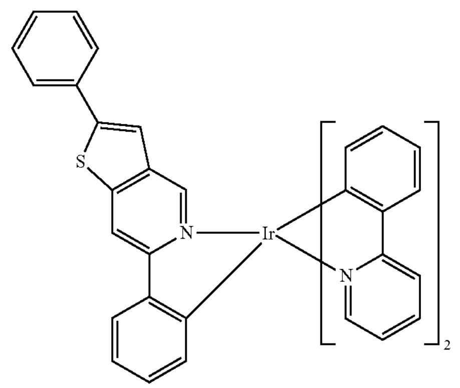

16. An organic light-emitting device comprising:

a first electrode;

a second electrode; and an organic layer disposed between the first electrode and the second electrode and comprising an emission layer, wherein the organic layer comprises at least one organometallic compound of claim 1.

17. The organic light-emitting device of claim 16, wherein the first electrode is an anode, the second electrode is a cathode, the organic layer further comprises a hole transport region between the first electrode and the emission layer and an electron transport region between the emission layer and the second electrode, the hole transport region comprises a hole injection layer, a hole transport layer, an electron blocking layer, a buffer layer, or any combination thereof, and the electron transport region comprises a hole blocking layer, an electron transport layer, an electron injection layer, or any combination thereof.

18. The organic light-emitting device of claim 16, wherein the emission layer comprises the organometallic compound.

19. The organic light-emitting device of claim 18, wherein the emission layer further comprises a host, and an amount of the host is larger than an amount of the organometallic compound.

20. A diagnostic composition comprising the organometallic compound of claim 1.

* * * * *